US008063855B2

(12) United States Patent
Takahara et al.

(10) Patent No.: US 8,063,855 B2
(45) Date of Patent: Nov. 22, 2011

(54) DRIVE METHOD OF EL DISPLAY PANEL

(75) Inventors: Hiroshi Takahara, Osaka (JP); Hitoshi Tsuge, Osaka (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 1015 days.

(21) Appl. No.: 11/865,749

(22) Filed: Oct. 2, 2007

(65) Prior Publication Data

US 2008/0084365 A1 Apr. 10, 2008

Related U.S. Application Data

(62) Division of application No. 10/511,447, filed as application No. PCT/JP03/02597 on Mar. 6, 2003, now Pat. No. 7,777,698.

(30) Foreign Application Priority Data

Apr. 26, 2002 (JP) ................................ 2002-127532
Apr. 26, 2002 (JP) ................................ 2002-127637
Sep. 27, 2002 (JP) ................................ 2002-284393

(51) Int. Cl.
*G09G 3/30* (2006.01)

(52) U.S. Cl. .......................... 345/76; 345/204; 345/690

(58) Field of Classification Search .................... 345/76, 345/204, 690
See application file for complete search history.

(56) References Cited

U.S. PATENT DOCUMENTS 5,952,789 A 9/1999 Stewart et al.
5,990,629 A 11/1999 Yamada et al.
6,219,113 B1 4/2001 Takahara
6,229,508 B1 5/2001 Kane
6,249,325 B1 * 6/2001 Ohkawara et al. .............. 349/38
6,265,833 B1 7/2001 Kim et al.
6,351,255 B1 2/2002 Ishizuka et al.
6,366,025 B1 4/2002 Yamada
6,369,786 B1 4/2002 Suzuki
6,373,454 B1 4/2002 Knapp et al.

(Continued)

FOREIGN PATENT DOCUMENTS

CN 1552050 A 12/2004

(Continued)

OTHER PUBLICATIONS

U.S. Appl. No. 12/361,069, filed Jan. 28, 2009, Takahara, et al.

(Continued)

*Primary Examiner* — Bipin Shalwala
*Assistant Examiner* — Afroza Chowdhury
(74) *Attorney, Agent, or Firm* — Oblon, Spivak, McClelland, Maier & Neustadt, L.L.P.

(57) ABSTRACT

A switching transistor is controlled to turn on or off depending on a turn-on voltage or a turn-off voltage applied to a gate signal line. A driver transistor is supplied with an image signal applied to a source signal line through a switching transistor. A voltage based on the supplied image signal is retained by a capacitor. The driver transistor supplies a light-emitting current to an EL element based on the voltage retained in the capacitor. A capacitor is formed between one terminal of the capacitor (that is, a gate terminal of the driver transistor) and a gate signal line. The capacitor causes the gate terminal voltage of the driver transistor to be varied depending on variation of the potential on the gate signal line.

11 Claims, 189 Drawing Sheets

U.S. PATENT DOCUMENTS

| | | | | |
|---|---|---|---|---|
| 6,504,585 | B2 * | 1/2003 | Ohkawara et al. | 349/38 |
| 6,583,775 | B1 | 6/2003 | Sekiya et al. | |
| 6,597,349 | B1 | 7/2003 | Koyama et al. | |
| 6,909,409 | B2 | 6/2005 | Tanada | |
| 7,173,612 | B2 | 2/2007 | Nanno et al. | |
| 7,180,513 | B2 | 2/2007 | Tsuge | |
| 7,227,519 | B1 | 6/2007 | Kawase et al. | |
| 2001/0024186 | A1 | 9/2001 | Kane et al. | |
| 2001/0033252 | A1 | 10/2001 | Yamazaki et al. | |
| 2001/0038367 | A1 | 11/2001 | Inukai | |
| 2001/0040645 | A1 | 11/2001 | Yamazaki | |
| 2002/0021293 | A1 | 2/2002 | Tam | |
| 2002/0175635 | A1 | 11/2002 | Komiya | |
| 2002/0196214 | A1 | 12/2002 | Park et al. | |
| 2003/0052597 | A1 | 3/2003 | Sakurai | |
| 2003/0201448 | A1 | 10/2003 | Yamazaki et al. | |
| 2005/0041002 | A1 * | 2/2005 | Takahara et al. | 345/76 |
| 2005/0168490 | A1 | 8/2005 | Takahara | |
| 2005/0180083 | A1 | 8/2005 | Takahara et al. | |
| 2006/0267889 | A1 * | 11/2006 | Kimura | 345/84 |
| 2006/0279260 | A1 | 12/2006 | Tsuge | |
| 2007/0080905 | A1 | 4/2007 | Takahara | |
| 2007/0085781 | A1 | 4/2007 | Chung et al. | |
| 2007/0120784 | A1 | 5/2007 | Tsuge | |
| 2007/0126667 | A1 | 6/2007 | Nakamura et al. | |
| 2007/0222718 | A1 | 9/2007 | Takahara | |

FOREIGN PATENT DOCUMENTS

| | | | |
|---|---|---|---|
| EP | 0883191 | | 12/1998 |
| EP | 1130565 | | 9/2001 |
| EP | 1282104 | | 2/2003 |
| JP | 63-290413 | | 11/1988 |
| JP | 4-42619 | | 2/1992 |
| JP | 5-5866 | | 1/1993 |
| JP | 5-307167 | | 11/1993 |
| JP | 6-61955 | | 3/1994 |
| JP | 6-132739 | | 5/1994 |
| JP | 6-161580 | | 6/1994 |
| JP | 6-314977 | | 11/1994 |
| JP | 6-324348 | | 11/1994 |
| JP | 6-332397 | | 12/1994 |
| JP | 9-195141 | | 7/1997 |
| JP | 10-214065 | | 8/1998 |
| JP | 10-232649 | | 9/1998 |
| JP | 10-260661 | | 9/1998 |
| JP | 10-274960 | | 10/1998 |
| JP | 10-319908 | | 12/1998 |
| JP | 11-3048 | | 1/1999 |
| JP | 11-143429 | | 5/1999 |
| JP | 11-272233 | | 10/1999 |
| JP | 11-288244 | | 10/1999 |
| JP | 11-311970 | | 11/1999 |
| JP | 2000-105574 | | 4/2000 |
| JP | 2000-122608 | | 4/2000 |
| JP | 2000-221942 | | 8/2000 |
| JP | 2000-259110 | | 9/2000 |
| JP | 2000-276296 | | 10/2000 |
| JP | 2000-284727 | | 10/2000 |
| JP | 2000-310981 | | 11/2000 |
| JP | 2000-347621 | | 12/2000 |
| JP | 2001-42822 | | 2/2001 |
| JP | 2001-56667 | | 2/2001 |
| JP | 2001-60076 | | 3/2001 |
| JP | 2001-83924 | | 3/2001 |
| JP | 2001-109432 | | 4/2001 |
| JP | 2001-147666 | | 5/2001 |
| JP | 2001-210122 | A | 8/2001 |
| JP | 2001-290441 | | 10/2001 |
| JP | 2001-306018 | | 11/2001 |
| JP | 2001-312243 | | 11/2001 |
| JP | 2002-14644 | | 1/2002 |
| JP | 2002-32051 | | 1/2002 |
| JP | 2002-40990 | | 2/2002 |
| JP | 2002-116728 | | 4/2002 |
| JP | 2002-149125 | | 5/2002 |
| JP | 2002-174655 | | 6/2002 |
| JP | 2002-182612 | | 6/2002 |
| JP | 2002-278514 | | 9/2002 |
| JP | 2002-297096 | | 10/2002 |
| JP | 2002-333866 | | 11/2002 |
| JP | 2003-29708 | | 1/2003 |
| JP | 2003-66865 | | 3/2003 |
| JP | 2003-114644 | | 4/2003 |
| JP | 2003-114645 | | 4/2003 |
| JP | 2003-150082 | | 5/2003 |
| JP | 2003-150104 | | 5/2003 |
| JP | 2003-150109 | A | 5/2003 |
| JP | 2003-150118 | A | 5/2003 |
| JP | 2003-173154 | | 6/2003 |
| JP | 2003-216100 | A | 7/2003 |
| JP | 2003-228331 | | 8/2003 |
| JP | 2003-295790 | | 10/2003 |
| JP | 2004-138976 | | 5/2004 |
| JP | 2004-198770 | | 7/2004 |
| JP | 2004-252216 | | 9/2004 |
| JP | 2005-266735 | A | 9/2005 |
| KR | 10-0548799 | | 5/1999 |
| KR | 2000-0014673 | | 3/2000 |
| KR | 2000-0033177 | | 6/2000 |
| KR | 2001-0070173 | | 7/2001 |
| KR | 2001-0078229 | | 8/2001 |
| KR | 2002-0021362 | | 3/2002 |
| KR | 2002-0025984 | | 4/2002 |
| KR | 2002-0069488 | | 9/2002 |
| KR | 2003-0000146 | | 1/2003 |
| KR | 2003-0025185 | | 3/2003 |
| KR | 10-2007-0015828 | | 2/2007 |
| TW | 400450 | | 8/2000 |
| TW | 461002 | | 10/2001 |
| TW | 521257 | | 2/2003 |
| TW | 558701 | | 10/2003 |
| WO | WO98/48403 | | 10/1998 |
| WO | 99/65011 | | 12/1999 |
| WO | WO99/65012 | | 12/1999 |
| WO | WO01/06484 | | 1/2001 |
| WO | WO 01/37249 | A2 | 5/2001 |
| WO | 01/75852 | A1 | 10/2001 |
| WO | WO 01/91095 | A1 | 11/2001 |
| WO | 03/027998 | A1 | 3/2003 |

OTHER PUBLICATIONS

U.S. Appl. No. 12/760,708, filed Apr. 15, 2010, Takahara.

Taiwanese Office Action dated May 9, 2011 for Taiwan Application No. 092104946 (with English Translation).

Taiwanese Office Action dated Jul. 1, 2011, in Taiwanese Application No. 095146358 (with English Translation).

Taiwanese Office Action dated Jun. 30, 2011, in Taiwanese Application No. 095146359 (with English Translation).

Taiwanese Office Action dated Jun. 29, 2011, in Taiwanese Application No. 095146360 (with English Translation).

Taiwanese Office Action dated Jun. 29, 2011, in Taiwanese Application No. 095146361 (with English Translation).

* cited by examiner

Gate signal line 17a
1F
1H
Vgh
Vgl
Time t

Gate signal line 17b
1F/(N·K)
1F/(N·K)
Vgh
Vgl
Time t

Emission brightness
N
0
Time t

Potential of source signal line when current Iw is applied

Pixel-side selection signal line
OEV1
Gate signal line 17a
EL-side selection signal line
OEV2
Gate signal line 17b
Vgh
Vgl
H
L
1H
A
B WR-side selection signal line
OEV1
Gate signal line 17a
EL-side selection signal line
OEV2
Gate signal lie 17b

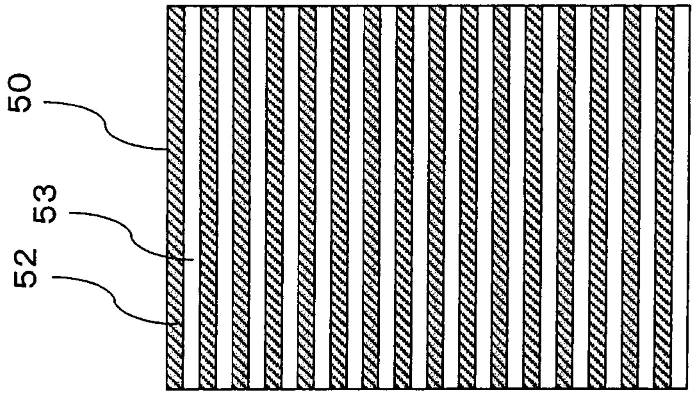
Fig. 126 (b)
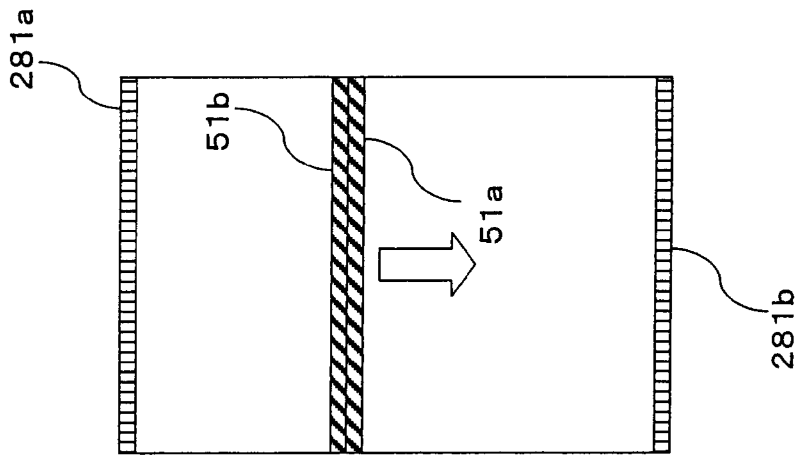
Fig. 126 (a2)
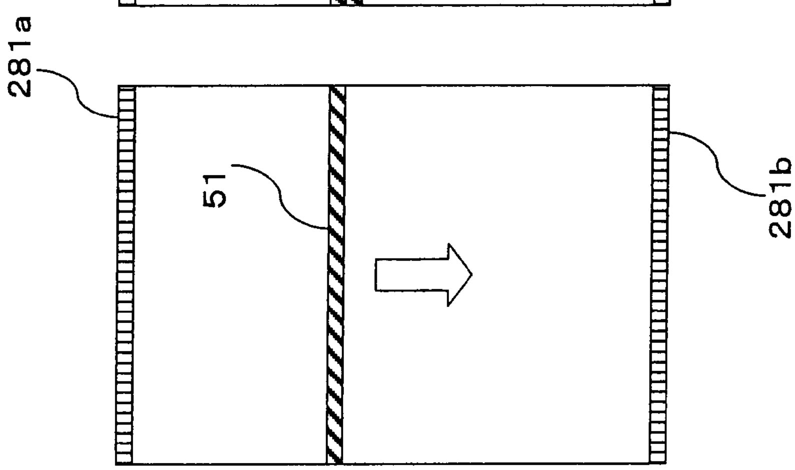
Fig. 126 (a1)

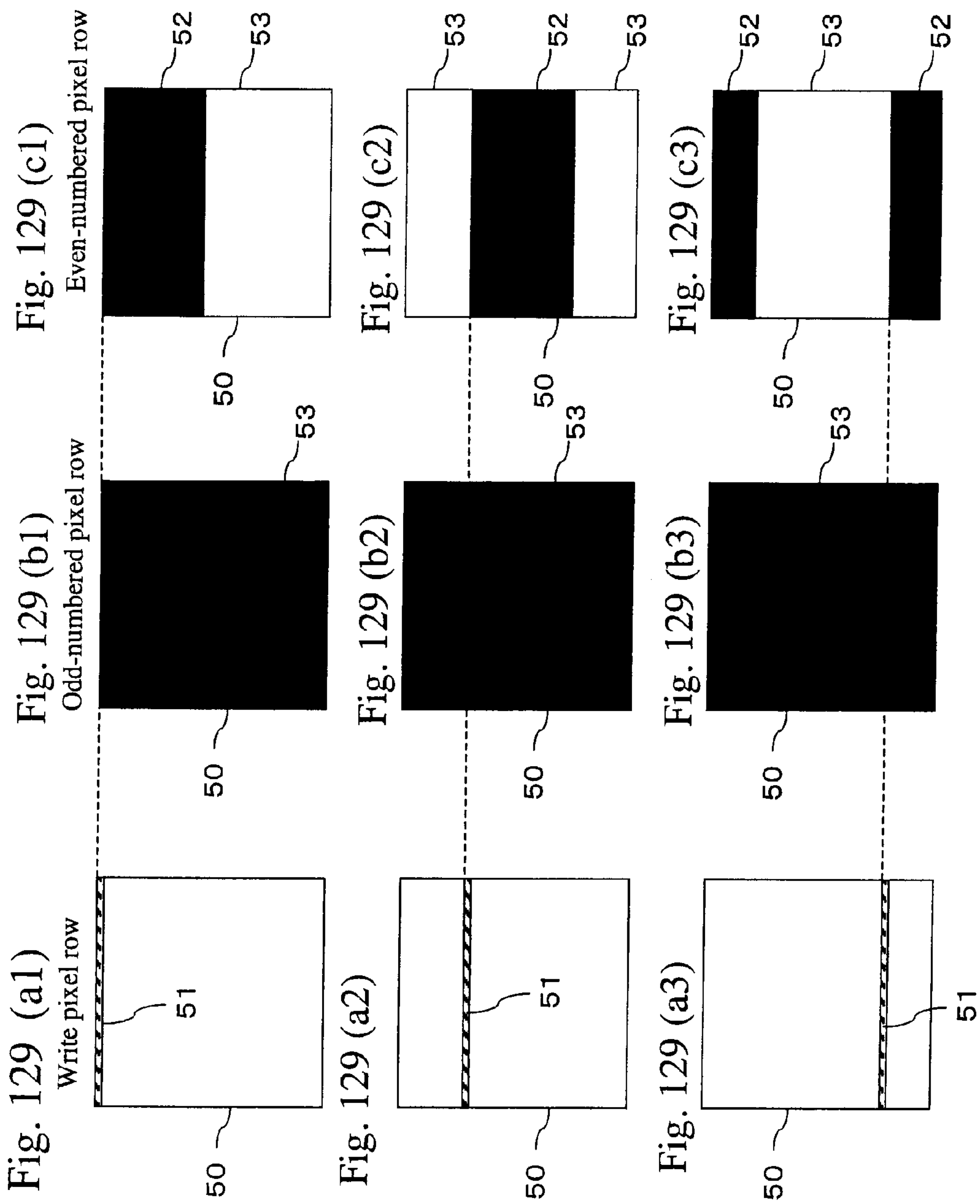
Fig. 129 (a1) Write pixel row
Fig. 129 (b1) Odd-numbered pixel row
Fig. 129 (c1) Even-numbered pixel row
Fig. 129 (a2)
Fig. 129 (b2)
Fig. 129 (c2)
Fig. 129 (a3)
Fig. 129 (b3)
Fig. 129 (c3)

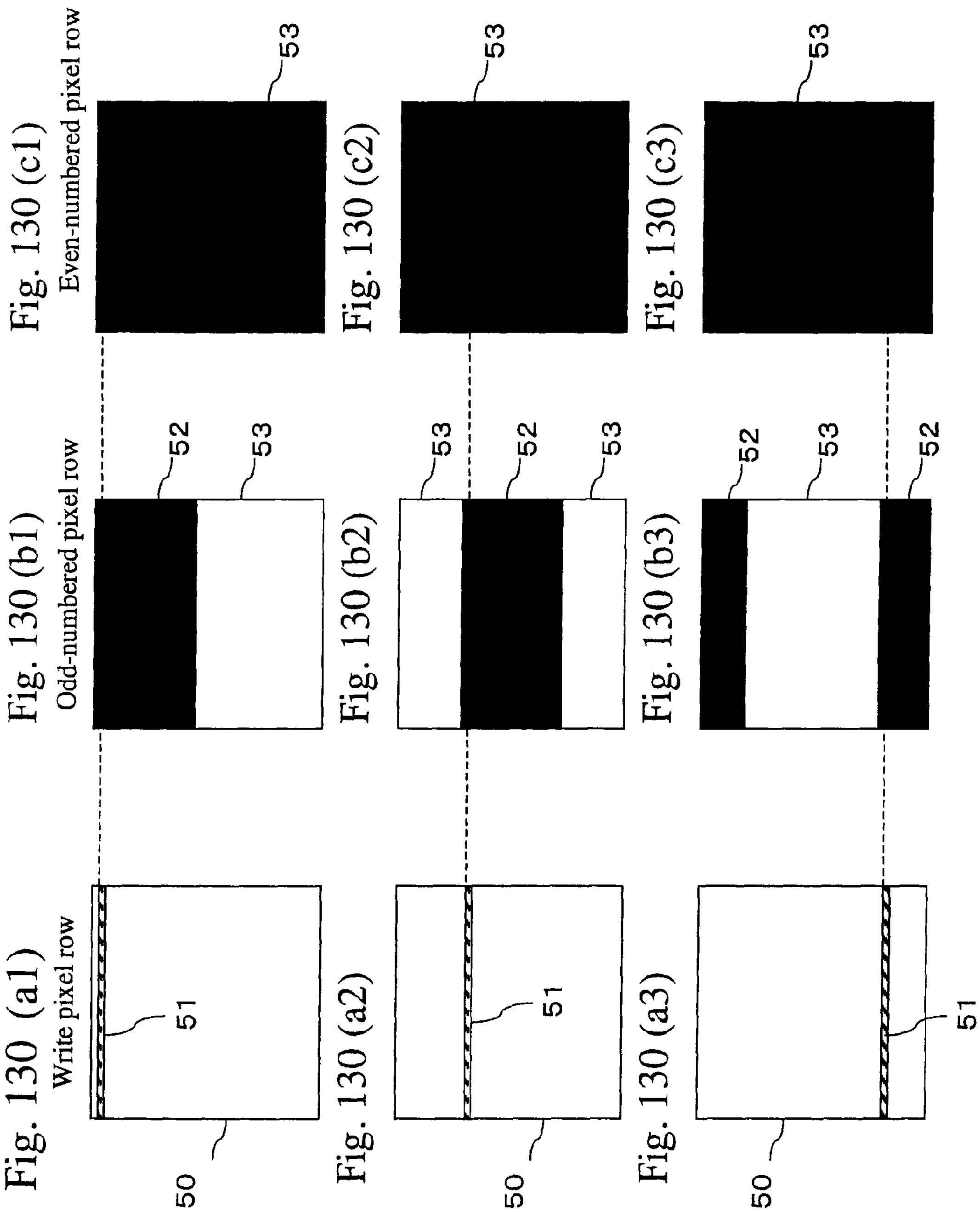
Fig. 130 (a1)
Write pixel row
51
50
Fig. 130 (b1)
Odd-numbered pixel row
52
53
Fig. 130 (c1)
Even-numbered pixel row
53
Fig. 130 (a2)
51
50
Fig. 130 (b2)
53
52
53
Fig. 130 (c2)
53
Fig. 130 (a3)
51
50
Fig. 130 (b3)
52
53
52
Fig. 130 (c3)
53

Fig. 131 (b1)
Odd-numbered pixel row
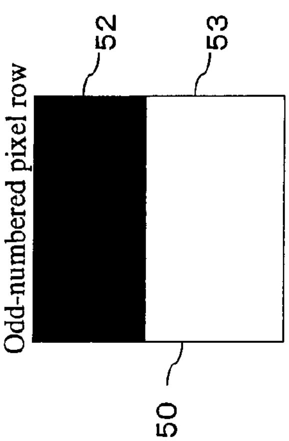
Fig. 131 (c1)
Even-numbered pixel row
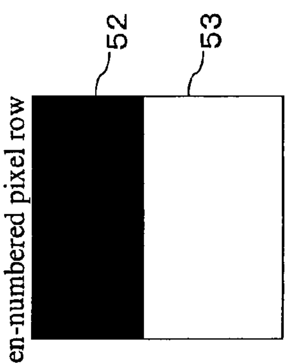
Fig. 131 (b2)
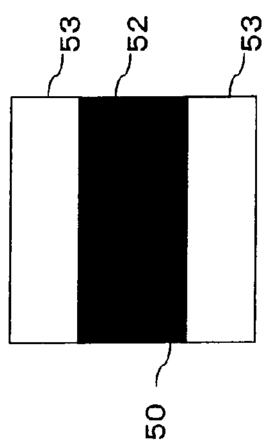
Fig. 131 (c2)
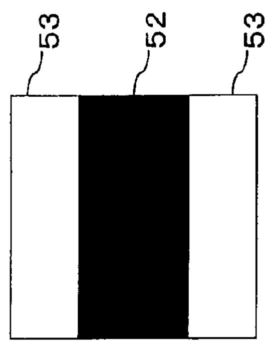
Fig. 131 (b3)
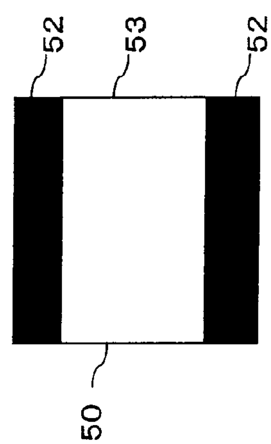
Fig. 131 (c3)
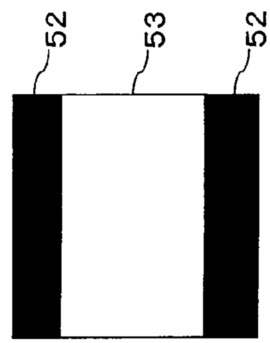

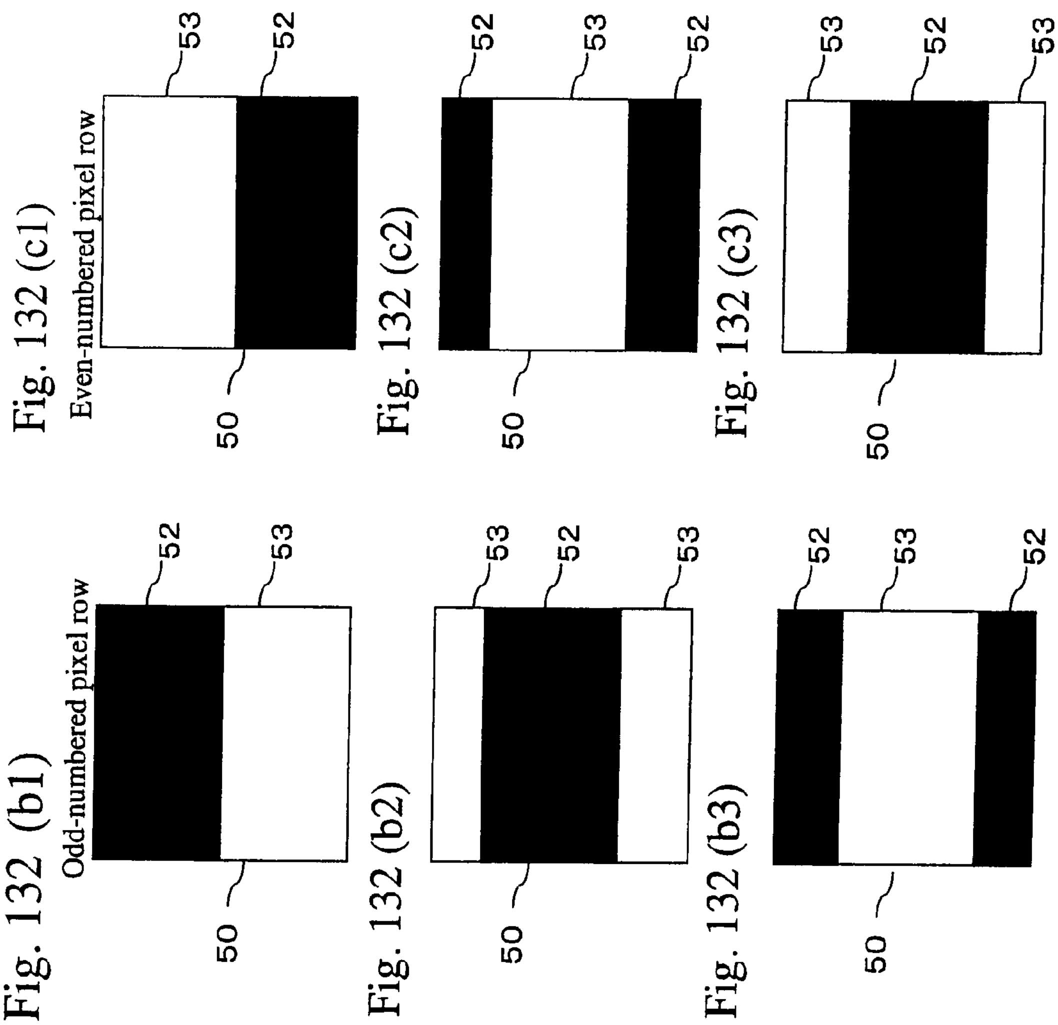
Fig. 132 (b1)
Fig. 132 (b2)
Fig. 132 (b3)
Fig. 132 (c1)
Fig. 132 (c2)
Fig. 132 (c3)

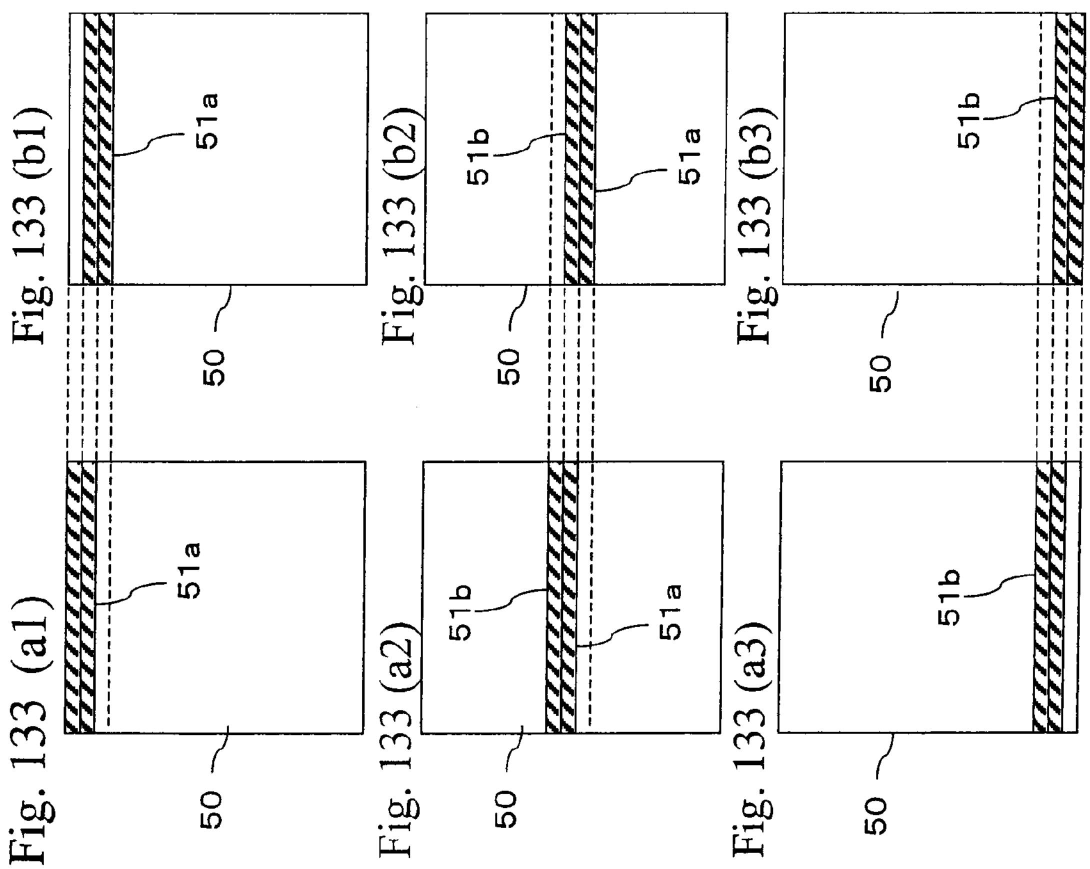
Fig. 133 (a1)
Fig. 133 (b1)
Fig. 133 (a2)
Fig. 133 (b2)
Fig. 133 (a3)
Fig. 133 (b3)
50
51a
51b

Fig. 145

| | B／A (ON periods) | | | |
|---|---|---|---|---|
| (Average) Gradation | MODE1 | MODE2 | MODE3 | MODE4 |
| 1 | 0 | 0 | 0. 05 | 0 |
| 2 | 0 | 0 | 0. 05 | 0 |
| 3 | 0 | 0 | 0. 05 | 0 |
| 4 | 0 | 0 | 0. 05 | 0 |
| 5 | 0 | 0 | 0. 05 | 0 |
| 17 | 0 | 0. 05 | 0. 05 | 0. 05H |
| 18 | 0 | 0. 05 | 0. 05 | 0. 05H |
| 19 | 0 | 0. 05 | 0. 05 | 0. 04H |
| 20 | 0 | 0. 05 | 0. 05 | 0. 04H |
| 21 | 0 | 0. 05 | 0. 05 | 0. 03H |
| 22 | 0 | 0. 05 | 0. 05 | 0. 03H |
| 61 | 0 | 0. 05 | 0. 05 | 0. 22H |
| 62 | 0 | 0. 05 | 0. 05 | 0. 23H |
| 63 | 0 | 0. 05 | 0. 05 | 0. 24H |
| 64 | 0 | 0. 05 | 0. 05 | 0. 25H |

Gate signal line 17b
Vgh
Vgl
1H

Gate signal line 17b
Vgh
Vgl
1H

Gate signal line 17b
Vgh
Vgl
1H

DRIVE METHOD OF EL DISPLAY PANEL

This application is a division of and claims the benefit of priority under 35 U.S.C. §120 from U.S. Ser. No. 10/511,447, filed Oct. 26, 2004, and claims the benefit of priority under 35 U.S.C. §119 from Japanese Patent Application Nos. 2002-284393, filed Sep. 27, 2002, 2002-127532, filed Apr. 26, 2002 and 2002-127637, filed Apr. 26, 2002, the entire contents of which are incorporated herein by reference.

TECHNICAL FIELD

The present invention relates to a self-luminous display panel such as an EL display panel which employs organic or inorganic electroluminescent (EL) elements. Also, it relates to an information display apparatus and the like which employ the EL display panel, a drive method for the EL display panel, and the drive circuit for the EL display panel.

BACKGROUND ART

Generally, active-matrix display apparatus display images by arranging a large number of pixels in a matrix and controlling the light intensity of each pixel according to a video signal. For example, if liquid crystals are used as an electrochemical substance, the transmittance of each pixel changes according to a voltage written into the pixel. Even with active-matrix display apparatus which employ an organic electroluminescent (EL) material as an electrochemical substance, the basic operation is the same as in the case of using liquid crystals.

In a liquid crystal display panel, each pixel works as a shutter, and images are displayed as a backlight is blocked off and revealed by the pixels or shutters. An organic EL display panel is of a self-luminous type in which each pixel has a light-emitting element. Consequently, the self-luminous type display panel such as an organic EL display panel has the advantages of being more viewable than liquid crystal display panels, requiring no backlighting, having high response speed, etc.

Brightness of each light-emitting element (pixel) in an organic EL display panel is controlled by an amount of current. That is, organic EL display panels differ greatly from liquid crystal display panels in that light-emitting elements are driven or controlled by current.

A construction of organic EL display panels can be either a simple-matrix type or active-matrix type. It is difficult to implement a large high-resolution display panel of the former type although the former type is simple in structure and inexpensive. The latter type allows a large high-resolution display panel to be implemented, but involves a problem that it is a technically difficult control method and is relatively expensive. Currently, active-matrix type display panels are developed intensively. In the active-matrix type display panel, current flowing through the light-emitting elements provided in each pixel is controlled by thin-film transistors (transistors) installed in the pixels.

Such an organic EL display panel of an active-matrix type is disclosed in Japanese Patent Laid-Open No. 8-234683. An equivalent circuit for one pixel of the display panel is shown in FIG. 62. A pixel 16 consists of an EL element 15 which is a light-emitting element, a first transistor 11*a*, a second transistor 11*b*, and a storage capacitance 19. The light-emitting element 15 is an organic electroluminescent (EL) element. According to the present invention, the transistor 11*a* which supplies (controls) current to the EL element 15 is referred to as a driver transistor 11. A transistor, such as the transistor 11*b* shown in FIG. 62, which operates as a switch is referred to as a switching transistor 11.

The organic EL element 15, in many cases, may be referred to as an OLED (organic light-emitting diode) because of its rectification. In FIG. 62 or the like, a diode symbol is used for the light-emitting element OLED 15.

Incidentally, the light-emitting element 15 according to the present invention is not limited to an OLED. It may be of any type as long as its brightness is controlled by the amount of current flowing through the element 15. Examples include an inorganic EL element, a white light-emitting diode consisting of a semiconductor, a typical light-emitting diode, and a light-emitting transistor. Rectification is not necessarily required of the light-emitting element 15. Bidirectional diodes are also available. While the reference numeral 15 is described as an EL element, it is sometimes used as the meaning of an EL film or an EL structure.

In the example of FIG. 62, a source terminal (S) of the P-channel transistor 11*a* is designated as Vdd (power supply potential) and a cathode of the EL element 15 is connected to ground potential (Vk). On the other hand, an anode is connected to a drain terminal (D) of the transistor 11*a*. Besides, a gate terminal of the P-channel transistor 11*b* is connected to a gate signal line 17*a*, a source terminal is connected to a source signal line 18, and a drain terminal is connected to the storage capacitance 19 and a gate terminal (G) of the P-channel transistor 11*a*.

Incidentally, although it is stated herein that the transistor elements 11*a* which supply current used to drive the EL elements 15 are p-channel transistors, this is not restrictive and they may be n-channel transistors. Of course, the transistors 11 may be bipolar transistors, FETs, or MOSFETs. The board 71 is not limited to a glass substrate and may be a silicon substrate or metal substrate.

To drive the pixel 16, a video signal which represents brightness information is first applied to the source signal line 18 with the gate signal line 17*a* selected. Then, the transistor 11*a* conducts, the storage capacitance 19 is charged or discharged, and gate potential of the transistor 11*b* matches the potential of the video signal. When the gate signal line 17*a* is deselected, the transistor 11*a* is turned off and the transistor 11*b* is cut off electrically from the source signal line 18. The gate potential of the transistor 11*a* is maintained stably by the storage capacitance 19. Current delivered to the light-emitting element 15 via the transistor 11*a* depends on gate-source voltage Vgs of the transistor 11*a* and the light-emitting element 15 continues to emit light at an intensity which corresponds to the amount of current supplied via the transistor 11*a*.

Organic EL display panels are made of low-temperature polysilicon transistor arrays. However, since organic EL elements use current to emit light, there has been a problem that variations in the characteristics of the transistors will cause display irregularities.

DISCLOSURE OF THE INVENTION

In view of the above problems with conventional EL elements, an object of the present invention is to provide a drive method of an EL display apparatus which can achieve more uniform display than conventional methods even if there are variations in characteristics of pixel transistors and which causes blurred moving pictures less than the conventional methods.

To achieve the above object, a first invention of the present invention is a drive method for an EL display panel, the EL display panel comprising:

EL elements arranged in a matrix;

driver transistors which supply current to be passed through the EL elements;

first switching elements placed in current paths of the EL elements;

a gate driver circuit which turns on and off the first switching elements for control; and a source driver circuit which supplies programming current to the driver transistors, wherein the driver transistors are p-channel transistors, unit transistors which generate the programming current in the source driver circuit are n-channel transistors, and the gate driver circuit turns off the first switching elements at least two or more times during one frame period or one field period.

A second invention of the present invention is a drive method for an EL display panel, the EL display panel comprising:

EL elements arranged in a matrix;

driver transistors which supply current to be passed through the EL elements;

first switching elements placed in current paths of the EL elements;

a gate driver circuit which turns on and off the first switching elements for control; and a source driver circuit which supplies programming current to the driver transistors, wherein the driver transistors are p-channel transistors, unit transistors which generate the programming current in the source driver circuit are n-channel transistors, and the gate driver circuit keeps the first switching elements off for two horizontal scanning periods during one frame period or one field period.

A third invention of the present invention is a drive method for an EL display panel, the EL display panel comprising:

EL elements arranged in a matrix;

driver transistors which supply current to be passed through the EL elements;

first switching elements placed in current paths of the EL elements;

a gate driver circuit which turns on and off the first switching elements for control; and a source driver circuit which supplies programming current to the driver transistors, wherein the driver transistors are p-channel transistors, unit transistors which generate the programming current in the source driver circuit are n-channel transistors, a period during which pixel row is selected and programmed with current is constructed from a first period and second period, a first current is applied during the first period, a second current is applied during the second period, the first current is larger than the second current, and the source driver circuit outputs the first current during the first period and outputs the second current during the second period which comes after the first period.

A fourth invention of the present invention is the drive method for the EL display panel according to the first invention of the present invention, wherein the first switching elements are turned off periodically during one frame period or one field period.

A fifth invention of the present invention is an EL display panel, comprising:

a source driver circuit which outputs programming current;

EL elements arranged in a matrix;

driver transistors which supply current to be passed through the EL elements;

first switching elements placed in current paths of the EL elements;

second switching elements which constitute paths used to transmit programming current to the driver transistors;

a first gate driver circuit which turns on and off the first switching elements for control;

a second gate driver circuit which turns on and off the second switching elements for control;

a source driver circuit which supplies programming current to the driver transistors, wherein the driver transistors are p-channel transistors, unit transistors which generate the programming current in the source driver circuit are n-channel transistors, the first gate driver circuit turns off the first switching elements a number of times during one frame period or one field period, the first gate driver circuit is placed or formed on one side of the display panel, and the second gate driver circuit is placed or formed on another side of the display panel.

A sixth invention of the present invention is the EL display panel according to the fifth invention of the present invention, wherein the gate driver circuits are formed in the same process as the driver transistors and the source driver circuit is made of a semiconductor chip.

A seventh invention of the present invention is an EL display panel, comprising:

gate signal lines;

source signal lines;

a source driver circuit which outputs programming current;

a gate driver circuit;

EL elements arranged in a matrix;

driver transistors which supply current to be passed through the EL elements;

first transistors placed in current paths of the EL elements;

second transistors which constitute paths used to transmit programming current to the driver transistors; and a source driver circuit which supplies programming current to the driver transistors, wherein the driver transistors are p-channel transistors, unit transistors which generate the programming current in the source driver circuit are n-channel transistors, the source driver circuit outputs programming current to the source signal lines, the gate driver circuit is connected to the gate signal lines, gate terminals of the second transistors are connected to the gate signal lines, source terminals of the second transistors are connected to the source signal lines, drain terminals of the second transistors are connected to drain terminals of the driver transistors, and the gate driver circuit selects a plurality of gate signal lines and supplies the programming current to the driver transistors of a plurality of pixels.

An eighth invention of the present invention is an EL display panel, comprising:

a display area consisting of I pixel rows (I is an integer larger than 1) and J pixel columns (J is an integer larger than 1);

a source driver circuit which applies an image signal to source signal lines in the display area;

a gate driver circuit which applies a turn-on voltage or turn-off voltage to gate signal lines in the display area; and a dummy pixel row formed outside the display area, wherein EL elements are arranged in a matrix in the display area and emit light based on the image signal from the source driver circuit, and the dummy pixel row either does not to emit light or emits light not visible to the eye.

A ninth invention of the present invention is the EL display panel according to the seventh invention of the present invention, wherein the gate driver circuit selects a plurality of pixel rows at a time and applies the image signal from the source driver circuit to the plurality of pixel rows; and a dummy pixel row is selected when the first pixel row or I-th pixel rows is selected.

A tenth invention of the present invention is the EL display panel according to the seventh invention of the present invention, wherein the gate driver circuit is constructed of p-channel transistors.

An eleventh invention of the present invention is an EL display panel, comprising:

EL elements arranged in a matrix;

driver transistors which supply current to be passed through the EL elements;

first switching elements placed in current paths of the EL elements;

a gate driver circuit which turns on and off the first switching elements for control; and a source driver circuit which supplies programming current to the driver transistors, wherein the driver transistors and the first switching elements are p-channel transistors, and unit transistors which generate the programming current in the source driver circuit are n-channel transistors.

A twelfth invention of the present invention is a drive method for an EL display panel, comprising the steps of: supplying EL elements with a current which makes the EL elements emit light brighter than a predetermined brightness; and making the EL elements emit light for a period equal to 1/N of one frame period or one field period (N is larger than 1).

A thirteenth invention of the present invention is the drive method for the EL display panel according to the twelfth invention of the present invention, wherein the period equal to 1/N of a frame is divided into a plurality of periods.

A fourteenth invention of the present invention is a drive method for an EL display panel which uses a current to program currents to be passed through EL elements, comprising the steps of: making the EL elements emit light brighter than a predetermined brightness; displaying a display area equal to 1/N(N>1) of an entire screen; and shifting the display area of 1/N of the entire screen in sequence to display the entire screen.

A fifteenth invention of the present invention is an EL display apparatus comprising an EL display panel having the EL display panel in turn comprising EL elements arranged in a matrix; driver transistors which supply current to be passed through the EL elements; first switching elements placed in current paths of the EL elements; and a gate driver circuit which turns on and off the first switching elements, and a receiver.

One of the aspects of the present invention described herein includes two operations. The first operation involves supplying driver transistors 11*a* of pixels 16 with current (drawn) from a current driver circuit (IC) 14 and programming the driver transistors 11*a* with a predetermined current. The second operation involves passing the current programmed in the driver transistors 11*a* through EL elements 15. In this way, by programming the driver transistors 11*a* with a current and passing the current through the EL elements 15, it is possible to pass the predetermined current which has been programmed, even if there are variations in characteristics of the driver transistors 11*a*. This makes it possible to achieve a uniform screen display. The current passed through each EL element 15 is driven intermittently by a transistor 11*d* formed or placed between the EL element 15 and driver transistor 11*a*.

Another aspect of the present invention is a method of performing current programming by selecting the driver transistors 11*a* of multiple pixel rows at a time. The selected pixel rows are scanned in sequence. For example, if a current of 1 μA is outputted from the current driver 14 and two pixel rows are selected at a time, a current of 0.5 μA (=½) is programmed into each pixel row.

To do this, a dummy pixel row is formed at least along the top or bottom edge of the screen. The dummy pixel row is designed not to emit light even when programmed with current. The number of dummy pixel rows formed or disposed equals to the number of pixel rows selected simultaneously minus one.

Parasitic capacitance is present in source signal lines 18 to which current is outputted from the current driver 14. If the parasitic capacitance cannot be charged and discharged sufficiently, it is pot possible to write a predetermined current into the pixels 16. To improve charging and discharging, output current from the current driver 14 should be increased. However, the current outputted from the current driver 14 is written into the driver transistors 11*a* of the pixels 16. Thus, an increase in the output current from the current driver 14 increases the current written into the driver transistors 11*a* as well, resulting in a proportional increase in emission brightness of the pixels 15. Consequently, predetermined brightness is not available.

If the driver transistors 11*a* of multiple pixel rows are selected simultaneously, the output current from the current driver 14 is programmed into the multiple pixel rows, being divided among them. This makes it possible to increase the current outputted from the current driver 14 and decrease the current written into the driver transistors 11*a*.

Another aspect of the present invention illuminates pixels 16 intermittently. That is, intermittent screen display is provided. Intermittent screen display eliminates blurred moving pictures. This achieves proper movie display without residual images as in the case of a CRT. Intermittent display can be achieved by controlling the transistors 11*d* placed or formed between the driver transistors 11*a* and EL elements 15.

Incidentally, with the above configuration, if the pixel transistors are programmed, for example, with 10 times larger current (N=10), a 10 times larger current flows through the EL elements 15 and the EL elements 15 emit 10 times brighter light. To obtain predetermined emission brightness, the time during which the current flows through the EL elements can be reduced to 1/10 of one frame (1 F). This way, the parasitic capacitance of the source signal lines can be charged and discharged sufficiently and the predetermined emission brightness can be obtained. Since the pixels are programmed with N times larger current, the parasitic capacitance of the source signal lines can be charged and discharged sufficiently. This allows accurate current programming, resulting in a uniform screen display. Also, current is passed through the EL element 15 only for a period of 1 F/N, but current is not passed during the remaining period (1 F(N−1)/N). In this display condition, image data display and black display (non-illumination) are repeated every 1 F. This makes it possible to achieve proper movie display without edge blur of images.

BRIEF DESCRIPTION OF THE DRAWINGS

FIG. 120 is an explanatory diagram illustrating a drive method of a display panel according to the present invention;

FIG. 121 is an explanatory diagram illustrating a drive method of a display panel according to the present invention;

FIG. 122 is an explanatory diagram illustrating a drive method of a display panel according to the present invention;

FIG. 123 is an explanatory diagram illustrating a drive method of a display panel according to the present invention;

FIG. 124 is an explanatory diagram illustrating a drive method of a display panel according to the present invention;

FIG. 125 is an explanatory diagram illustrating a drive method of a display panel according to the present invention;

FIG. 126 is an explanatory diagram illustrating a drive method of a display panel according to the present invention;

FIG. 127 is an explanatory diagram illustrating a drive method of a display panel according to the present invention;

FIG. 128 is an explanatory diagram illustrating a drive method of a display panel according to the present invention;

FIG. 129 is an explanatory diagram illustrating a drive method of a display panel according to the present invention;

FIG. 130 is an explanatory diagram illustrating a drive method of a display panel according to the present invention;

FIG. 131 is an explanatory diagram illustrating a drive method of a display panel according to the present invention;

Figure 134:
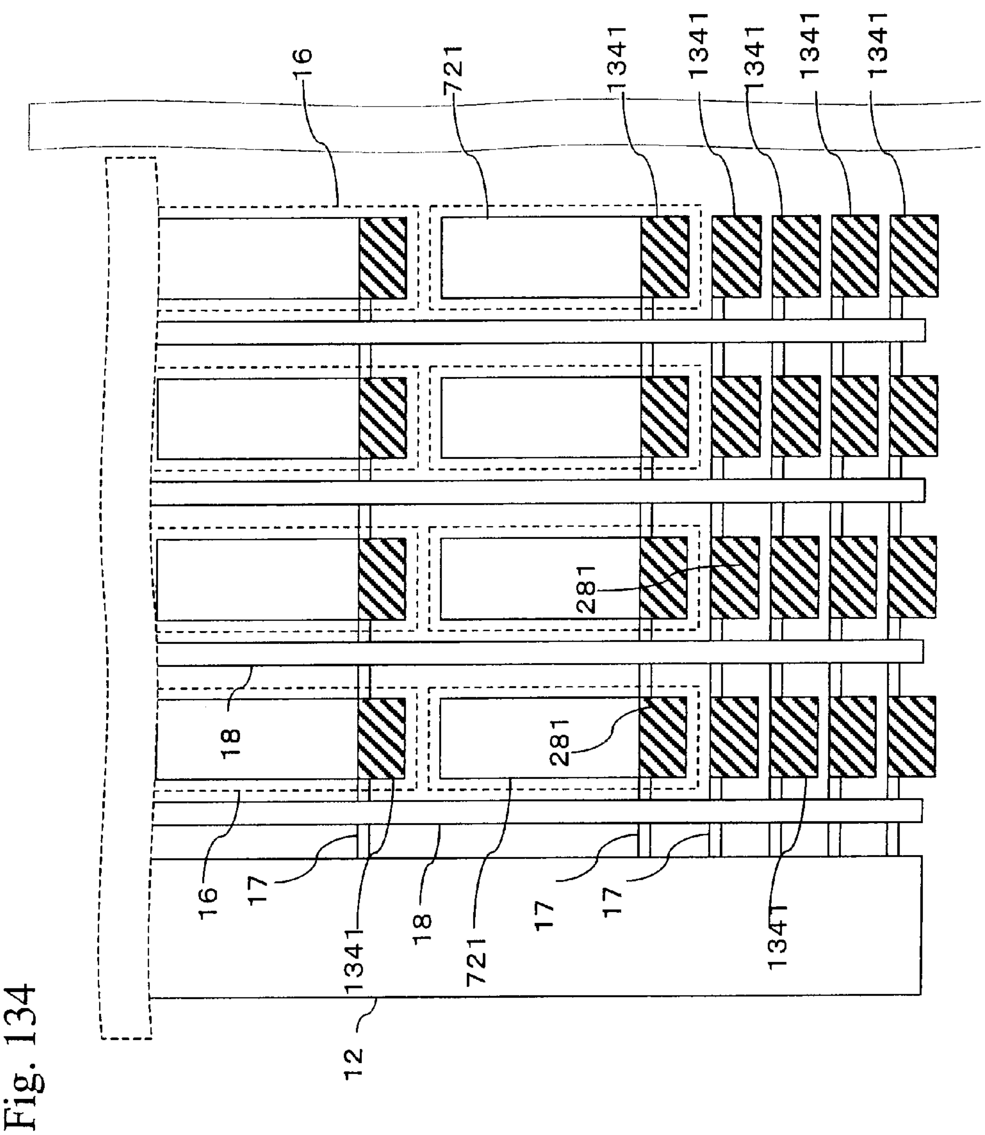
Figure 135:
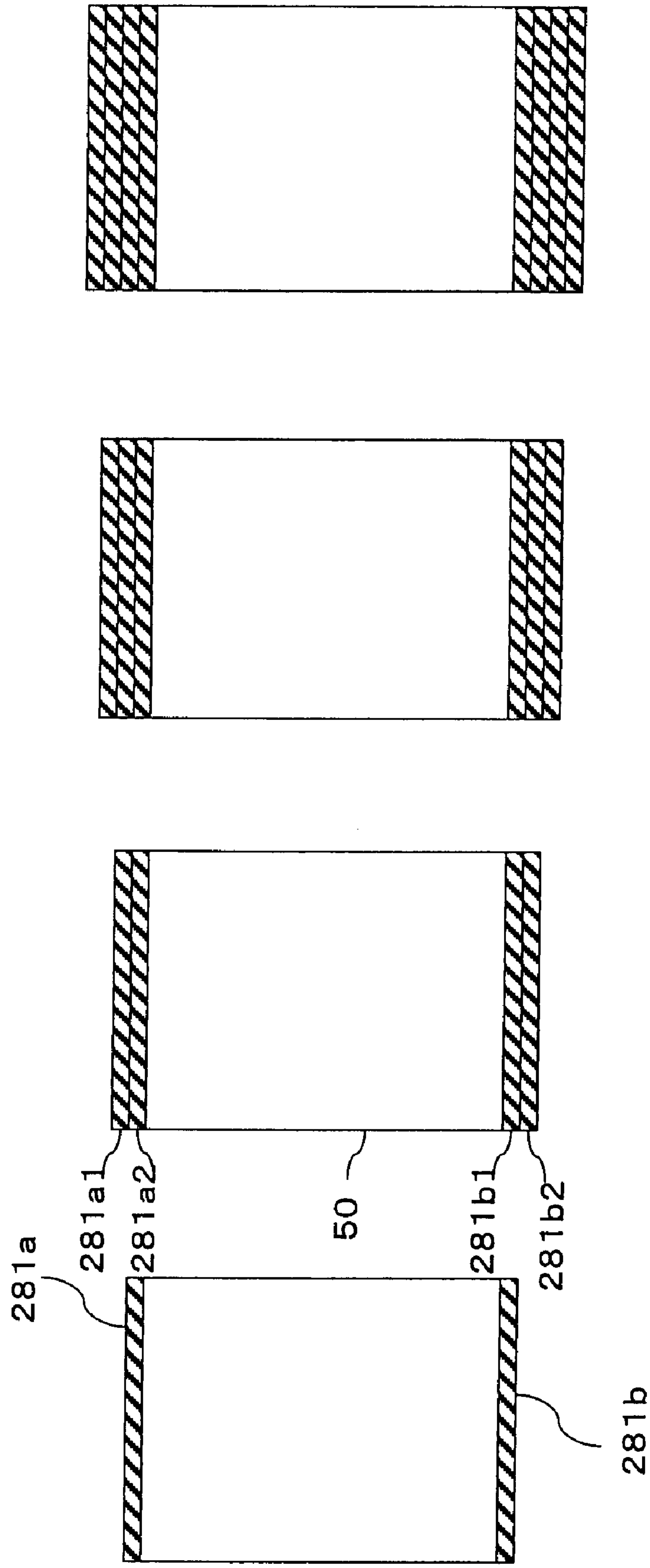
Figure 136:
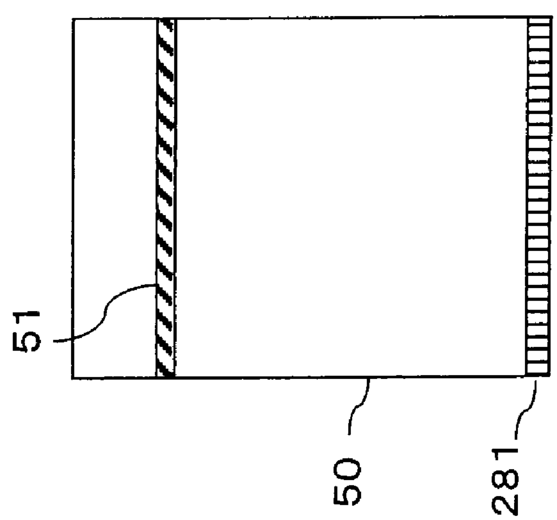
Figure 136:
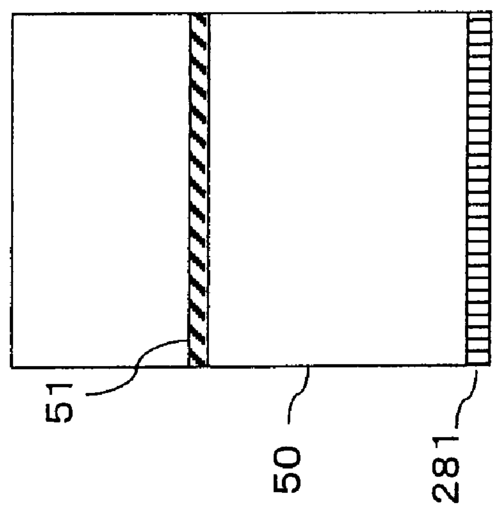
Figure 136:
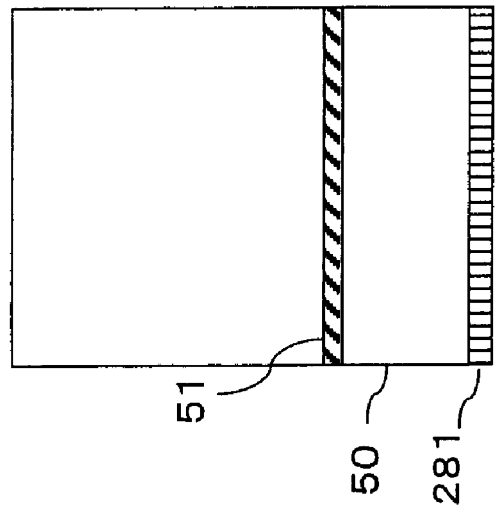
Figure 137:
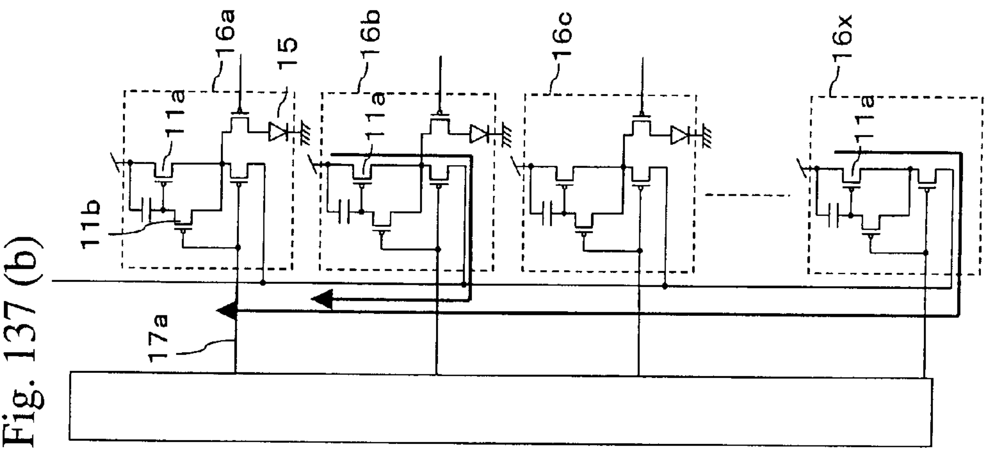
Figure 137:
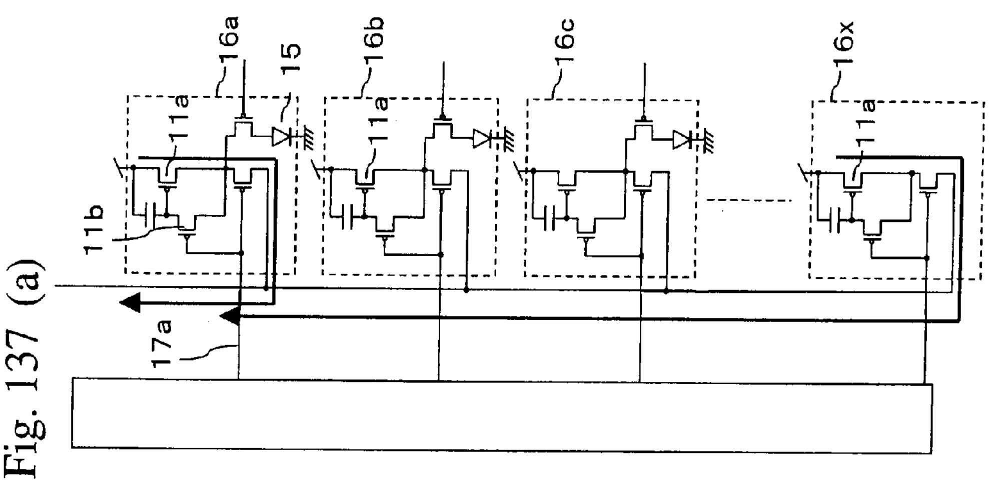
Figure 138:
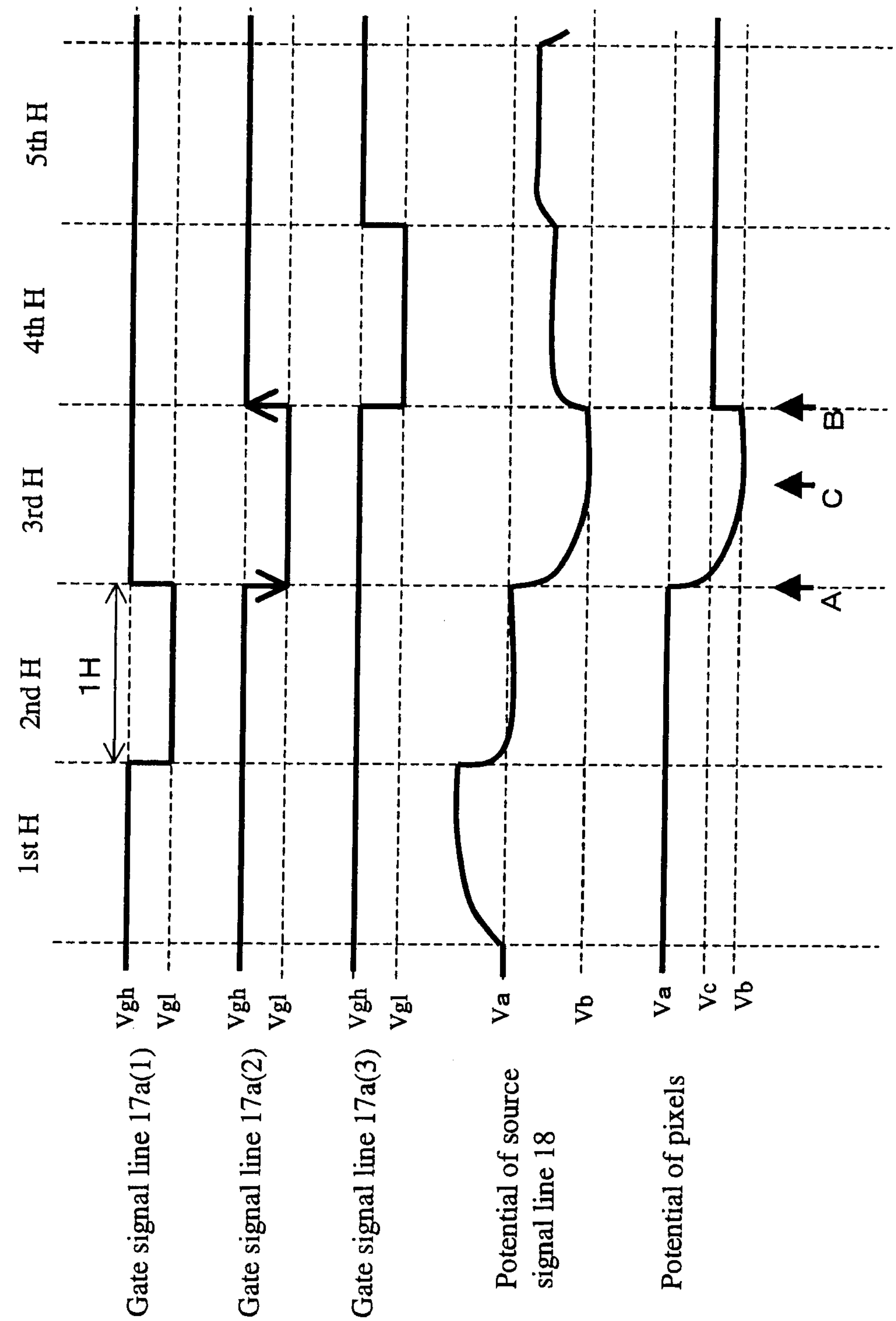
Figure 139:
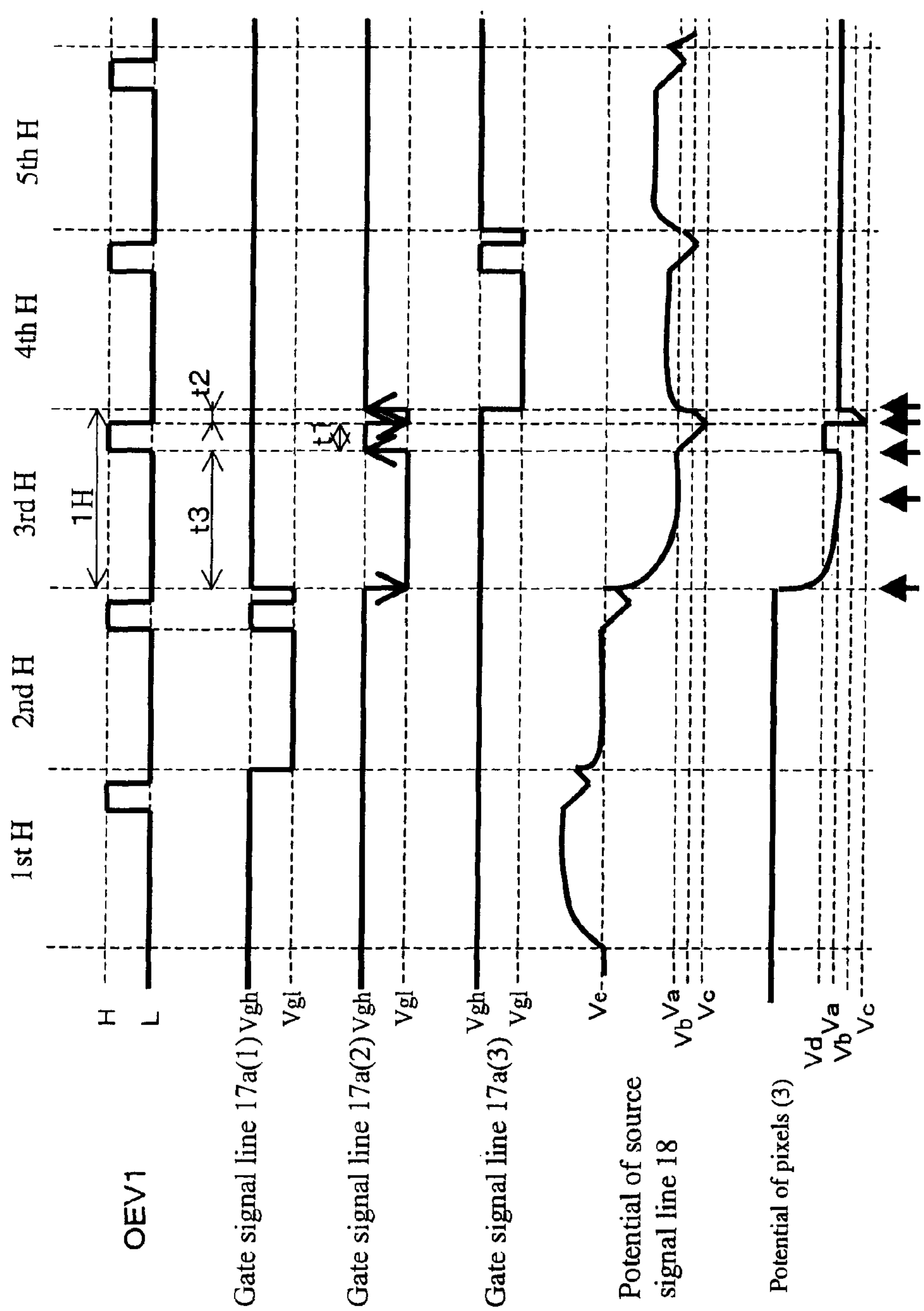
Figure 140:
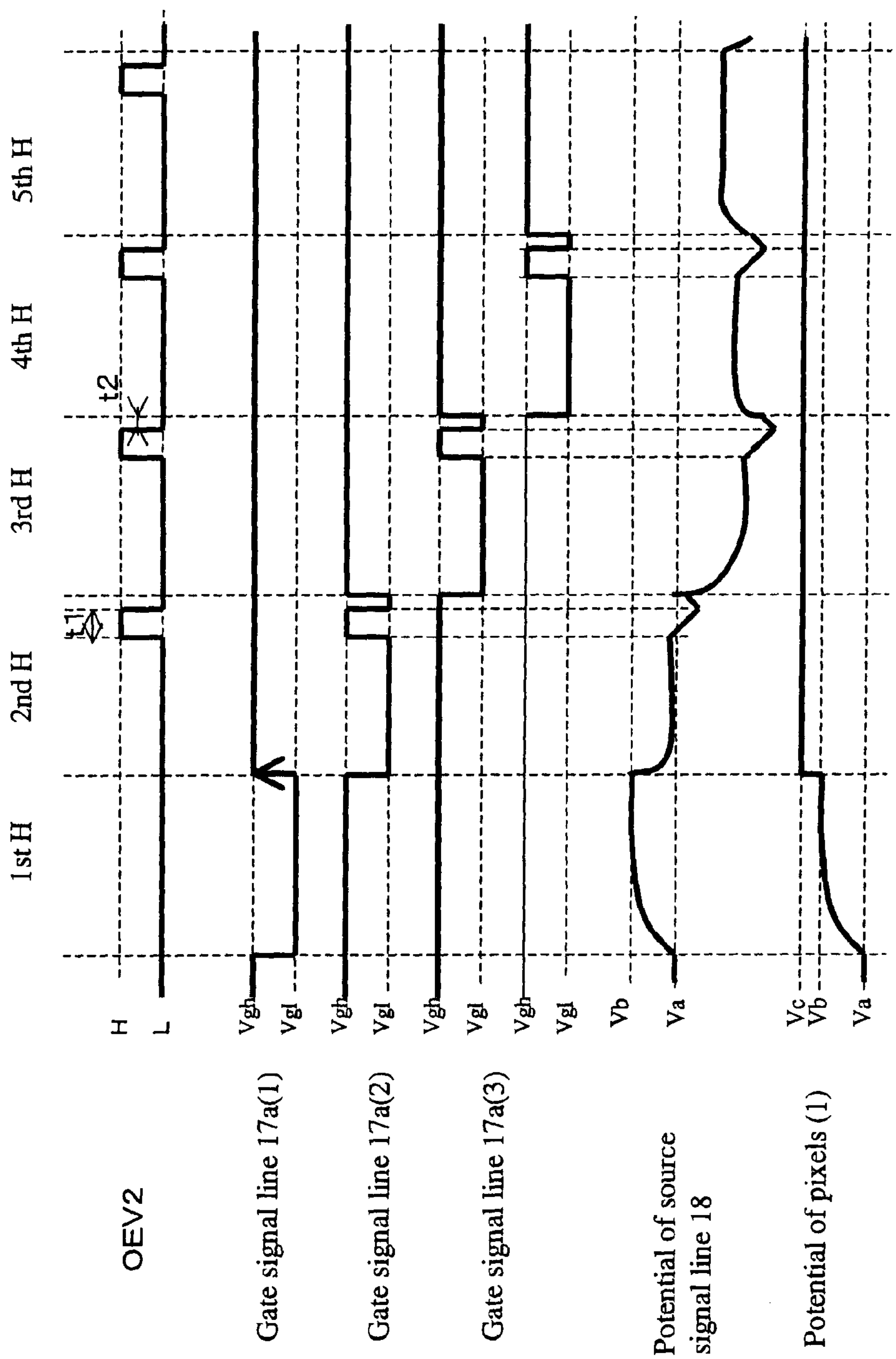
Figure 141:
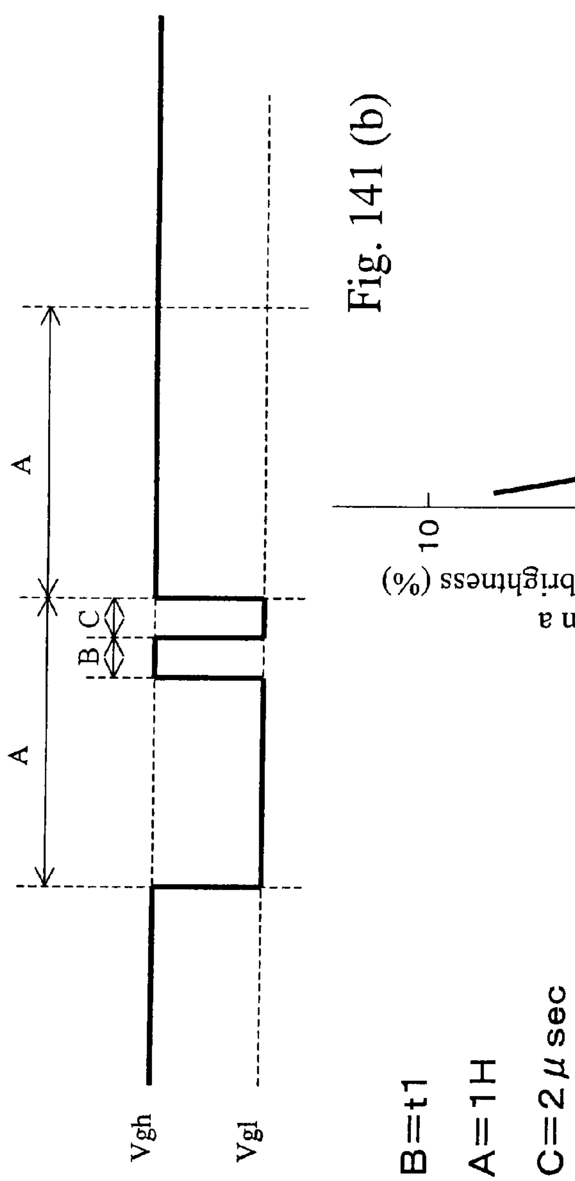
Figure 141:
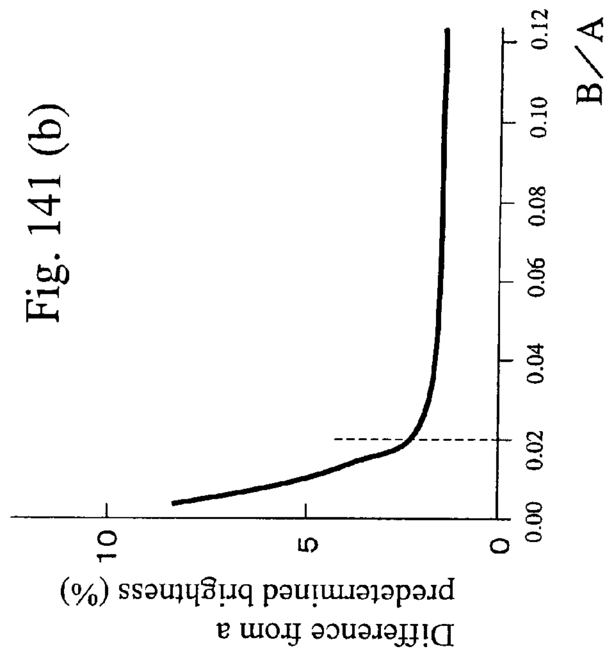
Figure 142:
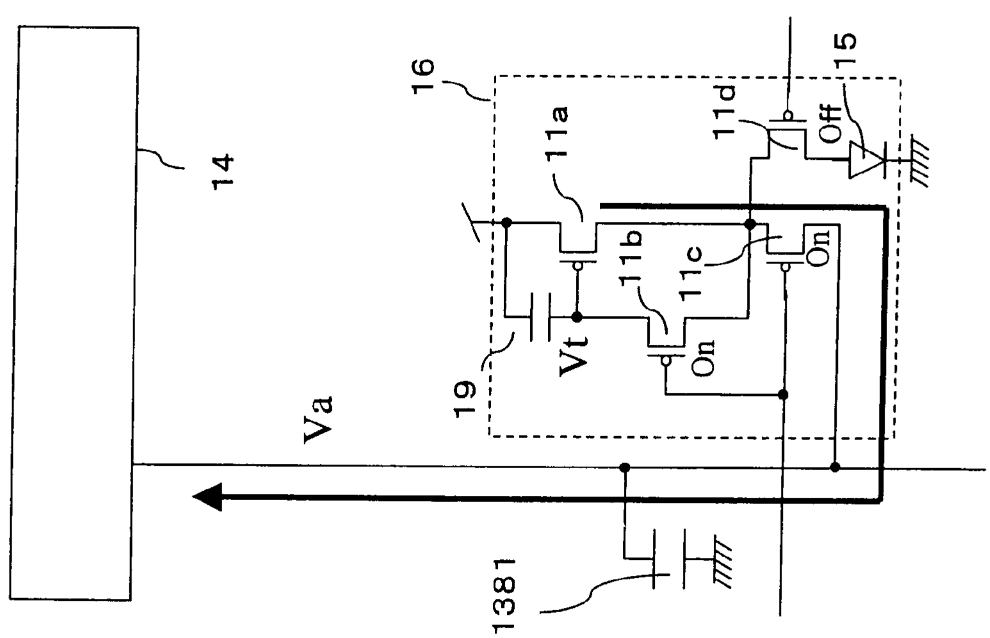
Figure 142:
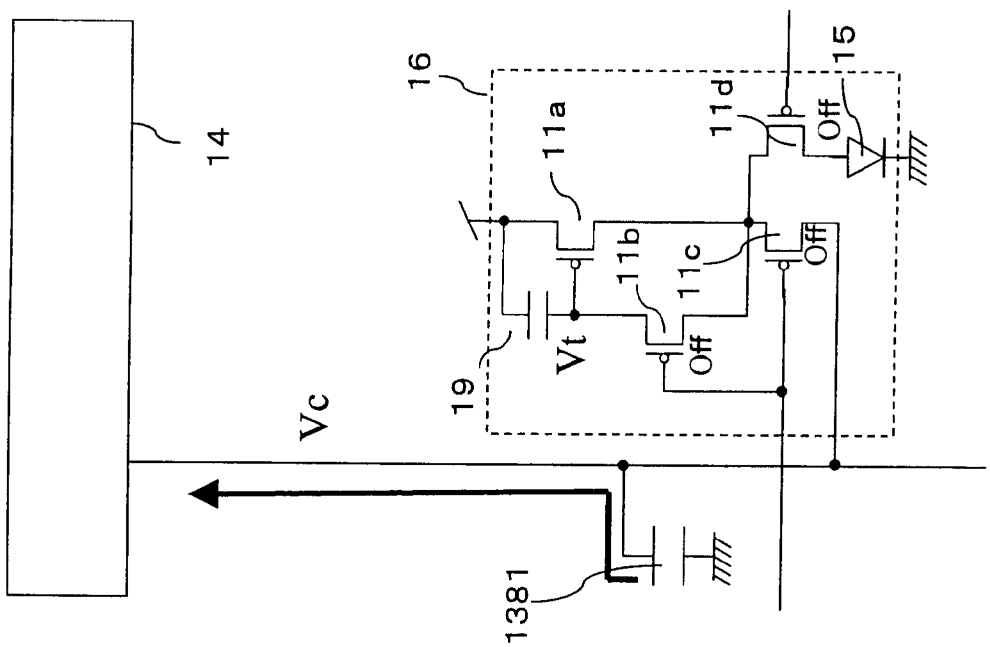
Figure 143:
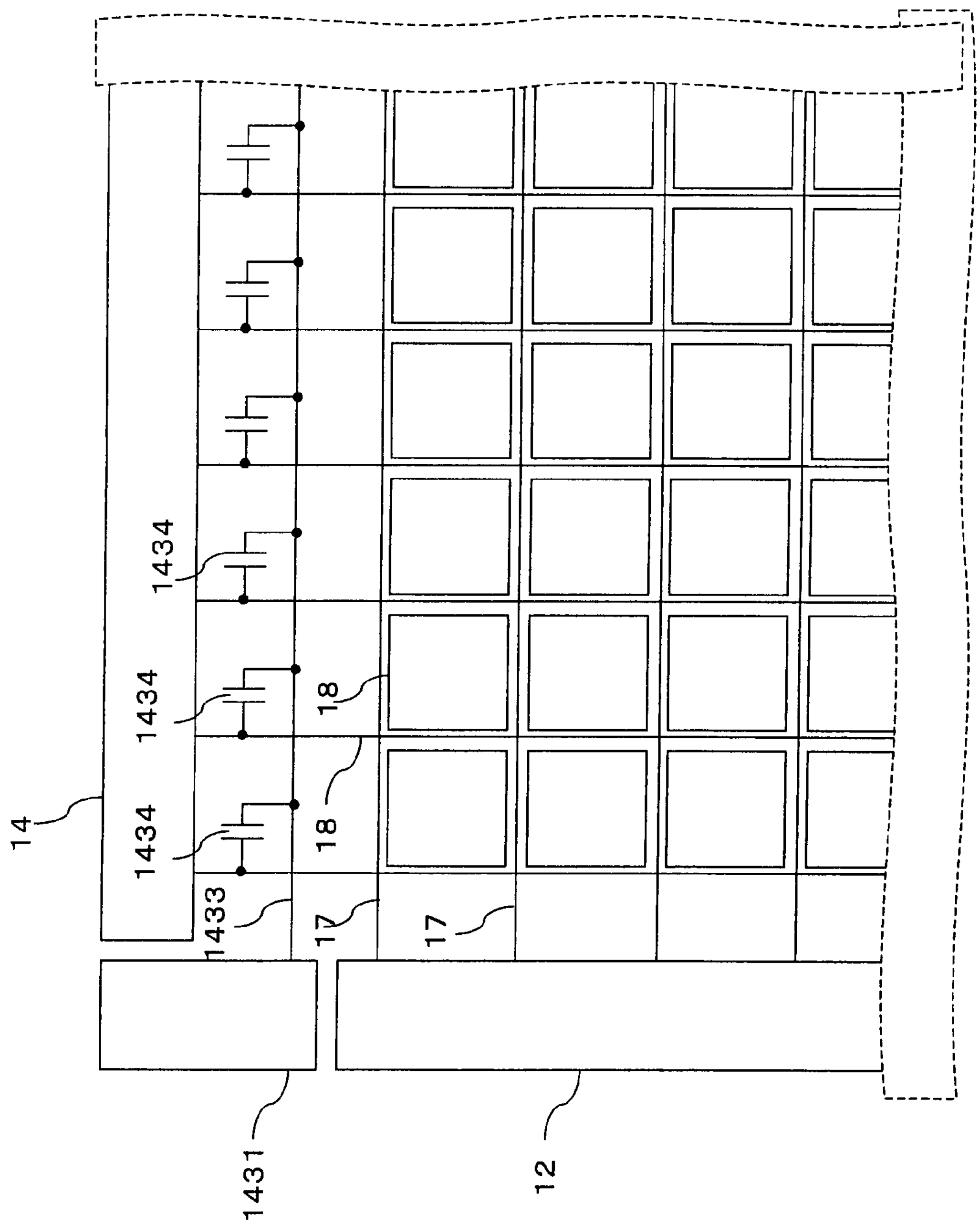
Figure 144:
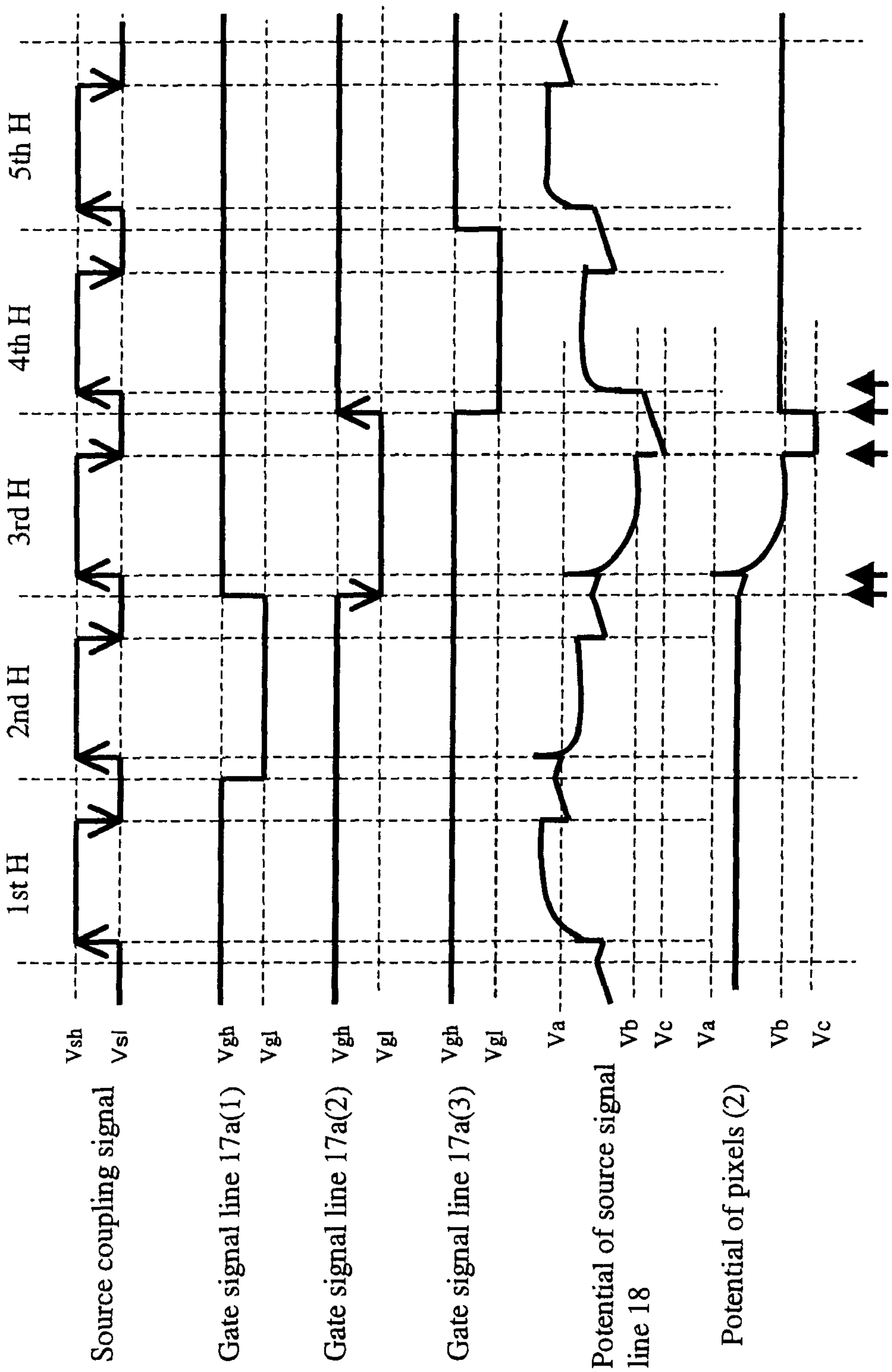
Figure 146:
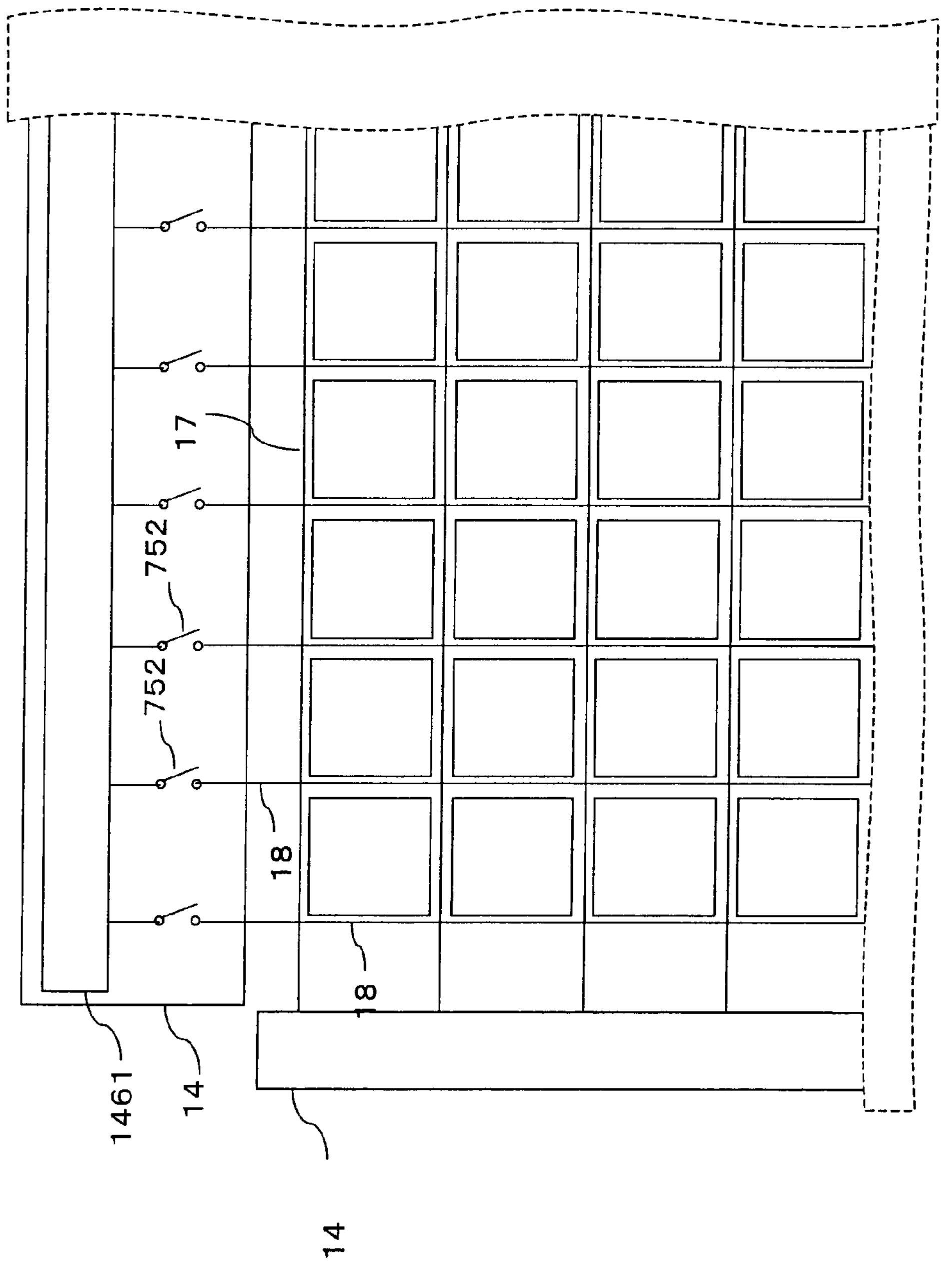
Figure 147:
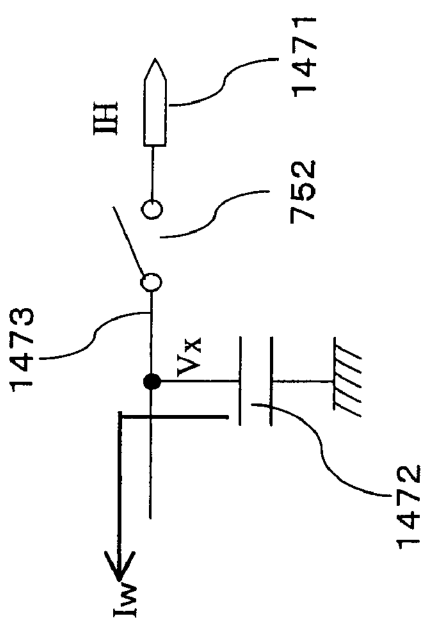
Figure 147:
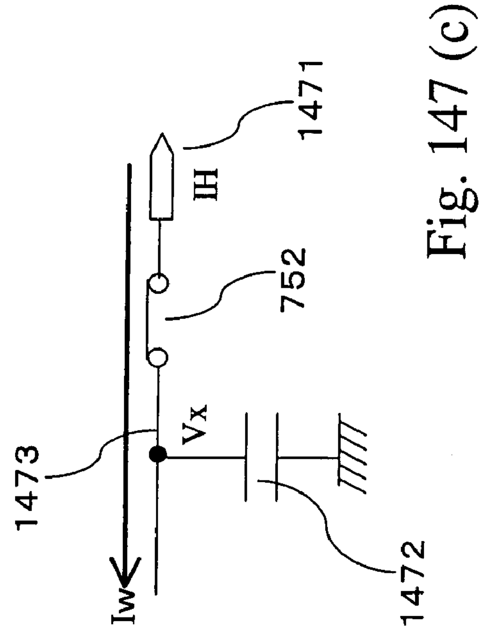
Figure 147:
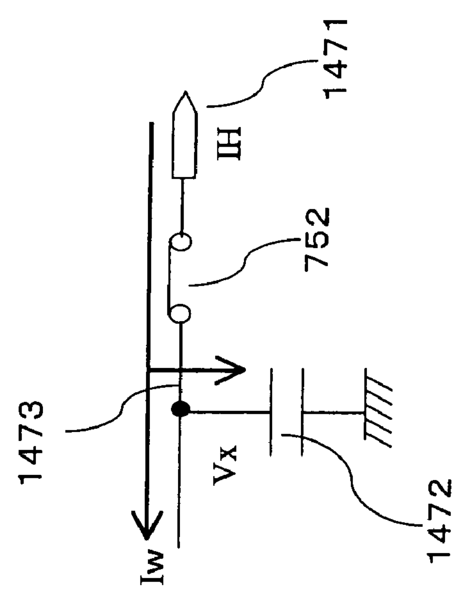
Figure 148:
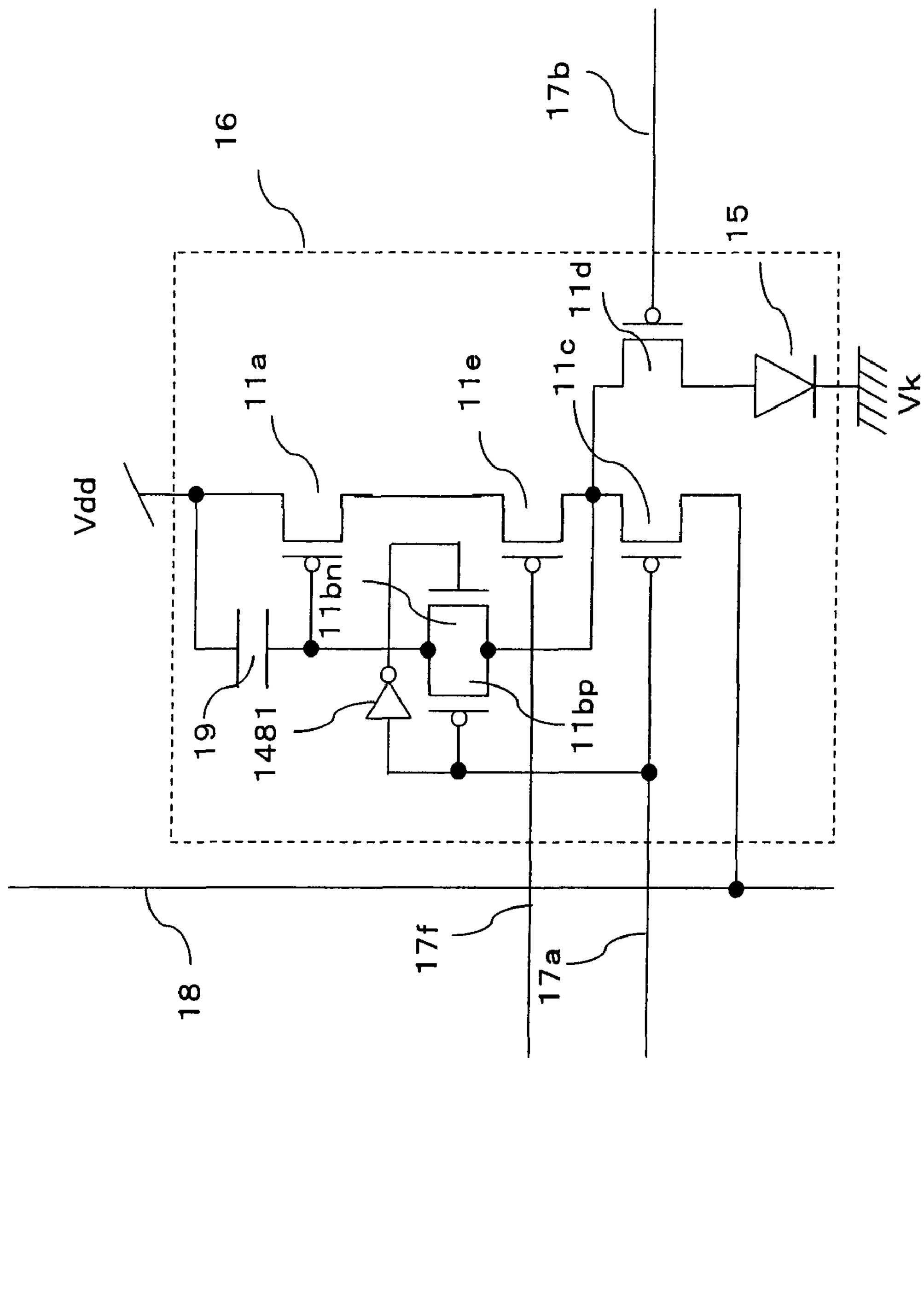
Figure 149:
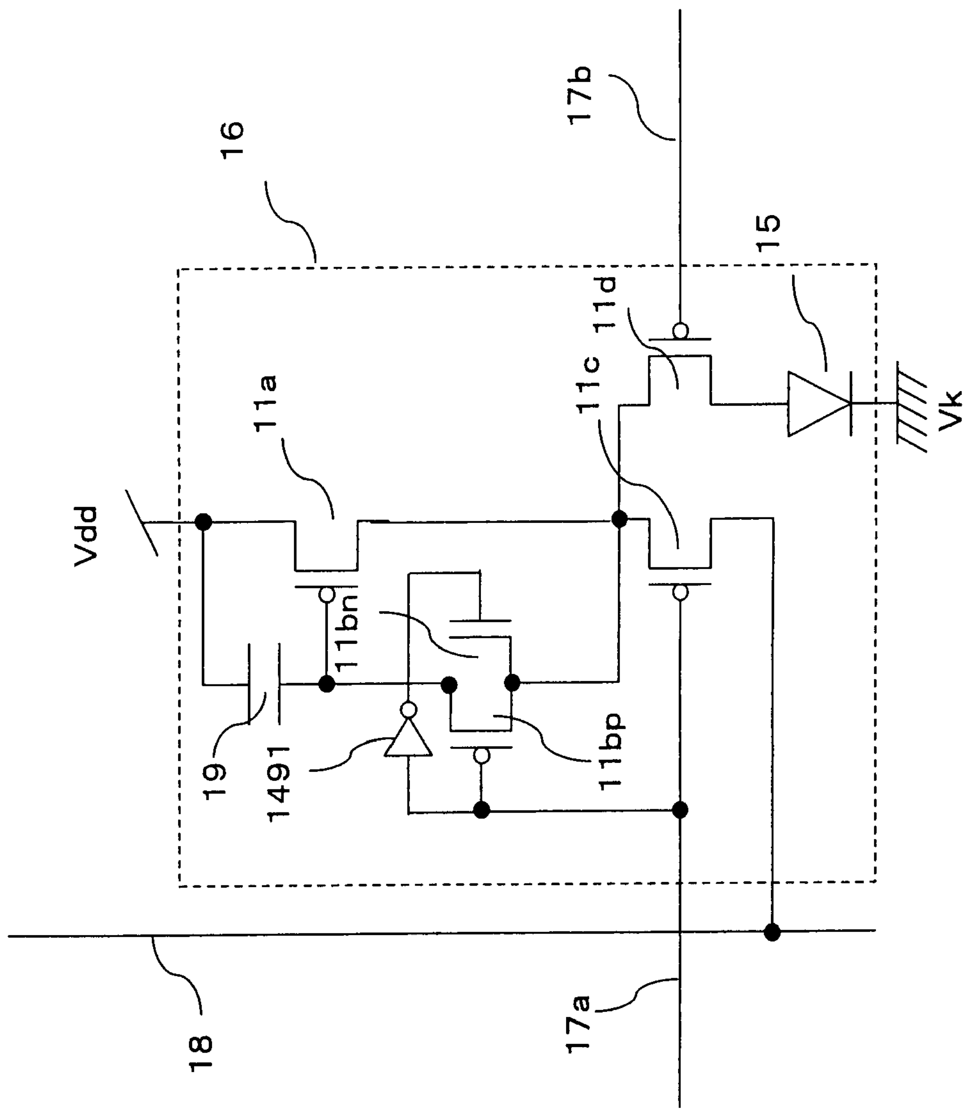
Figure 150:
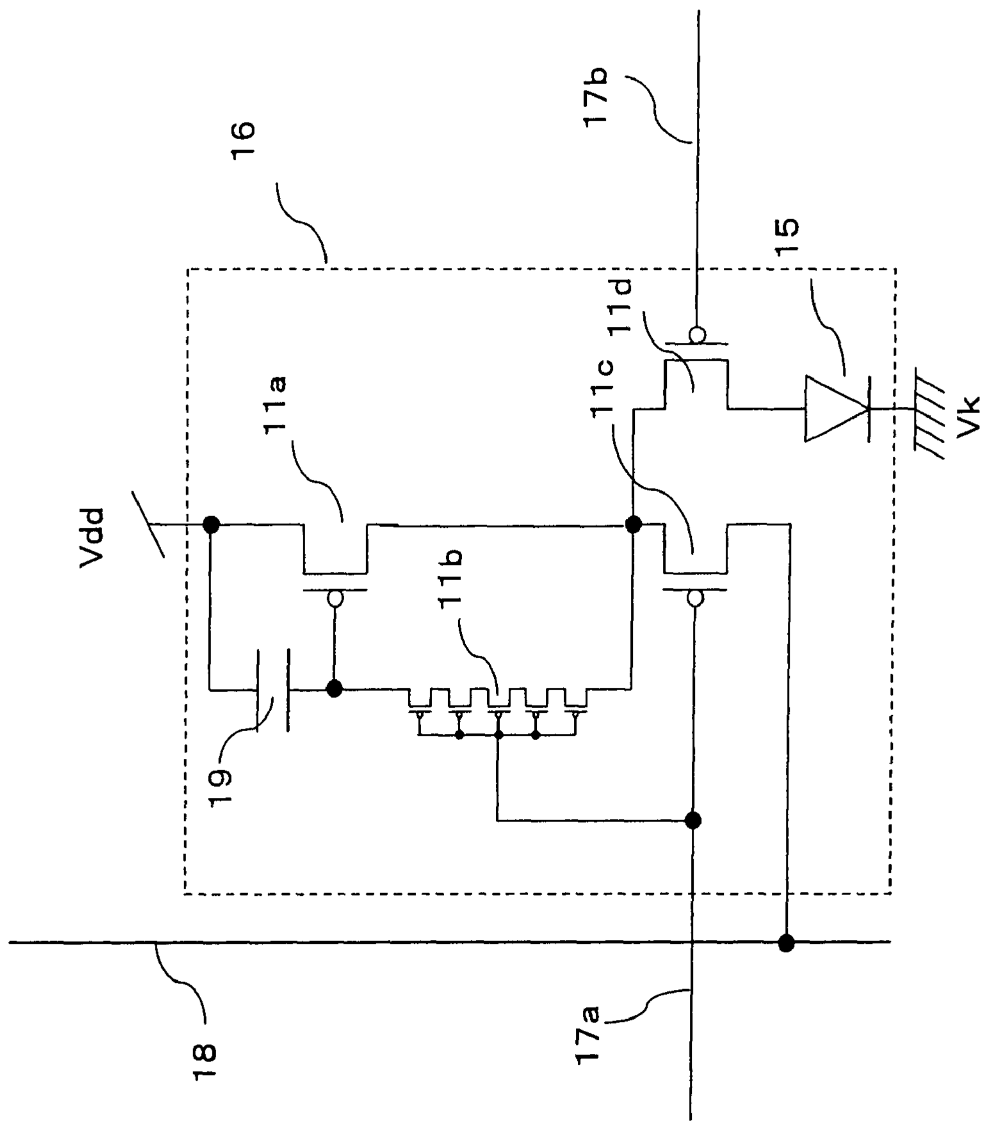
Figure 151:
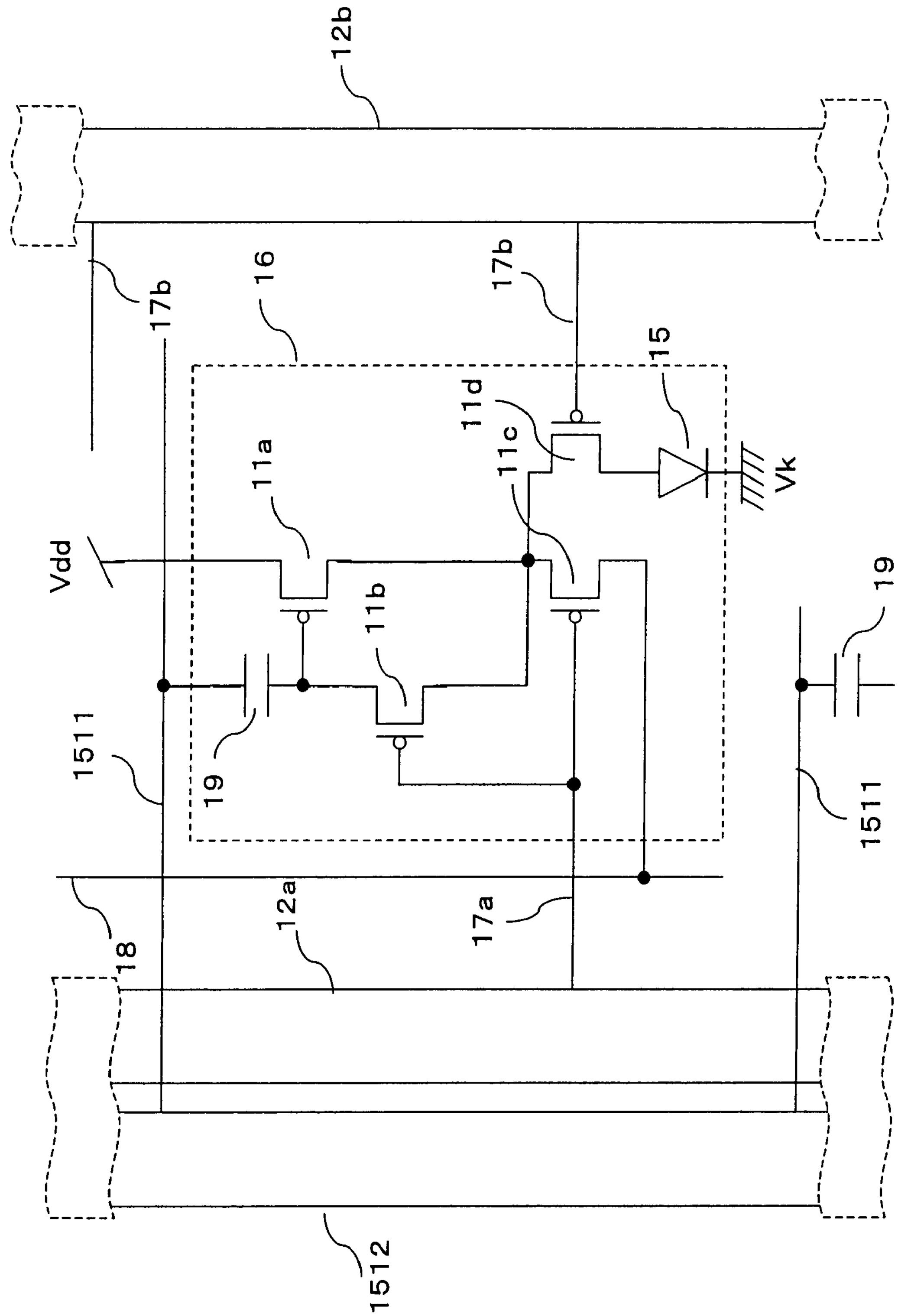
Figure 152:
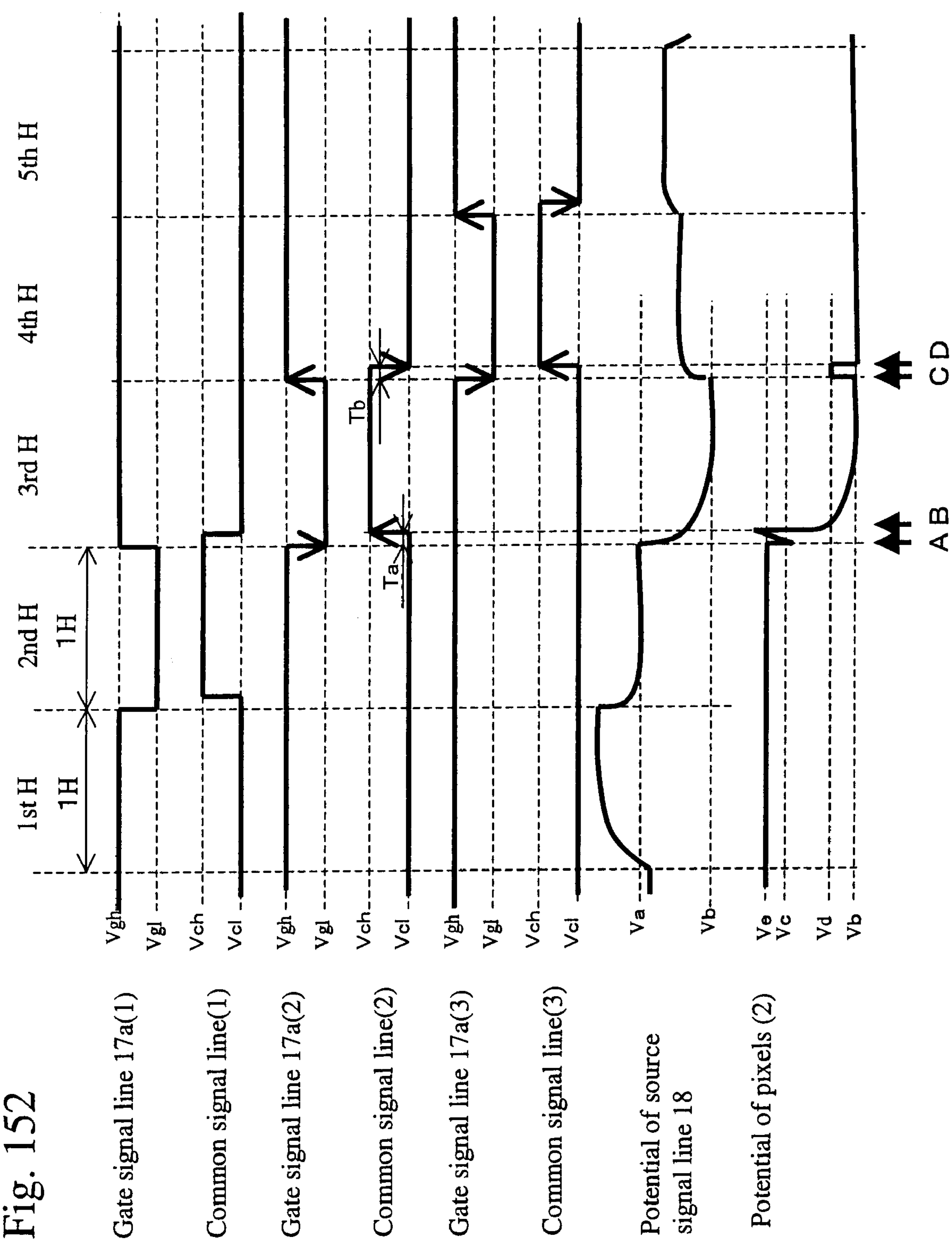
Figure 153:
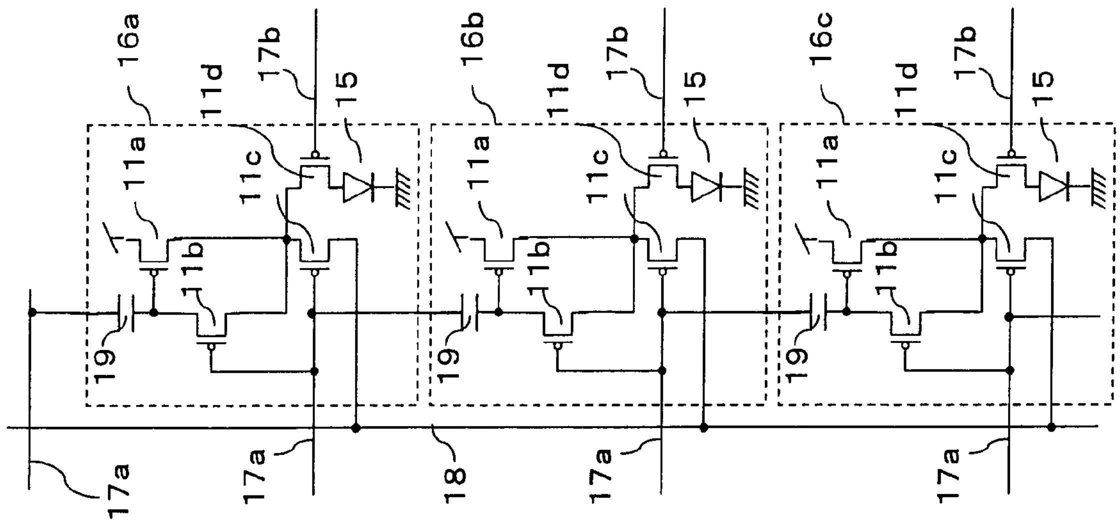
Figure 154:
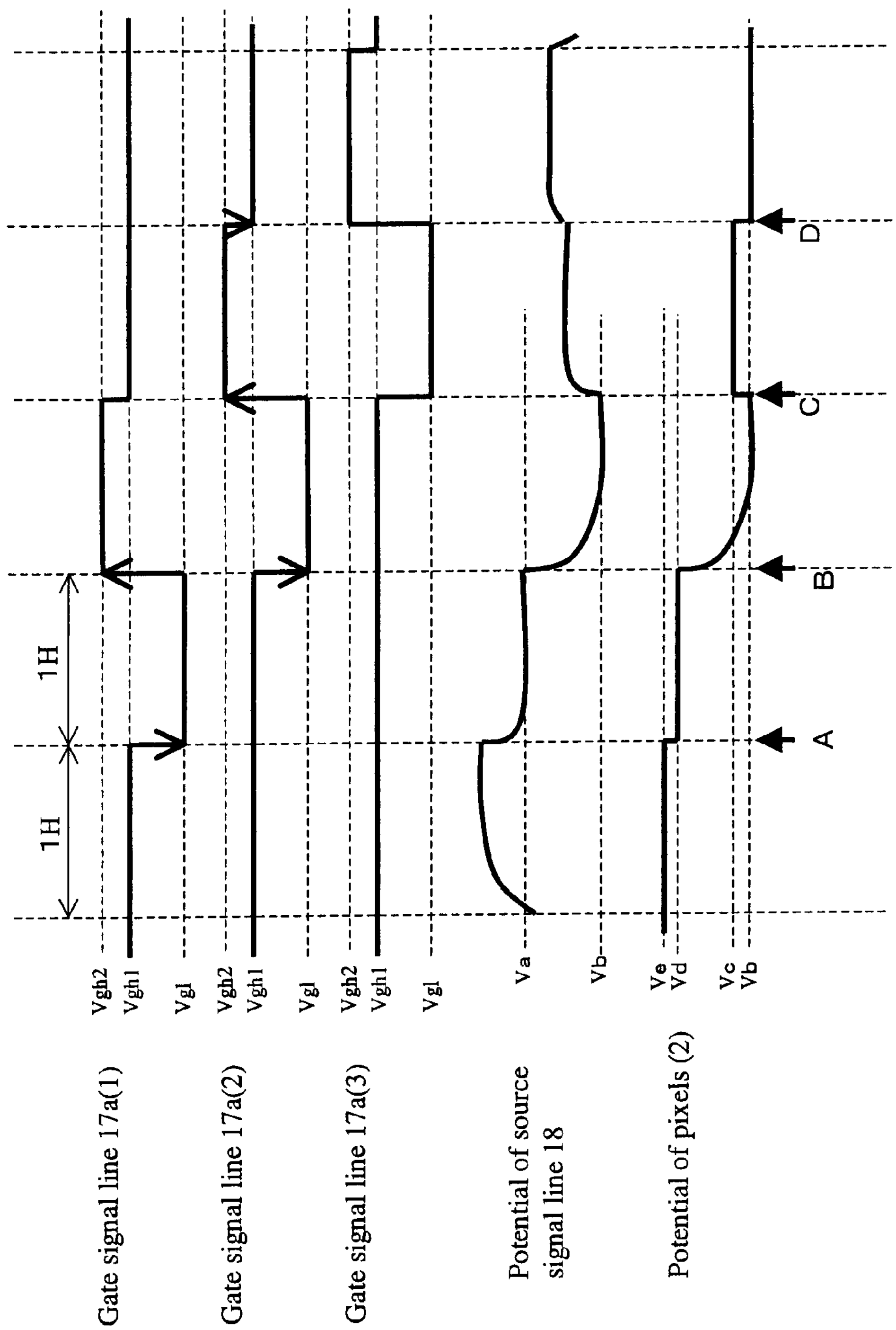
Figure 155:
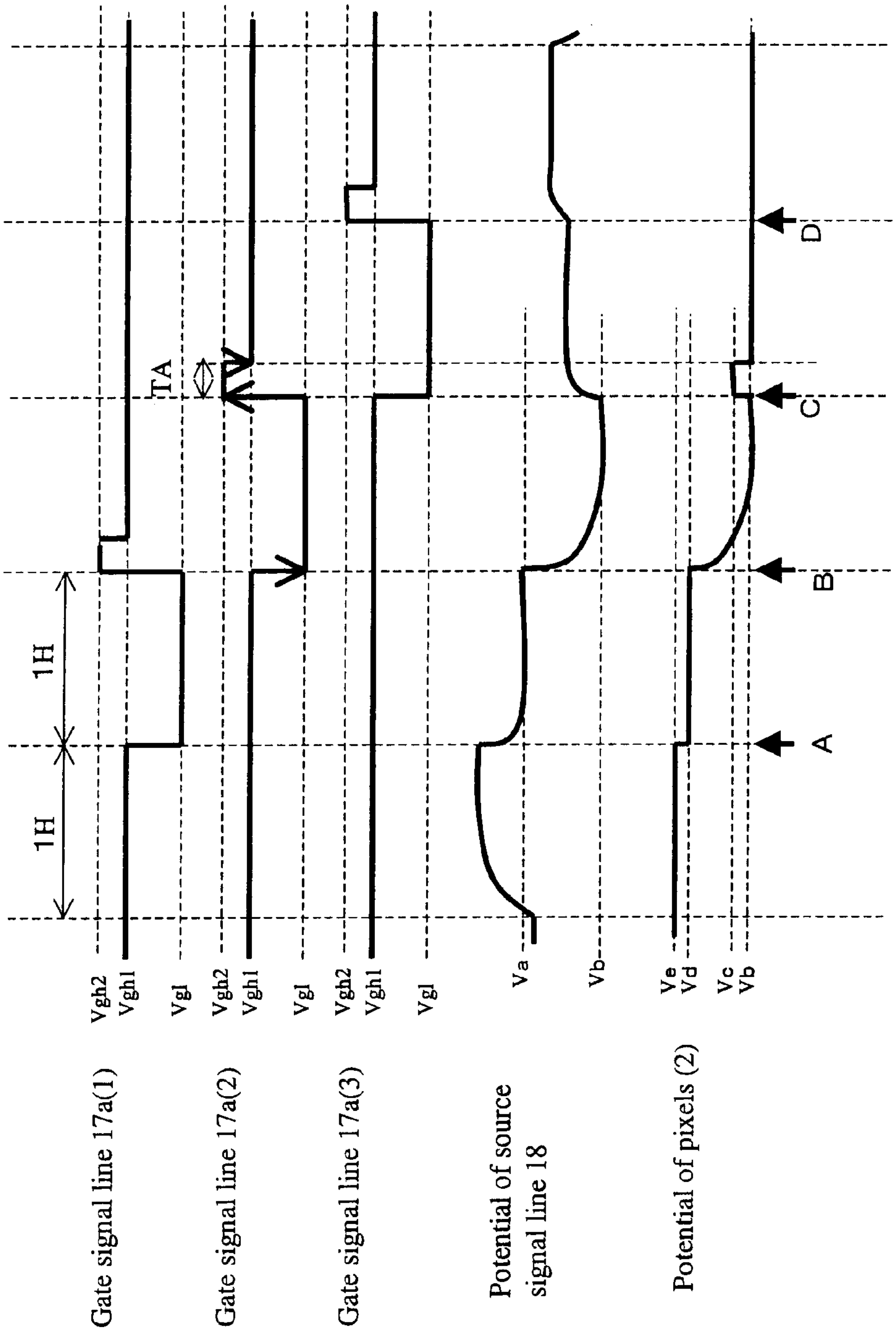
Figure 156:
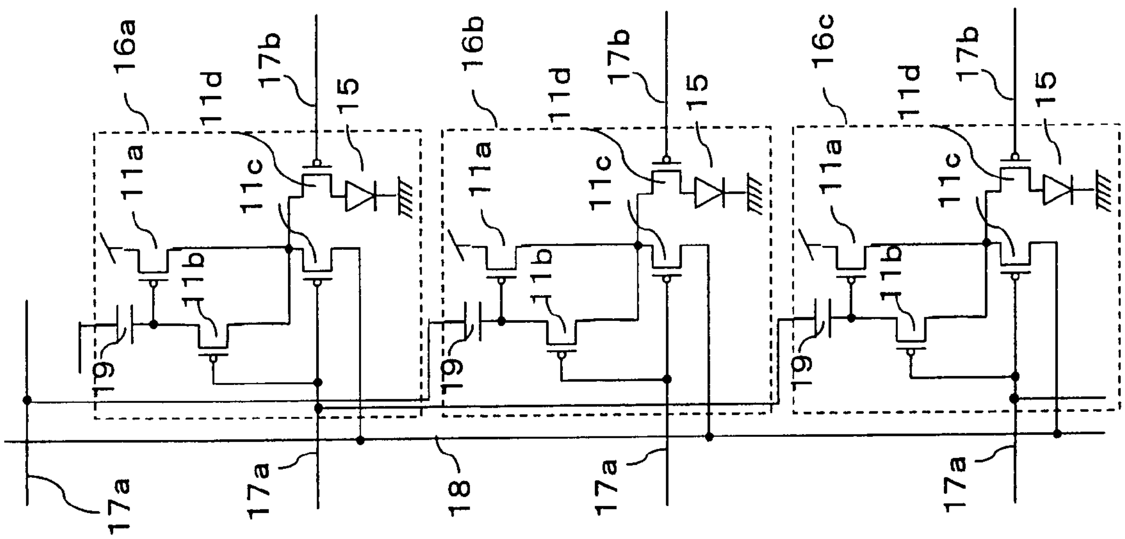
Figure 157:
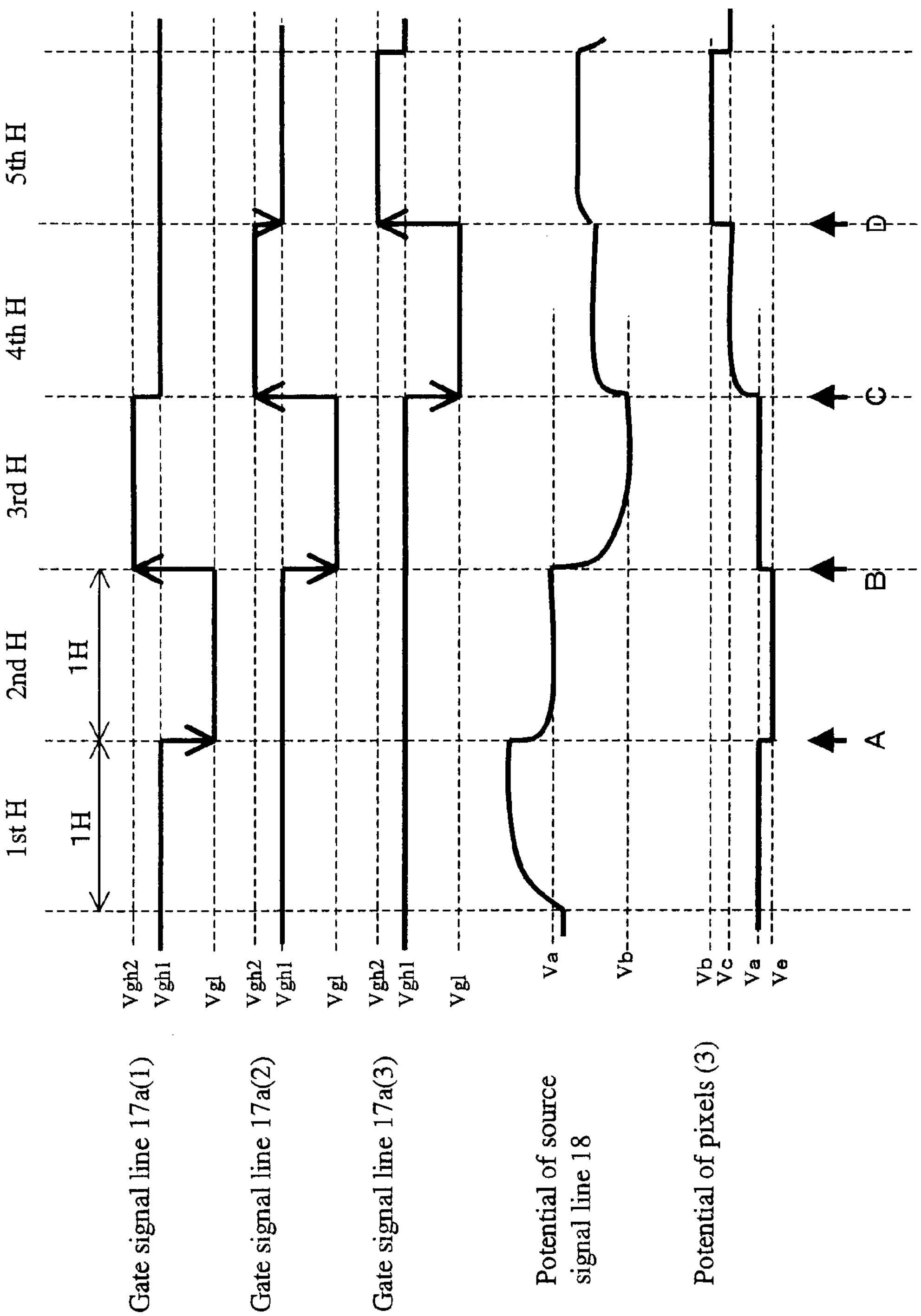
Figure 158:
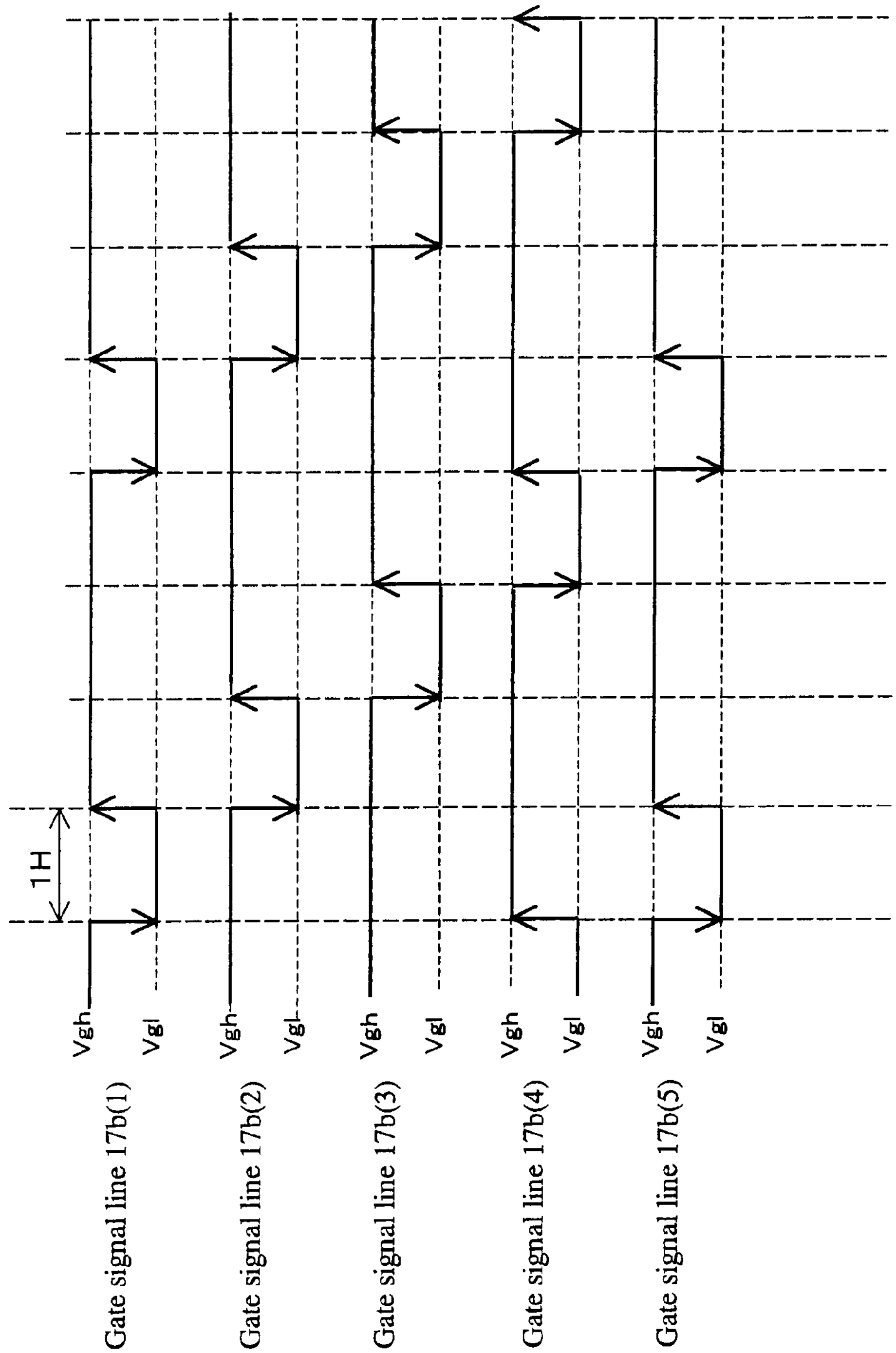
Figure 159:
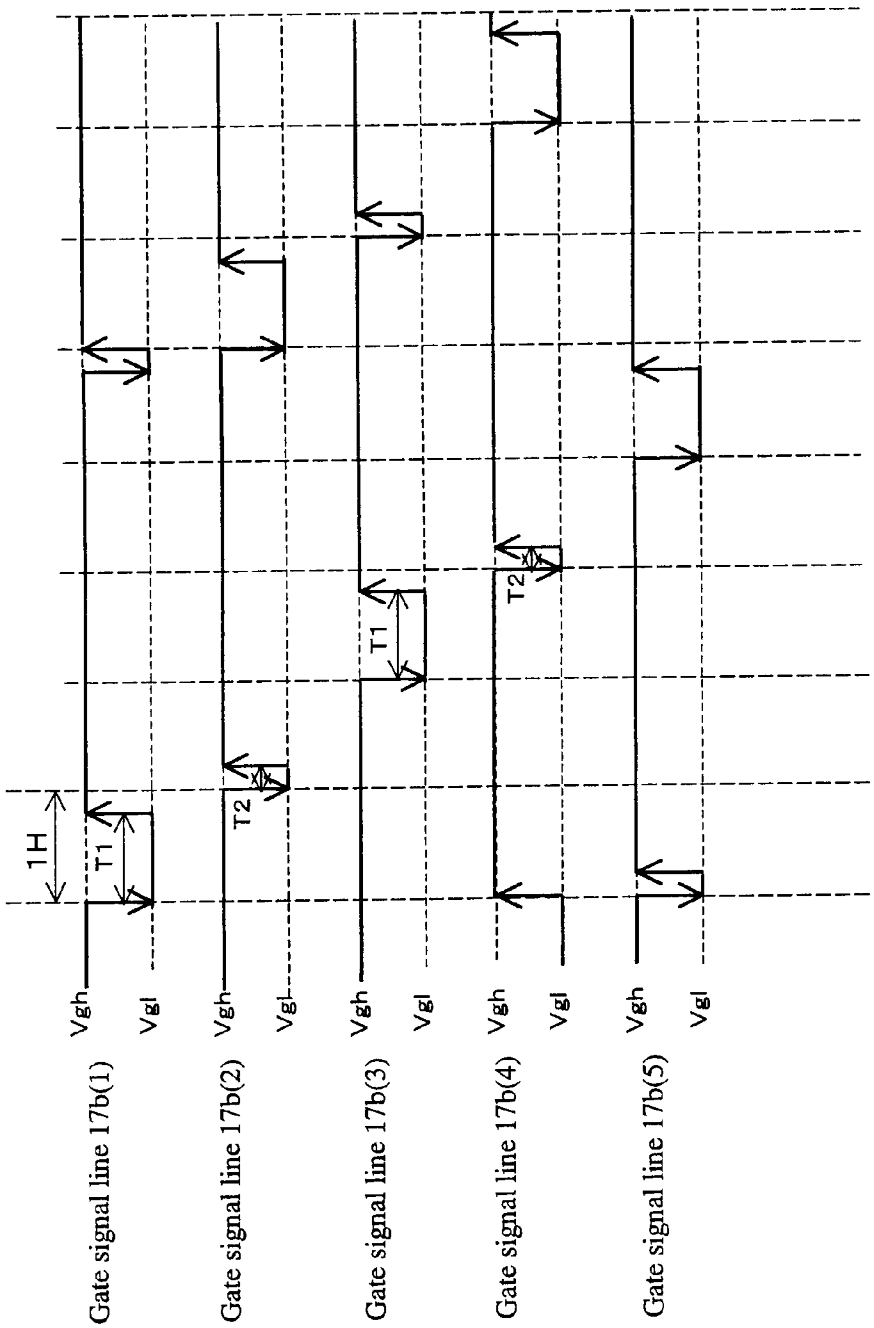
Figure 160:
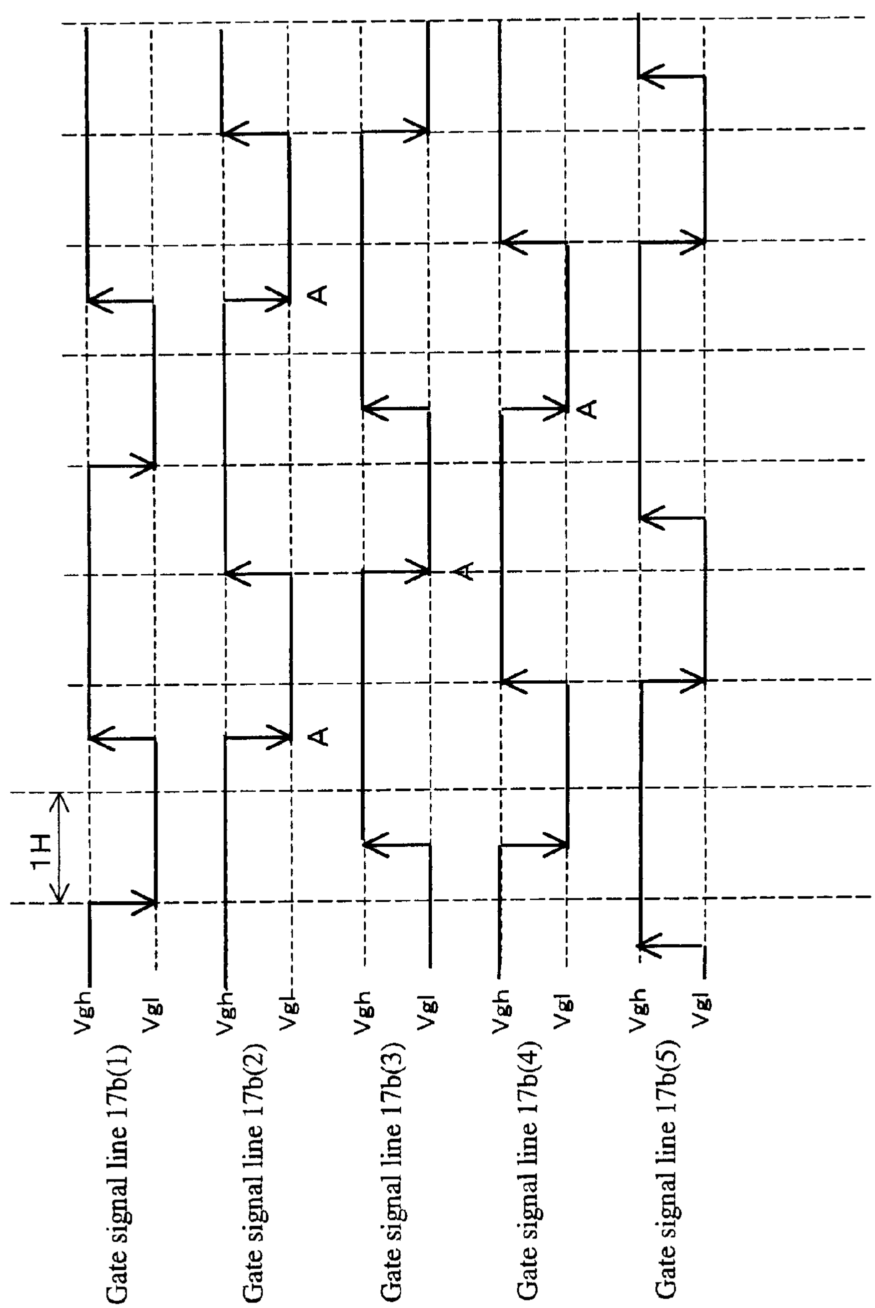
Figure 161:
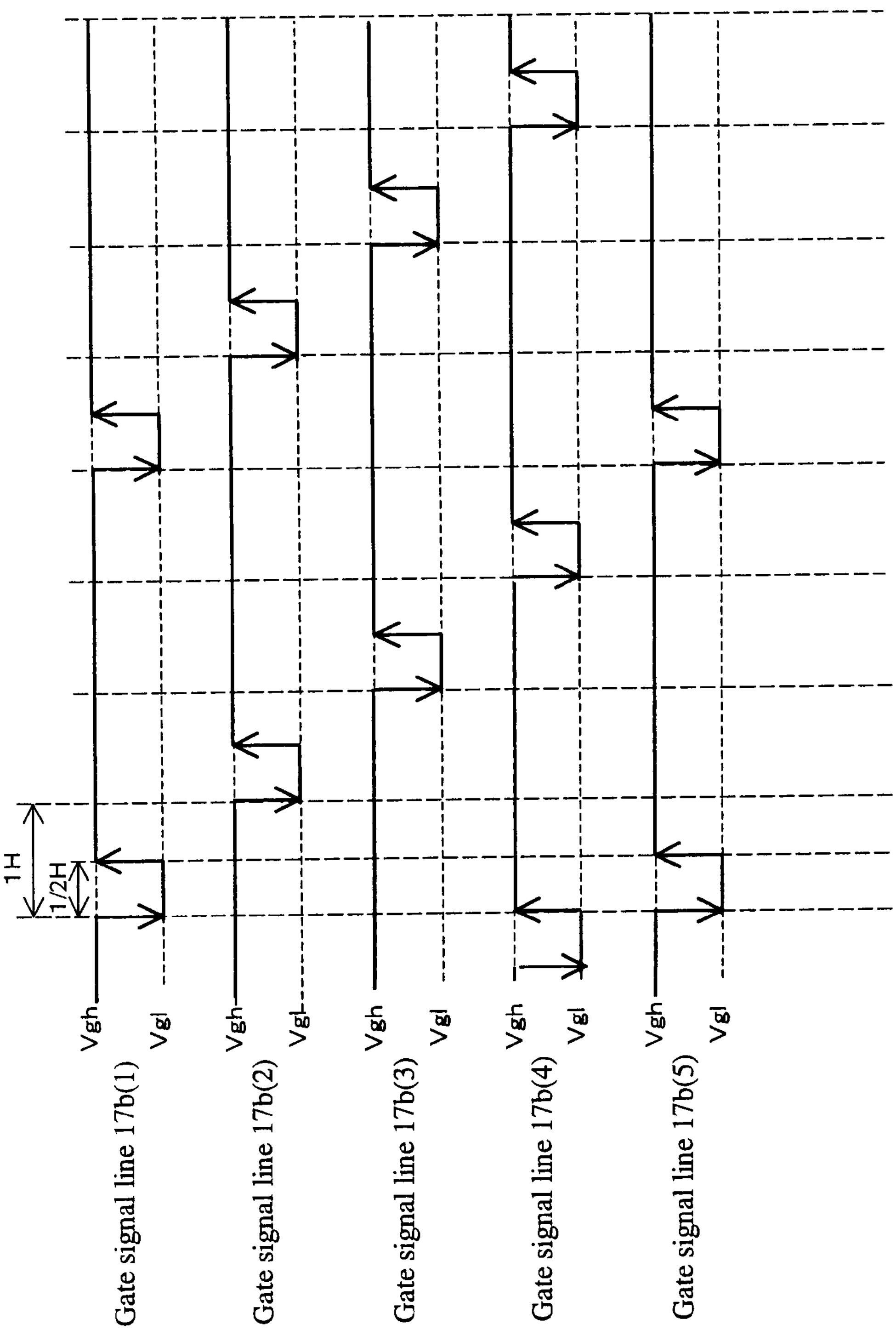
Figure 162:
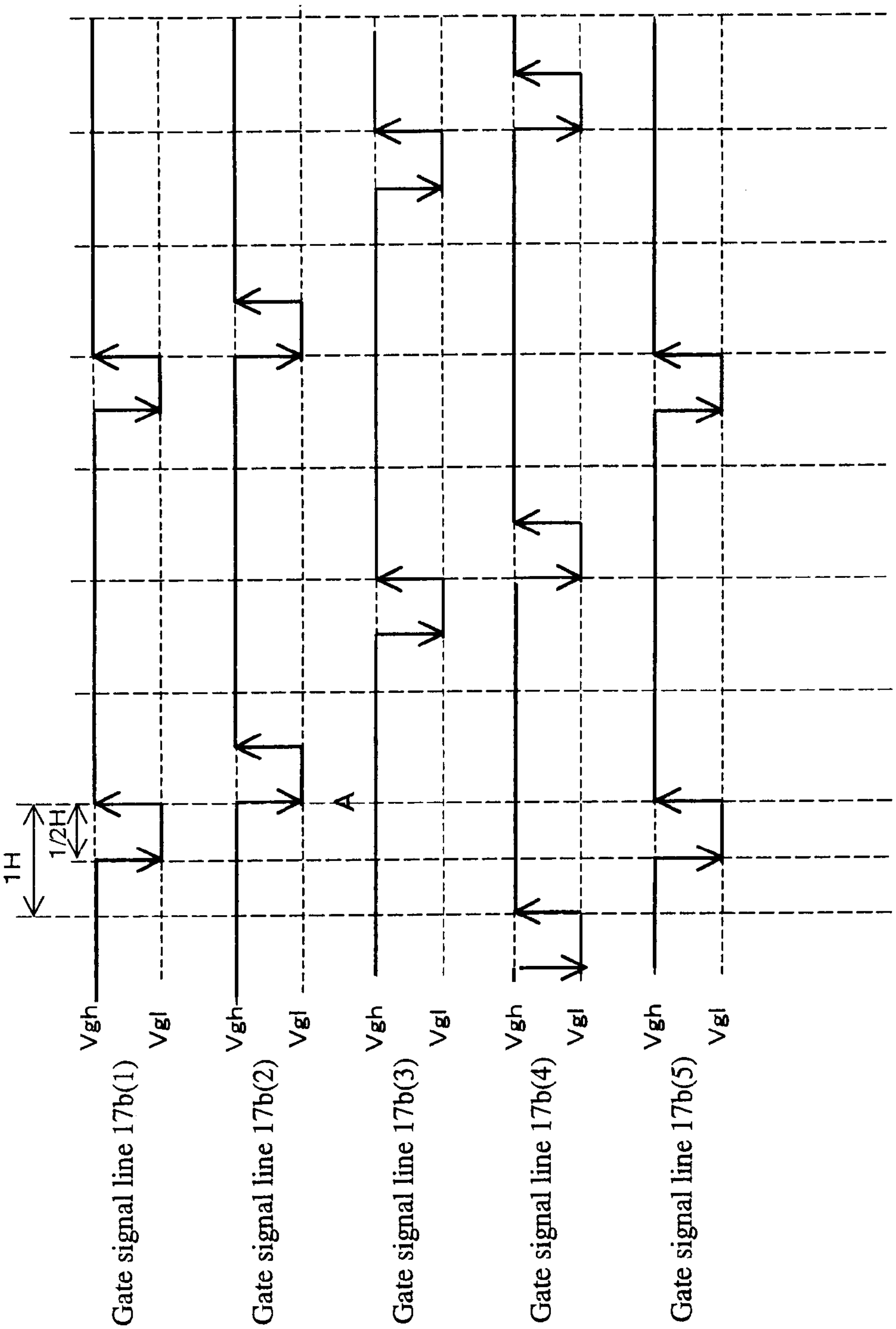
Figure 163:
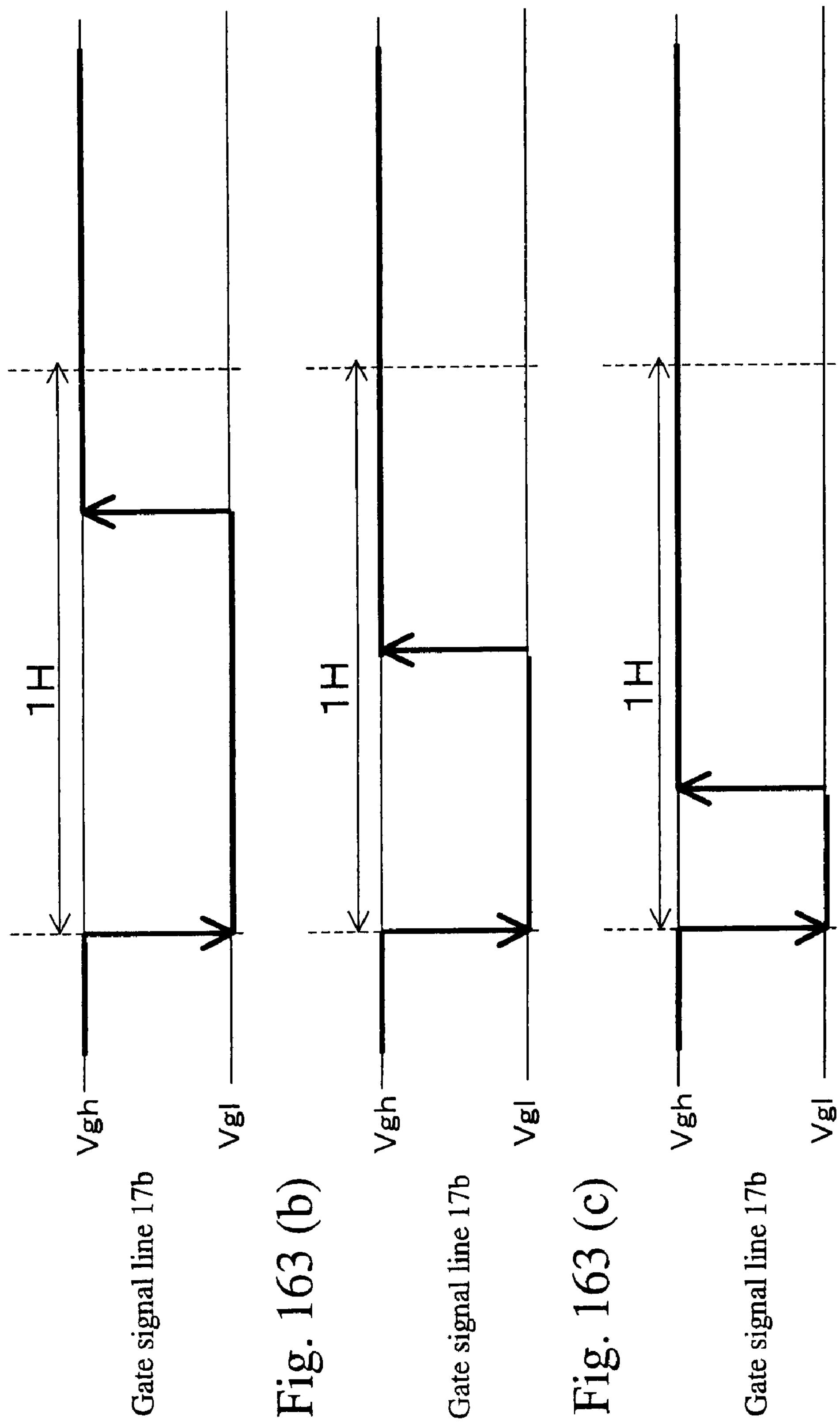
Figure 164:
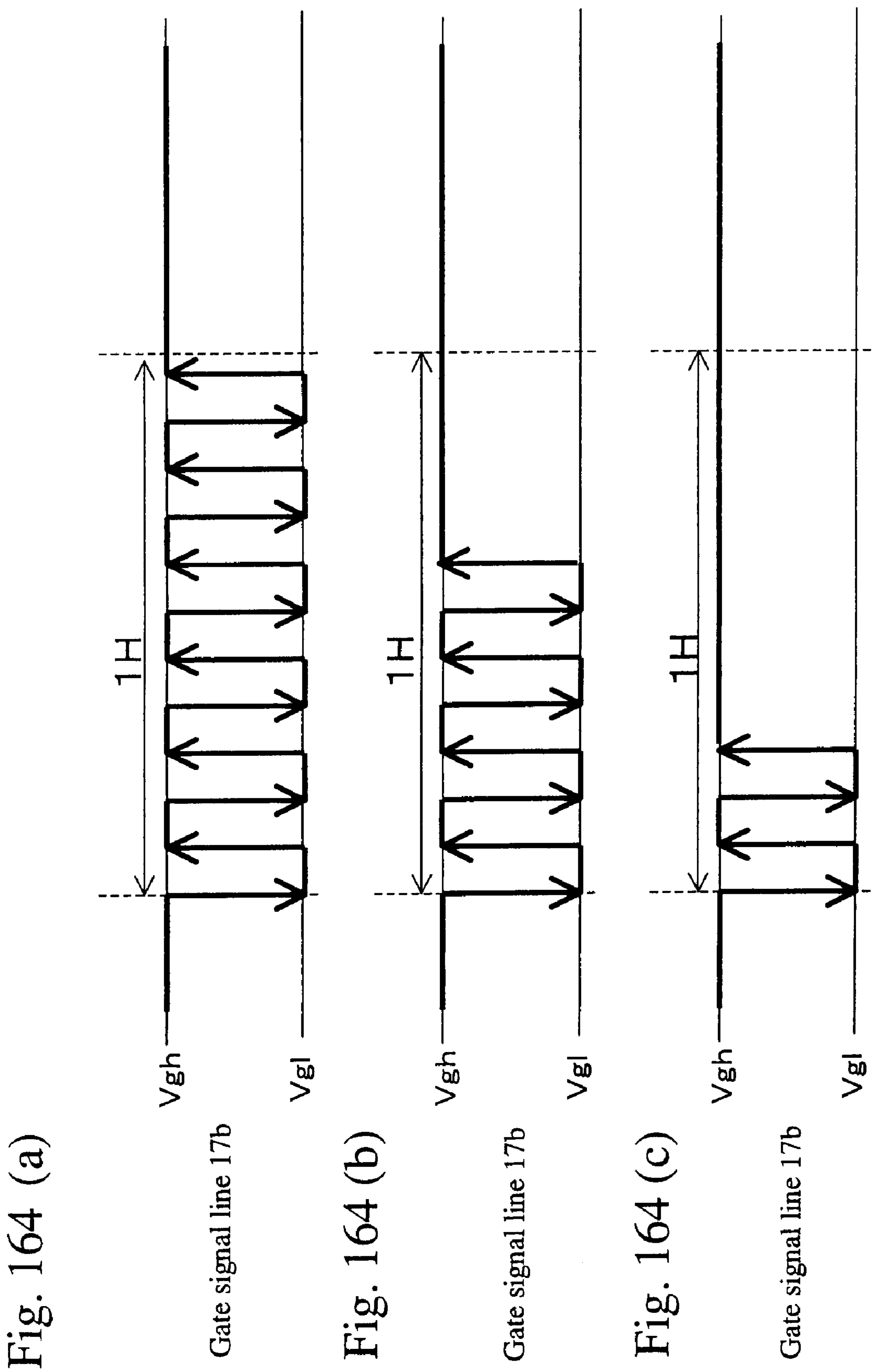
Figure 165:
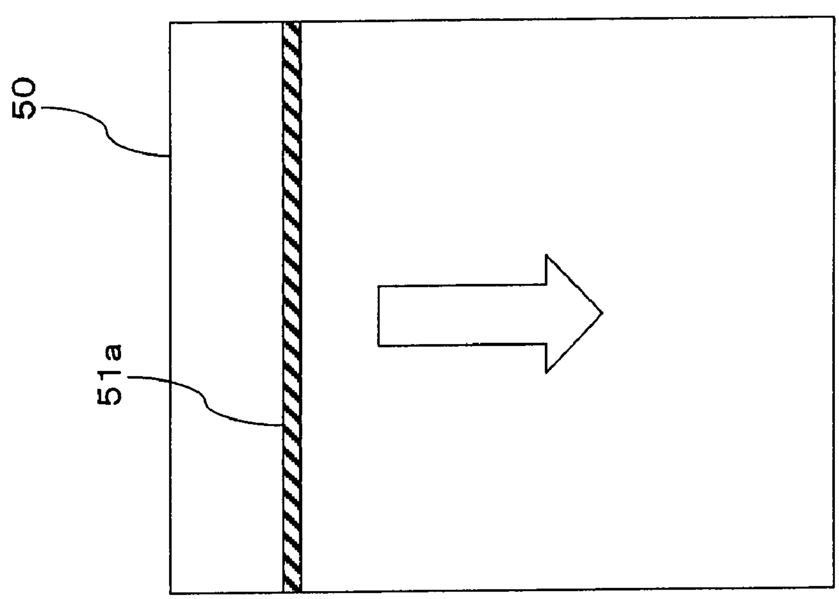
Figure 165:
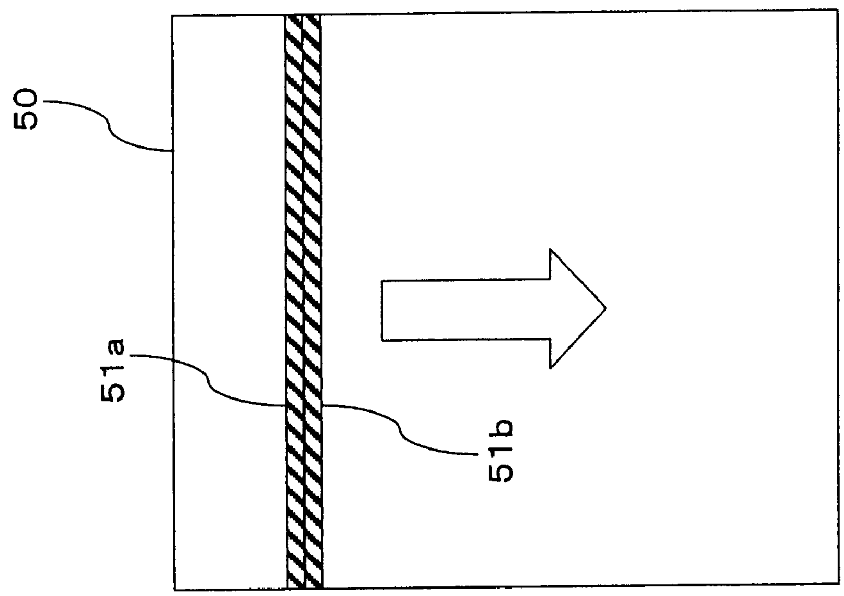
Figure 166:
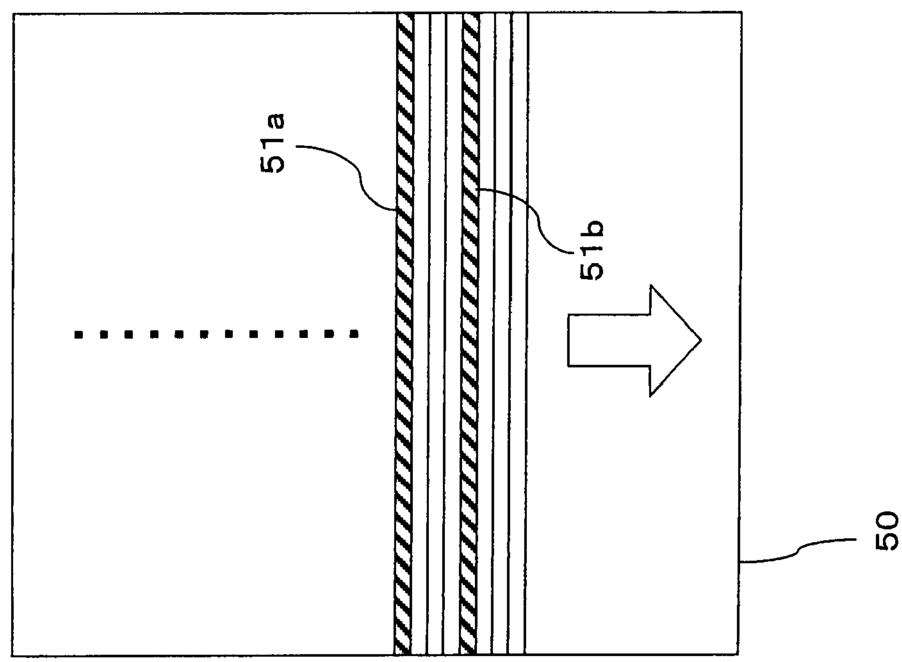
Figure 167:
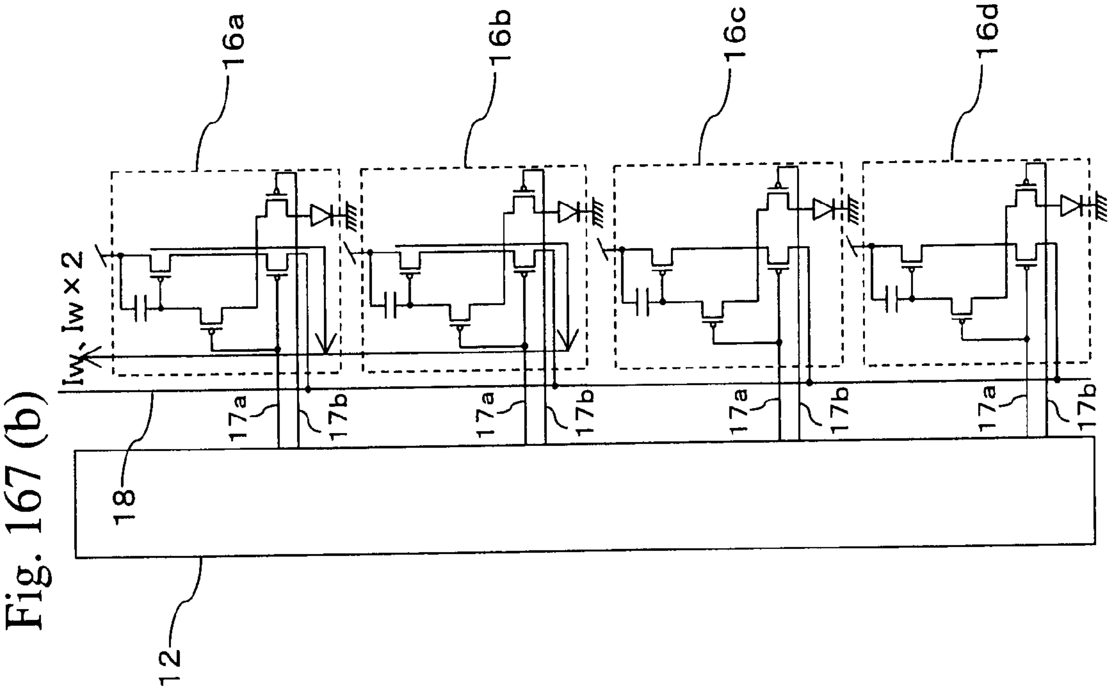
Figure 167:
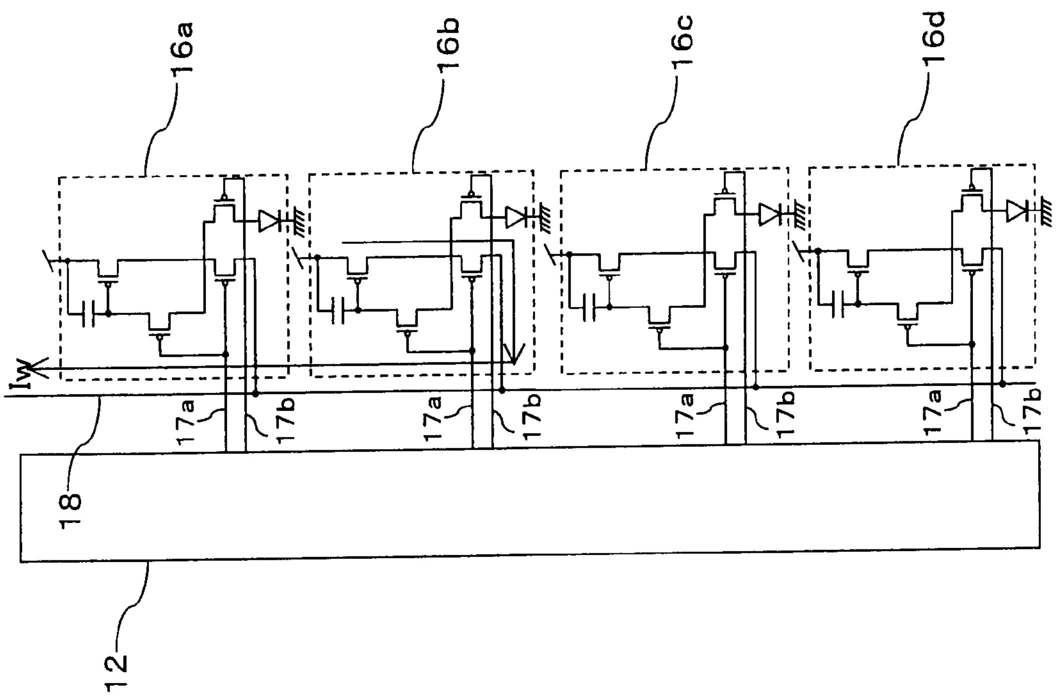
Figure 168:
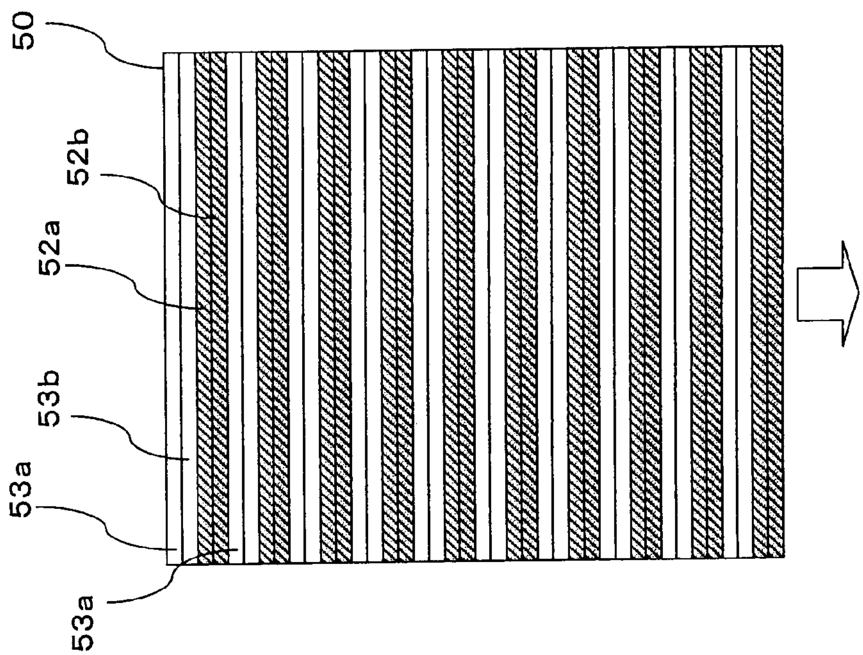
Figure 168:
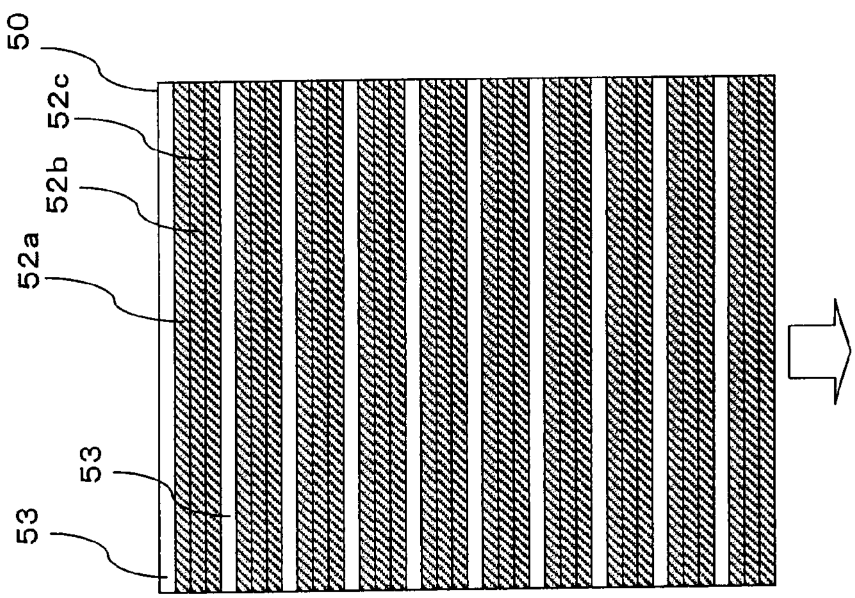
Figure 169:
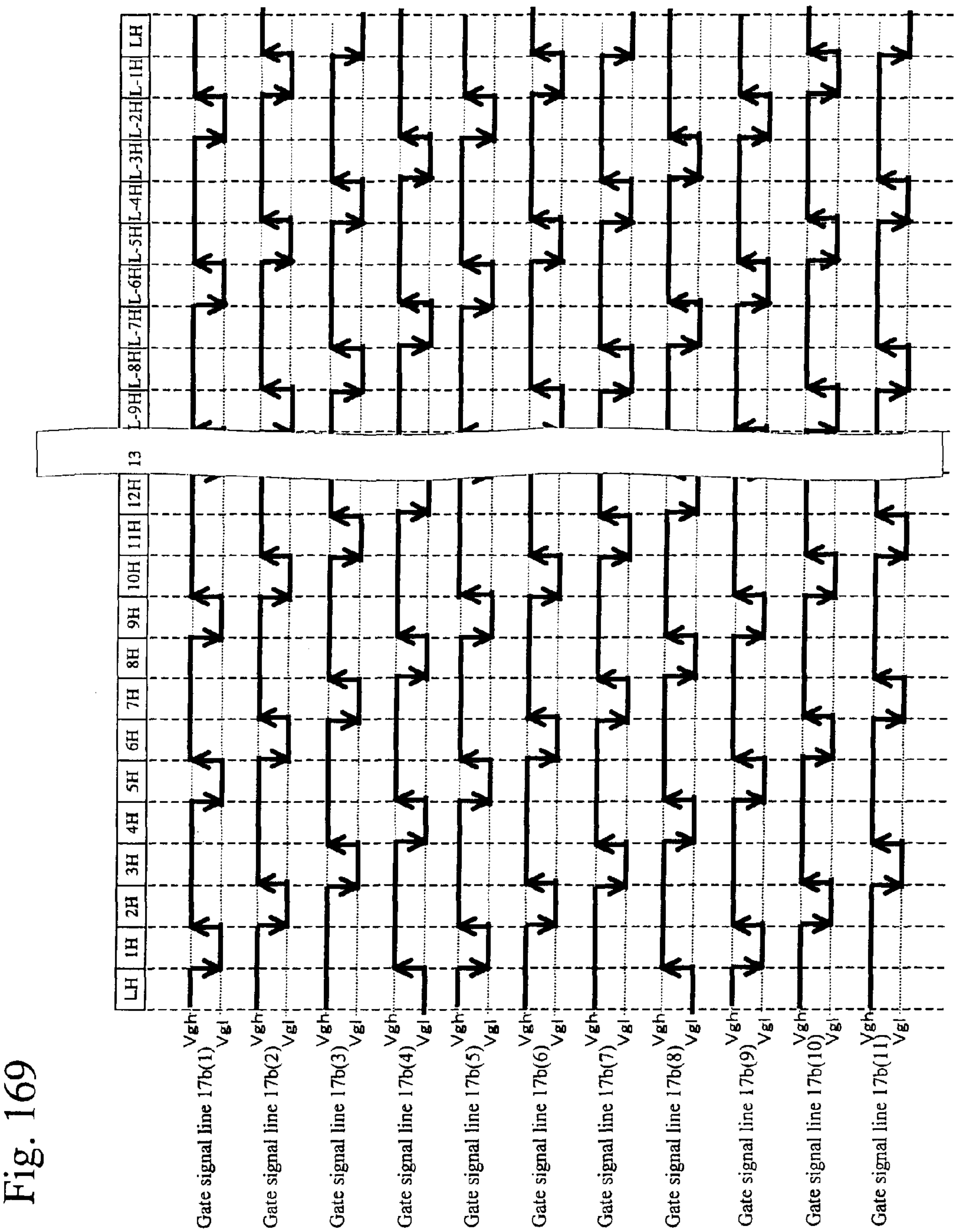
Figure 170:
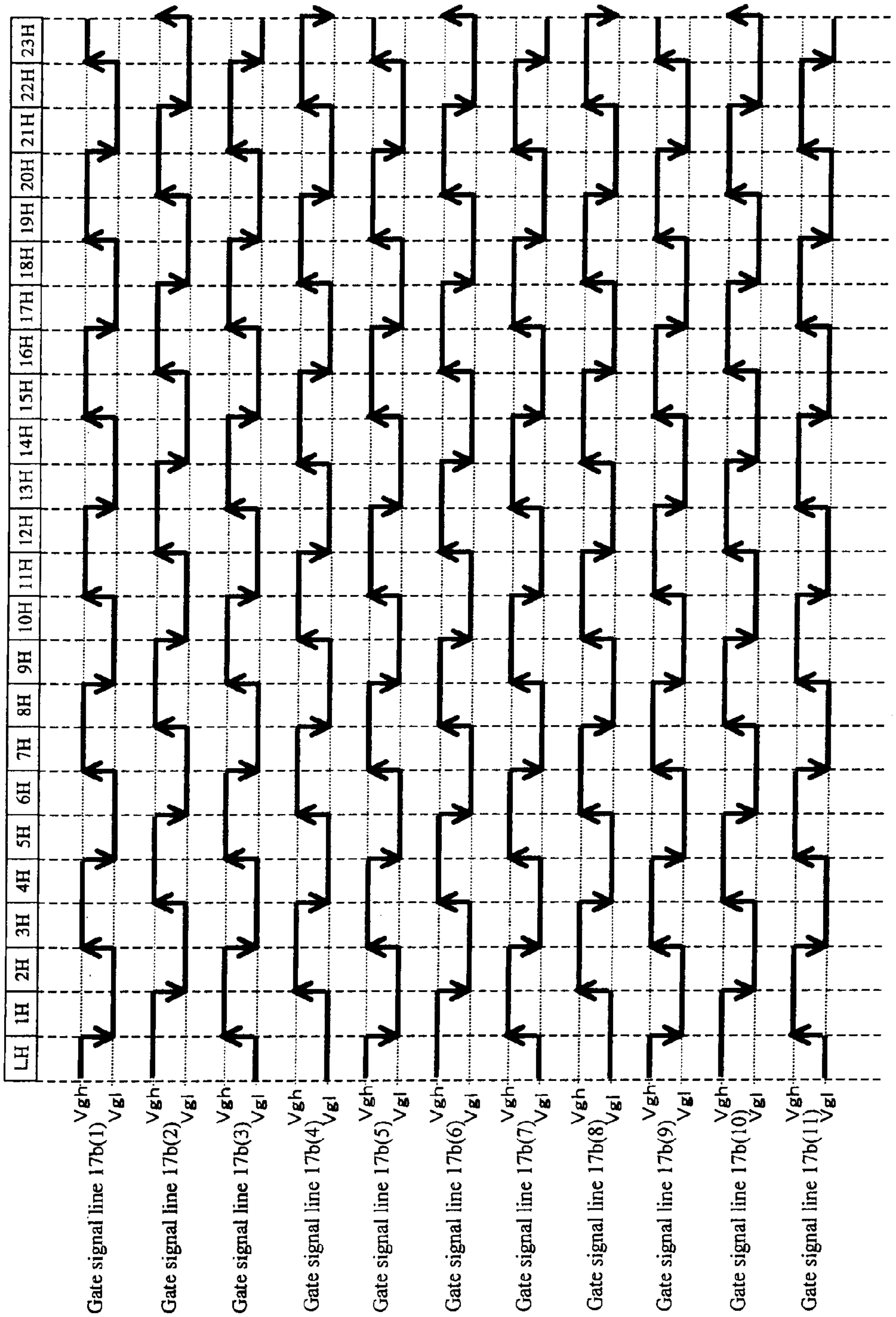
Figure 171:
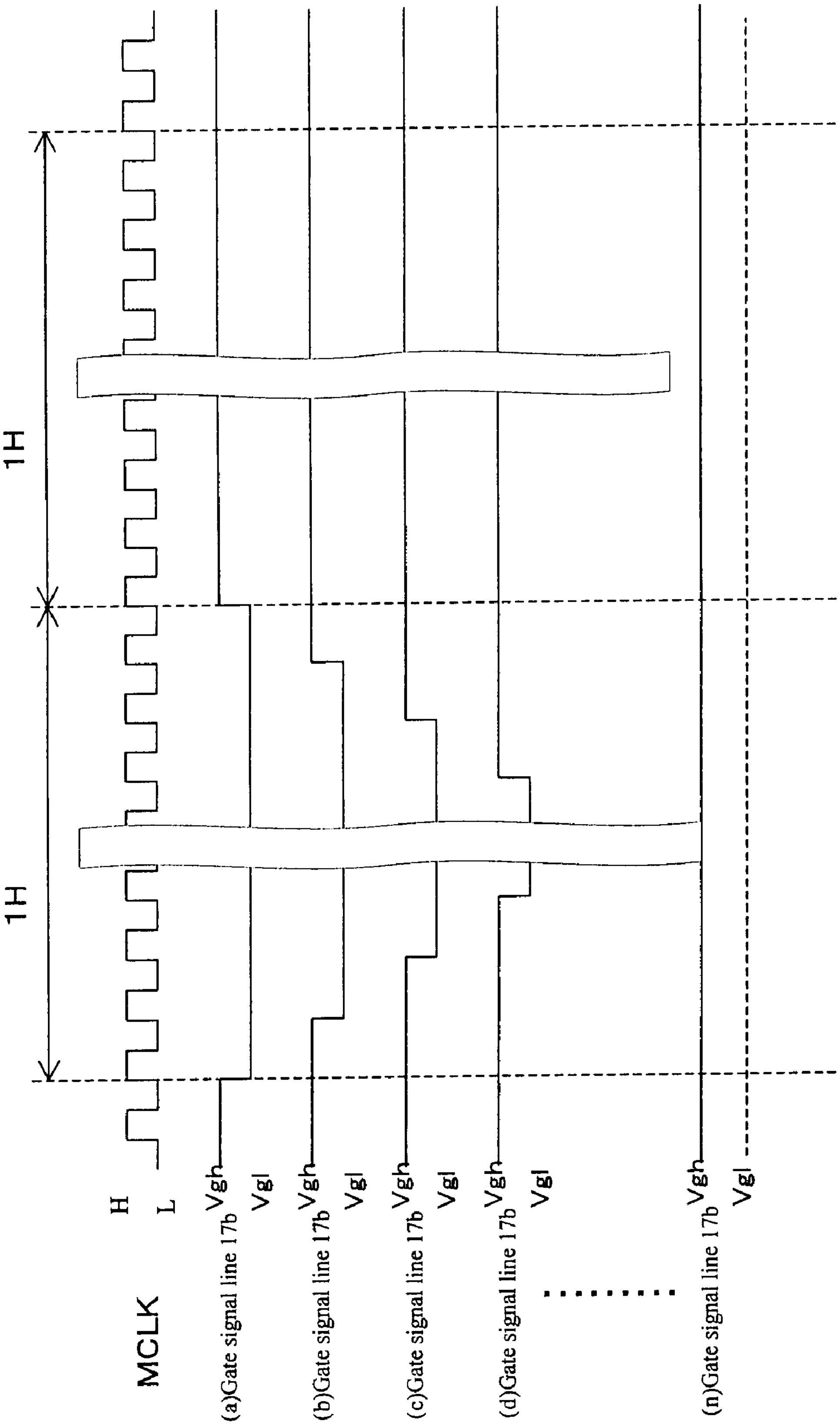
Figure 172:
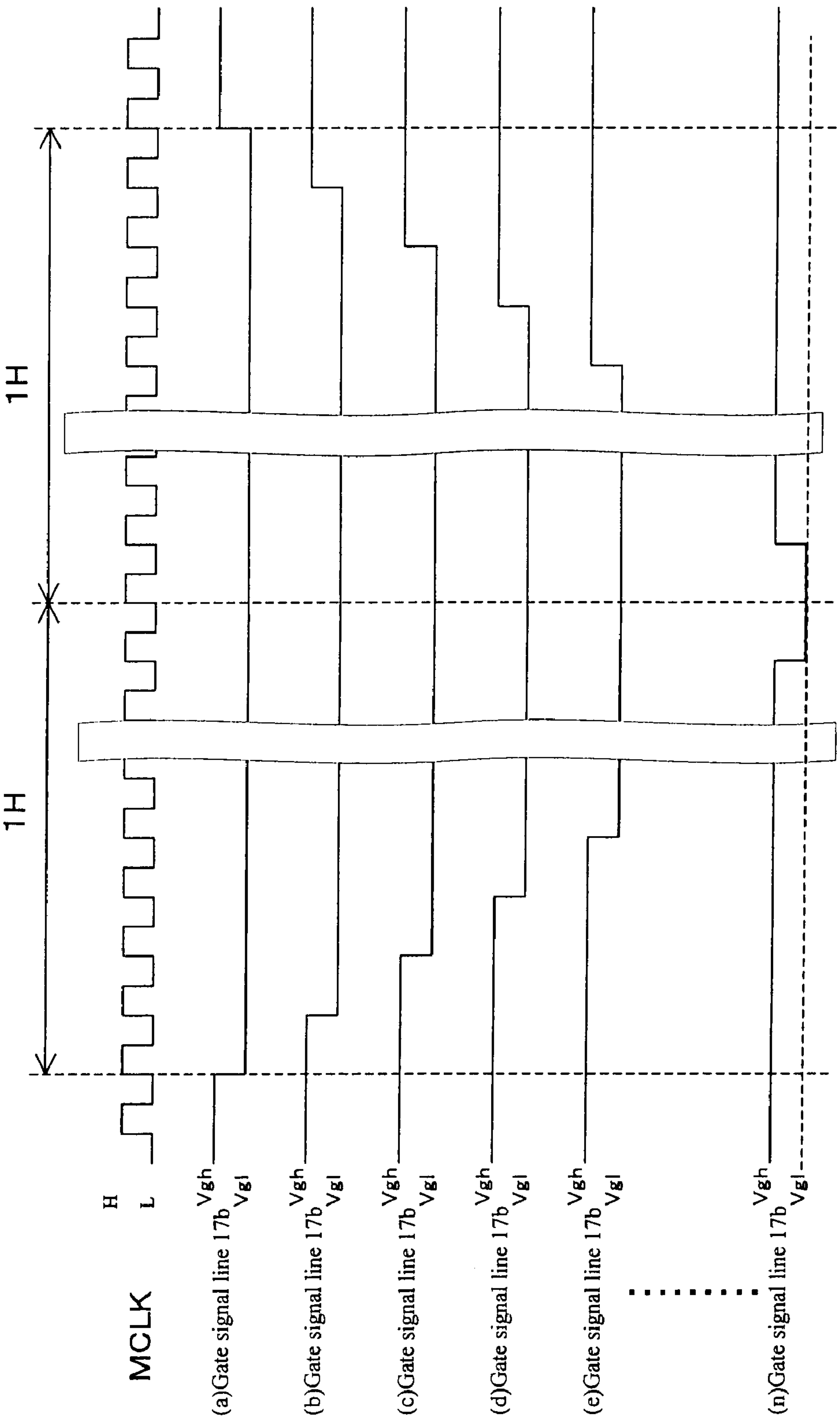
Figure 173:
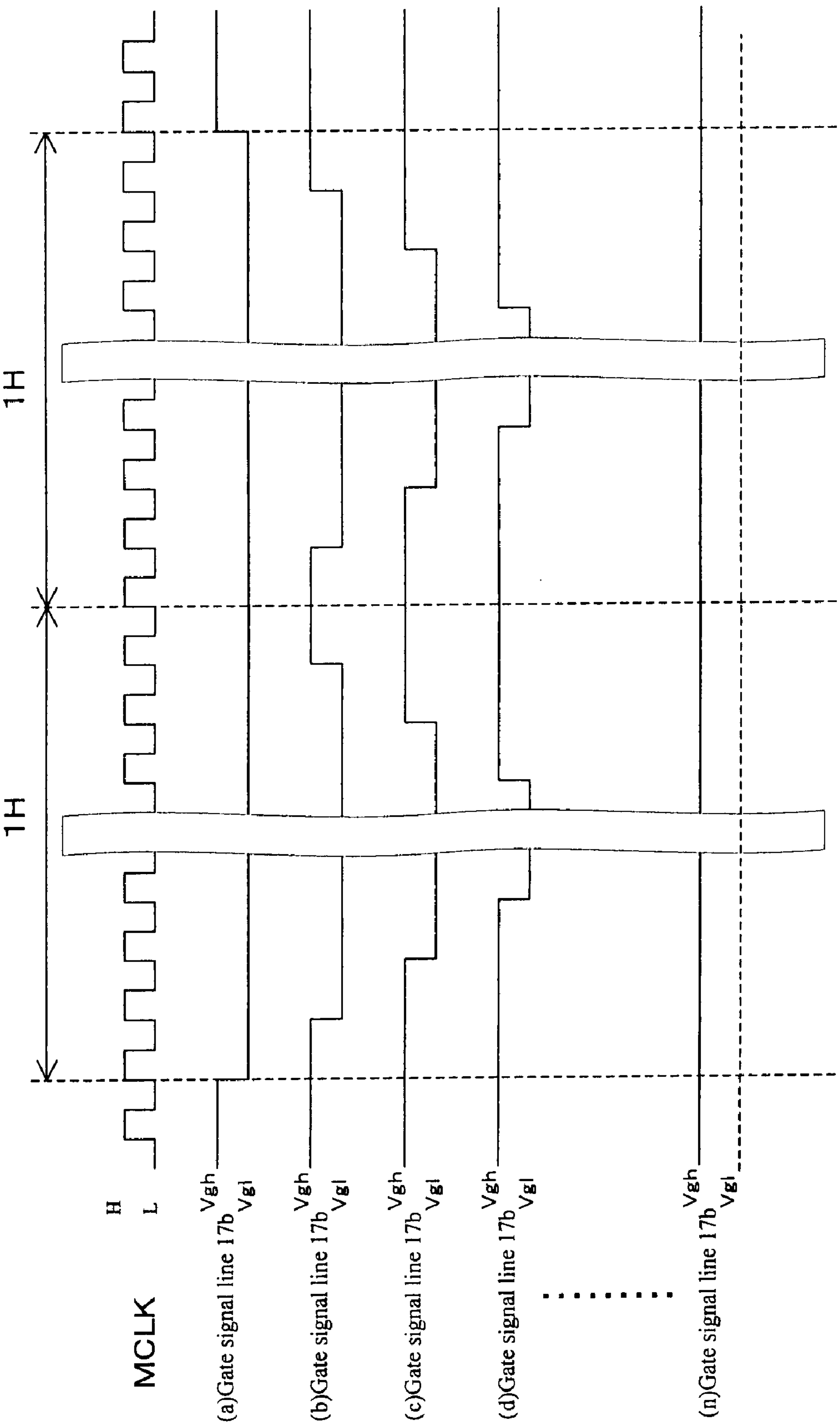
Figure 174:
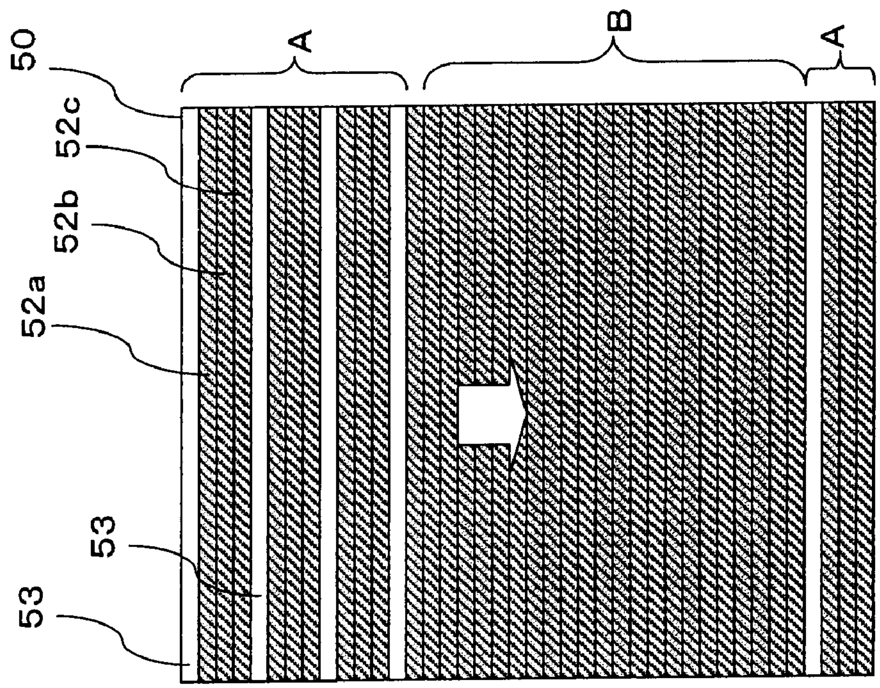
Figure 174:
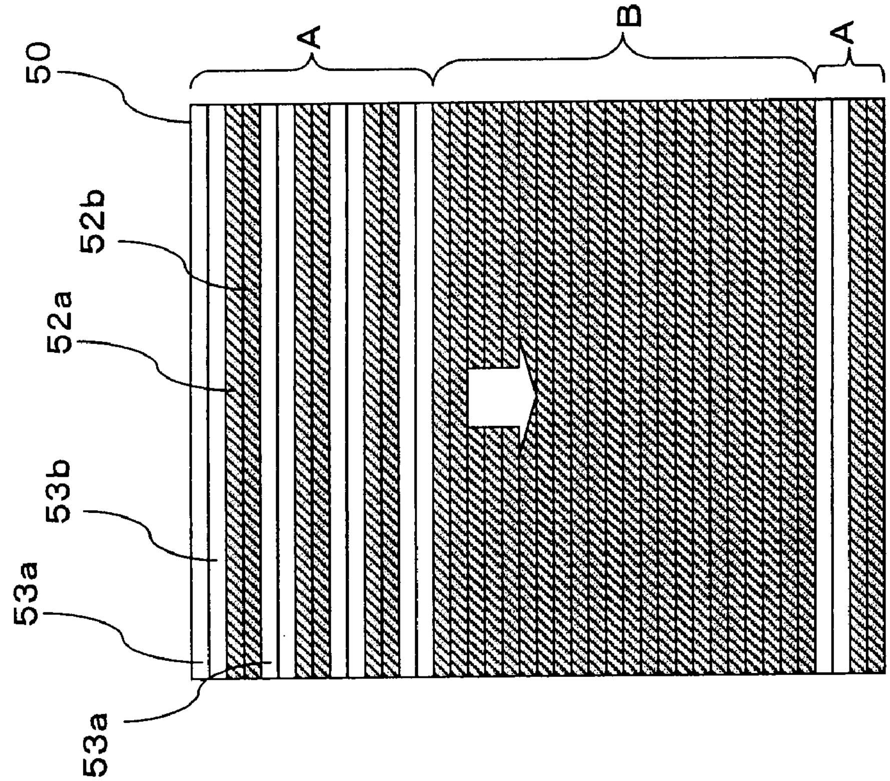
Figure 175:
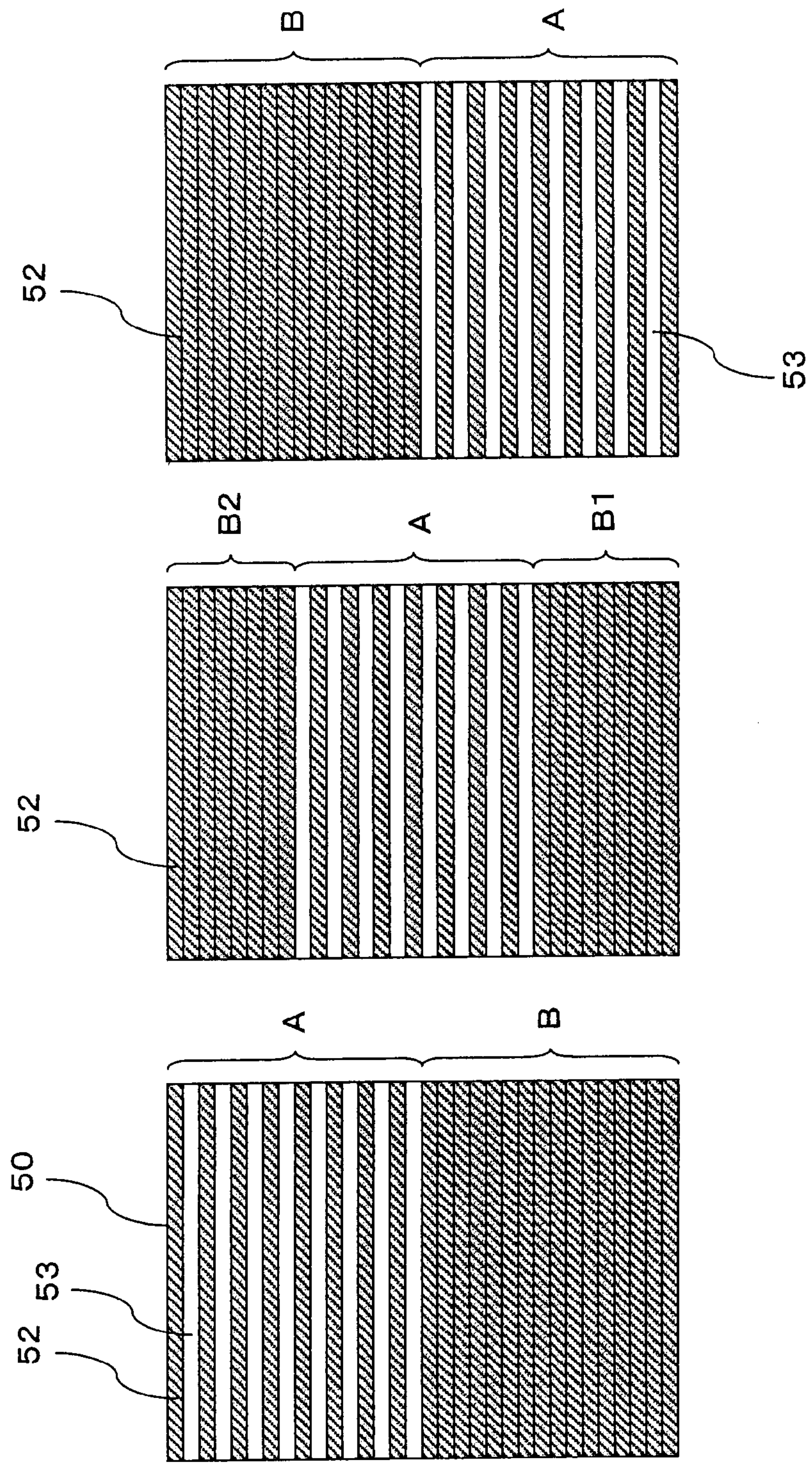
Figure 176:
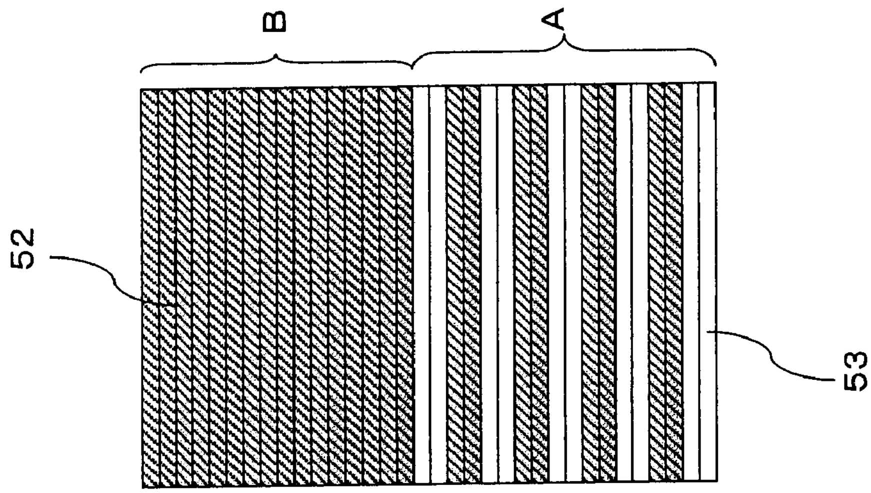
Figure 176:
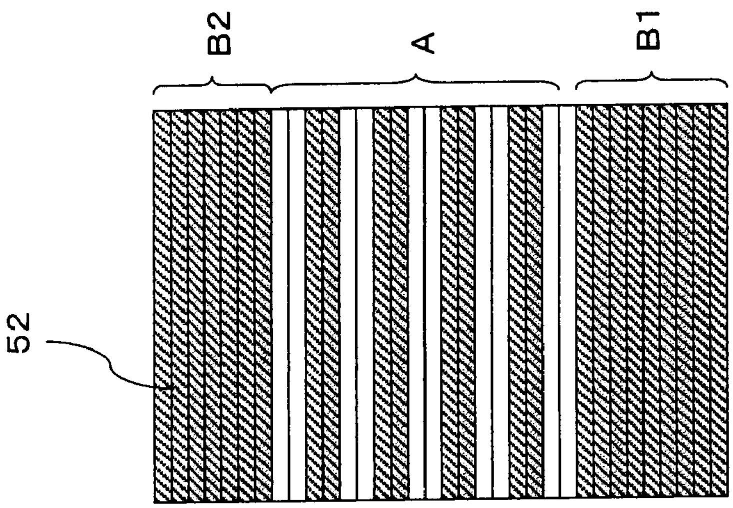
Figure 176:
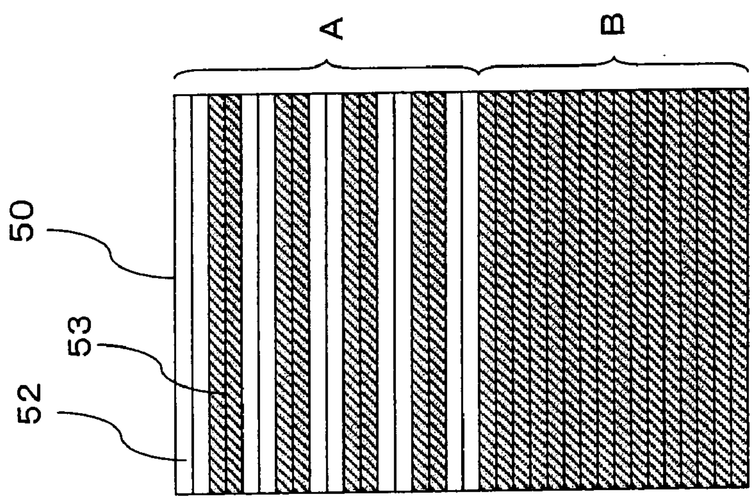
Figure 177:
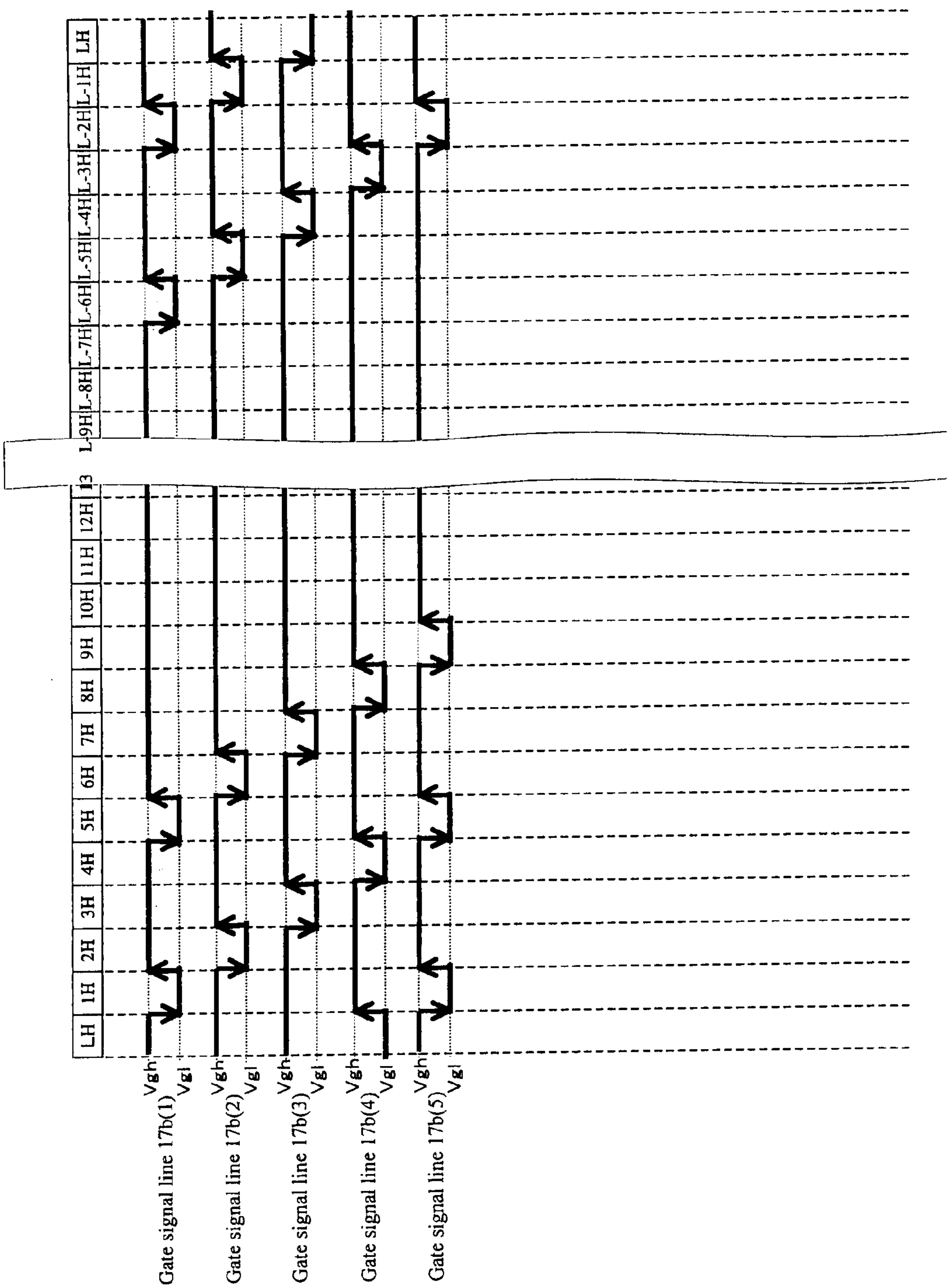
Figure 178:
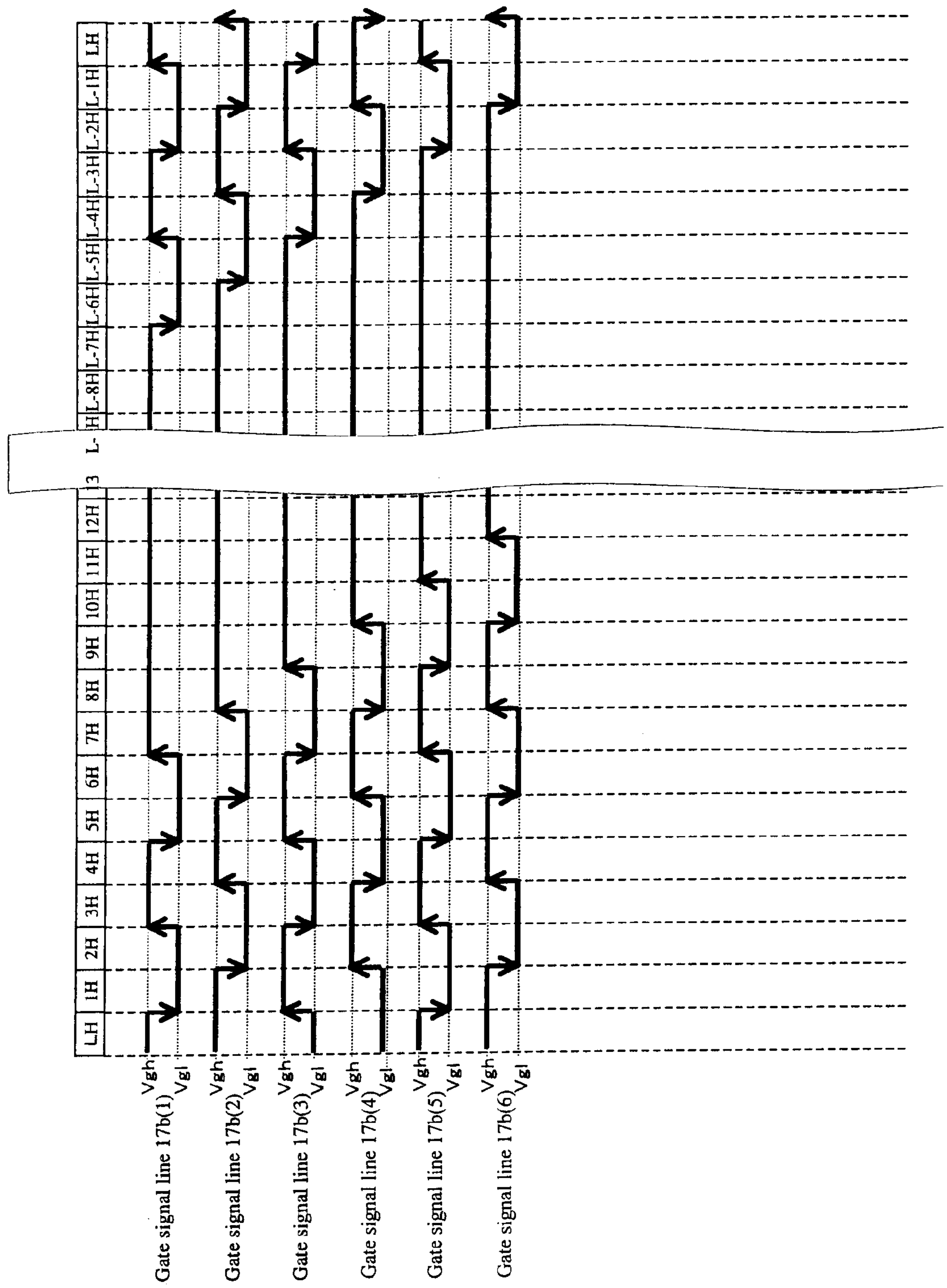
Figure 179:
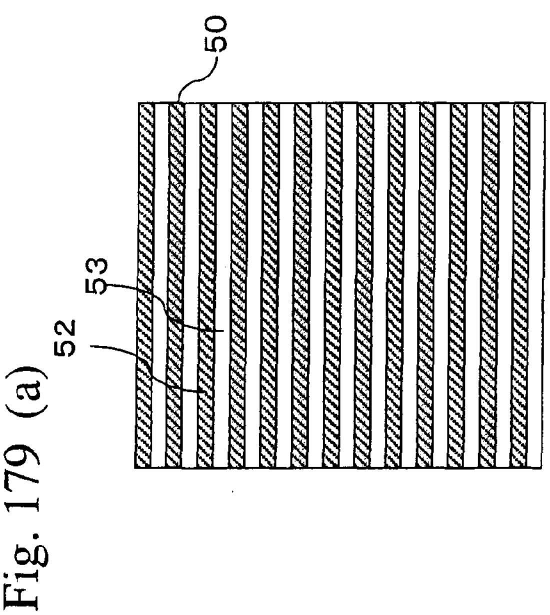
Figure 179:
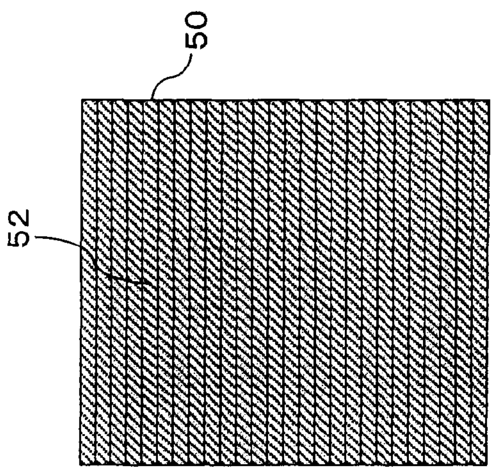
Figure 179:
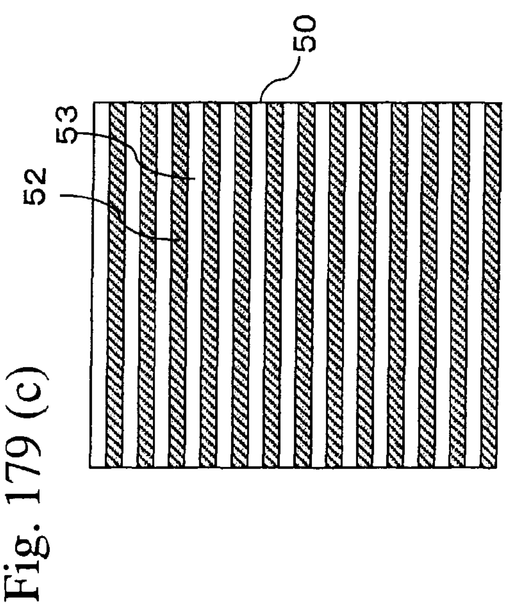
Figure 179:
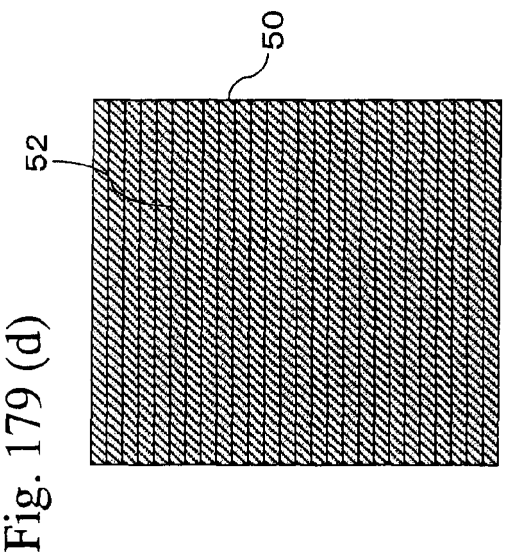
Figure 180:
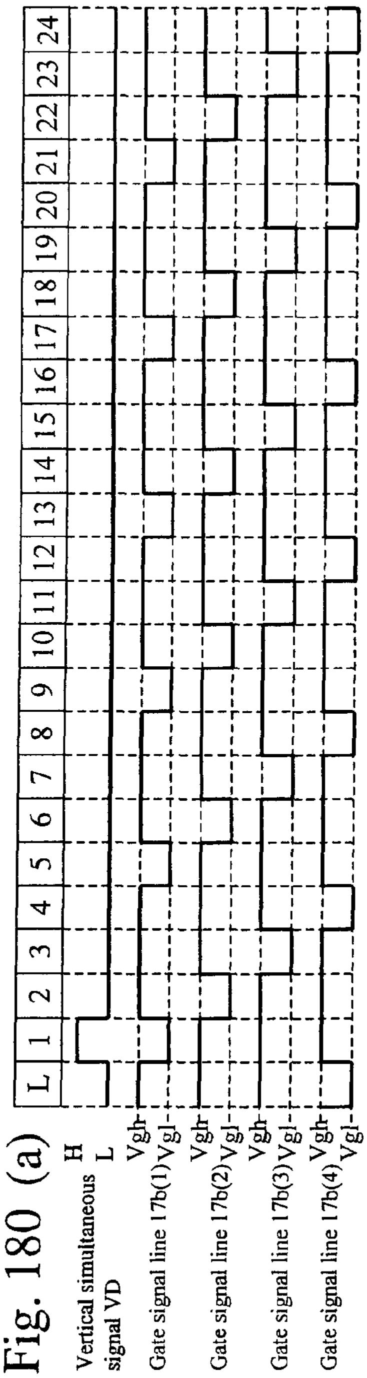
Figure 180:
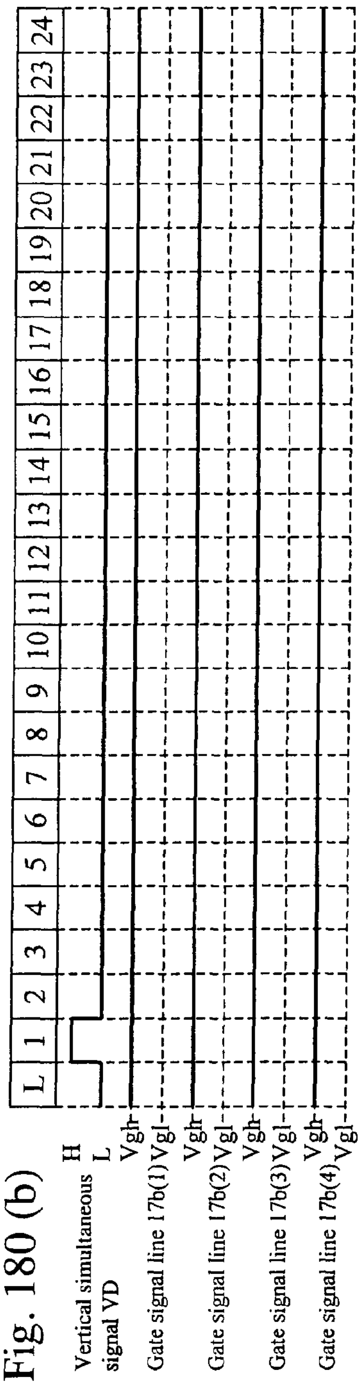
Figure 180:
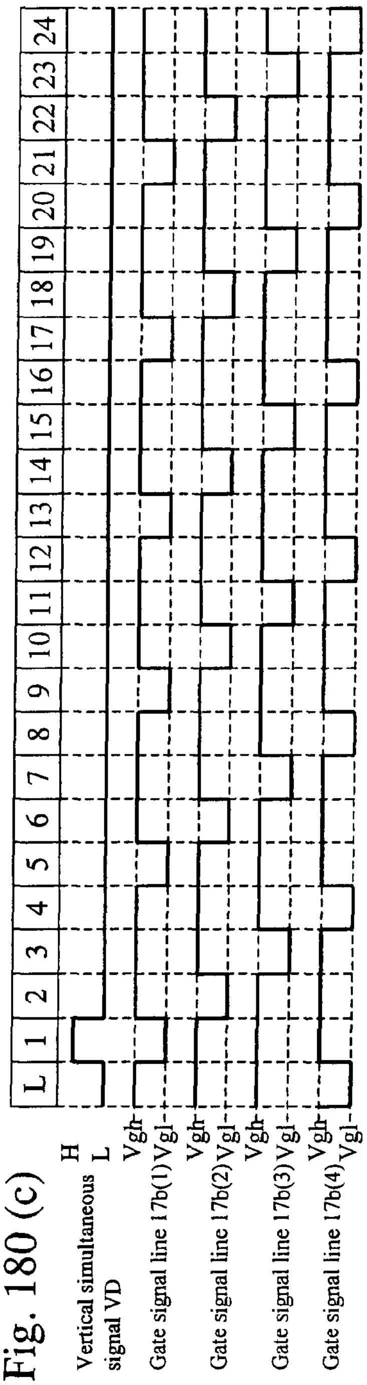
Figure 181:
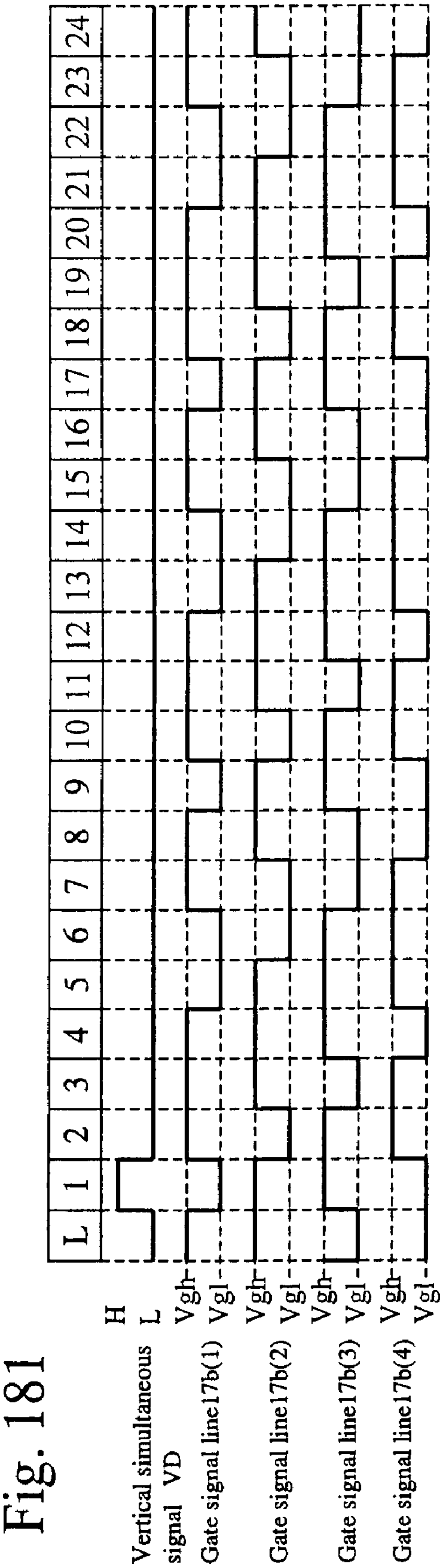
Figure 182:
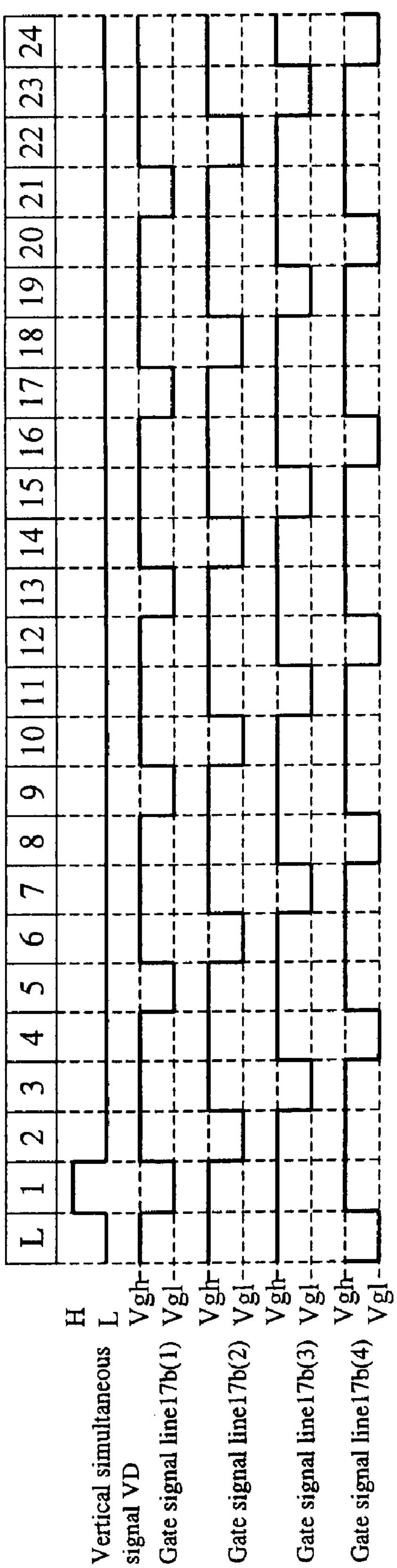
Figure 182:
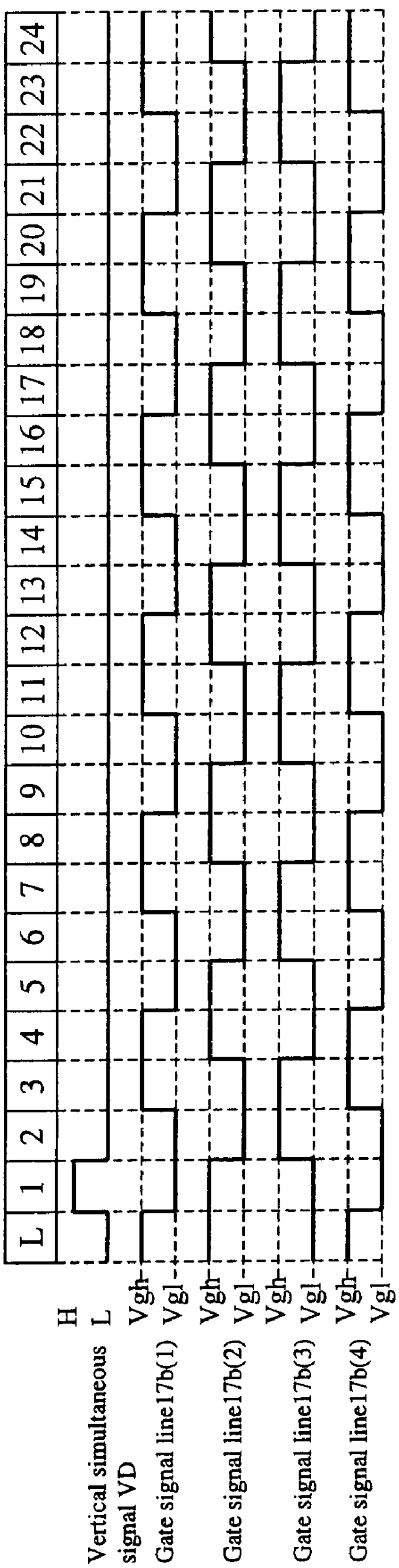
Figure 183:
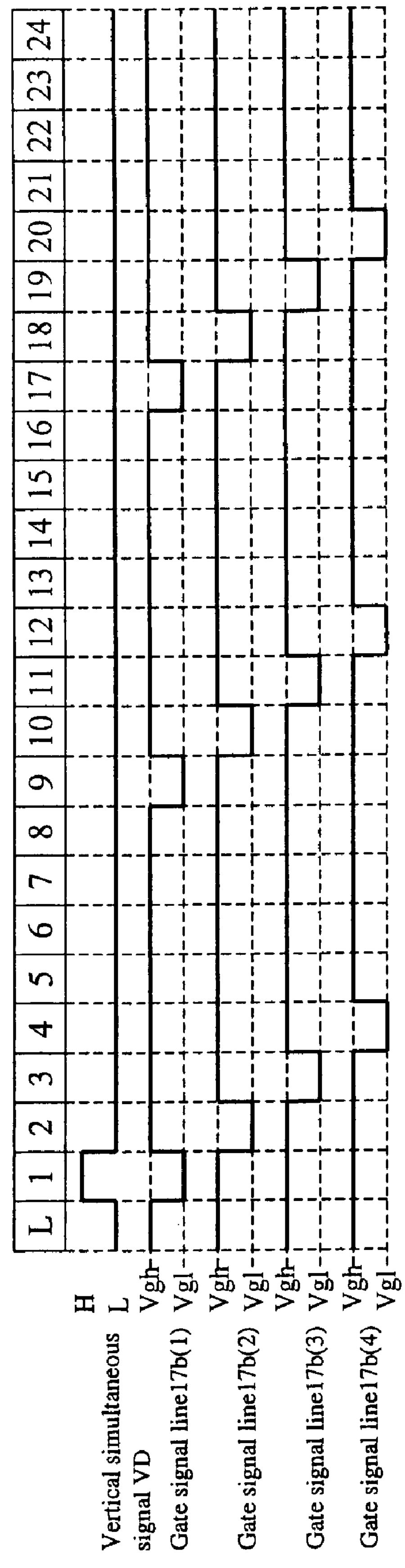
Figure 184:
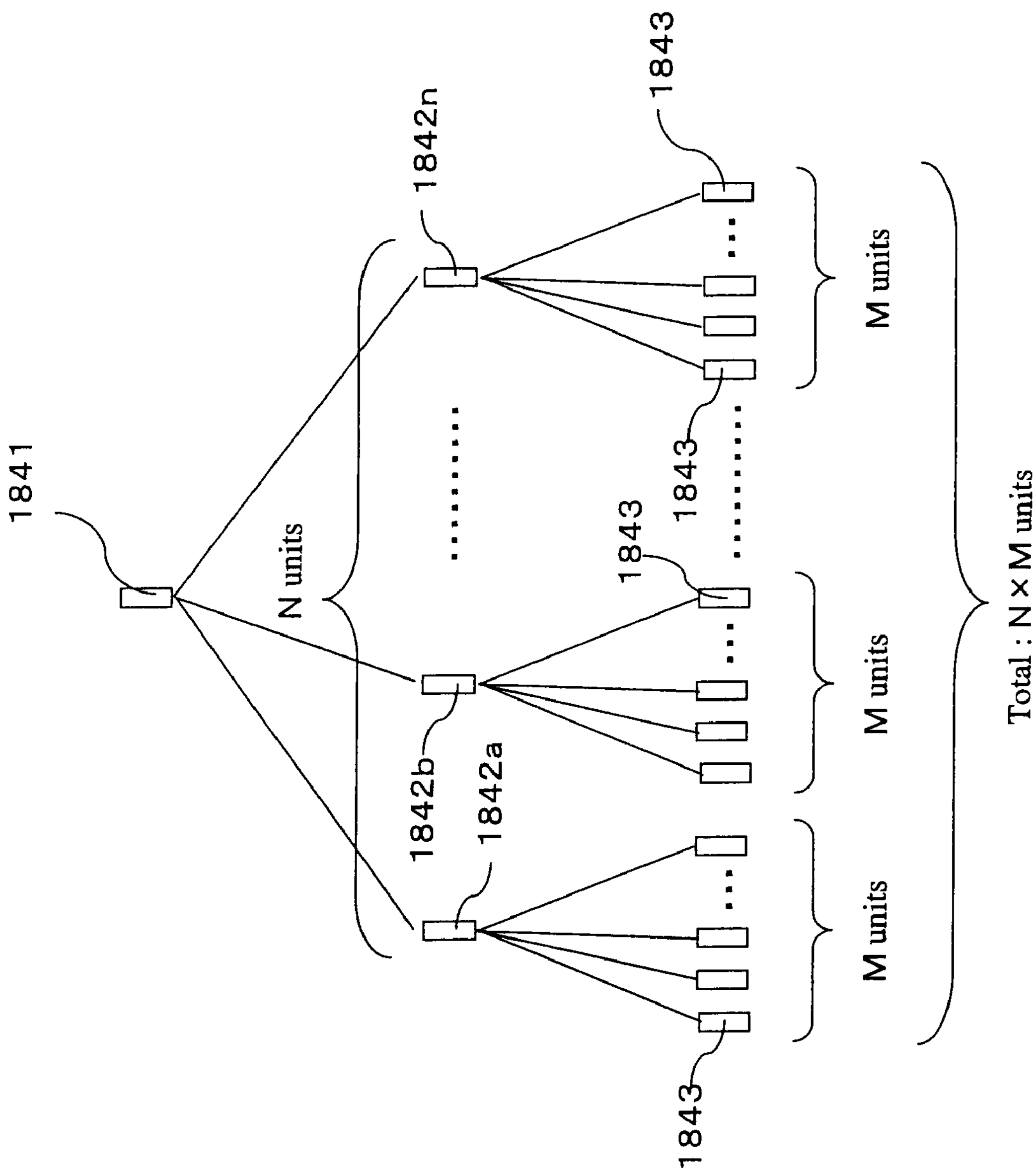
Figure 185:
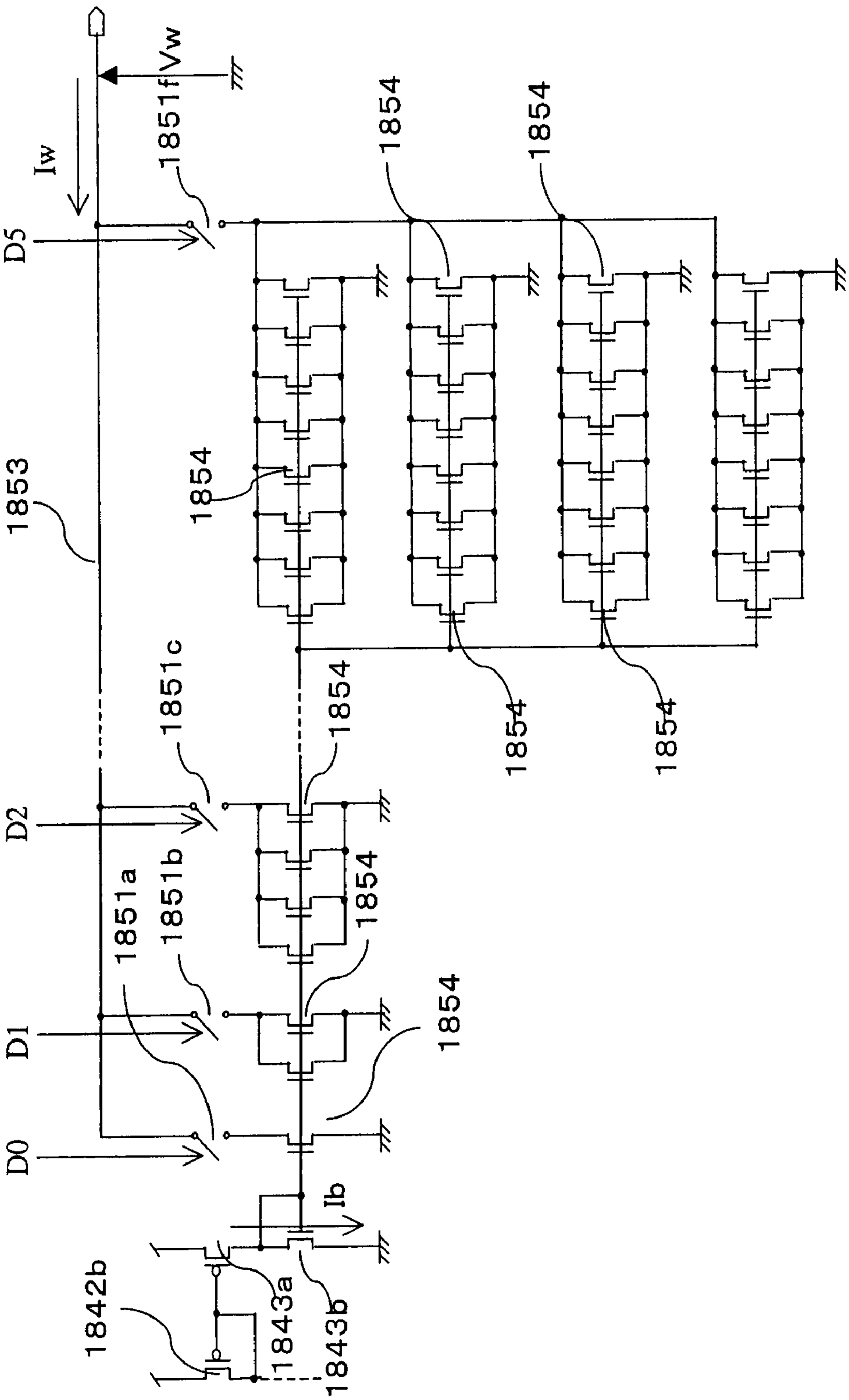
Figure 186:
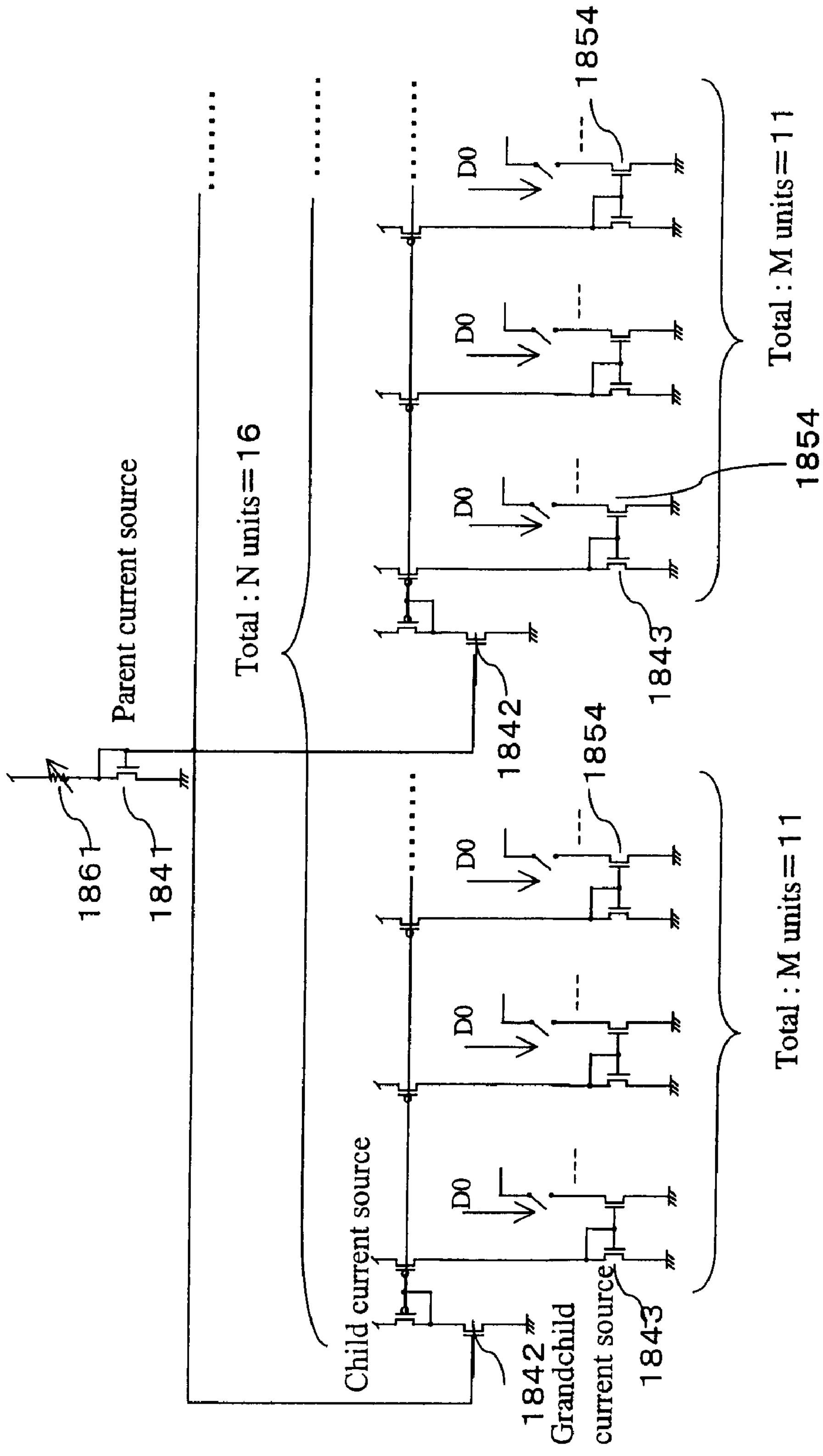
Figure 187:
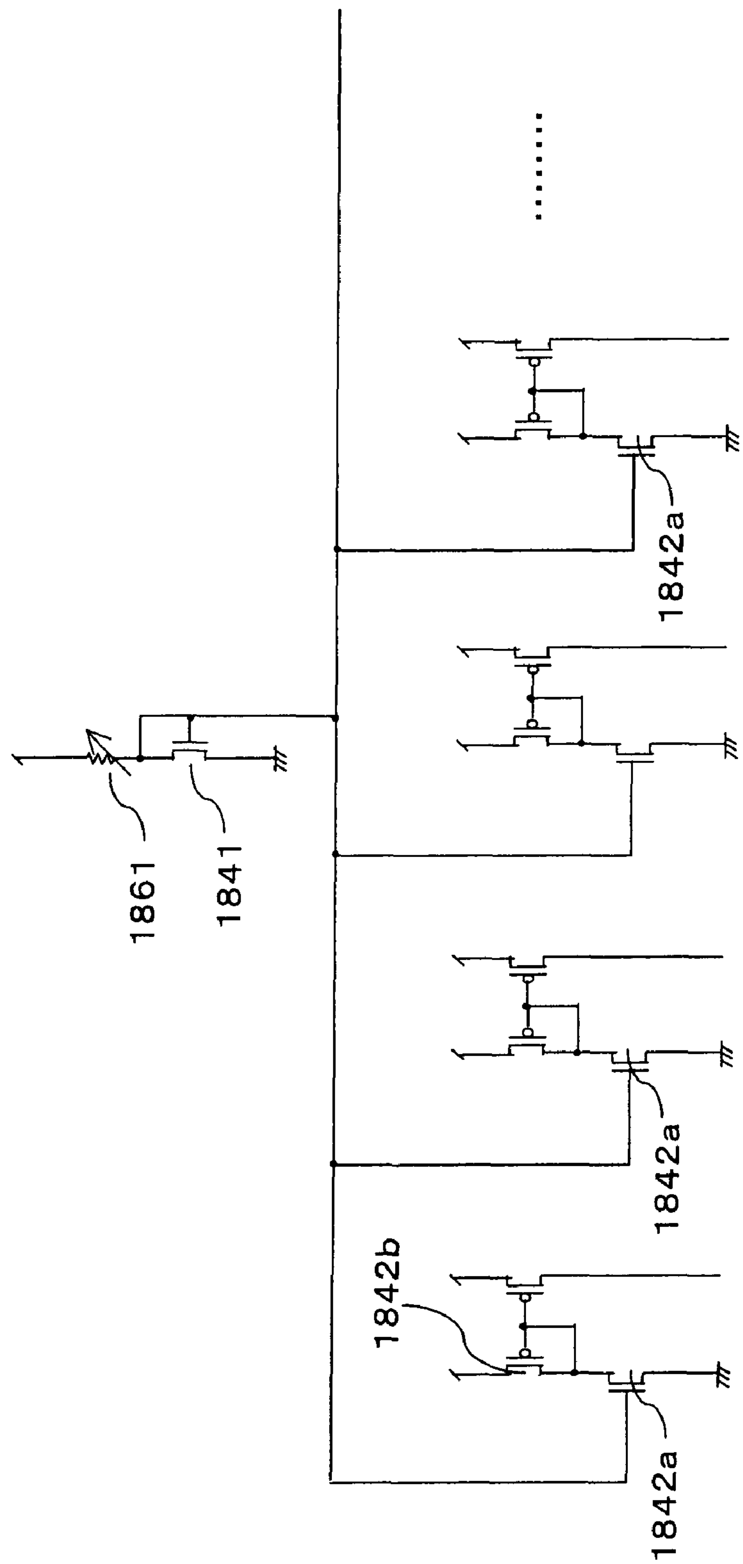
Figure 188:
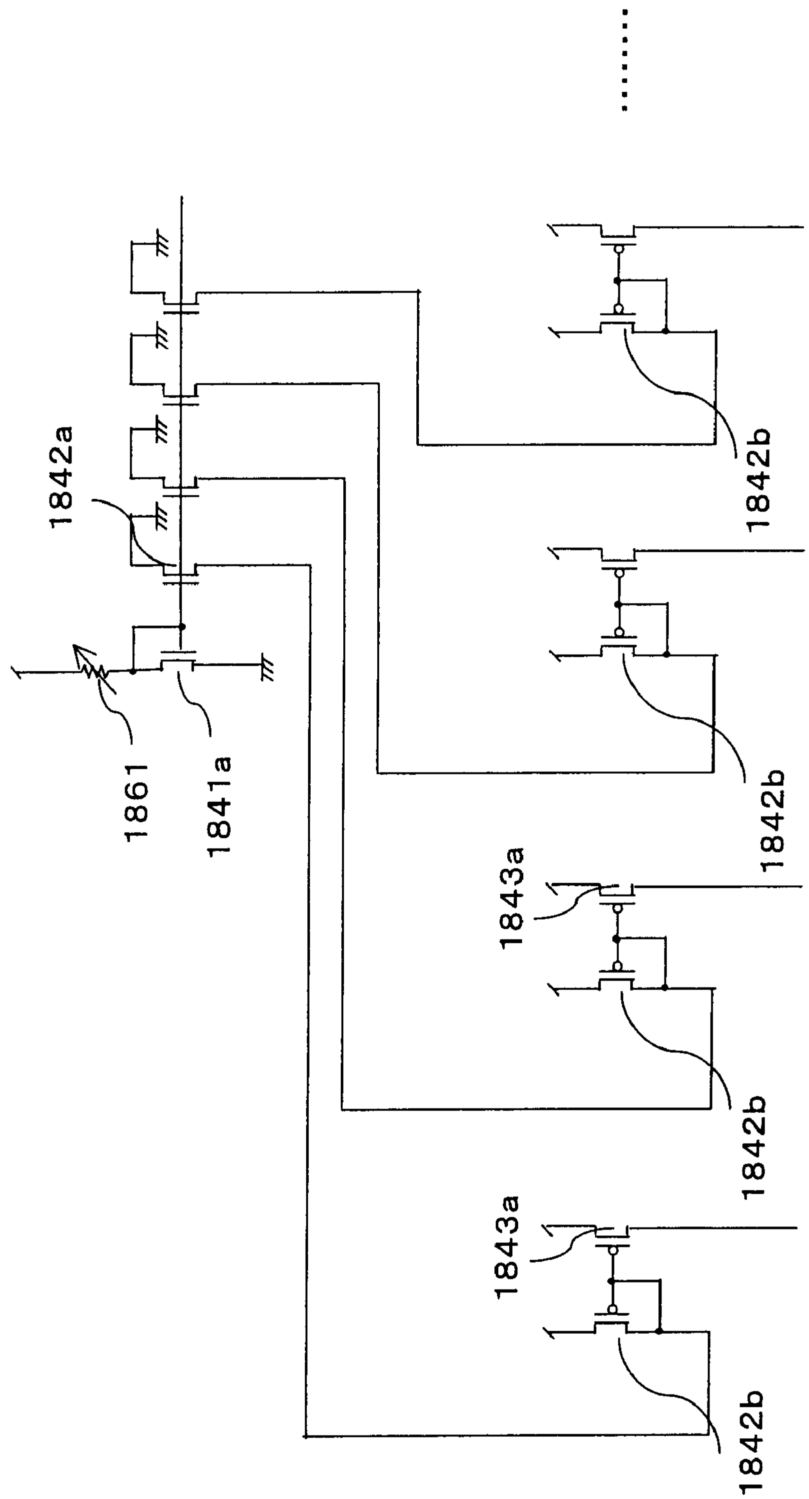
Figure 189:
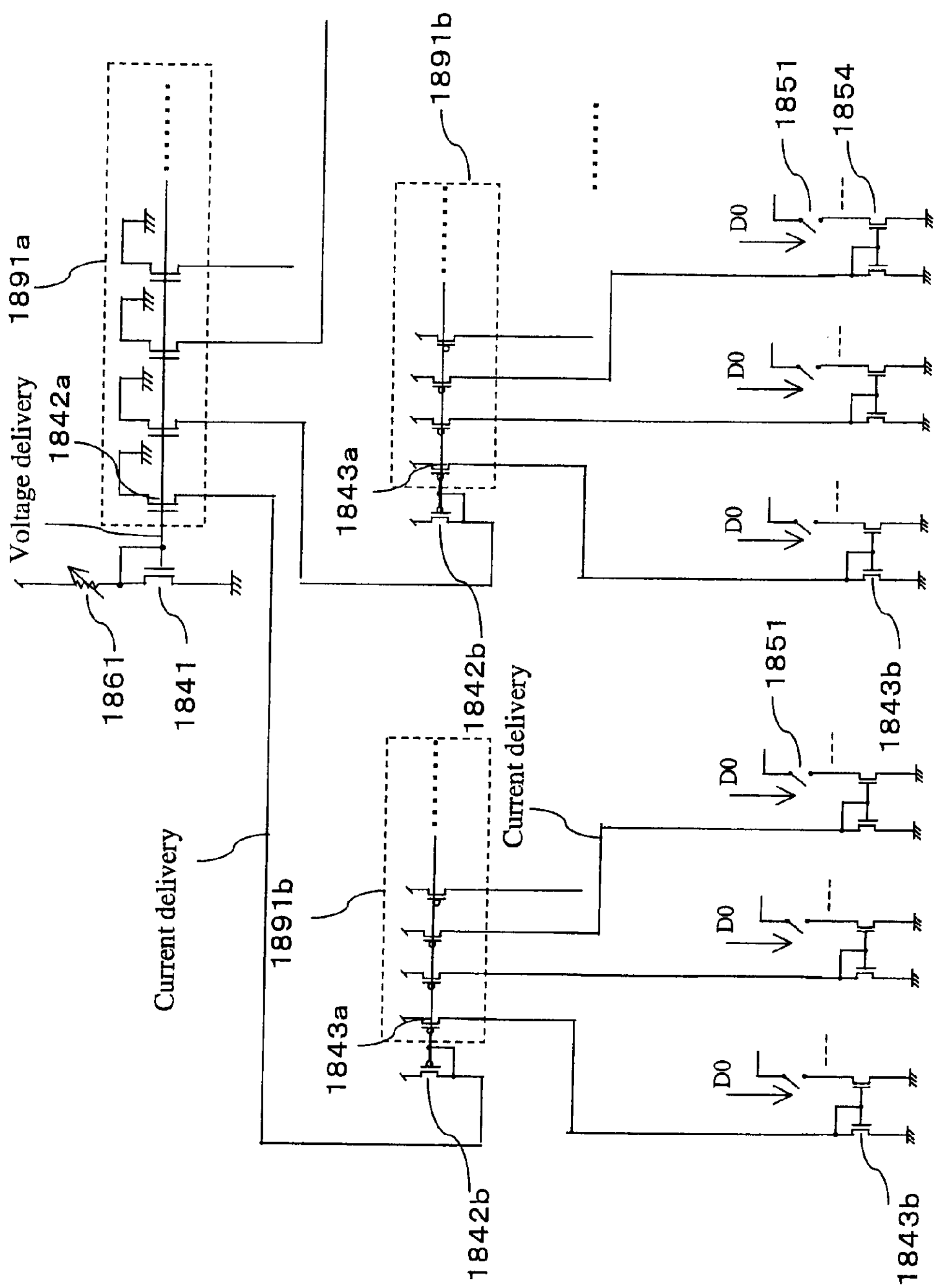

FIG. 132 is an explanatory diagram illustrating a drive method of a display panel according to the present invention;

FIG. 133 is an explanatory diagram illustrating a drive method of a display panel according to the present invention;

FIG. 134 is an explanatory diagram illustrating a drive method of a display panel according to the present invention;

FIG. 135 is an explanatory diagram illustrating a drive method of a display panel according to the present invention;

FIG. 136 is an explanatory diagram illustrating a drive method of a display panel according to the present invention;

FIG. 137 is an explanatory diagram illustrating a drive method of a display panel according to the present invention;

FIG. 138 is an explanatory diagram illustrating a drive method of a display panel according to the present invention;

FIG. 139 is an explanatory diagram illustrating a drive method of a display panel according to the present invention;

FIG. 140 is an explanatory diagram illustrating a drive method of a display panel according to the present invention;

FIG. 141 is an explanatory diagram illustrating a drive method of a display panel according to the present invention;

FIG. 142 is an explanatory diagram illustrating a drive method of a display panel according to the present invention;

FIG. 143 is an explanatory diagram illustrating a drive method of a display panel according to the present invention;

FIG. 144 is an explanatory diagram illustrating a drive method of a display panel according to the present invention;

FIG. 145 is an explanatory diagram illustrating a drive method of a display panel according to the present invention;

FIG. 146 is an explanatory diagram illustrating a drive method of a display panel according to the present invention;

FIG. 147 is an explanatory diagram illustrating a drive method of a display panel according to the present invention;

FIG. 148 is an explanatory diagram illustrating a drive method of a display panel according to the present invention;

FIG. 149 is an explanatory diagram illustrating a drive method of a display panel according to the present invention;

FIG. 150 is an explanatory diagram illustrating a drive method of a display panel according to the present invention;

FIG. 151 is an explanatory diagram illustrating a drive method of a display panel according to the present invention;

FIG. 152 is an explanatory diagram illustrating a drive method of a display panel according to the present invention;

FIG. 153 is an explanatory diagram illustrating a drive method of a display panel according to the present invention;

FIG. 154 is an explanatory diagram illustrating a drive method of a display panel according to the present invention;

FIG. 155 is an explanatory diagram illustrating a drive method of a display panel according to the present invention;

FIG. 156 is an explanatory diagram illustrating a drive method of a display panel according to the present invention;

FIG. 157 is an explanatory diagram illustrating a drive method of a display panel according to the present invention;

FIG. 158 is an explanatory diagram illustrating a drive method of a display panel according to the present invention;

FIG. 159 is an explanatory diagram illustrating a drive method of a display panel according to the present invention;

FIG. 160 is an explanatory diagram illustrating a drive method of a display panel according to the present invention;

FIG. 161 is an explanatory diagram illustrating a drive method of a display panel according to the present invention;

FIG. 162 is an explanatory diagram illustrating a drive method of a display panel according to the present invention;

FIG. 163 is an explanatory diagram illustrating a drive method of a display panel according to the present invention;

FIG. 164 is an explanatory diagram illustrating a drive method of a display panel according to the present invention;

FIG. 165 is an explanatory diagram illustrating a drive method of a display apparatus according to the present invention;

FIG. 166 is an explanatory diagram illustrating a drive method of a display apparatus according to the present invention;

FIG. 167 is an explanatory diagram illustrating a drive method of a display apparatus according to the present invention;

FIG. 168 is an explanatory diagram illustrating a drive method of a display apparatus according to the present invention;

FIG. 169 is an explanatory diagram illustrating a drive method of a display apparatus according to the present invention;

FIG. 170 is an explanatory diagram illustrating a drive method of a display apparatus according to the present invention;

FIG. 171 is an explanatory diagram illustrating a drive method of a display apparatus according to the present invention;

FIG. 172 is an explanatory diagram illustrating a drive method of a display apparatus according to the present invention;

FIG. 173 is an explanatory diagram illustrating a drive method of a display apparatus according to the present invention;

FIG. 174 is an explanatory diagram illustrating a drive method of a display apparatus according to the present invention;

FIG. 175 is an explanatory diagram illustrating a drive method of a display apparatus according to the present invention;

FIG. 176 is an explanatory diagram illustrating a drive method of a display apparatus according to the present invention;

FIG. 177 is an explanatory diagram illustrating a drive method of a display apparatus according to the present invention;

FIG. 178 is an explanatory diagram illustrating a drive method of a display apparatus according to the present invention;

FIG. 179 is an explanatory diagram illustrating a drive method of a display apparatus according to the present invention;

FIG. 180 is an explanatory diagram illustrating a drive method of a display apparatus according to the present invention;

FIG. 181 is an explanatory diagram illustrating a drive method of a display apparatus according to the present invention;

FIG. 182 is an explanatory diagram illustrating a drive method of a display apparatus according to the present invention;

FIG. 183 is an explanatory diagram illustrating a drive method of a display apparatus according to the present invention;

FIG. 184 is an explanatory diagram illustrating a source driver circuit according to the present invention;

FIG. 185 is an explanatory diagram illustrating a source driver circuit according to resent invention;

FIG. 186 is an explanatory diagram illustrating a source driver circuit according to resent invention;

FIG. 187 is an explanatory diagram illustrating a source driver circuit according to resent invention;

FIG. 188 is an explanatory diagram illustrating a source driver circuit according to resent invention; and FIG. 189 is an explanatory diagram illustrating a source driver circuit according to resent invention.

DESCRIPTION OF SYMBOLS

11 Transistor (thin-film transistor)
12 Gate driver IC (circuit)
14 Source driver IC (circuit)
15 EL (element) (light-emitting element)
16 Pixel
17 Gate signal line
18 Source signal line
19 Storage capacitance (additional capacitor, additional capacitance)
50 Display screen
51 Write pixel (row)
52 Non-display pixel (non-display area, non-illuminated area)
53 Display pixel (display area, illuminated area)
61 Shift register
62 Inverter
63 Output buffer
71 Array board (display panel)
72 Laser irradiation range (laser spot)
73 Positioning marker
74 Glass substrate (array board)
81 Control IC (circuit)
82 Power supply IC (circuit)
83 Printed board
84 Flexible board
85 Sealing lid
86 Cathode wiring
87 Anode wiring (Vdd)
88 Data signal line
89 Gate control signal line
101 Bank (rib)
102 Interlayer insulating film
104 Contact connector
105 Pixel electrode
106 Cathode electrode
107 Desiccant
108 λ/4 plate
109 Polarizing plate
111 Thin encapsulation film
281 Dummy pixel (row)
341 Output stage circuit
371 OR circuit
401 Illumination control line
471 Reverse bias line
472 Gate potential control line
561 Electronic regulator circuit
562 SD (source-drain) short circuit of a transistor
571 Antenna
572 Key
573 Casing
574 Display panel
581 Eye ring
582 Magnifying lens
583 Convex lens
591 Supporting point (pivot point)
592 Taking lens
593 Storage section
594 Switch
601 Body
602 Photographic section
603 Shutter switch
611 Mounting frame
612 Leg
613 Mount
614 Fixed part
631 Changeover switch
681 Insulating film
691 Diffraction grating
721 Pixel aperture
341 Output stage circuit
991 Reference voltage circuit
992 PC (data input means, control means)
993 Input circuit (operational amplifier, switch, A/D converter)
994 Transistor
995 Operational amplifier
996 Connection terminal 997 Probe (connection means)
941 Coil (transformer)
942 Control circuit
943 Diode
944 Capacitor
945 Resistor
946 Transistor
951 Switch
952 Temperature sensor
9991 Liquid crystal display panel
1001 Connector resin
1002 Sealing resin
1003 Dispersing agent
1004 Polarizing plate (polarizing film, circular polarizing plate, circular polarizing film)
1011 Glass ring
1021 Flexible board
1022 Controller
1023 Connector terminal
1031 Serial data
1032 Parallel video data
1033 Gate driver circuit control data
1051 Radiator plate (radiator film)
1052 Hole (air hole, cooling hole)
1061 Mounted part
1062 Printed board
1063 Cushioning member (cushioning bump)
1111 Unit gate output circuit
1381 Parasitic capacitance
1431 Capacitor driver
1433 Capacitor signal line
1434 Coupling capacitor
1461 Current output circuit
1471 Output terminal
1472 Parasitic capacitance
1481 Inverter
1511 Common signal line
1512 Common driver circuit
1841, 1842, 1843 Current source (transistor)
1851 Switch (on/off means)
1854 Current source (single unit)
1853 Internal wiring
1861 Electronic regulator (Current adjustment means)
1891 Transistor group

BEST MODE FOR CARRYING OUT THE INVENTION

Some parts of drawings herein are omitted and/or enlarged/reduced herein for ease of understanding and/or illustration. For example, in a sectional view of a display panel shown in FIG. 11, a encapsulation film 111 and the like are shown as being fairly thick. On the other hand, in FIG. 10, a sealing lid 85 is shown as being thin. Some parts are omitted. For example, although the display panel according to the present invention requires a polarizing plate with a phase film such as a circular polarizing plate to prevent reflection, the phase film is omitted in drawings herein. This also applies to the drawings below. Besides, the same or similar forms, materials, functions, or operations are denoted by the same reference numbers or characters.

Incidentally, what is described with reference to drawings or the like can be combined with other examples or the like even if not noted specifically. For example, a touch panel or the like can be attached to a display panel in FIG. 8 to construct an information display apparatus or the like shown in FIGS. 57 to 61 and 102 etc. Also, a magnifying lens 582 can be mounted to configure a view finder (see FIG. 58) used for a video camera (see FIG. 59, etc.) or the like. Also, any of the drive methods described with reference to FIG. 4, 15, 18, 21, 23, 27, 31, 35, 39, 44, 52, 53, 55, 63, 67, 77, 78, 79, 80, 114, 116, 120, 122, 125, 129, 130, 131, 132, 133, 136, 139, 140, 144, 145, 152, 164, or the like can be applied to any display apparatus, display panel, or information display apparatus according to the present invention.

Also, thin-film transistors are cited herein as driver transistors 11 and switching transistors 11 etc., this is not restrictive. Thin-film diodes (TFDs) or ring diodes may be used instead. Also, the present invention is not limited to thin-film elements, and transistors formed on silicon wafers may also be used. Needless to say, FETs, MOS-FETs, MOS transistors, or bipolar transistors may also be used. They are basically, thin-film transistors. It goes without saying that the present invention may also use varistors, thyristors, ring diodes, photodiodes, phototransistors, or PLZT elements. That is, the switching element 11 and driving element 11 can be constructed by using any of the above elements.

An EL panel according to the present invention will be described below with reference to drawings.

Figure 10:
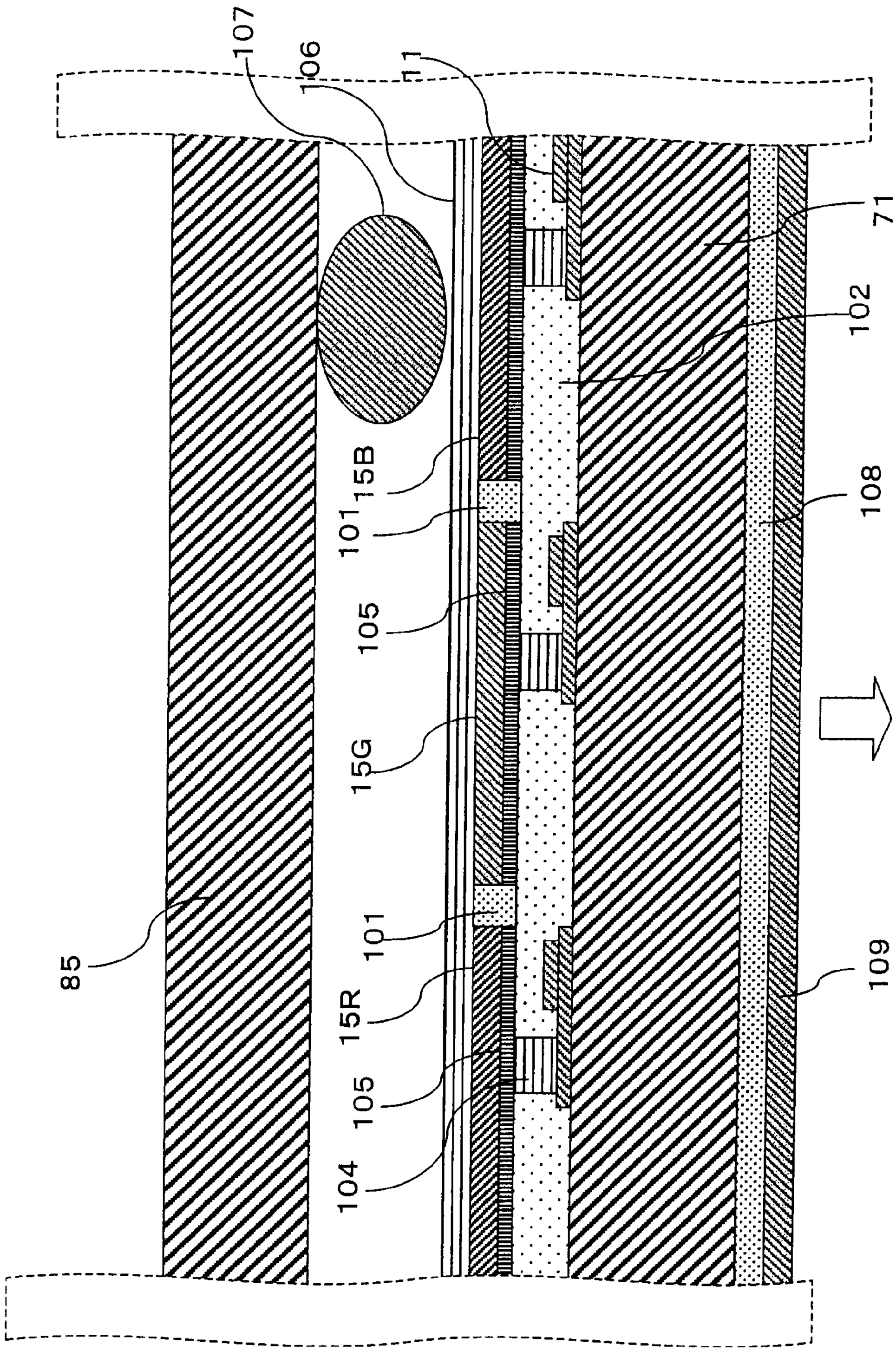
FIG. 10 is a sectional view of a display panel according to the present invention.

As shown in FIG. 10, an organic EL display panel consists of a glass substrate (array board) 71, transparent electrodes 105 formed as pixel electrodes, at least one organic EL layer 15, and a metal electrode (reflective film) (cathode) 106, which are stacked one on top of another, where the organic functional layer consists of an electron transport layer, light-emitting layer, positive hole transport layer, etc. The organic EL element 15 emits light when a positive voltage is applied to the anode or transparent electrodes (pixel electrodes) 105 and a negative voltage is applied to the cathode or metal electrode (reflective electrode) 106.

A large current flows through the wiring which supplies current to the anode or cathode (anode wiring 86 or cathode wiring 87). For example, current on the order of 100 A flows through an EL display apparatus with a 40-inch screen. Thus, the resistance values of the anode wiring and cathode wiring fabricated (formed) should be sufficiently low. To solve this problem, according to the present invention, the anode wiring and the like (wiring which supplies light-emitting current to the EL elements) are formed of thin film. Then, the thickness of the thin-film wiring is increased by electro-plating it in multiple layers using electroless plating or electrolytic plating technologies.

Available plating metals include, for example, chromium, nickel, gold, copper, and aluminum as well as alloys and amalgam thereof. Also, copper foil is affixed as wiring itself or to wiring, as required. Alternatively, copper paste or the like is screen-printed on wiring in multiple layers to increase the thickness of the wiring and thereby decrease the wiring resistance. Also, a bonding technique may be used to bond wires composing the wiring. Also, if necessary, an insulating layer may be formed on the wiring and conductive layers may be stacked on the wiring to form a ground pattern, thereby forming a capacitor (capacitance) between the wiring and ground pattern.

Preferably, the metal electrode 106 is made of metal with a small work function, such as lithium, silver, aluminum, magnesium, indium, copper, or an alloy thereof. In particular, it is preferable to use, for example, an Al—Li alloy. The transparent electrodes 105 may be made of, conductive materials with a large work function such as ITO, or gold and the like. If gold is used as an electrode material, the electrodes become translucent. Incidentally, IZO or other material may be used instead of ITO. This also applies to other pixel electrodes 105.

Needless to say, the EL film 15 according to the present invention may be formed not only by vapor deposition, but also by ink jetting. That is, the EL elements 15 according to the present invention may be formed not only of low molecular-weight material by a vapor deposition process, but also of high molecular-weight material by ink jetting and the like. Besides, they may be formed of screen printing or offset printing.

A desiccant 107 is placed in a space between the sealing lid 85 and array board 71. This is because the organic EL film 15 is vulnerable to moisture. With the EL film 15 shut off from the open air by the sealing lid 85, the desiccant 107 absorbs water penetrating a sealant and thereby prevents deterioration of the organic EL film 15.

Figure 11:
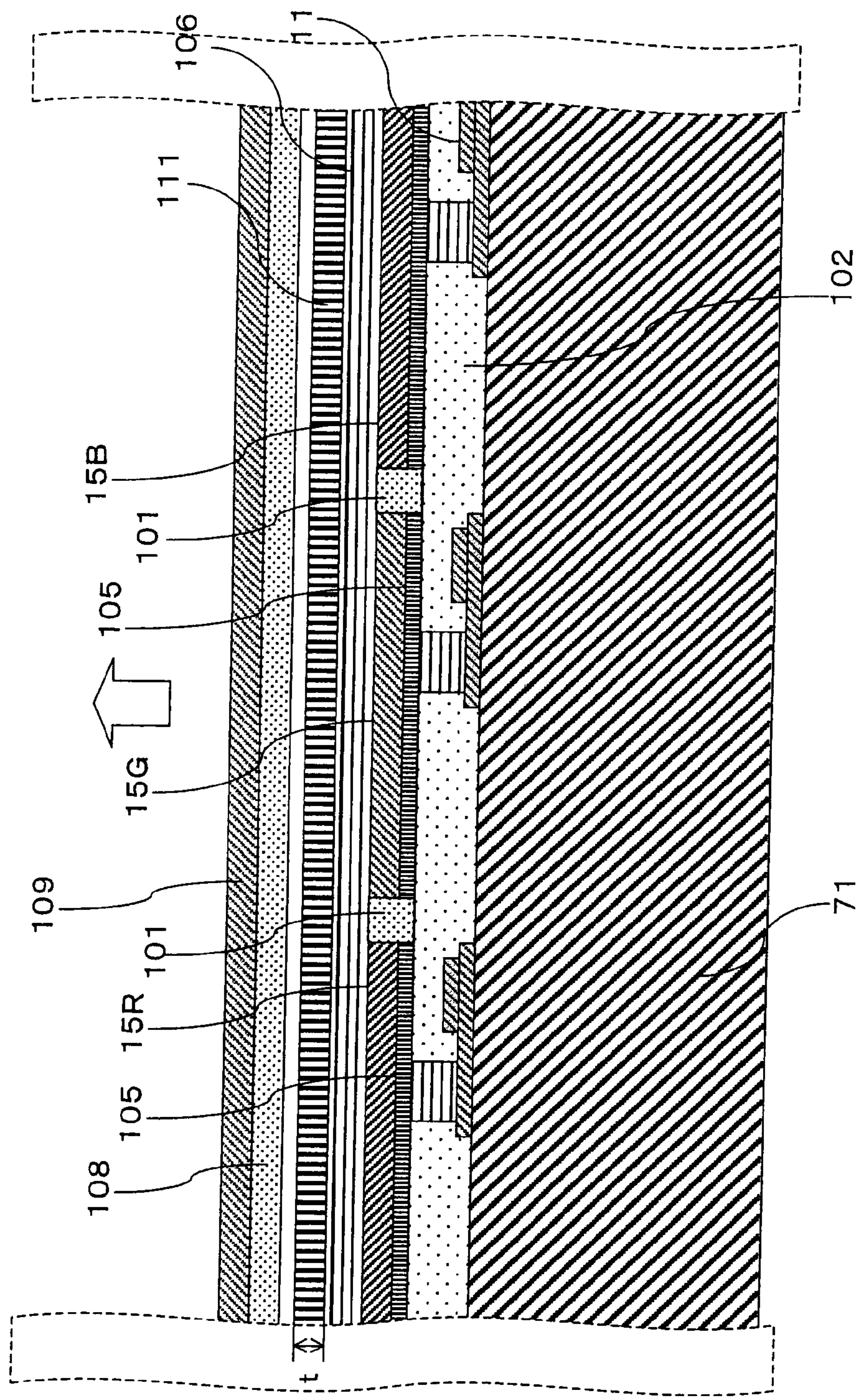
FIG. 11 is a sectional view of a display panel according to the present invention.

Although the glass sealing lid 85 is used for sealing in FIG. 10, the film 111 (this may be a thin film, i.e., a thin encapsulation film) may be used for sealing as shown in FIG. 11. The encapsulation film (thin encapsulation film) 111 may be, for example, an electrolytic capacitor film on which DLC (diamond-like carbon) is vapor-deposited. This film features extremely low moisture penetration (high moisture resistance). It is used as the encapsulation film 111. Preferably, the difference in thermal expansion coefficient between the sealing lid or encapsulation film 111 and array board 71 is 10% or less. A larger difference in the thermal expansion coefficient will cause the sealing lid 111 or the like to peel off the array board 71. Also, it goes without saying that the encapsulation film 111 may be formed by DLC film or the like vapor-deposited directly on a surface of the electrode 106. Besides, the thin encapsulation film may be formed by laminating thin resin films and metal films.

Desirably, film thickness of the thin film 111 is such that n·d is equal to or less than main emission wavelength λ of the EL element 15 (where n is the refraction factor of the thin film and d is the film thickness of the thin film; if two or more thin films are laminated, n·d of each thin film is calculated and the results are summed). By satisfying this condition, it is possible to more than double the efficiency of light extraction from the EL element 15 compared to when a glass substrate is used for sealing. Also, an alloy, mixture, or laminate of aluminum and silver may be used.

A technique which uses an encapsulation film 111 for sealing instead of a sealing lid 85 as described above is called thin film encapsulation. In the case of "underside extraction (see FIG. 10; light is extracted in the direction of the arrow in FIG. 10)" in which light is extracted from the side of the board 71, thin film encapsulation involves forming an EL film and then forming an aluminum electrode which will serve as a cathode on the EL film. Then, a resin layer is formed as a cushioning layer on the aluminum layer. An organic material such as acrylic or epoxy may be used for a cushioning layer. Suitable film thickness is from 1 μm to 10 μm (both inclusive). More preferably, the film thickness is from 2 μm to 6 μm (both inclusive). The encapsulation film 111 is formed on the cushioning film (film layer). Without the cushioning film, structure of the EL film would be deformed by stress, resulting in streaky defects. As described above, the encapsulation film 111 may be made, for example, of DLC (diamond-like carbon) or an electrolytic capacitor of a laminar structure (structure consisting of thin dielectric films and aluminum films vapor-deposited alternately).

In the case of "topside extraction (see FIG. 11; light is extracted in the direction of the arrow in FIG. 11)" in which light is extracted from the side of the EL layer 15, thin film encapsulation involves forming the EL film 15 and then forming an Ag—Mg film 20 angstrom (inclusive) to 300 angstrom thick on the EL film 15 to serve as a cathode (anode). A transparent electrode such as ITO is formed on the film to reduce resistance. Then, a resin layer is formed as a cushioning layer on the electrode film. An encapsulation film 111 is formed on the cushioning film.

Half the light produced by the organic EL layer 15 is reflected by the reflective film 106 and emitted through the array board 71. However, the reflective film 106 reflects extraneous light, resulting in glare, which lowers display contrast. To deal with this situation, a λ/4 phase plate 108 and polarizing plate (polarizing film) 109 are placed on the array board 71. These are generally called circular polarizing plates (circular polarizing sheets).

Incidentally, if the pixels are reflective electrodes, the light produced by the organic EL layer 15 is emitted upward. Thus, needless to say, the phase plate 108 and polarizing plate 109 are placed on the side from which light is emitted. Reflective pixels can be obtained by making pixel electrodes 105 from aluminum, chromium, silver, or the like. Also, by providing projections (or projections and depressions) on a surface of the pixel electrodes 105, it is possible to increase an interface with the organic EL layer 15, and thereby increase the light-emitting area, resulting in improved light-emission efficiency. Incidentally, the reflective film which serves as the cathode 106 (anode 105) is made as a transparent electrode. If reflectance can be reduced to 30% or less, no circular polarizing plate is required. This is because glare is reduced greatly. Light interference is reduced as well.

Glare can be reduced by the application of carbon-containing acrylic resin (black matrix (BM)), leaving pixel apertures uncoated. Any resin may be used as long as it absorbs light. Light diffusing materials are also available, including black metal such as hexavalent chromium; paint; thin film, thick film, or members with fine irregularities on a surface; titanium oxide; aluminum oxide; magnesium oxide; and opal glass. The materials do not necessarily need to be black or dark if they are colored by a dye or pigment complementary to the color produced by a light-modulating layer 24.

The pixel electrodes 105 are formed of transparent electrodes (ITO). The organic EL film 15 is formed on the pixel electrodes 105. As an electric field is applied to an EL element 15 pinched between the cathode electrode 106 and pixel electrode 105, the EL element 15 emits light.

A problem is that all the EL layers 15 to which the electric field is applied emit light. Areas which are located under the pixel electrodes 105 and in which the transistors 11 and gate signal lines 17 are formed are impervious to light (they are referred to as nontransparent areas). Even if the EL layers 15 in the nontransparent areas emit light, the emitted light is blocked. However, power is consumed if light is emitted. Thus, the larger the EL layers in the nontransparent areas, the lower the power efficiency.

Figure 68:
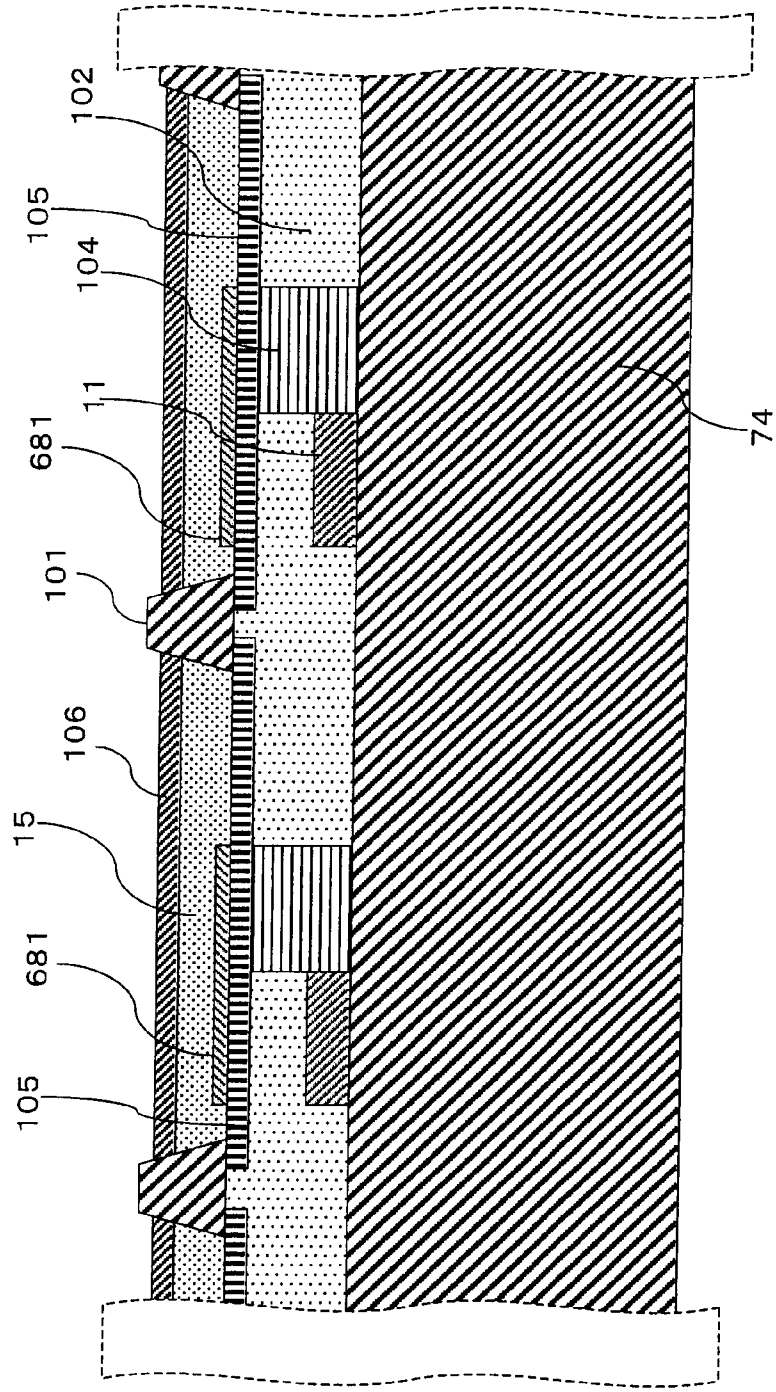
FIG. 68 is an explanatory diagram illustrating a display panel according to the present invention.

To solve this problem, according to the present invention, an insulating film 681 is formed in non-luminous areas as illustrated in FIG. 68. The insulating film 681 is formed on the pixel electrodes 105. Also, the insulating film 681 is formed in the non-luminous areas. The non-luminous areas exist between the pixel electrodes 105 and EL layers 15 as well as between the cathode 106 and EL layers 15. FIG. 68 shows a configuration in which the insulating film 681 is formed between the pixel electrodes 105 and EL layers 15.

Figure 71:
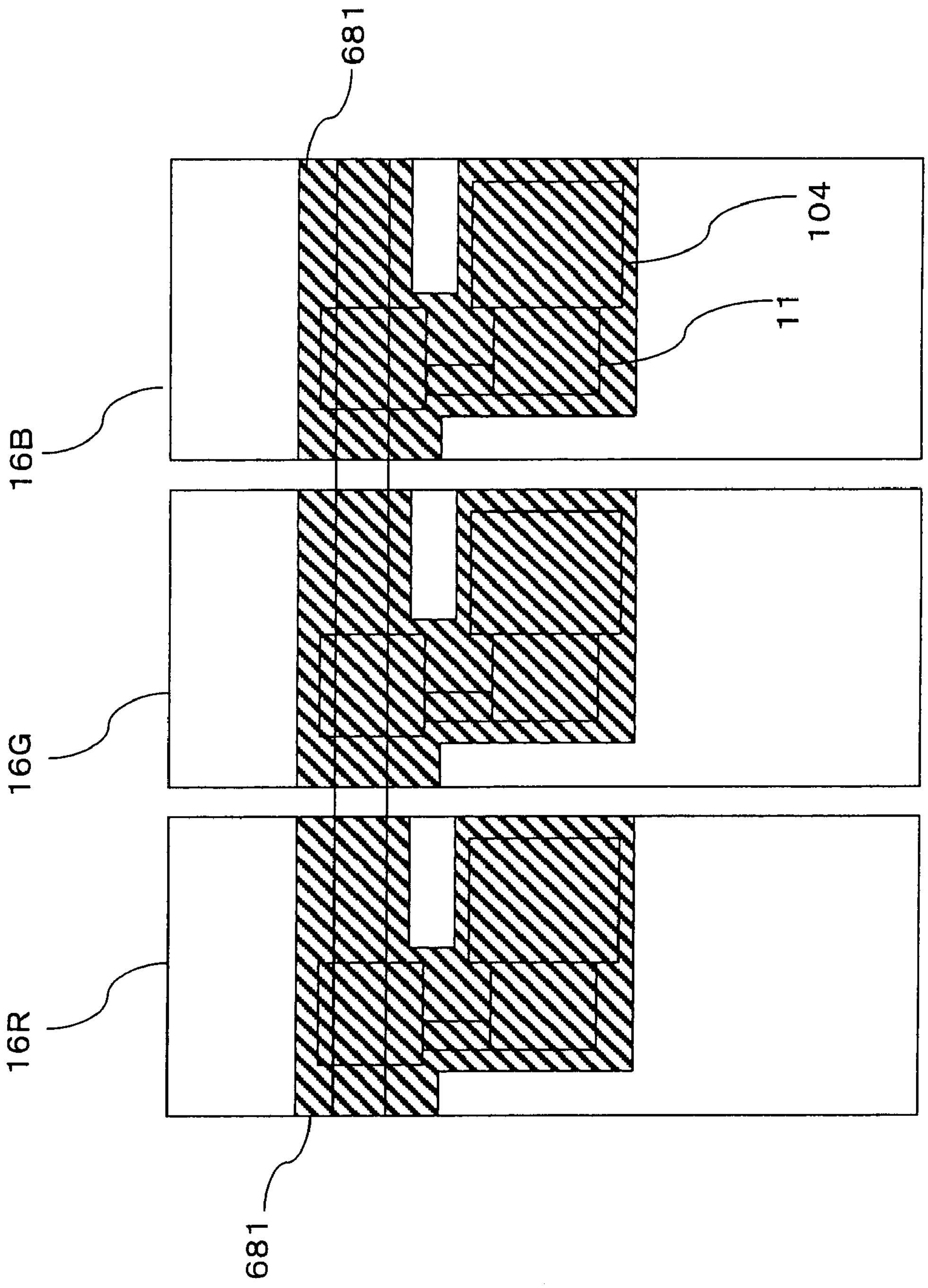
FIG. 71 is an explanatory diagram illustrating a display panel according to the present invention.
Figure 72:
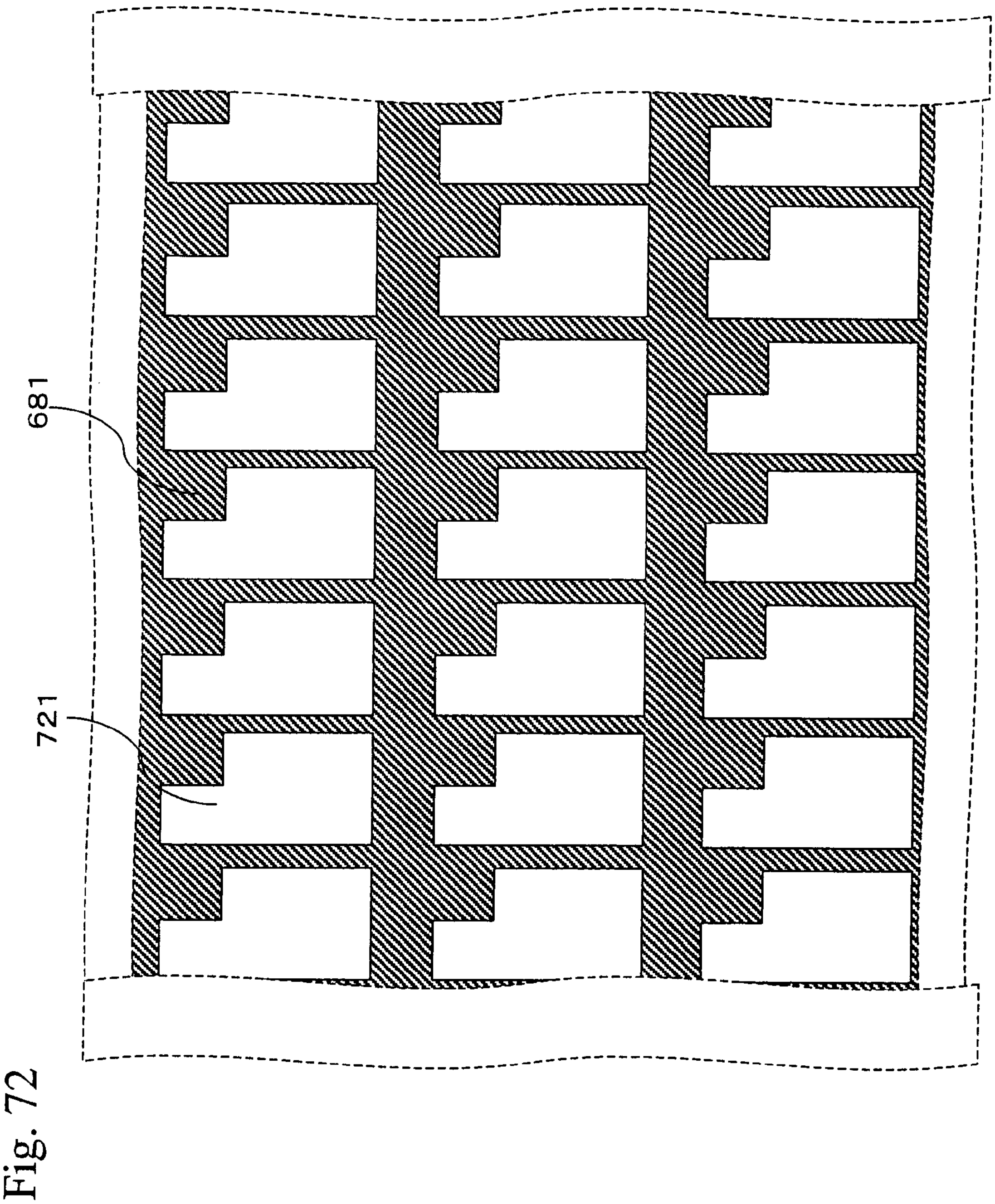
FIG. 72 is an explanatory diagram illustrating a display panel according to the present invention.

FIG. 71 schematically shows the pixel electrodes 105 as viewed from the top. The insulating film 681 is formed in the non-luminous areas. FIG. 72 shows how the insulating film 681 is formed in areas other than pixel apertures 721.

The insulating film is, for example, a thin film of inorganic material such as $SiO_2$, SiO, $TiO_2$, or $Al_2O_3$. Alternatively, it may be a thin or thick film of organic material such as acrylic resin or resist. Incidentally, the pixel electrodes in the non-transparent areas may be removed by patterning. Also, needless to say, thin metal film and the like forming the cathode may be removed by patterning.

As the insulating film 681 is formed or the electrodes of EL elements 15 are removed by pattering, electric charges are not poured into the EL layers 15. Consequently, the EL elements 15 in the non-luminous areas do not emit light. This results in improved power efficiency.

Figure 73:
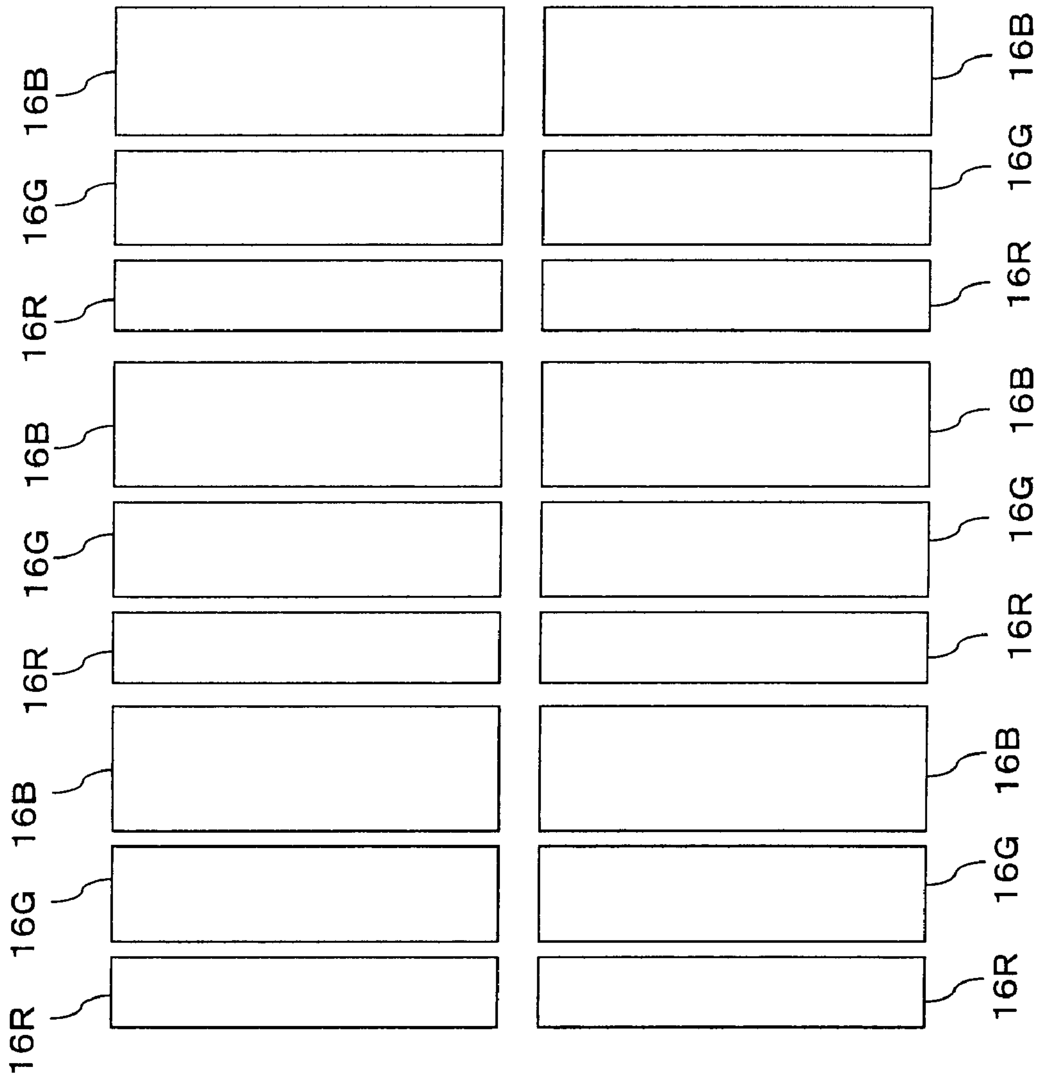
FIG. 73 is an explanatory diagram illustrating a display panel according to the present invention.

Incidentally, needless to say, pixel size may be varied among R, G, and B as illustrated in FIG. 73. Since the luminous efficiency of the EL elements 15 vary among R, G, and B, a good white balance can be achieved by varying the pixel aperture ratio (pixel size) among R, G, and B as illustrated in FIG. 73.

Figure 69:
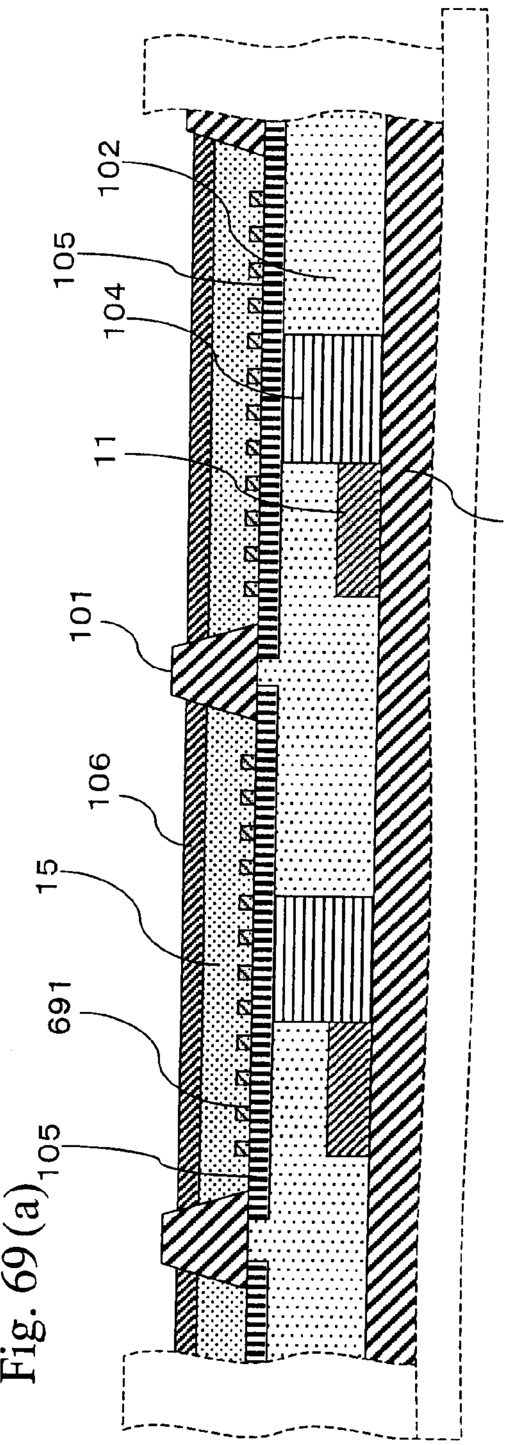
FIG. 69 is an explanatory diagram illustrating a display panel according to the present invention.
Figure 69:
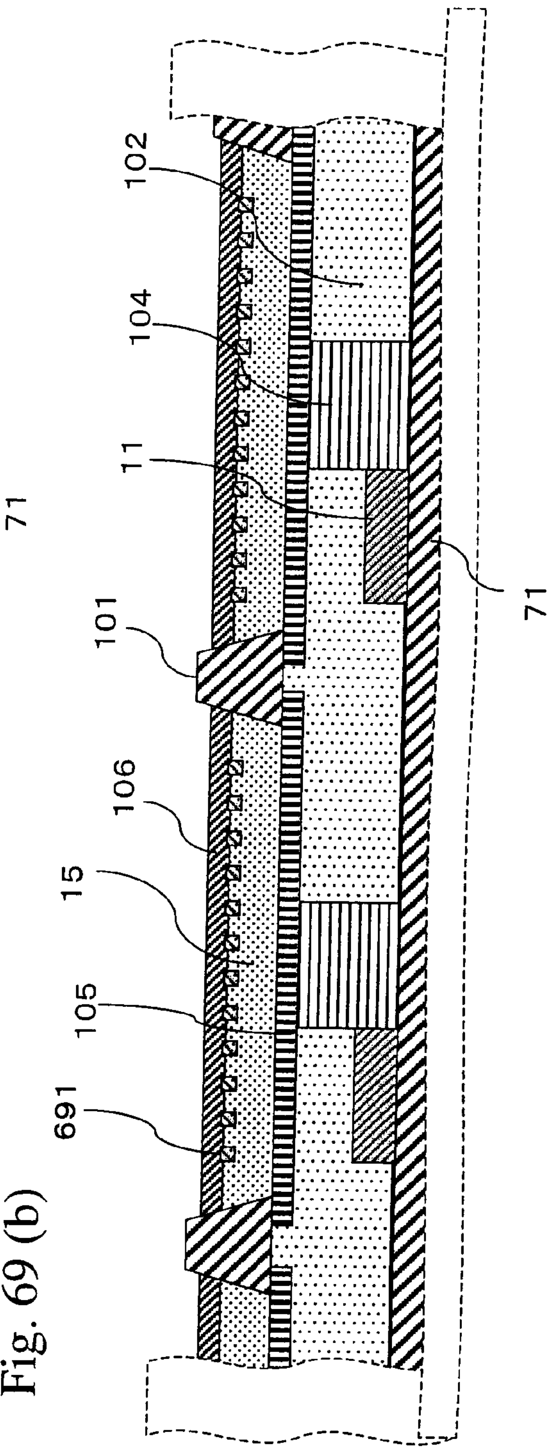

To increase the quantity of light emitted from the board 71 to the outside, it is recommended to form a diffraction grating illustrated in FIG. 69. The light produced by the EL layers 15 is diffracted by the diffraction grating, reducing the amount of light reflected at the critical angle. This increases the amount of light emitted from the board 71, achieving a high-brightness display.

FIG. 69(*a*) shows an example in which a diffraction grating 691 is formed on pixel electrodes 105. Diffraction effect can be obtained by patterning the pixel electrodes 105 or forming a diffraction grating under or on the pixel electrodes 105.

The shape of diffraction grating may be circular, triangular, serrated, rectangular, or sinusoidal. However, in terms of characteristics and efficiency, preferably the diffraction grating is sinusoidal. Preferably, the pitch of the diffraction grating is between 1 μm and 20 μm (both inclusive). More preferably, it is between 2 μm and 10 μm (both inclusive). Preferably, the height of the diffraction grating is between 2 μm and 20 μm (both inclusive). More preferably, it is between 3 μm and 10 μm (both inclusive). Also, preferably, the diffraction grating is three-dimensional (dot-matrix) rather than linear (two-dimensional). This is because linear shape will cause polarization dependence.

FIG. 69(*b*) shows an example in which a diffraction grating 691 is formed on cathode electrodes 106. Diffraction effect can be obtained by patterning the cathode electrode 106 or forming a diffraction grating under or on the cathode electrode 106.

Figure 70:
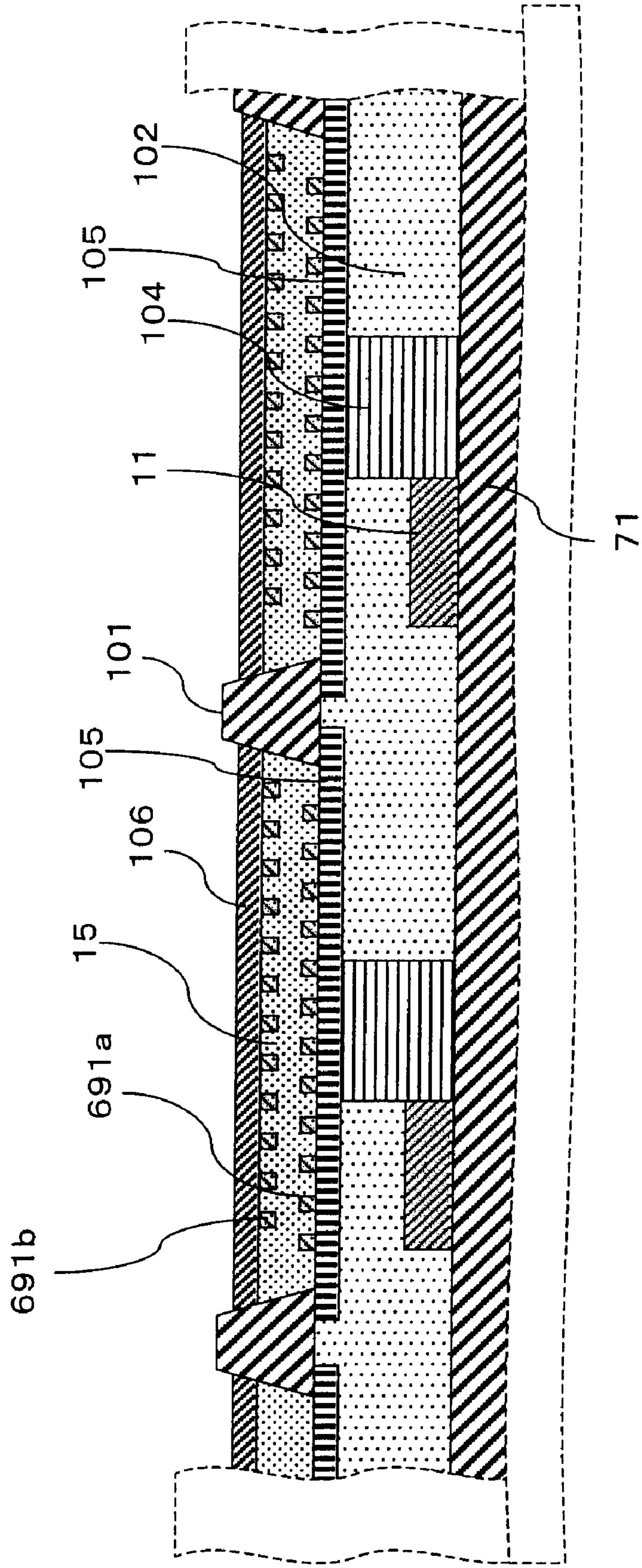
FIG. 70 is an explanatory diagram illustrating a display panel according to the present invention.

FIG. 70 shows an example in which diffraction gratings 691 are formed on cathode electrodes 106 and pixel electrodes. The diffraction gratings 691*a* and 691*b* can be formed to be two-dimensional (linear) and the formation direction of the diffraction gratings 691*a* and 691*b* can be configured to be orthogonal to each other. Of course, needless to say, one or both of the diffraction gratings 691*a* and 691*b* may be three-dimensional.

Preferably, LDD (low doped drain) structure is used for the transistors 11. The EL elements will be described herein taking organic EL elements (known by various abbreviations including OEL, PEL, PLED, OLED) 15 as an example, but this is not restrictive and inorganic EL elements may be used as well.

An organic EL display panel of active-matrix type must satisfy two conditions that:

1. it is capable of selecting a specific pixel and give necessary information and 2. it is capable of passing current through the EL element throughout one frame period.

Figure 62:
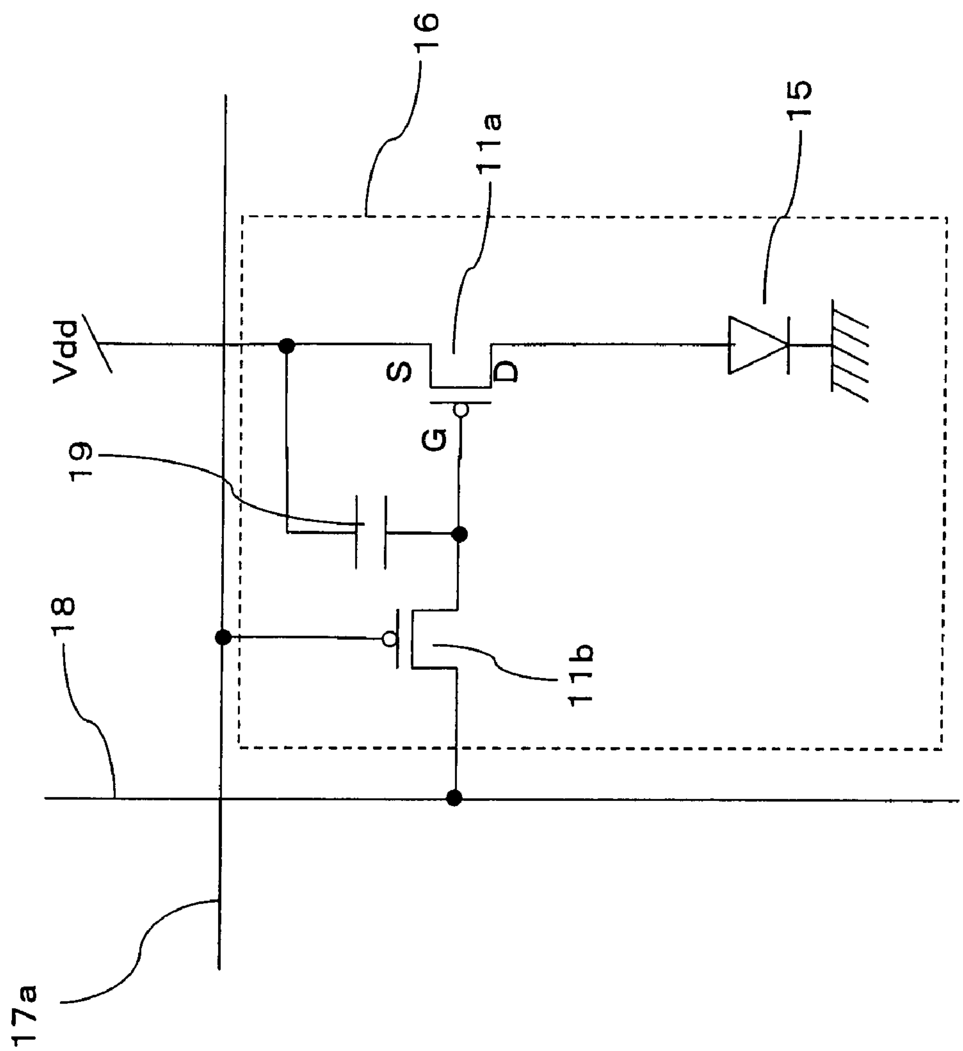
FIG. 62 is a block diagram of a pixel in a conventional display panel.

To satisfy the two conditions, in a conventional organic EL pixel configuration shown in FIG. 62, a switching transistor is used as a first transistor 11*b* to select the pixel and a driver transistor is used as a second transistor 11*a* to supply current to an EL element (EL film) 15.

To display a gradation using this configuration, a voltage corresponding to the gradation must be applied the gate of the driver transistor 11*a*. Consequently, variations in a turn-on current of the driver transistor 11*a* appear directly in display.

The turn-on current of a transistor is extremely uniform if the transistor is monocrystalline (ex. a transistor formed on a silicon substrate). However, in the case of a low-temperature polycrystalline transistor formed on an inexpensive glass substrate by low-temperature polysilicon technology at a temperature not higher than 450, its threshold varies in a range of ±0.2 V to 0.5 V. The turn-on current flowing through the driver transistor 11*a* varies accordingly, causing display irregularities. The irregularities are caused not only by variations in the threshold voltage, but also by mobility of the transistor and thickness of a gate insulating film. Characteristics also change due to degradation of the transistor 11.

Variations in the characteristics of the transistor is not limited to low-temperature polysilicon technologies, and can occur in transistors formed on semiconductor films grown in solid-phase (CGS) by high-temperature polysilicon technology at a process temperature of 450 degrees (centigrade) or higher. Besides, the phenomenon can occur in organic transistors and amorphous silicon transistors. Description will be given herein mainly of transistors produced by the low-temperature polysilicon technology.

In a method which displays gradations by the application of voltage as shown in FIG. 62, device characteristics must be controlled strictly to obtain a uniform display. However, current low-temperature polycrystalline polysilicon transistors or the like cannot satisfy a specification which prescribes that variations be kept within a predetermined range.

Figure 1:
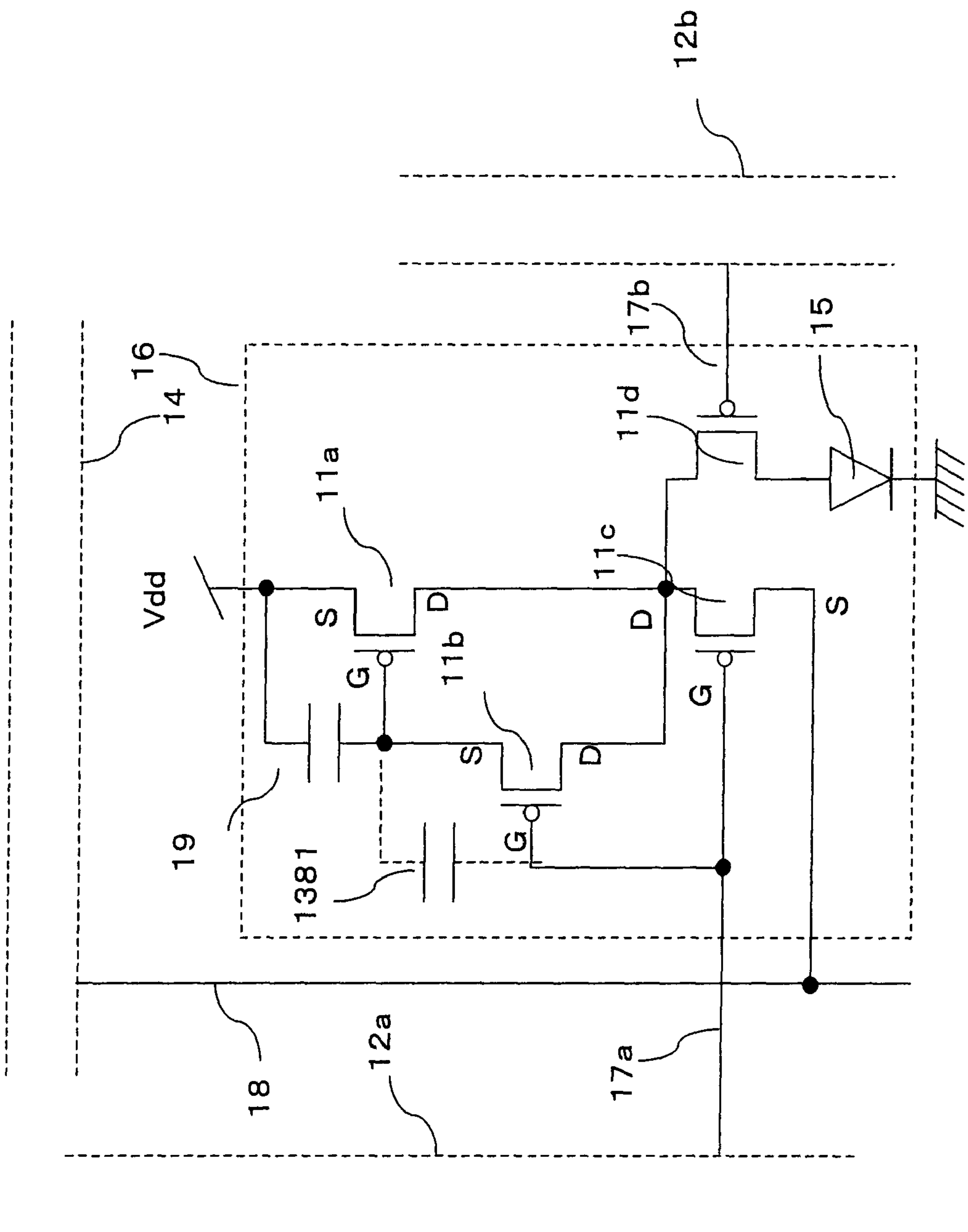
FIG. 1 is a block diagram of a pixel in a display panel according to the present invention.

Each pixel structure in an EL display panel according to the present invention comprises four transistors 11 and an EL element as shown concretely in FIG. 1. Pixel electrodes are configured to overlap with a source signal line. Specifically, the pixel electrodes 105 are formed on an insulating film or planarized acrylic film formed on the source signal line 18 for insulation. A structure in which pixel electrodes overlap with at least part of the source signal line 18 is known as a high aperture (HA) structure. This reduces unnecessary light interference and allows proper light emission.

In this circuit, a single pixel contains four transistors 11. The gate of the transistor 11*a* is connected to the source of the transistor 11*b*. The gates of the transistors 11*b* and 11*c* are connected to the gate signal line 17*a*. The drain of the transistor 11*b* is connected to the source of the transistor 11*c* and source of the transistor 11*d*. The drain of the transistor 11*c* is connected to the source signal line 18. The gate of the transistor 11*d* is connected to the gate signal line 17*b* and the drain of the transistor 11*d* is connected to the anode electrode of the EL element 15.

Incidentally, the transistors 11*b* and 11*c* are examples of the second switching elements according to the present invention. On the other hand, the transistor 11*d* is an example of the first switching elements according to the present invention.

As the gate signal line (a first scanning line) 17*a* is activated (a turn-on voltage is applied), the driver transistor 11*a* and switching transistor 11*c* of the EL element 15 are turned on. At the same time, the current to be passed through the EL element 15 is delivered by the source driver circuit 14. Also, the transistor 11*b* turns on to short-circuit the gate and drain of the transistor 11*a* and the current delivered by the source driver circuit 14 is stored in a capacitor (storage capacitance, additional capacitance) 19 connected between the gate and source of the transistor 11*a* (see FIG. 3(*a*)).

Figure 3:
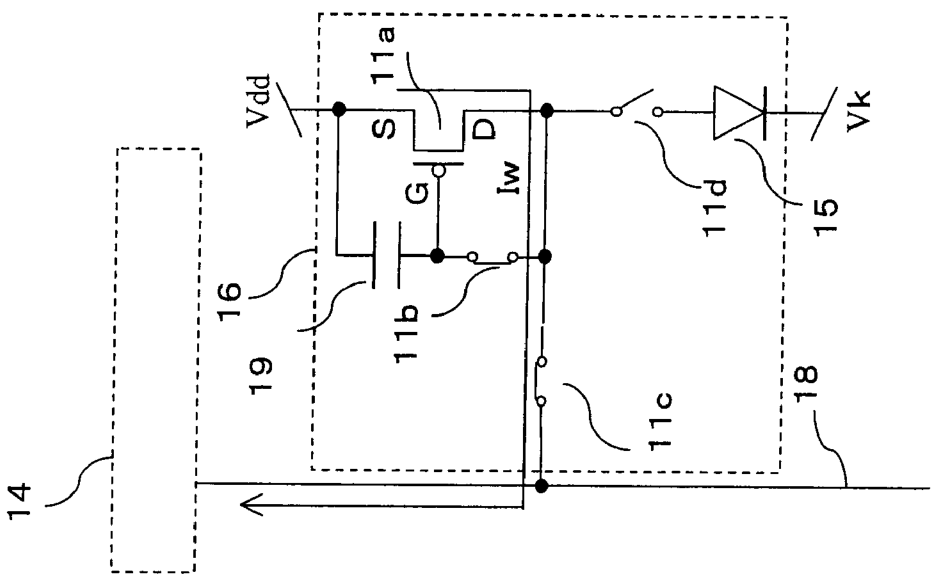
FIG. 3 is an explanatory diagram illustrating operation of a display panel according to the present invention.
Figure 3:
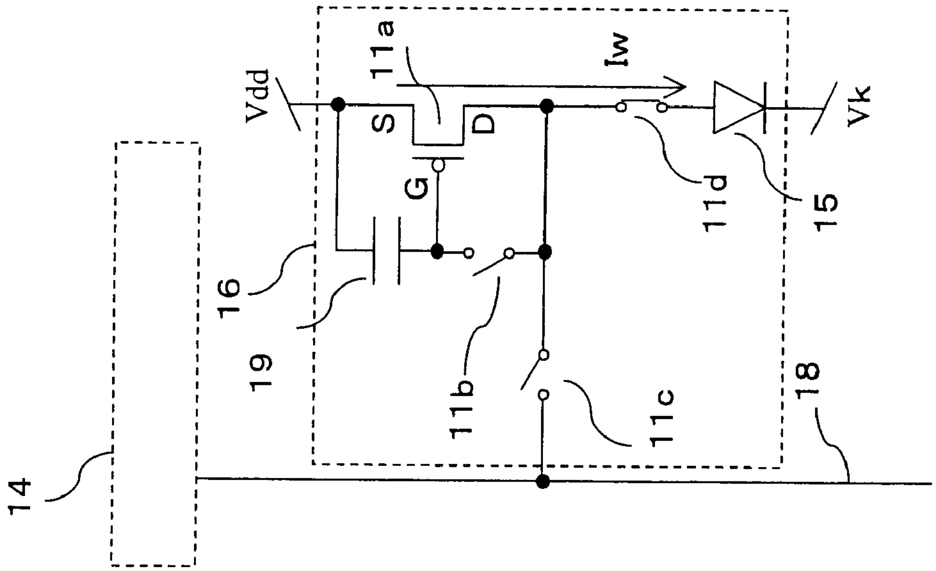

Nest, the gate signal line 17*a* is deactivated (a turn-off voltage is applied), a gate signal line 17*b* is activated, and a current path is switched to a path which includes the first transistor 11*a*, a transistor 11*d* connected to the EL element 15, and the EL element 15 to deliver the stored current to the EL element 15 (see FIG. 3(*b*)).

If the capacity of the capacitor 19 needed for a single pixel is Cs (pF) and an area (pixel size rather than an aperture ratio) occupied by the pixel is Sp (square μm), a condition 500/Sp≦Cs≦20000/Sp, and more preferably a condition 1000/Sp≦Cs≦10000/Sp should be satisfied. Incidentally, since gate capacity of the transistor is small, Cs as referred to here can be regarded as the capacity of the storage capacitance (capacitor) 19 alone.

Preferably, the capacitors 19 are generally formed in non-display areas of pixels. Generally, for full-color organic EL 15, the organic EL layers 15 are formed by masked vapor deposition using metal masks. If masks are misaligned, there is a danger that the organic EL layers 15 (15R, 15G, and 15B) of different colors may overlap. Thus, adjacent pixels of different colors must be separated 10μ or more by non-display areas. These areas do not contribute to light-emission (non-luminous areas). Thus, by forming the storage capacitance 19 in these areas, it is possible to make effective use of the space in the pixels, providing an effective means of increasing an aperture ratio.

Incidentally, all the transistors in FIG. 1 are P-channel transistors. Compared to N-channel transistors, P-channel transistors have more or less lower mobility, but they are preferable because they are more resistant to voltage and degradation. However, the EL element according to the present invention is not limited to P-channel transistors and the present invention may employ N-channel transistors alone. Also, the present invention may employ both N-channel and P-channel transistors.

In FIG. 1, preferably the transistors 11*c* and 11*b* are n-channel transistors of the same polarity while the transistors 11*a* and 11*d* are p-channel transistors. Generally, p-channel transistors are more reliable than p-channel transistors. They feature reduced kink current, etc. The use of p-channel transistors for the transistors 11*a* has good effects on the EL elements 15 which obtain desired luminous intensity by controlling current.

Optimally, P-channel transistors should be used for all the transistors 11 composing pixels as well as for the built-in gate driver circuit 12. By composing an array solely of P-channel transistors, it is possible to reduce the number of masks to 5, resulting in low costs and high yields.

Figure 87:
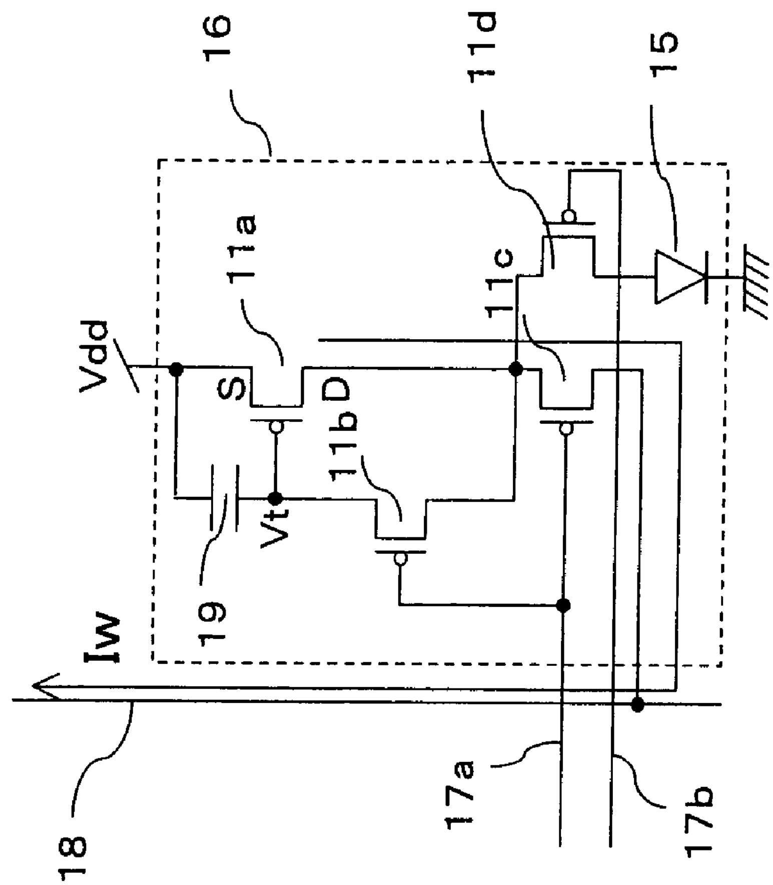
FIG. 87 is an explanatory diagram illustrating a checking method according to the present invention.
Figure 88:
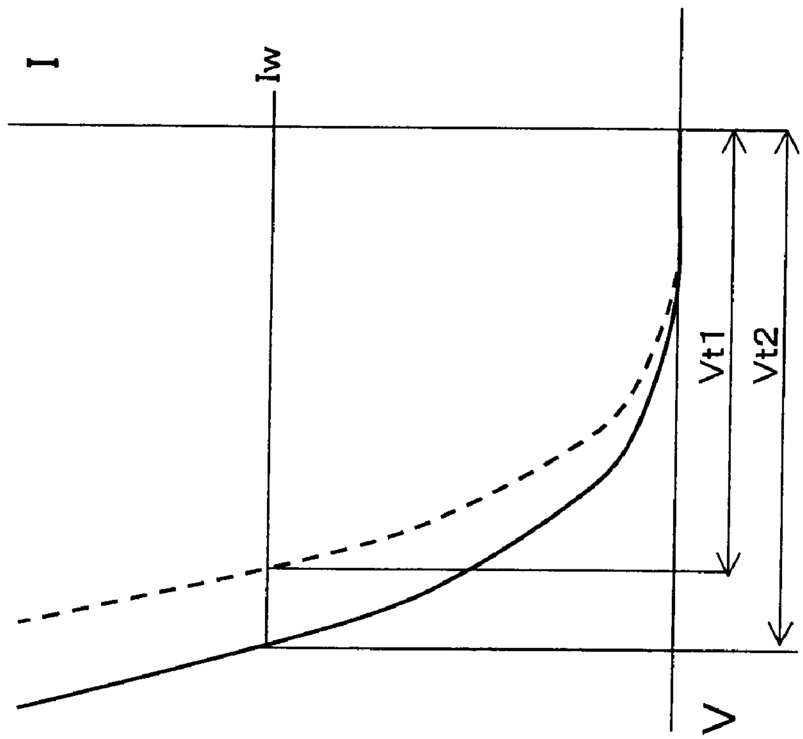
FIG. 88 is an explanatory diagram illustrating a checking method according to the present invention.

The current-driven pixel configurations in FIG. 1 and the like allow pixel defects to be checked electrically. A checking method according to the present invention will be described below. FIGS. 87 and 88 are explanatory diagrams illustrating the checking method according to the present invention. With the pixel configuration in FIG. 87 (the pixel configuration in Figure is cited as an example), programming current Iw is applied to the source signal line 18. The programming current Iw ranges from 1 μA to 10 μA. The driver transistor 11*a* operates in such a way as to pass a predetermined programming current Iw. That is, the potential at the gate (G) terminal of the driver transistor 11*a* changes. The potential at the gate (G) terminal of the driver transistor 11*a* required to pass the predetermined programming current Iw is denoted by Vt.

For example, to pass the current Iw through the driver transistor 11*a* of a pixel, the potential at its gate (G) terminal must be lower than the Vdd voltage by Vt2 (solid line in FIG. 88). To pass the current Iw through the driver transistor 11*a* of another pixel, the potential at its gate terminal must be lower than the Vdd voltage by Vt1 (dotted line in FIG. 88). These values of Vt, which correspond to changes in the potential of the source signal line 18, represent characteristics of the driver transistors 11*a* of the pixels 16.

That is, the potential at the gate terminal of the driver transistor 11*a* of the selected pixel 16 becomes the potential of the source signal line 18. Since the current passed by a driver transistor 11*a* is determined by adjusting the potential at the gate terminal of the driver transistor 11*a*, it is possible to measure characteristics of the driver transistor 11*a* by looking at the potential at the gate terminal of the driver transistor 11*a*. Also, defects which occur in the pixel 16 cause the source signal line 18 to output an abnormal potential. Thus, defects and the like can be detected.

Apply a turn-on voltage to one gate signal line 17*a* by controlling the gate drive circuit 12. That is, select pixel rows one by one in sequence (a turn-off voltage is applied to the other gate signal lines 17*a*). Also, set the source signal line 18 to pass the current Iw. As a turn-on voltage is applied to the gate signal line 17*a*, the gate terminal of the driver transistor 11*a* of the selected pixel 16 assumes the Vt voltage required to pass the predetermined current Iw.

Apply a turn-off voltage to the gate signal line 17*b*. The application of the turn-off voltage turns off the transistor 11*d*, cutting off the driver transistor 11*a* and EL element 15 from each other. Thus, the checking method according to the present invention can be applied even to an array board on which EL elements 15 are yet to be formed.

Figure 89:
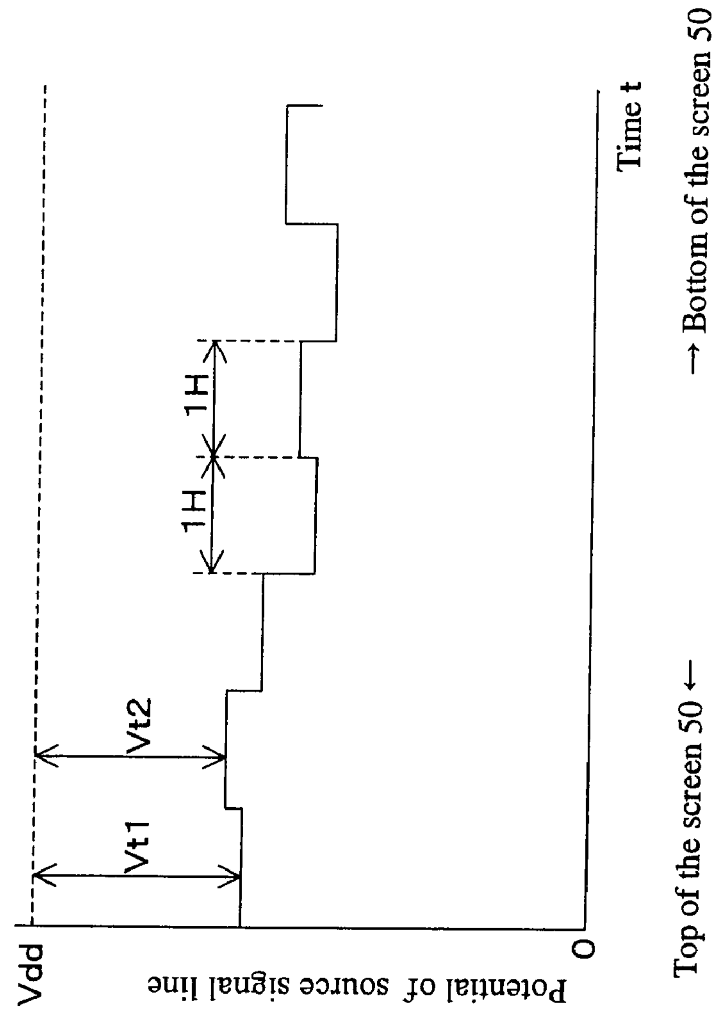
FIG. 89 is an explanatory diagram illustrating a checking method according to the present invention.

In this way, as the location of the gate signal line 17*a* to which a turn-on voltage is applied is shifted in sequence in sync with a horizontal scanning period (1 H), the potential of the source signal line 18 changes as illustrated in FIG. 89 (see also FIG. 88). The changes are outputted in sync with 1 H. Incidentally, the use of 1 H is not strictly necessary because what goes on here is checking rather than image display. Thus, 1 H is used for ease of explanation to mean selecting one pixel row in sequence. Any fixed period may be used instead of 1 H. That is, 1 H is a period during which the pixel row to be checked is selected.

In the checking system (checking device, checking method) according to the present invention, it may be apparent that two or more pixel rows may be selected simultaneously. This is because pixel defects and the like can be detected if an abnormal output is sent to the source signal line 18 even if two or more pixel rows are selected simultaneously. The current outputted from the pixel 16 being checked is a minute current on the order of μA. If short-circuit defects or the like occur in the pixel 16, an output at least on the order of mA is sent to the source signal line 18. Thus, two or more pixel rows can be selected and checked simultaneously. In extreme cases, all the pixel rows in the display area 50 can be selected and checked at once. Also, half the screen 50 may be checked at a time.

Figure 90:
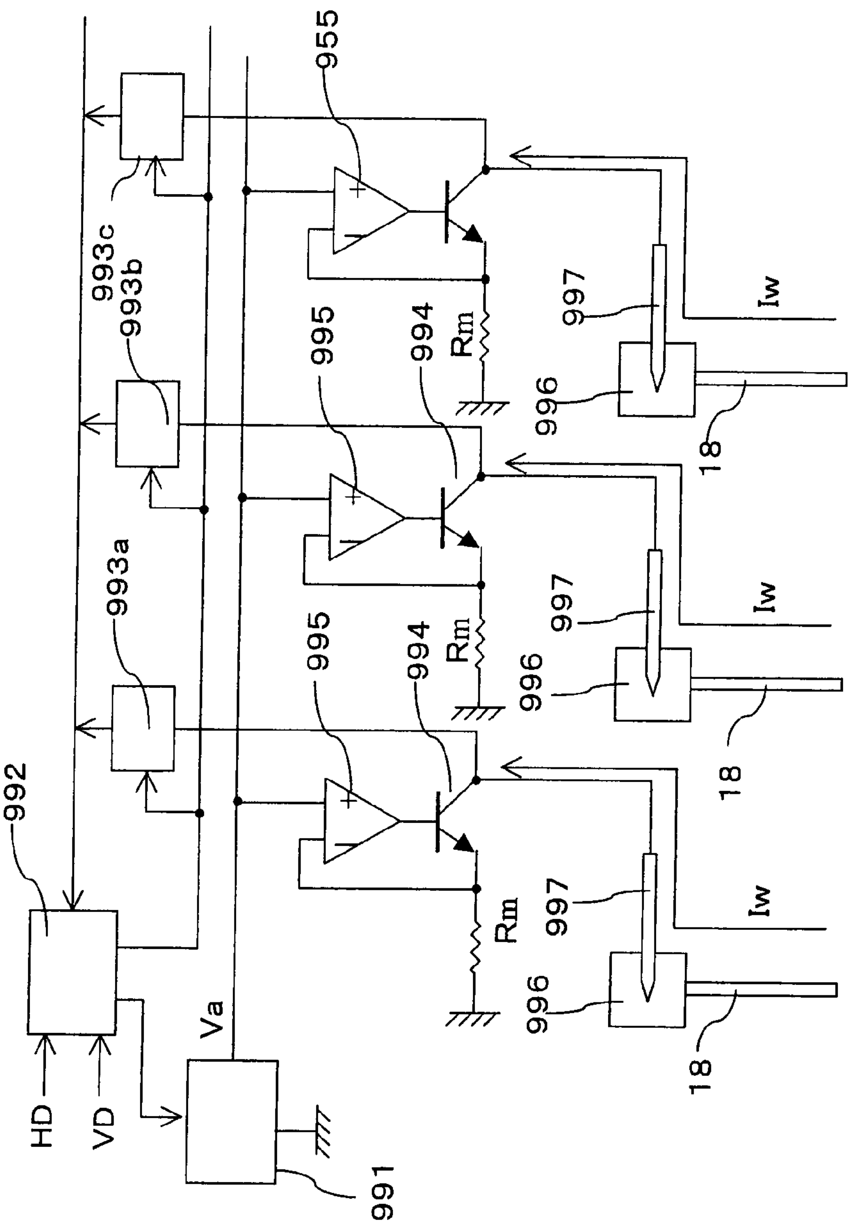
FIG. 90 is an explanatory diagram illustrating a checking method according to the present invention.

FIG. 90 is a block diagram of a checking circuit used to perform the checking method according to the present invention. A probe 997 is connected to an electrode terminal 996 of each source signal line 18 and the programming current Iw is applied to the source signal line 18. The programming current Iw can be changed or adjusted with a reference voltage circuit 991. A reference voltage Va from the reference voltage generator circuit 991 is inputted in the plus terminal (positive terminal) of an operational amplifier 995. The operational amplifier 995 composes a constant-current circuit in conjunction with a transistor 994 and resistor Rm.

The programming current Iw is set to between 1 μA and 10 μA. Basically, use the maximum current needed to drive the panel. Alternatively, a small current not larger than 100 nA may be used for measurement to examine black writing mode (during black display).

The reference voltage Va outputted by the reference voltage circuit 991 is applied to the plus terminal (positive terminal) of the operational amplifier 995. The plus terminal and minus terminal of the operational amplifier are at the same potential, and thus the same current Iw (=Va/Rm) that flows through the source signal line 18 flows through the transistor 994. Consequently, a constant current Iw flows through all the source signal lines 18. The current Iw can be changed easily by changing the reference voltage Va.

Incidentally, although it is stated herein that the same current Iw is passed through all the source signal lines 18, this is not restrictive. For example, checks may be run by passing different constant currents through adjacent source signal lines 18. Also, the method of connecting the probe 997 to the electrode 996 is not limited to the one described above. For example, they may be bonded by an ACF technique. Also, gold bumps or nickel bumps may be used for the connection.

Also, in the checking method according to the present invention, although it is stated herein that constant current Iw is passed through the source signal lines 18, this is not restrictive. For example, current (alternating current) having a rectangular waveform may be used for the checking. It is also possible to use two modes in combination: a first mode in which voltage is applied to source signal lines 18 to detect a short circuit between adjacent source signal lines 18 and a second mode in which constant current is passed through source signal lines 18 to detect pixel defects. It is also possible to perform checking by applying signals (voltage or current) to the cathode electrode and anode electrode of an EL element 15 and detecting or measuring the signals by a source signal line 18.

With the configuration in FIG. 90, since the constant current Iw flows through the source signal lines 18, the voltage (current) waveform in FIG. 89 can be measured by shifting the gate signal lines 17*a* in sequence. The voltage waveform is converted from analog voltage (current) to a digital signal by an input circuit 993 (which consists of a high-input-impedance operational amplifier, analog input-selector switch, AD (analog-digital) converter circuit, etc.) and the resulting signal is captured into data collection means and control means such as a personal computer (PC) 992.

The source signal lines 18, through which minute current flows, are in a high-impedance state. To measure changes (or their absolute values) in the potential of the source signal lines 18 properly in this state, a high-impedance circuit (a positive input terminal of an input operational amplifier consisting of a FET circuit) is connected to each source signal line 18. That is, the probes 997 are electrically connected with the positive input terminals of the input operational amplifiers (not shown) of the respective input circuits 993.

A QCIF panel has 176×RGB=528 source signal lines 18. It is difficult to place AD converters on all the source signal lines 18. Thus, a multiplexer type analog switch (not shown) is placed on the output side of the input operational amplifier of each input circuit 993. An AD converter is placed at the output of the analog switch and data from the AD converter is captured into the PC 992. In FIG. 90, the high-impedance circuit, analog switch, etc. are described as being components of the input circuit 993.

Figure 91:
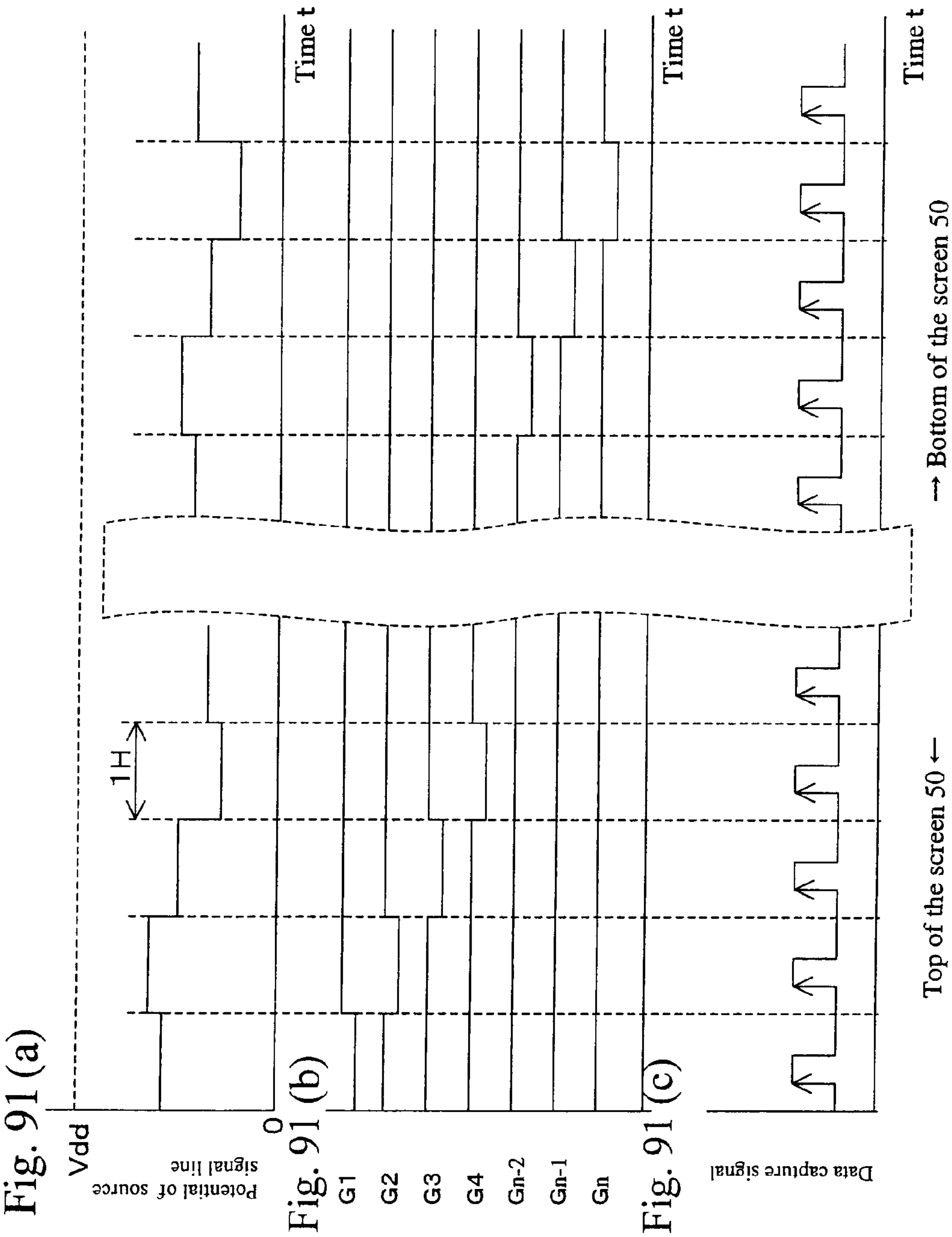
FIG. 91 is an explanatory diagram illustrating a checking method according to the present invention.

FIG. 91 is a timing chart of a circuit (checking circuit) which measures the potential (voltage or current) of source signal lines 18. FIG. 91(*a*) shows changes in the potential (voltage or current) of the source signal lines 18, where the changes are synchronized with 1 H. FIG. 91(*b*) shows the potentials of gate signal lines 17*b*. It can be seen that the location of the gate signal line to which a turn-on voltage is applied is shifted every pixel row. In sync with the pixel row selection, the transistor 11*a* of the selected pixel row operates and the potential of the source signal lines 18 (FIG. 91(*a*)) changes.

FIG. 91(*c*) shows a data capture signal to data input means 992 (this signal can also be viewed as an analog switch changeover signal in the input circuit 993). Data is captured into the data input means 992 on a rising edge of the data capture signal.

The PC 992 evaluates/judges values of the captured data. Also, it accumulates the values of the data. Based on obtained results, defect state, defect locations, defect mode, faulty conditions, etc. of the array or panel are detected or checked.

With the pixel configuration in FIG. 87, when a turn-on voltage is applied to the gate signal line 17*a* and a turn-off voltage is applied to the gate signal line 17*b*, a current path is formed as follows: the Vdd terminal→between the source and drain of the transistor 11*a*→transistor 11*c*→the source signal line 18.

Figure 92:
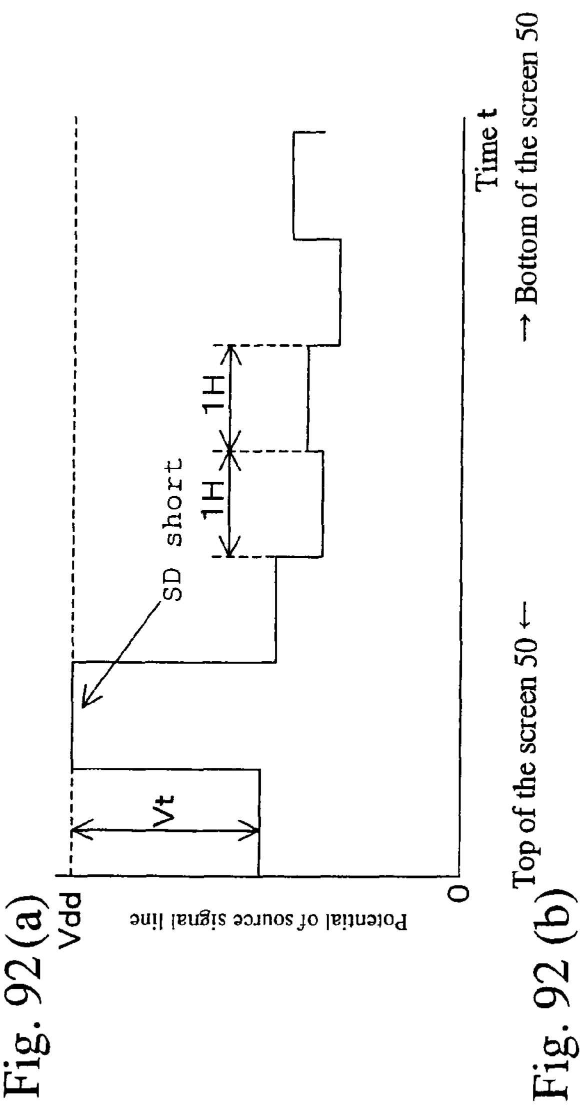
FIG. 92 is an explanatory diagram illustrating a checking method according to the present invention.
Figure 92:
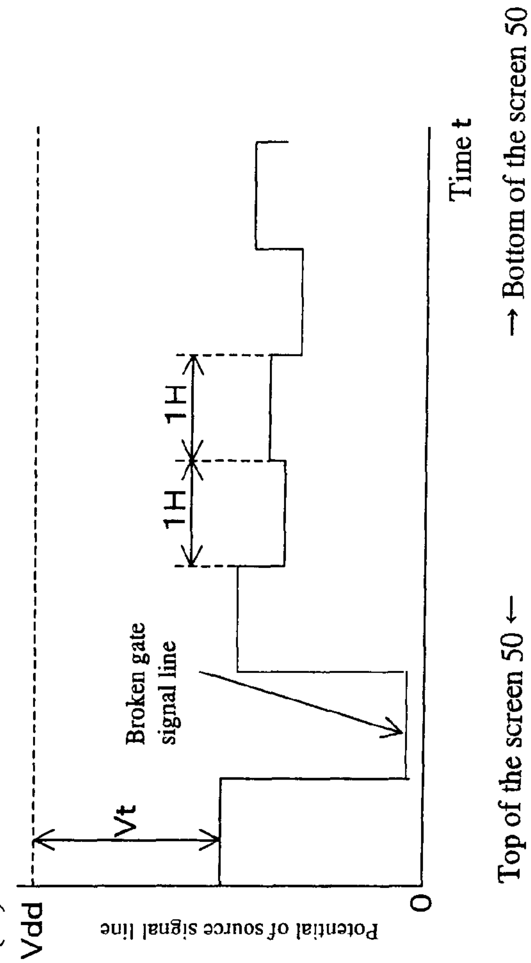

If a short circuit (referred to as an SD short or channel short) occurs between the source terminal S and drain terminal D of the transistor 11*a*, the Vdd voltage is outputted to the source signal line 18 (the SD short in FIG. 92(*a*)). Thus, the SD short (pixel defects) of the transistor 11*a* can be detected electrically.

Also, if the gate signal line 17*a* is broken, no path is formed for the programming current Iw, and thus the potential of the source signal line 18 becomes close to ground potential (see a broken gate signal line in FIG. 92(*b*)). Thus, wire defects such as a break in the gate signal line 17*a* can be detected (checked). Of course, there is no output if a source signal line is broken, and consequently, the break in the source signal line 18 can be detected.

Also, with a turn-off voltage applied to all the gate signal lines 17*a*, if an unusual voltage is outputted to the source signal line 18, it can be detected that the transistor 11*c* or 11*b* of some pixel 16 is defective. Also, the signal outputted to the source signal line 18 varies with whether the Vdd voltage (anode voltage) is applied or the Vdd terminal is opened. This makes it possible to check and examine defects in the pixel 16 in detail. Regarding the cathode electrode, since the signal outputted to the source signal line 18 varies again with signal applications, it is possible to detect defects in the pixel 16.

Needless to say, it is also possible to detect defects in a pixel 16 by applying a signal to the source signal line 18 and detecting a signal outputted to the cathode electrode, conversely. Again, pixel rows can be scanned by selecting them one by one with a turn-on voltage.

While the pixel row selected by the gate driver circuit 12 is shifted in sequence, the potential of the source signal line 18 is measured sequentially in sync with the shift operation. The display panel (array board 71) can be checked when the above operation is repeated from top to bottom of the screen 50 (checks on one pixel column are completed).

Figure 93:
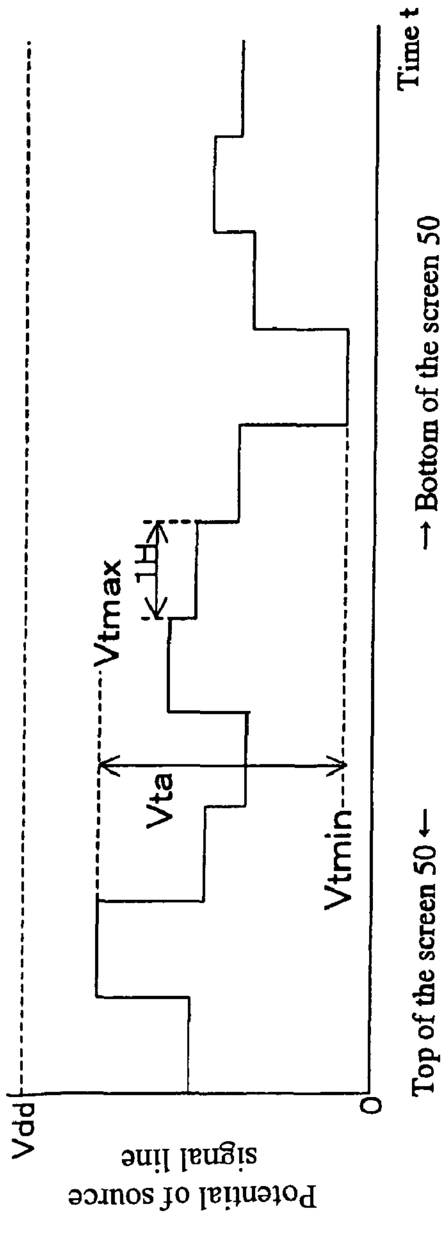
FIG. 93 is an explanatory diagram illustrating a checking method according to the present invention.
Figure 93:
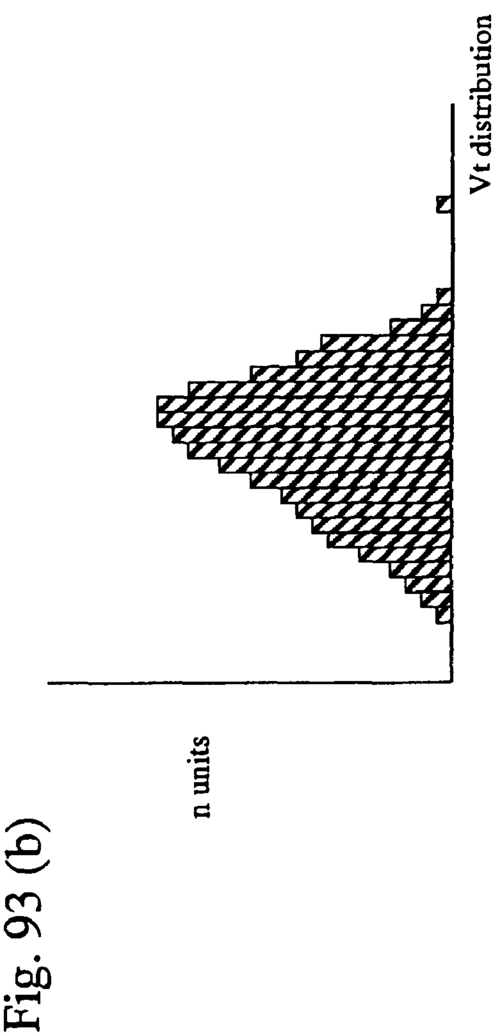

As illustrated in FIG. 93(*a*), by measuring the signal line potential of the source signal line 18 of a pixel column (the pixels 16 connected to one source signal line 18), it is possible to detect a maximum voltage Vtmax (the maximum value of the Vt of the driver transistor 11*a* of a pixel 16 (see FIG. 88)) and minimum voltage Vtmin (the minimum value of the Vt of the driver transistor 11*a* f a pixel 16 (see FIG. 88). If the difference between the maximum voltage and minimum voltage is equal to or larger than a predetermined value, the measured/checked array or panel is judged to be non-conforming.

As illustrated in FIG. 93(*b*), by measuring Vt distribution in an array or panel, it is possible to determine characteristic distribution of the transistors 11*a*. The standard deviation and average value of the Vt can be calculated from the characteristic distribution. Also, when the standard deviation or average value of the Vt falls outside a predetermined range, the measured/checked array or panel is judged to be non-conforming.

The checking method according to the present invention checks pixels 16 by controlling the gate driver circuit 12, thereby applying a turn-on voltage to at least one gate signal line 17*a*, and thereby passing programming current through the source signal line 18.

Incidentally, although it has been stated in the above example that the Vt outputted to the source signal line 18 is measured or checked by selecting pixel rows one by one, this is not restrictive. Two or more pixel rows may be selected simultaneously. It is also possible to check odd-numbered pixels 16 in sequence first by selecting odd-numbered pixel rows in sequence and then check even-numbered pixels 16 in sequence by selecting even-numbered pixel rows in sequence. Pixel defects (broken gate signal lines, SD shorts, etc.) can also be detected in this way as illustrated in FIG. 92.

To speed up checking, a plurality of gate signal lines 17*a* can be selected, approximate defect locations and defect mode can be detected, and then a turn-on voltage can be applied to each gate signal line 17*a* in a portion having defects in sequence to identify the defect locations and defect state.

The checking method according to the present invention does not require that all the source signal lines 18 should be probed at once. For example, the checking method according to the present invention may be performed by connecting probes 997 to the terminal electrodes 996 of the odd-numbered source signal lines 18*b* with the even-numbered source signal lines 18*a* kept open, and then by connecting probes 997 to the terminal electrodes 996 of the even-numbered source signal lines 18*a* with the odd-numbered source signal lines 18*b* kept open.

Of course, every fourth pixel column may be probed by shifting in sequence.

Incidentally, although the gate driver circuit 12 in FIG. 90 and the like is a built in type (other than an external semiconductor chip), this is not restrictive. The gate driver IC 12 may be constructed of a semiconductor chip and mounted on the array board 71 using a COG process.

Although it has been stated with reference to FIG. 90 that voltage is applied to the source signal lines 18 via the probes 997, this is not restrictive. Once the source driver IC 14 has been mounted on the board 71, constant current may be applied to the source signal lines 18 by operating the source driver IC 14. Voltage changes caused by the constant current are measured in the input circuits 993.

Figure 38:
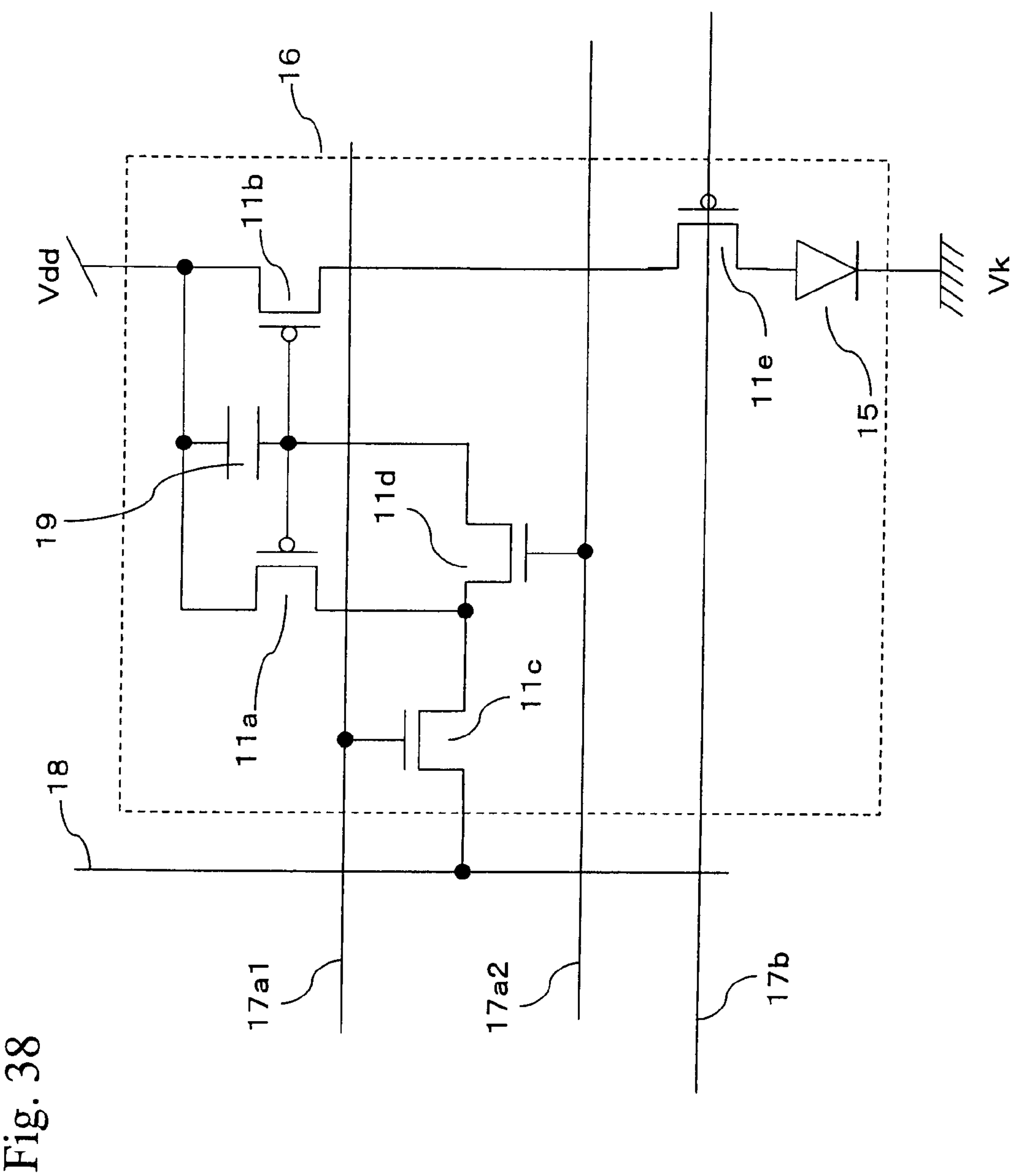
FIG. 38 is a block diagram of a display apparatus according to the present invention.

The checking system with the pixel configuration in FIG. 87 has been described in the above example. However, the present invention is not limited to this and the checking system according to the present invention can also be implemented with another pixel configuration (FIG. 38 or the like).

As described above, the checking system (checking device, checking method) according to the present invention relates to an EL display apparatus or an array board 71 used in the EL display apparatus. The checking system performs checking by applying a selection voltage to a gate signal line 17*a* which selects a pixel 16 and thereby connecting the driver transistor 11*a* of the pixel to a source signal line 18. Also, by applying a signal such as a voltage (or current) to a terminal (signal line) such as a cathode or anode electrode which receives external inputs, the checking system detects whether the signal is outputted from the source signal line 18. Basically, it performs checking by applying a constant current to the source signal lines 18. Also, it selects and scans the gate signal lines 17*a* in sequence.

Preferably, in the display panel, the source driver circuit 14 is not formed directly on the array board 71. This will ease checking. Preferably, checking is performed before sealing glass (sealing lid) is installed after EL elements 15 are formed on the array board 71. This will reduce the cost of discarding non-conforming panels.

To facilitate understanding, the configuration of the EL element in FIG. 1 will be described below with reference to FIG. 3. The EL element according to the present invention is controlled using two timings. The first timing is the one when required current values are stored. Turning on the transistor 11*b* and transistor 11*c* with this timing provides an equivalent circuit shown in FIG. 3(*a*). A predetermined current Iw is applied from signal lines. This makes the gate and drain of the transistor 11*a* connected, allowing the current Iw to flow through the transistor 11*a* and transistor 11*c*. Thus, the gate-source voltage of the transistor 11*a* is such that allows 11 to flow.

The second timing is the one when the transistor 11*a* and transistor 11*c* are closed and the transistor 11*d* is opened. The equivalent circuit available at this time is shown in FIG. 3(*b*). The source-gate voltage of the transistor 11*a* is maintained. In this case, since the transistor 11*a* always operates in a saturation region, the current Iw remains constant.

Figure 5A:
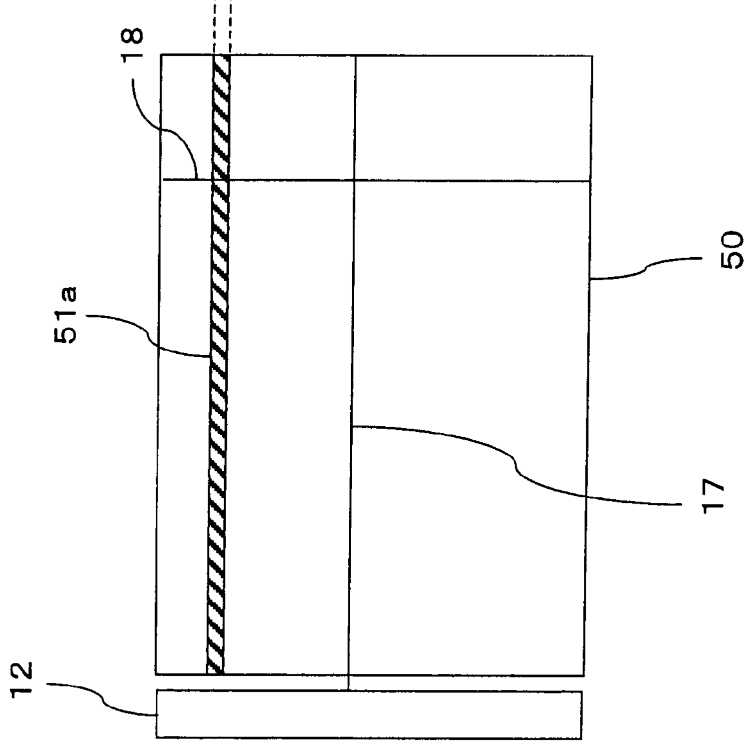
FIG. 5 is an explanatory diagram illustrating a drive method of a display apparatus according to the present invention.
Figure 5B:
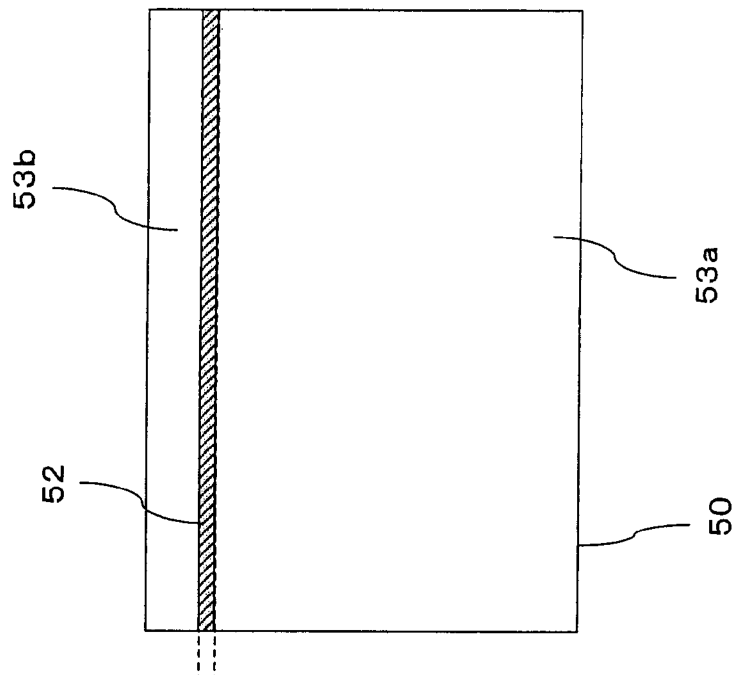

Display results of this operation are shown in FIG. 5. Specifically, reference numeral 51*a* in FIG. 5(*a*) denotes a pixel (row) (write pixel row) programmed with current at a certain time point in a display screen 50. The pixel row 51*a* is non-illuminated (non-display pixel (row)) as illustrated in FIG. 5(*b*). Other pixels (rows) are display pixels (rows) 53 (current flows through the EL elements 15 of the non-pixels 53, causing the EL elements 15 to emit light).

In the pixel configuration in FIG. 1, the programming current Iw flows through the source signal line 18 during current programming as shown in FIG. 3(*a*). The current Iw flows through the transistor 11*a* and voltage is set (programmed) in the capacitor 19 in such a way as to maintain the current Iw. At this time, the transistor 11*d* is open (off).

During a period when the current flows through the EL element 15, the transistors 11*c* and 11*b* turn off and the transistor 11*d* turns on as shown in FIG. 3(*b*). Specifically, a turn-off voltage (Vgh) is applied to the gate signal line 17*a*, turning off the transistors 11*b* and 11*c*. On the other hand, a turn-on voltage (Vgl) is applied to the gate signal line 17*b*, turning on the transistor 11*d*.

Figure 4:
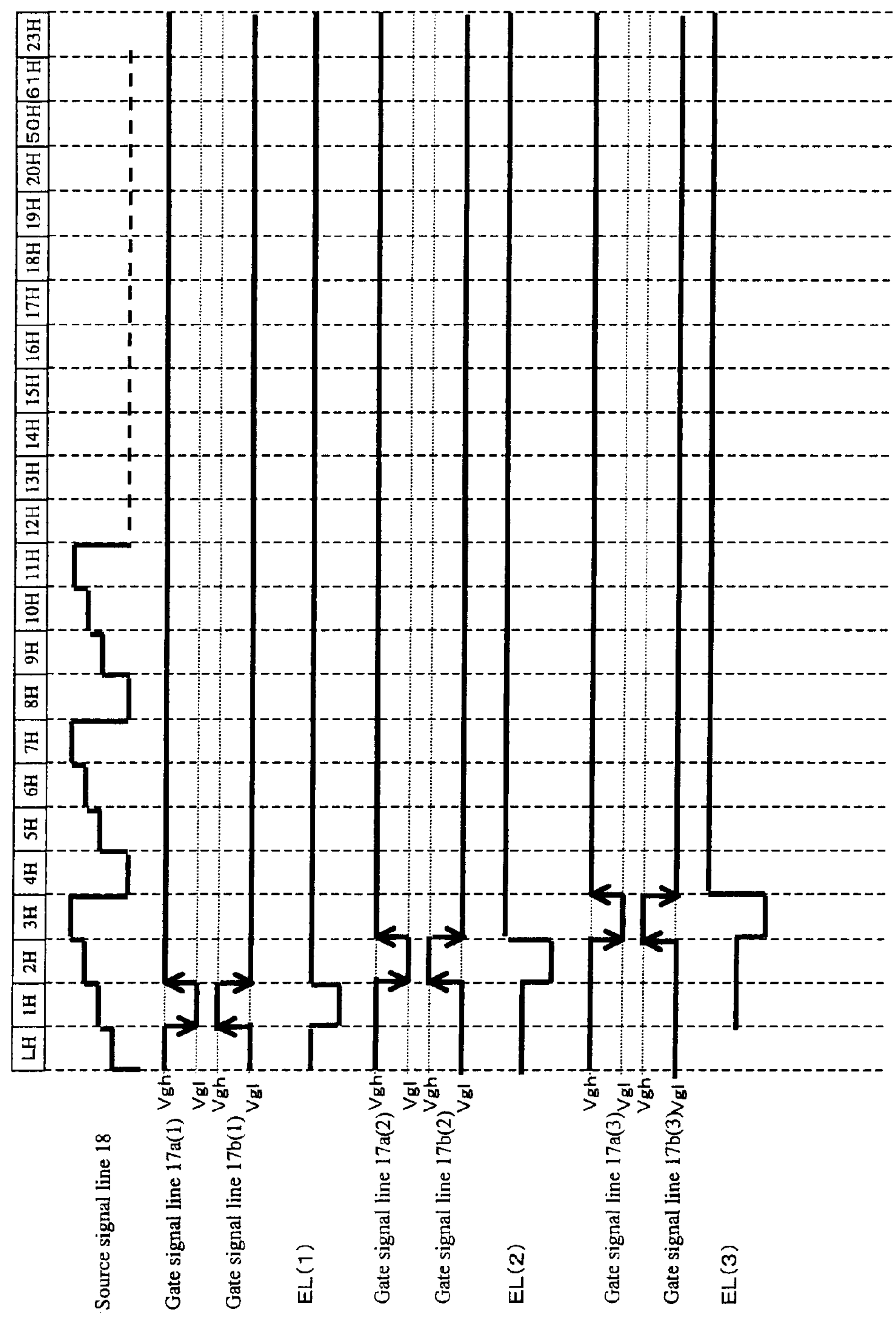
FIG. 4 is an explanatory diagram illustrating operation of a display panel according to the present invention.

A timing chart is shown in FIG. 4. The subscripts in brackets in FIG. 4 (e.g., (1)) indicate pixel row numbers. Specifically, a gate signal line 17*a*(1) denotes a gate signal line 17*a* in a pixel row (1). Also, *H (where "*" is an arbitrary symbol or numeral and indicates a horizontal scanning line number) in the top row in FIG. 4 indicates a horizontal scanning period. Specifically, 1 H is a first horizontal scanning period. Incidentally, the items (1 H number, 1-H cycle, order of pixel row numbers, etc.) described above are intended to facilitate explanation and are not intended to be restrictive.

As can be seen from FIG. 4, in each selected pixel row (it is assumed that the selection period is 1 H), when a turn-on voltage is applied to the gate signal line 17*a*, a turn-off voltage is applied to the gate signal line 17*b*. During this period, no current flows through the EL element 15 (non-illuminated).

In non-selected pixel rows, a turn-off voltage is applied to the gate signal line 17_a_ and a turn-on voltage is applied to the gate signal line 17_b_. During this period, a current flows through the EL element 15 (illuminated).

Incidentally, the gate of the transistor 11_a_ and gate of the transistor 11_c_ are connected to the same gate signal line 17_a_. However, the gate of the transistor 11_a_ and gate of the transistor 11_c_ may be connected to different gate signal lines 17 (see FIG. 32). Then, one pixel will have three gate signal lines (gate signal lines 17_a_, 17_b_, and 17_c_) (two gate signal lines 17_a_ and 17_b_ in the configuration in FIG. 1). By controlling ON/OFF timing of the gate of the transistor 11_b_ and ON/OFF timing of the gate of the transistor 11_c_ separately, it is possible to further reduce variations in the current value of the EL element 15 due to variations in the transistor 11_a_.

By sharing the gate signal line 17_a_ and gate signal line 17_b_ and using different conductivity types (N-channel and P-channel) for the transistors 11_c_ and 11_d_, it is possible to simplify the drive circuit and improve the aperture ratio of pixels.

With this configuration, a write paths from signal lines are turned off according to operation timing of the present invention That is, when a predetermined current is stored, an accurate current value is not stored in a capacitance (capacitor) between the source (S) and gate (G) of the transistor 11_a_ if a current path is branched. By using different conductivity types for the transistors 11_c_ and 11_d_ and controlling their thresholds, it is possible to ensure that when scanning lines are switched, the transistor 11_d_ is turned on after the transistor 11_c_ is turned off.

Incidentally, although it has been stated with reference to FIG. 1 that the gate signal lines 17_a_ are controlled by the gate driver circuit 12_a_ (an example of the second gate driver circuit according to the present invention) and that the gate signal lines 17_b_ are controlled by the gate driver circuit 12_b_ (an example of the first gate driver circuit according to the present invention), this is not restrictive and, needless to say, the gate signal lines 17_a_ and 17_b_ may be controlled by a single gate driver circuit 12. This also applies to the examples described below.

In that case, however, since the thresholds of the transistors must be controlled accurately, it is necessary to pay attention to processes. The circuit described above can be implemented using four transistors at the minimum, but even if more than four transistors including a transistor 11_e_ are cascaded for more accurate timing control or for reduction of mirror effect (described later), the principle of operation is the same. By adding the transistor 11_e_, it is possible to deliver programming current to the EL element 15 more precisely via the transistor 11_c_.

Figure 2:
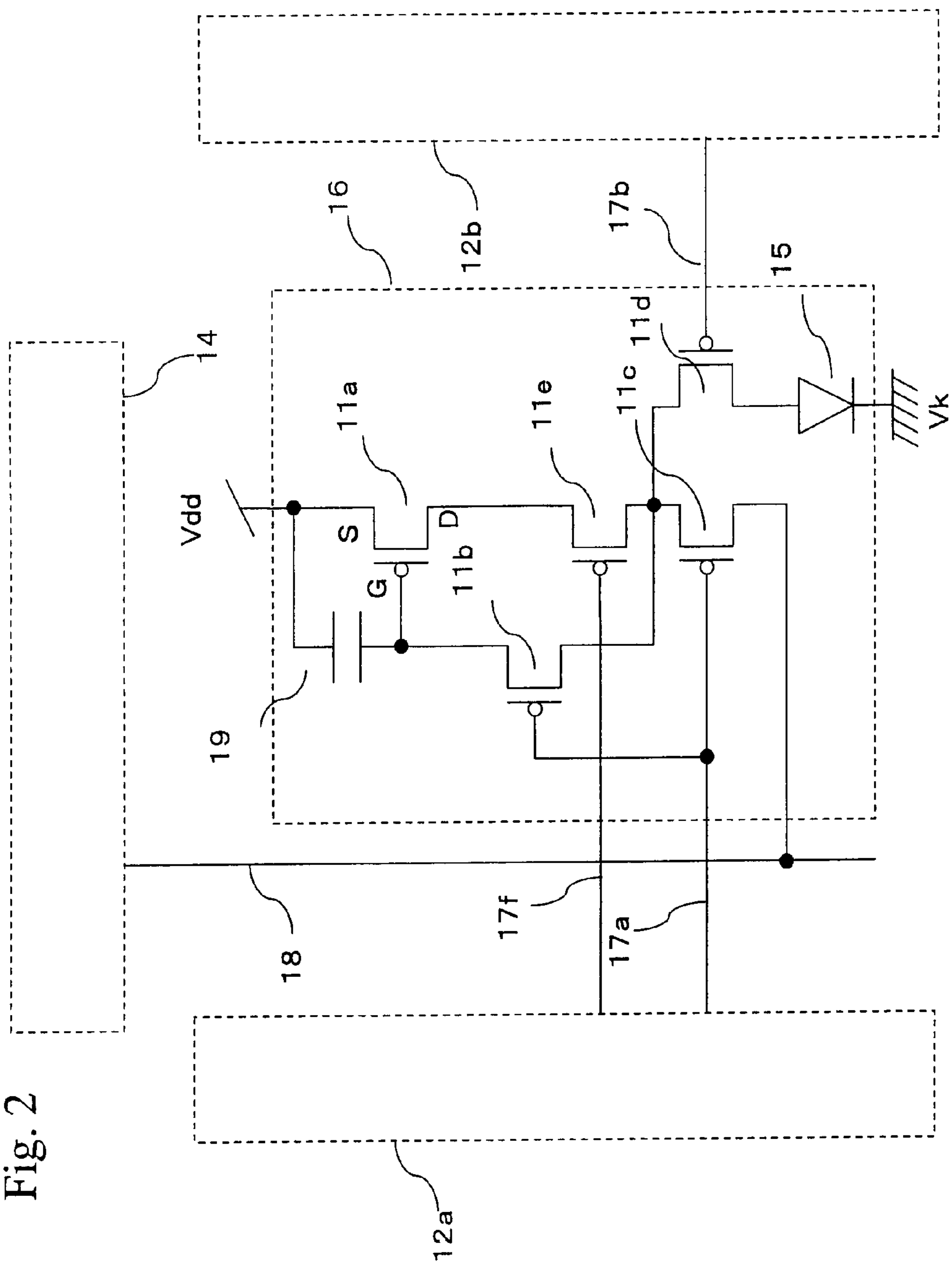
FIG. 2 is a block diagram of a pixel in a display panel according to the present invention.

Referring to FIG. 2, a predetermined voltage is applied to the gate terminal of transistor 11_e_ to put the transistor 11_e_ in a low activation state.

This configuration makes it possible to pass minute current from the driver transistor 11_a_ through the EL element 15 accurately. Also, by controlling the voltage applied to the gate terminal of the transistor 11_e_ (applied to the gate signal line 17_f_), it is possible to vary conditions of current output from the driver transistor 11_a_. Incidentally, the same voltage as the voltage applied to the gate signal line 17_f_ is applied to the pixels in the display area. Of course, it is possible to form a gate driver circuit 12, which drives the gate signal line 17_f_, and apply an ac signal to the gate signal line 17_f_ by operating the gate driver circuit 12.

Incidentally, gate signal line 17_a_, gate signal line 17_b_, and gate signal line 17_f_ may be driven by different gate driver circuits or by a single gate driver circuit 12 as shown in FIG. 2. The other part of the configuration is the same as that shown in FIG. 1, and thus description thereof will be omitted.

Figure 63:
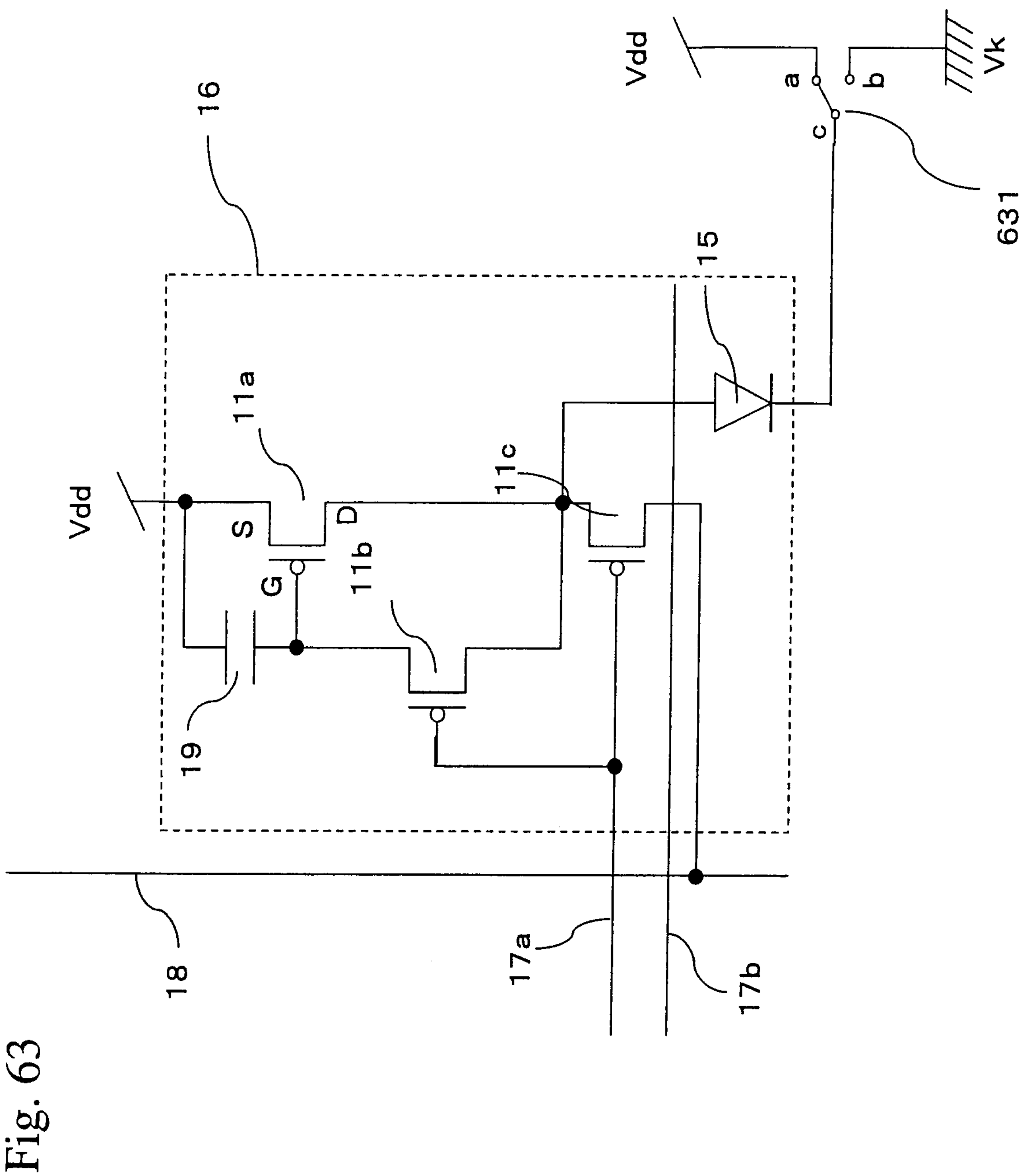
FIG. 63 is a block diagram of a pixel in a display panel according to the present invention.

Incidentally, the pixel configuration is not limited to those shown in FIGS. 1 and 2. For example, pixels may be configured as shown in FIG. 63. FIG. 63 lacks the switching element 11_d_ unlike the configuration in FIG. 1. Instead, a changeover switch 631 is formed or placed. The switch 11_d_ in FIG. 1 functions to turn on and off (pass and shut off) the current delivered from the driver transistor 11_a_ to the EL element 15. As also described in subsequent examples, the on/off control function of the transistor 11_d_ constitutes an important part of the present invention. The configuration in FIG. 63 achieves the on/off function without using the transistor 11_d_.

In FIG. 63, a terminal a of the changeover switch 631 is connected to anode voltage Vdd. Incidentally, the voltage applied to the terminal a is not limited to the anode voltage Vdd. It may be any voltage that can turn off the current flowing through the EL element 15.

A terminal b of the changeover switch 631 is connected to cathode voltage (indicated as ground in FIG. 63). Incidentally, the voltage applied to the terminal b is not limited to the cathode voltage. It may be any voltage that can turn on the current flowing through the EL element 15.

A terminal c of the changeover switch 631 is connected with a cathode terminal of the EL element 15. Incidentally, the changeover switch 631 may be of any type as long as it has a capability to turn on and off the current flowing through the EL element 15. Thus, its installation location is not limited to the one shown in FIG. 63 and the switch may be located anywhere on the path through which current is delivered to the EL element 15. Also, the switch is not limited by its functionality as long as the switch can turn on and off the current flowing through the EL element 15.

Also, the term "off" here does not mean a state in which no current flows, but it means a state in which the current flowing through the EL element 15 is reduced to below normal. The items mentioned above also apply to other configurations of the present invention.

The changeover switch 631 will require no explanation because it can be implemented easily by a combination of P-channel and N-channel transistors. For example, it can be implemented by two circuits of analog switches. Of course, the switch 631 can be constructed of only P-channel or N-channel transistors because it only turns off the current flowing through the EL element 15.

When the switch 631 is connected to the terminal a, the Vdd voltage is applied to the cathode terminal of the EL element 15. Thus, current does not flow through the EL element 15 regardless of the voltage state of voltage held by the gate terminal G of the driver transistor 11_a_. Consequently, the EL element 15 is non-illuminated.

When the switch 631 is connected to the terminal b, the GND voltage is applied to the cathode terminal of the EL element 15. Thus, current flows through the EL element 15 according to the state of voltage held by the gate terminal G of the driver transistor 11_a_. Consequently, the EL element 15 is illuminated.

Thus, in the pixel configuration shown in FIG. 63, no switching transistor 11_d_ is formed between the driver transistor 11_a_ and the EL element 15. However, it is possible to control the illumination of the EL element 15 by controlling the switch 631.

Figure 64:
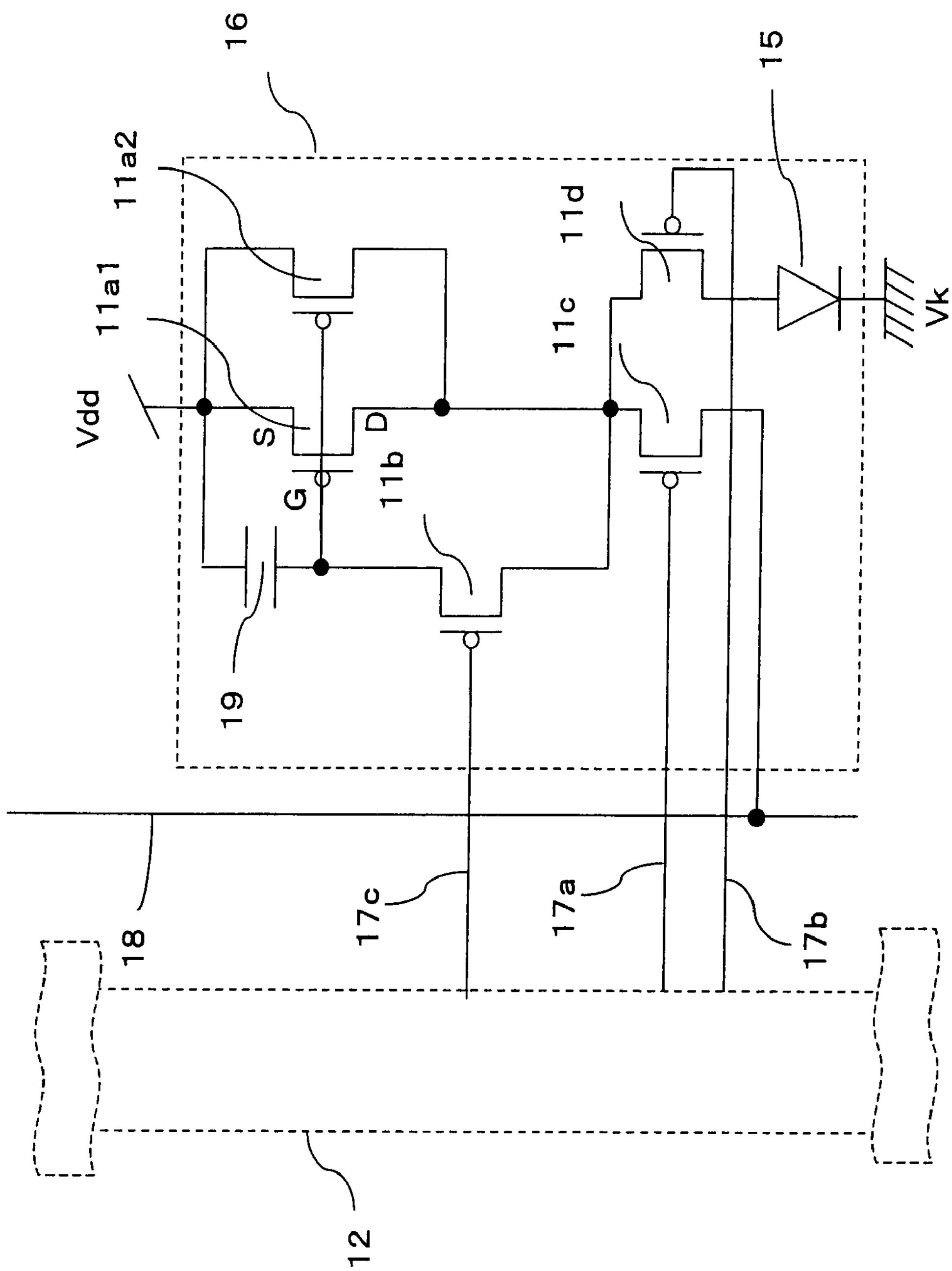
FIG. 64 is a block diagram of a pixel in a display panel according to the present invention.

In the pixel configurations shown in FIGS. 1, 2, etc., one pixel contains one driver transistor 11_a_. However, the present invention is not limited to this and one pixel may contain two or more driver transistors 11_a_. An example is shown in FIG. 64. In FIG. 63, one pixel contains two driver transistors 11_a_1 and 11$a$2, whose gate terminals are connected to a common capacitor 19. By using a plurality of driver transistors 11$a$, it is possible to reduce variations in programming current. The other part of the configuration is the same as those shown in FIG. 1 and the like, and thus description thereof will be omitted.

In FIGS. 1 and 2, the current outputted by the driver transistor 11$a$ is passed through the EL element 15 and turned on and off by the switching element 11$d$ formed between the driver transistor 11$a$ and the EL element 15. However, the present invention is not limited to this. For example, another configuration is illustrated in FIG. 65.

Figure 65:
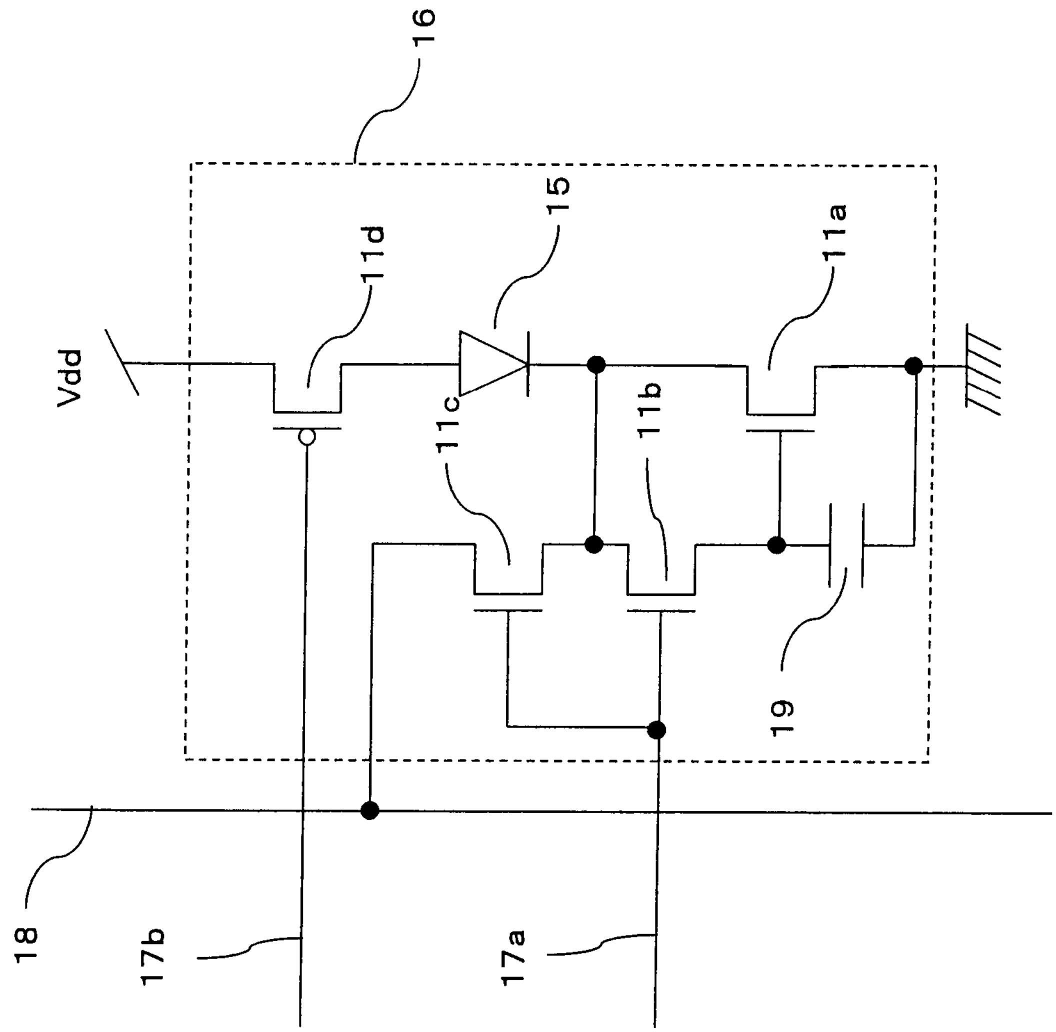
FIG. 65 is a block diagram of a pixel in a display panel according to the present invention.

In the example shown in FIG. 65, the current delivered to the EL element 15 is controlled by the driver transistor 11$a$. The current flowing through the EL element 15 is turned on and off by the switching element 11$d$ placed between the Vdd terminal and EL element 15. Thus, according to the present invention, the switching element 11$d$ may be placed anywhere as long as it can control the current flowing through the EL element 15.

Variations in the characteristics of the transistor 11$a$ are correlated to the transistor size. To reduce the variations in the characteristics, preferably the channel length of the first transistor 11$a$ is from 5 μm to 100 μm (both inclusive). More preferably, it is from 10 μm to 50 μm (both inclusive). This is probably because a long channel length L increases grain boundaries contained in the channel, reducing electric fields, and thereby suppressing kink effect.

Preferably, the transistors 11 of the pixels are polysilicon transistors formed by laser recrystallization (laser annealing) and the channel directions of all the transistors coincide with the direction of laser emission. In particular, it is preferable that the direction of laser emission coincides with the formation direction of the source signal lines 18. This will make the characteristics of the driver transistors 11$a$ along the source signal lines 18 uniform and reduce amplitude fluctuations of the source signal lines 18 during current programming. Reduced amplitudes make it possible to perform current programming accurately.

An object of the present invention is to propose a circuit configuration in which variations in transistor characteristics do not affect display. Four or more transistors are required for that. When determining circuit constants using transistor characteristics, it is difficult to determine appropriate circuit constants unless the characteristics of the four transistors are not consistent. Both thresholds of transistor characteristics and mobility of the transistors vary depending on whether the channel direction is horizontal or vertical with respect to the longitudinal axis of laser irradiation.

Incidentally, variations are more of the same in both cases. However, the mobility and average threshold vary between the horizontal direction and vertical direction. Thus, it is desirable that all the transistors in a pixel have the same channel direction.

Also, if the capacitance value of the storage capacitance 19 is Cs and the turn-off current value of the second transistor 11$b$ is Ioff, preferably the following equation is satisfied.

$$3<Cs/Ioff<24$$

More preferably the following equation is satisfied.

$$6<Cs/Ioff<18$$

By setting the turn-off current of the transistor 11$b$ to 5 pA or less, it is possible to reduce changes in the current flowing through the EL to 2% or less. This is because when leakage current increases, electric charges stored between the gate and source (across the capacitor) cannot be held for one field with no voltage applied. Thus, the larger the storage capacity of the capacitor 19, the larger the permissible amount of the turn-off current. By satisfying the above equation, it is possible to reduce fluctuations in current values between adjacent pixels to 2% or less.

Also, preferably transistors composing an active matrix are p-channel polysilicon thin-film transistors and the transistor 11$b$ is a dual-gate or multi-gate transistor. More preferably, the transistor has three or more gates. Unless the transistor 11$b$ has good turn-off characteristics, the capacitor 19 cannot hold electric charges. This will cause excessive brightness resulting in a whitish screen.

As high an ON/OFF ratio as possible is required of the transistor 11$b$, which acts as a source-drain switch for the transistor 11$a$. By using a dual-gate or multi-gate structure for the transistor 11$b$, it is possible to achieve a high ON/OFF ratio.

The semiconductor films composing the transistors 11 in the pixel 16 are generally formed by laser annealing in low-temperature polysilicon technology. Variations in laser annealing conditions result in variations in transistor 11 characteristics. However, if the characteristics of the transistors 11 in the pixel 16 are consistent, it is possible to drive the pixel using current programming such as the one shown in FIG. 1 so that a predetermined current will flow through the EL element 15. This is an advantage lacked by voltage programming. Preferably the laser used is an excimer laser.

Incidentally, the formation of the semiconductor film of the transistor 11 according to the present invention is not limited to the laser annealing method. The present invention may also use a heat annealing method and a method which involves solid-phase (CGS) growth. Besides, the present invention is not limited to the low-temperature polysilicon technology and may use high-temperature polysilicon technology. Also, the semiconductor films may be formed by performing doping and diffusion on a silicon substrate. Also, the semiconductor films may be formed of organic material.

Figure 7:
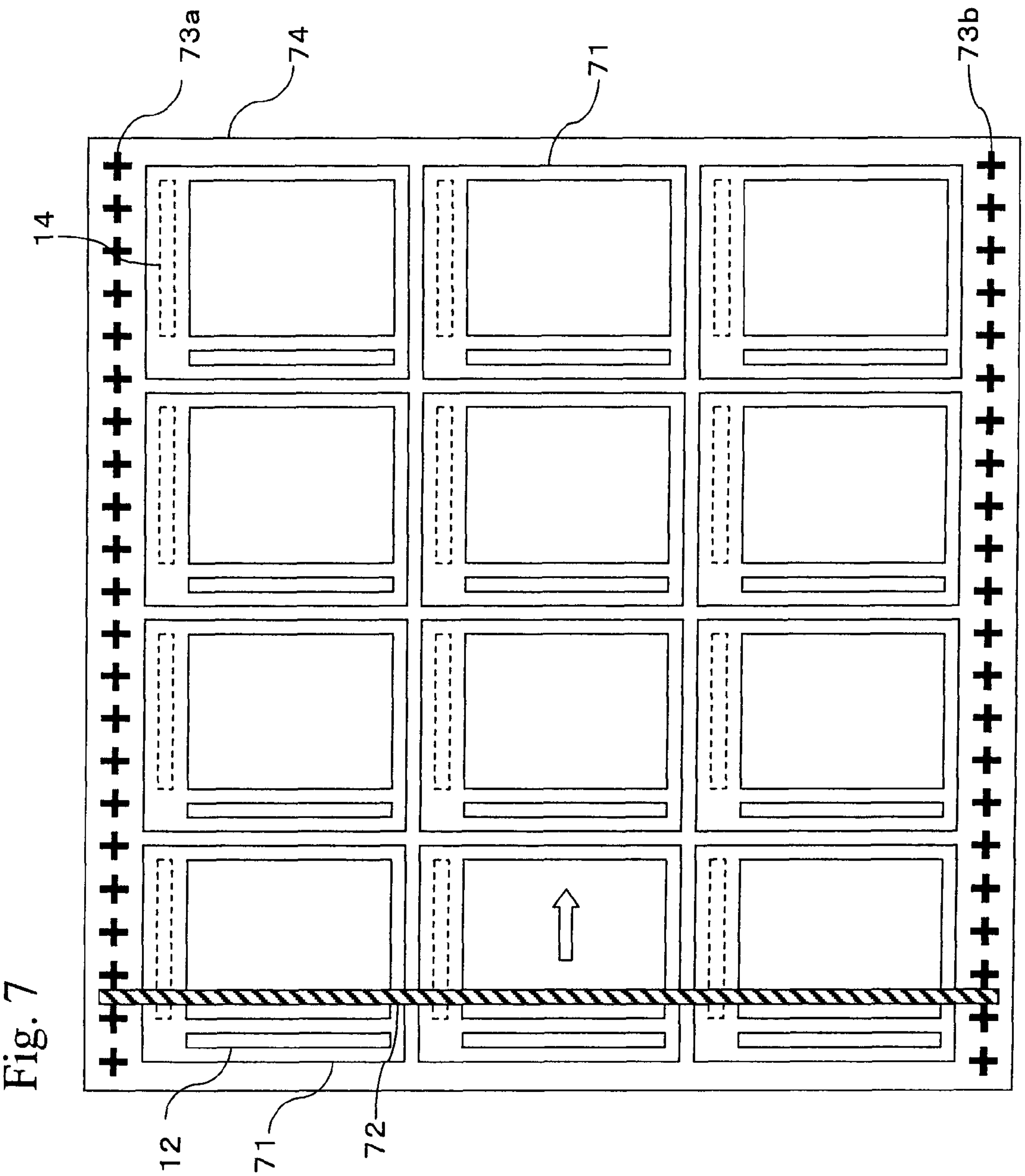
FIG. 7 is an explanatory diagram illustrating a manufacturing method of a display panel according to the present invention.

The present invention moves a laser spot (laser irradiation range) 72 in parallel to the source signal line 18 as shown in FIG. 7. Also, the laser spot 72 is moved in such a way as to align with one pixel row. Of course, the number of pixel rows is not limited to one. For example, laser may be shot by treating RGB in FIG. 72 (three pixel columns in this case) as a single pixel 16. Also, laser may be directed at two or more pixels at a time. Needless to say, moving laser irradiation ranges may overlap (it is usual for moving laser irradiation ranges to overlap).

Pixels are constructed in such a way that three pixels of RGB will form a square shape. Thus, each of the R, G, B pixels has oblong shape. Consequently, by performing annealing using an oblong laser spot 72, it is possible to eliminate variations in the characteristics of the transistors 11 within each pixel. Also, the characteristics (mobility, Vt, S value, etc.) of the transistors 11 connected to the same source signal line 18 can be made uniform (i.e., although the transistors 11 connected to adjacent source signal lines 18 may differ in characteristics, the characteristics of the transistors 11 connected to the same source signal line can be made almost equal).

Generally, the laser spot 72 has a fixed length such as 10 inches. Since the laser spot 72 is moved, the panels must be placed in such a way that they can fit in a range in which the laser spot 72 can be moved (i.e., in such a way that laser spots 72 will not overlap in the center of a panel's display area 50).

In the configuration shown in FIG. 7, three panels are placed lengthwise within the length of the laser spot 72. An annealing apparatus which emits the laser spot 72 recognizes positioning markers 73*a* and 73*b* on a glass substrate 74 (automatic positioning based on pattern recognition) and moves the laser spot 72. The positioning markers 73 are recognized by a pattern recognition apparatus. The annealing apparatus (not shown) recognizes the positioning markers 73 and determines the location of the pixel column (makes the laser irradiation range 72 parallel to the source signal line 18). It emits the laser spot 72 in such a way as to overlap with the location of each pixel column for sequential annealing.

Preferably, the laser annealing method (which involves emitting a linear laser spot in parallel to the source signal line 18) described with reference to FIG. 7 is used for current programming of an organic EL display panel, in particular. This is because the transistors 11 placed in the direction parallel to the source signal line have the same characteristics (the characteristics of the pixel transistors adjacent in the longitudinal direction are quite similar to each other). This reduces changes in the voltage level of the source signal lines when the pixels are driven by current, and thus reduces the chances of insufficient write current.

For example, in the case of white raster display, since almost the same current is passed through the transistors 11*a* in adjacent pixels, the current outputted from the source driver IC 14 does not have significant amplitude changes. If the transistors 11*a* in FIG. 1 have the same characteristics and the currents used for current programming of pixels have the same value within the pixel column, the potential of the source signal line 18 during the current programming is constant. Thus, no potential fluctuation occurs in the source signal line 18. If the transistors 11*a* connected to the same source signal line 18 have almost the same characteristics, there should be no significant potential fluctuation in the source signal line 18. This is also true to other current-programmable pixel configurations such as the one shown in FIG. 38 (thus, it is preferable to use the manufacturing method shown in FIG. 7).

Figure 27:
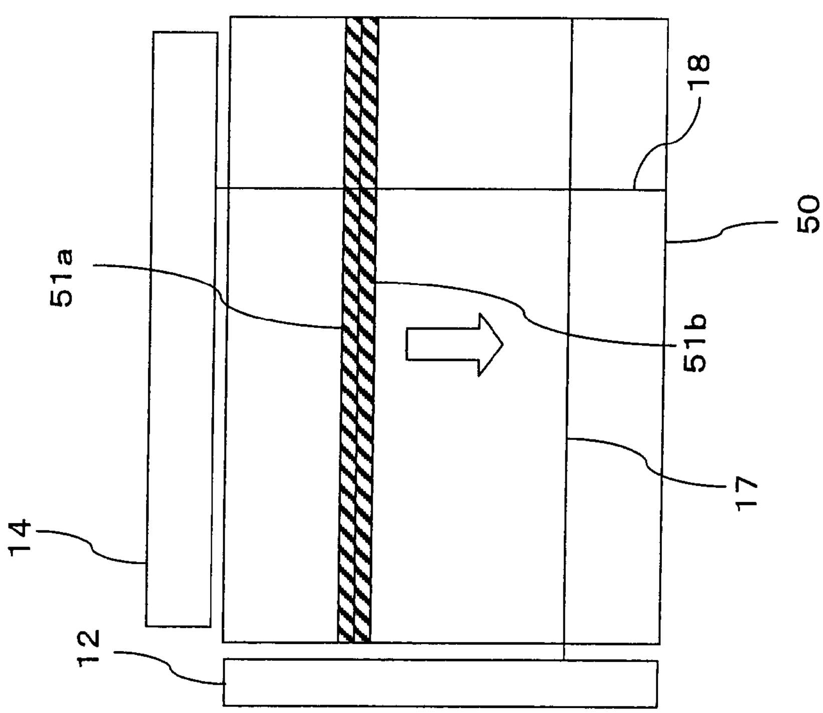
FIG. 27 is an explanatory diagram illustrating a drive method of a display apparatus according to the present invention.
Figure 27:
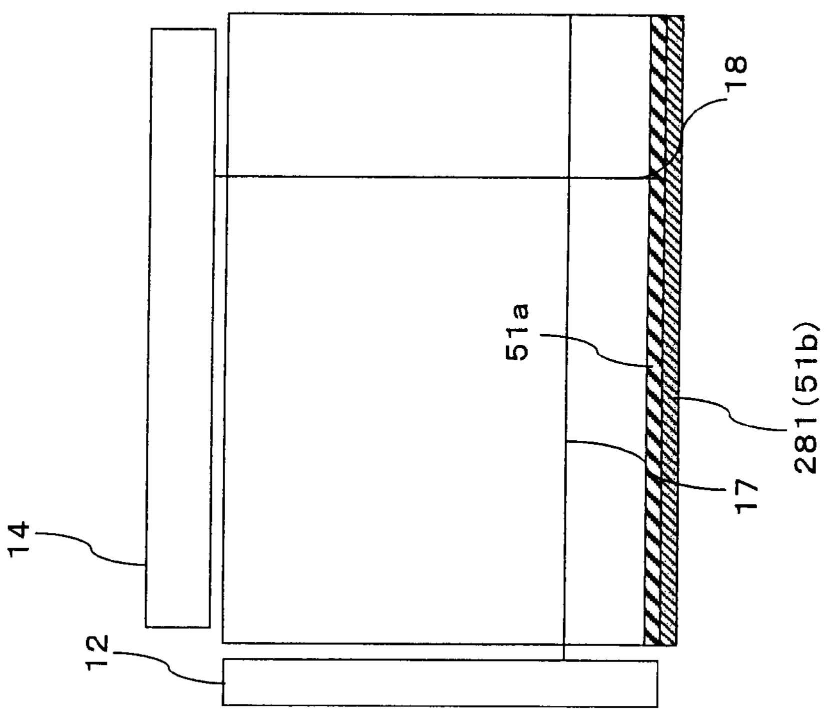

A method which involves programming two or more pixel rows simultaneously and which are described with reference to FIGS. 27, 30, etc. can achieve a uniform image display (because the method is not prone to display irregularities due mainly to variations in transistor characteristics). In the case of FIG. 27, etc., since a plurality of pixel rows are selected simultaneously, if the transistors in adjacent pixel rows are uniform, irregularities in the characteristics of the transistors placed in the lengthwise direction can be absorbed by the driver circuit 14.

Incidentally, although an IC chip is illustrated in FIG. 7 as being stacked on the source driver circuit 14, this is not restrictive and it goes without saying that the source driver circuit 14 may be formed in the same process as the pixel 16.

The present invention, in particular, ensures that a voltage threshold Vth2 of the driver transistor 11*b* will not fall below a voltage threshold Vth1 of the corresponding driver transistor 11*a* in the pixel. For example, gate length L2 of the transistor 11*b* is made longer than gate length L1 of the transistor 11*a* so that Vth2 will not fall below Vth1 even if process parameters of these thin-film transistors change. This makes it possible to suppress subtle current leakage.

Incidentally, the items mentioned above also apply to pixel configuration of a current mirror shown in FIG. 38. The pixel in FIG. 38 consists of a driver transistor 11*a* through which a signal current flows, a driver transistor 11*b* which controls drive current flowing through a light-emitting element such as an EL element 15, a transistor 11*c* which connects or disconnects a pixel circuit and data line "data" by controlling a gate signal line 17*a*1, a switching transistor 11*d* which shorts the gate and drain of the transistor 11*a* during a write period by controlling a gate signal line 17*a*2, a capacitance C19 which holds gate-source voltage of the transistor 11*a* after application of voltage, the EL element 15 serving as a light-emitting element, etc.

In FIG. 38, the transistors 11*c* and 11*d* are N-channel transistors and other transistors are P-channel transistors, but this is only exemplary and are not restrictive. A capacitance Cs has its one end connected to the gate of the transistor 11*a*, and the other end to Vdd (power supply potential), but it may be connected to any fixed potential instead of Vdd. The cathode (negative pole) of the EL element 15 is connected to the ground potential.

Figure 6:
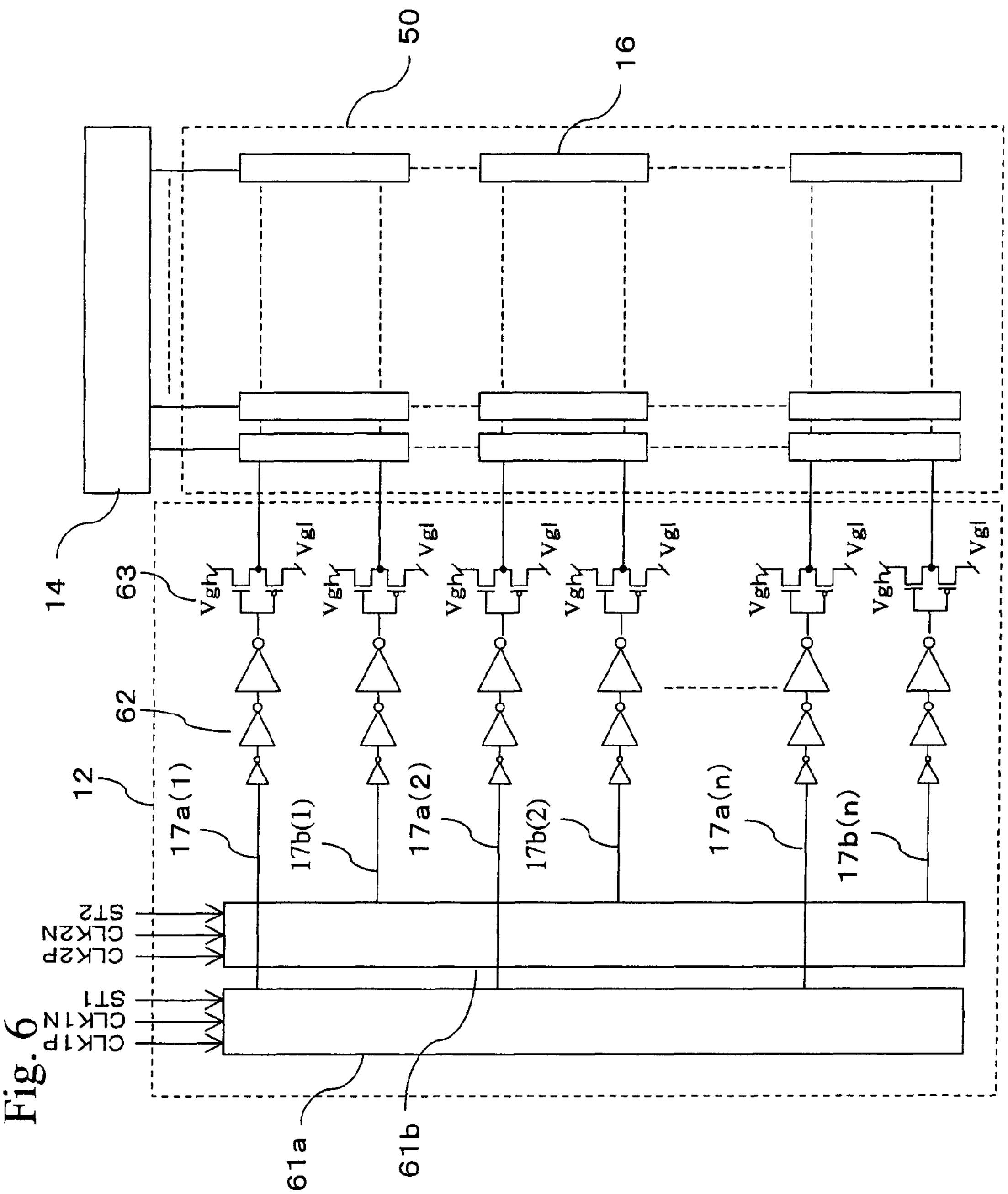
FIG. 6 is a block diagram of a display apparatus according to the present invention.

Next, the EL display panel or EL display apparatus of the present invention will be described. FIG. 6 is an explanatory diagram which mainly illustrates a circuit of the EL display apparatus. Pixels 16 are arranged or formed in a matrix. Each pixel 16 is connected with a source driver circuit 14 which outputs current for use in current programming of the pixel. In an output stage of the source driver circuit 14 are current mirror circuits (described later) corresponding to the bit count of a video signal. For example, if 64 gradations are used, 63 current mirror circuits are formed on respective source signal lines so as to apply desired current to the source signal lines 18 when an appropriate number of current mirror circuits is selected.

Incidentally, the minimum output current of one current mirror circuit is from 10 nA to 50 nA (both inclusive). Preferably, the minimum output current of the current mirror circuit should be from 15 nA to 35 nA (both inclusive) to secure accuracy of the transistors composing the current mirror circuit in the driver IC 14.

Besides, a precharge or discharge circuit is incorporated to charge or discharge the source signal line 18 forcibly. Preferably, voltage (current) output values of the precharge or discharge circuit which charges or discharges the source signal line 18 forcibly can be set separately for R, G, and B. This is because the thresholds of the EL element 15 differ among R, G, and B.

Organic EL elements are known to have heavy temperature dependence (temperature characteristics). To adjust changes in emission brightness caused by the temperature characteristics, reference current is made in an analog fashion by adding nonlinear elements such as thermistors or posistors to the current mirror circuits to vary output current and adjusting the changes due to the temperature characteristics with the thermistors or the like.

According to the present invention, the source driver circuit 14 is made of a semiconductor silicon chip and connected with a terminal on the source signal line 18 of the board 71 by chip-on-glass (COG) technology. Metals such as chromium, copper, aluminum, and silver are used for wiring of signal lines such as the source signal lines 18. These metals provide low resistance with thin wiring width. If pixels are a reflective type, preferably the wiring is formed of the same material as reflecting films simultaneously with the reflecting films. This will simplify production processes.

The source driver circuit 14 can be mounted not only by the COG technology. It is also possible to mount the source driver circuit 14 by chip-on-film (COF) technology and connect it to the signal lines of the display panel. Regarding the driver IC, it may be made of three chips by constructing a power supply IC 82 separately.

On the other hand, the gate driver circuit 12 is formed by low-temperature polysilicon technology. That is, it is formed in the same process as the transistors in pixels. This is because the gate driver circuit 12 has a simpler internal structure and lower operating frequency than the source driver circuit 14.

Thus, it can be formed easily even by low-temperature polysilicon technology and allows bezel width to be reduced. Of course, it is possible to construct the gate driver circuit 12 from a silicon chip and mount it on the board 71 using the COG technology. Also, switching elements such as pixel transistors as well as gate drivers may be formed by high-temperature polysilicon technology or may be formed of an organic material (organic transistors).

The gate driver circuit 12 incorporates a shift register circuit 61*a* for a gate signal line 17*a* and a shift register circuit 61*b* for a gate signal line 17*b*. The shift register circuits 61 are controlled by positive-phase and negative-phase clock signals (CLKxP and CLKxN) and a start pulse (STx). Besides, it is preferable to add an enable (ENABL) signal which controls output and non-output from the gate signal line and an up-down (UPDWN) signal which turns a shift direction upside down. Also, it is preferable to install an output terminal to ensure that the start pulse is shifted by the shift register and is outputted. Incidentally, shift timings of the shift registers are controlled by a control signal from a control IC 81. Also, the gate driver circuit 12 incorporates a level shift circuit which level-shifts external data. It also incorporates a checking circuit.

Since the shift register circuits 61 have small buffer capacity, they cannot drive the gate signal lines 17 directly. Therefore, at least two or more inverter circuits 62 are formed between each shift register circuit 61 and an output gate 63 which drives the gate signal line 17.

The same applies to cases in which the source driver circuit 14 is formed on the board 71 by polysilicon technology such as low-temperature polysilicon technology. A plurality of inverter circuits are formed between an analog switching gate such as a transfer gate which drives the source signal line 18 and the shift register of the source driver circuit 14. The following matters (shift register output and output stages which drive signal lines (inverter circuits placed between output stages such as output gates or transfer gates)) are common to the gate driver circuit and source driver circuit.

For example, although the output from the source driver circuit 14 is shown in FIG. 6 as being connected directly to the source signal line 18, actually the output from the shift register of the source driver is connected with multiple stages of inverter circuits, and the inverter outputs are connected to analog switching gates such as transfer gates.

The inverter circuit 62 consists of a P-channel MOS transistor and N-channel MOS transistor. As described earlier, the shift register circuit 61 of the gate driver circuit 12 has its output end connected with multiple stages of inverter circuits 62 and the final output is connected to the output gate 63. Incidentally, the inverter circuit 62 may be composed solely of P-channel MOS transistors or N-channel MOS transistors.

The shift register circuit 61*a* of the gate driver circuit 12 controls control signals for the gate signal lines 17*a* while the shift register circuit 61*b* controls control signals for the gate signal lines 17*b*. An output buffer 63 is formed or placed in the output stage of the inverter 62. Incidentally, the buffer and the like are formed on the array board 71 using low-temperature polysilicon process technology.

Figure 74:
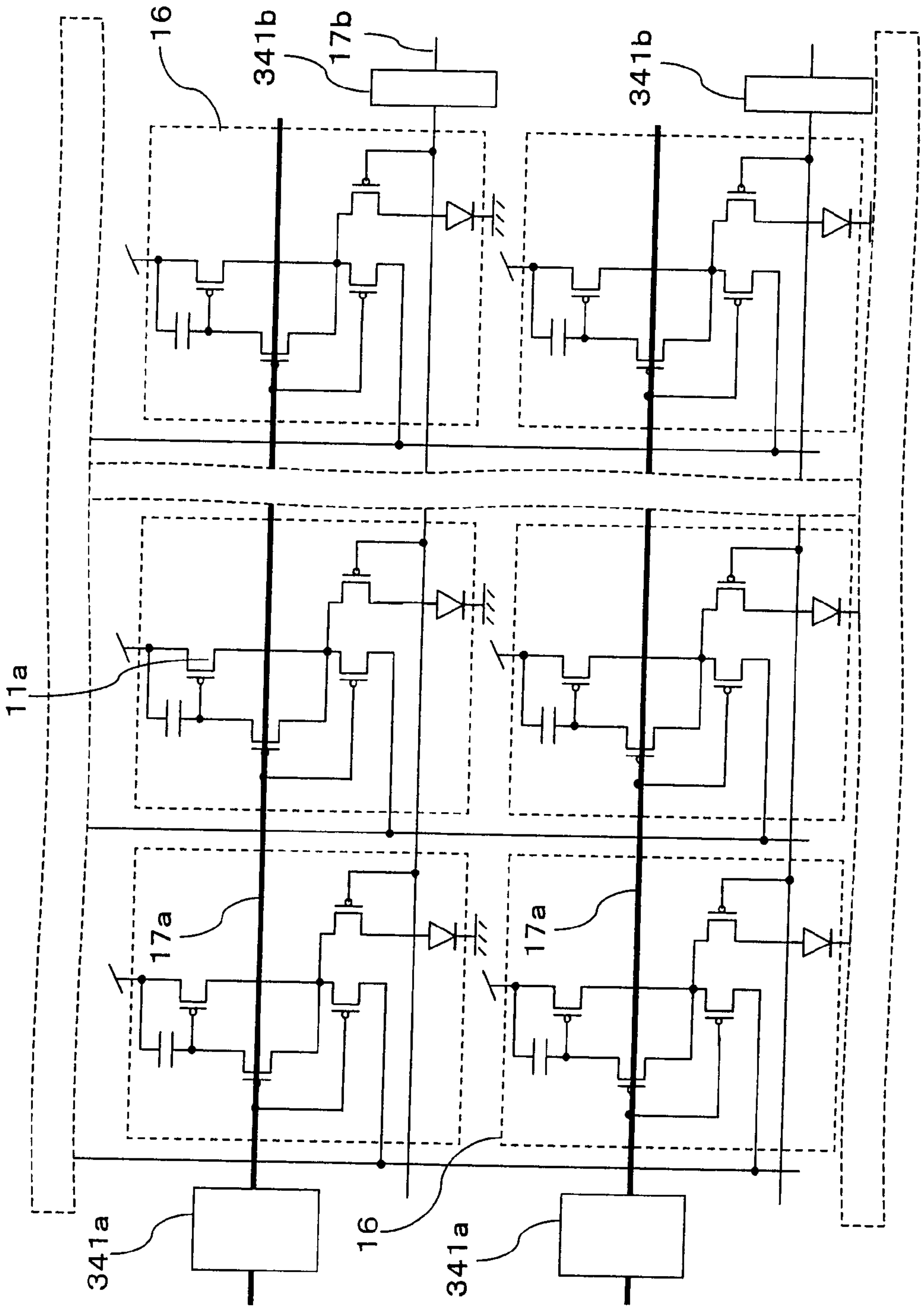
FIG. 74 is an explanatory diagram illustrating a display panel according to the present invention.

As illustrated in FIG. 74, an output buffer circuit 341*a* of the gate signal line 17*a* is larger than an output buffer circuit 341*b* of the gate signal line 17*b*. Preferably, wiring resistance of the gate signal line 17*a* is lower than wiring resistance of the gate signal line 17*b*. This is because by making a time constant of the gate signal line 17*a* sufficiently short, it is possible to improve accuracy of writing current.

Figure 111:
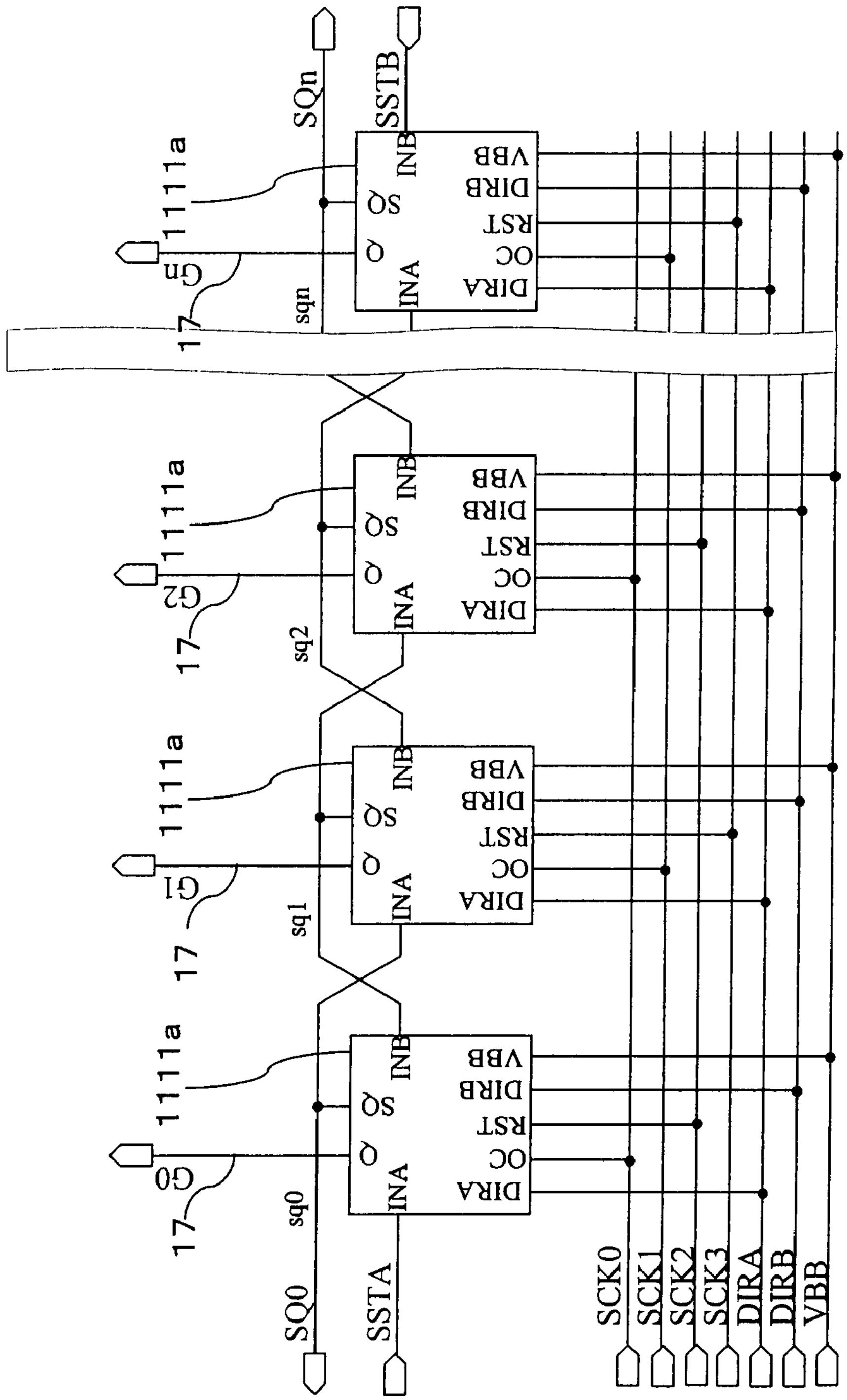
FIG. 111 is an explanatory diagram illustrating a display apparatus according to the present invention.

FIG. 111 is a block diagram of the gate driver circuit 12 according to the present invention. Incidentally, the gate driver circuit 12 in FIG. 6 is a CMOS type which uses both n-channel and p-channel transistors. The gate driver circuit 12 in FIG. 111 uses only p-channel transistors. Although only four stages are shown in FIG. 111 for ease of explanation, basically there are formed or disposed as many unit gate output circuits 1111 as there are gate signal lines 17.

As illustrated in FIG. 111, the gate driver circuits 12 (12*a* and 12*b*) according to the present invention comprise signal terminals: four clock terminals (SCK0, SCK1, SCK2, and SCK3), one start terminal (data signal SSTA), and two inverting terminals (DIRA and DIRB which apply signals 180 degrees out of phase with each other) which turn a shift direction upside down. They also comprise power supply terminals, including an L power supply terminal (VBB) and H power supply terminal (Vd).

Since only p-channel transistors are used for the gate driver circuits 12 in FIG. 111, no level shifter circuit (circuit used to convert a low voltage logic signal into a high voltage logic signal) can be incorporated into the gate driver circuits 12. Thus, a level shifter circuit is placed or formed in the power supply circuit (IC) 82 shown in FIG. 8 and the like.

If the pixels 16 are constructed of P-channel transistors, they will match well with the gate driver circuits 12 which employ P-channel transistors shown in FIG. 111, etc. The P-channel transistors (the transistors 11*b* and 11*c* and transistor 11*d* in the configuration in FIG. 1) turn on when the voltage becomes low. On the other hand, the lower voltage serves as the selection voltage for the gate driver circuits 12 as well. Gate drivers with P-channel achieve good matching if the lower level is used as the selection level as can be seen from a configuration in FIG. 113. This is because the lower level cannot be maintained for a long time. On the other hand, the higher voltage can be maintained for a long time.

Also, by using P-channel for the driver transistors (transistor 11*a* in FIG. 1) which supply current to the EL element 15, it is possible to use a solid electrode made of thin metal film as the cathode of the EL elements 15. Also, current can be passed from the anode potential Vdd to the EL elements 15 in the forward direction. In view of the above circumstances, it is preferable that the transistors in the pixels 16 and gate driver circuits 12 are P-channel. Thus, the use of P-channel transistors as the transistors (driver transistors and switching transistors) in the pixels 16 and gate driver circuits 12 according to the present invention is not merely a design matter.

The level shifter (LS) circuit may be formed directly on the array board 71. That is, N-channel and P-channel transistors are used for the level shifter (LS) circuit. A logic signal from a controller (not shown) is boosted by the level shifter circuit formed directly on the array board 71 so that it will match the logic level of the gate driver circuits 12 constructed from a P-channel transistor. The boosted logic voltage is applied to the gate driver circuits 12.

Figure 113:
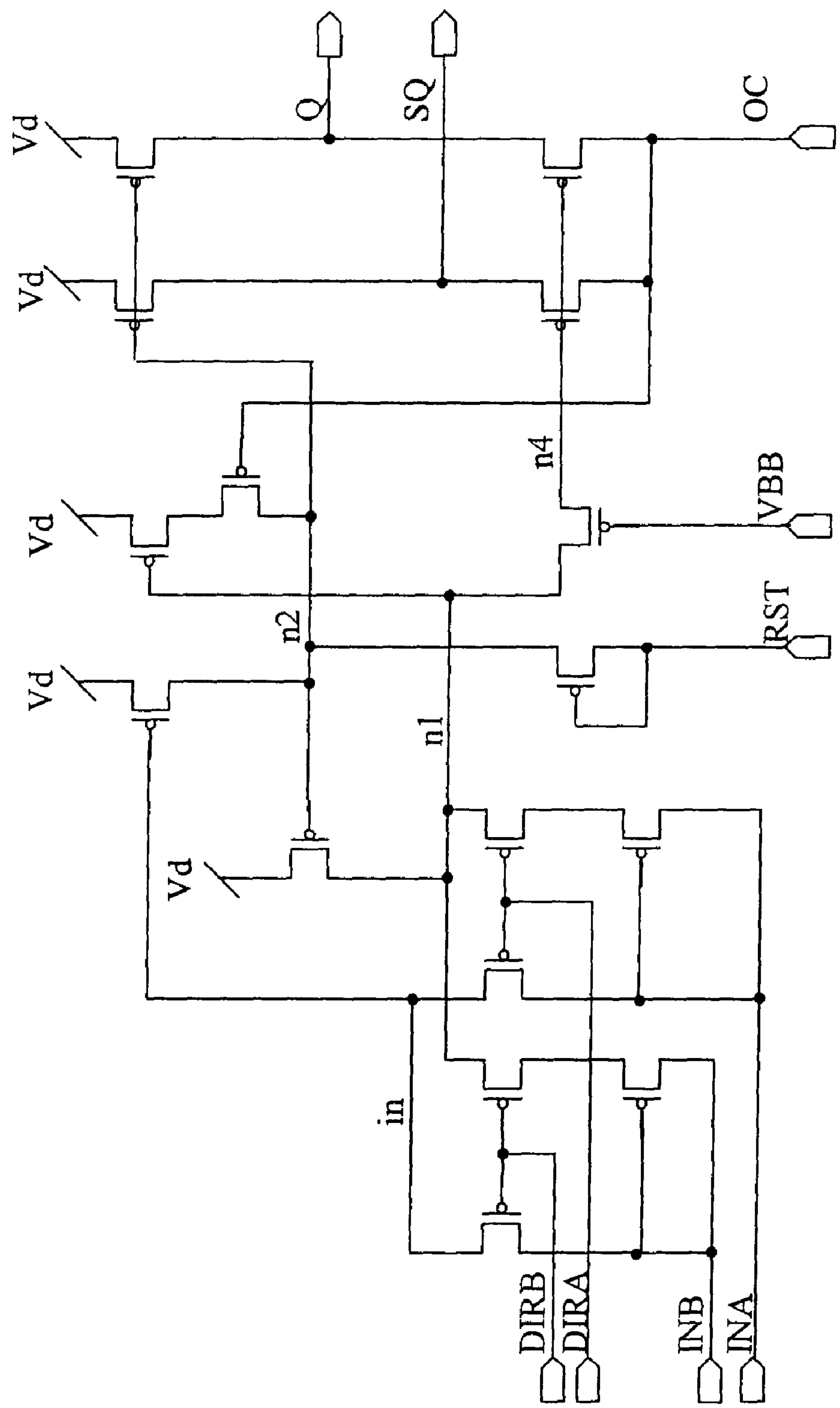
FIG. 113 is an explanatory diagram illustrating a display apparatus according to the present invention.

For ease of explanation, the pixel configuration in FIG. 1 is employed in the example of the present invention. However, the technical idea of the present invention which involves the use of P-channel transistors as selection transistors (transistor 11*c* in FIG. 1) of pixels 16 and for gate driver circuits 12 is not limited to the pixel configuration in FIG. 1. Needless to say, for example, it is also applicable to the current-minor pixel configuration illustrated in FIGS. 38 and 50 in the case of current-driven pixel configuration. Also, it is applicable to two transistors (selection transistor is transistor 11*b* and driver transistor is transistor 11*a*) such as those illustrated in FIG. 62 in the case of voltage-driven pixel configuration. Also, needless to say, it is applicable to the pixel configuration which employs four transistors (selection transistors 11*c* and driver transistors 11*a*) as illustrated in FIG. 51. The configuration of the gate driver circuits 12 described with reference to FIGS. 111 and 113 is also applicable to current-driven pixel configurations. Thus, the items described above or below are not limited to pixel configurations and the like.

Also, it is applicable to two transistors (selection transistor is transistor 11*b* and driver transistor is transistor 11*a*) such as those illustrated in FIG. 62 in the case of voltage-driven pixel configuration. Also, needless to say, it is applicable to the pixel configuration which employs four transistors (selection transistors 11*c* and driver transistors 11*a*) as illustrated in FIG. 51. The configuration of the gate driver circuits 12 described with reference to FIGS. 111 and 113 is also applicable to current-driven pixel configurations. Thus, the items described above or below are not limited to pixel configurations and the like.

Also, the configuration in which p-channel transistors are used as selection transistors of pixels 16 and for gate driver circuits is not limited to organic EL or other self-luminous devices (display panels or display apparatus). For example, it is also applicable to liquid crystal display panels.

The inverting terminals (DIRA and DIRB) apply common signals to all the unit gate output circuits 1111. As can be seen from an equivalent circuit diagram in FIG. 113, the inverting terminals (DIRA and DIRB) are fed signals of opposite polarity. To reverse the scan direction of the shift register, the polarity of the signal applied to the inverting terminals (DIRA and DIRB) is reversed.

Incidentally, the circuit configuration in FIG. 111 contains four clock signal lines. Four is the optimum number according to the present invention. However, this is not restrictive and the present invention may use less than or more than four clock signal lines.

The clock signals (SCK0, SCK1, SCK2, and SCK3) are fed differently between adjacent unit gate output circuits 1111. For example, in the unit gate output circuit 1111*a*, OC is fed by the clock terminal SCK0 while RST is fed by the clock terminal SCK2. This is also the case with the unit gate output circuit 1111*c*. However, in the unit gate output circuit 1111*b* (the unit gate output circuit in the next stage) adjacent to the unit gate output circuit 1111*a*, OC is fed by the clock terminal SCK1 while RST is fed by the clock terminal SCK3. In this way, every other unit gate output circuit 1111 is fed by clock terminals in a different manner: OC is fed by SCK0 and RST is fed by SCK2, OC is fed by SCK1 and RST is fed by SCK3 in the next stage, OC is fed by SCK0 and RST is fed by SCK2 in the next stage, and so on.

Figure 112:
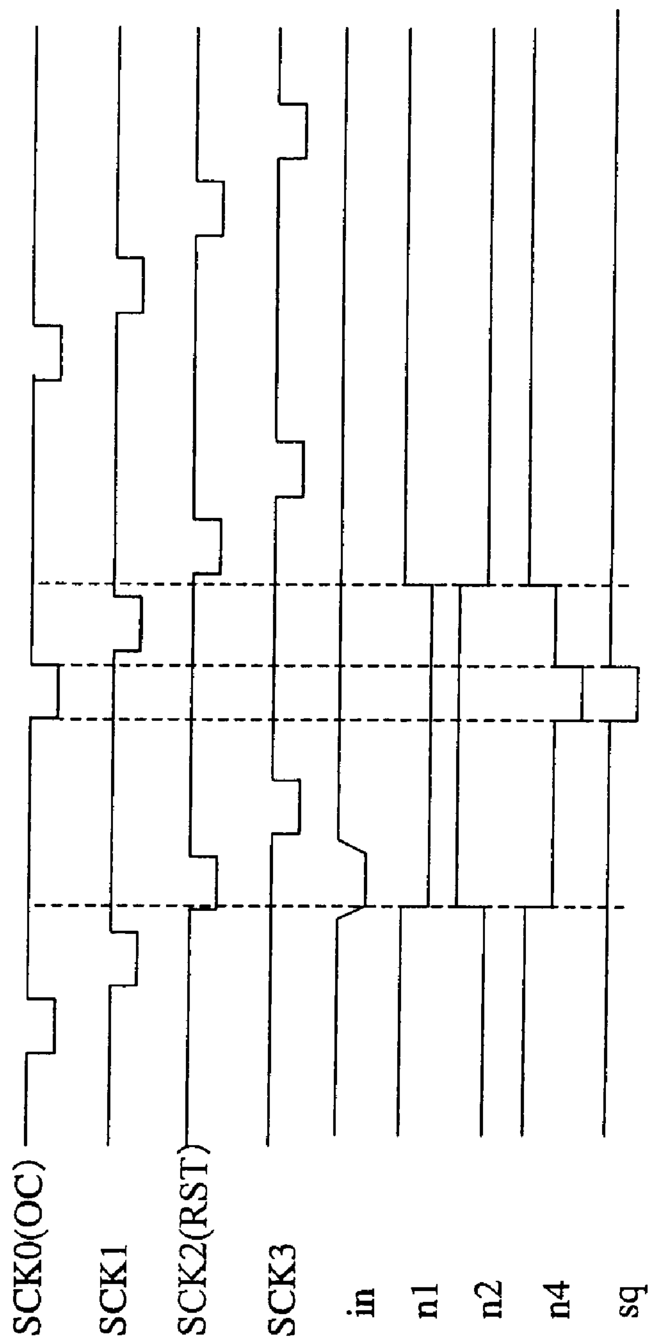
FIG. 112 is an explanatory diagram illustrating a display apparatus according to the present invention.
Figure 114:
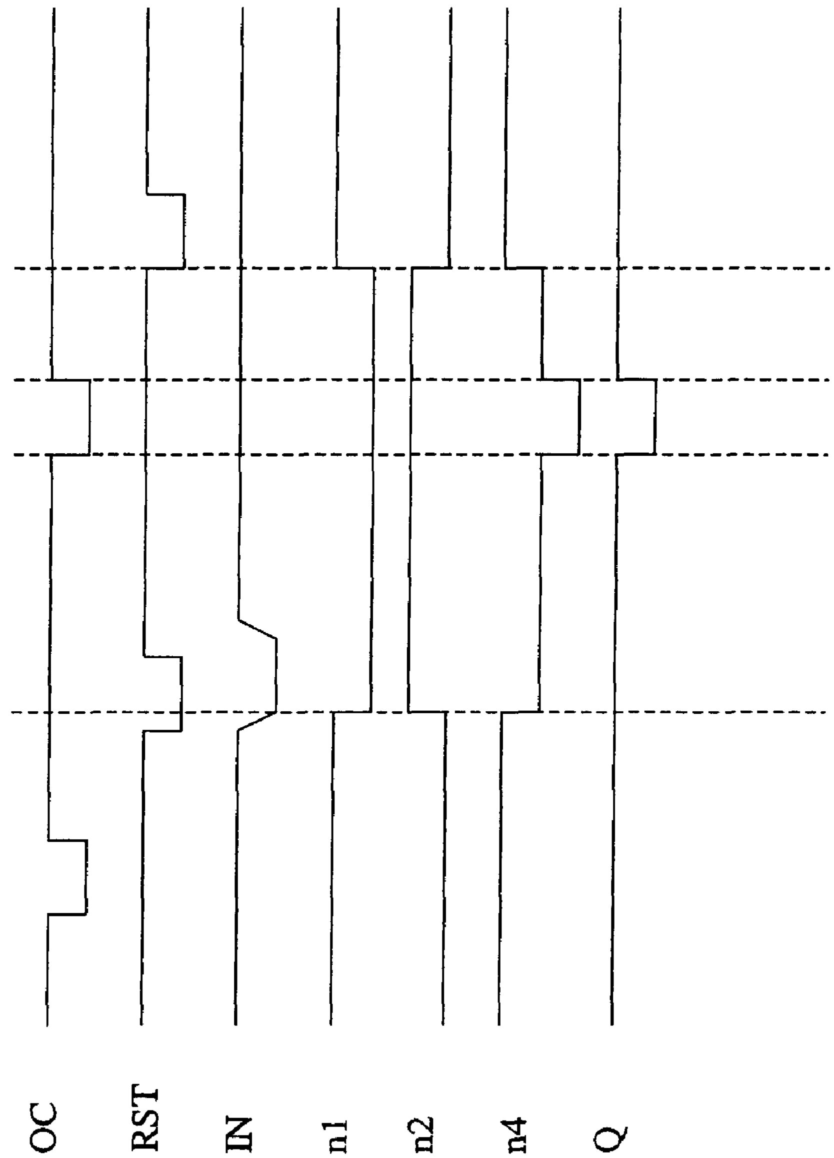
FIG. 114 is an explanatory diagram illustrating a display apparatus according to the present invention.

FIG. 113 shows a circuit configuration of the unit gate output circuit 1111, which uses only P-channel transistors. FIG. 114 is a timing chart for use to explain the circuit configuration of FIG. 113. FIG. 112 is a timing chart of multiple stages in FIG. 113. Thus, by understanding FIG. 113, it is possible to understand overall operation. Rather than being explained in text, the operation can be understood with reference to the timing chart in FIG. 114 in conjunction with the equivalent circuit diagram in FIG. 113, and thus detailed description of transistor operation will be omitted.

When driver circuits are built solely of P-channel transistors, it is basically difficult to maintain the output voltage of the gate signal lines 17 at an H level (Vd voltage in FIG. 113). It is also difficult to maintain them at an L level (VBB voltage in FIG. 113) for a long period of time, but they can be kept adequately at the H level for a short period such as during selection of a pixel row. A signal fed to an IN terminal and the SCK clock fed to the RST terminal invert the state of n1 with respect to n2. Although n2 and n4 have potentials of the same polarity, the SCK clock fed to the OC terminal lowers the potential level of n4 further. In contrast, a Q terminal is kept at the L level for the same period (a turn-on voltage is output from the gate signal line 17). A signal outputted to an SQ terminal or the Q terminal is transferred to the unit gate output circuit 1111 in the next stage.

In the circuit configuration in FIGS. 111 and 113, by controlling the IN (INA and INb) terminals and the timings of signal application to clock terminals, it is possible to two modes using the same circuit configuration: a mode in which one gate signal line 17 is selected as shown in FIG. 165(*a*) and a mode in which two gate signal lines 17 are selected as shown in FIG. 165(*b*). In the selection-side gate driver circuit 12*a*, FIG. 165(*a*) shows a drive mode in which pixel rows are selected one (51*a*) at a time (normal driving) shifting on a row-by-row basis. FIG. 165(*b*) shows a configuration in which two pixel rows are selected at a time. This drive mode corresponds to the driving for simultaneous selection of multiple pixel rows (51*a* and 51*b*) described with reference to FIG. 24 etc. (configuration in which a dummy pixel row is used). Two adjacent rows are selected at a time shifting on a row-by-row basis.

According to the drive method in FIG. 165(*b*), while the pixel row (51*a*) holds final video, the pixel row 51*b* is precharged. This makes the pixel 16 easier to write into. That is, the present invention can switch between two drive modes by manipulating signals applied to terminals.

Figure 123:
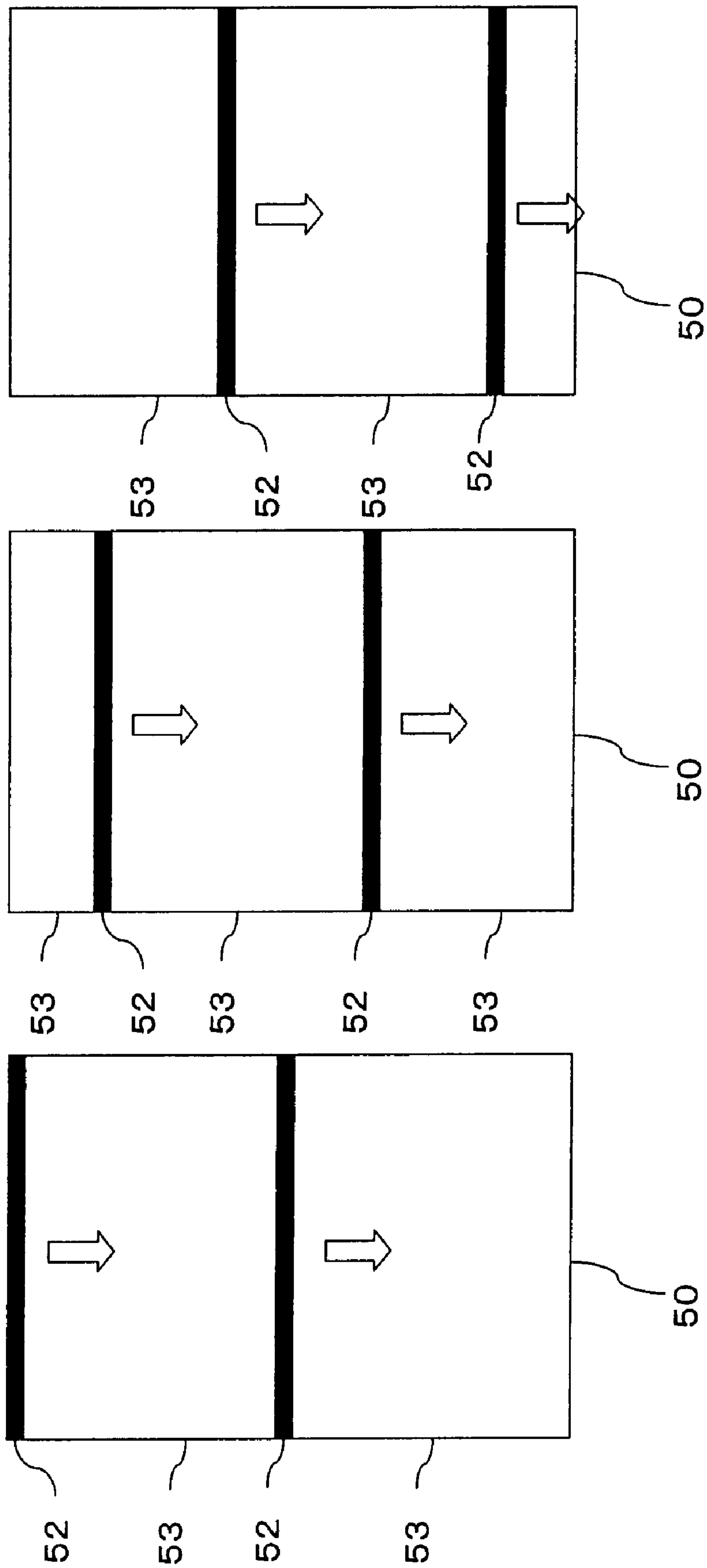

Incidentally, although 165(*b*) shows a mode in which adjacent rows of pixels are selected, it is also possible to select rows of pixels other than adjacent pixel rows as shown in FIG. 123. In the configuration shown in FIG. 113, pixel rows are controlled in sets of four. Out of four pixel rows, it is possible to determine whether to select one pixel row or two consecutive pixel rows. The number of pixel rows in each set is restricted by the number of clocks (SCK), which is four in this case. If eight clocks (SCK) are used, pixel rows can be controlled in sets of eight. Thus, as can be seen also from the configuration in FIG. 113, pixel rows can be selected as illustrated in FIG. 168.

In FIG. 168(*a*), one pixel row can be selected from a set of four pixel rows (whether to select one pixel row or no pixel row from a set of four pixel rows depends on input state and shift state of IN data). In FIG. 168(*b*), two pixel rows can be selected from a set of four pixel rows (whether to select two pixel rows or no pixel row from a set of four pixel rows depends on input state and shift state of IN data). According to the present invention, pixel rows equal in number as a clock count make a set, and one pixel row or pixel rows no larger in number than half the pixel rows in each set are selected (for example, two pixel rows (=4/2) are selected if four pixel rows make a set). Thus, there are always non-selected pixel rows in each set of pixel rows.

When one pixel row is selected as shown in FIG. 165(*a*), the programming current Iw flows through one pixel 16 as illustrated in FIG. 167(*a*). The programming current Iw is written into the pixel 16, being divided into two pixel rows as illustrated in FIG. 167(*b*). However, this is not restrictive. For example, the same current may be passed through two selected pixels (16*a* and 16*b*) by applying a current twice as large as the programming current Iw as illustrated in FIG. 167(*b*).

Operation of the selection-side gate driver circuit 12*a* is shown in FIG. 165. In FIG. 165(*a*), pixel rows are selected one at a time by shifting one by one in sync with a horizontal synchronization signal. In FIG. 165(*b*), pixel rows are selected two at a time by shifting one by one in sync with a horizontal synchronization signal.

FIG. 168 is an explanatory diagram illustrating operation of the gate driver circuit 12*b* which controls the gate signal lines 17*b* that turn on and off the EL elements 15. FIG. 168(*a*) shows a state which results when a turn-on voltage is applied to the gate signal line 17*b* of one pixel row in each set of four pixel rows (hereinafter such a set of pixel rows will be referred to as a pixel row set). The location of a displayed pixel row 53 shifts one by one in sync with a horizontal synchronization signal (HD). Of course, it is free to decide whether to select one pixel row (apply a turn-off voltage to the gate signal lines 17*b* of the other three pixel rows) or no pixel row (apply a turn-off voltage to the gate signal lines 17*b* of the four pixel rows) in the 4-pixel-row set. Since this is configured into the shift register, the selection is shifted in sync with a horizontal synchronization signal.

FIG. 168(*b*) shows a state which results when a turn-on voltage is applied to the gate signal lines 17*b* of two pixel rows in each 4-pixel-row set. The location of a displayed pixel row 53 shifts one by one in sync with a horizontal synchronization signal (HD). Of course, it is free to decide whether to select two pixel rows (apply a turn-off voltage to the gate signal lines 17*b* of the other two pixel rows) or no pixel row (apply a turn-off voltage to the gate signal lines 17*b* of the four pixel rows) in the 4-pixel-row set. Since this is configured into the shift register, the selection is shifted in sync with a horizontal synchronization signal.

FIG. 168(*a*) shows a state which results when a turn-on voltage is applied to the gate signal line 17*b* of one pixel row in each 4-pixel-row set. FIG. 168(*b*) shows a state which results when a turn-on voltage is applied to the gate signal lines 17*b* of two pixel rows in each 4-pixel-row set. However, the present invention is not limited to this configuration (system). For example, a turn-on voltage may be applied to the gate signal line 17*b* of one pixel row in each six-pixel-row set. Alternatively, a turn-on voltage may be applied to the gate signal lines 17*b* of two pixel rows in each eight-pixel-row set. That is, the present invention is not limited to the drive method in FIG. 168. Also, on/off state may be varied separately for R, G, and B.

FIG. 169 shows state of voltage outputted to the gate signal lines 17*b* in the drive mode in FIG. 168(*a*). As described earlier, the subscript in the gate signal line 17*b*(4) indicates a pixel row. Incidentally, for ease of explanation, pixel rows begin with (1). Also, the numerals in the top row of the table indicate horizontal scanning period numbers.

As illustrated in FIG. 169, the gate signal lines 17*b*(1) to 17*b*(4) have the same waveforms as the gate signal lines 17*b*(5) to 17*b*(8). That is, the same operation is performed for each 4-pixel-row set.

FIG. 170 shows state of voltage outputted to the gate signal lines 17*b* in the drive mode in FIG. 168(*b*). As illustrated in FIG. 170, the gate signal lines 17*b*(1) to 17*b*(4) have the same waveforms as the gate signal lines 17*b*(5) to 17*b*(8). That is, the same operation is performed for each 4-pixel-row set.

According to the example in FIG. 168, the brightness of the display screen 50 can be adjusted at any time by increasing and decreasing the number of pixels in display mode. In a QCIF panel, the number of vertical pixels is 220 dots. Thus, in FIG. 168(*a*), 220/4=55 pixel rows can be displayed. That is, in white raster display, maximum brightness is obtained when 55 pixel rows are displayed. The display screen can be made darker by decreasing the number of displayed pixel rows as follows: 55→54→53→52→51→ . . . 5→4→3→2→1→0. Conversely, the screen can be made brighter by increasing the number of displayed pixel rows as follows: 0→1→2→3→4→5→ . . . 50→51→52→53→54→55. Thus, the brightness can be adjusted in multiple steps.

In this brightness adjustment, the brightness of the screen changes linearly in proportion to the number of displayed pixel rows. Besides, gamma characteristics which correspond to the brightness do not change (the number of gradations remains constant regardless of whether the screen is bright or dark).

Although in the above example, the number of displayed pixel rows is changed in increments of 1 to adjust the brightness of the screen 50, this is not restrictive. It may be changed as follows: 54→52→50→48→46→ . . . →6→4→2→0. Alternatively, it may be changed as follows: 55→50→45→40→35→ . . . 15→10→5→0.

Similarly, in FIG. 168(*b*), a QCIF panel can display 220/2=110 pixel rows. That is, in white raster display, maximum brightness is obtained when 110 pixel rows are displayed. The display screen can be made darker by decreasing the number of displayed pixel rows as follows: 110→108→106→104→102→ . . . 10→8→6→4→2→0. Conversely, the screen can be made brighter by increasing the number of displayed pixel rows as follows: 0→2→4→6→8→ . . . 100→102→104→106→108→110. Thus, the brightness can be adjusted in multiple steps.

Although the number of displayed pixel rows is changed in increments of 2 to adjust the brightness of the screen 50, this is not restrictive. It may be changed in increments of 4 or more than 4. When curtailing displayed pixel rows to adjust brightness, preferably pixel rows are curtailed in a distributed manner wherever possible rather than in a concentrated manner. This is to reduce flickering.

Brightness can also be adjusted by varying illumination time per horizontal scanning period instead of using the number of pixel rows (the pixel rows are illuminated or non-illuminated approximately over an entire horizontal scanning period). That is, the brightness of the display screen is adjusted by illuminating pixel rows for part of one horizontal scanning period (e.g., for ⅛ of 1 H or for 15/16 of 1 H).

This adjustment (control) is performed using a main clock (MCLK) of the display panel. In the case of a QCIF panel, MCLK is approximately 2.5 MHz. This means that 176 clock pulses can be counted in one horizontal scanning period (1 H). Thus, by counting MCLK pulses and controlling the duration for which a turn-on voltage (Vgl) is applied to the gate signal lines 17*b* based on the count value, it is possible to turn on and off the EL elements 15 in each pixel row.

Specifically, this can be done by controlling the positions where the clocks (SCK) are set to the low level and the duration for which the clocks (SCK) are set to the low level in timing charts in FIGS. 112 and 114. The shorter the duration for which the clocks (SCK) are set to the low level, the shorter the duration for which the Q output terminal is set to the low level (Vgl).

With the drive method in FIG. 168(*a*), the durations for which Vgl (turn-on voltage) occurs symmetrically during a period of 1 H get shorter as illustrated in FIG. 171. In (a) of FIG. 171, Vgl (turn-on voltage) is outputted for an entire period of 1 H (however, with the p-channel gate driver circuit 12 shown in FIG. 113, it is not possible to produce a low-level output over the entire period of 1 H). A period of the Vgh voltage (turn-off voltage) occurs between 1 H and the next 1 H. However, this is shown in (a) of FIG. 171 for ease of explanation.

Similarly, in (b) of FIG. 171, the duration for which Vgl is outputted to the gate signal lines 17*b* is shorter than in (a) by two MCLK pulses. In (c) of FIG. 171, the duration for which Vgl is outputted to the gate signal lines 17*b* is shorter than in (b) by two MCLK pulses. The rest is the same as above, and thus description thereof will be omitted.

With the drive method in FIG. 168(*b*), the durations for which Vgl (turn-on voltage) occurs symmetrically during a period of 2 Hs get shorter as illustrated in FIG. 172. In (a) of FIG. 172, Vgl (turn-on voltage) is outputted for an entire period of 2 H (however, with the p-channel gate driver circuit 12 shown in FIG. 113, it is not possible to produce a low-level output over the entire period of 2 Hs). A period of the Vgh voltage (turn-off voltage) occurs between 2 Hs and the next 2 Hs. This is similar to the case with FIG. 171.

Similarly, in (b) of FIG. 172, the duration for which Vgl is outputted to the gate signal lines 17*b* is shorter than in (a) by two MCLK pulses in the period of 2 Hs. In (c) of FIG. 172, the duration for which Vgl is outputted to the gate signal lines 17*b* is shorter than in (b) by two MCLK pulses. The rest is the same as above, and thus description thereof will be omitted.

Incidentally, if the clock is adjusted by changing the configuration of the gate driver circuit 12 somewhat, the voltage can be applied to the gate signal lines 17*b* in FIG. 171 for 2 Hs continuously as illustrated in FIG. 173.

The drive method in FIG. 168 can also achieve proper movie display. However, whereas both display area 53 and non-display area 52 are continuous in FIG. 13, the display area 53 in FIG. 168 is not continuous. This is because a turn-on voltage is applied to one pixel row in each 4-pixel-row set (FIG. 168(*a*)) or two consecutive pixel rows in each 4-pixel-row set (FIG. 168(*b*)). Of course, by changing or improving the circuit configuration illustrated in FIGS. 113 and 111, it is possible to change or vary displayed pixel rows in relation to the clocks (SCK). For example, pixel rows can be displayed by skipping one pixel row. Also, it is possible to illuminate pixel rows by skipping six pixel rows. However, in the case of a driver circuit (shift register) which is composed or formed of p-channel transistors, on-illuminated pixel rows 52 are at least placed (inserted) among displayed pixel rows 53.

FIG. 174 shows a drive method which supports movie display in the case where the gate driver circuit 12 is composed of p-channel transistors as shown in FIG. 113. As described earlier, intermittent display is required to prevent degradation of image display due to blurred moving pictures. That is, it is necessary to insert black (display a black or low-brightness display screen). It is necessary to provide intermittent screen display as CRT display. That is, an arbitrary pixel row which displays an image enters black (low-brightness) display mode after a predetermined period. This pixel row blinks (image display and non-display (black display or low-brightness display) alternate). The black display period should be 4 msec or longer. Alternatively, black display (low-brightness display) should last ¼ of one frame (field) period or longer. Preferably, black display (low-brightness display) should last ½ of one frame (field) period or longer.

This condition depends on persistence of human vision. That is, images which blink faster than at predetermined intervals appear to illuminate continuously because of the human vision. This results in blurred moving pictures. However, when images blink slower than at predetermined intervals, although they visually appear to be continuous, inserted non-display (black display) areas become recognizable and the displayed images become discrete (although nothing looks unusual visually). Consequently, in movie display, images become discrete and no image blur occurs. That is, blurred moving pictures are eliminated.

In area A in FIG. 174(*a*), one pixel row out of four pixel rows are displayed (illuminated). Thus, a pixel row illuminates once every four horizontal scanning periods (illuminates for 1 H every 4 Hs). This period (the time it takes for a pixel row to turn on, turns off, and turn on again) is 4 msec or less. Thus, it looks to the human eye as if the images were displayed continuously (any pixel row almost appears to be displayed constantly). In area B in FIG. 174(*a*), black (low-brightness display) is inserted so that the time required for a pixel row to be displayed again after it is displayed once will be 4 msec or more, and preferably 8 msec or more. This makes images discrete, resulting in proper movie display.

Incidentally, the term “area A” or “area B” is used above only for ease of explanation. In FIG. 174, area A is scanned sequentially in the direction of the arrow (from top to bottom of the screen). This is similar to electronic beam scanning in a CRT. That is, images are rewritten in sequence (For FIG. 174(*a*), refer to FIG. 175. The pixel rows are scanned (driven) as shown in FIG. 175(*a*)→(*b*)→(*c*)→(*a*). For FIG. 174(*b*), refer to FIG. 176. The pixel rows are scanned (driven) as shown in FIG. 176(*a*)→(*b*)→(*c*)→(*a*).

As described above, with the drive method according to the present invention, in FIG. 174(*a*), arbitrary pixel row is displayed for 1 H in every 4 Hs for a period of 4 msec (preferably 8 msec) or more out of one field (frame) period, and remains non-illuminated (black display (black insertion) or low-brightness display) for the rest of the period (in the field (frame) period). Thus, although the term “area A” or “area B” has been used above for ease of explanation, it is more appropriate to use the term “period A” or “period B” from a temporal standpoint. Specifically, images are displayed continuously in area A (period A) while pixel rows (the screen 50) are displayed intermittently in area B (period B). The above items also apply to the example in FIG. 174(*b*) as well as to other examples of the present invention.

In FIG. 174(*b*), two pixel rows are illuminated continuously and the next two pixel rows are non-illuminated. That is, in area A (period A), pixel rows are illuminated for a period of 2 Hs and non-illuminated for a period of 2 Hs and this cycle is repeated. In area B (period B), pixel rows remain non-illuminated for a predetermined period. With the drive method in FIG. 174(*b*), continuous display takes place in appearance in area A and intermittent display takes place in appearance in area B.

Thus, when display modes of an arbitrary pixel row (pixels) is observed, the drive method according to the present invention alternates two periods: a first period during which image display and non-display are repeated at least once for a period of less than 4 msec (or less than ¼ of one frame (field) period) and a second period during which the pixel row (pixels) changes from display mode to non-display mode (black display or low-brightness display lower than a predetermined brightness) and enters display mode again after 4 msec or more (or ¼ of one frame (field) period or more). The above driving makes it possible to achieve proper image display. Also it uses a simple configuration of the control circuit (the gate driver circuit 12 and the like), resulting in reduced costs.

In FIG. 174, again it is possible to adjust (vary) the brightness of the screen 50 by varying the number of illuminated pixel rows (the number of displayed pixel rows 53 can be varied or adjusted as in the case of FIG. 168). Also, by varying the ratio of a black insertion area (area B in FIG. 174), it is possible to achieve an optimum state according to image display condition. For example, in the case of still pictures, it is necessary to avoid increasing area B. Increasing area B will cause flickering. In the case of still pictures, the display area 53 should be scattered in the screen 50. For example, a QCIF panel has 220 pixel rows. To display a still picture using 55 pixel rows, since 220/55=4, one in every four pixel rows can be displayed. To display 10 pixel rows out of the 200 pixel rows, one in every 22 pixel rows (220/10=22) can be displayed.

Incidentally, although one area B (period B) is shown in FIG. 174, needless to say, this is not restrictive and area B (period B) may be divided into two or more parts.

However, in FIG. 174(*a*), there is only a choice of whether to illuminate one in every four pixel rows. Thus, it is not possible to illuminate one in every 22 pixel rows. Consequently, one pixel row is displayed in every five 4-pixel-row sets (i.e., one in every 20 pixel rows is displayed). In other words, four 4-pixel-row sets are not illuminated at all and only one pixel row in a 1-pixel-row set is illuminated. All the remaining twenty (20) pixel rows are not illuminated (220−4×5=200). That is, the present invention puts a set of pixel rows to be manipulated into a unit, groups pixel-row sets into a block, and controls, on a block by block basis, the number of pixel-row sets which contains a pixel row to be illuminated. The above items also apply to the example in FIG. 174(*b*) as well as to other examples of the present invention.

Conversely, in the case of movie display, black display should be inserted for at least 4 msec as described with reference to FIG. 174. Also, by varying the ratio of black insertion (duration of black display or area ratio of black display to the display screen), it is possible to change movie display condition (adjust it to an optimum state). For very fast movie display (e.g., if images move actively), it is recommended to increase the black insertion area. In so doing, reduction in brightness due to reduction in the number of pixels displaying images is compensated for by increasing the emission brightness of each pixel row. Also, it is recommended to increase the period in which black display continues. If the ratio of a movie display area to the entire screen is relatively small or if moving pictures move relatively slowly, it is recommended to decrease the ratio of black insertion. In so doing, increase in display brightness due to increase in the number of illuminated pixel rows 53 can be adjusted easily by decreasing the emission brightness of each pixel row. This adjustment can be made by varying the programming current Iw and the like. Alternatively, the adjustment can be made by scattering the black insertion period into multiple parts. This makes it possible to achieve proper image display with reduced flickering.

Thus, also in the case of movie display, it is possible to achieve more optimum image display by varying or adjusting the condition of black insertion. Needless to say, the above items also apply to examples described below.

An input image signal is checked for moving pictures (ID detection). If the signal represents moving pictures or contains many moving pictures, the drive system in FIG. 174 (intermittent display by means of black insertion) is performed. In the case of still pictures, the drive system in FIG. 168 is implemented (illuminated pixel rows are placed being scattered as much as possible). Of course, the drive system may be changed according to the application of the display panel or display apparatus of the present invention. For example, the drive system in FIG. 168 is used for still pictures such as those on a computer monitor. The drive system in FIG. 174 is used for AV applications such as television. The drive system can be changed easily using the SSTA data of the gate driver circuit 12*b*. This can be done simply by controlling the transistor which turns on and off the current flowing through the EL elements 15 shown in FIG. 1 and the like.

Switching between the drive systems in FIGS. 174 and 168 (for moving pictures or still pictures, or for mainly moving pictures or mainly still pictures) may be either left up to the user by providing a changeover switch as required or done by the manufacturer of the display panel according to the present invention. Also, switching may be done automatically by detecting conditions of ambient environment with a photosensor and the like. It is also possible to combine a control signal (changeover signal) with the video signal received by the present invention, detect the control signal, and switch display mode (drive system).

FIG. 177 shows output waveforms of gate signal lines 17*b* in the case where the drive system in FIG. 174(*a*) is used. With the pixel configuration in FIG. 1, on/off signals (Vgh is a turn-off voltage and Vgl is a turn-on voltage) applied to the gate signal lines 17*b* turn on and off the transistors 11*d*, thereby turning on and off the EL elements 15. In FIG. 177, the top row contains the horizontal scanning period, where symbol L represents the number of pixel rows (in the case of a QCIF panel, L=220 pixel rows). In FIGS. 168 and 174, again the drive systems according to the present invention are not limited to the pixel configuration in FIG. 1. Needless to say, they may also be applied to other pixel configurations (e.g., FIG. 38).

As can be seen from FIG. 177, in period A (area A), a turn-on voltage (Vgl) is applied to the gate signal lines 17*b* for 1 H in every 4 Hs. In period B (area B), a turn-off voltage (Vgh) is applied continuously. Thus, current does not flow through the EL elements 15 during this period. The location of each gate signal line 17*b* to which a turn-on voltage is applied is scanned every pixel row.

Incidentally, although it has been stated in the above example that pixel rows are scanned one by one, the present invention is not limited to this. For example, in the case of interlaced scanning, pixel rows are scanned skipping one pixel row. That is, even-numbered pixel rows are scanned in the first field. Odd-numbered pixel rows are scanned in the second field. When the first field is being rewritten, the images written into the second field are retained. However, blinking is caused (or may not be caused). When the second field is being rewritten, the images written into the first field are retained. Of course, blinking may be caused as in the example of FIG. 174.

In the case of interlaced scanning, one frame consists of two fields, which is normally the case with CRTs. However, the present invention is not limited to this. For example, one frame may consist of four fields. In that case, images in the (4N+1)-th pixel rows are rewritten in the first field (where n is an integer not smaller than 1). Images in the (4N+2)-th pixel rows are rewritten in the second field. Images in the (4N+3)-th pixel rows are rewritten in the third field. Images in the (4N+4)-th pixel rows are rewritten in the final fourth field. Thus, writing into pixel rows according to the present invention is not limited to sequential scanning. The above items also apply to other examples. The interlaced scanning as referred to herein means typical skip scanning and is not limited to "2 fields=1 frame." That is, one frame may consist of a plurality of fields.

Needless to say, the drive system in FIG. 177 or 178 may be used in combination with the drive system described in FIGS. 171, 172, 173, etc., which involves adjusting the brightness of the screen 50 by controlling the current flowing through the EL elements 15 (controlling ON periods), in one horizontal scanning period (1 H) or two or more horizontal scanning periods.

As in the case of FIG. 177, FIG. 178 shows applied waveforms of gate signal lines 17*b* in FIG. 174(*b*). FIG. 178 differs from FIG. 177 in that in period A (area A, see FIG. 168(*b*)), a turn-on voltage (Vgl) is applied to each gate signal line 17*b* for two horizontal scanning periods (2 Hs) and then a turn-off voltage (Vgh) is applied for 2 Hs. The turn-on voltage and turn-off voltage are applied alternately. The turn-off voltage is applied continuously in period B (area B). That location of each gate signal line 17*b* to which a turn-on voltage is applied is scanned every 1 H.

FIG. 177 shows output waveforms of gate signal lines 17*b* in the case where the drive system in FIG. 174(*a*) is used. With the pixel configuration in FIG. 1, on/off signals (Vgh is a turn-off voltage and Vgl is a turn-on voltage) applied to the gate signal lines 17*b* turn on and off the transistors 11*d*, thereby turning on and off the EL elements 15. In FIG. 1, the top row contains the horizontal scanning period, where symbol L represents the number of pixel rows L (in the case of a QCIF panel, L=220 pixel rows). In FIGS. 168 and 174, again the drive systems according to the present invention are not limited to the pixel configuration in FIG. 1. Needless to say, they also apply to other pixel configurations (e.g., FIGS. 38, 43, 51, 62, 63, etc.).

As in the case of FIG. 177, FIG. 178 shows applied waveforms of gate signal lines 17*b* in FIG. 174(*b*). FIG. 178 differs from FIG. 177 in that in period A (area A, see FIG. 168(*b*)), a turn-on voltage (Vgl) is applied to each gate signal line 17*b* for two horizontal scanning periods (2 Hs) and then a turn-off voltage (Vgh) is applied for 2 Hs. The turn-on voltage and turn-off voltage are applied alternately. The turn-off voltage is applied continuously in period B (area B). That location of each gate signal line 17*b* to which a turn-on voltage is applied is scanned every 1 H. Other items are the same as or similar to FIG. 177, and thus description thereof will be omitted.

Incidentally, in the above example, area A and area B coexist in the screen 50. That is, area A and area B always exist during any period in screen display mode (of course, the location of area A varies). This means that period A and period B exist in one field (one frame, i.e., a refresh period of the screen). However, since black insertion (black display or low-brightness display) can be used to improve movie display, the present invention is not limited to the drive system in FIG. 124. For example, the drive system in FIG. 179 may be used.

In FIG. 179, it is assumed for ease of explanation, that the screen is made up of four display periods (a), (b), (c), and (d). It is also assumed that one frame consists of four fields with FIG. 179(*a*) corresponding to the first field, FIG. 179(*b*) corresponding to the second field, FIG. 179(*c*) corresponding to the third field, and FIG. 179(*d*) corresponding to the fourth field. In FIG. 179, the display repeats a cycle of (a)→(b)→(c)→(d).

In the first field, the even-numbered pixel rows are selected in sequence to rewrite images as illustrated in FIG. 179(*a*). When the first field is rewritten, the screen 50 is filled with black display in sequence from the top as illustrated in FIG. 179(*b*) (FIG. 179(*b*) shows the screen 50 filled with black display). Next, in the third field, images are written into the odd-numbered pixel rows in sequence from the top of the screen 50 as illustrated in FIG. 179(*c*). In other words, odd-numbered images are displayed in sequence from the top. Next, in the fourth field, images are put into non-illumination mode (black display) in sequence from the top of the screen 50 (FIG. 179(*d*) shows the screen 50 completely in non-illumination mode).

Incidentally, the words "images are written" and "images are displayed" are used in FIGS. 179(*a*) and (*c*), and basically the present invention is characterized in that images are displayed (illuminated). Thus, writing an image (running a program) does not need to be identical with displaying an image. That is, one may think that in FIGS. 179(*a*) and (*c*), by controlling the gate signal lines 17*b*, the present invention controls the current flowing through the EL elements 15, and thereby puts images into illumination or non-illumination mode. Thus, it is possible to switch between the state in FIG. 179(*a*) and state in FIG. 179(*b*) at once (e.g., in a period of 1 H). For example, this can be done through control of an enable terminal (on-state and off-state are held in the shift registers of the gate driver circuit 12*b* (in FIG. 179(*a*), the shift register for the even-numbered pixel rows holds on-state data) and the states in FIGS. 179(*b*) and (*d*) are displayed when the enable terminal is off and the state in FIG. 179(*a*) is displayed when the enable terminal is on). Thus, the displays in FIGS. 179(*a*) and 179(*c*) can be achieved using on-state and off-state of the gate signal lines 17*b* (image data is held in the capacitor 19 beforehand in the case of the pixel configuration in FIG. 1, for example). It has been stated that each of the modes in FIGS. 179(*a*), (*b*), (*c*), and (*d*) occurs for one field period.

However, the present invention is not limited to these display modes. To improve at least movie display condition, black insertion mode such as the one shown in FIGS. 179(*b*) or (*d*) can be run for 4 msec. Thus, in the example of the present invention, the display modes in FIGS. 179(*a*) and (*c*) can be brought about not only by scanning the gate signal lines 17*b* using the shift register circuits of the gate driver circuit 12*b*. These modes can be brought about by mutually connecting odd-numbered gate signal lines 17*b* (referred to as an odd-numbered gate signal line group), mutually connecting even-numbered gate signal lines 17*b* (referred to as an even-numbered gate signal line group), and applying turn-on and turn-off voltages alternately to the odd-numbered gate signal line group and even-numbered gate signal line group. The display mode in FIG. 179(*c*) is brought about if a turn-on voltage is applied to the odd-numbered gate signal line group and a turn-off voltage is applied to the even-numbered gate signal line group. The display mode in FIG. 179(*a*) is brought about if a turn-on voltage is applied to the even-numbered gate signal line group and a turn-off voltage is applied to the odd-numbered gate signal line group. The display modes in FIGS. 179(*b*) and (*d*) are brought about if a turn-off voltage is applied to both odd-numbered gate signal line group and even-numbered gate signal line group. Each of the modes in FIGS. 179(*a*), (*b*), (*c*), and (*d*) (especially FIGS. 179(*b*) and (*d*)) should be brought about for 4 msec or longer. The drive system in FIG. 179 alternates between screen display mode (FIGS. 179(*a*) and (*c*)) and black display mode (black insertion, FIGS. 179(*b*) and (*d*)). This makes image display intermittent, improving movie display performance (without blurred moving pictures).

The drive system in the example of FIG. 179 involves displaying images in the odd-numbered pixel rows or even-numbered pixel rows in the first and third fields and inserting a black screen (FIGS. 179(*b*) and (*d*)) between the two screens. However, the present invention is not limited to this. The display mode in FIG. 168 may be brought about in the first and third fields and black display may be inserted between the two fields.

A timing chart for an example described below is shown in FIG. 180. FIG. 180(*a*) corresponds to the first field and FIG. 180(*b*) corresponds to the second field which is in black insertion mode. FIG. 180(*c*) corresponds to the third field. Incidentally, the fourth field, which is the same as that in FIG. 180(*b*), has been omitted. However, the fourth field is not strictly necessary. One frame may consist of three fields. Since black screen is inserted in the second field, blurred moving pictures are reduced greatly. Thus, in FIG. 180, a cycle of (a)→(b)→(c) is repeated.

In FIG. 180(*a*), images are displayed in FIG. 168(*a*) for 1 H in every four horizontal scanning periods (4 Hs) (a Vgl voltage (turn-on voltage) is applied to each gate signal line 17*b* for 1 H in every 4 Hs). Next, in the second field, a turn-off voltage (Vgh) is applied to all the gate signal lines 17*b*. This can be done at once through control of the enable terminal as is the case with the previous example. Thus, it is not strictly necessary to maintain the state in FIG. 180(*b*) for one field period. To achieve proper movie display, it is enough to maintain the state for 4 msec or longer. However, in FIG. 180(*a*), if images are rewritten in sequence from the top of the screen (not necessarily from the top), images will be skipped. The state in FIG. 180(*b*) can be maintained easily by connecting the plural gate signal lines 17*b* in the lump and controlling the enable terminal as described with reference to FIG. 179.

In FIG. 180(*a*), images are displayed in FIG. 168(*a*) for 1 H in every four horizontal scanning periods (4 Hs) (a Vgl voltage (turn-on voltage) is applied to each gate signal line 17*b* for 1 H in every 4 Hs). Next, in the second frame, a turn-off voltage (Vgh) is applied to all the gate signal lines 17*b*. This can be done at once through control of the enable terminal as is the case with the previous example. Thus, it is not strictly necessary to maintain the state in FIG. 180(*b*) for one frame period. To achieve proper movie display, it is enough to maintain the state for 4 msec or longer. However, in FIG. 180(*a*), if images are rewritten in sequence from the top of the screen (not necessarily from the top), images will be skipped. The state in FIG. 180(*b*) can be maintained easily by connecting the plural gate signal lines 17*b* in the lump and controlling the enable terminal as described with reference to FIG. 179.

In FIG. 180, images are displayed regularly, for example, by illuminating each pixel row for 1 H in every 4 Hs. However, it is sufficient if each pixel row is illuminated (displayed) for an equal interval during a unit period (e.g., one frame, one field, or the like). That is, there is no need for illumination mode and non-illumination mode to occur regularly.

FIG. 181 shows an example in which illumination mode occurs irregularly. A turn-on voltage is applied to the gate signal line 17*b*(1) in the 1st H, 5th H, 6th H, 9th H, 13th H, 14th H, and so on. A turn-off voltage is applied during the other periods. Thus, the turn-on voltage is applied randomly rather than periodically (although periodically in the long term). It is sufficient if total durations for which a turn-on voltage is applied during one frame period (unit period) are approximately equal among different gate signal lines. In this way, the different pixel rows are illuminated for approximately equal durations (pixel rows are illuminated (displayed) when a turn-on voltage is applied to the gate signal lines 17*b*).

Incidentally, in FIG. 181, the signal waveforms applied to the gate signal lines 17*b* are scanned every 1 H. In this way, by scanning (applying) basic waveforms by shifting the gate signal lines 17*b* by 1 H (by predetermined clock pulses or by a predetermined unit), it is possible to make brightness uniform over the entire screen. In FIG. 181, needless to say, the brightness of the screen can also be controlled (adjusted) by adjusting the application duration of the turn-on voltage (Vgl).

In the above example, the same turn-on/turn-off voltage patterns are applied to the gate signal lines 17*b* in each frame (unit period). However, according to the present invention, different pixel rows (pixels) are illuminated (display) or non-illuminated (non-display) for approximately equal durations during a predetermined period. Thus, in the drive system, where one frame consists of two fields, the signal waveforms applied to the first field and second field may vary among different gate signal lines 17*b*. For example, a turn-on voltage may be applied to an arbitrary pixel row for a period of 10 Hs in the first field, and for a period of 20 Hs in the second field (in a unit period of two fields, a turn-on voltage is applied for a period of 10 Hs+20 Hs). A turn-on voltage is also applied to the other pixel rows for a period of 30 Hs.

An example is shown in FIG. 182. In FIG. 182(*a*) (first field), a turn-on voltage is applied to the gate signal line 17*b* for each pixel row for one horizontal scanning period (1 H) in every four horizontal scanning periods (4 Hs). In FIG. 182(*b*) (second field), a turn-on voltage is applied to the gate signal line 17 for each pixel row for 2 Hs in every 4 Hs. Thus, in two fields, a turn-on voltage is applied for (1+2) Hs in every (4+4) Hs. However, in a unit period (two a fields in FIG. 132), a turn-on voltage is applied to every gate signal line 17*b* for the same period. Thus, every pixel row is displayed at the same brightness (assuming a white raster display).

Incidentally, although it has been stated with reference to FIG. 180 that a turn-on voltage is applied for 1 H in every 4 Hs, this is not restrictive. For example, a turn-on voltage may be applied for 1 H in every 8 Hs as illustrated in FIG. 183. Also, in each field, signal waveforms may be applied to the gate signal lines 17*b* perfectly at random rather than periodically. It is sufficient if the total durations for which a turn-on voltage is applied during a unit period are equal among all the gate signal lines 17*b*.

Although it has been stated in the above example that the total durations for which a turn-on voltage is applied during a unit period are equal among all the gate signal lines 17*b*, this does not apply to the following cases. Such is the case when a screen 50 (i.e., one display panel) contains multiple screens 50 which differ in brightness. That is, for example, when the screen 50 consists of a first screen 50*a* and second screen 50*b* which differ in brightness. The two screens 50 can be varied in brightness by adjusting the programming current Iw, but they can be varied more easily by scanning the gate signal lines 17*b* and varying the illumination (display) period of pixel rows between the first screen 50*a* and second screen 50*b*. For example, regarding each pixel row in the first screen 50*a*, a turn-on voltage is applied to the gate signal lines 17*b* for 1 H in every 4 Hs. For each pixel row in the second screen 50*b*, a turn-on voltage is applied to the gate signal lines 17*b* for 1 H in every 8 Hs. In this way, by varying the application duration of the turn-on voltage among different screens, it is possible to adjust screen brightness and make gamma curves of the screens similar to each other.

The power supply circuit (IC) 82 (see FIG. 8) generates voltages of potentials needed for a turn-on voltage (selection voltage of pixel 16 transistors) and turn-off voltage (non-selection voltage of pixel 16 transistors) to be outputted from the gate driver circuits 12 to the gate signal lines 17. Consequently, semiconductor processes for the power supply IC 82 have sufficient voltage resistance.

Thus, the logic signals can be level-shifted (LS) conveniently by the power supply IC 82. For this reason, gate driver circuit 12 control signals outputted from a controller (not shown) are fed into the power supply IC 82 and level-shifted there before it is fed into the gate driver circuits 12 according to the present invention. Source driver circuit 14 control signals outputted from the controller (not shown) are fed into the source driver circuit 14 and the like according to the present invention (there is no need for level shifting).

However, the present invention does not limit all the transistors formed on the array board 71 to p-channel transistors. By using only p-channel transistors for the gate driver circuits 12 as described later with reference to FIGS. 111 and 113, it is possible to make the gate driver circuits 12 smaller than gate driver circuits 12 of CMOS structure. Consequently, it is possible to reduce bezel width. In the case of a 2.2-inch QCIP panel, the width of a gate driver circuit 12 can be reduced to 600 μm if a 6-μm rule is adopted. The width will be 700 μm even including power wiring of the gate driver circuit 12. If CMOS (n-channel and p-channel transistors) is used for a similar circuit configuration, the width will be increased to 1.2 mm. Thus, by using only p-channel transistors for the gate driver circuits 12, it is possible to achieve a characteristic effect of bezel width reduction.

Also, if the pixels 16 are constructed of p-channel transistors, they will match well with the gate driver circuits 12 which are composed of p-channel transistors. The p-channel transistors (the transistors 11*b* and 11*c* and transistor 11*d* in the pixel configuration in FIG. 1) turn on when the voltage becomes low (Vgl). On the other hand, the lower voltage serves as the selection voltage for the gate driver circuits 12 as well. Gate drivers with p-channel transistors achieve good matching if the lower level is used as the selection level as can be seen from a configuration in FIG. 113. This is because the lower level cannot be maintained for a long time. On the other hand, the higher voltage (Vgh) can be maintained for a long time.

Also, by using p-channel transistors for the driver transistors (transistor 11*a* in FIG. 1) which supplies current to the EL elements 15, it is possible to use a ground electrode made of thin metal film as the cathode of the EL elements 15. Also, current can be passed from the anode potential Vdd to the EL elements 15 in the forward direction. In view of the above circumstances, it is preferable that the transistors in the pixels 16 and gate driver circuits 12 are p-channel transistors. Thus, the use of p-channel transistors as the transistors (driver transistors 11*a* and switching transistors 11*d*, 11*b*, and 11*c*) in the pixels 16 and as the transistors in the gate driver circuits 12 according to the present invention is not merely a design matter.

The level shifter (LS) circuit may be formed directly on the array board 71. That is, n-channel and p-channel transistors are used for the level shifter (LS) circuit. A logic signal from a controller (not shown) is boosted by the level shifter circuit formed directly on the board 71 so that it will match the logic level of the gate driver circuits 12 constructed from a p-channel transistor. The boosted logic voltage is applied to the gate driver circuits 12.

Incidentally, the level shifter circuit may be constructed from a semiconductor chip and mounted on the board 71 using COG technology or the like. Also, the source driver circuit 14 is constructed basically from a semiconductor chip and mounted on the board 71 using COG technology. However, the source driver circuit 14 is not limited to being constructed from a semiconductor chip, and may be formed directly on the board 71 using polysilicon technology. If p-channel transistors are used as the transistors 11*a* of pixels 16, programming current flows in the direction from the pixels 16 to the source signal lines 18. Thus, n-channel transistors should be used as the constant-current circuit in the source driver circuit. That is, the source driver circuit 14 should be configured in such a way as to draw the programming current Iw.

Thus, if the driver transistors 11*a* of the pixels 16 (in the case of FIG. 1) are p-channel transistors, the constant-current circuit (circuit which outputs gradation current) in the source driver circuit 14 must be n-channel transistors to ensure that the source driver circuit 14 will draw the programming current Iw. In order to form a source driver circuit 14 on an array board 71, it is necessary to use both masks (processes) for n-channel transistors and masks (processes) for p-channel transistors. Conceptually speaking, in the display panel (display apparatus) of the present invention, p-channel transistors are used for the pixels 16 and gate driver circuits 12 while n-channel transistors are used as the transistors of drawing current sources of the source driver.

Figure 8:
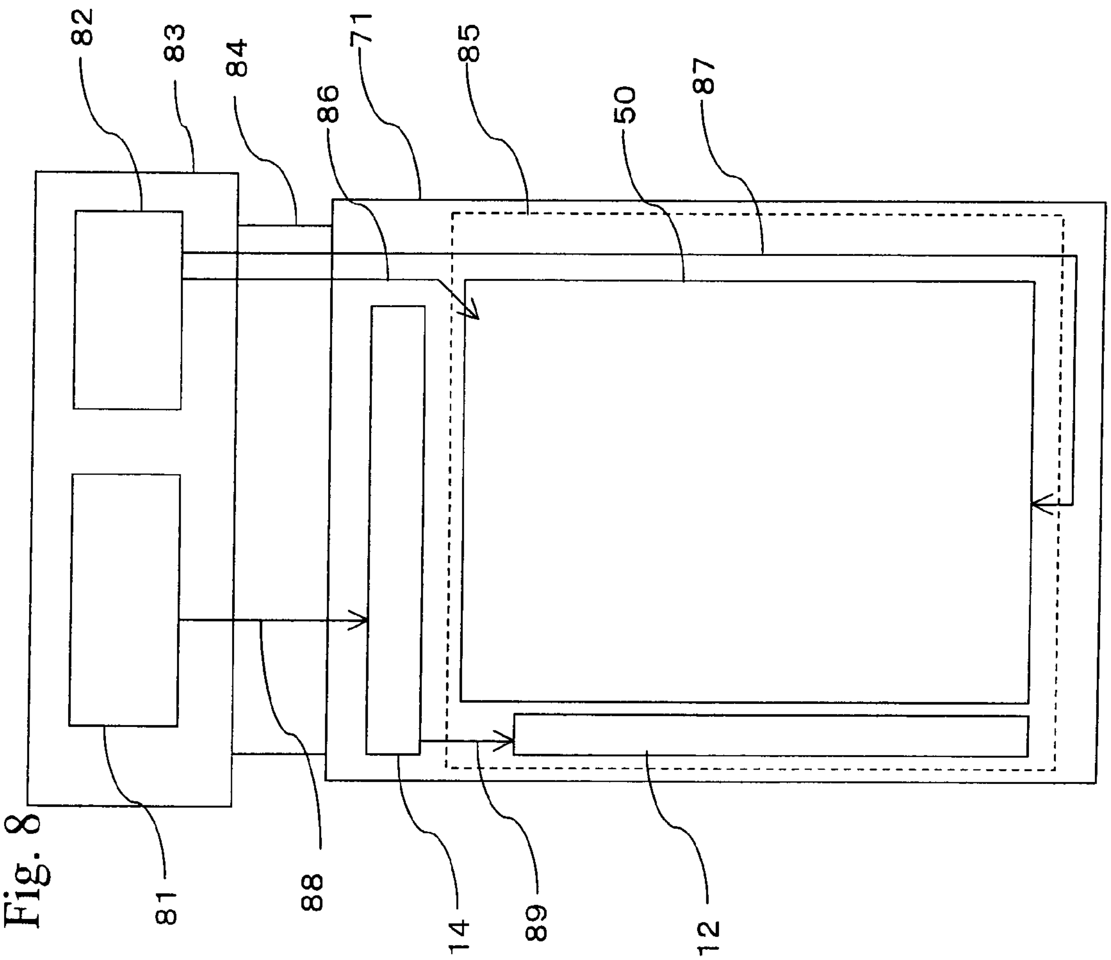
FIG. 8 is a block diagram of a display apparatus according to the present invention.

FIG. 8 is a block diagram of signal and voltage supplies on a display apparatus according to the present invention or a block diagram of the display apparatus. Signals (power supply wiring, data wiring, etc.) are supplied from the control IC 81 to a source driver circuit 14*a* via a flexible board 84.

In FIG. 8, a control signal for the gate driver circuit 12 is generated by the control IC, level-shifted by the source driver circuit 14, and applied to the gate driver circuit 12. Since drive voltage of the source driver circuit 14 is 4 to 8 (V), the control signal with an amplitude of 3.3 (V) outputted from the control IC 81 can be converted into a signal with an amplitude of 5 (V) which can be received by the gate driver circuit 12. Of course, the signal voltage may be level-shifted by a controller and supplied to the gate driver circuits 12.

Preferably, the source driver circuit 14 contains an image memory. Image data may go through an error diffusion process or dithering process before being stored in the image memory.

In FIG. 8 and the like, what is denoted by reference numeral 14 has been described as a source driver, but instead of being a mere driver, it may incorporate a power circuit, buffer circuit (including a circuit such as a shift register), data conversion circuit, latch circuit, command decoder, shifting circuit, address conversion circuit, image memory, etc. Needless to say, a three-side free configuration or other configuration, drive system, etc. described with reference to FIG. 9 and the like are also applicable to the configuration described with reference to FIG. 8 and the like.

Figure 9:
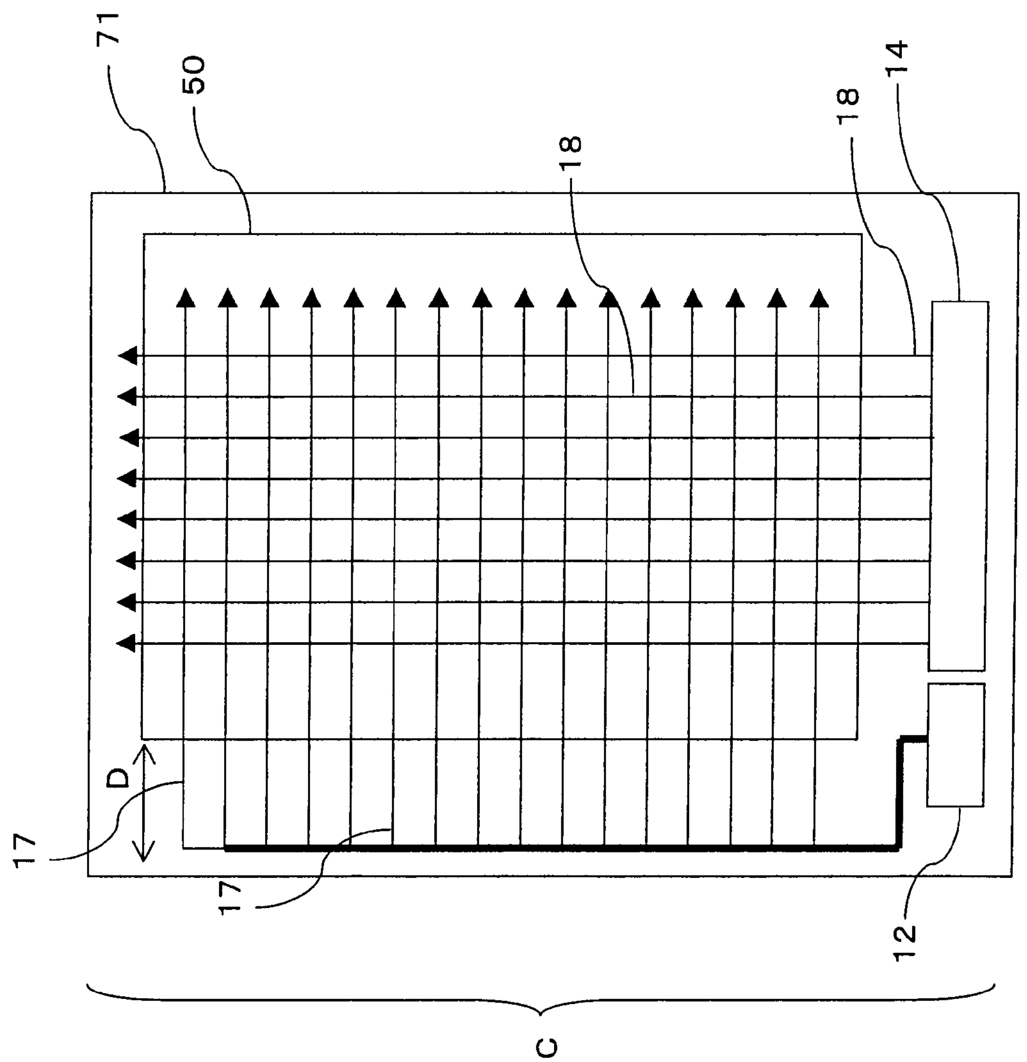
FIG. 9 is a block diagram of a display apparatus according to the present invention.

When the display panel is used for information display apparatus such as a cell phone, it is preferable to mount (form) the source driver IC (circuit) 14 and gate driver IC (circuit) 12 on one side of the display panel as shown in FIG. 9 (incidentally, a configuration in which driver ICs (circuits) are mounted (formed) on one side of a display panel is referred to as a three-side free configuration (structure). Conventionally, the gate driver IC 12 is mounted on an X side of a display area and a source driver IC 14 is mounted on a Y side). This makes it easy in the design to center the center line of a display screen 50 on the display apparatus and mount the driver ICs. Using the three-side free configuration, the gate driver circuit may be produced by high-temperature polysilicon technology, low-temperature polysilicon technology or the like (i.e., at least one of the source driver circuit 14 and gate driver circuit 12 may be formed directly on the board 71 by polysilicon technology).

Incidentally, the three-side free configuration includes not only a configuration in which ICs are placed or formed directly on the board 71, but also a configuration in which a film (TCP, TAB, or other technology) with a source driver IC (circuit) 14 and gate driver IC (circuit) 12 mounted are pasted on one side (or almost one side) of the board 71. That is, the three-side free configuration includes configurations and arrangements in which two sides are left free of ICs and all similar configurations.

If the gate driver circuit 12 is placed beside the source driver circuit 14 as shown in FIG. 9, the gate signal line 17 must be formed along the side c.

Incidentally, the thick solid line in FIG. 9, etc. indicates gate signal lines 17 formed in parallel. Thus, as many gate signal lines 17 as there are scanning signal lines are formed in parallel in part b (bottom of the screen) while a single gate signal line 17 is formed in part a (top of the screen).

Spacing between the gate signal lines 17 formed on the side C is from 5 μm to 12 μm (both inclusive). If it is less than 5 μm, parasitic capacitance will cause noise on adjacent gate signal lines. It has been shown experimentally that parasitic capacitance has significant effects when the spacing is 7 μm or less. Furthermore, when the spacing is less than 5 μm, beating noise and other image noise appear intensely on the display screen. In particular, noise generation differs between the right and left sides of the screen and it is difficult to reduce the beating noise and other image noise. When the spacing exceeds 12 μm, bezel width D of the display panel becomes too large to be practical.

To reduce the image noise, a ground pattern (conductive pattern which has been fixed at a constant voltage or set generally at a stable potential) can be placed under or above the gate signal lines 17. Alternatively, a separate shield plate (shield foil: a conductive pattern which has been fixed at a constant voltage or set generally at a stable potential) may be placed on the gate signal lines 17.

The gate signal lines 17 on the side c in FIG. 9 may be formed, using ITO materials. However, to reduce resistance, preferably they are formed by laminating ITO and thin metal films. Also preferably they are formed of multilayered metal films. When using an ITO laminate, a titanium film is formed on the ITO, and a thin aluminum film or aluminum-molybdenum alloy film is formed on it. Alternatively, a chromium is formed on the ITO. For metal films, thin aluminum films or chromium films are used. This also applies to other examples of the present invention.

Incidentally, although it has been stated with reference to FIG. 9 and the like that the gate signal lines 17 are placed on one side of the display area, this is not restrictive and they may be placed on both sides. For example, the gate signal line 17*a* may be placed (formed) on the right side of the display area 50 while the gate signal line 17*b* may be placed (formed) on the left side of the display area 50. This also applies to other examples.

Also, the source driver IC 14 and gate driver IC 12 may be integrated into a single chip. Then, it suffices to mount only one IC chip on the display panel. This also reduces implementation costs. Furthermore, this makes it possible to simultaneously generate various voltages for use in the single-chip driver IC.

In the configuration shown in FIG. 1 and the like, the EL element 15 is connected to the Vdd potential via the transistor 11*a*. However, there is a problem that organic EL elements constituting different colors vary in drive voltage.
For example, when a current of 0.01 A is delivered per square centimeter, the terminal voltage of the EL elements for blue (B) is 5 V while the terminal voltage of the EL elements for green (G) and red (R) is 9 V. That is, the terminal voltage for B differs from the terminal voltage for G and R. Thus, the source-drain voltage (SD voltage) of the transistor 11*a* for B differs from that for G and R. Consequently, drain-source off-leakage current differs among different colors. If off-leakage current occurs and off-leakage characteristics vary with the color, flickering occurs with color balance disturbed and gamma characteristics deviate in correlation with emitted colors, resulting in complicated display condition.

To deal with this problem, preferably the potential of the cathode electrode for one of at least the RGB colors is different from the potential of the cathode electrode for the other colors. Alternatively, it is preferable that the Vdd potential (anode potential) for one of the RGB colors is different from the Vdd potential for the other colors.

Needless to say, the terminal voltages of the EL elements 15 for R, G, and B are identical whenever possible. Material and structure should be selected in such a way that the terminal voltages of the EL elements for R, G, and B are 10 V or below at least at white peak brightness and in a color temperature range of 7000 K to 12000 K (both inclusive). Also, among R, G, and B, the difference between the maximum terminal voltage and minimum terminal voltage of the EL elements should be 2.5 V or less. For example, if the terminal voltage of the EL elements for R is 7 V when maximum current is passed through the EL elements 15, preferably the terminal voltage of the EL elements 15 for R, G and B should be between 7-2.5 V (minimum) and 7+2.5 V (maximum) both inclusive when maximum current is passed through the EL elements. More preferably, the difference should be 1.5 v or less.

Although it has been stated that pixels are of the three primary colors of R, G, and B, this is not restrictive. They may be of three colors of cyan, yellow, and magenta. They may be of two colors of B and yellow or the like. Of course, they may be monochromatic. Alternatively, they may be of six colors of R, G, B, cyan, yellow, and magenta or of five colors of R, G, B, cyan, and magenta. These are natural colors which provide an expanded color reproduction range, enabling good display. Besides, the pixels may be of four colors of R, G, B, and white. Alternatively, they may be of seven colors of R, G, B, cyan, yellow, magenta, black, and white. It is also possible to form (build) white light-emitting pixels over the entire display area 50 and produce the three primary colors using RGB color filters or the like. Also, a single pixel may be two-colored such as B and yellow. Thus, the EL display apparatus according to the present invention is not limited to those which provide color display using the three primary colors of R, G, and B.

Mainly three methods are available to colorize an organic EL display panel. One of them is a color conversion method. It suffices to form a single layer of blue as a light-emitting layer. The remaining green and red colors needed for full color display can be produced from the blue color through color conversion. Thus, this method has the advantage of eliminating the need to paint the R, G, and B colors separately and prepare organic EL materials for the R, G, and B colors. The color conversion method does not lower yields unlike the multi-color painting method. Any of the three methods can be applied to the EL display panel of the present invention.

Also, in addition to the three primary colors, white light-emitting pixels may be formed. The white light-emitting pixels can be created (formed or constructed) by laminating R, G, and B light-emitting structures. A set of pixels consists of pixels for the three primary colors RGB and a white light-emitting pixel 16. Forming the white light-emitting pixels makes it easier to express peak brightness of white, and thus possible to implement bright image display.

Even when using a set of pixels for the three primary colors RGB, it is preferable to vary pixel electrode areas for the different colors. Of course, an equal area may be used if luminous efficiencies of the different colors as well as color purity are well balanced. However, if one or more colors are poorly balanced, preferably the pixel electrodes (light-emitting areas) are adjusted. The electrode area for each color can be determined based on current density. That is, when white balance is adjusted in a color temperature range of 7000 K (Kelvin) to 12000 K (both inclusive), difference between current densities of different colors should be within ±30%. More preferably, the difference should be within ±15%. For example, if current densities are around 100 A/square meter, all the three primary colors should have a current density of 70 A/square meter to 130 A/square meter (both inclusive). More preferably, all the three primary colors should have a current density of 85 A/square meter to 115 A/square meter (both inclusive).

The organic EL element 15 is a self-luminous element. When light from this self-luminous element enters a transistor serving as a switching element, a photoconductive phenomenon occurs. The photoconductive phenomenon is a phenomenon in which leakage (off-leakage) increases due to photoexcitation when a switching element such as a transistor is off.

To deal with this problem, the present invention forms a shading film under the gate driver circuit 12 (source driver circuit 14 in some cases) and under the pixel transistor 11. The shading film is formed of thin film of metal such as chromium and is from 50 nm to 150 nm thick (both inclusive). A thin film will provide a poor shading effect while a thick film will cause irregularities, making it difficult to pattern the transistor 11A1 in an upper layer.

A smoothing film made of inorganic material, 20 to 100 nm thick (both inclusive), is formed on the light-shielding film. One of the electrodes of the storage capacitance 19 may be formed of this layer of the light-shielding film. In that case, preferably the thickness of the smooth film is minimized to increase the capacitance value of the storage capacitance. It is also possible to form the light-shielding film of aluminum, form a silicon oxide film on the light-shielding film using anodizing technology, and use the silicon oxide film as a dielectric film for the storage capacitance 19. Pixel electrodes of a high aperture (HA) structure are formed on the smoothing film.

In the case of the driver circuit 12 and the like, it is necessary to reduce penetration of light not only from the topside, but also from the underside. This is because the photoconductive phenomenon will cause malfunctions. If cathode electrodes are made of metal films, the present invention also forms a cathode electrode on the surface of the driver 12 and the like and uses it as a shading film.

An antireflection film is formed on a light-emitting surface of the board 71. The antireflection film is formed of thin multilayer film of titanium oxide or magnesium fluoride.

If a cathode electrode is formed on the driver 12, electric fields from the cathode electrode may cause driver malfunctions or place the cathode electrode and driver circuit in electrical contact. To deal with this problem, the present invention forms at least one layer of organic EL film, and preferably two or more layers, on the driver circuit 12 simultaneously with the formation of organic EL film on the pixel electrode. Since the organic EL film is an insulating material, it isolates the cathode and driver from each other when formed on the driver. This solves the above problem.

If a short circuit occurs between terminals of one or more transistors 11 or between a transistor 11 and signal line in the pixel, the EL element 15 may become a bright spot which remains illuminated constantly. The bright spot is visually conspicuous and must be turned into a black spot (turned off). The pixel 16 which corresponds to the bright spot is detected and the capacitor 19 is irradiated with laser light to cause a short circuit across the capacitor. As a result, the capacitor 19 can no longer hold electric charges, and thus the transistor 11*a* can be stopped from passing current. Thus, the pixels irradiated with laser light remain non-illuminated in black display mode.

Incidentally, it is desirable to remove cathode film from those portions which will be irradiated with laser light. This will prevent the terminal electrodes of the capacitor 19 from short-circuiting to the cathode film when the pixels are irradiated with laser light. Thus, where laser repairs will be made, the cathode electrode is patterned with holes in advance.

Flaws in a transistor 11 in the pixel 16 will affect the driver IC 14. For example, if a source-drain (SD) short circuit 562 occurs in the driver transistor 11*a* in FIG. 56, a Vdd voltage of the panel is applied to the source driver IC 14. Thus, preferably the power supply voltage of the source driver IC 14 is kept equal to or higher than the power supply voltage Vdd of the panel (anode voltage). Preferably, the reference voltage used by the source driver IC 14 can be adjusted with an electronic regulator 561.

Figure 56A:
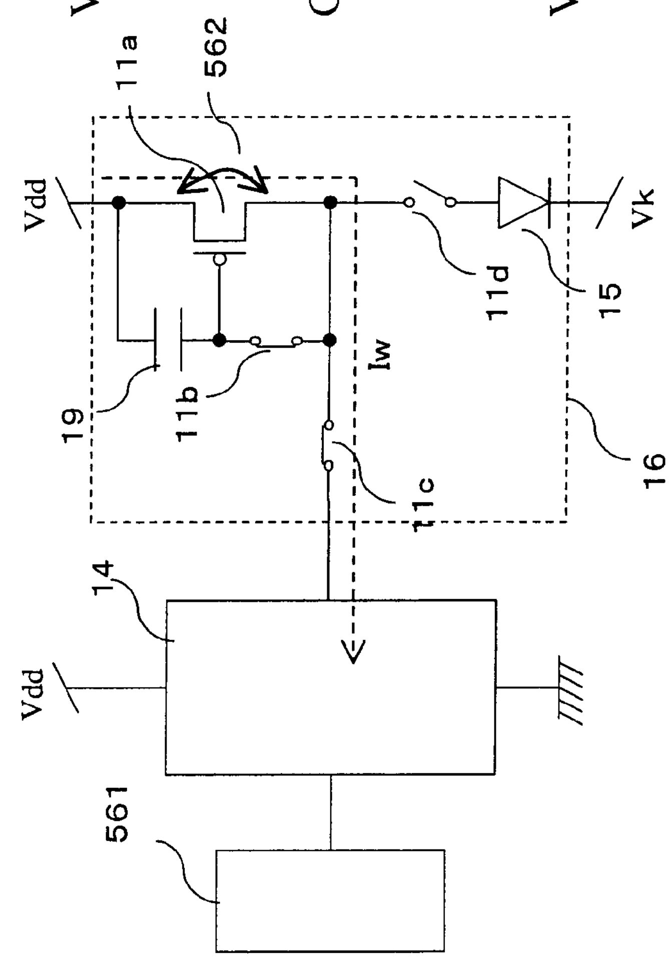
FIG. 56 is an explanatory diagram illustrating a drive method of a display apparatus according to the present invention.
Figure 56:
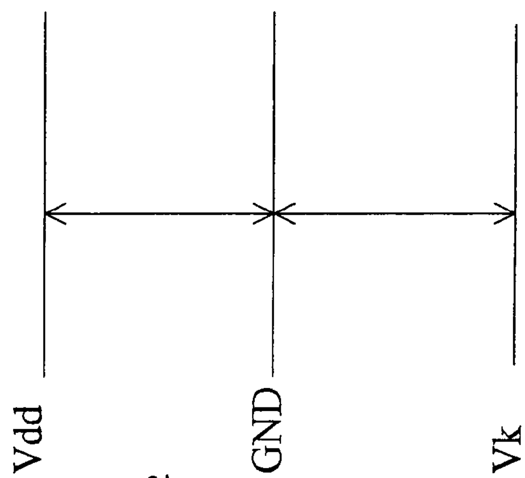

As shown in FIG. 56, if an SD short circuit 562 occurs in the transistor 11*a*, an excessive current flows through the EL element 15. In other words, the EL element 15 remains illuminated constantly (becomes a bright spot). The bright spot is conspicuous as a defect. For example, if a source-drain (SD) short circuit occurs in the transistor 11*a* in FIG. 56, current flows constantly from the Vdd voltage to the EL element 15 (when the transistor 11*d* is on) regardless of the magnitude of gate (G) terminal voltage of the transistor 11*a*. Thus, a bright spot results.

On the other hand, if an SD short circuit occurs in the transistor 11*a* and if the transistor 11*c* is on, the Vdd voltage is applied to the source signal line 18 and to the source driver circuit 14. If the power supply voltage of the source driver circuit 14 is not higher than Vdd, voltage resistance may be exceeded, causing the source driver circuit 14 to rupture.

An SD short circuit of the transistor 11*a* may go beyond a point defect and lead to rupture of the source driver circuit of the panel. Also, the bright spot is conspicuous, which makes the panel defective. Thus, it is necessary to turn the bright spot into a black spot by cutting the wiring which connects between the transistor 11 and EL element 15. For that, the source terminal (S) or drain terminal (D) of the transistor 11*a* are cut by optical means such as laser light or the channel of the transistor 11*a* is destroyed.

Incidentally, although it has been stated in the above example that wiring is cut, this is not restrictive in the case of black display. For example, as also can be seen from FIG. 1, the power supply Vdd of the transistor 11*a* may be always applied to the gate (G) terminal of the transistor 11*a*. For example, if the two electrodes of the capacitor 19 are short-circuited, the Vdd voltage is applied to the gate (G) terminal of the transistor 11*a*. Consequently, the transistor 11*a* is turned off completely, causing the EL elements 15 to stop passing current. This can be accomplished easily because the capacitor electrodes can be short-circuited by irradiating the capacitor 19 with laser light.

Also, since Vdd wiring is actually laid under the pixel electrodes, the display condition of the pixels can be controlled (corrected) by irradiating the Vdd wiring and pixel electrodes with laser light.

For black display of the pixels 16, the EL elements 15 may be degraded. For example, the EL layer 15 is degraded physically or chemically by being irradiated with laser light so that it will not emit light (constant black display). The EL layer 15 can be heated and degraded easily by laser irradiation. The EL layer 15 can be chemically changed easily using an excimer laser.

Incidentally, although the pixel configuration in FIG. 1 is cited in the above example, the present invention is not limited to this. Needless to say, the approach of opening or short-circuiting wiring or electrodes using laser light is also applicable to other current-driven pixel configurations such as current mirrors or to voltage-driven pixel configurations such as those illustrated in FIGS. 62 and 51. Thus, the present invention is not limited by pixel configuration or structure.

A drive method regarding the pixel structure shown in FIG. 1 will be described below. As shown in FIG. 1, the gate signal line 17*a* conducts when the row remains selected (since the transistor 11 in FIG. 1 is a P-channel transistor, the gate signal line 17*a* conducts when it is in low state) and the gate signal line 17*b* conducts when the row remains non-selected.

Parasitic capacitance (not shown) is present in the source signal line 18. The parasitic capacitance is caused by the capacitance at the junction of the source signal line 18 and gate signal line 17, channel capacitance of the transistors 11*b* and 11*c*, etc.

The time t required to change the current value of the source signal line 18 is given by t=C·V/I, where C is stray capacitance, V is a voltage of the source signal line, and I is a current flowing through the source signal line. Thus, if the current value can be increased tenfold, the time required to change the current value can be reduced nearly tenfold. This also means that the current value can be changed to a predetermined value even if the parasitic capacitance of the source signal line 18 is increased tenfold. Thus, to apply a predetermined current value during a short horizontal scanning period, it is useful to increase the current value.

For example, a tenfold increase in the output current from the source driver IC 14 results in a tenfold increase in the current programmed into the pixel 16. This results in a tenfold increase in the emission brightness of the EL element 15 as well. Thus, to obtain predetermined brightness, a light emission period is reduced tenfold by reducing the conduction period (ON time) of the transistor 11*d* in FIG. 1 tenfold compared to a conventional conduction period.

Thus, in order to charge and discharge the parasitic capacitance of the source signal line 18 sufficiently and program a predetermined current value into the transistor 11*a* of the pixel 16, it is necessary to output a relatively large current from the source driver circuit 14. However, when such a large current is passed through the source signal line 18, its large current value is programmed into the pixel and a current larger than the predetermined current flows through the EL element 15. For example, if a 10 times larger current is programmed, naturally a 10 times larger current flows through the EL element 15 and the EL element 15 emits 10 times brighter light. To obtain predetermined emission brightness, the time during which the current flows through the EL element 15 can be reduced tenfold. This way, the parasitic capacitance can be charged/discharged sufficiently from the source signal line 18 and the predetermined emission brightness can be obtained.

Incidentally, although it has been stated that a 10 times larger current value is written into the pixel transistor 11*a* (more precisely, the terminal voltage of the capacitor 19 is set) and that the conduction period of the EL element 15 is reduced to 1/10, this is only exemplary. As another example, ten times larger current may be written into the pixel transistor 11*a* and the ON time of the EL element 15 may be reduced to 1/5. On the contrary, a 10 times larger current value may be written into the pixel transistor 11*a* and the conduction period of the EL element 15 may be reduced to 1/2.

It is also possible to set the ON time to 1/1 (keep the transistor 11*d* on) for bright image display and set the ON time to 1/10 (turn on the transistor 11*d* for 1/10 of a frame period) for dark image display. Also, the display may be changed in real time based on image display data.

The present invention is characterized in that the write current into a pixel is set at a value other than a predetermined value and that a current is passed through the EL element 15 intermittently. For ease of explanation, it has been stated herein that an N times larger current is written into the pixel transistor 11 and the conduction period of the EL element 15 is reduced to 1/N. However, this is not restrictive. Needless to say, N1 times larger current may be written into the pixel transistor 11 and the conduction period of the EL element 15 may be reduced to 1/N2 (N1 and N2 are different from each other).

Incidentally, the term "intermittently" does not mean that the panel drive method according to the present invention always uses intermit display. A 1/1 display (other than intermittent display) may be used depending on image display condition. That is, with the drive method according to the present invention, image display occasionally involves intermit display. Intermittent display is a display mode in which at least two horizontal scanning periods (2 Hs) occur in one frame period.

Incidentally, regarding intermittent display, intermittent periods are not necessarily spaced equally. For example, they may appear at random (provided that the display period or non-display period makes up a predetermined value (constant ratio) as a whole). Also, display periods may vary among R, G, and B. For example, R pixels may be driven in non-display mode for 1/3 of one frame period and G and B pixels may be driven in non-display mode for 1/4 of one frame period. That is, during an intermittent period, display periods of R, G, and B or non-display period can be adjusted to a predetermined value (constant ratio) in such a way as to obtain an optimum white balance.

To facilitate explanation, it is assumed that "1/N" means reducing 1 F (one field or one frame) to 1/N. However, it takes time to select one pixel row and to program current values (normally, one horizontal scanning period (1 H)) and error may result depending on scanning conditions. Thus, what has been described above is strictly for ease of explanation and is not meant to be restrictive. Also, N is not limited to integers and may be non-integers such as 3.5. For ease of explanation, it is assumed herein that N represents integers unless otherwise stated.

The EL element 15 may be illuminated for 1/5 of a period by programming the pixel 16 with an N=10 times larger current. The EL element 15 illuminates 10/5=2 times more brightly. On the contrary, it is also possible to program an N=2 times larger current into the pixel 16 and illuminate the EL element 15 for 1/4 of the period. The EL element 15 illuminates 2/4=0.5 time more brightly. In short, the present invention achieves display other than constant display (1/1, i.e., non-intermittent drive) by using a current other than an N=1 time current for current programming. Also, in a broad sense, the drive system turns off the current supplied to the EL element 15, at least once during one frame (or one field) period. Also, the drive system at least achieves intermittent display by programming the pixel 16 with a current larger than a predetermined value.

A problem with an organic (inorganic) EL display is that it uses a display method basically different from that of an CRT or other display which presents an image as a set of displayed lines using an electron gun. That is, the EL display holds the current (voltage) written into a pixel for 1 F (one field or one frame) period. Thus, a problem is that displaying moving pictures will result in blurred edges.

According to the present invention, current is passed through the EL element 15 only for a period of 1 F/N, but current is not passed during the remaining period (1 F (N−1)/N). Let us consider a situation in which the drive system is implemented and one point on the screen is observed.

In this display condition, image data display and black display (non-illumination) are repeated every 1 F. That is, image data is displayed intermittently (intermittent display) in the temporal sense. When moving picture data are displayed intermittently, a good display condition is achieved without edge blur. In short, movie display close to that of a CRT can be achieved. Although the present invention implements intermittent display, the main clock of the circuit does not differ from conventional ones. Thus, there is no increase in the power consumption of the circuit.

In the case of liquid crystal display panels, image data (voltage) to be subjected to light modulation is held in a liquid crystal layer. Therefore, for black insertion display, the data applied to the liquid crystal layer must be rewritten. For that, the operation clock of the source driver IC 14 must be speeded up and the image data and black display data must be applied alternately to the source signal lines 18.

Thus, to achieve black insertion (intermittent display such as black display), it is necessary to speed up the main clock of the circuit. Also, an image memory is needed in order to elongate a time axis.

In the pixel configurations of the EL display panel according to the present invention shown in FIGS. 1, 2, 38, etc., image data is held in the capacitor 19. Current which corresponds to the terminal voltage of the capacitor 19 is passed through the EL element 15. Thus, the image data is not held in a light modulating layer unlike in the case of liquid crystal display panels.

The present invention controls the current passed through the EL element 15 by simply turning on and off the switching transistor 11*d*, the transistor 11*e*, and the like. That is, even if the current Iw flowing through the EL element 15 is turned off, the image data is held as it is in the capacitor 19. Thus, when the switching element 11*d* is turned on the next time, the current passed through the EL element 15 has the same value as the current flowing through the EL element 15 the previous time. Even to achieve black insertion (intermittent display such as black display), the present invention does not need to speed up the main clock of the circuit. Also, it does not need to elongate a time axis, and thus requires no image memory. Besides, the EL element 15 responds quickly, requiring a short time from application of current to light emission. Thus, the present invention is suitable for movie display, and by using intermittent display, it can solve a problem with conventional data-holding display panels (liquid crystal display panels, EL display panels, etc.) in displaying moving pictures.

Furthermore, in the case of a large display apparatus with a large source capacity, source current can be increased more than tenfold. Generally, if the source current value is increased N times, the conduction period of the gate signal line 17*b* (the transistor 11*d*) can be set to 1 F/N. This makes it possible to apply the present invention to television sets as well as to display apparatus for monitoring.

The drive method according to the present invention will be described with reference to drawings in more detail below. The parasitic capacitance of the source signal line 18 is generated by the coupling capacitance with adjacent source signal lines 18, buffer output capacitance of the source driver IC (circuit) 14, cross capacitance between the source signal line 18 and gate signal line 17, etc. This parasitic capacitance is normally 10 pF or larger. In the case of voltage driving, since voltage is applied to the source signal line 18 from the source driver IC 14 at low impedance, more or less large parasitic capacitance does not disturb driving.

However, in the case of current driving, especially image display at the black level, the pixel capacitor 19 needs to be programmed with a minute current of 20 nA or less. Thus, if parasitic capacitance larger than a predetermined value is generated, the parasitic capacitance cannot be charged and discharged during the time when one pixel row is programmed (normally within 1 H, but not limited to 1 H because two pixel rows may be programmed simultaneously). If the parasitic capacitance cannot be charged and discharged within a period of 1 H, sufficient current cannot be written into the pixel, resulting in inadequate resolution.

In the pixel configuration in FIG. 1, the programming current Iw flows through the source signal line 18 during current programming as shown in FIG. 3(*a*). The current Iw flows through the transistor 11*a* and voltage is set (programmed) in the capacitor 19 in such a way as to maintain the current Iw. At this time, the transistor 11*d* is open (off).

During a period when the current flows through the EL element 15, the transistors 11*c* and 11*b* turn off and the transistor 11*d* turns on as shown in FIG. 3(*b*). Specifically, a turn-off voltage (Vgh) is applied to the gate signal line 17*a*, turning off the transistors 11*b* and 11*c*. On the other hand, a turn-on voltage (Vgl) is applied to the gate signal line 17*b*, turning on the transistor 11*d*.

Figure 12:
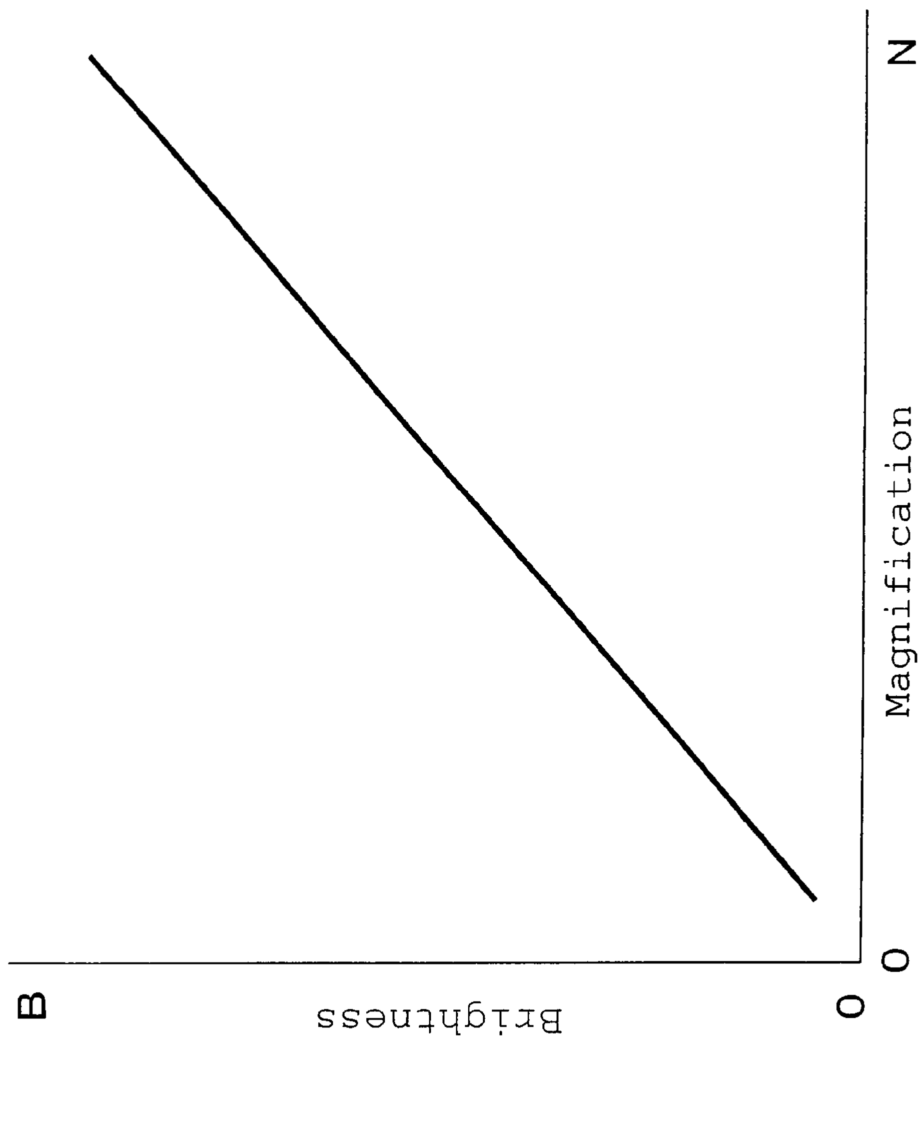
FIG. 12 is an explanatory diagram illustrating a display panel according to the present invention.

Suppose a current I1 is N times the current which should normally flow (a predetermined value), the current flowing through the EL element 15 in FIG. 3(*b*) is also Iw. Thus, the EL element 15 emits light 10 times more brightly that a predetermined value. In other words, as shown in FIG. 12, the larger the magnification N, the higher the display brightness B of the display panel. Thus, the magnification N and the brightness are proportional to each other. Conversely, if the current is reduced to 1/N, the brightness is inversely proportional to the magnification.

If the transistor 11*d* is kept on for a period 1/N the period during which it is normally kept on (approximately 1 F) and is kept off during the remaining period (N−1)/N, the average brightness over the 1 F equals predetermined brightness. This display condition closely resembles the display condition under which a CRT is scanning a screen with an electronic gun. The difference is that the area where images are displayed is 1/N of the entire screen which illuminates (where the entire screen is taken as 1) (in a CRT, what illuminates is one pixel row—more precisely, one pixel).

Figures 13, 13A:
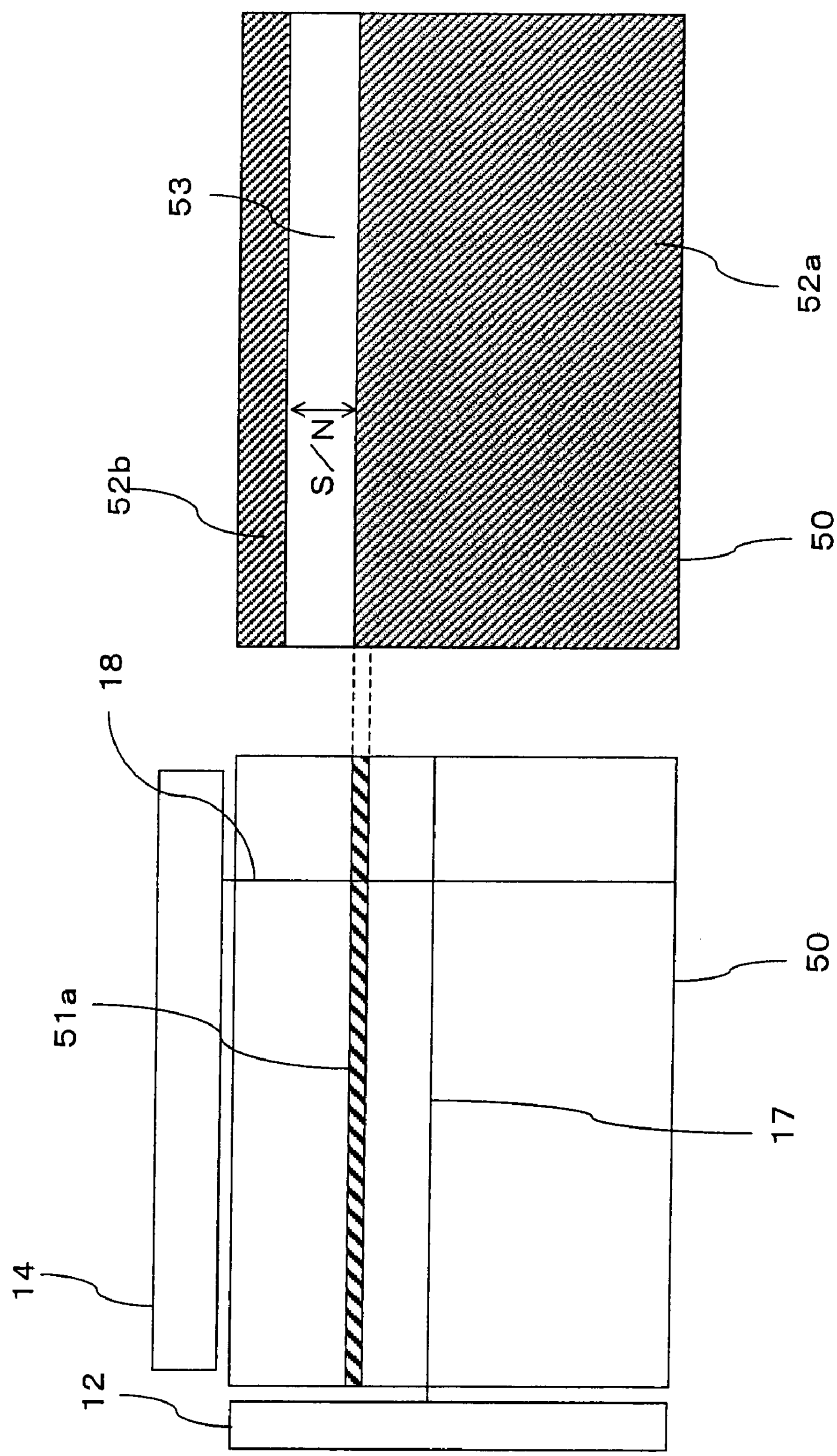
FIG. 13 is an explanatory diagram illustrating a drive method of a display apparatus according to the present invention.

According to the present invention, 1 F/N of the image display area 53 moves from top to bottom of the screen 50 as shown in FIG. 13(*b*). According to the present invention, current flows through the EL element 15 only for the period of 1 F/N, but current does not flow during the remaining period (1 F·(N−1)/N). Thus, the pixel is displayed intermittently. However, due to an afterimage, the entire screen appears to be displayed uniformly to the human eye.

Incidentally, as shown in FIG. 13, the write pixel row 51*a* is non-illuminated 52*a*. However, this is true only to the pixel configurations in FIGS. 1, 2, etc. In the pixel configuration of a current mirror shown in FIG. 38, etc., the write pixel row 51*a* may be illuminated. However, description will be given herein citing mainly the pixel configuration in FIG. 1 for ease of explanation. A drive method which involves driving a pixel intermittently by programming it with a current larger than the predetermined drive current Iw shown in FIGS. 13, 16, etc, is referred to as N-fold pulse driving.

In this display condition, image data display and black display (non-illumination) are repeated every 1 F. That is, image data is displayed at intervals (intermittently) in the temporal sense. Liquid crystal display panels (EL display panels other than that of the present invention), which hold data in pixels for a period of 1 F, cannot keep up with changes in image data during movie display, resulting is blurred moving pictures (edge blur of images). Since the present invention displays images intermittently, it can achieve a good display condition without edge blur of images. In short, movie display close to that of a CRT can be achieved.

Figure 14:
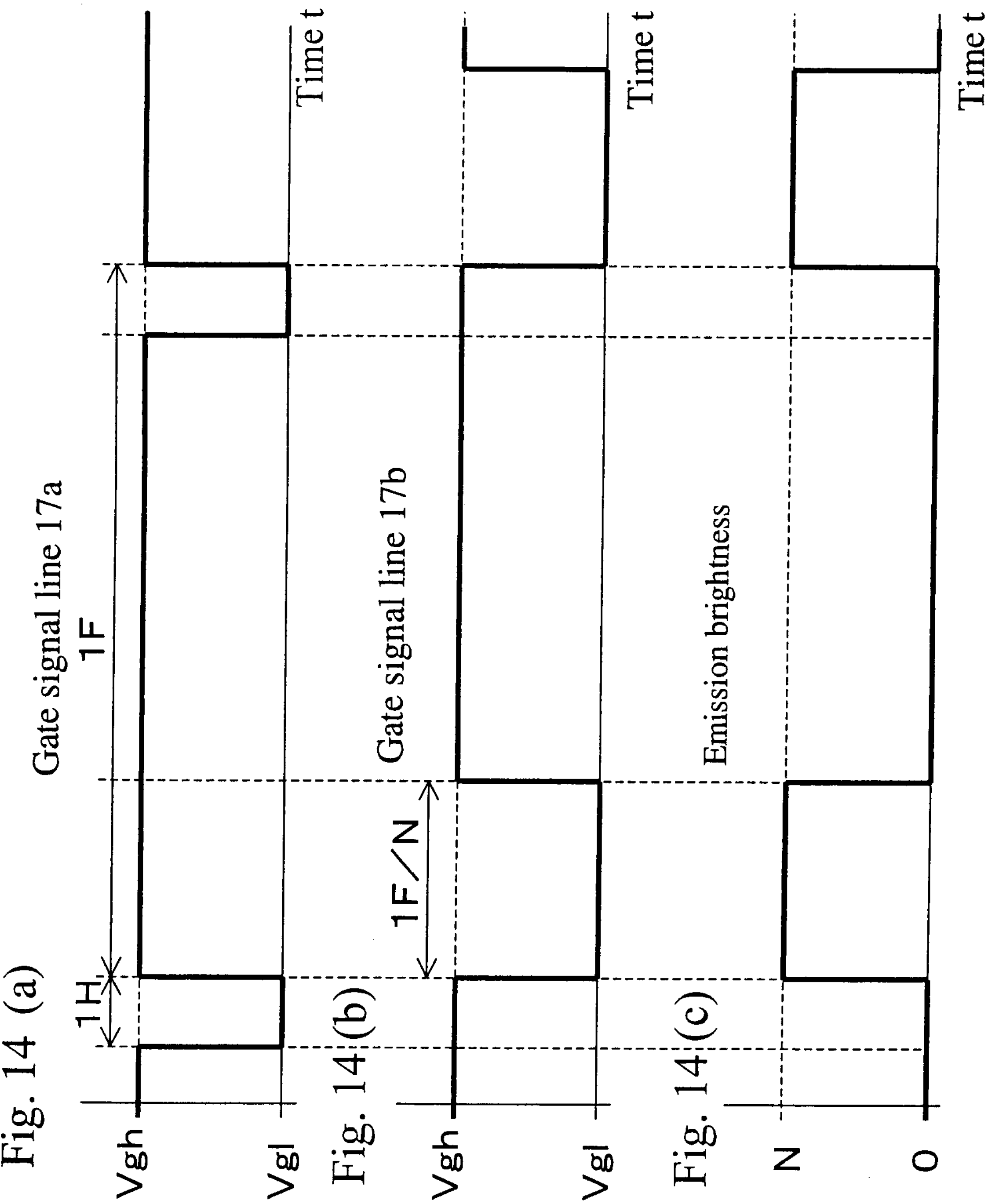
FIG. 14 is an explanatory diagram illustrating a drive method of a display apparatus according to the present invention.

A timing chart is illustrated in FIG. 14. The pixel configuration referred to in the present invention and the like is the one shown in FIG. 1 unless otherwise stated. However, needless to say, since the pixel configurations in FIGS. 38, 63, 64, 65, etc. can also achieve intermittent display, the present invention is not limited to FIG. 1.

As can be seen from FIG. 14, in each selected pixel row (the selection period is designated as 1 H), when a turn-on voltage (Vgl) is applied to the gate signal line 17*a* (see FIG. 14(*a*)), a turn-off voltage (Vgh) is applied to the gate signal line 17*b* (see FIG. 14(*b*)). During this period, current does not flow through the EL element 15 (non-illumination mode). In a non-selected pixel row, a turn-on voltage (Vgl) is applied to the gate signal line 17*b* and a turn-off voltage (Vgh) is applied to the gate signal line 17*a*. During this period, current flows through the EL element 15 (illumination mode). In the illumination mode, the EL element 15 illuminates at a brightness (N·B) N times the predetermined brightness and the illumination period is 1 F/N. Thus, the average display brightness of the display panel over 1 F is given by (N·B)×(1/N)=B (the predetermined brightness).

Incidentally, although the above description seemingly concerns white display, the brightness is reduced to 1/10 in black display as well. Thus, even if excessive brightness develops in image display, it is also reduced to 1/10, resulting in a proper image display.

Figure 15:
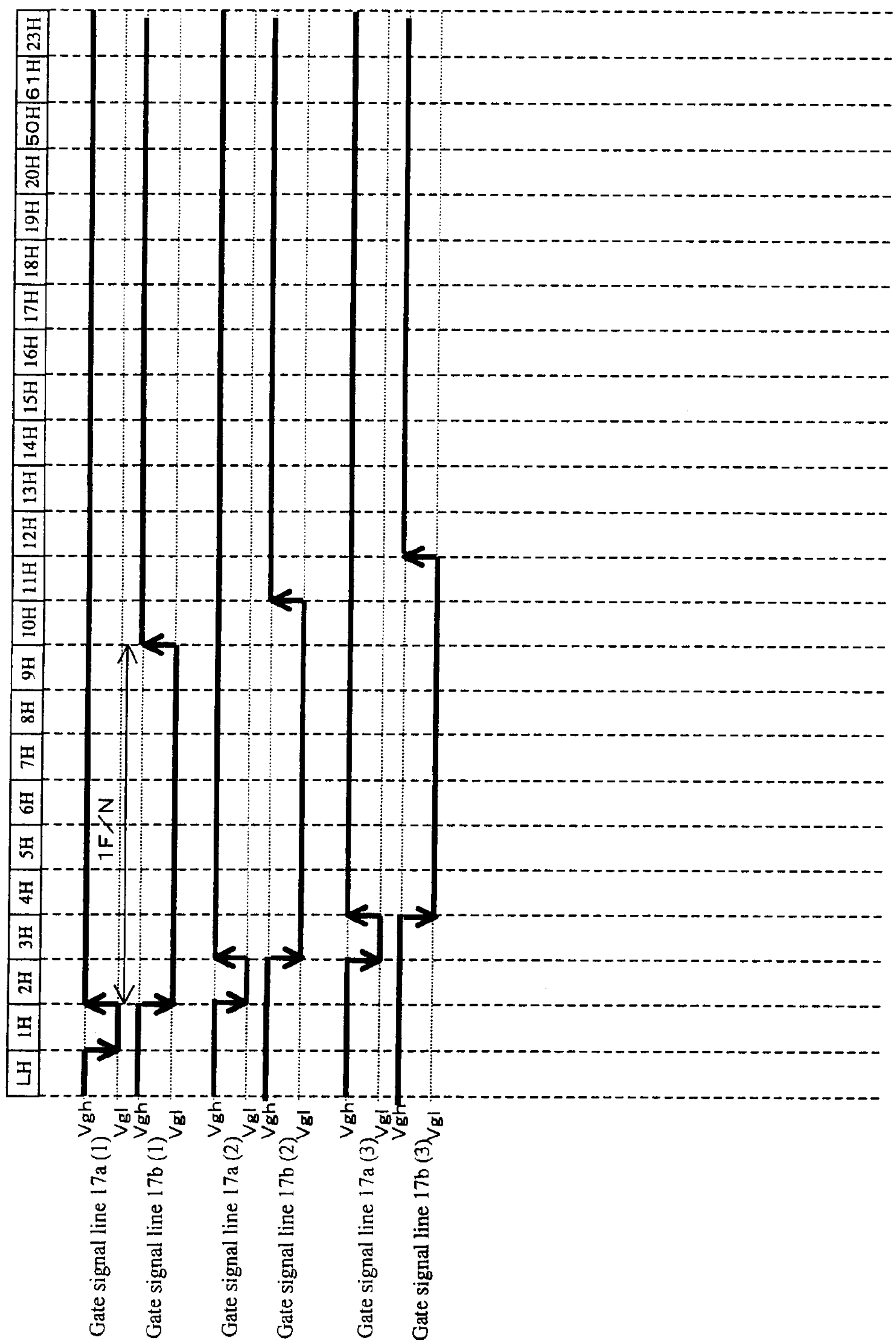
FIG. 15 is an explanatory diagram illustrating a drive method of a display apparatus according to the present invention.

FIG. 15 shows an example in which the operation in FIG. 14 is applied to each pixel row (it illustrates signal waveforms of the gate signal lines 17*a* and 17*b* for pixels). The turn-off voltage of gate signal line is denoted by Vgh (high level) while waveforms of the turn-on voltage are denoted by Vgl (low level). The subscripts such as (1) and (2) indicate selected pixel row numbers.

In FIG. 15, a gate signal line 17*a*(1) is selected (Vgl voltage) and a programming current flows through the source signal line 18 in the direction from the transistor 11*a* in the selected pixel row to the source driver circuit 14. Incidentally, the direction in which the programming current flows varies with the pixel configuration. If the driver transistor 11*a* of the pixel 16 is a p-channel transistor, the programming current Iw flows form the pixel 16 to the source driver circuit 14. If the driver transistor 11*a* of the pixel 16 is an n-channel transistor, the programming current Iw flows form the source driver circuit 16 to the pixel 14.

The programming current is N times larger than a predetermined value (for ease of explanation, it is assumed that N=10. Of course, since the predetermined value is a data current for use to display images, it is not a fixed value unless in the case of white raster display). The magnitude of the current programmed into each pixel 16 varies with the display condition of natural images. Therefore, the capacitor 19 is programmed so that a 10 times larger current will flow through the transistor 11*a*. When the pixel row (1) is selected, in the pixel configuration shown in FIG. 1, a turn-off voltage (Vgh) is applied to the gate signal line 17*b*(1) and current does not flow through the EL element 15.

After 1 H, a gate signal line 17*a*(2) is selected (Vgl voltage) and a programming current flows through the source signal line 18 in the direction from the transistor 11*a* in the selected pixel row to the source driver circuit 14. The programming current is N times larger than a predetermined value (for ease of explanation, it is assumed that N=10). Therefore, the capacitor 19 is programmed so that 10 times larger current will flow through the transistor 11*a*.

When the pixel row (2) is selected, in the pixel configuration shown in FIG. 1, a turn-off voltage (Vgh) is applied to the gate signal line 17*b*(2) and current does not flow through the EL element 15. However, since a turn-off voltage (Vgh) is applied to the gate signal line 17*a*(1) and a turn-on voltage (Vgl) is applied to the gate signal line 17*b*(1) of the pixel row (1), the EL element 15 illuminates.

After the next 1 H, a gate signal line 17*a*(3) is selected, a turn-off voltage (Vgh) is applied to the gate signal line 17*b*(3), and current does not flow through the EL element 15 in the pixel row (3). However, since a turn-off voltage (Vgh) is applied to the gate signal lines 17*a*(1) and (2) and a turn-on voltage (Vgl) is applied to the gate signal lines 17*b*(1) and (2) in the pixel rows (1) and (2), the EL element 15 illuminates.

Through the above operation, images are displayed in sync with a synchronization signal of 1 H. However, with the drive method in FIG. 15, a 10 times larger current flows through the EL element 15. Thus, the display screen 50 is 10 times brighter. Of course, it goes without saying that for display at a predetermined brightness in this state, the programming current can be reduced to 1/10 (by controlling the programming current rather than reducing the intermittent period to 1/10). However, a 10 times smaller current will cause a shortage of write current due to parasitic capacitance and the like. To solve this problem, the basic idea of the present invention is to use an N times larger current for programming, insert a black screen 52 (intermittent display), and thereby obtain a predetermined brightness.

Incidentally, the drive method according to the present invention causes a current larger than a predetermined current to flow through the EL element 15, and thereby charges and discharges the parasitic capacitance of the source signal line 18 sufficiently. That is, there is no need to pass an N times larger current through the EL element 15. For example, it is conceivable to form a current path in parallel with the EL element 15 (form a dummy EL element and use a shield film to prevent the dummy EL element from emitting light) and divide the flow of current between the EL element 15 and the dummy EL element.

For example, when a signal current is 0.2 μA, a programming current is set to 2.2 μA and the current of 2.2 μA is passed through the transistor 11*a*. Then, the signal current of 0.2 μA may be passed through the EL element 15 and 2 μA may be passed through the dummy EL element, for example (see FIG. 136). That is, the dummy pixel row 281 in FIG. 27 remains selected constantly. Incidentally, the dummy pixel row is either kept from emitting light or hidden from view by a shield film or the like even if it emits light.

With the above configuration, by increasing the current passed through the source signal line 18 N times, it is possible to pass an N times larger current through the driver transistor 11*a* and pass a current sufficiently smaller than the N times larger current through the EL element 15. As shown in FIG. 5, this method allows the entire display area 50 to be used as the image display area 53 without a non-display area 52.

FIG. 13(*a*) shows writing into the display image 50. In FIG. 13(*a*), reference numeral 51*a* denotes a write pixel row. A programming current is supplied to the source signal line 18 from the source driver IC 14. In FIG. 13 and the like, there is one pixel row into which current is written during a period of 1 H, but this is not restrictive. The period may be 0.5H or 2 Hs.

Also, although it has been stated that a programming current is written into the source signal line 18, the present invention is not limited to current programming. The present invention may also use voltage programming (FIG. 62, etc.) which writes voltage into the source signal line 18. For example, a possible voltage drive method programs pixels 16 by applying a voltage higher than needed for a predetermined brightness to the source signal lines 18 and then obtains the predetermined brightness using intermittent display.

In FIG. 13(*a*), when the gate signal line 17*a* is selected, the current to be passed through the source signal line 18 is programmed into the transistor 11*a*. At this time, a turn-off voltage is applied to the gate signal line 17*b*, and current does not flow through the EL element 15. This is because when the transistor 11*d* is on on the EL element 15, a capacitance component of the EL element 15 is visible from the source signal line 18 and the capacitance prevents sufficient current from being programmed into the capacitor 19. Thus, to take the configuration shown in FIG. 1 as an example, the pixel row into which current is written is a non-illuminated area 52 as shown in FIG. 13(*b*).

Suppose an N times larger current is used for programming (it is assumed that N=10 as described above), the screen becomes 10 times brighter. Thus, 90% of the display area 50 can be constituted of the non-illuminated area 52. Thus, for example, if the number of horizontal scanning lines in the screen display area is 220 (S=220) in compliance with QCIF, 22 horizontal scanning lines can compose a display area 53 while 220−22=198 horizontal scanning lines can compose a non-display area 52. Generally speaking, if the number of horizontal scanning lines (number of pixel rows) is denoted by S, S/N of the entire area constitutes a display area 53, which is illuminated N times more brightly. Then, the display area 53 is scanned in the vertical direction of the screen. Thus, S(N−1)/N of the entire area is a non-illuminated area 52. The non-illuminated area presents a black display (is non-luminous). Also, the non-luminous area 52 is produced by turning off the transistor 11*d*. Incidentally, although it has been stated that the display area 53 is illuminated N times more brightly, naturally the display area 53 is adjusted to the value of N by brightness adjustment and gamma adjustment.

In the above example, if a 10 times larger current is used for programming, the screen becomes 10 times brighter and 90% of the display area 50 can be constituted of the non-illuminated area 52. However, this does not necessarily mean that R, G, and B pixels constitute the non-illuminated area 52 in the same proportion. For example, ⅛ of the R pixels, ⅙ of the G pixels, and 1/10 of the B pixels may constitute the non-illuminated area 52 with different colors making up different proportions.

It is possible to allow the non-illuminated area 52 (or illuminated area 53) to be adjusted separately among R, G, and B. For that, it is necessary to provide separate gate signal lines 17*b* for R, G, and B. However, allowing R, G, and B to be adjusted separately makes it possible to adjust white balance, making it easy to adjust color balance for each gradation (see FIG. 41).

As shown in FIG. 13(*b*), pixel rows including the write pixel row 51*a* compose a non-illuminated area 52 while an area of S/N (1 F/N in the temporal sense) above the write pixel row 51*a* compose a display area 53 (when write scans are performed from top to bottom of the screen. When the screen is scanned from bottom to top, the areas change places). Regarding the display condition of the screen, a strip of the display area 53 moves from top to bottom of the screen.

In FIG. 13, one display area 53 moves from top to bottom of the screen. At a low frame rate, the movement of the display area 53 is recognized visually. It tends to be recognized easily especially when a user closes his/her eyes or moves his/her head up and down.

Figure 16:
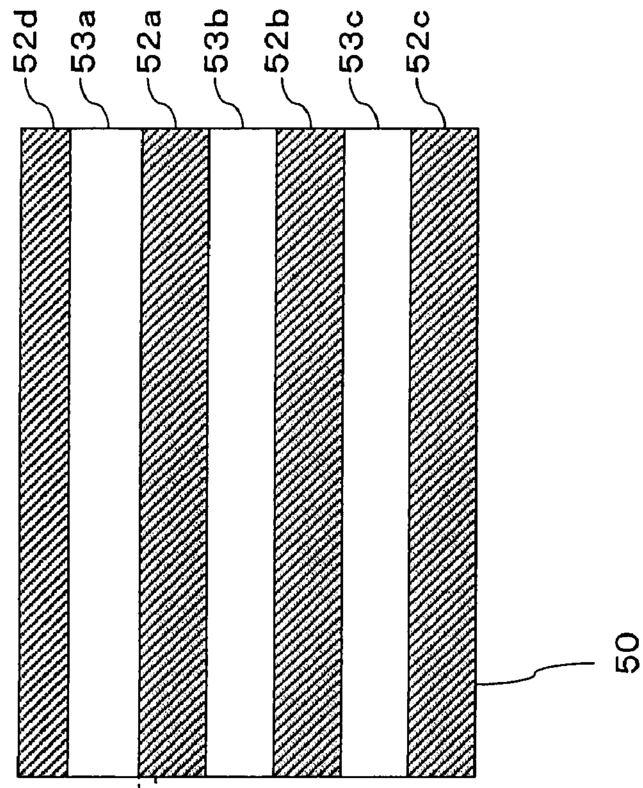
FIG. 16 is an explanatory diagram illustrating a drive method of a display apparatus according to the present invention.
Figure 16A:
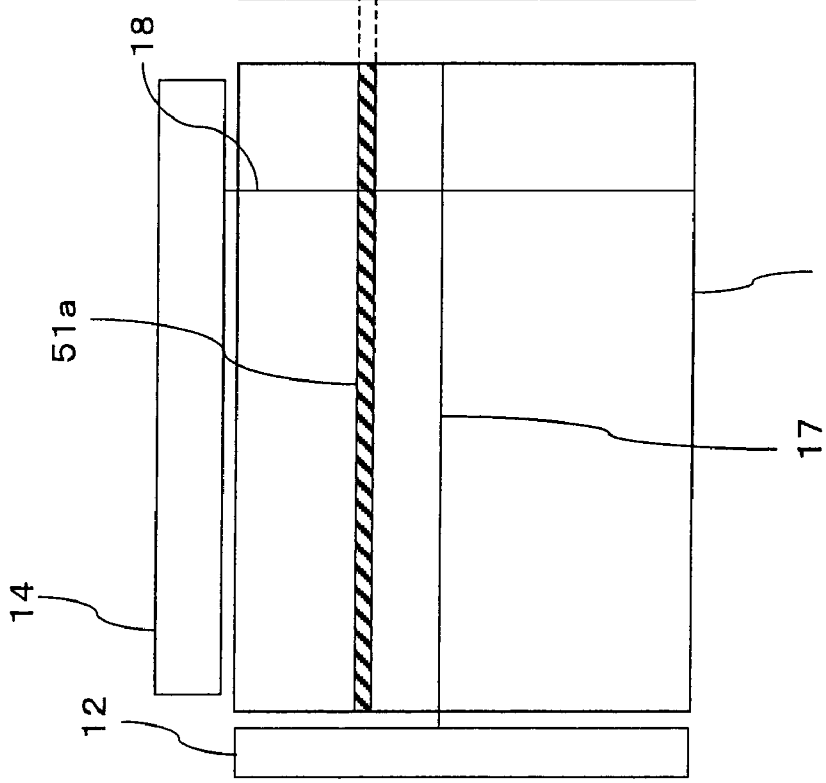

To deal with this problem, the display area 53 can be divided into a plurality of parts as shown in FIG. 16. If the total area of the divided display area is S(N−1)/N, the brightness is equal to the brightness in FIG. 13 (where, S is an effective display area 50 of the display panel). Incidentally, there is no need to divide the display area 53 equally. For example, the display area may be divided into a display area 53*a* with an area of 1, display area 53*b* with an area of 2, display area 53*c* with an area of 1, and display area 53*d* with an area of 4. Also, the divided display areas do not need to be exactly equal in size to divided non-display areas 52.

Needless to say, it is also possible to make the average size of the display area 53 over a few frames (fields) equal to a target size. For example, to make the size of the display area 53 equal to S/10, a possible drive method involves setting the size of the display area 53 to S/10 in the first frame (field), setting the size of the display area 53 to S/20 in the second frame (field), setting the size of the display area 53 to S/20 in the third frame (field), and setting the size of the display area 53 to S/5 in the fourth frame (field) to obtain the desired display area (display brightness) of S/10 when averaged over the four frames (fields). Also, the average display area over a few frames (fields) may be made equal among the RGB colors for a period of L. However, preferably, the few frames (fields) as referred to above do not exceed four frames (fields). Otherwise, flickering may occur depending on displayed images.

Incidentally, one frame or one field as referred to herein may be regarded to be synonymous with an image refresh period of the pixels 16 or the period required for the screen 50 to be scanned from top to bottom (from bottom to top).

Also, the average display area over a few frames (fields) may be made different among the RGB colors for a period of L to achieve an appropriate white balance. This drive method is effective especially when emission efficiency varies among R, G, and B. Also, the number K of divisions may be varied among R, G, and B. G, in particular, is visually conspicuous, and thus it is useful to increase the number of divisions of G over R and B.

Incidentally, it has been stated in the above example for ease of explanation that the display area 53 is divided. However, dividing an area is tantamount to dividing a period (time). Thus, in FIG. 1, since the ON time of the transistor 11*d* is divided, dividing an area is tantamount to dividing a period (time).

Dividing the display area 53 reduces flickering of the screen. Thus, a flicker-free good image display can be achieved. Incidentally, the display area 53 may be divided more finely. However, the more finely the display area 53 is divided, the poorer the movie display performance becomes. Also, the frame rate of image display can be lowered, resulting in reduced power consumption. For example, if the non-display area 52 is undivided, flickering occurs when the frame rate falls below 45 Hz. However, if the non-display area 52 is divided into six or more parts, flickering does not occur until the frame rate falls below 20 Hz.

Figures 17A, 17B, 17C:
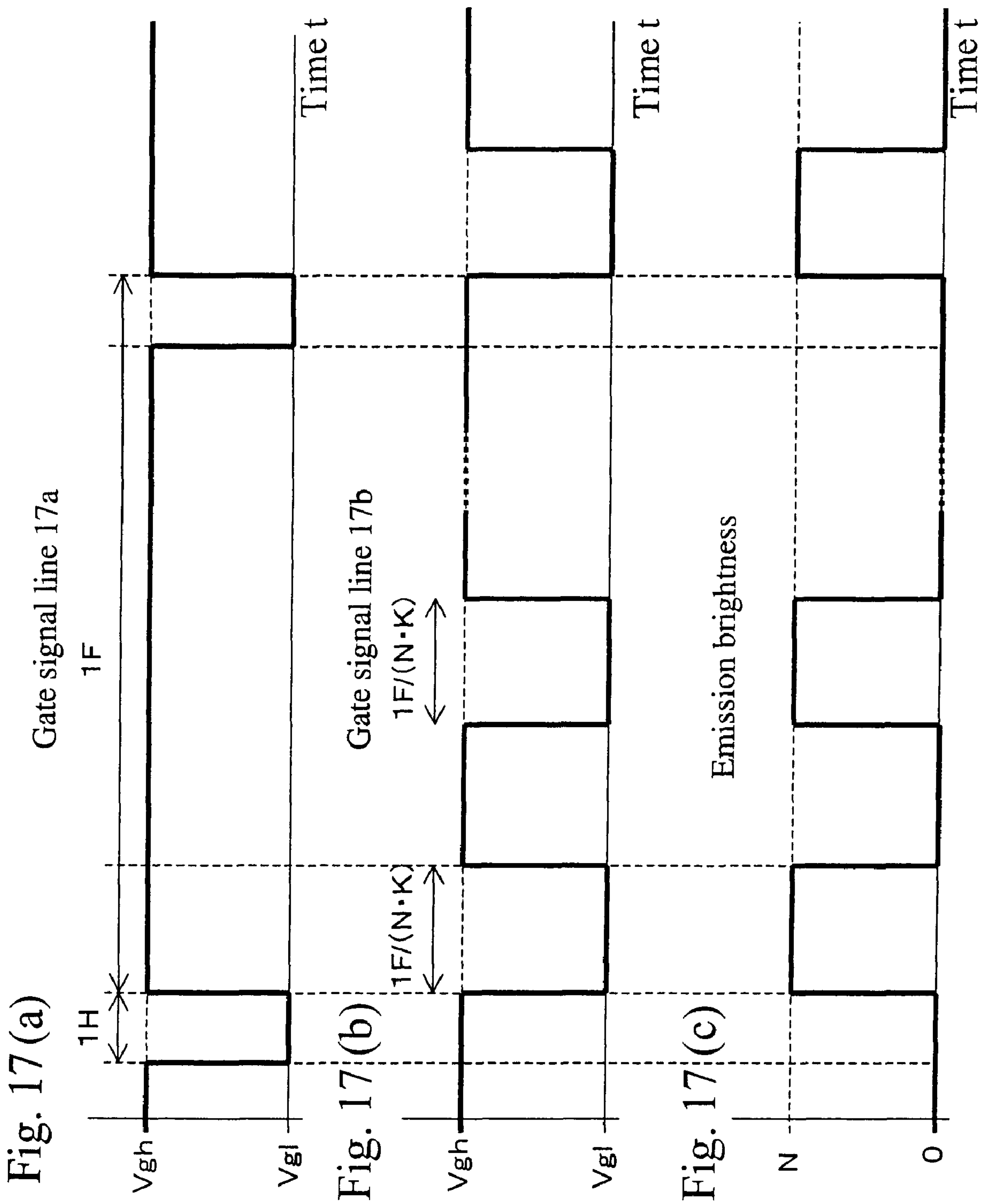
FIG. 17 is an explanatory diagram illustrating a drive method of a display apparatus according to the present invention.

FIG. 17 shows voltage waveforms of gate signal lines 17 and emission brightness of the EL element. As can be seen from FIG. 17, a period (1 F/N) during which the gate signal line 17*b* is set to Vgl is divided into a plurality of parts (K parts). That is, a period of 1 F/(K·N) during which the gate signal line 17*b* is set to Vgl repeats K times. If the period of 1 F/(K*N) is repeated K times, the total of illumination periods 53 is 1 F/N. This reduces flickering and implements image display at a low frame rate.

Preferably, the number of divisions is variable. For example, when the user presses a brightness adjustment switch or turns a brightness adjustment knob, the value of K may be changed in response. Also, the user may be allowed to adjust brightness. Alternatively, the value of K may be changed manually or automatically depending on images or data to be displayed.

Also, the number of divisions may be changed according to condition of image data. If the image data is moving pictures, by leaving the non-illuminated area 52 undivided, it is possible to avoid blurred moving pictures. In the case of moving pictures, since images change constantly, flickering does not occur even if the frame rate is lowered. If the image data is still pictures, by dividing the non-illuminated area 52 into multiple parts, it is possible to avoid flickering even at a low frame rate. Thus, by judging in real time whether the image data is moving pictures or still pictures and controlling the number of divisions of the non-illuminated area 52 based on the result of judgment, it is possible to achieve high quality display without blurred moving pictures at low power consumption.

If the timing of a change from a state in which a turn-on voltage (Vgl) is applied to the gate signal line 17*a* to a state in which a turn-off voltage (Vgh) is applied coincides with the timing of a change from a state in which a turn-off voltage (Vgh) is applied to the gate signal line 17*b* to a state in which a turn-on voltage (Vgl) is applied, variations tend to occur in retained images. This is believed to be due to discharge or leakage of the voltage programmed in the capacitor 19, which in turn is caused by difference in on/off timing of the transistors 11*b* and 11*d* depending on their characteristics.

Figures 66, 66A:
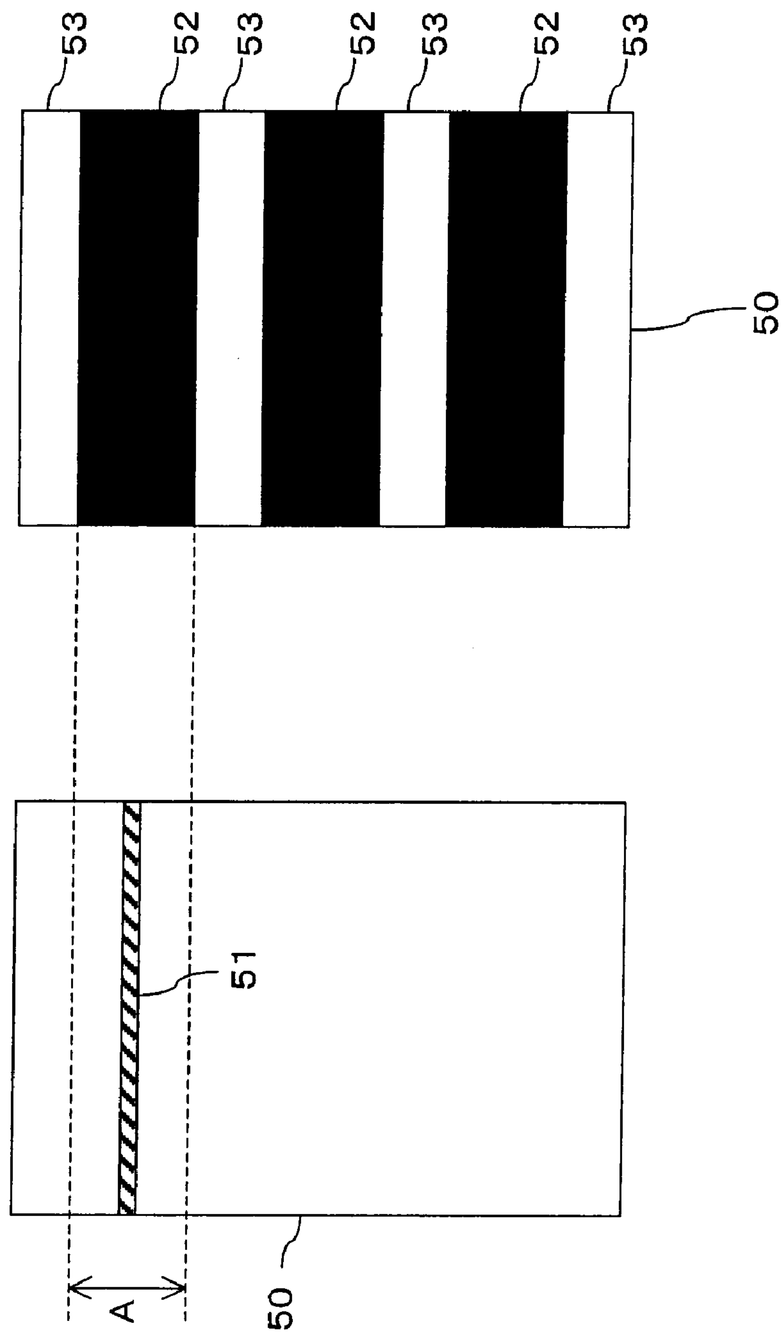
FIG. 66 is an explanatory diagram illustrating a drive method of a display apparatus according to the present invention.

To deal with this problem, preferably a write pixel row 51 is sandwiched by non-display areas 52 as illustrated in FIG. 66. It is preferable to program the write pixel row with current (voltage), apply a turn-on voltage to the gate signal line 17*b* of the pixel row after one horizontal scanning period, and thereby pass current through the EL element 15. Preferably, a turn-off voltage is applied to the gate signal line 17*b* of each pixel row at least 3 μsec after applying a turn-on voltage to the gate signal line 17*a* which selects the pixel row. Preferably, the pixel rows before and after the write pixel rows 51 are included in the non-display area 52 as illustrated in FIG. 66 if there is no restriction on the timing to pass current through the EL element 15.

Figure 67:
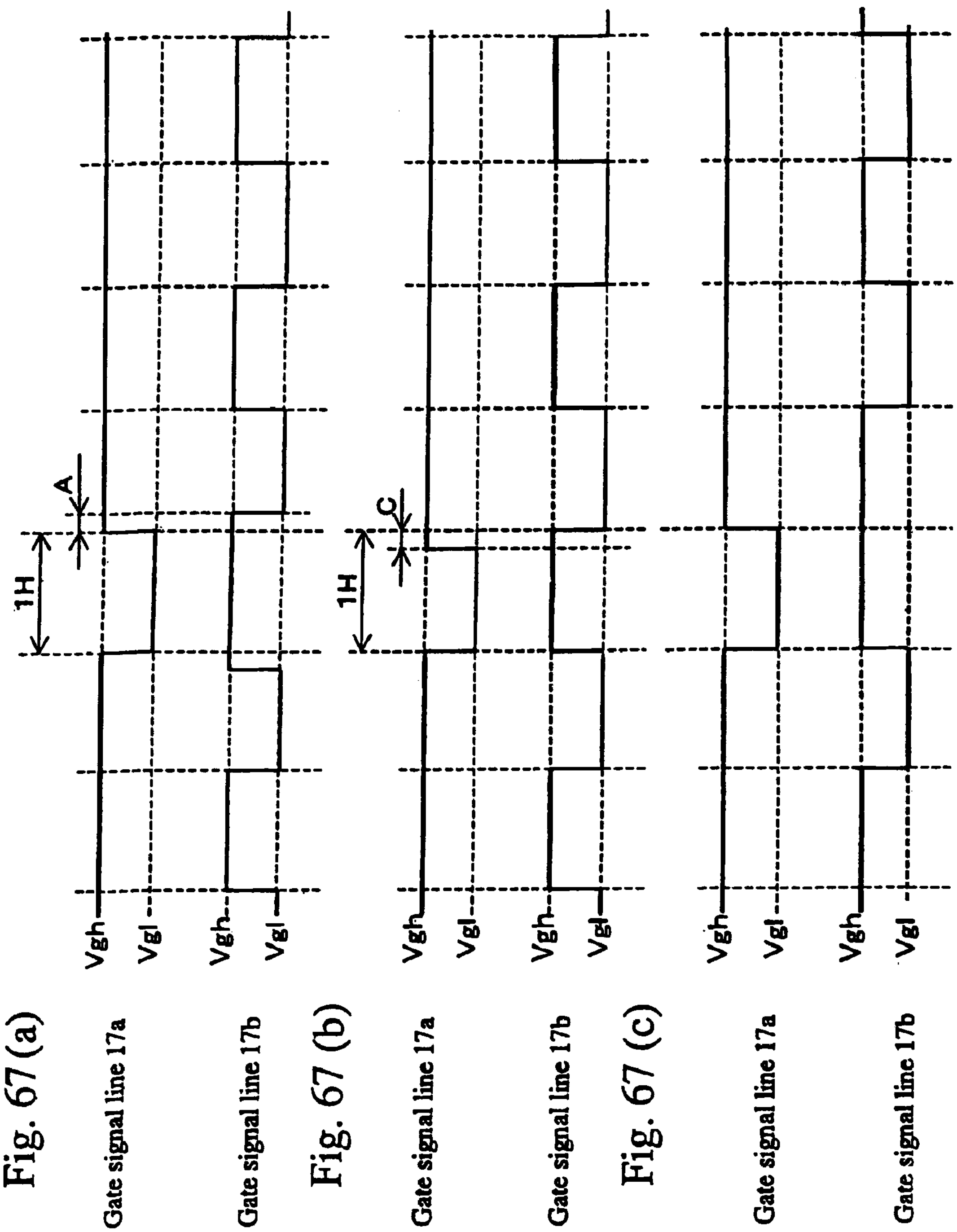
FIG. 67 is an explanatory diagram illustrating a drive method of a display apparatus according to the present invention.

FIG. 67 is an explanatory diagram illustrating the above drive method. FIG. 67 assumes the pixel configuration in FIG. 1 for ease of explanation.

In FIG. 67(*a*), a turn-on voltage (Vgl) is applied to the gate signal line 17*a* for one horizontal scanning period (1 H). At the point when a turn-on voltage is removed and a turn-off voltage is applied to the gate signal line 17*a*, a turn-off voltage continues to be applied to the gate signal line 17*b*. A turn-on voltage (Vgl) is applied to the gate signal line 17*b* after a lapse of time A as illustrated in FIG. 67(*a*). Preferably, the period A is 1 μsec or longer. More preferably, the period A is 3 μsec or longer.

By continuing to apply a turn-off voltage to the gate signal line 17*b* while a turn-on voltage is applied to the gate signal line 17*a* and applying a turn-on voltage to the gate signal line 17*b* when a turn-off voltage is applied to the gate signal line 17*a* in place of the turn-on voltage and the transistors 11*b* and 11*c* of the pixel 16 in FIG. 1 are turned off completely as shown in FIG. 67(*a*), it is possible to reduce variations in the current programmed into the pixels 16 and achieve proper image display.

In FIG. 67(*b*), a turn-on voltage (Vgl) is applied to the gate signal line 17*a* for a period shorter than one horizontal scanning period (1 H). At the point when a turn-on voltage is removed and a turn-off voltage is applied to the gate signal line 17*a*, a turn-off voltage continues to be applied to the gate signal line 17*b*. A turn-on voltage (Vgl) is applied to the gate signal line 17*b* after a lapse of time C as illustrated in FIG. 67(*b*). Preferably, the period C is 1 μsec or longer. More preferably, the period C is 3 μsec or longer.

By continuing to apply a turn-off voltage to the gate signal line 17*b* while a turn-on voltage is applied to the gate signal line 17*a* and applying a turn-on voltage to the gate signal line 17*b* when a turn-off voltage is applied to the gate signal line 17*a* in place of the turn-on voltage and the transistors 11*b* and 11*c* of the pixel 16 in FIG. 1 are turned off completely as shown in FIG. 67(*b*), it is possible to reduce variations in the current programmed into the pixels 16 and achieve proper image display.

In FIG. 67(*c*), a turn-on voltage (Vgl) is applied to the gate signal line 17*a* for one horizontal scanning period (1 H). At the point when a turn-on voltage is removed and a turn-off voltage is applied to the gate signal line 17*a*, a turn-off voltage continues to be applied to the gate signal line 17*b*. Furthermore, a turn-off voltage is applied to the gate signal line 17*b* for 1 H after a turn-on voltage (Vgl) is applied to the gate signal line 17*a*.

By continuing to apply a turn-off voltage to the gate signal line 17*b* while a turn-on voltage is applied to the gate signal line 17*a* and applying a turn-on voltage to the gate signal line 17*b* when a turn-off voltage is applied to the gate signal line 17*a* in place of the turn-on voltage and the transistors 11*b* and 11*c* of the pixel 16 in FIG. 1 are turned off completely as shown in FIG. 67(*c*), it is possible to reduce variations in the current programmed into the pixels 16 and achieve proper image display.

Incidentally, although the above example has been described by citing the pixel configuration in FIG. 1 and the like, needless to say, the above example is also applicable to the pixel configurations shown in FIGS. 63, 64, 65, etc.

Also, although it has been stated with reference to FIG. 17 and the like that a period during which the gate signal line 17*b* is set to Vgl (the period of 1 F/N during which the transistor 11*d* is on in the case of FIG. 1) is divided into a plurality of parts (the number of divisions is K) and that a period of 1 F/(K*N) during which the gate signal line 17*b* is set to Vgl is repeated K times, this is not restrictive. A period of 1 F/(K*N) may be repeated L (L≠K) times. In other words, the present invention displays the display screen 50 by controlling the period (time) during which current is passed through the EL elements 15. Thus, the idea of repeating the 1 F/(K*N) period L (L≠K) times is included in the technical idea of the present invention. Also, it is not strictly necessary to divide a period into equal parts. Also, the control method of L, period of L, and cycle of L may be varied among R, G, and B.

By varying the value of L, the brightness of the display screen 50 can be changed digitally. For example, there is a 50% change of brightness (contrast) between L=2 and L=3. By changing the period of L sequentially, it is possible to adjust the brightness of the screen 50 linearly in proportion to the period of L. Even if the brightness is adjusted, the number of gradations is maintained. Incidentally, the period of L is not limited to integral multiples of one horizontal scanning period (1 H). Needless to say, 5/2 Hs or a period shorter than 1 H such as ½ H or ⅛ H may be used for operations and control.

In the example described above, the display screen 50 is turned on and off (illuminated and non-illuminated) as the current delivered to the EL element 15 is switched on and off. That is, approximately equal current is passed through the transistor 11*a* multiple times using electric charges held in the capacitor 19. The present invention is not limited to this. For example, the display screen 50 may be turned on and off (illuminated and non-illuminated) by charging and discharging the capacitor 19 (See embodiments shown in FIGS. 32, 33, 53, 54 etc.).

Figure 18:
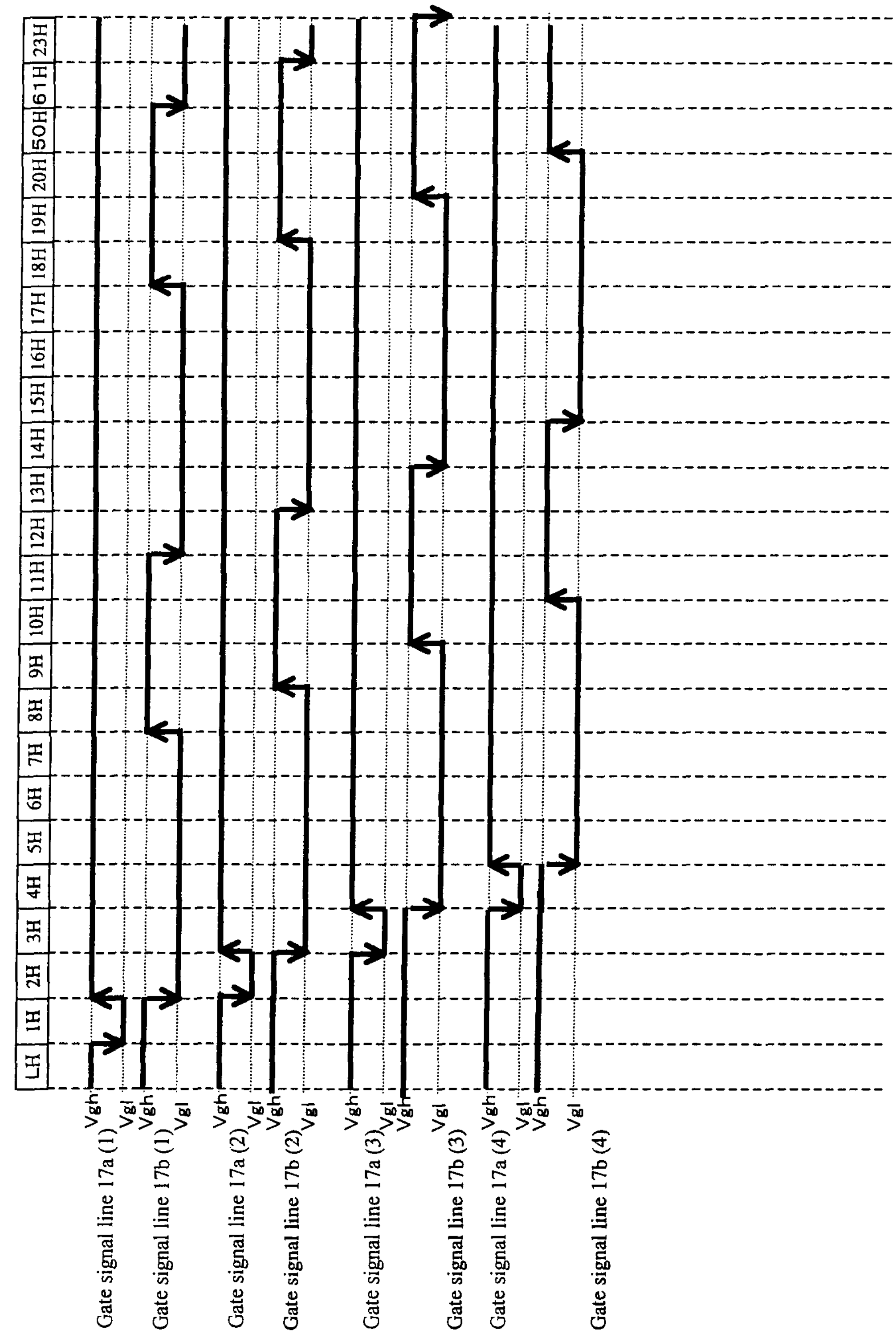
FIG. 18 is an explanatory diagram illustrating a drive method of a display apparatus according to the present invention.

FIG. 18 shows voltage waveforms applied to gate signal lines 17 to achieve the image display condition shown in FIG. 16. FIG. 18 differs from FIG. 15 in the operation of the gate signal line 17*b* (in the operation of the transistor 11*d* in FIGS. 1, 2, 64, and 65; or operation of the switch 631 in FIG. 63. Although the switch 631 is not controlled via the gate signal line 17*b*, those skilled in the art can easily perform on/off control of the switch 631, and thus description thereof will be omitted.) The gate signal line 17*b* is turned on and off (Vgl and Vgh) as many times as there are screen divisions. FIG. 18 is the same as FIG. 15 in other respects, and thus description thereof will be omitted.

Since black display on EL display apparatus corresponds to complete non-illumination, contrast does not lower unlike in the case of intermittent display on liquid crystal display panels. Also, with the configurations in FIG. 1, intermittent display can be achieved by simply turning on and off the transistor 11*d*. With the configurations in FIGS. 38, and 51, intermittent display can be achieved by simply turning on and off the transistor element 11*e*. In this way, the same image display can be reproduced even if the pixel 16 is turned on and off one or more times because image data is stored in the capacitor 19 (the number of gradations is infinite because analog values are used). That is, the image data is held in each pixel 16 for a period of 1 F (until the image data is rewritten in the next frame). Whether to deliver a current which corresponds to the stored image data to the EL element 15 is controlled by controlling the transistors 11*d* and 11*e* or the switch 631.

The drive method described above is not limited to a current-driven type and can be applied to a voltage-driven type as well. That is, in a configuration in which the current passed through the EL element 15 is stored in each pixel, intermittent driving is implemented by switching on and off the current path between the driver transistor 11 and EL element 15. Needless to say, intermittent driving can be implemented, for example, through control of the transistor 11*d* in FIG. 43 or transistor 11*e* in FIG. 51.

It is important to maintain the terminal voltage of the capacitor 19 programmed with current or voltage. This is because any change (charge/discharge) in the terminal voltage of the capacitor 19 during one field (frame) period causes changes in the screen brightness, resulting in flickering at lower frame rates. The current passed through the EL element 15 by the transistor 11*a* must be higher than 65%. More specifically, if the initial current written into the pixel 16 and passed through the EL element 15 is taken as 100%, the current passed through the EL element 15 just before it is written into the pixel 16 in the next frame (field) must not fall below 65%. The capacitance of the capacitor 19 and turn-off characteristics of the voltage-holding transistor 11*b* are determined in such a way as to satisfy the above conditions.

With the pixel configuration shown in FIG. 1, etc., there is no difference in the number of transistors 11 in a single pixel between when an intermittent display is created and when an intermittent display is not created. That is, by controlling the transistor 11*d*, proper current programming is achieved with the pixel configuration left as it is by removing the effect of parasitic capacitance of the source signal line 18. Besides, movie display close to that of a CRT is achieved.

Also, since the operation clock of the gate driver circuit 12 is significantly slower than the operation clock of the source driver circuit 14, there is no need to upgrade the main clock of the circuit (the same clock can be applied to either of the cases where intermittent operation is done or not.) Besides, the value of N or K can be changed easily. This can be achieved simply through on/off control of the transistor 11*b* and the like.

Incidentally, the image display direction (image writing direction) may be from top to bottom of the screen in the first field (frame), and from bottom to top of the screen in the second field (frame). That is, an upward direction and downward direction may be repeated alternately. By switching the scanning direction in this way, it is possible to reduce flickering even at a low frame rate.

Alternatively, it is possible to use a downward direction in the first field (frame), turn the entire screen into black display (non-display) once, and use an upward direction in the second field (frame). It is also possible to turn the entire screen into black display (non-display) once. It is also possible to turn the entire screen into black display (non-display) once, and then rewrite images from top to bottom of the screen. That is, the entire screen is turned into black display after rewriting and displaying images. Turning the entire screen into black display in this way improves movie display performance.

In the description of the drive method according to the present invention, it is stated for ease of explanation that the writing direction on the screen is from top to bottom or from bottom to top. However, the present invention is not limited to this. It is also possible to fix the writing direction on the screen to a top-to-bottom direction or bottom-to-top direction and move the non-display area 52 from top to bottom in the first field (frame), and from bottom to top in the second field (frame). Alternatively, it is possible to divide a frame into three fields and assign the first field to R, the second field to G, and the third field to B so that three fields compose a single frame. It is also possible to display R, G, and B in turns by switching among them every horizontal scanning period (1 H) (see FIGS. 75 to 82, etc.). The items mentioned above also apply to other examples of the present invention. Needless to say, the above items similarly apply to other examples of the present invention.

The non-display area 52 need not be totally non-illuminated. Weak light emission or dim image display will not be a problem in practical use. That is, non-display area (non-illuminated area) 52 should be regarded to be an area which has a lower display brightness than the image display area 53. It has been shown analytically that if the brightness of the non-display area 52 is set at or below ⅓ the brightness of the display area 53, proper image display can be achieved without lowering movie display performance. In the pixel configuration in FIG. 1 and the like, brightness of ⅓ or below can be achieved by increasing the turn-on voltage (Vgl) of the transistor 11*d* in such a way that the transistor 11*d* will not turn on completely. Also, the non-display area 52 may be an area which does not display one or two colors out of R, G, and B.

If the brightness of the display area 53 is kept at a predetermined value, the larger the display area 53, the brighter the display screen 50. For example, when the brightness of the image display area 53 is 100 (nt), if the percentage of the display screen 50 accounted for by the display area 53 changes from 10% to 20%, the brightness of the screen is doubled. Thus, by varying the proportion of the display area 53 in the entire screen 50, it is possible to vary the display brightness of the screen. The present invention provides a system which controls image display by controlling the size of the display area 53 with respect to the display 50.

The size of the display area 53 can be specified freely by controlling data pulses (ST2) sent to the shift register circuit 61 (See FIG. 6). Also, by varying the input timing and period of the data pulses, it is possible to switch between the display condition shown in FIG. 16 and display condition shown in FIG. 13 (the size of the non-display area 52 is made different between FIG. 13 and FIG. 16 for ease of explanation). If the sizes of the non-display areas 52 are made equal, the same brightness can be obtained (provided the same reference current are applied to the source driver IC (described later)). Increasing the number of data pulses in one 1 F period thereby extending the display area 53 makes the screen 50 brighter and decreasing it makes the screen 50 dimmer. Also, continuous application of the data pulses brings on the display condition shown in FIG. 13 while intermittent input of the data pulses brings on the display condition shown in FIG. 16. Thus, the brightness of image display can be controlled easily by simply controlling the data pulses applied to the shift registers 61.

Figure 19:
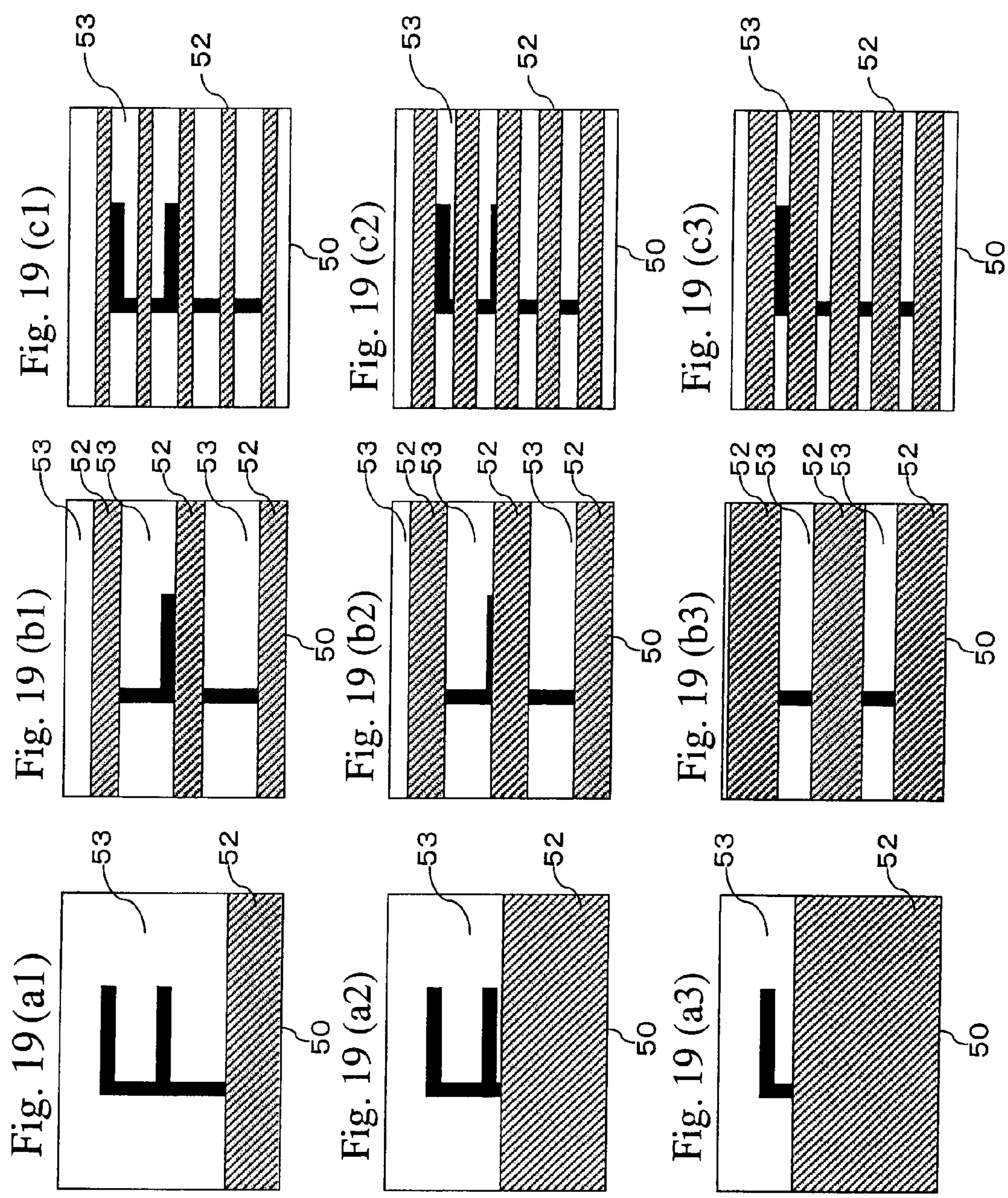
FIG. 19 is an explanatory diagram illustrating a drive method of a display apparatus according to the present invention.

FIG. 19(*a*) shows a brightness adjustment scheme used when the display area 53 is continuous as in FIG. 13. The display brightness of the screen 50 in FIG. 19(*a*1) is the brightest, the display brightness of the screen 50 in FIG. 19(*a*2) is the second brightest, and display brightness of the screen 50 in FIG. 19(*a*3) is the dimmest. Changes from FIG. 19(*a*1) to FIG. 19(*a*3) (or vice versa) can be achieved easily by controlling the shift register circuit 61 and the like of the gate driver circuit 12 as described above. In this case, there is no need to vary the Vdd voltage (anode voltage, or the like) in FIG. 1. There is no need to vary the magnitude of the programming current or programming voltage outputted from the source driver circuit 14, either. That is, the brightness of the screen 50 can be varied without changing the power supply voltage or video signal.

Also, in the process of change from FIG. 19(*a*1) to FIG. 19(*a*3), the gamma characteristics of the screen do not change at all. Thus, the contrast and gradation characteristics of the display screen are maintained regardless of the brightness of the screen 50. This is an effective feature of the present invention.

In brightness adjustment of a conventional screen, low brightness of the screen 50 results in poor gradation performance. That is, even if 64 gradations can be displayed in a high-brightness display, less than half the gradations can be displayed in a low-brightness display. In contrast, the drive method according to the present invention does not depend on the display brightness of the screen and can display up to 64 gradations, which is the highest.

FIG. 19(*b*) shows a brightness adjustment scheme used when the display areas 53 are scattered as in FIG. 16. The display brightness of the screen 50 in FIG. 19(*b*1) is the brightest, the display brightness of the screen 50 in FIG. 19(*b*2) is the second brightest, and display brightness of the screen 50 in FIG. 19(*b*3) is the dimmest. Changes from FIG. 19(*b*1) to FIG. 19(*b*3) (or vice versa) can be achieved easily by controlling the shift register circuit 61 of the gate driver circuit 12 and the like as described above. By scattering the display areas 53 as shown in FIG. 19(*b*), it is possible to eliminate flickering even at a low frame rate.

To eliminate flickering at an even lower frame rate, the display areas 53 can be scattered more finely as shown in FIG. 19(*c*). However, this lowers movie display performance. Thus, the drive method in FIG. 19(*a*) is suitable for moving pictures. The drive method in FIG. 19(*c*) is suitable when it is desired to reduce power consumption by displaying still pictures. Switching from FIG. 19(*a*) to FIG. 19(*c*) can be done easily by controlling the shift register circuit 61.

Although non-display areas 52 are formed at equal intervals in FIG. 19, this is not restrictive. Needless to say, it is also possible to form a continuous display area 53 in half the area of the screen 50, and alternate display areas 53 and non-display areas 52 at equal intervals in the rest of the screen 50 as shown in FIG. 19(*c*1).

Figure 20:
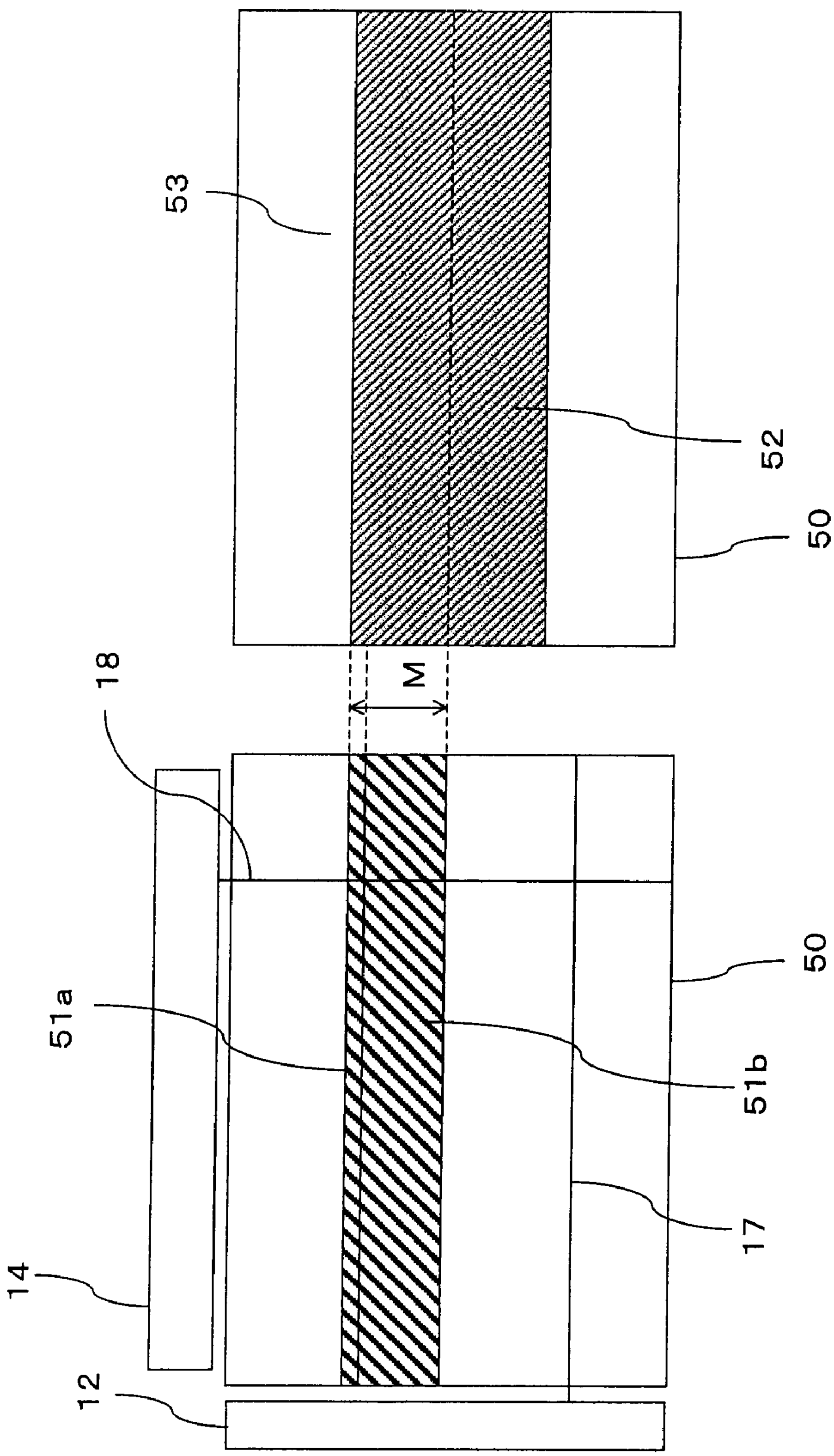
FIG. 20 is an explanatory diagram illustrating a drive method of a display apparatus according to the present invention.

FIG. 20 illustrates another example of the drive method according to the present invention. FIG. 20 shows a system which selects multiple pixel rows simultaneously, charges and discharges parasitic capacitance and the like of the source signal line 18 using the programming current which drives the multiple pixel rows, and thereby alleviate shortages of write current greatly. Since a plurality of pixel rows are selected simultaneously, drive current per pixel can be reduced. Thus, it is possible to reduce the current flowing through the EL element 15. For ease of explanation, it is assumed, for example that N=10 and that the number M of pixel rows selected simultaneously is 5 (the current passed through the source signal line 18 is increased tenfold. Since five pixel rows are selected simultaneously, ⅕ of the programming current flows through each pixel).

According to the invention described with reference to FIG. 20, M pixel rows are selected simultaneously. A current N times larger than a predetermined current is applied to the source signal line 18 from the source driver IC 14. A current N/M times larger than the current passed through the EL element 15 is programmed into each pixel. To illuminate the EL element 15 at a predetermined emission brightness, current is passed through the EL element 15 for a duration of MIN the duration of one frame (one field) This makes it possible to charge and discharge parasitic capacitance of the source signal line 18 sufficiently, resulting in a sufficient resolution at the predetermined emission brightness.

Incidentally, although in the description of the drive method according to the present invention, it is stated for ease of explanation that a current N times larger than a predetermined current is passed through the source signal line, this is not restrictive. The present invention is characterized in that a signal (current or voltage) outputted from the source driver circuit 14 is divided into multiple parts, which are applied to pixel rows selected simultaneously (it is all right if they are selected not exactly at the same time). If the driver transistors 11*a* in the pixels 16 selected simultaneously and connected to the same source signal line 18 have uniform characteristics, the current outputted from the source driver circuit 14 and divided by the number M of pixel rows selected simultaneously is programmed into the pixels 16.

That is, current is passed through the EL elements 15 only for a period equal to M/N of one frame (one field), but current is not passed during the remaining period (1 F (N−1) MIN). In this display condition, image data display and black display (non-illumination) are repeated every 1 F. That is, image data is displayed intermittently in the temporal sense (intermittent display). Thus, a good display condition is achieved without edge blur. Also, since the source signal line 18 is driven by an N times larger current, it is not affected by parasitic capacitance. Thus, this method can accommodate high-resolution display panels.

Incidentally, it has been stated in the above example for ease of explanation that M pixel rows are selected simultaneously and that an N times larger current is outputted from the source driver circuit 14. However, the present invention is not limited to this. It is also possible to select M pixel rows simultaneously and output the original current as it is from the source driver circuit 14. In that case, the present invention is implemented with the brightness of the display screen 50 reduced. Of course, the brightness of the screen 50 can be increased if 2 times, 2.5 times, or 5.25 times larger current is outputted from the source driver circuit 14.

Although it has been stated in the above example for ease of explanation that M pixel rows are selected simultaneously and that each pixel 16 is illuminated for a period of M/N, the present invention is not limited to this. It is also possible to select M pixel rows simultaneously and output M/10 times, M/5 times, or M/2.5 times larger current from the source driver circuit 14. That is, the display period can be set freely independent of N. Increasing the display period increases the brightness of the screen 50 and decreasing the display period decreases the brightness of the screen 50. That is, the present invention which selects M pixel rows simultaneously can also control or adjust the brightness of the screen 50 easily by controlling the display period.

Figure 21:
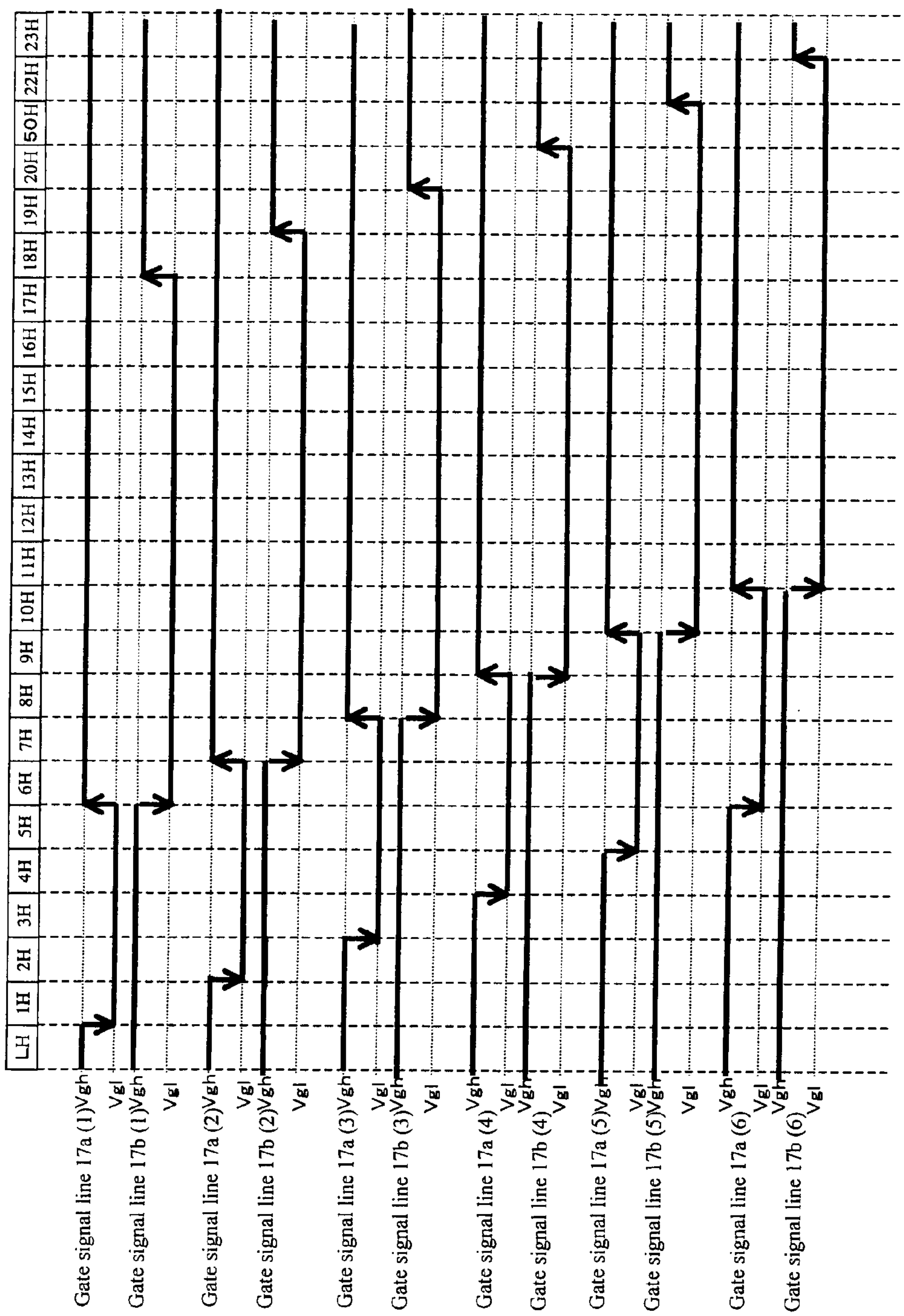
FIG. 21 is an explanatory diagram illustrating a drive method of a display apparatus according to the present invention.

FIG. 21 is an explanatory diagram illustrating drive waveforms which implement the drive method shown in FIG. 20. In the voltage waveforms of the gate signal lines 17, the turn-off voltage is Vgh (H level) and turn-on voltage is Vgl (L level). The subscripts to signal lines (such as (1), (2), and (3)) indicate pixel row numbers. Incidentally, a QCIF panel has 220 pixel rows and a VGA panel has 480 pixel rows.

In FIG. 21, a gate signal line 17*a*(1) is selected (a Vgl voltage is applied to the gate signal line 17*a* of the pixel row (1)) and a programming current flows through the source signal line 18 in the direction from the transistor 11*a* in the selected pixel row to the source driver circuit 14 (in the case of FIG. 1). For ease of explanation, it is assumed here that the write pixel row 51*a* is the (1)-th pixel row in FIG. 20.

The programming current flowing through the source signal line 18 is N times larger than a predetermined value (for ease of explanation, it is assumed that N=10. Of course, since the predetermined value is a data current for use to display images, it is not a fixed value unless in the case of white raster display or the like. The current value to be programmed in each pixel 16 by the image data varies. It is also assumed that five pixel rows are selected simultaneously (M=5). Therefore, ideally the capacitor 19 of one pixel is programmed so that a twice (N/M=10/5=2) larger current will flow through the transistor 11*a*.

When the write pixel row is the (1)-th pixel row, the gate signal lines 17*a* of pixel rows (1), (2), (3), (4), and (5) are selected as shown in FIG. 21. That is, the switching transistors 11*b* and the transistors 11*c* in the pixel rows (1), (2), (3), (4), and (5) are on. Also, the programming current flows through the driver transistors 11*a* of pixel rows (1), (2), (3), (4), and (5). As can be seen from FIG. 21, in the 5th H, a turn-on voltage is applied to the gate signal lines 17*a* of the pixel rows (1), (2), (3), (4), and (5) while a turn-off voltage is applied to the gate signal lines 17*b* of the pixel rows (1), (2), (3), (4), and (5). Thus, the switching transistors 11*d* in the pixel rows (1), (2), (3), (4), and (5) are off and current does not flow through the EL elements 15 in the corresponding pixel rows. That is, the EL elements 15 are in non-illumination mode 52.

Incidentally, it has been stated for ease of explanation that when a selection voltage is applied to the gate signal lines 17*a* of pixel rows (pixel rows (1), (2), (3), (4), and (5) in the above description), a turn-off voltage is applied to the gate signal lines 17*b* and the transistors 11*d* of the pixel rows (pixel rows (1), (2), (3), (4), and (5)) are turned off. However, as illustrated in FIG. 20, it goes without saying that the transistors 11*d* of pixel rows other than the selected pixel rows may be turned off. In FIG. 20, the transistors 11*d* in a wide range including the write pixel rows 51 are turned off to form a non-display area 52. Needless to say, the non-display area may be scattered or undivided as described with reference to FIG. 19.

According to the present invention, in the pixel configurations in FIGS. 1, 2, etc., it is important to cut off the current paths for the EL elements 15 when finally holding the programming current in the pixels at least in the pixel rows being programmed with current. However, in the case of current-mirror pixel configurations in FIG. 38, the above items are not restrictions.

According to the present invention, it is important that one or all of the pixel rows selected simultaneously (with a turn-on voltage applied to the gate signal lines 17*a*) to write image data are put into non-display mode. This is because putting one or more pixel rows into display mode lowers the resolution of displayed images.

Ideally, the transistors 11*a* in the five pixels deliver a current of Iw×2 each to the source signal line 18 (i.e., a current of Iw×2×N=Iw×2×5=Iw×10 flows through the source signal line 18. Thus, if a predetermined voltage Iw flows when the N-fold pulse driving according to the present invention is not used, a current 10 times larger than Iw flows through the source signal line 18).

Through the above operation (drive method), the capacitor 19 of each pixel row (1), (2), (3), (4) and (5) is programmed with a twice larger programming current. For ease of understanding, it is assumed here that the transistors 11*a* have equal characteristics (Vt and S value).

Since five pixel rows are selected simultaneously (K=5), five driver transistors 11*a* operate. That is, 10/5=2 times larger current flows through the transistor 11*a* per pixel. The total programming current of the transistors 11*a* of the five pixels 16 flows through the source signal line 18. For example, if a current written into the write pixel row 51*a* is Iw, a current equal to Iw×10 is passed through the source signal line 18. The write pixel rows 51*b* (the pixel rows (2), (3) (4) and (5) when the pixel row (1) is being programmed with current) into which image data is written later than the write pixel row (1) are auxiliary pixel rows used to increase the amount of current delivered to the source signal line 18. However, there is no problem because regular image data is written into the write pixel rows 51*b* later (see FIG. 20. It is assumed that 51*a* in FIG. 20 corresponds to the pixel row (1) while 51*b* corresponds to the pixel rows (2), (3), (4), and (5)).

Thus, the four pixel rows 51*b* provide the same display as the pixel row 51*a* during a period of 1 H. Consequently, at least the write pixel row 51*a* and the pixel rows 51*b* selected to increase current are put into non-display mode 52 (see FIG. 20(*b*)). Needless to say, however, in the current-mirror pixel configuration in FIG. 38 or other pixel configurations for voltage programming, the pixel row 51*a* may be in display mode.

After 1 H, the gate signal line 17*a*(1) becomes deselected and a turn-on voltage (Vgl) is applied to the gate signal line 17*b* in FIG. 21. See the waveforms of the gate signal lines in the 6th H. At the same time, the gate signal line 17*a*(6) is selected (a Vgl voltage is applied) and programming current flows through the source signal line 18 in the direction from the transistor 11*a* in the selected pixel row (6) to the source driver circuit 14. Through this operation, regular image data is held in the pixel row (1). That is, the programming current for the pixel row (1) is determined definitely and a programming current flows through the pixel row (6).

After the next 1 H, the gate signal line 17*a*(2) becomes deselected and a turn-on voltage (Vgl) is applied to the gate signal line 17*b* of the pixel row (2) (see the 7th H in FIG. 21). At the same time, the gate signal line 17*a*(7) is selected (a Vgl voltage is applied) and a programming current flows through the source signal line 18 in the direction from the transistor 11*a* in the selected pixel row (7) to the source driver circuit 14. Through this operation, regular image data is held in the pixel row (2). The entire screen 50 is redrawn as it is scanned by shifting pixel rows one by one through the above operations.

With the drive method in FIG. 20, since each pixel is programmed with a twice larger current (voltage), ideally the emission brightness of the EL element 15 is two times higher (however, the figure "two" here is only according to one example). Thus, the brightness of the display screen is twice higher than a predetermined value. To equalize this brightness with the predetermined brightness, an area which includes the write pixel rows 51 and which is half as large as the display screen 50 can be turned into a non-display area 52 as illustrated in FIG. 16.

Figure 22:
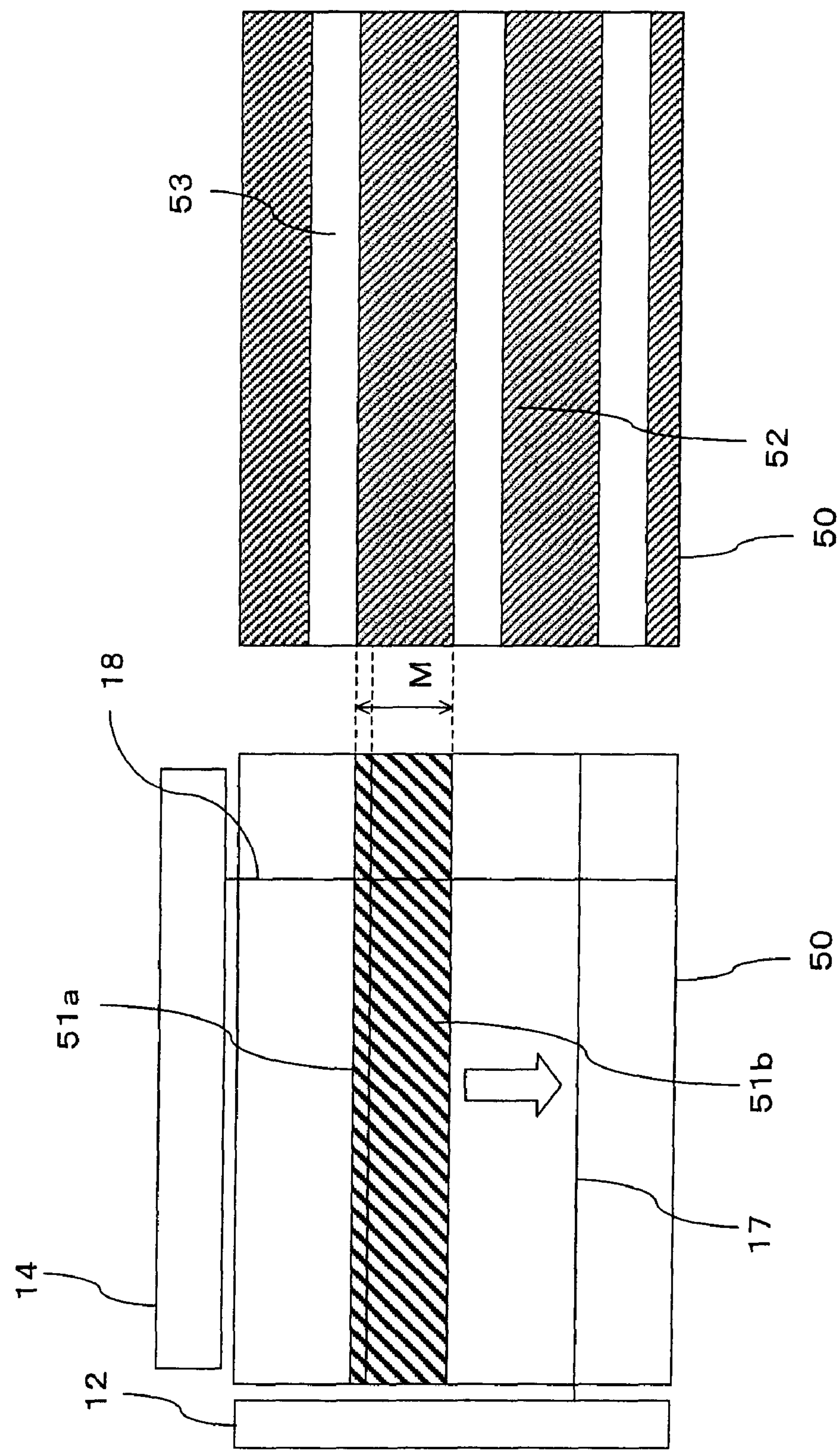
FIG. 22 is an explanatory diagram illustrating a drive method of a display apparatus according to the present invention.

As is the case with FIG. 13, when one display area 53 moves from top to bottom of the screen as shown in FIG. 20, the movement of the display area 53 is recognized visually if a low frame rate is used. It tends to be recognized easily especially when the user closes his/her eyes or moves his/her head up and down. To deal with this problem, the display area 53 can be divided into a plurality of parts as illustrated in FIG. 22 (the number of divisions is K).

Figure 23:
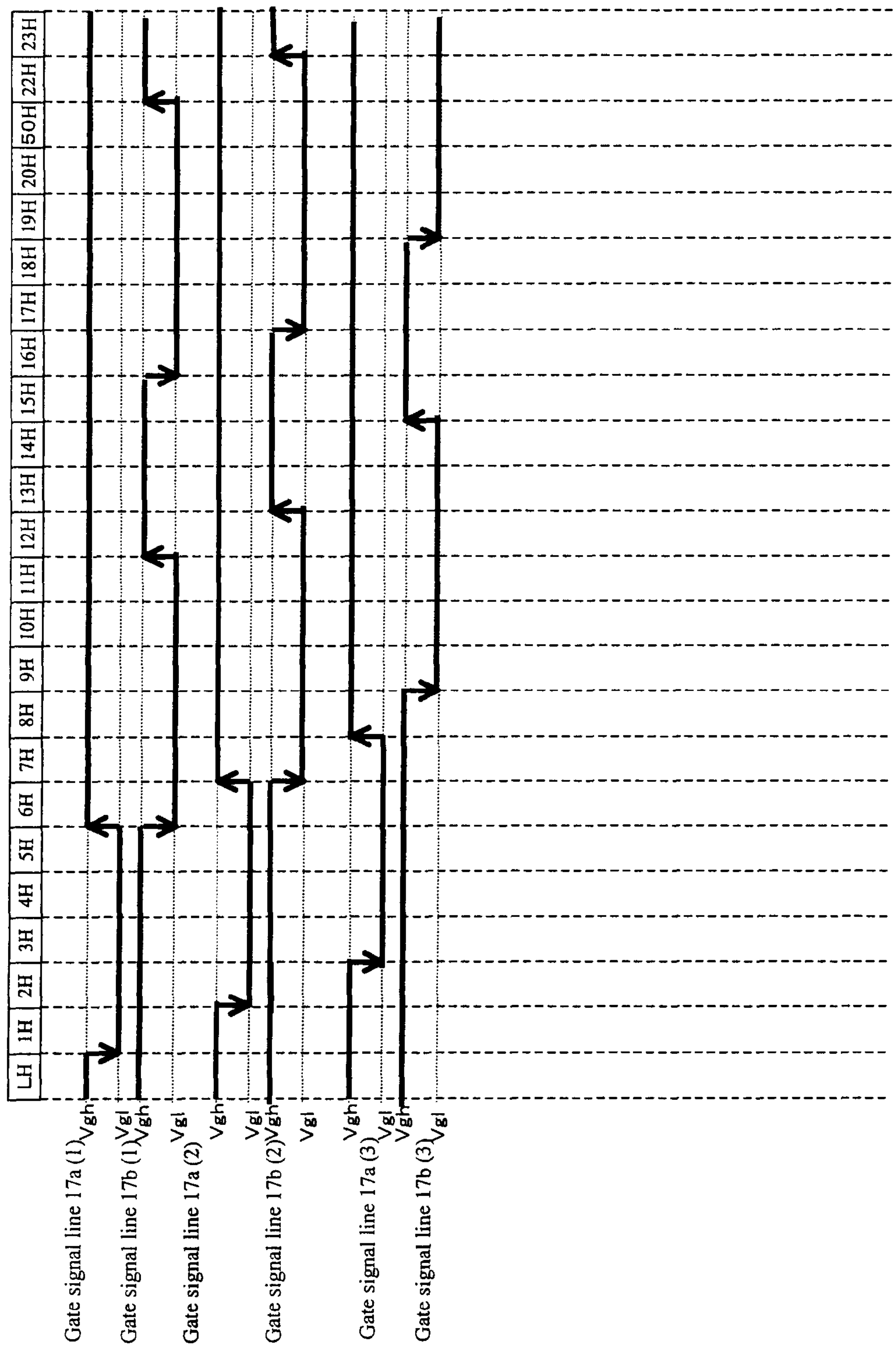
FIG. 23 is an explanatory diagram illustrating a drive method of a display apparatus according to the present invention.

FIG. 23 shows voltage waveforms applied to gate signal lines 17. FIG. 21 differs from FIG. 23 basically in the operation of the gate signal lines 17*b*. The gate signal line 17*b* is turned on and off (Vgl and Vgh) as many times as there are screen divisions. The rest is almost the same as FIG. 21 or can be known by analogy, and thus description thereof will be omitted.

As described above, dividing the display area 53 reduces flickering of the screen. Thus, a flicker-free good image display can be achieved. Incidentally, the display area 53 may be divided more finely. The more finely the display area 53 is divided, the less flickering occurs. Since the EL element 15 is highly responsive, even if it is turned on and off at intervals shorter than 5 μsec, there is no lowering of the display brightness.

With the drive method according to the present invention, the EL element 15 can be turned on and off by turning on and off a signal applied to the gate signal line 17*b*. Thus, a clock frequency can be controlled using a low frequency on the order of KHz. Also, it does not need an image memory or the like in order to insert a black screen (insert a non-display area 52). Thus, the drive circuit or method according to the present invention can be implemented at low costs.

Figures 24, 24A:
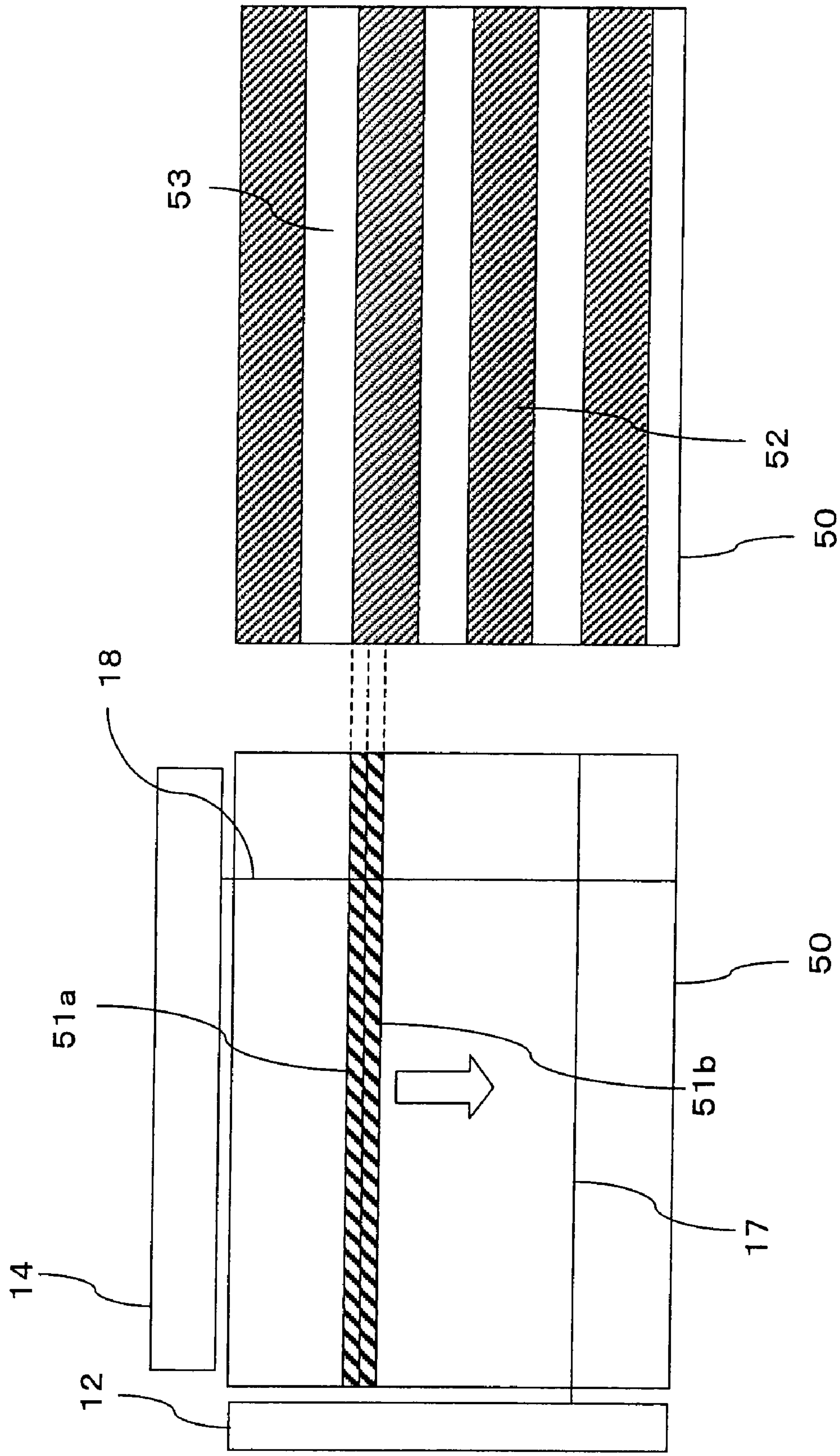
FIG. 24 is an explanatory diagram illustrating a drive method of a display apparatus according to the present invention.

FIG. 24 shows a case in which two pixel rows are selected simultaneously. It was found that on a display panel formed by low-temperature polysilicon technology, a method in which two pixel rows were selected simultaneously provided image display with out any problem on a practical level. Probably this is because driver transistors 11*a* in adjacent pixels had very similar characteristics. In laser annealing, good results were obtained when laser stripes were irradiated in parallel with the source signal line 18 (see FIG. 7 and the explanation thereof).

This is because that part of a semiconductor film which is annealed simultaneously has uniform characteristics. That is, the semiconductor film is created uniformly within an irradiation range of laser stripes and the Vt, mobility, and S value of the transistors which use the semiconductor film are almost uniform. Thus, if a striped laser shot is moved in parallel with the source signal line 18 (see FIG. 7), pixels (a pixel column, i.e., pixels arranged vertically on the screen) along the source signal line 18 take on almost equal characteristics. Therefore, if a plurality of pixel rows are turned on simultaneously for current programming, the current obtained by dividing the programming current by the number of selected pixels are programmed almost uniformly into the pixels This makes it possible to program a current close to a target value and achieve uniform display. Thus, it is possible to achieve proper image display using an array board 71 built along the direction of a laser shot and the drive method described with reference to FIG. 24 and the like.

As described above, if the direction of a laser shot is made to coincide approximately with the direction of the source signal line 18, the characteristics of the pixel transistors 11*a* arranged vertically become almost uniform. This makes it possible to program pixels accurately with a target voltage, and thus achieve proper image display (even if the characteristics of the pixel transistors 11*a* arranged horizontally are not uniform). The above operation is performed in sync with 1 H (one horizontal scanning period) by shifting selected pixel rows one by one or by shifting two or more selected pixel rows at once.

Incidentally, according to the present invention, the direction of the laser shot does not always need to be parallel with the direction of the source signal line 18. This is because even if the laser shot is directed at angles to the source signal line 18, pixel transistors 11*a* placed along one source signal line 18 can be made to take on almost equal characteristics. Thus, directing a laser shot in parallel with the source signal line 18 means bringing a pixel vertically adjacent to an arbitrary pixel along the source signal line 18 into a laser irradiation range. Besides, a source signal line 18 generally constitutes wiring which transmits programming current or voltage used as a video signal.

Incidentally, in the examples of the present invention a write pixel row is shifted every 1 H, but this is not restrictive. Pixel rows may be shifted every 2 Hs. Also, more than two pixel rows may be shifted at a time. Also, pixel rows may be shifted at desired time intervals. The shifting interval may be varied according to locations on the screen. For example, the shifting interval may be decreased in the middle of the screen, and increased at the top and bottom of the screen. Also, the shifting interval may be varied on a frame-by-frame basis.

Also, it is not strictly necessary to select consecutive pixel rows. For example, every second pixel row may be selected. Specifically, a possible drive method involves selecting the first and third pixel rows in the first horizontal scanning period, the second and fourth pixel rows in the second horizontal scanning period, the third and fifth pixel rows in the third horizontal scanning period, and the fourth and sixth pixel rows in the fourth horizontal scanning period. Of course, a drive method which involves selecting the first, third, and fifth pixel rows in the first horizontal scanning period also belongs to the technical category of the present invention. Also, one in every few pixel rows may be selected.

Figure 42:
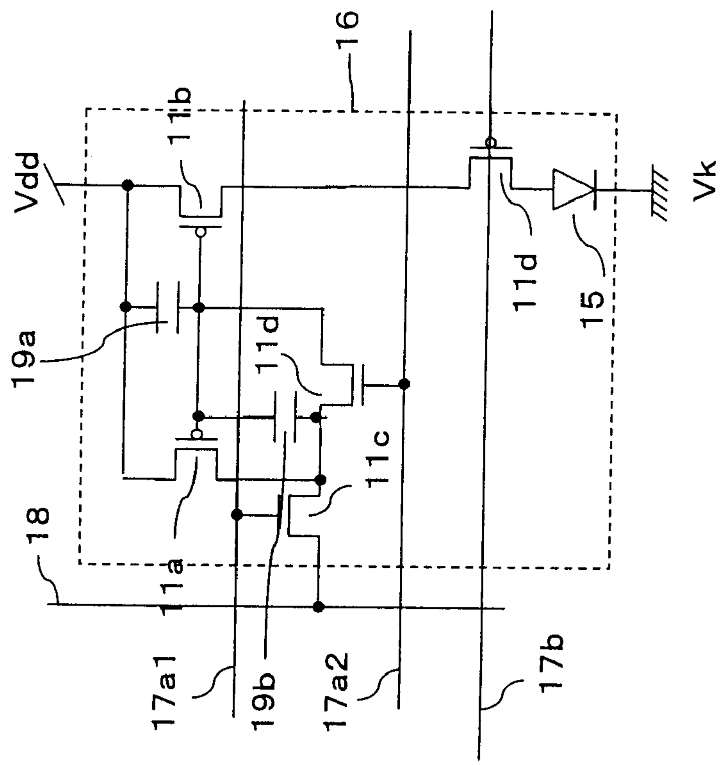
FIG. 42 is a block diagram of a pixel in a display panel according to the present invention.
Figure 42:
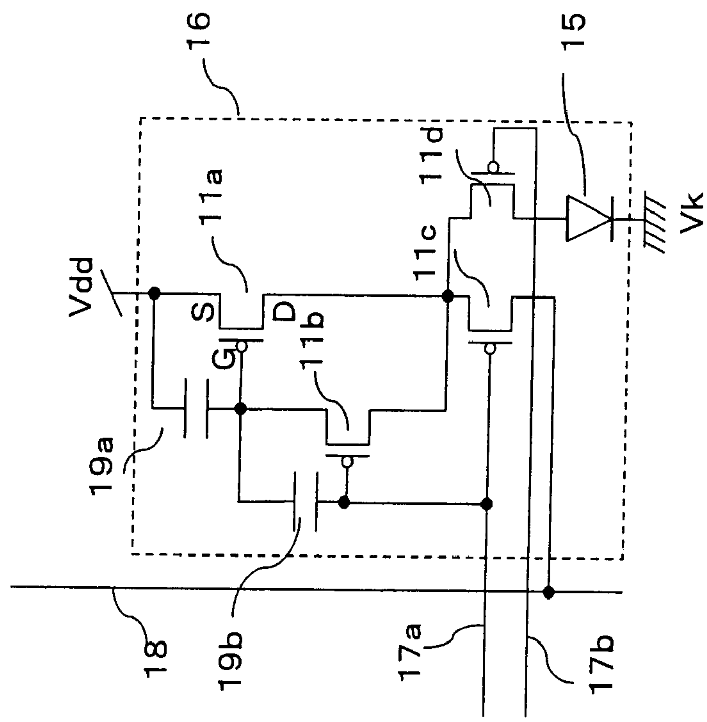
Figure 50:
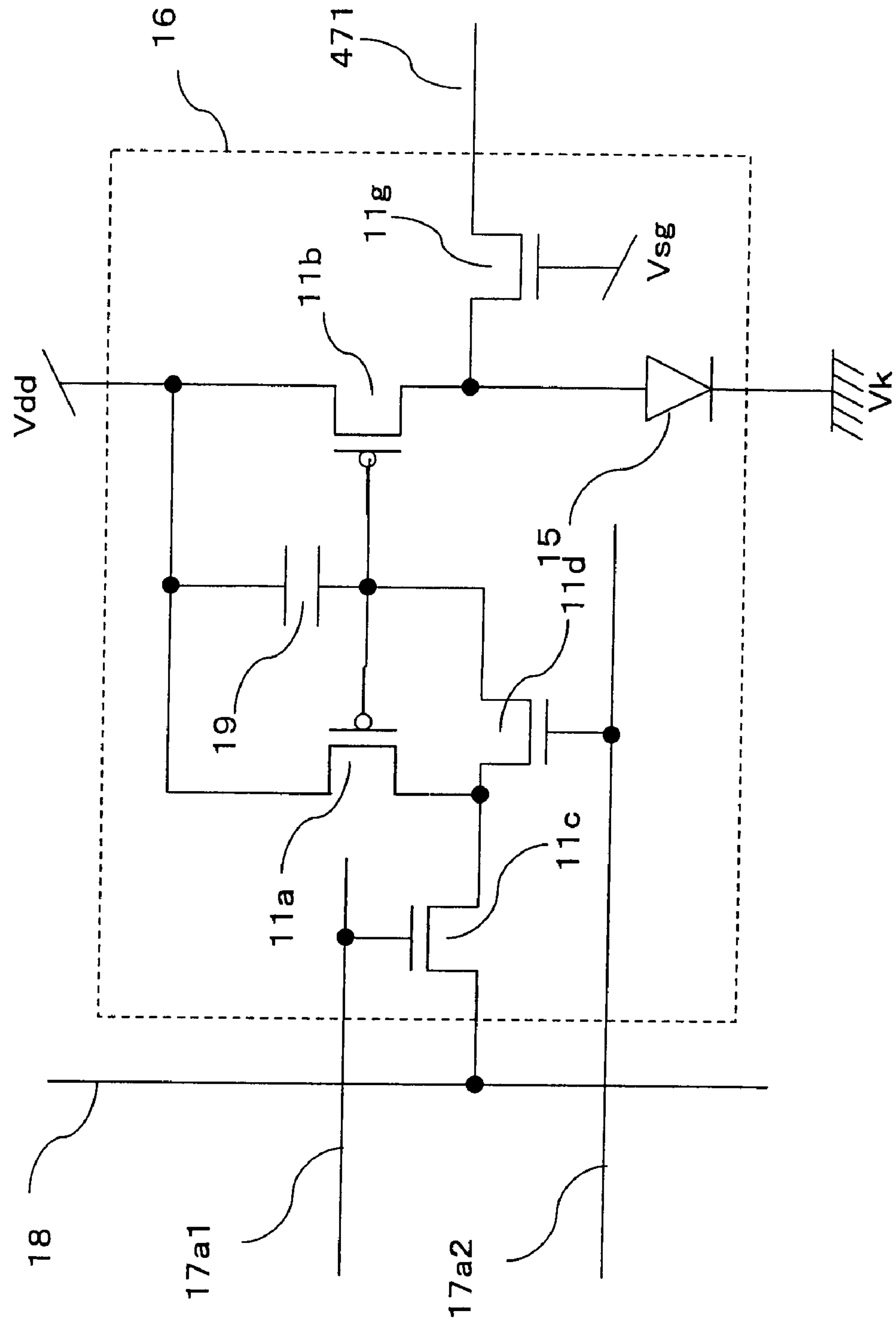
FIG. 50 is a block diagram of a pixel in a display panel according to the present invention.
Figure 51:
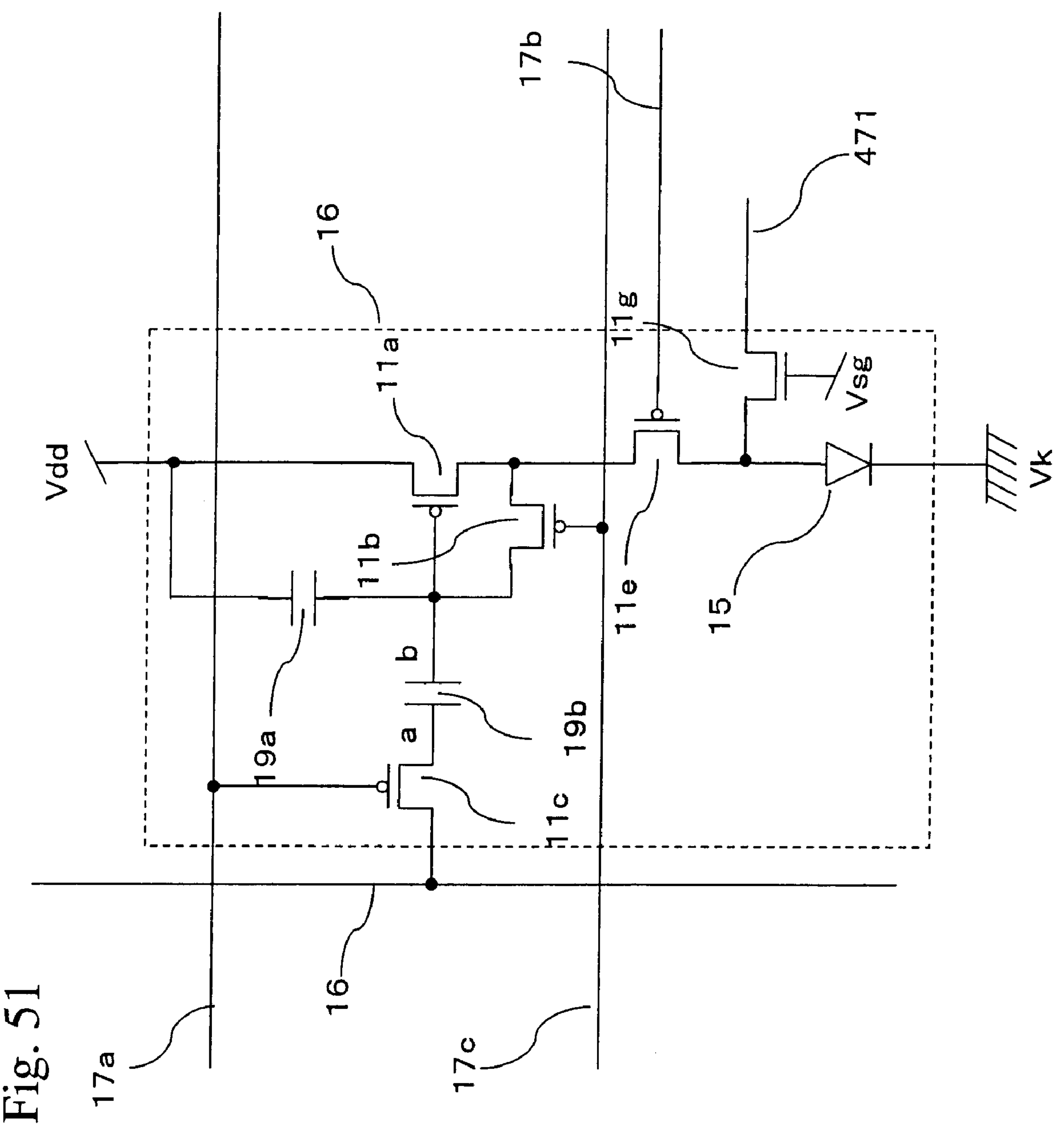
FIG. 51 is a block diagram of a pixel in a display panel according to the present invention.

Incidentally, the combination of the direction of a laser shot and selection of multiple pixel rows is not limited to the pixel configurations in FIGS. 1, 2, 32, 63, 64, 65, etc., but, needless to say, it is also applicable to other current-driven pixel configurations such as the current-mirror pixel configurations in FIGS. 38, 42, 50, etc. Also, it can be applied to voltage-driven pixel configurations in FIGS. 43, 51, 54, 62, etc. This is because as long as transistors in upper and lower parts of the pixel have equal characteristics, voltage programming can be performed properly using the voltage value applied to the same source signal line 18.

Figure 25:
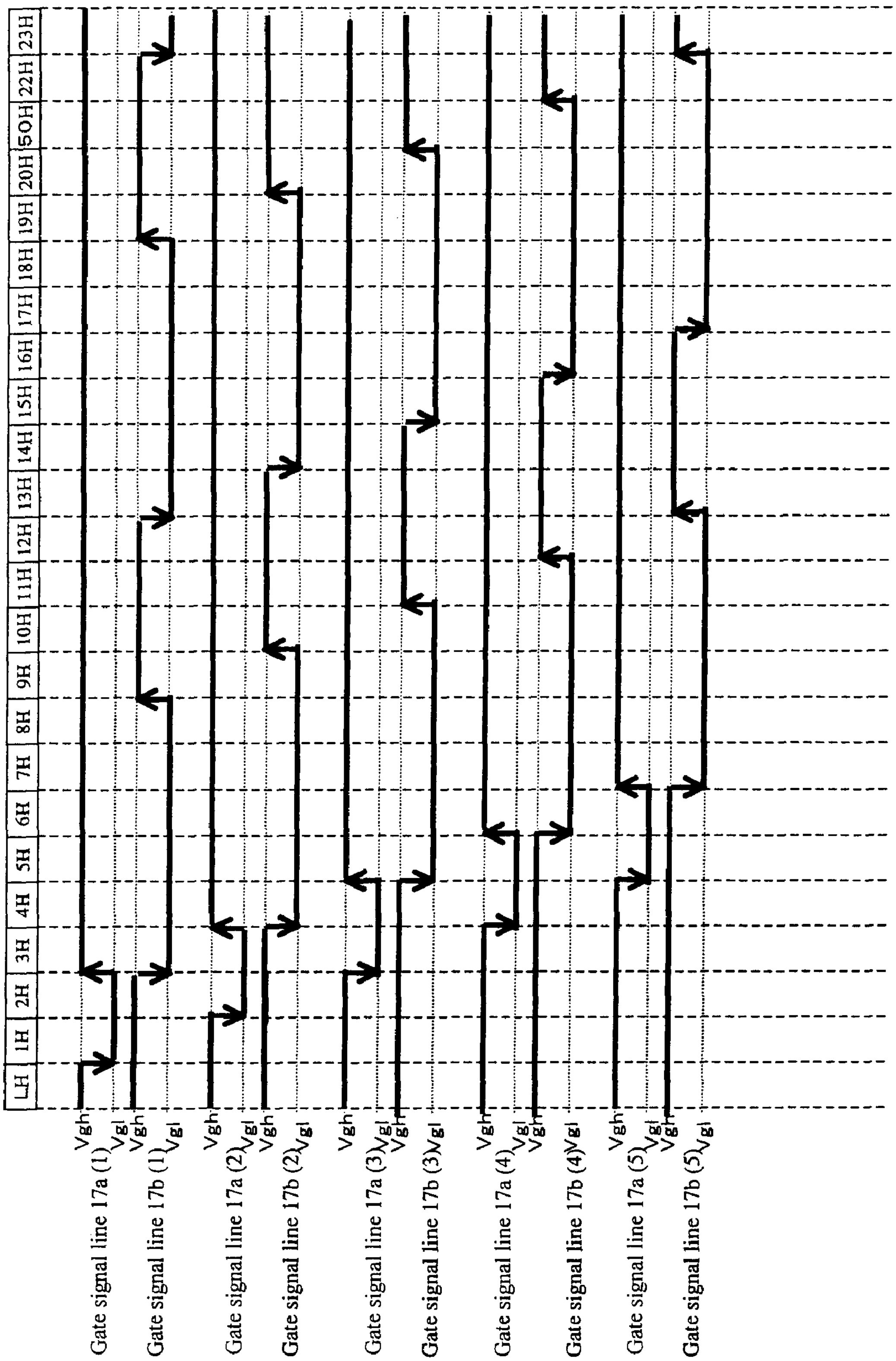
FIG. 25 is an explanatory diagram illustrating a drive method of a display apparatus according to the present invention.

As described above, the drive method according to the present invention in FIG. 21 selects five pixel rows simultaneously. FIGS. 24 and 25 show an example of the drive method which selects two pixel rows simultaneously. In FIG. 24, when the write pixel row is the (1)-th pixel row, the gate signal lines 17*a*(1) and (2) are selected (see FIG. 25). That is, the switching transistors 11*b* and the transistors 11*c* in the pixel rows (1) and (2) are on. Also, when a turn-on voltage is applied to the gate signal lines 17*a*, a turn-off voltage is applied to the gate signal lines 17*b*.

Thus, in the 1st and 2nd Hs, the switching transistors 11*d* in the pixel rows (1) and (2) are off and current does not flow through the EL elements 15 in the corresponding pixel rows. That is, the EL elements 15 are in non-illumination mode 52. Incidentally, in FIG. 24, the display area 53 is divided into five parts to reduce flickering.

Ideally, the transistors 11*a* in the two pixel rows deliver a current of Iw×5 each to the source signal line 18 (when N=10. Since K=2, a current of Iw×K×5=Iw×10 flows through the source signal line 18). Then, a 5 times larger current is programmed to the capacitor 19 of each pixel 16 and held.

Since two pixel rows are selected simultaneously (K=2), two driver transistors 11*a* operate. That is, 10/2=5 times larger current flows through the transistor 11*a* per pixel. The total programming current of the two transistors 11*a* flows through the source signal line 18.

For example, if the current written into the write pixel row 51*a* is Id, a current of Iw×10 is passed through the source signal line 18. There is no problem because regular image data is written into the write pixel row 51*b* later. The pixel row 51*b* provides the same display as the pixel row 51*a* during a period of 1 H. Consequently, at least the write pixel row 51*a* and the pixel row 51*b* selected to increase current are in non-display mode 52.

After the next 1 H, the gate signal line 17*a*(1) becomes deselected and a turn-on voltage (Vgl) is applied to the gate signal line 17*b*. At the same time, the gate signal line 17*a*(3) is selected (Vgl voltage) and a programming current flows through the source signal line 18 in the direction from the transistor 11*a* in the selected pixel row (3) to the source driver circuit 14. Through this operation, regular image data is held in the pixel row (1).

After the next 1 H, the gate signal line 17*a*(2) becomes deselected and a turn-on voltage (Vgl) is applied to the gate signal line 17*b*. At the same time, the gate signal line 17*a*(4) is selected (Vgl voltage) and a programming current flows through the source signal line 18 in the direction from the transistor 11*a* in the selected pixel row (4) to the source driver circuit 14. Through this operation, regular image data is held in the pixel row (2). The entire screen is redrawn as it is scanned by shifting pixel rows one by one through the above operations (of course, two or more pixel rows may be shifted simultaneously. For example, in the case of pseudo-interlaced driving, two pixel rows will be shifted at a time. Also, from the viewpoint of image display, the same image may be written into two or more pixel rows).

As in the case of FIG. 16, with the drive method in FIG. 24, since each pixel is programmed with a five times larger current (voltage), ideally the emission brightness of the EL element 15 is five times higher. Thus, the brightness of the display area 53 is five times higher than a predetermined value. To equalize this brightness with the predetermined brightness, an area which includes the write pixel rows 51 and which is ⅕ the display screen 50 can be turned into a non-display area 52.

Figure 26:
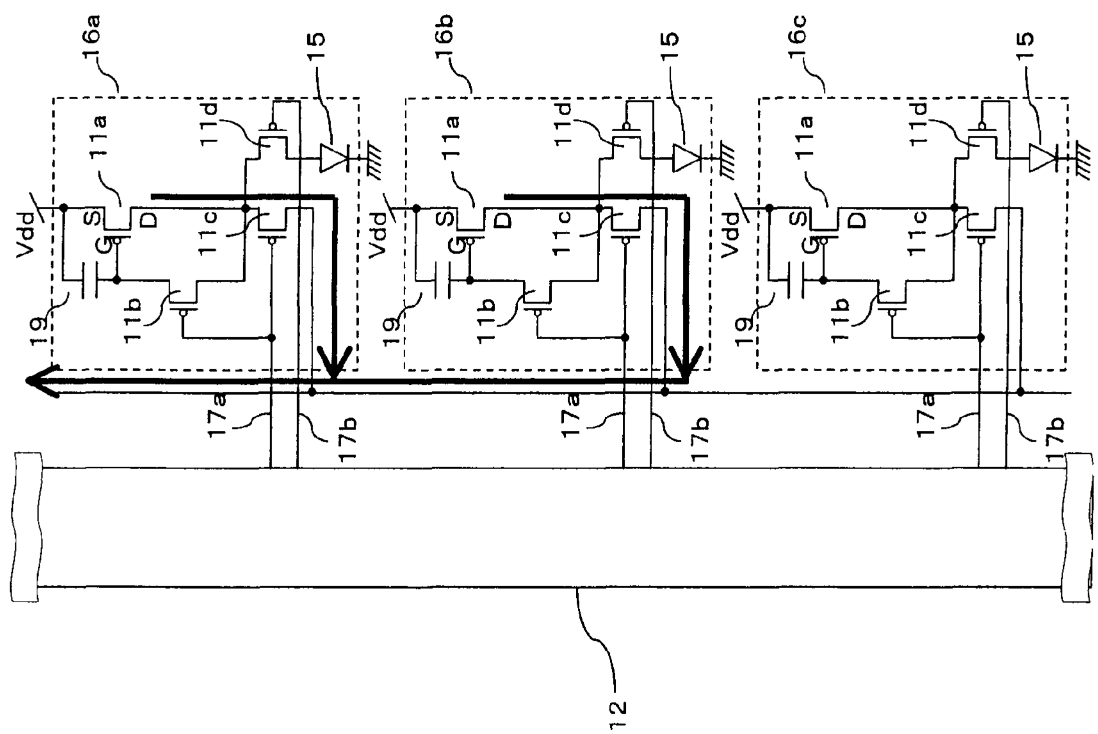
FIG. 26 is an explanatory diagram illustrating a drive method of a display apparatus according to the present invention.

As shown in FIG. 27, two write pixel rows 51 (51*a* and 51*b*) are selected in sequence from the upper side to the lower side of the screen 50 (see also FIG. 26. Pixel rows 16*a* and 16*b* are selected in FIG. 26). However, at the bottom of the screen, there does not exist 51*b* although the write pixel row 51*a* exists. That is, there is only one pixel row to be selected. Thus, the current applied to the source signal line 18 is all written into the write pixel row 51*a*. Consequently, twice as large a current as usual is written into the write pixel row 51*a*.

To deal with this problem, the present invention forms (places) a dummy pixel row 281 at the bottom of the screen 50, as shown in FIG. 27(*b*). Thus, after the pixel row at the bottom of the screen 50 is selected, the final pixel row of the screen 50 and the dummy pixel row 281 are selected. Consequently, a prescribed current is written into the write pixel row in FIG. 27(*b*). Incidentally, although the dummy pixel row 281 is illustrated as being adjacent to the top end or bottom end of the display area 50, this is not restrictive. It may be formed at a location away from the display area 50. Besides, the dummy pixel row 281 does not need to contain a switching transistor 11*d* or EL element 15 such as those shown in FIG. 1. This reduces the size of the dummy pixel row 281, which results in shortening the frame length of the panel.

Figure 28:
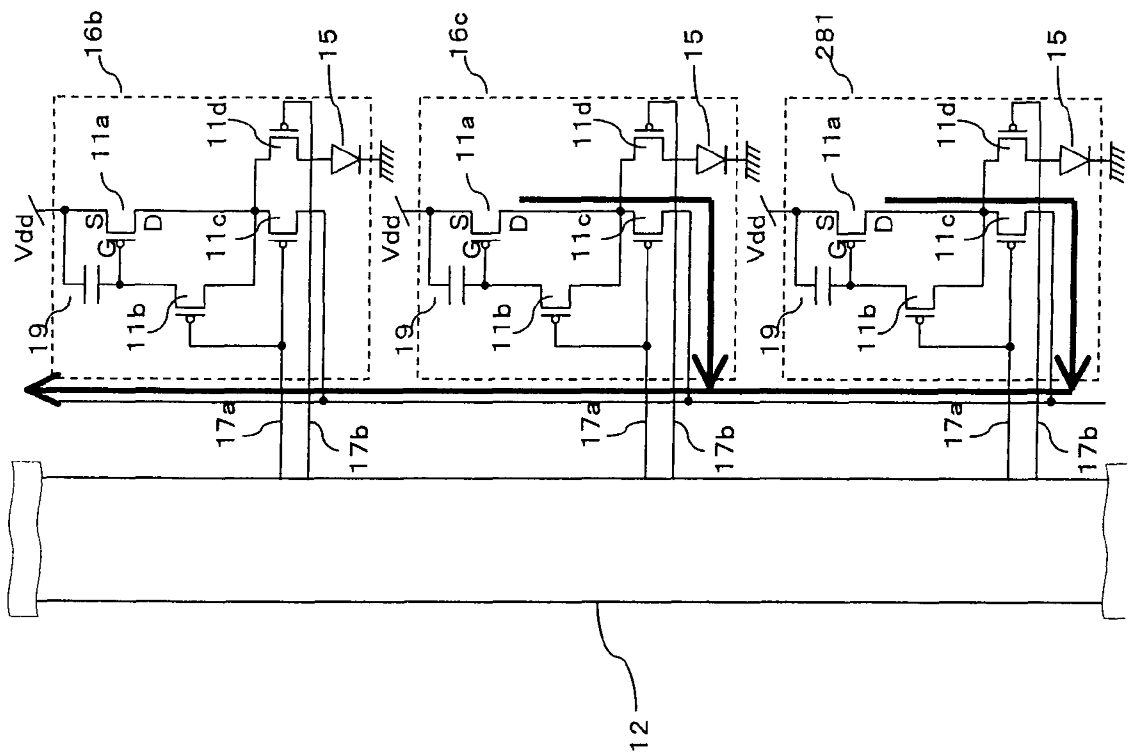
FIG. 28 is an explanatory diagram illustrating a drive method of a display apparatus according to the present invention.

FIG. 28 shows a mechanism of how the state shown in FIG. 27(*b*) takes place. As can be seen from FIG. 28, after the pixel 16*c* at the bottom of the screen 50 is selected, the final pixel row 281 of the screen 50 is selected. The dummy pixel row 281 is placed outside the display area 50. That is, the dummy pixel row 281 does not illuminate, is not illuminated, or is hidden even if illuminated. For example, contact holes between the pixel electrode and transistor 11 are eliminated, no EL element 15 is formed on the dummy pixel row, or the like. An EL element 15, transistor 11*d*, and gate signal line 17*b* are illustrated in the dummy pixel row 281 in FIG. 28, but they are not necessary for driving. No EL element 15, transistor 11*d*, or gate signal line 17*b* is formed in a dummy pixel row 281 of a display panel actually developed according to the present invention. However, it is preferable to form a pixel electrode. This is to provide against a situation in which there would be a difference in parasitic capacitance between the dummy pixel and other pixels 16, resulting in a difference in retained programming current.

Figure 29A:
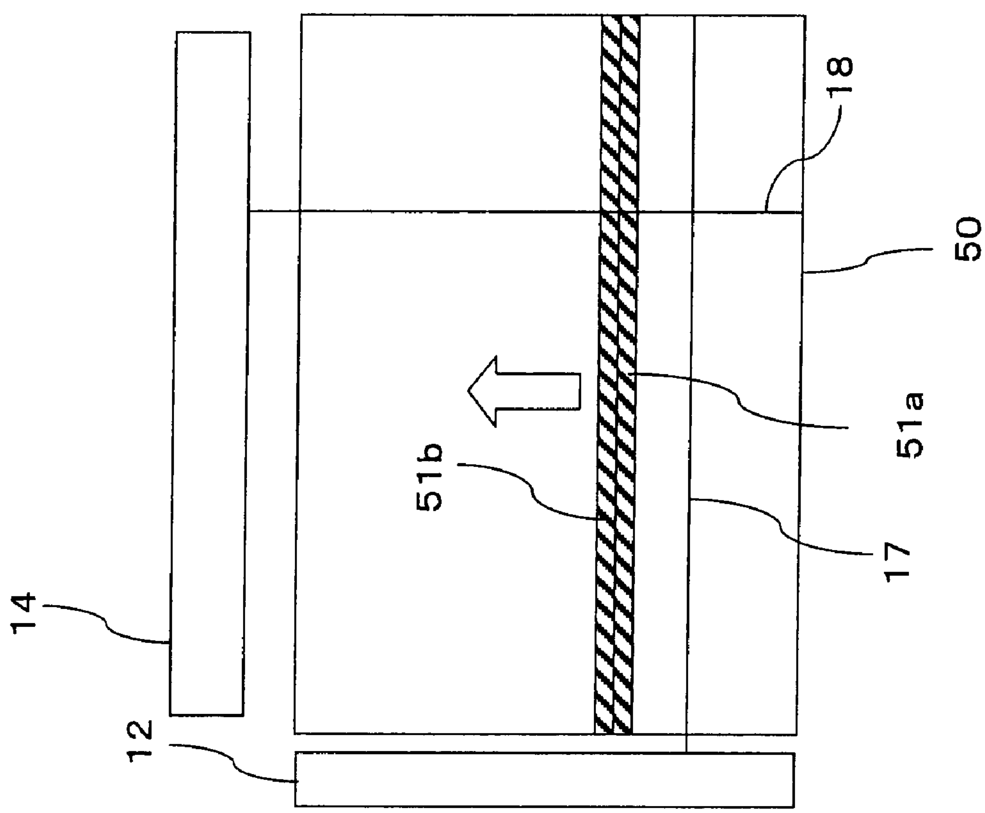
FIG. 29 is an explanatory diagram illustrating a drive method of a display apparatus according to the present invention.
Figure 29:
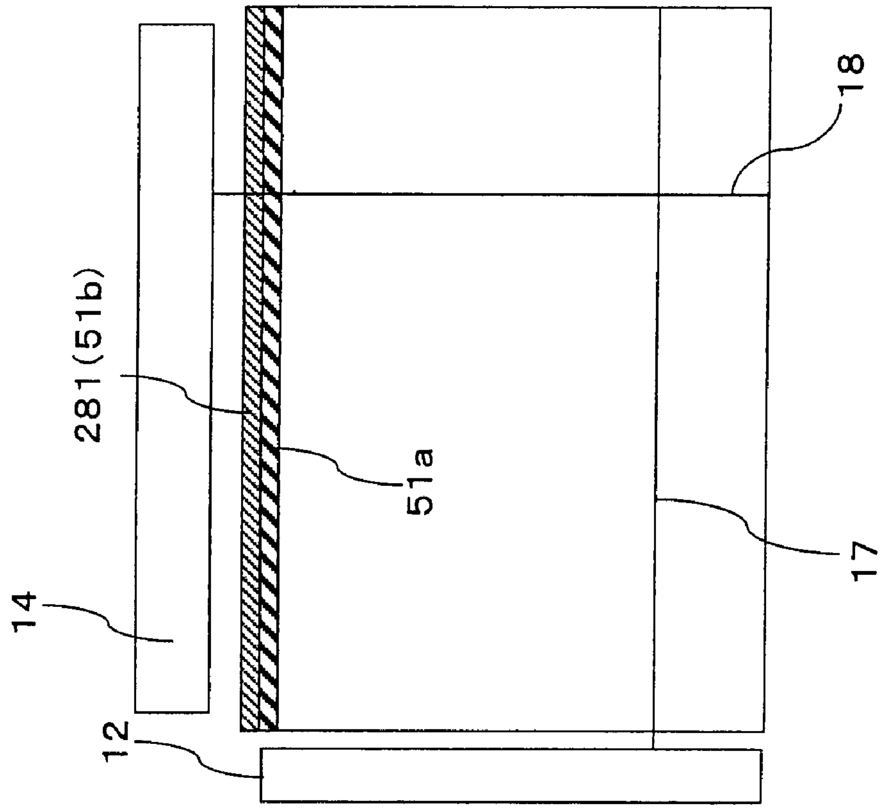

Although it has been stated with reference to FIG. 27 that the dummy pixel (row) 281 is provided (formed or placed) at the bottom of the screen 50, this is not restrictive. For example, the screen is scanned from bottom to top as shown in FIG. 29(*a*). In the case of inverse scanning, a dummy pixel row 281 should also be formed at the top of the screen 50 as shown in FIG. 29(*b*). That is, dummy pixel rows 281 are formed (placed) both at the top and bottom of the screen 50. This configuration accommodates inverse scanning of the screen as well.

Two pixel rows are selected simultaneously in the example described above. The present invention is not limited to this. For example, five pixel rows may be selected simultaneously (see FIG. 23). When five pixel rows are selected simultaneously, four dummy pixel rows 281 should be formed. FIG. 134 is an explanatory diagram illustrating an example. FIG. 134 is an explanatory diagram illustrating a configuration of a lower part of the screen 50. This example relates to simultaneous writing of five pixel rows. Four dummy pixel rows 281 have been formed or placed. The dummy pixel rows 281 do not contain an EL element 15 or the like. The dummy pixel rows 281 contain only pixel transistors (transistors 11*a*, 11*b*, and 11*c*), capacitors 19, and other components which pass programming current. Of course, it goes without saying that gate signal lines 17*b*, EL elements 15, and the like may be formed.

In view of the above, the required number of dummy pixel rows 281 equals the number M of pixel rows selected simultaneously minus 1. For example, if five pixel rows are selected simultaneously, required number of dummy pixel rows is 5−1=4. If ten pixel rows are selected simultaneously, required number of dummy pixel rows is 10−1=9.

FIG. 135 is an explanatory diagram illustrating placement locations of dummy pixel rows in the case where the dummy pixel rows 281 are formed. Basically, assuming inversion driving, dummy pixel rows 281 are placed at the top and bottom of the screen 50.

FIG. 135(*a*) shows formation locations of dummy pixel rows 281 for driving with simultaneous selection of two pixel rows (M=2). FIG. 135(*b*) shows formation locations of dummy pixel rows 281 for driving with simultaneous selection of three pixel rows (M=3). FIG. 135(*c*) shows formation locations of dummy pixel rows 281 for driving with simultaneous selection of four pixel rows (M=4). FIG. 135(*d*) shows formation locations of dummy pixel rows 281 for driving with simultaneous selection of five pixel rows (M=5). Incidentally, if four dummy pixel rows 281 are selected as shown in FIG. 135, driving with simultaneous selection of two to five pixel rows is available.

In the above example of a drive method, different image data is held for each pixel row. Needless to say, the required number of pixel rows is doubled if the same image data is held in two pixel rows. That is, if two pixel rows are selected at a time to scan, twice as many dummy pixel rows are required. Thus, the required number of dummy pixel rows is given by the number M of pixel rows selected simultaneously minus 1, all multiplied by the number of pixel rows into which the same image data is written.

In the above example of a drive method, adjacent pixel rows are selected simultaneously. However, the drive system according to the present invention is not limited to this. FIGS. 136 and 137 show an example of another drive method (drive system) according to the present invention. FIG. 136 shows an example of the drive method which involves simultaneous selection of two pixel rows. In FIG. 136, a dummy pixel row 281 is formed at the bottom of the screen 50 as in the case of FIG. 135.

In a drive method which involves selecting two pixel rows simultaneously, the dummy pixel row 281 formed at the bottom must always be selected. That is, the transistors 11*b* and 11*c* of the dummy pixel row 281 which select the dummy pixel row 281 always remain on.

FIG. 136(*a*) shows a state in which the top of the screen 50 is scanned (programmed with current). FIG. 136(*b*) shows a state in which the center of the screen 50 is scanned (programmed with current). FIG. 136(*c*) shows a state in which the bottom of the screen 50 is scanned (programmed with current). In any of the above cases, the dummy pixel row 281 is selected together. Thus, two pixel rows—the dummy pixel row 281 and the pixel row to be programmed with current—are selected simultaneously and an image is written into them.

With the drive method in FIG. 136, pixel rows in the display area 50 are selected one by one together with the dummy pixel row 281 at a fixed location. Then, currents from the dummy pixel row 281 and selected pixel row are supplied to the source driver IC (circuit) 14 (see FIG. 137). If FIG. 137(*a*) shows a driving state at a certain time point, FIG. 137(*b*) shows state one horizontal scanning period later.

Incidentally, in FIG. 136, the dummy pixel row 281 delivers the same current as the pixel rows 51 selected one after another to the source signal line 18. However, the present invention is not limited to this. The dummy pixel row 281 may deliver a larger current than the pixel rows 51 selected one after another. For example, it may deliver 2 times or 3.5 times larger current.

The magnification of the current delivered by the dummy pixel row 281 to the source signal line 18 can be set by specifying the channel width W and channel length L of the driver transistor 11*a* of the dummy pixel row 281 in design. Increasing W increases the drive current passed through the source signal line 18 and decreasing W decreases the drive current passed through the source signal line 18. Thus, if W/L of the driver transistor 11*a* of the dummy pixel row 281 is made larger than W/L of the driver transistor 11*a* of the pixel 16 in the display area 50, the drive current of the dummy pixel row 281 can be made larger than the drive current of the display area 50. Needless to say, it is preferable to make the drive current of the dummy pixel row 281 larger.

Incidentally, although with the drive method in FIG. 136, the pixel rows to be programmed with current are selected one by one, the present invention is not limited to this. For example, two or more pixel rows may be selected simultaneously as illustrated in FIG. 24.

With the pixel configuration in FIG. 136, since the dummy pixel row 281 is always selected, variations in the dummy pixel row 281 can be reduced, resulting in uniform image display. Incidentally, when reversing the scan direction of images, preferably a dummy pixel row 281 is formed at the top of the screen 50 in FIG. 136.

In the above example, scanning begins with the same pixel row number in every field or frame. NTSC and the like supports interlaced driving. In interlaced driving, one frame consists of two fields and odd-numbered pixel rows are scanned in the first field and even-numbered pixel rows are scanned in the second field.

In an example in FIG. 133, FIG. 133(*a*) shows a method of driving the first field and FIG. 133(*b*) shows a method of driving the second field. The drive method here employs driving with simultaneous selection of two pixel rows described with reference to FIG. 24.

In the first field, two pixel rows are selected simultaneously beginning with the first pixel row and subsequent pixel rows are selected by shifting position. This process is similar to the one described with reference to FIG. 24 and the like, and thus detailed description thereof will be unnecessary.

In the second field, two pixel rows are selected simultaneously beginning with the second pixel row and subsequent pixel rows are selected by shifting position. The point is that the scanning begins with the second pixel row rather than the first pixel row. With interlaced driving, odd-numbered pixel rows are scanned in the first field and even-numbered pixel rows are scanned in the second field. That is, the start position of scanning differs between the first field and second field. Needless to say, a dummy pixel row 281 such as the one described with reference to FIG. 134 and the like may be formed.

The drive method according to the present invention is not limited to simultaneous selection of multiple pixel rows. For example, the speed of writing into pixel rows may be doubled. That is, pixel rows are selected one by one and images on the selected pixel rows are rewritten (see FIG. 13). The same image data is written into adjacent pixel rows. For example, in the first field, the same image is written into the first and second pixel rows. Similarly, the same image is written into the third and fourth pixel rows and the same image is written into the fifth and sixth pixel rows. The above operation is repeated until the 479th and 480th pixel rows to finish writing images into the first field.

In the second field, the same image is written into the second and third pixel rows. Similarly, the same image is written into the fourth and fifth pixel rows and the same image is written into the sixth and seventh pixel rows. The above operation is repeated until the 478th and 479th pixel rows or the 480th and 481st pixel rows to finish writing images into the second field.

The simultaneous selection of multiple pixel rows is not limited to simultaneous selection of two pixel rows. Needless to say, for example, odd-numbered pixel rows (1, 3, 5, 7, 9, . . . , 479) may be scanned in the first field and even-numbered pixel rows (2, 4, 6, 8, 10, . . . , 480) may be scanned in the second field. The even-numbered pixel rows in the first field may be either non-illuminated or scanned in sequence as non-display areas 52, as illustrated in FIG. 24. Also, the odd-numbered pixel rows in the second field may be either non-illuminated or scanned in sequence as non-display areas 52, as illustrated in FIG. 24.

In FIGS. 15 and 21 and the like, pixel rows are selected one by one, being shifted by one pixel row in sync with a horizontal synchronization signal. However, the present invention is not limited to this and it goes without saying that pixel rows may be selected being shifted by two or more pixel rows.

The dummy pixel row configuration or dummy pixel row driving according to the present invention uses one or more dummy pixel rows. Of course, it is preferable to use the dummy pixel row driving and N-fold pulse driving in combination.

Figure 127:
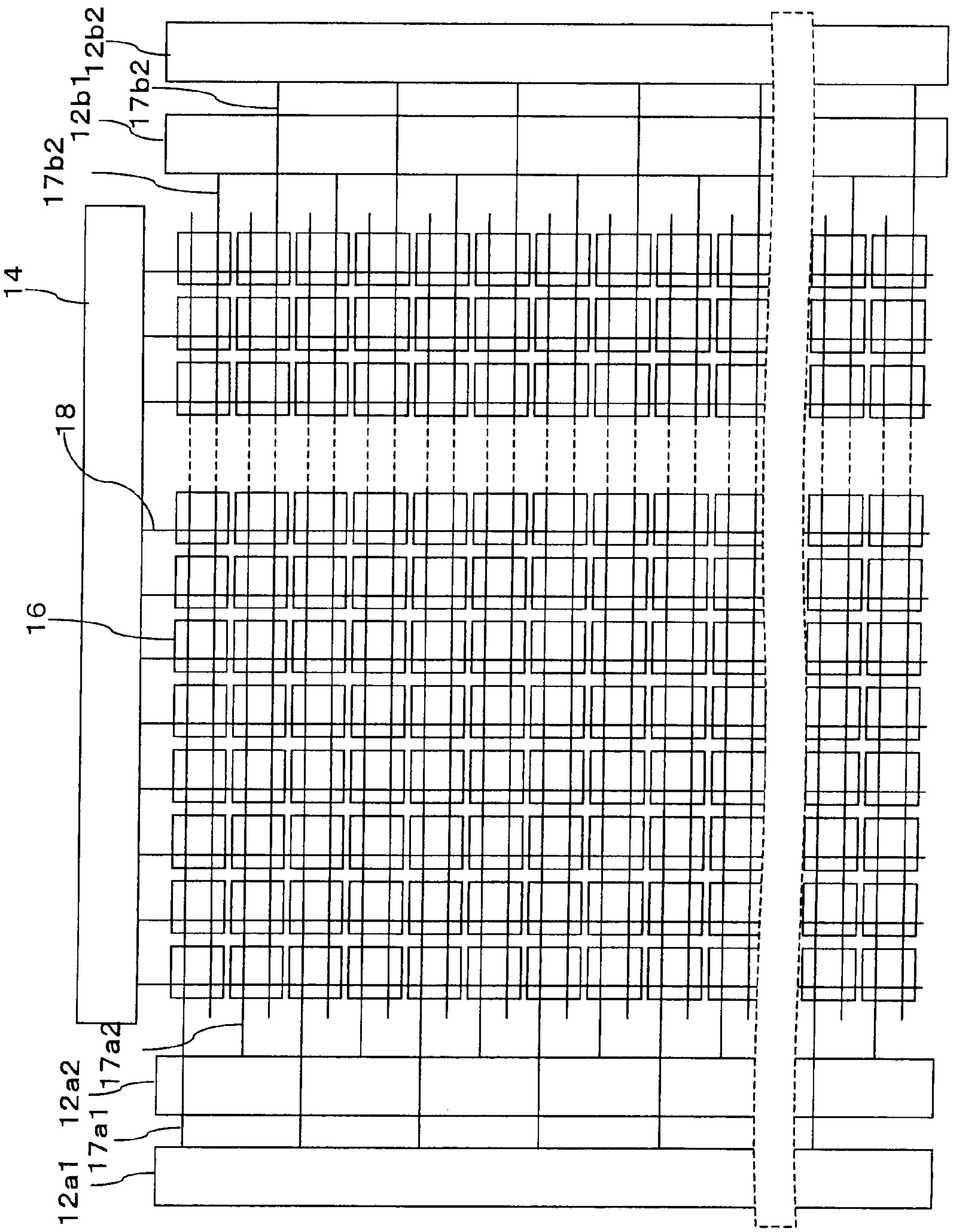

Now, interlaced driving according to the present invention will be described below in more detail. FIG. 127 shows a configuration of the display panel according to the present invention which performs the interlaced driving. In FIG. 127, the gate signal lines 17*a* of odd-numbered pixel rows are connected to a gate driver circuit 12*a*1. The gate signal lines 17*a* of even-numbered pixel rows are connected to a gate driver circuit 12*a*2. On the other hand, the gate signal lines 17*b* of the odd-numbered pixel rows are connected to a gate driver circuit 12*b*1. The gate signal lines 17*b* of the even-numbered pixel rows are connected to a gate driver circuit 12*b*2.

Thus, through operation (control) of the gate driver circuit 12*a*1, image data in the odd-numbered pixel rows are rewritten in sequence. In the odd-numbered pixel rows, illumination and non-illumination of the EL elements are controlled through operation (control) of the gate driver circuit 12*b*1. Also, through operation (control) of the gate driver circuit 12*a*2, image data in the even-numbered pixel rows are rewritten in sequence. In the even-numbered pixel rows, illumination and non-illumination of the EL elements are controlled through operation (control) of the gate driver circuit 12*b*2.

Figure 128:
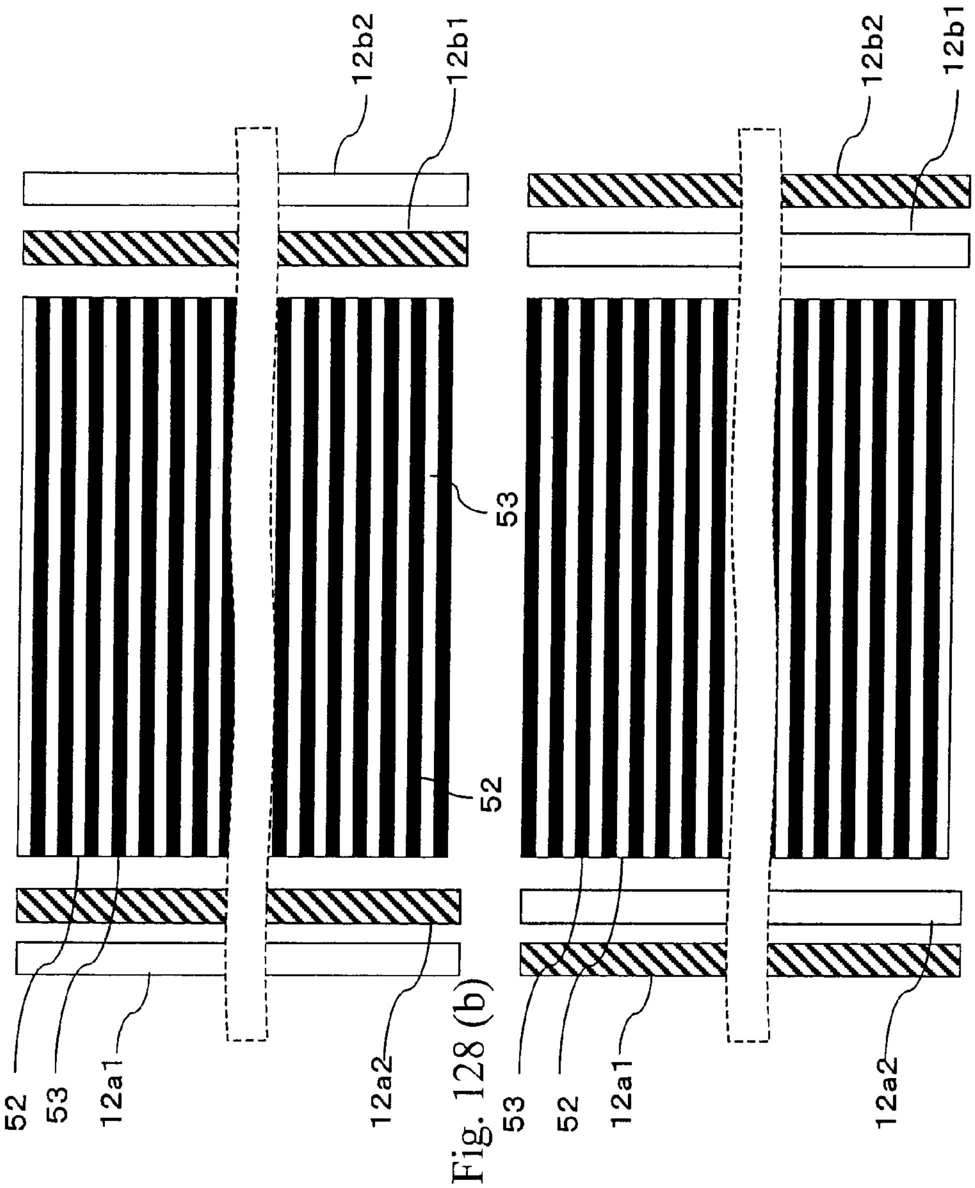

FIG. 128(*a*) shows operating state in the first field of the display panel. FIG. 128(*b*) shows operating state in the second field of the display panel. In FIG. 128, the oblique hatching which marks the gate driver circuits 12 indicates that the gate driver circuits 12 are not taking part in data scanning operation. Specifically, in the first field in FIG. 128(*a*), the gate driver circuit 12*a*1 is operating for write control of programming current and the gate driver circuit 12*b*2 is operating for illumination control of the EL elements 15. In the second field in FIG. 128(*b*), the gate driver circuit 12*a*2 is operating for write control of programming current and the gate driver circuit 12*b*1 is operating for illumination control of the EL elements 15. The above operations are repeated within the frame.

FIG. 129 shows image display status in the first field. FIG. 129(*a*) illustrates write pixel rows (locations of odd-numbered pixel rows programmed with current (voltage)). The location of the write pixel row is shifted in sequence: FIG. 129(*a*1)→(*a*2)→(*a*3). In the first field, odd-numbered pixel rows are rewritten in sequence (image data in the even-numbered pixel rows are retained). FIG. 129(*b*) illustrates display status of odd-numbered pixel rows. Incidentally, FIG. 129(*b*) illustrates only odd-numbered pixel rows. Even-numbered pixel rows are illustrated in FIG. 129(*c*). As can be seen from FIG. 129(*b*), the EL elements 15 of the pixels in the odd-numbered pixel rows are non-illuminated. On the other hand, the even-numbered pixel rows are scanned in both display area 53 and non-display area 52 as shown in FIG. 129(*c*) (N-fold pulse driving).

FIG. 130 shows image display status in the second field. FIG. 130(*a*) illustrates write pixel rows (locations of odd-numbered pixel rows programmed with current (voltage)). The location of the write pixel row is shifted in sequence: FIG. 130(*a*1)→(*a*2)→(*a*3). In the second field, even-numbered pixel rows are rewritten in sequence (image data in the odd-numbered pixel rows are retained). FIG. 130(*b*) illustrates display status of odd-numbered pixel rows. Incidentally, FIG. 130(*b*) illustrates only odd-numbered pixel rows. Even-numbered pixel rows are illustrated in FIG. 130(*c*). As can be seen from FIG. 130(*b*), the EL elements 15 of the pixels in the even-numbered pixel rows are non-illuminated. On the other hand, the odd-numbered pixel rows are scanned in both display area 53 and non-display area 52 as shown in FIG. 130(*c*) (N-fold pulse driving).

In this way, interlaced driving can be implemented easily on an EL display panel. Also, N-fold pulse driving eliminates shortages of write current and blurred moving pictures. Besides, current (voltage) programming and illumination of EL elements 15 can be controlled easily and circuits can be implemented easily.

Incidentally, the drive method according to the present invention is not limited to those shown in FIGS. 129 and 130. For example, a drive method shown in FIG. 131 is also available. In FIGS. 129 and 130, the odd-numbered pixel rows or even-numbered pixel rows being programmed with current (voltage) belong to a non-display area 52 (non-illumination or black display). The example in FIG. 131 involves synchronizing the gate driver circuits 12*b*1 and 12*b*2 which control illumination of the EL elements 15. Needless to say, however, the write pixel row 51 being programmed with current (voltage) belongs to a non-display area (there is no need for this in the case of the current-mirror pixel configuration in FIG. 38). In FIG. 131, since illumination control is common to the odd-numbered pixel rows and even-numbered pixel rows, there is no need to provide two gate driver circuits 12*b*1 and 12*b*2. One gate driver circuit 12*b* alone can perform illumination control.

The drive method in FIG. 131 uses the same illumination control for both odd-numbered pixel rows and even-numbered pixel rows. However, the present invention is not limited to this. FIG. 132 shows an example in which illumination control is varied between odd-numbered pixel rows and even-numbered pixel rows. In FIG. 132, in particular, the illumination mode (display area 53 and non-display area 52) of odd-numbered pixel rows and illumination mode of even-numbered pixel rows have opposite patterns. Thus, the display area 53 and non-display area 52 have the same size. Of course, this is not restrictive.

In the above example, pixel rows are programmed with current (voltage) one by one. However, the drive method according to the present invention is not limited to this. Needless to say, two pixel rows (a plurality of pixel rows) may be programmed with current (voltage) simultaneously as shown in FIG. 133. Also, in FIGS. 130 and 129, it is not strictly necessary that all the pixel rows in the odd-numbered pixel rows or even-numbered pixel rows should be non-illuminated. Needless to say, the pixel rows may be driven as shown in FIG. 66 and the like.

In the drive method which selects two or more pixel rows at a time, the larger the number of pixel rows selected simultaneously, the more difficult it becomes to absorb variations in the characteristics of the transistors 11*a*. However, the current programmed into one pixel increases with decreases in the number of pixel rows selected, resulting in a large current flowing through the EL element 15, which in turn makes the EL element 15 prone to degradation.

Figure 30:
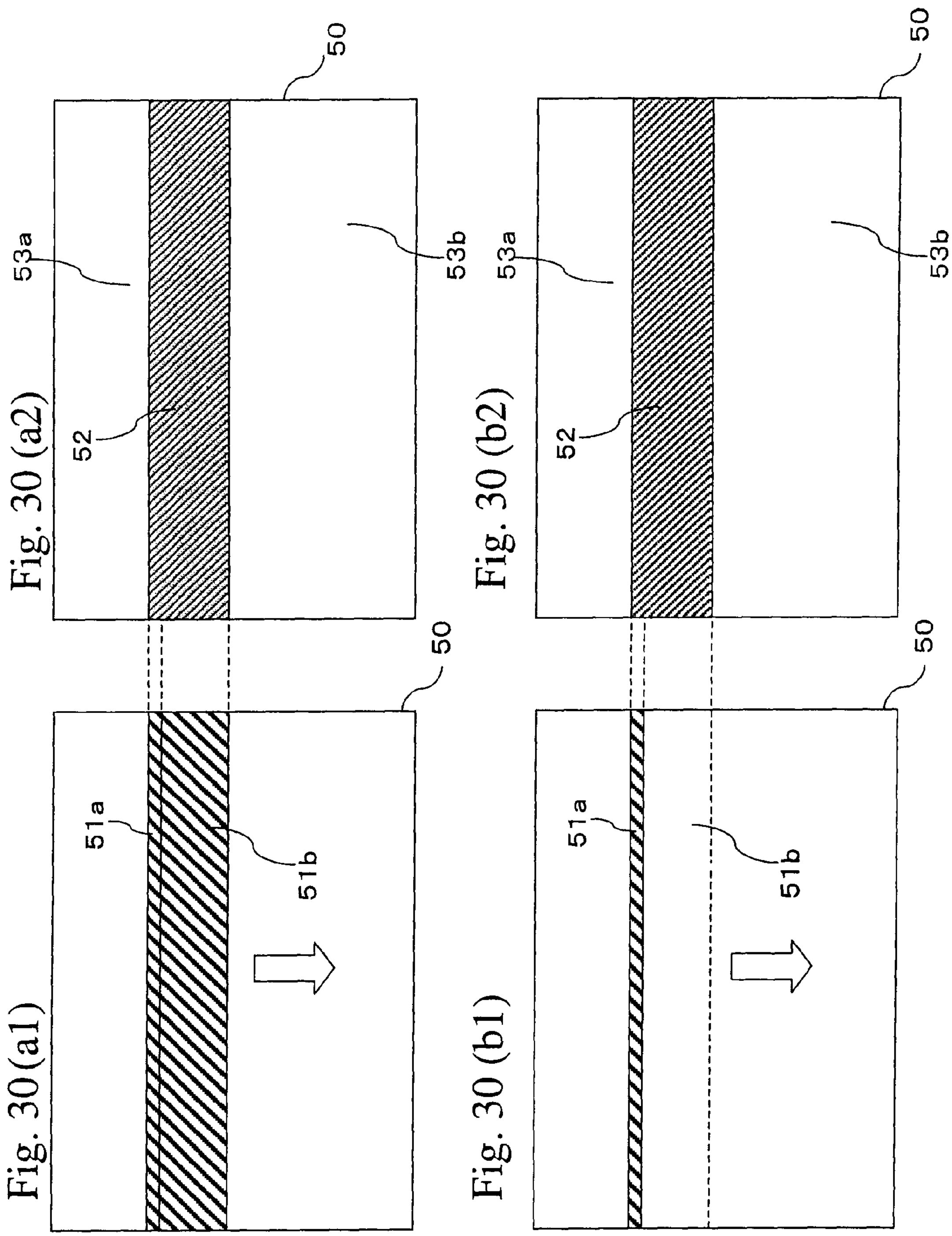
FIG. 30 is an explanatory diagram illustrating a drive method of a display apparatus according to the present invention.

FIG. 30 shows how to solve this problem. The basic concept behind FIG. 30 is to use a method of selecting a plurality of pixel rows simultaneously during ½ H (½ of a horizontal scanning period) as described with reference to FIGS. 22 and 29 and to use a method of selecting one pixel row in the latter ½ H (½ of the horizontal scanning period) as described with reference to FIGS. 5 and 13. This combination makes it possible to absorb variations in the characteristics of the transistors 11$a$ and achieve high speed and uniform surfaces.

Referring to FIG. 30, for ease of understanding, it is assumed that five pixel rows are selected simultaneously in the first period and that one pixel row is selected in the second period. First, as shown in FIG. 30($a$1), in the first period (first ½ H), five pixel rows are selected simultaneously. This operation has been described with reference to FIG. 22, and thus description thereof will be omitted. As an example, it is assumed that the current passed through the source signal line 18 is 25 times as large as a predetermined value. Thus, the transistor 11$a$ in the pixel 16 (in the pixel configuration in FIG. 1) is programmed with a five times larger current (25/5 pixel rows=5). Since the current is 25 times larger, the parasitic capacitance generated in the source signal line 18 and the like is charged and discharged in an extremely short period. Consequently, the potential of the source signal line 18 reaches a target potential in a short period of time and the terminal voltage of the capacitor 19 of each pixel 16 is programmed to pass a 25 times larger current. The 25 times larger current is applied in the first ½ H (½ of the horizontal scanning period).

Naturally, since the same image data is written into the five write pixel rows, the transistors 11$d$ in the five write pixel rows are turned off in order not to display the image. Thus, the display condition is as shown in FIG. 30($a$2).

In the next ½ H period, one pixel is selected for current (voltage) programming. The condition is as shown in FIG. 30($b$). Current (voltage) programming is performed so as to pass a five times larger current through the write pixel row 51$a$ as in the first period. Equal current is passed in FIG. 30($a$1) and FIG. 30($b$1) to reach a target current more quickly by decreasing the changes in the terminal voltage of the programmed capacitor 19.

Specifically, in FIG. 30($a$1), current is passed through a plurality of pixels, approaching an approximate target value quickly. In this first stage, since a plurality of transistors 11$a$ are programmed, variations in the transistors cause error with respect to the target value. In the second stage, only a pixel row where data will be written and held is selected and complete programming is performed by changing the value of current from the approximate target value to a predetermined target value.

Incidentally, scanning of the non-illuminated area 52 from top to bottom of the screen and scanning of the write pixel rows 51$a$ from top to bottom of the screen are performed in the same manner as in examples in FIG. 13 and the like, and thus description thereof will be omitted.

Figure 31:
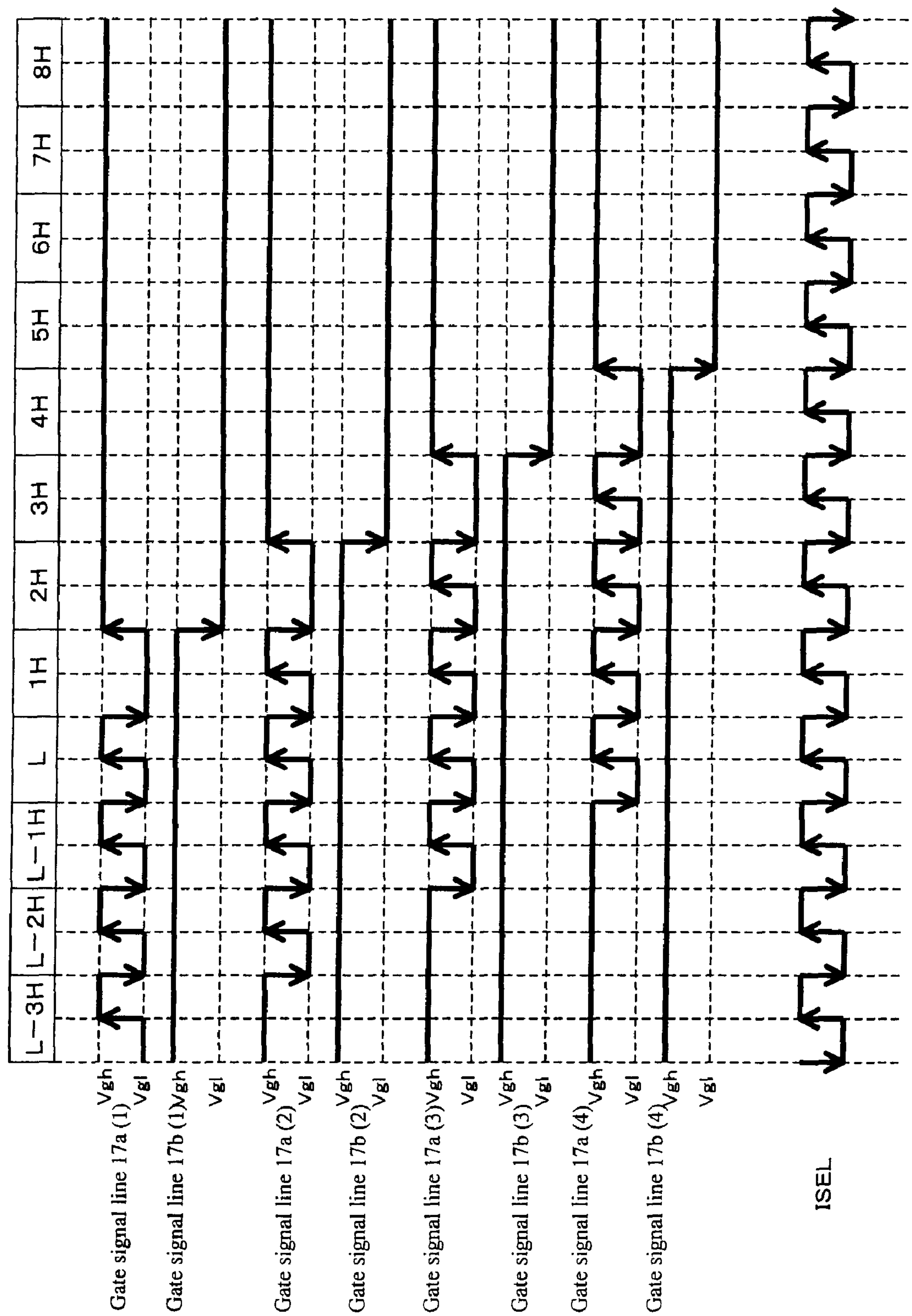
FIG. 31 is an explanatory diagram illustrating a drive method of a display apparatus according to the present invention.

FIG. 31 shows drive waveforms used to implement the drive method shown in FIG. 30. As can be seen from FIG. 31, 1 H (one horizontal scanning period) consists of two phases. An ISEL signal is used to switch between the two phases. The ISEL signal is illustrated in FIG. 31.

First, the ISEL signal will be described. The driver circuit 14 which performs operations shown in FIG. 30 comprises a current output circuit A and current output circuit B. Each of the current output circuits consists of a D/A circuit which converts 8-bit gradation data from digital to analog, an operation amplifier, etc. In the example in FIG. 30, the current output circuit A is configured to output 25 times larger current. On the other hand, the current output circuit B is configured to output 5 times larger current. Outputs from the current output circuit A and current output circuit B are controlled by a switch circuit formed (placed) in a current output section through the ISEL signals and are applied to the source signal line 18. Such current output circuits are placed on each source signal line 18.

When the ISEL signal is low, the current output circuit A which outputs 25 times larger current is selected and current from the source signal line 18 is absorbed by the source driver IC 14 (more precisely, the current is absorbed by the current output circuit A formed in the source driver IC 14). The magnification (such as x25 or x5) of the current from the current output circuits can be adjusted easily using a plurality of resisters and an analog switch.

As shown in FIG. 30, when the write pixel row is the (1)-th pixel row (see the 1 H column in FIG. 31), the gate signal lines 17$a$(1), (2), (3), (4), and (5) are selected (in the case of configuration shown in FIG. 1). That is, the switching transistors 11$b$ and the transistors 11$c$ in the pixel rows (1), (2), (3), (4), and (5) are on. Besides, since ISEL is low, the current output circuit A which outputs 25 times larger current is selected and connected to the source signal line 18. Also, a turn-off voltage (Vgh) is applied to the gate signal line 17$b$. Thus, the switching transistors 11$d$ in the pixel rows (1), (2), (3), (4), and (5) are off and current does not flow through the EL elements 15 in the corresponding pixel rows. That is, the EL elements 15 are in non-illumination mode 52.

Ideally, the transistors 11$a$ in the five pixels deliver a current of Iw×2 each to the source signal line 18. Then, the capacitor 19 of each pixel 16 is programmed with a five times larger current. For ease of understanding, it is assumed here that the transistors have equal characteristics (Vt and S value).

Since five pixel rows are selected simultaneously (K=5), five driver transistors 11$a$ operate. That is, 25/5=5 times larger current flows through the transistor 11$a$ per pixel. The total programming current of the five transistors 11$a$ flows through the source signal line 18. For example, if the current written into the write pixel row 51$a$ by a conventional drive method is Iw, a current of Iw×25 is passed through the source signal line 18. The write pixel rows 51$b$ into which image data is written later than the write pixel row (1) are auxiliary pixel rows used to increase the amount of current delivered to the source signal line 18. However, there is no problem because regular image data is written into the write pixel rows 51$b$ later.

Thus, the pixel rows 51$b$ provide the same display as the pixel row 51$a$ during a period of 1 H. Consequently, at least the write pixel row 51$a$ and the pixel rows 51$b$ selected to increase current are in non-display mode 52.

In the next ½ H period (½ of the horizontal scanning period), only the write pixel row 51$a$ is selected. That is, only the (1)-th pixel row is selected. As can be seen from FIG. 31, a turn-on voltage (Vgl) is applied only to the gate signal line 17$a$(1) and a turn-off voltage (Vgh) is applied to the gate signal lines 17$a$(2), (3), (4), and (5). Thus, the transistor 11$a$ in the pixel row (1) is in operation (supplying current to the source signal line 18), but the switching transistors 11$b$ and the transistors 11$c$ in the pixel rows (2), (3), (4), and (5) are off. That is, they are non-selected. Besides, since ISEL is high, the current output circuit B which outputs 5 times larger current is selected and connected to the source signal line 18. Also, a turn-off voltage (Vgh) is applied to the gate signal line 17$b$, which is in the same state as during the first ½ H. Thus, the switching transistors 11$d$ in the pixel rows (1), (2), (3), (4), and (5) are off and current does not flow through the EL elements 15 in the corresponding pixel rows. That is, the EL elements 15 are in non-illumination mode 52.

Thus, each transistor 11$a$ in the pixel row (1) deliver a current of Iw×5 to the source signal line 18. Then, the capacitor 19 in pixel row (1) is programmed with a 5 times larger current.

In the next horizontal scanning period, the write pixel row shifts by one. That is, the pixel row (2) becomes the current write pixel row. During the first ½ H period, when the write pixel row is the (2)-th pixel row, the gate signal lines 17$a$(2), (3), (4), and (5) and (6) are selected. That is, the switching transistors 11$b$ and the transistors 11$c$ in the pixel rows (2), (3), (4), (5), and (6) are on. Besides, since ISEL is low, the current output circuit A which outputs 25 times larger current is selected and connected to the source signal line 18. Also, a turn-off voltage (Vgh) is applied to the gate signal line 17$b$. Thus, the switching transistors 11$d$ in the pixel rows (2), (3), (4), (5), and (6) are off and current does not flow through the EL elements 15 in the corresponding pixel rows. That is, the EL elements 15 are in non-illumination mode 52. On the other hand, since Vgl voltage is applied to the gate signal line 17$b$(1) of the pixel row (1), the transistor 11$d$ is on and the EL element 15 in the pixel row (1) illuminates.

Since five pixel rows are selected simultaneously (K=5), five driver transistors 11$a$ operate. That is, 25/5=5 times larger current flows through the transistor 11$a$ per pixel. The total programming current of the five transistors 11$a$ flows through the source signal line 18.

In the next ½ H period (½ of the horizontal scanning period), only the write pixel row 51$a$ is selected. That is, only the (2)-th pixel row is selected. As can be seen from FIG. 31, a turn-on voltage (Vgl) is applied only to the gate signal line 17$a$(2) and a turn-off voltage (Vgh) is applied to the gate signal lines 17$a$ (3), (4), (5), and (6). Thus, the transistors 11$a$ in the pixel rows (1) and (2) are in operation (the pixel row (1) supplies current to the EL element 15 and the pixel row (2) supplies current to the source signal line 18), but the switching transistors 11$b$ and the transistors 11$c$ in the pixel rows (3), (4), (5), and (6) are off. That is, they are non-selected. Besides, since ISEL is high, the current output circuit B which outputs 5 times larger current is selected and the current output circuit B is connected to the source signal line 18. Also, a turn-off voltage (Vgh) is applied to the gate signal line 17$b$, which is in the same state as during the first ½ H. Thus, the switching transistors 11$d$ in the pixel rows (2), (3), (4), (5), and (6) are off and current does not flow through the EL elements 15 in the corresponding pixel rows. That is, the EL elements 15 are in non-illumination mode 52.

Thus, each transistor 11$a$ in the pixel row (1) deliver a current of Iw×5 to the source signal line 18. Then, the capacitor 19 in each pixel row (1) is programmed with a 5 times larger current. The entire screen is drawn as the above operations are performed in sequence.

The drive method described with reference to FIG. 30 selects G pixel rows (G is 2 or larger) in the first period and does programming in such a way as to pass N times larger current through each pixel row. In the second period, the drive method selects B pixel rows (B is smaller than G, but not smaller than 1) and does programming in such a way as to pass an N times larger current through the pixels.

Another scheme is also available. It selects G pixel rows (G is 2 or larger) in the first period and does programming in such a way that the total current in all the pixel rows will be an N times larger current. In the second period, this scheme selects B pixel rows (B is smaller than G, but not smaller than 1) and does programming in such a way that the total current in the selected pixel rows (the current in the one pixel row if one pixel row is selected) will be an N times larger current. For example, in FIG. 30($a$1), five pixel rows are selected simultaneously and a twice larger current is passed through the transistor 11$a$ in each pixel. Thus, 5×2=10 times larger current flows through the source signal line 18. In the second period, one pixel row is selected in FIG. 30($b$1). A 10 times larger current is passed through the transistor 11$a$ in this pixel.

Incidentally, although a plurality of pixel rows are selected simultaneously in a period of ½ H and a single pixel row is selected in a period of ½ H in FIG. 31, this is not restrictive. A plurality of pixel rows may be selected simultaneously in a period of ¼ H and a single pixel row may be selected in a period of ¾ H. Also, the sum of the period in which a plurality of pixel rows are selected simultaneously and the period in which a single pixel row is selected is not limited to 1 H. For example, the total period may be 2 Hs or 1.5 Hs.

In FIG. 30, it is also possible to select two pixel rows simultaneously in the second period after selecting five pixel rows simultaneously in the first ½ H. This can also achieve a practically acceptable image display.

In FIG. 30, pixel rows are selected in two stages—five pixel rows are selected simultaneously in the first ½ H period and a single pixel row is selected in the second ½ H period, but this is not restrictive. For example, it is also possible to select five pixel rows simultaneously in the first stage, select two of the five pixel rows in the second stage, and finally select one pixel row in the third stage. In short, image data may be written into pixel rows in two or more stages.

In the example described above, pixel rows are selected one by one and programmed with current, or two or more pixel rows are selected at a time and programmed with current. However, the present invention is not limited to this. It is also possible to use a combination of the two methods according to image data: the method of selecting pixel rows one by one and programming them with current and the method of selecting two or more pixel rows at a time and programming them with current.

FIG. 126 combines a drive system which selects pixel rows one by one and a drive method which selects multiple pixel rows one by one. In the case where multiple pixel rows are selected at a time, it is assumed for ease of understanding that two pixel rows are selected simultaneously as illustrated in FIG. 126($a$2). Thus, one dummy pixel row 281 each is formed at the top and bottom of the screen. The drive system which selects pixel rows one by one does not need to use dummy pixel rows.

Incidentally, for ease of understanding, it is assumed that the source driver IC 14 in FIG. 126($a$1) (one pixel row is selected) and FIG. 126($a$2) (two pixel rows are selected) output equal currents. Thus, the drive system which selects two pixel rows at a time as shown in FIG. 126($a$2) provides half the screen brightness compared to the drive system which selects pixel rows one by one as shown in FIG. 126($a$1). To provide equal screen brightness, the duty ratio in FIG. 126 ($a$2) can be doubled (e.g., if the duty ratio in FIG. 126($a$1) is 1/2, the duty ratio in FIG. 126($a$2) can be set to 1/1=1/2×2). Also, the magnitude of the reference current inputted in the source driver IC 14 can be varied twice as much. Alternatively, the programming current can be doubled.

FIG. 126($a$1) shows a typical drive method according to the present invention. If input video signals are non-interlaced (progressive) signals, the drive system in FIG. 126($a$1) is used. If input video signals are interlaced signals, the drive system in FIG. 126($a$2) is used. Also, if video signals have low image resolution, the drive system in FIG. 126($a$2) is used. It is also possible to use the drive method in FIG. 126($a$2) for moving pictures and the drive method in FIG. 126($a$1) for still pictures. The drive method in FIG. 126($a$1) and drive method in FIG. 126(*a*2) can be switched easily by controlling the start pulse supplied to the gate driver circuit 12.

A problem is that the drive system which selects two pixel rows at a time as shown in FIG. 126(*a*2) provides half the screen brightness compared to the drive system which selects pixel rows one by one (FIG. 126(*a*1)). To provide equal screen brightness, the duty ratio in FIG. 126(*a*2) can be doubled (e.g., if the duty ratio in FIG. 126(*a*1) is 1/2, the duty ratio in FIG. 126(*a*2) can be set to 1/1=1/2×2). That is, the proportions of the non-display area 52 and display area 53 in FIG. 126(*b*) can be varied.

The proportions of the non-display area 52 and display area 53 can be varied easily by controlling the start pulse supplied to the gate driver circuit 12. That is, the drive mode in FIG. 126(*b*) can be varied according the display mode in FIGS. 126(*a*1) and 126(*a*2).

Incidentally, FIG. 126(*a*2) shows a drive method which drives two pixels at a time sequentially. However, there is no need to select adjacent pixel rows and two nonadjacent pixel rows may be selected for sequential scanning as shown in FIG. 123.

The N-fold pulse driving method according to the present invention mentioned above uses the same waveform for the gate signal lines 17*b* of different pixel rows and applies current by shifting the pixel rows at 1 H intervals. The use of such scanning makes it possible to shift illuminating pixel rows in sequence with the illumination duration of the EL elements 15 fixed to 1 F/N. It is easy to shift pixel rows in this way while using the same waveform for the gate signal lines 17*b* of the pixel rows. It can be done by simply controlling data ST1 and ST2 applied to the shift register circuits 61*a* and 61*b* in FIG. 6. For example, if Vgl is output to the gate signal line 17*b* when input ST1 is low and Vgh is output to the gate signal line 17*b* when input ST1 is high, ST2 applied to the shift register circuit 61*b* can be set low for a period of 1 F/N and set high for the remaining period. Then, inputted ST2 can be shifted using a clock CLK2 synchronized with 1 H.

Incidentally, the EL elements 15 must be turned on and off at intervals of 0.5 msec or longer. Short intervals will lead to insufficient black display due to persistence of vision, resulting in blurred images and making it look as if the resolution has lowered. This also represents a display state of a data holding display. However, increasing the on/off intervals to 100 msec will cause flickering. Thus, the on/off intervals of the EL elements must be not shorter than 0.5 msec and not longer than 100 msec. More preferably, the on/off intervals should be from 2 msec to 30 msec (both inclusive). Even more preferably, the on/off intervals should be from 3 msec to 20 msec (both inclusive).

As also described above, an undivided black screen 152 achieves good movie display, but makes flickering of the screen more noticeable. Thus, it is desirable to divide the black insert into multiple parts. However, too many divisions will cause moving pictures to blur. The number of divisions should be from 1 to 8 (both inclusive). More preferably, it should be from 1 to 5 (both inclusive).

Incidentally, it is preferable that the number of divisions of a black screen can be varied between still pictures and moving pictures. When N=4, 75% is occupied by a black screen (non-display area 52) and 25% is occupied by image display (display area 53). When the number of divisions is 1, a strip of black display (non-display area 52) which makes up 75% is scanned vertically. When the number of divisions is 3, three blocks are scanned, where each block consists of a black screen which makes up 25% and a display screen which makes up 25/3 percent. The number of divisions is increased for still pictures and decreased for moving pictures. The switching can be done either automatically according to input images (detection of moving pictures) or manually by the user. Alternatively, the switching can be done according to input outlet contents such as video on the display apparatus.

For example, on cell phones, which use still pictures for wallpapers and input screens, the number of divisions should be 10 or more (in extreme cases, the display may be turned on and off every 1 H). When displaying moving pictures in NTSC format, the number of divisions should be from 1 to 5 (both inclusive). Preferably, the number of divisions can be switched in three or more steps; for example, 0, 2, 4, 8, 16 divisions, and so on. Preferably, the number of divisions can be varied from 0 to half the number of displayed scanning lines. Preferably, the number of divisions can be changed in real time according to contents of image data. It is also possible to allow the user to change the number of divisions with a changeover switch or the like. It is also possible to allow the number of divisions to be changed in real time according to the brightness of extraneous light.

Preferably, the ratio of the black screen to the entire display screen should be from 0.2 to 0.9 (from 1.2 to 9 in terms of N) both inclusive when the area of the entire screen is taken as 1. More preferably, the ratio should be from 0.25 to 0.6 (from 1.25 to 6 in terms of N) both inclusive. If the ratio is 0.20 or less, movie display is not improved much. When the ratio is 0.9 or more, the display part becomes bright and its vertical movements become liable to be recognized visually.

Also, preferably, the number of frames per second is from 10 to 100 (10 Hz to 100 Hz) both inclusive. More preferably, it is from 12 to 65 (12 Hz to 65 Hz) both inclusive. When the number of frames is small, flickering of the screen becomes conspicuous while too large a number of frames makes writing from the source driver circuit 14 and the like difficult, resulting in deterioration of resolution.

In any case, the present invention allows the brightness of images to be varied by controlling the gate signal lines 17. However, needless to say, the brightness of images may be varied by varying the current (voltage) applied to the source signal lines 18. It goes without saying that the two methods described above (FIGS. 33 and 35 and the like) may be used in combination: the method of controlling the gate signal lines 17 and the method of varying the current (voltage) applied to the source signal lines 18.

Figure 43:
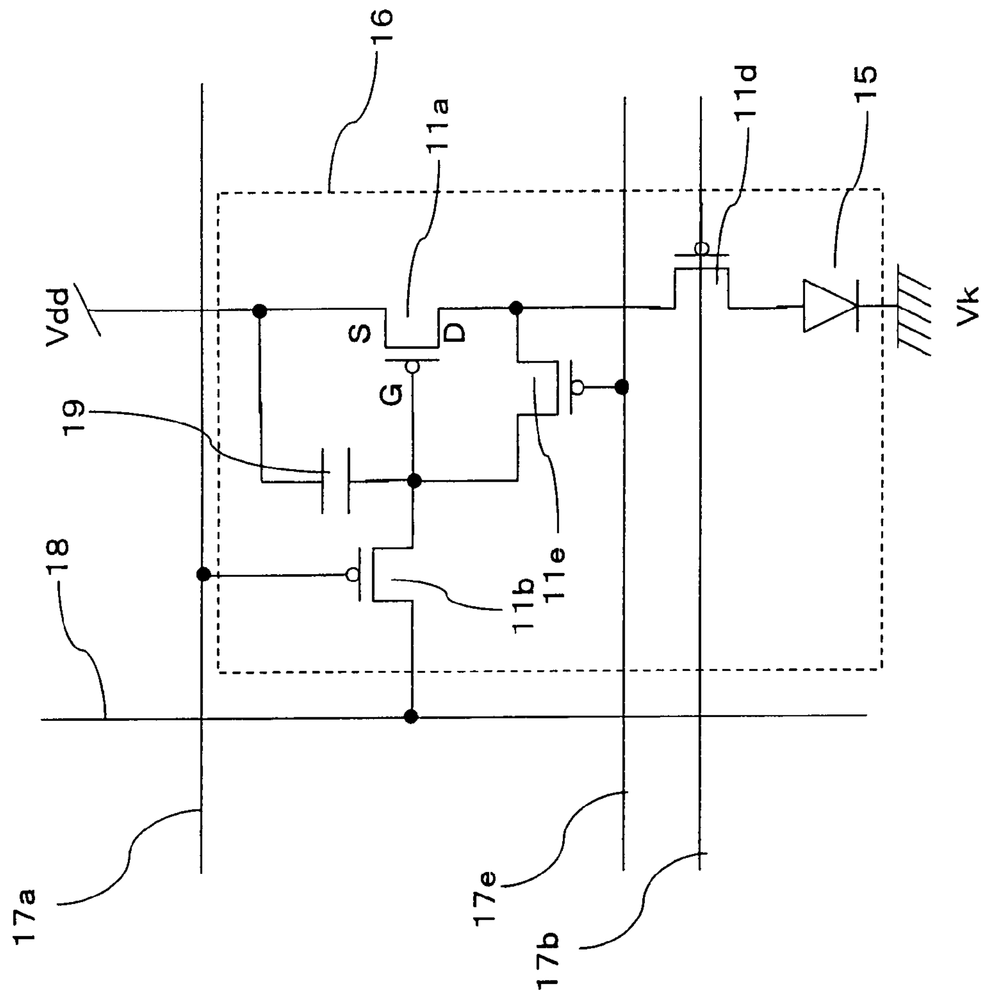
FIG. 43 is a block diagram of a pixel in a display panel according to the present invention.
Figure 54:
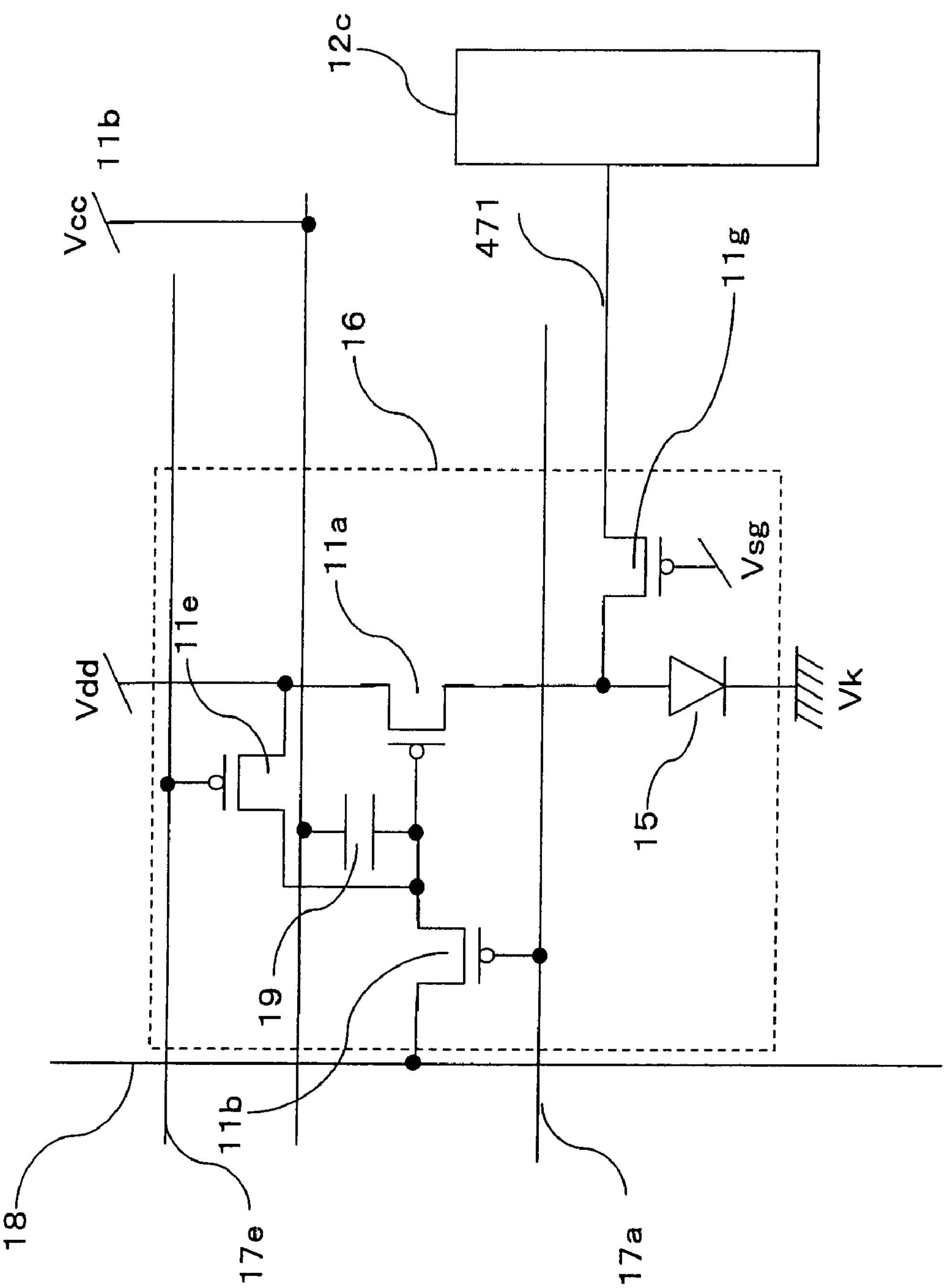
FIG. 54 is a block diagram of a pixel in a display panel according to the present invention.

Needless to say, the above items also apply to the pixel configurations for current programming in FIG. 38 and the like as well as to the pixel configurations for voltage programming in FIGS. 43, 51, 54, and the like. This can be accomplished through on/off control of the transistor 11*d* in FIG. 38, transistor 11*d* in FIG. 43, and transistor 11*e* in FIG. 51. This can also be accomplished by switching the connection terminal of the changeover switch 631 in FIG. 63. In this way, by turning on and off the wiring which delivers current to the EL elements 15, the N-fold pulse driving according to the present invention can be implemented easily.

Also, the gate signal line 17*b* may be set to Vgl for a period of 1 F/N anytime during the period of 1 F (not limited to 1 F. Any unit time will do). This is because a predetermined brightness is obtained by turning off the EL element 15 for a predetermined period out of a unit time. However, it is preferable to set the gate signal line 17*b* to Vgl and illuminate the EL element 15 immediately after the current programming period (1 H). This will reduce the effect of retention characteristics of the capacitor 19 in FIG. 1.

Also, preferably the number of screen divisions is configured to be variable. For example, when the user presses a brightness adjustment switch or turns a brightness adjustment knob, the value of K, which is the number of divisions, may be changed in response. Alternatively, the value of K may be changed manually or automatically depending on images or data to be displayed.

In this way, the mechanism for changing the value of K (the number of divisions of the image display part 53) can be implemented easily. This can be achieved by simply making the time to change ST (when to set ST low during 1 F) adjustable or variable.

Incidentally, although it has been stated with reference to FIG. 16 and the like that a period (1 F/N) during which the gate signal line 17*b* is set to Vgl is divided into a plurality of parts (K parts) and that a period of 1 F/(K/N) during which the gate signal line 17*b* is set to Vgl repeats K times, this is not restrictive. A period of 1 F/(K/N) may be repeated L ($L \neq K$) times. In other words, the present invention displays the image 50 by controlling the period (time) during which current is passed through the EL element 15. Thus, the idea of repeating the 1 F/(K/N) period L ($L \neq K$) times is included in the technical idea of the present invention. Also, by varying the value of L, the brightness of the image 50 can be changed digitally. For example, there is a 50% change of brightness (contrast) between L=2 and L=3. The control described here is also applicable to other examples of the present invention (of course, it is applicable to what is described later herein). These are also included in the N-fold pulse driving according to the present invention.

The above examples involve placing (forming) the transistor 11*d* serving as a switching element between the EL element 15 and driver transistor 11*a* and turning on and off the screen 50 by controlling the transistor 11*d*. This drive method eliminates shortages of write current in black display condition during current programming and thereby achieves proper resolution or black display. That is, in current programming, it is important to achieve proper black display. The drive method described next achieves proper black display by resetting the driver transistor 11*a*. This example will be described below with reference to FIG. 32.

Figure 32:
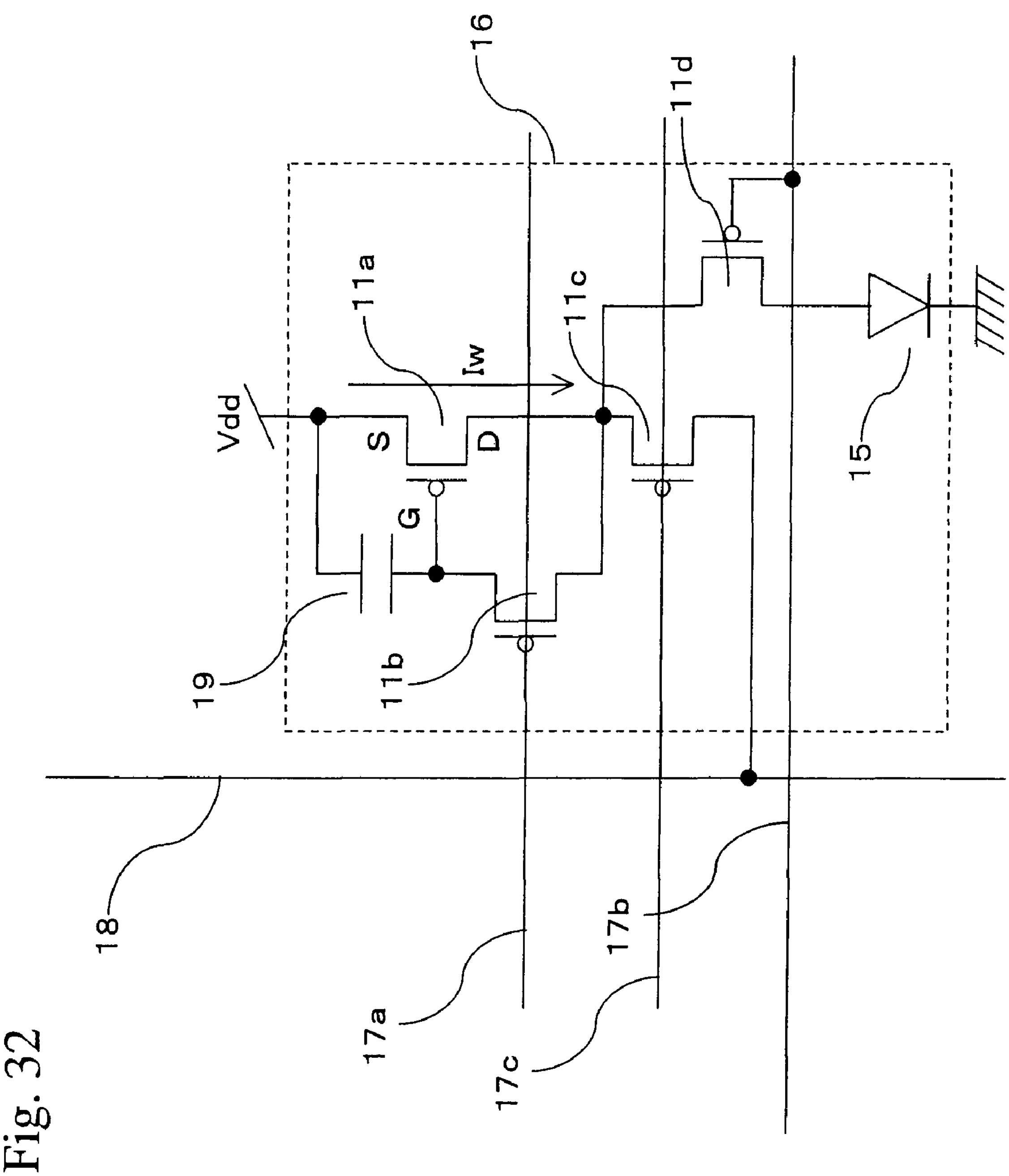
FIG. 32 is an explanatory diagram illustrating a drive method of a display apparatus according to the present invention.

The pixel configuration in FIG. 32 is basically the same as the one shown in FIG. 1. With the pixel configuration in FIG. 32, a programmed 1*w* current flows through the EL element 15, illuminating the EL element 15. By being programmed, the driver transistor 11*a* retains a capability to pass current. The drive system shown in FIG. 32 resets (turns off) the transistor 11*a* using this capability to pass current. Hereinafter, this drive system will be referred to as reset driving.

To implement reset driving using the pixel configuration shown in FIG. 1, the transistors 11*b* and 11*c* must be able to be switched on and off independently of each other. Specifically, as illustrated in FIG. 32, it is necessary to be able to independently control the gate signal line 11*a* (gate signal line WR) used for on/off control of the transistor 11*b* and the gate signal line 11*c* (gate signal line EL) used for on/off control of the transistor 11*c*. The gate signal lines 11*a* and 11*c* can be controlled using two independent shift registers 61 as illustrated in FIG. 6.

Preferably, the drive voltage should be varied between the gate signal line WR and the gate signal line EL. The amplitude value (difference between turn-on voltage and turn-off voltage) of the gate signal line WR should be smaller than the amplitude value of the gate signal line EL. Basically, too large an amplitude value of the gate signal line will increase penetration voltage between the gate signal line and pixel, resulting in an insufficient black level. The amplitude of the gate signal line WR can be controlled by controlling the time when the potential of the source signal line 18 is not applied (or is applied (during selection)) to the pixel 16. Since changes in the potential of the source signal line 18 are small, the amplitude value of the gate signal line WR can be made small. On the other hand, the gate signal line EL is used for on/off control of EL. Thus, its amplitude value becomes large. For this, output voltage is varied between the shift register circuits 61*a* and 61*b*. If the pixel is constructed of P-channel transistors, approximately equal Vgh (turn-off voltage) is used for the shift register circuits 61*a* and 61*b* while Vgl (turn-on voltage) of the shift register circuit 61*a* is made lower than Vgl (turn-on voltage) of the shift register circuit 61*b*.

Figure 33:
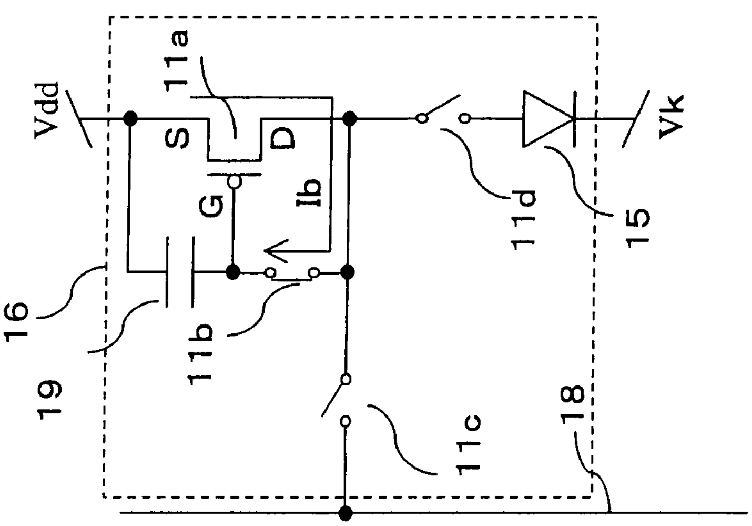
FIG. 33 is an explanatory diagram illustrating a drive method of a display apparatus according to the present invention.
Figure 33:
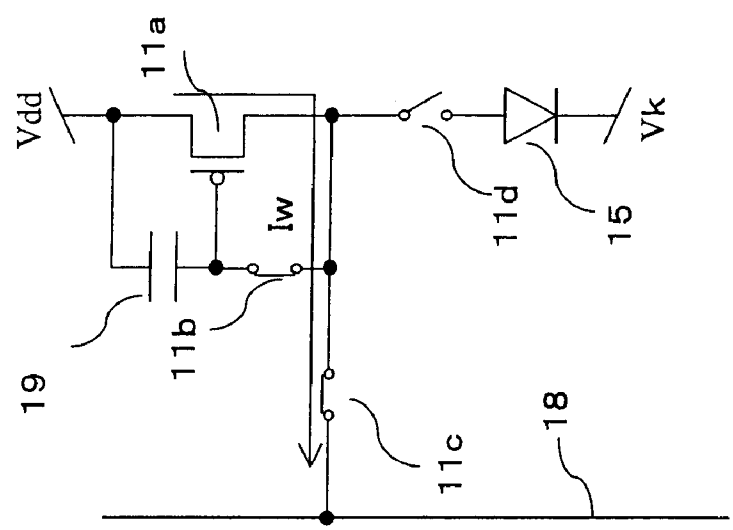
Figure 33:
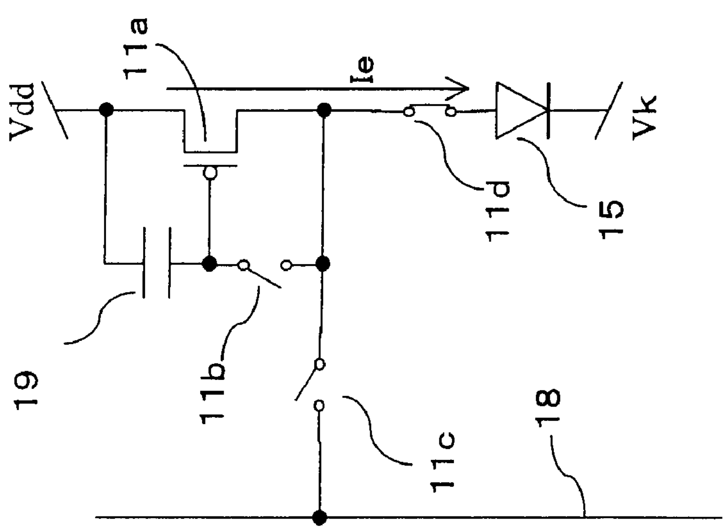

Reset driving will be described below with reference to FIG. 33. FIG. 33 is a diagram illustrating a principle of reset driving. First, as illustrated in FIG. 33(*a*), the transistors 11*c* and 11*d* are turned off and the transistor 11*b* is turned on. As a result, the drain (D) terminal and gate (G) terminal of the driver transistor 11*a* are short-circuited, allowing a current Ib to flow. Generally, the transistor 11*a* has been programmed with current in the previous field (frame) and capable of flowing the current. In this state, as the transistor 11*d* is turned off and the transistor 11*b* is turned on, the drive current Ib flows through the gate (G) terminal of the transistor 11*a*. Consequently, the gate (G) terminal and drain (D) terminal of the transistor 11*a* have the same potential, resetting the transistor 11*a* (to a state in which no current flows).

The reset mode (in which no current flows) of the transistor 11*a* is equivalent to a state in which an offset voltage is held in voltage offset canceling mode described with reference to FIG. 51 and the like. That is, in the state in FIG. 33(*a*), the offset voltage is held between the terminals of the capacitor 19. The offset voltage varies with the characteristics of the transistor 11*a*. Thus, in FIG. 33(*a*), a state in which the transistor 11*a* does not pass current is maintained in the capacitor 19 in each pixel (i.e., the transistor 11*a* passes a black display current close to zero).

Incidentally, before the operation in FIG. 33(*a*), it is preferable to turn off the transistors 11*b* and 11*c*, turn on the transistor 11*d*, and pass current through the driver transistor 11*a*. Preferably, this operation should be done in a minimum time. Otherwise, there is a fear that a current will flow through the EL element 15, illuminating the EL element 15, and thereby lowering display contrast. Preferably, the operating time here is from 0.1% to 10% of 1 H (one horizontal scanning period) both inclusive. More preferably, it is from 0.2% to 2% or from 0.2 μsec to 5 μsec (both inclusive). Also, this operation (the operation to be performed before the operation in FIG. 33(*a*)) may be performed on all the pixels 16 of the screen at once. This operation will lower the drain (D) terminal voltage of the driver transistor 11*a*, making it possible to pass the current Ib smoothly in the state shown in FIG. 33(*a*). Incidentally, the above items also apply to other reset driving according to the present invention.

As the operation time of FIG. 33(*a*) becomes longer, a larger Ib current tends to flow, reducing the terminal voltage of the capacitor 19. Thus, the operation time of FIG. 33(*a*) should be fixed. It has been shown experimentally and analytically that preferably the operation time in FIG. 33(*a*) is from 1 H to 5 Hs (both inclusive). Preferably, this period should be varied among R, G, and B pixels. This is because EL material varies among different colors and rising voltage varies among different EL materials. Optimum periods suitable for EL materials should be specified separately for the R, G, and B pixels. Although it has been stated that the period should be from 1 H to 5 Hs (both inclusive) in this example, it goes without saying that the period may be 5 Hs or longer in the case of a drive system which mainly concerns black insertion (writing of a black screen). Incidentally, the longer the period, the better the black display condition of pixels.

A state shown in FIG. 33(*b*) occurs during a period of 1 H to 5 Hs (both inclusive) after the state in FIG. 33(*a*). FIG. 33(*b*) shows a state in which the transistors 11*c* and 11*b* are on and the transistor 11*d* is off. This is a state in which current programming is being performed, as described earlier. Specifically, a programming current Iw is output (or absorbed) from the source driver circuit 14 and passed through the driver transistor 11*a*. The potential of the gate (G) terminal of the driver transistor 11*a* is set so that the programming current Iw flows (the set potential is held in the capacitor 19).

If the programming current Iw is 0 A, the transistor 11*a* is held in the state in FIG. 33(*a*) in which it does not pass current, and thus a proper black display is achieved. Also, when performing current programming for white display in FIG. 33(*b*), the current programming is started from offset voltage of completely black display even if there are variations in the characteristics of driver transistors in pixels. Thus, the time required to reach a target current value becomes uniform according to gradations. This eliminates gradation errors due to variations in the characteristics of the transistors 11*a*, making it possible to achieve proper image display.

After the programming in FIG. 33(*b*), the transistors 11*b* and 11*c* are turned off in sequence and the transistor 11*d* is turned on to deliver the programming current Iw (=Ie) to the EL element 15 from the driver transistor 11*a*, and thereby illuminate the EL element 15. What is shown in FIG. 33(*c*) has already been described with reference to FIG. 1 and the like, and thus detailed description thereof will be omitted.

The drive system (reset driving) described with reference to FIG. 33 consists of a first operation of disconnecting the driver transistor 11*a* from the EL element 15 (so that no current flows) and shorting between the drain (D) terminal and gate (G) terminal of the driver transistor (or between the source (S) terminal and gate (G) terminal, or generally speaking, between two terminals including the gate (G) terminal of the driver transistor) and a second operation of programming the driver transistor with current (voltage) after the first operation. At least the second operation is performed after the first operation. Incidentally, for reset driving, the transistors 11*b* and 11*c* must be able to be controlled independently as shown in FIG. 32.

In image display mode (if instantaneous changes can be observed), the pixel row to be programmed with current is reset (black display mode) and is programmed with current after 1 H (also in black display mode because the transistor 11*d* is off). Next, current is supplied to the EL element 15 and the pixel row illuminates at a predetermined brightness (at the programmed current). That is, the pixel row of black display moves from top to bottom of the screen and it should look as if the image were rewritten at the location where the pixel row passed by. Incidentally, although it has been stated that current programming is performed 1 H after a reset, this period may be approximately 5 Hs or shorter. This is because it takes a relatively long time for the reset in FIG. 33(*a*) to be completed. If this period is 5 Hs, five pixel rows will be displayed in black (six pixel rows including the pixel row going through current programming).

Also, the number of pixel rows which are reset at a time is not limited to one, and two or more pixel rows may be reset at a time. It is also possible to reset and scan two or more pixel rows at a time by overlapping some of them. For example, if four pixel rows are reset at a time, pixel rows (1), (2), (3), and (4) are reset in the first horizontal scanning period (1 unit), pixel rows (3), (4), (5), and (6) are reset in the second horizontal scanning period, pixel rows (5), (6), (7), and (8) are reset in the third horizontal scanning period, and pixel rows (7), (8), (9), and (10) are reset in the fourth horizontal scanning period. Incidentally the drive operations in FIGS. 33(*b*) and 33(*c*) are naturally carried out in sync with the drive operation in FIG. 33(*a*).

Needless to say, the drive operation in (b) and (c) of FIG. 33 may be performed after resetting all the pixels in the screen simultaneously or during scanning. Also, it goes without saying that pixel rows may be reset (at intervals of one or more pixel rows) in interlaced driving mode (scanning at intervals of one or more pixel rows). Also, pixel rows may be reset at random. The reset driving according to the present invention involves operating pixel rows (i.e., controlling the vertical direction of the screen). However, the concept of reset driving does not limit control directions to the pixel row direction. For example, it goes without saying that reset driving may be performed in the direction of pixel columns.

It has been stated that FIG. 32 shows a pixel configuration for reset driving. However, by controlling the gate signal line 17*a* and gate signal line 17*c* independently, it is possible to reduce variations in image data programmed with current. A drive method for such control will be described below.

First, description will be given of why variations occur in image data programmed with current in the pixel configuration in FIG. 1. With the pixel configuration in FIG. 1, the transistors 11*b* and 11*c* are turned on or off simultaneously by voltage applied to the gate signal line 17*a*. Actually, however, there could be subtle difference in characteristics between the transistor 11*b* and transistor 11*c* and there may be cases in which the transistor 11*b* and transistor 11*c* do not turn on or off simultaneously. For example, if a turn-on voltage and turn-off voltage are applied to the gate signal line 17*a* successively, the transistor 11*b* may turn off later than the transistor 11*c*.

If the transistor 11*c* turns off with the transistor 11*b* on, the state illustrated in FIG. 33(*a*) occurs. That is, reset mode occurs. Consequently, a current Ib flows, causing the capacitor 19 to charge or discharge. The state of charge or discharge is affected by variations in pixel 16 transistors. If the transistor 11*b* turns off earlier than the transistor 11*c*, the capacitor 19 is not charged or discharged. If the transistor 11*b* turns off later than the transistor 11*c*, the capacitor 19 is charged or discharged. Error occurs in the voltage held by the capacitor 19 depending on the duration of charge or discharge.

To solve this problem, a turn-off voltage is applied to the gate signal line 17*a* after a turn-on voltage (the transistor 11*b* turns off by the application of the turn-off voltage), and then a turn-off voltage is applied to the gate signal line 17*c* after a turn-on voltage (the transistor 11*c* turns off by the application of the turn-off voltage). That is, after programming the pixel 16 with current (during the programming, a turn-on voltage is applied to the gate signal lines 17*a* and 17*c*, keeping the transistors 11*b* and 11*c* on), a turn-off voltage is applied to the gate signal line 17*a*, and after a predetermined period of time, a turn-off voltage is applied to the gate signal line 17*c*. Through the above operation, appropriate current programming can be achieved, eliminating the state in FIG. 33(*a*). The operation, control, etc. of the transistor 11*d* are the same as in FIG. 1 and the like, and thus description thereof will be omitted.

Incidentally, the predetermined period of time here is between 0.1 and 10 μsec (both inclusive). Alternatively, it is between 1/1000 and 1/10 of 1 H (both inclusive). If this period is too short, it is not possible to achieve proper current (voltage) programming, resulting in variations in the holding voltage of the capacitor 19. If it is too long, the duration of current (voltage) programming is reduced, resulting in insufficient writing. A drive method which controls the on/off timing of the voltage-holding transistor 11*b* and the on/off timing of the transistor 11*c* which writes current (voltage) into the driver transistor 11*a* is referred to as a time-controlled drive method.

The time-controlled method is not limited to the pixel configuration in FIG. 32, but it is also applicable to the pixel configuration in FIG. 38 and the like. In FIG. 32, the transistor 11*d* is the voltage-holding transistor. The transistor 11*c* is the transistor which writes current (voltage) into the driver transistor 11*a*. The transistor 11*d* can perform on/off control by means of the turn-on and turn-off voltages applied to the gate signal line 17*a*2. The transistor 11*c* can perform on/off control by means of the turn-on and turn-off voltages applied to the gate signal line 17*a*1. After programming the pixel 16 with current (during the programming, a turn-on voltage is applied to the gate signal lines 17*a*1 and 17*a*2, keeping the transistors 11*b* and 11*c* on), a turn-off voltage is applied to the gate signal line 17*a*2, and after a predetermined period of time, a turn-off voltage is applied to the gate signal line 17*a*1. Through the above operation, appropriate current (voltage) programming can be achieved. The operation, control, etc. of the transistor 11*e* are the same as in FIG. 1 and the like, and thus description thereof will be omitted.

Incidentally, the reset driving in FIG. 33 and the time-control driving method in FIG. 32 can achieve better image display if combined with the N-fold pulse driving according to the present invention or with interlaced driving. Particularly, the configuration in FIG. 22 can easily implement intermittent N/K-fold pulse driving (this driving method provides two or more illuminated areas in a screen and can be implemented easily by turning on and off the transistor 11*d* by controlling the gate signal line 17*b*: this has been described earlier), and thus can achieve proper image display without flickering. This is an excellent feature of the configuration in FIG. 22 or its modifications.

Needless to say, more excellent image display can be achieved by combining with a reverse bias driving method, a precharge driving method, a penetration voltage driving method, or the like described later. Thus, it goes without saying that reset driving can be performed in combination with other examples according to the present invention. The matters concerning combinations of drive systems also apply to other examples of the present invention.

Figure 34:
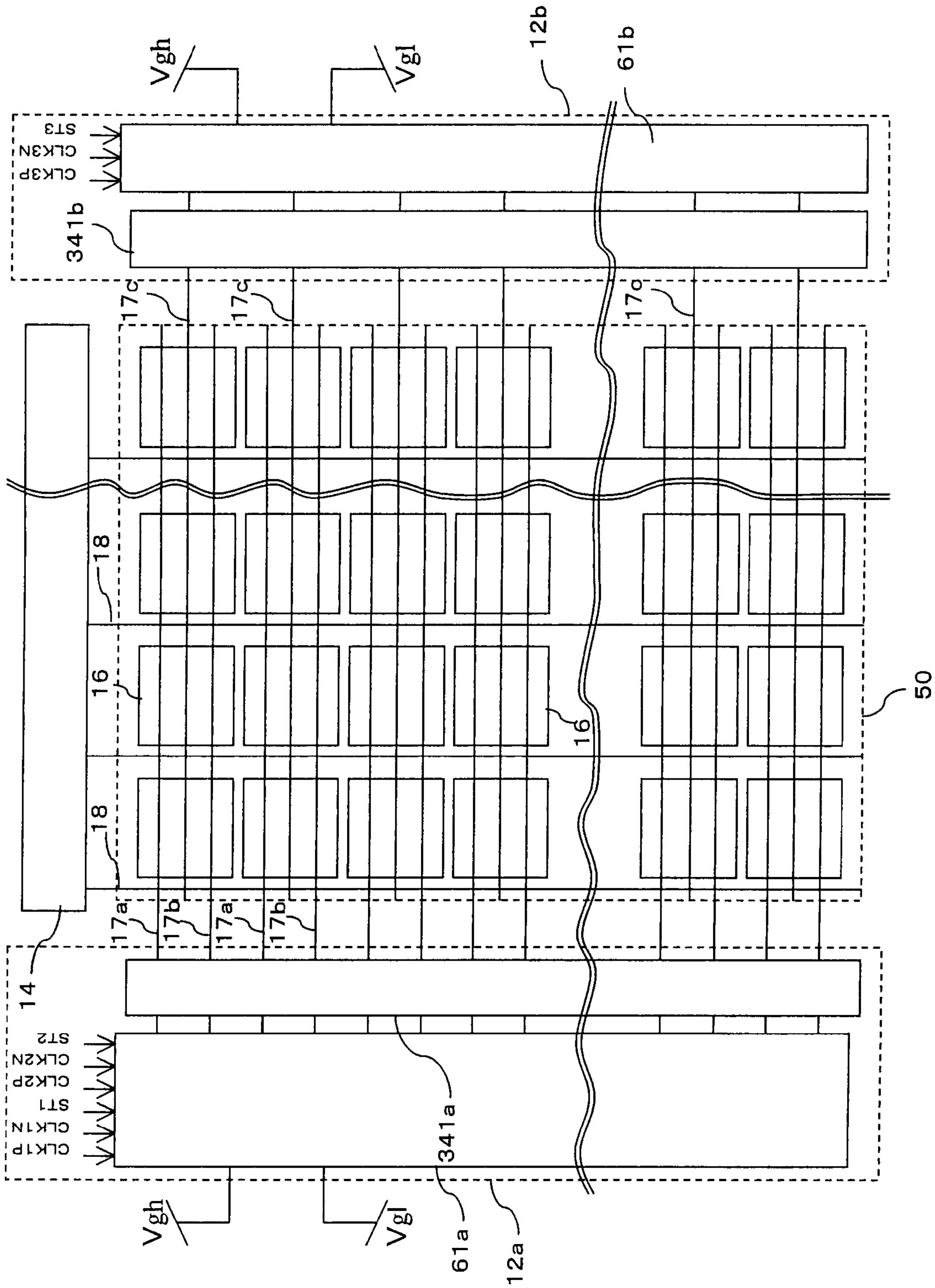
FIG. 34 is a block diagram of a display apparatus according to the present invention.

FIG. 34 is a block diagram of a display apparatus which implement reset driving. The gate driver circuit 12*a* controls the gate signal line 17*a* and gate signal line 17*b* in FIG. 32. By the application of on/off voltages to the gate signal line 17*a*, the transistor 11*b* is turned on and off. Also, by the application of on/off voltages to the gate signal line 17*b*, the transistor 11*d* is turned on and off. The gate driver circuit 12*b* controls the gate signal line 17*c* in FIG. 32. By the application of on/off voltages to the gate signal line 17*c*, the transistor 11*c* is turned on and off.

Thus, the gate signal line 17*a* is controlled by the gate driver circuit 12*a* while the gate signal line 17*c* is controlled by the gate driver circuit 12*b*. This makes it possible to freely specify the time to turn on the transistor 11*b* and reset the driver transistor 11*a* as well as the time to turn on the transistor 11*c* and program the driver transistor 11*a* with current. Other parts of the configuration are the same as or similar to those described in FIG. 6, etc., and thus description thereof will be omitted. Incidentally, the gate driver circuits 12 are formed using polysilicon technology. Also, needless to say, the gate driver circuits 12*a* and 12*b* may be integrated into a single unit.

Figure 35:
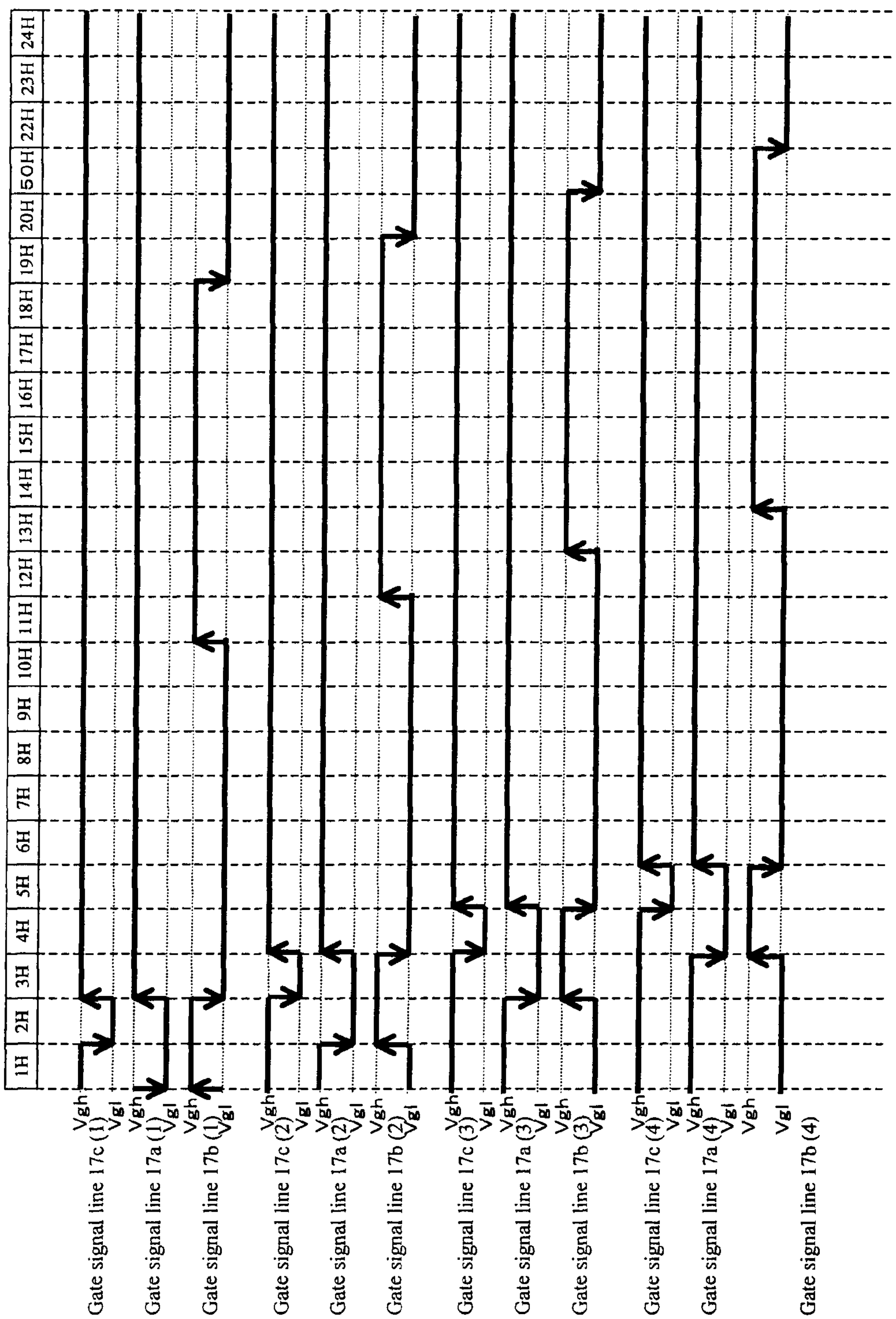
FIG. 35 is an explanatory diagram illustrating a drive method of a display apparatus according to the present invention.

FIG. 35 is a timing chart of reset driving. While a turn-on voltage is applied to the gate signal line 17*a* to turn on the transistor 11*b* and reset the driver transistor 11*a*, a turn-off voltage is applied to the gate signal line 17*b* to keep the transistor 11*d* off. This creates the state shown in FIG. 32(*a*). A current Ib flows during this period.

For example, looking at the pixel row (1), in the 1st H, a turn-off voltage is applied to the gate signal line 17*c*, a turn-on voltage is applied to the gate signal line 17*a*, and a turn-off voltage is applied to the gate signal line 17*b*. Consequently, in the 1st H, the pixel row (1) is in reset mode with the transistor 11*d* off and with no current flowing through the EL element 15.

In the 2nd H, a turn-on voltage is applied to the gate signal line 17*c*, a turn-on voltage is applied to the gate signal line 17*a*, and a turn-off voltage is applied to the gate signal line 17*b*. Consequently, in the 2nd H, the pixel row (1) is in current programming mode with the transistor 11*d* off and with no current flowing through the EL element 15.

In the 3rd H, a turn-off voltage is applied to the gate signal line 17*c*, a turn-off voltage is applied to the gate signal line 17*a*, and a turn-on voltage is applied to the gate signal line 17*b*. Consequently, in the 3rd H, the pixel row (1) is in image display mode with the transistor 11*d* on and with current flowing through the EL element 15.

Thus, the capacitor 19 is reset for 1 H (one horizontal scanning period). Consequently, the gate terminal G of the transistor 11*a* has a voltage close to the anode voltage Vdd. Consequently, the transistor 11*a* is cut off (reset mode). Since the capacitor 19 is reset once to program currents, it is possible to achieve accurate current programming. While the capacitor 19 is reset, the pixel is in non-display mode (even if the transistor 11*d* is on). This state is close to a state in which black screen is inserted. Thus, by continuing the reset state for a certain period or longer, it is possible to eliminate blurred moving pictures.

Although in the timing chart shown in FIG. 35, the reset time is 2 Hs (when a turn-on voltage is applied to the gate signal line 17*a* and the transistor 11*b* is turned on), this is not restrictive. (However, out of 2 Hs, 1 H is a programming period.) The reset time may be 2 Hs or longer. If a reset can be performed very quickly, the reset time may be less than 1 H.

The duration of the reset period can be changed easily using a DATA (ST) pulse period inputted in the gate driver circuit 12. For example, if DATA inputted in an ST terminal is set high for a period of 2 Hs, the reset period outputted for each gate signal line 17*a* is 2 Hs. Similarly, if DATA inputted in the ST terminal is set high for a period of 5 Hs, the reset period outputted for each gate signal line 17*a* is 5 Hs.

After a reset period of 1 H, a turn-on voltage is applied to the gate signal line 17*c*(1) of the pixel row (1). As the transistor 11*c* turns on, the programming current Iw applied to the source signal line 18 is written into the driver transistor 11*a* via the transistor 11*c*.

After current programming, a turn-off voltage is applied to the gate signal line 17*c* of the pixel row (1), the transistor 11*c* is turned off, and the pixel disconnected from the source signal line. At the same time, a turn-off voltage is also applied to the gate signal line 17*a* and the driver transistor 11*a* exits the reset mode (incidentally, the use of the term "current-programming mode" is more appropriate than the term "reset mode" to refer to this period). On the other hand, a turn-on voltage is applied to the gate signal line 17*b*, the transistor 11*d* is turned on, and the current programmed into the driver transistor 11*a* flows through the EL element 15. What has been said about the pixel row (1) similarly applies to the pixel row (2) and subsequent pixel rows. Also, their operation is obvious from FIG. 35. Thus, description of (2) and subsequent pixel rows will be omitted.

Figure 36:
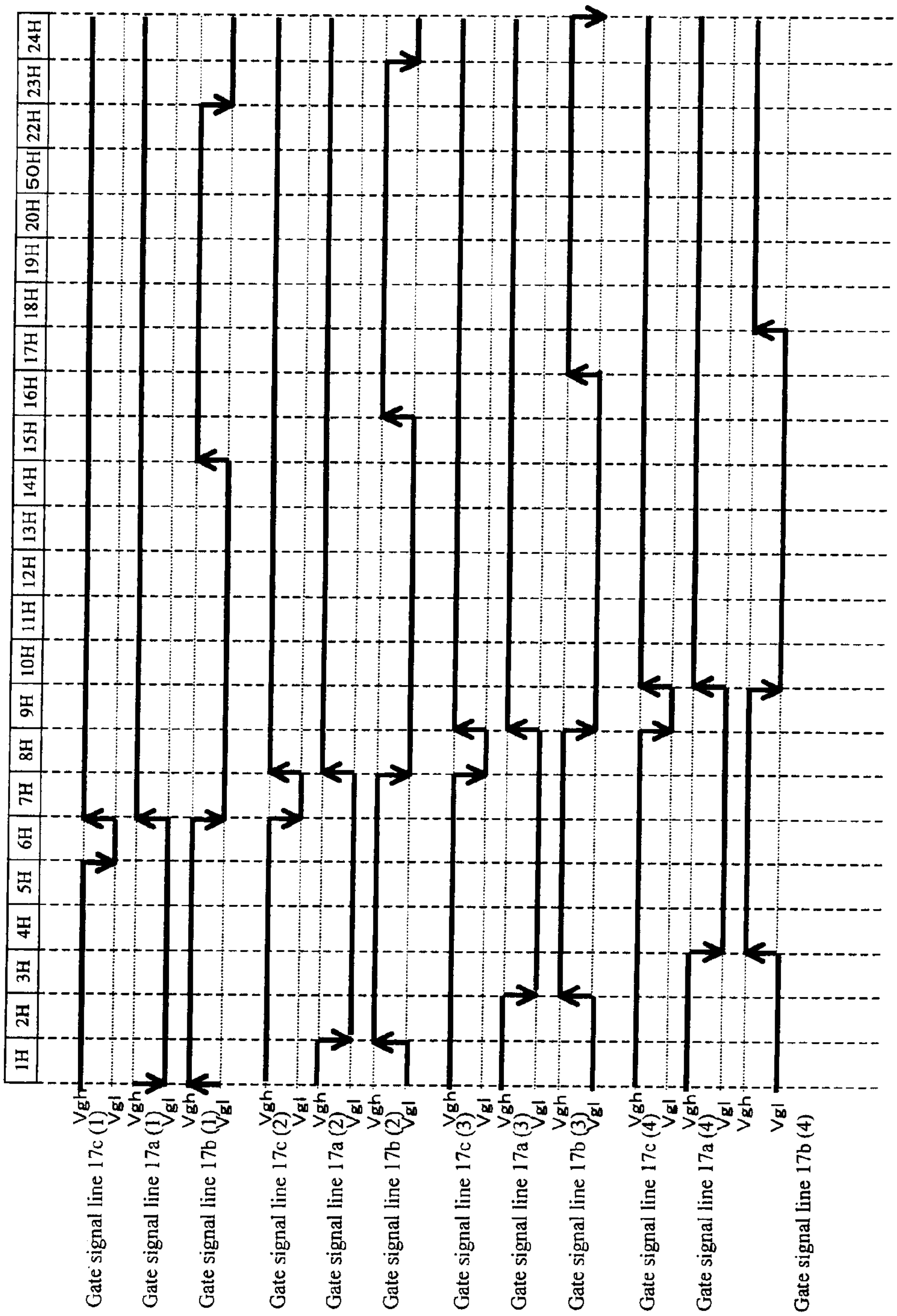
FIG. 36 is an explanatory diagram illustrating a drive method of a display apparatus according to the present invention.

In FIG. 35, the reset period has been 1 H. FIG. 36 shows an example in which the reset period is 5 Hs. The duration of the reset period can be changed easily using the DATA (ST) pulse period inputted in the gate driver circuit 12. FIG. 36 shows an example in which DATA inputted in the ST1 terminal of the gate driver circuit 12*a* is set high for a period of 5 Hs and the reset period outputted for each gate signal line 17*a* is 5 Hs. The longer the reset period, the more completely the reset is performed, resulting in a proper black display. Also, blurred moving pictures can be reduced. Other operations and the like in FIG. 36 are the same as in FIG. 35, and thus description thereof will be omitted.

Display brightness is decreased commensurately with the length of the reset period. However, by using a programming current N times larger than a predetermined value as in the case of N-fold pulse driving, it is possible to prevent screen brightness from dropping. Thus, reset driving is an embodiment of N-fold pulse driving.

In FIG. 36, the reset period has been 5 Hs. Besides, the reset mode is continuous. However, the reset mode need not necessarily be continuous. For example, the signal outputted from each gate signal line 17*a* may be turned on and off every 1 H. Such on/off operation can be achieved easily by operating an enable circuit (not shown) formed in the output stage of the shift register or controlling the DATA (ST) pulses inputted in the gate driver circuit 12.

Figure 37:
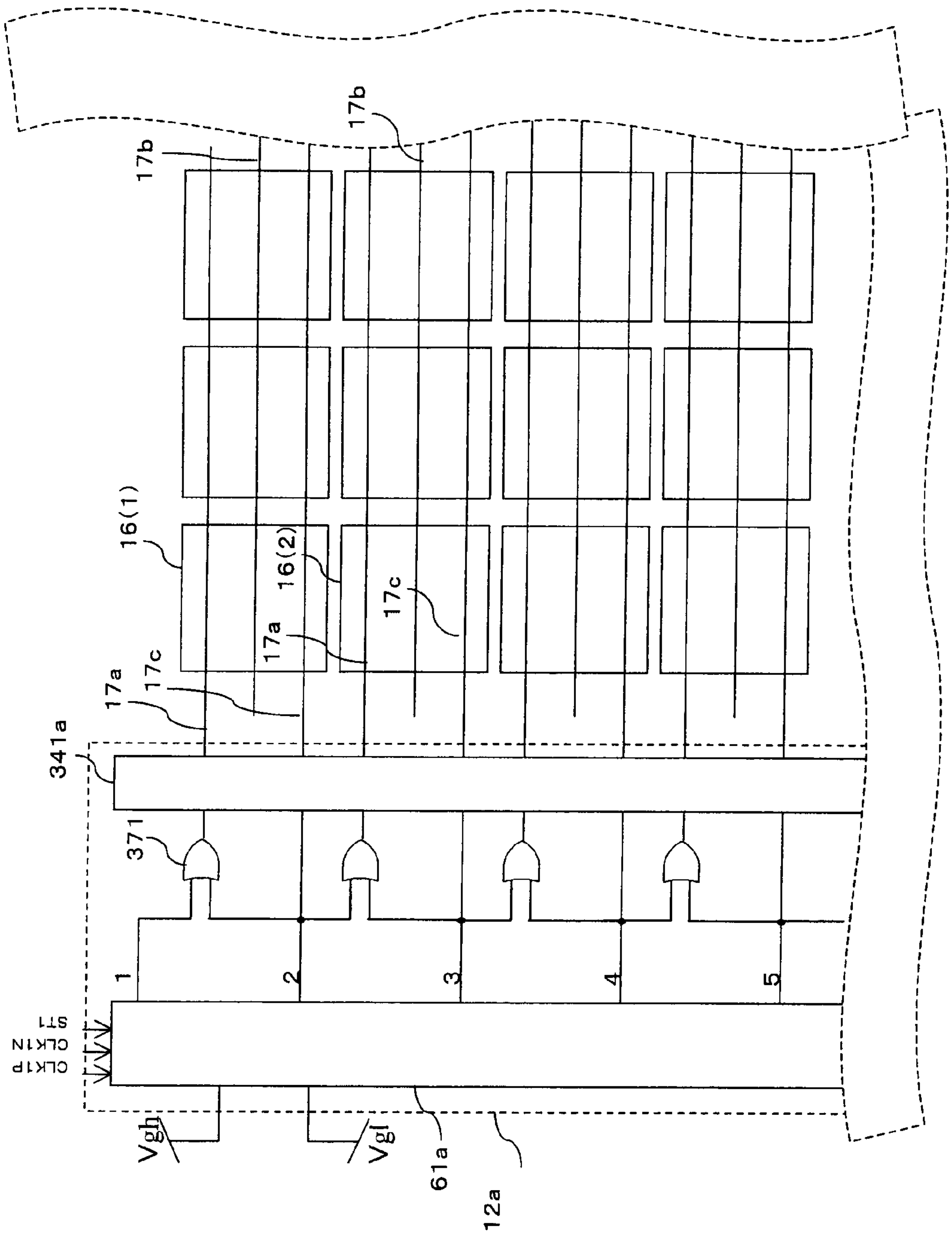
FIG. 37 is a block diagram of a display apparatus according to the present invention.

In the circuit configuration shown in FIG. 34, the gate driver circuit 12*a* requires at least two shift register circuits (one for the gate signal line 17*a*, the other for the gate signal line 17*b*). This presents a problem of an increased circuit scale of the gate driver circuit 12*a*. FIG. 37 shows an example in which the gate driver circuit 12*a* has only one shift register. A timing chart of output signals resulting from operation of the circuit in FIG. 37 is shown in FIG. 35. Note that the gate signal lines 17 coming out of the gate driver circuits 12*a* and 12*b* are denoted by different symbols between FIGS. 35 and 37.

As can be seen from the fact that an OR circuit 371 in FIG. 37 has been added, the output from each gate signal line 17*a* is logically added to the output from the preceding stage of the shift register circuit 61*a* and a turn-on voltage or turn-off voltage is outputted to the gate signal line 17*a* depending on this result.

Incidentally, the pixel configuration in FIG. 32 is assumed here for ease of explanation and it is assumed that a turn-on voltage is outputted to the gate signal line 17*a* when the output from the OR circuit 371 is high (positive logic).

In FIG. 37, the gate signal line 17*a* outputs a turn-on voltage for a period of 2 Hs. On the other hand, the gate signal line 17*c* outputs the output of the shift register circuit 61*a* as it is. Thus, a turn-on voltage is applied for a period of 1 H.

For example, if the shift register circuit 61*a* outputs a high-level signal second, a turn-on voltage is output to the gate signal lines 17*c* of the pixel 16(1), which now is in a state of being programmed with current (voltage). At the same time, a turn-on voltage is also output to the gate signal lines 17*a* of the pixel 16(2), turning on the transistor 11*b* of the pixel 16(2) and resetting the driver transistor 11*a* of the pixel 16(2).

Similarly, if the shift register circuit 61*a* outputs a high-level signal third, a turn-on voltage is output to the gate signal lines 17*c* of the pixel 16(2), which now is in a state of being programmed with current (voltage). At the same time, a turn-on voltage is also output to the gate signal lines 17*a* of the pixel 16(3), turning on the transistor 11*b* of the pixel 16(3) and resetting the driver transistor 11*a* of the pixel 16(3). Thus, the gate signal lines 17*a* outputs turn-on voltages for a period of 2 Hs, and the gate signal lines 17*c* receive a turn-on voltage for a period of 1 H.

In programming mode, since the transistors 11*b* and 11*c* turn on simultaneously (FIG. 33(*b*)), if the transistor 11*c* turns off before the transistor 11*b* during transition to non-programming mode (FIG. 33(*c*), the reset mode in FIG. 33(*b*) occurs. To prevent this situation, the transistor 11*c* must be turned off after the transistor 11*b*. For that, a turn-on voltage needs to be applied to the gate signal line 17*a* earlier than the gate signal line 17*c*.

Figure 39:
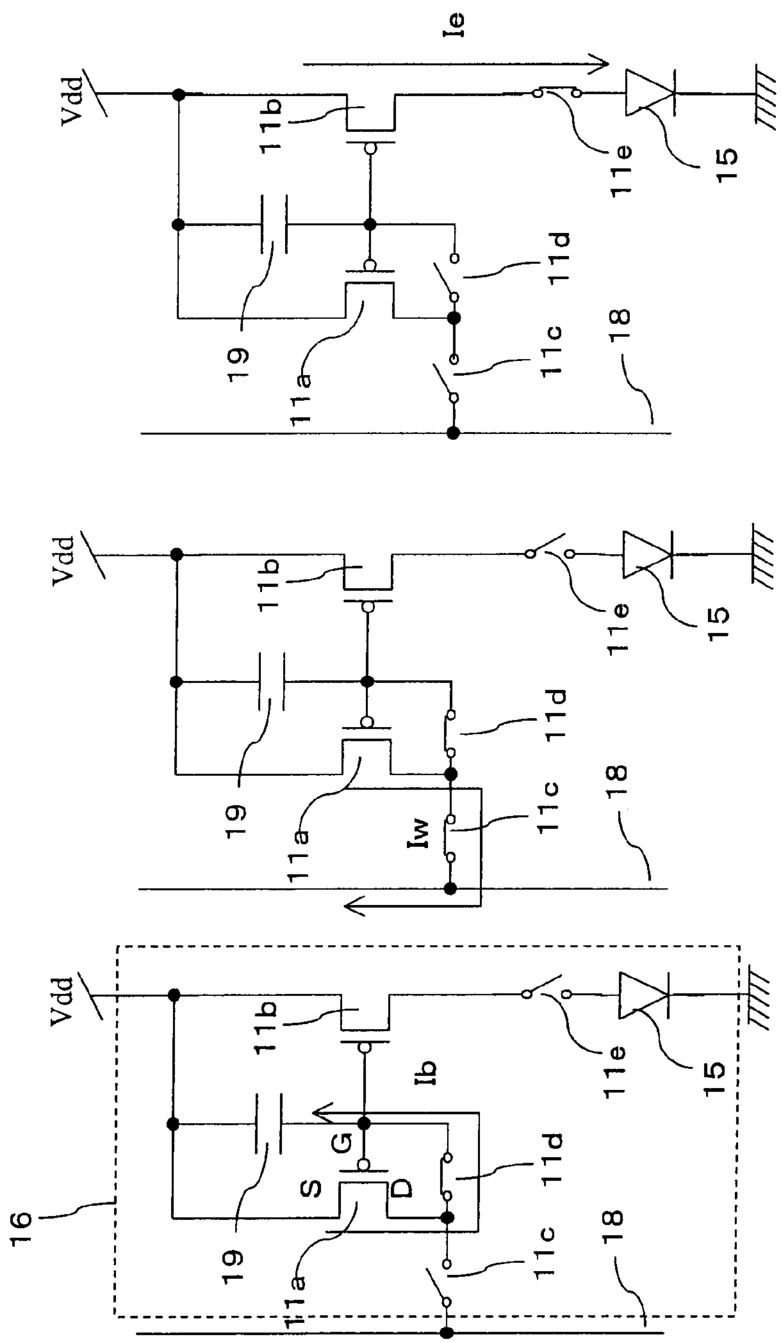
FIG. 39 is an explanatory diagram illustrating a drive method of a display apparatus according to the present invention.

The above example concerns the pixel configuration in FIG. 32 (basically, in FIG. 1). However, the present invention is not limited to this. For example, it is also applicable to current-mirror pixel configurations such as the one shown in FIG. 38. Incidentally, in FIG. 38, by turning on and off the transistor 11*e*, N-fold pulse driving illustrated in FIGS. 13, 15, etc. can be implemented. FIG. 39 is an explanatory diagram illustrating an example employing the current-mirror pixel configuration shown in FIG. 38. Reset driving in the current-mirror pixel configuration will be described below with reference to FIG. 39.

As shown in FIG. 39(*a*), the transistors 11*c* and 11*e* are turned off and the transistor 11*d* is turned on. Then, the drain (D) terminal and gate (G) terminal of the current-programming transistor 11*a* are short-circuited and a current Ib flows between them as shown in the figure. Generally, the transistor 11*b* has been programmed with current in the previous field (frame) and is capable of passing current (this is natural because the gate potential is held in the capacitor 19 for a period of 1 F and image is displayed. However, current does not flow during a completely black display). In this state, as the transistor 11*e* is turned off and the transistor 11*d* is turned on, the drive current Ib flows through the gate (G) terminal of the transistor 11*a* (gate (G) terminal and the drain (D) terminal are short-circuited). Consequently, the gate (G) terminal and drain (D) terminal of the transistor 11*a* have the same potential, resetting the transistor 11*a* (to a state in which no current flows). Since the driver transistor 11*b* shares a common gate (G) terminal with the current-programming transistor 11*a*, the driver transistor 11*b* is also reset.

The reset mode (in which no current flows) of the transistors 11*a* and 11*b* is equivalent to a state in which a offset voltage is held in voltage offset canceling mode described with reference to FIG. 51 and the like. That is, in the state in FIG. 39(*a*), the offset voltage is held between the terminals of the capacitor 19 (the offset voltage is a starting voltage at which a current starts to flow: when a voltage equal to or larger than the starting voltage is applied, a current flows through the transistor 11). The offset voltage varies with the characteristics of the transistors 11*a* and 11*b*. Thus, in FIG. 39(*a*), a state in which the transistors 11*a* and 11*b* do not pass current is maintained in the capacitor 19 in each pixel (the transistors 11*a* and 11*b* pass a black display current close to zero, i.e., they have been reset to the starting voltage at which a current starts to flow).

In FIG. 39(*a*), as the reset period becomes longer, a larger Ib current tends to flow, reducing the terminal voltage of the capacitor 19, as in the case of FIG. 33(*a*). Thus, the operation time in FIG. 39(*a*) should be fixed. It has been shown experimentally and analytically that preferably the operation time in FIG. 39(*a*) is from 1 H to 10 Hs (ten horizontal scanning periods) both inclusive. More preferably, it should be from 1 H to 5 Hs or from 20 μsec to 2 msec (both inclusive). This also applies to the drive system in FIGS. 33 and 34.

As in the case of FIG. 33(*a*), if the reset mode in FIG. 39(*a*) is synchronized with the current-programming mode in FIG. 39(*b*), there is no problem because the period from the reset mode in FIG. 39(*a*) to the current-programming mode in FIG. 39(*b*) is fixed (constant). That is, preferably the period from the reset mode in FIG. 33(*a*) or FIG. 39(*a*) to the current-programming mode in FIG. 33(*b*) or FIG. 39(*b*) should be from 1 H to 10 Hs (ten horizontal scanning periods) both inclusive. More preferably, it should be from 1 H to 5 Hs or from 20 μsec to 2 msec (both inclusive). If this period is short, the driver transistors 11*a* are not reset completely. If it is too long, the driver transistor 11 is turned off completely, which means that much time is required for current programming. Also, the brightness of the screen 50 is decreased. This is not necessarily true if black insertion is made (non-display area 52 is generated) as shown in FIG. 13 because the black insertion (non-display area 52) is used for N-fold pulse driving.

After the state in FIG. 39(*a*), a state shown in FIG. 39(*b*) occurs. FIG. 39(*b*) shows a state in which the transistors 11*c* and 11*d* are turned on and the transistor 11*e* is turned off. This is a state in which current programming is being performed. Specifically, a programming current Iw is output (absorbed) from the source driver circuit 14 and passed through the current programming transistor 11*a*. The potential of the gate (G) terminal of the driver transistor 11*a* is set in the capacitor 19 so that the programming current Iw will flow.

If the programming current Iw is 0 A (black display), the transistor 11*b* is held in the state in FIG. 39(*a*) in which it does not pass current, and thus proper black display is achieved. Also, when performing current programming for white display in FIG. 39(*b*), the current programming is started from offset voltage of completely black display even if there are variations in the characteristics of driver transistors in pixels (the offset voltage is a starting voltage at which a current specified according to the characteristics of each driver transistor starts to flow). Thus, the time required to reach a target current value becomes uniform according to gradations. This eliminates gradation errors due to variations in the characteristics of the transistor 11*a* or 11*b*, making it possible to achieve proper image display.

After the current programming in FIG. 39(*b*), the transistors 11*c* and 11*d* are turned off in sequence and the transistor 11*e* is turned on to deliver the programming current Iw (=Ie) to the EL element 15 from the driver transistor 11*b*, and thereby illuminate the EL element 15. What is shown in FIG. 39(*c*) has already been described, and thus detailed description thereof will be omitted.

The drive system (reset driving) described with reference to FIGS. 33 and 39 consists of a first operation of disconnecting the driver transistor 11*a* or 11*b* from the EL element 15 (using the transistor 11*e* or 11*d* so that no current flows) and shorting between the drain (D) terminal and gate (G) terminal of the driver transistor (or between the source (S) terminal and gate (G) terminal, or generally speaking, between two terminals including the gate (G) terminal of the driver transistor) and a second operation of programming the driver transistor with current (voltage) after the first operation. At least the second operation is performed after the first operation.

Incidentally, the operation of disconnecting the driver transistor 11*a* or 11*b* from the EL element 15 in the first operation is not absolutely necessary. The drain (D) terminal and gate (G) terminal of the driver transistor are short-circuited in the first operation without disconnecting the driver transistor 11*a* or 11*b* from the EL element 15, nothing more than some variations in reset mode may result. Whether to omit disconnection should be determined by considering the characteristics of the transistors in the constructed array.

The current-mirror pixel configuration in FIG. 39 provides a drive method which resets the current-programming transistor 11*a*, and consequently resets the driver transistor 11*b*.

With the current-mirror pixel configuration in FIG. 39, it is not always necessary to disconnect the driver transistor 11*b* from the EL element 15 in reset mode. Thus, the following operations are performed: a first operation of shorting between the drain (D) terminal and gate (G) terminal of the current-programming transistor a (or between the source (S) terminal and gate (G) terminal, or generally speaking, between two terminals including the gate (G) terminal of the current-programming transistor or between two terminals including the gate (G) terminal of the driver transistor) and a second operation of programming the current-programming transistor with current (voltage) after the first operation. At least the second operation is performed after the first operation.

In image display mode (if instantaneous changes can be observed), the pixel row to be programmed with current is reset (black display mode) and is programmed with current after a predetermined H. The pixel row of black display moves from top to bottom of the screen and it should look as if the image were rewritten at the location where the pixel row passed by.

Although the above example has been described mainly in relation to pixel configuration for current programming, the reset driving according to the present invention can also be applied to pixel configuration for voltage programming. FIG. 43 is an explanatory diagram illustrating a pixel configuration (panel configuration) according to the present invention used to perform reset driving in a pixel configuration for voltage programming.

In the configuration shown in FIG. 43, a transistor 11*e* which resets a driver transistor 11*a* has been formed. When a turn-on voltage is applied to a gate signal line 17*e*, the transistor 11*e* turns on, causing a short circuit between the gate (G) terminal and drain (D) terminal of the driver transistor 11*a*. Also a transistor 11*d* which cuts off a current path between the EL element 15 and driver transistor 11*a* has been formed. The reset driving according to the present invention in a pixel configuration for voltage programming will be described below with reference to FIG. 44 (FIG. 43 shows a pixel configuration for voltage programming).

Figure 44:
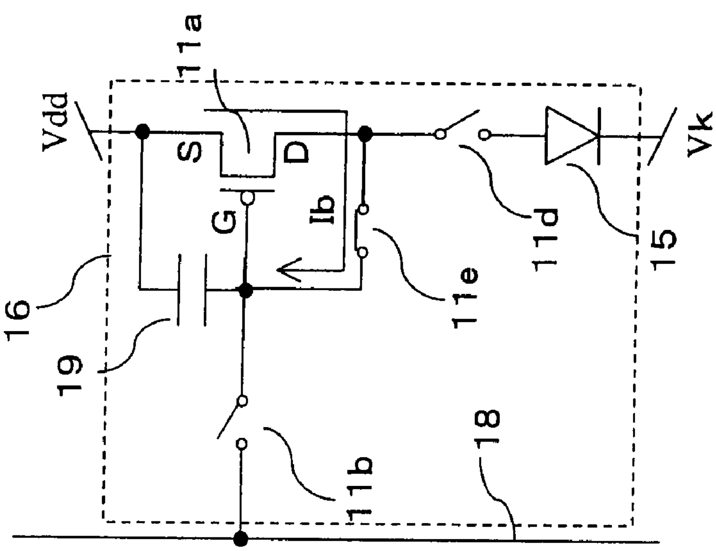
FIG. 44 is an explanatory diagram illustrating a drive method of a display apparatus according to the present invention.
Figure 44:
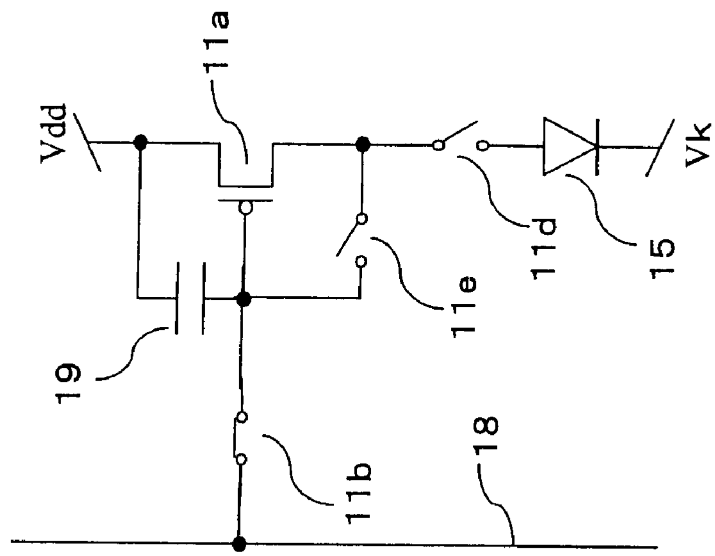
Figure 44:
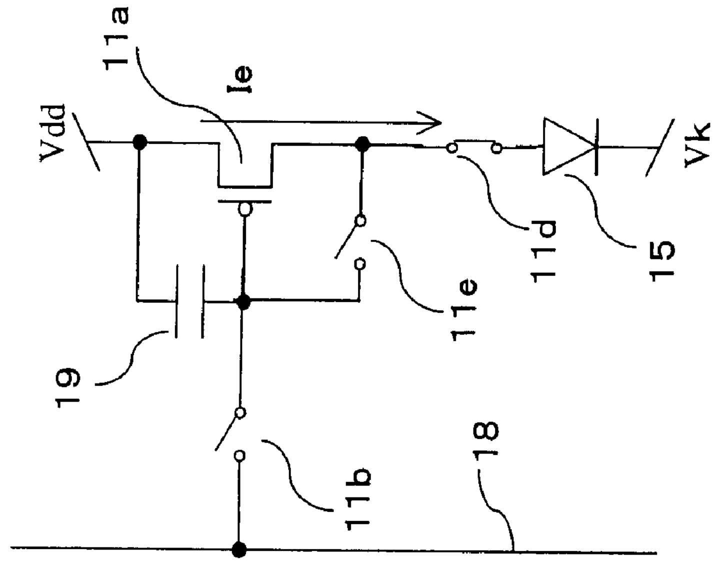

As illustrated in FIG. 44(*a*), the transistors 11*b* and 11*d* are turned off and the transistor 11*e* is turned on. The drain (D) terminal and gate (G) terminal of the driver transistor 11*a* are short-circuited and a current Ib flows as shown in the figure. Consequently, the gate (G) terminal and drain (D) terminal of the transistor 11*a* have the same potential, resetting the transistor 11*a* (to a state in which no current flows). Before resetting the transistor 11*a*, the transistor 11*d* is turned on, the transistor 11*e* is turned off, and current is passed through the transistor 11*a* in sync with an HD synchronization signal as described with reference to FIG. 33 or 39. Then the operation shown in FIG. 44(*a*) is performed. It is not strictly necessary that the resetting is synchronized with the HD signal.

The reset mode (in which no current flows) of the transistors 11*a* and 11*b* is equivalent to a state in which a offset voltage is held in voltage offset canceling mode described with reference to FIG. 41 and the like. That is, in the state in FIG. 44(*a*), the offset voltage (reset voltage) is held between the terminals of the capacitor 19. This reset voltage varies with the characteristics of the driving transistors 11*a*. Thus, in FIG. 44(*a*), a state in which the driving transistors 11*a* and 11*b* do not pass current is maintained in the capacitor 19 in each pixel (the transistors 11*a* and 11*b* pass a black display current close to zero, i.e., they have been reset to the starting voltage at which a current starts to flow).

Incidentally, in the pixel configuration for voltage programming, as the reset period becomes longer, a larger Ib current tends to flow, reducing the terminal voltage of the capacitor 19, as in the case of pixel configuration for current programming. Thus, the operation time in FIG. 44(*a*) should be fixed. Preferably, the operation time should be from 0.2H to 5 Hs (five horizontal scanning periods) both inclusive. More preferably, it should be from 0.5H to 4 Hs or from 2 μsec to 400 μsec (both inclusive).

Besides, it is preferable that the gate signal line 17*e* should be shared with the gate signal line 17*a* in a preceding stage. That is the gate signal line 17*e* should be shorted to the gate signal line 17*a* in the pixel row in the preceding stage. This configuration is referred to as a preceding-stage gate control system. Incidentally, the stage-stage gate control system uses waveforms of gate signal lines of a pixel row selected one or more Hs before the pixel row of interest. Thus, this system is not limited to the previous pixel row. For example, the driver transistor 11*a* of the pixel row of interest may be reset using the waveforms of gate signal lines two pixel rows ahead.

The stage-stage gate control system will be described more concretely. Suppose, the pixel row of interest is the (N)-th pixel row whose gate signal lines are 17*e*(N) and 17*a*(N). The preceding pixel row selected 1 H before is assumed to be the (N−1)-th pixel row whose gate signal lines are 17*e*(N−1) and 17*a*(N−1). The pixel row selected 1 H after the pixel row of interest is assumed to be the (N+1)-th pixel row whose gate signal lines are 17*e*(N+1) and 17*a* (N+1).

In the (N−1)-th H-period, as a turn-on voltage is applied to the gate signal line 17*a*(N−1) of the (N−1)-th pixel row, a turn-on voltage is also applied to the gate signal line 17*e*(N) of the (N)-th pixel row. This is because the gate signal line 17*e*(N) and the gate signal line 17*a*(N−1) of the pixel row in the preceding stage are shorted. Consequently, the pixel transistor 11*b*(N−1) in the (N−1)-th pixel row is turned on and the voltage applied to the source signal line 18 is written into the gate (G) terminal of the driver transistor 11*a*(N−1). At the same time, the pixel transistor 11*e*(N) in the (N)-th pixel row is turned on, the gate (G) terminal and drain (D) terminal of the driver transistor 11*a*(N) are shorted, and the driver transistor 11*a*(N) is reset.

In the (N)-th H-period which follows the (N−1)-th H-period, as a turn-on voltage is applied to the gate signal line 17*a*(N) of the (N)-th pixel row, a turn-on voltage is also applied to the gate signal line 17*e*(N+1) of the (N+1)-th pixel row. Consequently, the pixel transistor 11*b*(N) in the (N)-th pixel row is turned on and the voltage applied to the source signal line 18 is written into the gate (G) terminal of the driver transistor 11*a*(N). At the same time, the pixel transistor 11*e* (N+1) in the (N+1)-th pixel row is turned on, the gate (G) terminal and drain (D) terminal of the driver transistor 11*a* (N+1) are shorted, and the driver transistor 11*a*(N+1) is reset.

Similarly, in the (N+1)-th period which follows the (N)-th H-period, as a turn-on voltage is applied to the gate signal line 17*a*(N+1) of the (N+1)-th pixel row, a turn-on voltage is also applied to the gate signal line 17*e*(N+2) of the (N+2)-th pixel row. Consequently, the pixel transistor 11*b*(N+1) in the (N+1)-th pixel row is turned on and the voltage applied to the source signal line 18 is written into the gate (G) terminal of the driver transistor 11*a*(N+1). At the same time, the pixel transistor 1*e*(N+2) in the (N+2)-th pixel row is turned on, the gate (G) terminal and drain (D) terminal of the driver transistor 11*a*(N+2) are shorted, and the driver transistor 11*a*(N+2) is reset.

According to the above-described stage-stage gate control system of the present invention, the driver transistor 11*a* is reset for a period of 1 H, and then voltage (current) programming is performed.

As in the case of FIG. 33(*a*), if the reset mode in FIG. 44(*a*) is synchronized with the voltage-programming mode in FIG. 44(*b*), there is no problem because the period from the reset mode in FIG. 44(*a*) to the current-programming mode in FIG. 44(*b*) is fixed (constant). If this period is short, the driver transistors 11 are not reset completely. If it is too long, the driver transistor 11*a* is turned off completely, which means that much time is required for current programming. Also, the brightness of the screen 50 is decreased.

After the state in FIG. 44(*a*), a state shown in FIG. 44(*b*) occurs. FIG. 44(*b*) shows a state in which the transistor 11*b* is turned on and the transistors 11*e* and 11*d* are turned off. This state in FIG. 44(*b*), is a state in which voltage programming is being performed. Specifically, a programming voltage is output from the source driver circuit 14 and written into the gate (G) terminal of the driver transistor 11*a* (the potential of the gate (G) terminal of the driver transistor 11*a* is set in the capacitor 19). Incidentally, in the case of voltage programming, it is not always necessary to turn off the transistor 11*d* during voltage programming. Besides, the transistor 11*e* is not necessary if there is no need to combine with the N-fold driving shown in FIG. 13, 15, or the like or perform intermittent N/K-fold pulse driving (this driving method provides two or more illuminated areas in a screen and can be implemented easily by turning on and off the transistor 11*e*). Since this has been described earlier, description thereof will be omitted.

When performing voltage programming for white display using the configuration shown in FIG. 43 or drive method shown in FIG. 44, the voltage programming is started from offset voltage of completely black display even if there are variations in the characteristics of driver transistors in pixels (the offset voltage is a starting voltage at which a current specified according to the characteristics of each driver transistor starts to flow). Thus, the time required to reach a target current value becomes uniform according to gradations. This eliminates gradation errors due to variations in the characteristics of the transistor 11*a*, making it possible to achieve proper image display.

After the voltage programming in FIG. 44(*b*), the transistor 11*d* is turned off and the transistor 11*d* is turned on to deliver the programming current to the EL element 15 from the driver transistor 11*a*, and thereby illuminate the EL element 15, as shown in FIG. 44(*c*).

As described above, the reset driving according to the present invention using the voltage programming shown in FIG. 43 consists of a first operation of turning on the transistor 11*d*, turning off the transistor 11*e*, and passing current through the transistor 11*a* in sync with the HD synchronization signal; a second operation of disconnecting the transistor 11*a* from the EL element 15 and shorting between the drain (D) terminal and gate (G) terminal of the driver transistor 11*a* (or between the source (S) terminal and gate (G) terminal, or generally speaking, between two terminals including the gate (G) terminal of the driver transistor); and a third operation of programming the driver transistor 11*a* with voltage after the above operations.

In the above example, the transistor 11*d* is turned on and off to control the current delivered from the driver transistor 11*a* (in the case of configuration shown in FIG. 1) to the EL element 15. To turn on and off the transistor 11*d*, the gate signal line 17*b* needs to be scanned, for which the shift register circuit 61 (the gate driver circuit 12) is required. However, shift register circuits 61 are large in scale and the use of a shift register circuit 61 for the gate signal line 17*b* makes it impossible to reduce bezel width. A system described with reference to FIG. 40 solves this problem.

Incidentally, although the pixel configuration for current programming illustrated in FIG. 1 and the like is mainly described herein by way of examples, the present invention is not limited to this and it goes without saying that the present invention can also be applied to other configuration for current programming (current-mirror pixel configuration) described with reference to FIG. 38 and the like.

Figure 41:
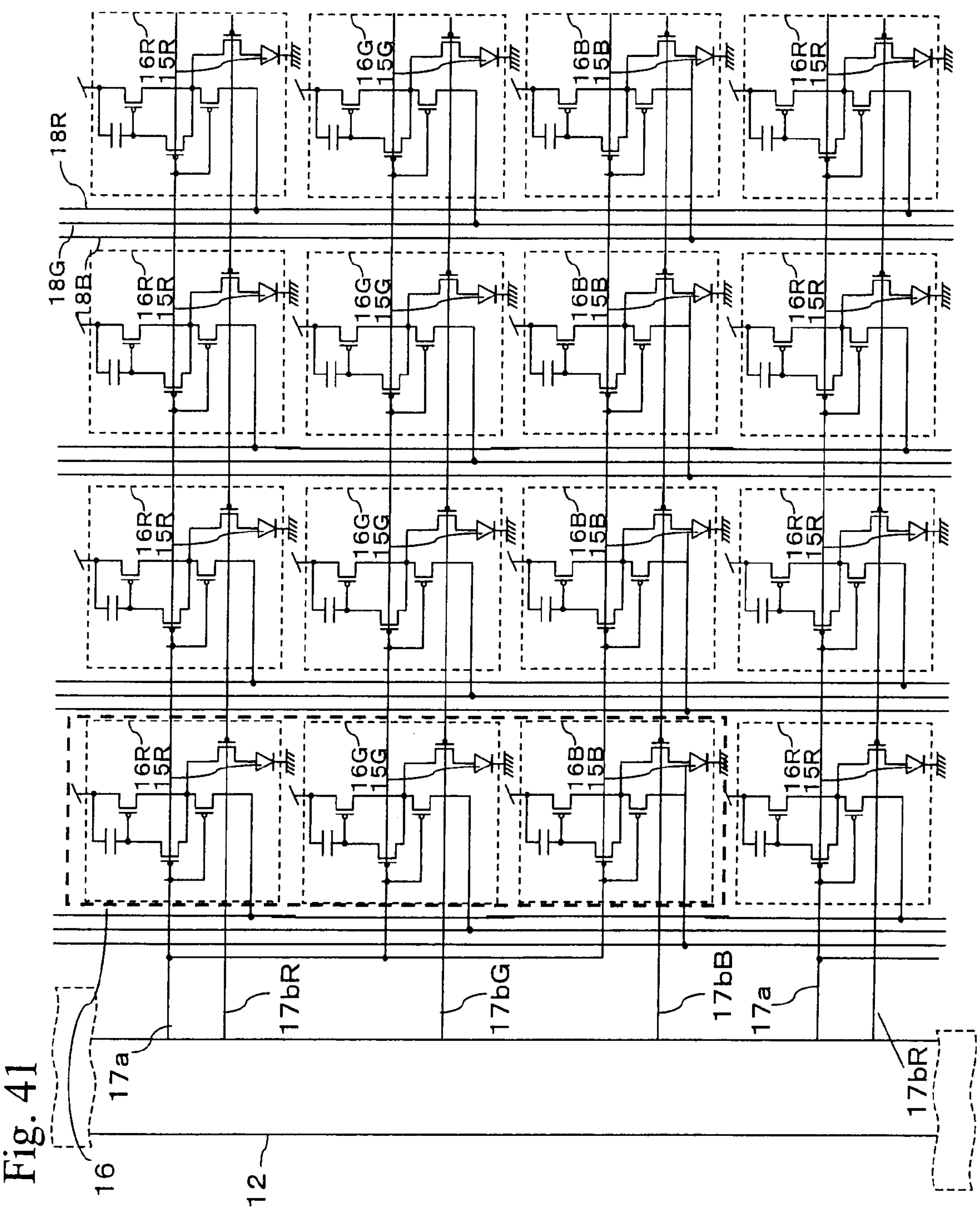
FIG. 41 is a block diagram of a display apparatus according to the present invention.

Also, the technical concept of turning on and off elements as a block can also be applied to the pixel configuration for voltage programming in FIG. 41 and the like. According to the invention, since this method passes current through the EL elements 15 intermittently, it can be used in combination with a method (described with reference to FIG. 50, etc.) which applies a reverse bias voltage. Thus, the present invention can be performed in combination with other examples.

Figure 40:
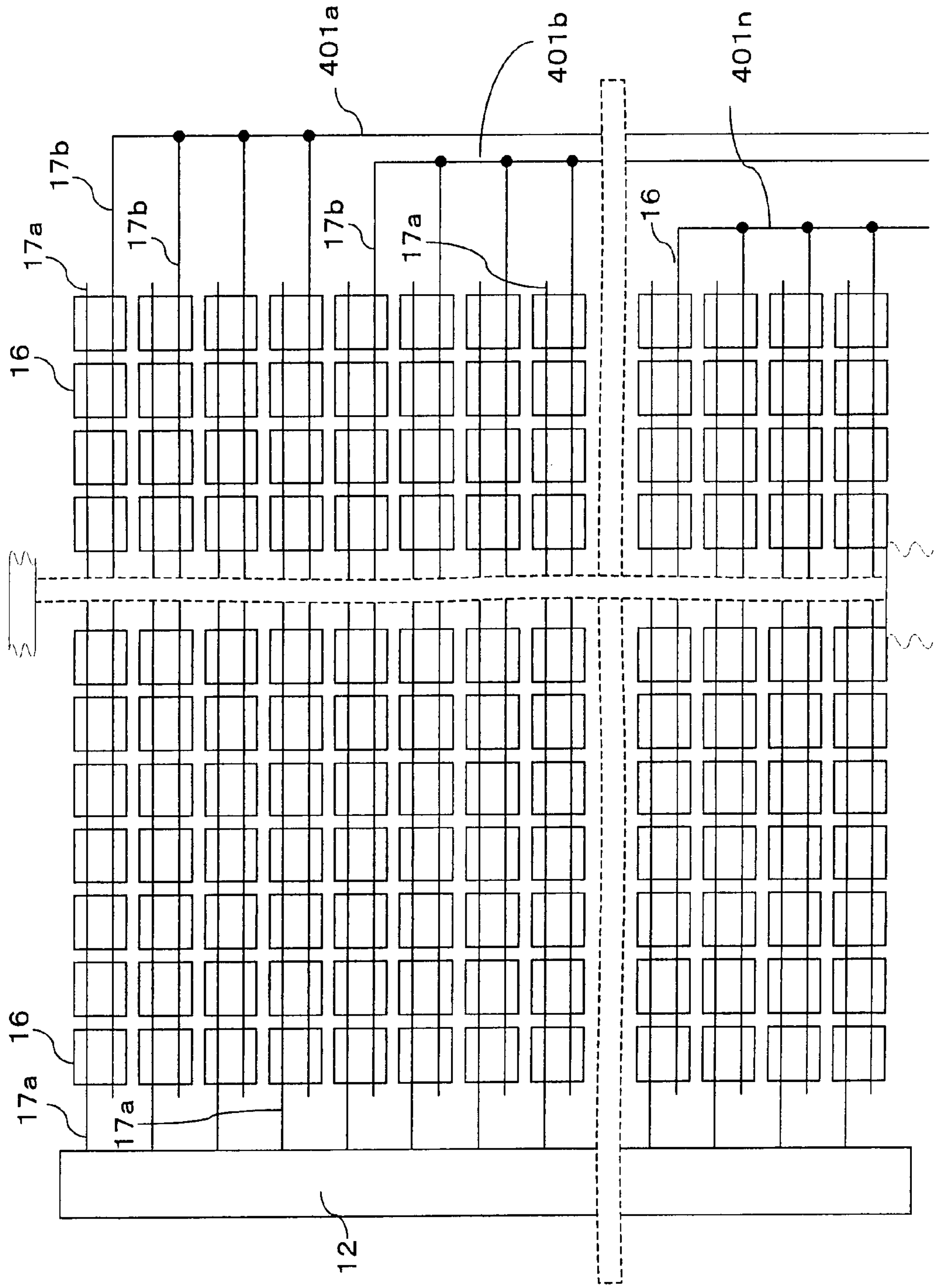
FIG. 40 is a block diagram of a display apparatus according to the present invention.

FIG. 40 shows an example of a block driving system. For ease of understanding, it is assumed that a gate driver circuit 12 is formed directly on an array board 71 or that a silicon chip, gate driver IC 12, is mounted on an array board 71. Source driver circuits 14 and source signal lines 18 are omitted to avoid complicating the drawing.

In FIG. 40, gate signal lines 17*a* are connected to the gate driver circuit 12. On the other hand, gate signal lines 17*b* are connected to illumination control lines 401. In FIG. 40, four gate signal lines 17*b* are connected to one illumination control line 401.

Incidentally, although four gate signal lines 17*b* are grouped into a block here, this is not restrictive and it goes without saying that more than four gate signal lines 17*b* may be grouped into a block. Generally, it is preferable to divide the display area 50 into five or more parts. More preferably, the screen 50 should be divided into ten or more parts. Even more preferably, the screen 50 should be divided into twenty or more parts. A small number of divisions will make flickering conspicuous. Too large a number of divisions will increase the number of illumination control lines 401, making it difficult to lay out the illumination control lines 401.

Thus, in the case of a QCIF display panel, which has 220 vertical scanning lines, at least 220/5=44 or more lines should be grouped into a block. More preferably, 220/10=22 or more lines should be grouped into a block. However, if odd-numbered rows and even-numbered rows are grouped into two different blocks, there is not much flickering even at a low frame rate, and thus the two blocks are sufficient.

In the example shown in FIG. 40, the current flowing through the EL elements 15 are turned on and off on a block-by-block basis by the application of either a turn-on voltage (Vgl) or turn-off voltage (Vgh) to illumination control lines 401*a*, 401*b*, 401*c*, 401*d*, . . . , 401*n* in sequence.

Incidentally, in the example in FIG. 40, the gate signal lines 17*b* do not intersect the illumination control lines 401. Thus, there can be no defect in which a gate signal line 17*b* would become short-circuited with an illumination control line 401. Also, since there is no capacitive coupling between gate signal lines 17*b* and illumination control lines 401, capacitive load is very small when the gate signal lines 17*b* are viewed from the illumination control lines 401. This makes it easy to drive the illumination control lines 401.

The gate driver circuit 12 is connected with the gate signal lines 17*a*. When a turn-on voltage is applied to gate signal lines 17*a*, the appropriate pixel rows are selected and the transistors 11*b* and 11*c* in the selected pixel rows are turned on. Then, currents (voltage) applied to the source signal lines 18 are programmed into the capacitors 19 in the pixels. On the other hand, the gate signal lines 17*b* are connected with the gate (G) terminals of the transistors 11*d* in the pixels. Thus, when a turn-on voltage (Vgl) is applied to the illumination control lines 401, current paths are formed between the driver transistors 11*a* and EL elements 15. When a turn-off voltage (Vgh) is applied, the anode terminals of the EL elements 15 are opened.

Preferably, control timing of turn-on/turn-off voltages applied to the illumination control lines 401 and a pixel row selection voltage (Vgl) outputted to the gate signal lines 17*a* by the gate driver circuit 12 are synchronized with one horizontal scanning clock (1 H). However, this is not restrictive.

The signals applied to the illumination control lines 401 simply turn on and off the current delivered to the EL elements 15. They do not need to be synchronized with image data outputted from the source driver circuits 14. This is because the signals applied to the illumination control lines 401 are intended to control the current programmed into the capacitors 19 in the pixels 16. Thus, they do not always need to be synchronized with the pixel row selection signal. Even when they are synchronized, the clock is not limited to a 1-H signal and may be a ½-H or ¼-H signal.

Even in the case of the current-mirror pixel configuration shown in FIG. 38, the transistors 11*e* can be turned on and off if the gate signal lines 17*b* are connected to the illumination control lines 401. Thus, block driving can be implemented.

Incidentally, in FIG. 32, by connecting the gate signal lines 17*a* to the illumination control lines 401 and performing resets, it is possible to implement block driving. In other words, the block driving according to the present invention is a drive method which puts a plurality of pixel rows in non-illumination (black display) mode simultaneously using one control line.

In the above example, one selection gate signal line is placed (formed) per pixel row. The present invention is not limited to this and a selection gate signal line may be placed (formed) for two or more pixel rows.

FIG. 41 shows such an example. Incidentally, for ease of explanation, the pixel configuration in FIG. 1 is employed mainly. In FIG. 41, the gate signal line 17*a* for pixel row selection selects three pixels (16R, 16G, and 16B) simultaneously. Reference character R is intended to indicate something related to a red pixel, reference character G indicates something related to a green pixel, and reference character B indicates something related to a blue pixel.

Thus, when the gate signal line 17*a* is selected, the pixels 16R, 16G, and 16B are selected and get ready to write data. The pixel 16R writes data into a capacitor 19R via a source signal line 18R, the pixel 16G writes data into a capacitor 19G via a source signal line 18G, and the pixel 16B writes data into a capacitor 19B via a source signal line 18B.

The transistor 11*d* of the pixel 16R is connected to a gate signal line 17*b*R, the transistor 11*d* of the pixel 16G is connected to a gate signal line 17*b*G, and the transistor 11*d* of the pixel 16B is connected to a gate signal line 17*b*B. Thus, an EL element 15R of the pixel 16R, EL element 15G of the pixel 16G, and EL element 15B of the pixel 16B can be turned on and off separately. Illumination times and illumination periods of the EL element 15R, EL element 15G, and EL element 15B can be controlled separately by controlling the gate signal line 17*b*R, gate signal line 17*b*G, and gate signal line 17*b*B.

To implement this operation, in the configuration in FIG. 6, it is appropriate to form (place) four shift register circuits: a shift register circuit 61 which scans the gate signal line 17*a*, shift register circuit 61 which scans the gate signal line 17*b*R, shift register circuit 61 which scans the gate signal line 17*b*G, and shift register circuit 61 which scans the gate signal line 17*b*B.

Incidentally, although it has been stated that a current N times larger than a predetermined current is passed through the source signal line 18 and that a current N times larger than a predetermined current is passed through the EL element 15 for a period of 1/N, this cannot be implemented in practice.

Actually, signal pulses applied to the gate signal line 17 penetrate into the capacitor 19, making it impossible to set a desired voltage value (current value) on the capacitor 19. Generally, a voltage value (current value) lower than a desired voltage value (current value) is set on the capacitor 19. For example, even if 10 times larger current value is meant to be set, only approximately 5 times larger current value is set on the capacitor 19. For example, even if N=10 is specified, N=5 times larger current actually flows through the EL element 15. Thus, this method sets an N times larger current value to pass a current proportional or corresponding to the N-fold value through the EL element 15. Alternatively, this drive method applies a current larger than a desired value to the EL element 15 in a pulsed manner.

This method performs current (voltage) programming so as to obtain desired emission brightness of the EL element by passing a current larger than a desired value intermittently through the driver transistor 11*a* (in the case of FIG. 1) (i.e., a current which will give brightness higher than the desired brightness if passed through the EL element 15 continuously).

Incidentally, a compensation circuit which employs the penetration to the capacitor 19 is installed in the source driver circuit 14. This will be described later.

Preferably, N-channel transistors are used as the switching transistors 11*b* and 11*c*, etc. in FIG. 1 and the like. This will reduce penetration voltage reaching the capacitor 19. Also, since off-leakage of the capacitor 19 is reduced, this method can be applied to a 10-Hz or lower frame rate.

Depending on pixel configuration, if the penetration voltage tends to increase the current flowing through the EL element 15, white peak voltage will increase, increasing perceived contrast in image display. This provides for a good image display.

Conversely, it is also useful to use P-channel transistors as the switching transistors 11*b* and 11*c* in FIG. 1 to cause penetration, and thereby obtain a proper black display. When the P-channel transistor 11*b* turns off, the voltage goes high (Vgh), shifting the terminal voltage of the capacitor 19 slightly to the Vdd side. Consequently, the voltage at the gate (G) terminal of the transistor 11*a* rises, resulting in more intense black display. Also, the current used for first gradation display can be increased (a certain base current can be delivered up until gradation 1), and thus shortages of write current can be eased during current programming.

Besides, it is useful to increase penetration voltage by intentionally forming a capacitor 19*b* between the gate signal line 17*a* and the gate (G) terminal of the transistor 11*a* (see FIG. 42(*a*)). Preferably, the capacitance of the capacitor 19*b* is between 1/50 and 1/10 (both inclusive) of the capacitance of a normal capacitor 19*a*. More preferably, it is between 1/40 and 1/15 (both inclusive). Alternatively, it should be from 1 to 10 times (both inclusive) the source-gate (or source-drain (SD) or gate-drain (GD)) capacitance of the transistor 11*b*. More preferably, it is from 2 to 6 times (both inclusive) the SG capacitance. Incidentally, the capacitor 19*b* may be formed or placed between one terminal of the capacitor 19*a* (gate (G) terminal of the transistor 11*a*) and source (S) terminal of the transistor 11*d*. In that case, the capacitance and the like have the same values as those described above.

Let Cb (pF) denote the capacitance of the penetration-voltage generating capacitor 19*b*, let Ca (pF) denote the capacitance of the capacitor 19*a*, let Vw denote the gate (G) terminal voltage of the transistor 11*a* in the case of white peak current (during white raster display at the maximum display brightness), and let Vb denote the gate (G) terminal voltage in the case of black display current (basically when the current is 0, i.e., during black display), preferably the following relationship is satisfied.

$$Ca/(200Cb) < |Vw-Vb| \leqq Ca/(8Cb)$$

Incidentally, |Vw−Vb| is the absolute value of the difference in the terminal voltage of the driver transistor between white display and black display (i.e., a variable voltage range).

More preferably the following relationship is satisfied.

$$Ca/(100Cb) \leqq |Vw-Vb| \leqq Ca/(10Cb)$$

The transistor 11*b* should be a p-channel transistor and should have at least two gates. Preferably, it has three or more gates. More preferably, it has four or more gates. Capacitors with a capacitance of 1 to 10 times the source-gate (SD or gate-drain (GD)) capacitance of the transistor 11*b* (when activated) are placed or formed in series.

Incidentally, the above items apply not only to the pixel configuration in FIG. 1, but also to other pixel configurations. For example, in the current-mirror pixel configuration in FIG. 42(*b*), a penetration-voltage generating capacitor is formed or placed between the gate signal line 17*a* or 17*b* and gate (G) terminal of the transistor 11*a*. The switching transistor 11*c* should be an n-channel transistor and should have two or more gates. Alternatively, switching transistors 11*c* and 11*d* should be p-channel transistors and should have three or more gates.

In the voltage-programming pixel configuration in 41, a penetration-voltage generating capacitor 19*c* is formed or placed between the gate signal line 17*c* and gate (G) terminal of the driver transistor 11*a*. The switching transistor 11*c* should have three or more gates. The penetration-voltage generating capacitor 19*c* may be formed or placed between the drain (D) terminal of the transistor 11*c* (on the side of the capacitor 19*b*) and the gate signal line 17*a*. Also, the penetration-voltage generating capacitor 19*c* may be formed or placed between the gate (G) terminal of the transistor 11*a* and the gate signal line 17*a*. The penetration-voltage generating capacitor 19*c* may be formed or placed between the drain (D) terminal of the transistor 11*c* (on the side of the capacitor 19*b*) and the gate signal line 17*c*.

Let Ca denote the capacitance of the charge-holding capacitor 19*a*, let Cc denote the source-gate capacitance (the capacitance of any penetration-voltage generating capacitor is added) of the switching transistor 11*c* or 11*d*, let Vgh denote a high voltage signal applied to the gate signal line, and let Vgl denote a low voltage signal applied to the gate signal line, proper black display can be achieved if the following relationship is satisfied.

$$0.05\ (\mathrm{V}) \leqq (Vgh-Vgl) \times (Cc/Ca) \leqq 0.8\ (\mathrm{V})$$

More preferably the following relationship is satisfied.

$$0.1\ (\mathrm{V}) \leqq (Vgh-Vgl) \times (Cc/Ca) \leqq 0.5\ (\mathrm{V})$$

The above items also apply to the pixel configurations in FIG. 43 and the like. In the voltage-programming pixel configuration in FIG. 43, the penetration-voltage generating capacitor 19*b* is formed or placed between the gate (G) terminal of the transistor 11*a* and the gate signal line 17*a*.

Incidentally, the penetration-voltage generating capacitor 19*b* is formed by the source wiring and gate wiring of the transistor. However, since the capacitor 19*b* is formed by increasing the source width of the transistor 11 and lapping the source wiring over the gate signal line 17, there may be cases in which the capacitor 19*b* is not separated clearly from the transistor in a practical sense.

The approach of constructing a penetration-voltage generating capacitor 19*b* in appearance by making the switching transistors 11*b* and 11*c* (in the configuration in FIG. 1) larger than necessary also belongs to the present invention. The switching transistors 11*b* and 11*c* are often formed in such a way as to satisfy a relationship: channel width W/channel length L=6/6 μm. Increasing the W amounts to constructing a penetration-voltage generating capacitor 19*b*. For example, the ratio of W to L is configured to be between 2:1 and 20:1 (both inclusive). Preferably, the ratio of W to L is between 3:1 and 10:1 (both inclusive).

Preferably, the size (capacitance) of the penetration-voltage generating capacitors 19*b* is varied among R, G, and B, which make pixels modulated. This is because drive current varies among the EL elements 15 of R, G, and B as well as because cutoff voltage varies with the EL element 15, varying the voltage (current) programmed into the gate (G) terminal of the driver transistor 11*a* among the EL elements 15. For example, if a capacitor 19*b*R for the R pixel is 0.02 pF, capacitors 19*b*G and 19*b*B for the other colors (G and B pixels) should be 0.025 pF. Also, if the capacitor 19*b*R for the R pixel is 0.02 pF, the capacitor 19*b*G for the G pixel should be 0.03 pF and the capacitor 19*b*B for the B pixel should be 0.025 pF, for example. By varying the capacitance of the capacitors 19*b* among the R, G, and B pixels in this way, it is possible to adjust offset drive current separately for R, G, and B. This makes it possible to optimize black display levels for R, G, and B.

It has been described that the capacitance of the penetration-voltage generating capacitors 19*b* is varied, but the penetration voltage is determined relatively depending on relationship between the capacitance of the charge-holding capacitor 19*a* and capacitance of the penetration-voltage generating capacitor 19*b*. Thus, it is not strictly necessary to vary the capacitors 19*b* among the R, G, and B pixels. That is, the capacitance of the charge-holding capacitors 19*a* may be varied. For example, if the capacitor 11*a*R for the R pixel is 1.0 pF, the capacitor 11*a*G for the G pixel may be 1.2 pF and the capacitor 11*b*B for the B pixel may be 0.9 pF. At this time, the capacitance of the penetration-voltage generating capacitors 19*b* should be common among R, G, and B. Thus, according to the present invention, the capacitance ratio between the charge-holding capacitors 19*a* and penetration-voltage generating capacitors 19*b* is varied at least for one of the RGB colors. Incidentally, both the capacitance of the charge-holding capacitors 19*a* and capacitance of the penetration-voltage generating capacitors 19*b* may be varied among the R, G, and B pixels.

Also, the capacitance of the penetration-voltage generating capacitors 19*b* may be varied between the left and right of the screen 50. In the case of pixels 16 located close to the gate drivers 12, since they are placed on the signal supply side, gate signals rise quickly (because of a high through-rate), resulting in a high penetration voltage. Pixels placed (formed) at the ends of the gate signal lines 17 have blunt waveforms (because the gate signal lines 17 have capacitance). This is because gate signals rise slowly (because of a low through-rate), resulting in a low penetration voltage. Thus, the penetration-voltage generating capacitors 19*b* of the pixels 16 close to the side of connection with the gate drivers 12 should be downsized. Also, capacitors 19*b* at the ends of the gate signal lines 17 should be enlarged. For example, the capacitance of the capacitors is varied by approximately 10% between the left and right of the screen.

The penetration voltage generated depends on the capacitance ratio between the charge-holding capacitors 19*a* and penetration-voltage generating capacitors 19*b*. Thus, although it has been stated that the capacitance of the penetration-voltage generating capacitors 19*b* are varied between the left and right of the screen, this is not restrictive. It is also possible to keep the capacitance of the penetration-voltage generating capacitors 19*b* constant between the left and right of the screen and vary the capacitance of the charge-holding capacitors 19*a* between the left and right of the screen. Needless to say, it is also possible to vary both the capacitance of the penetration-voltage generating capacitors 19*b* and capacitance of the charge-holding capacitors 19*a* between the left and right of the screen.

One of the problems with the N-fold pulse driving according to the present invention is that the current applied to the EL elements 15 is N times larger than the current applied conventionally although instantaneously. Large current may shorten the life of EL elements. To solve this problem, it is useful to apply a reverse bias voltage Vm to the EL elements 15.

In the above example, RGB image data is rewritten within a field (frame). The RGB data may be rewritten sequentially. The term "sequentially" means rewriting R image data in the first field, G image data in the second field, and B image data in the third field assuming that one frame consists of three fields. This drive method is referred to as sequential driving.

Needless to say, sequential driving may be used in combination with another drive method according to the present invention such as N-fold pulse driving or reset driving. Display panels employing a combination of drive methods according to the present invention or display apparatus employing such a display panel are also included in the present invention.

Figure 75:
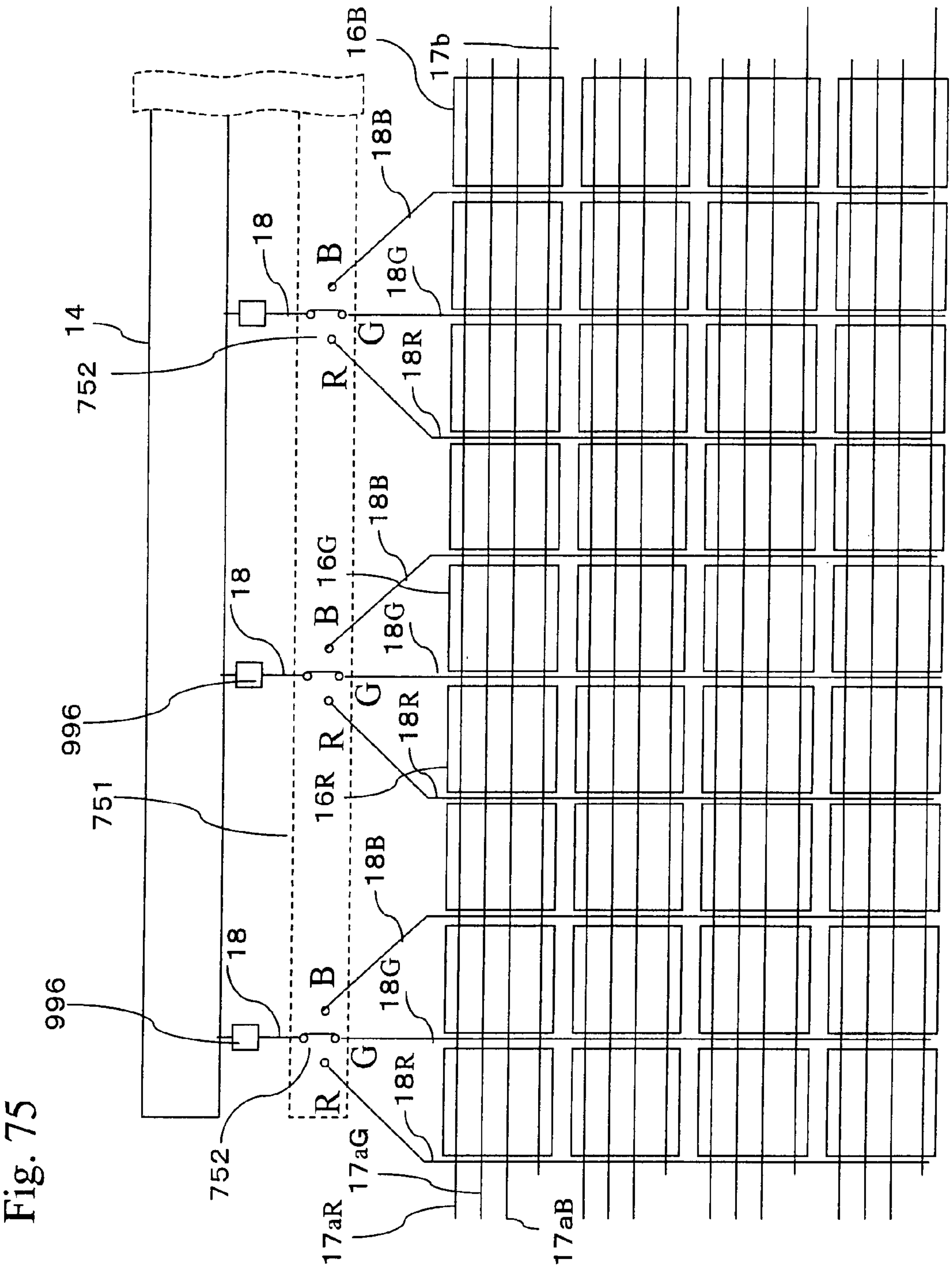
FIG. 75 is an explanatory diagram illustrating a display panel according to the present invention.

FIG. 75 is an explanatory diagram illustrating a display panel which performs sequential driving. A source driver circuit 14 outputs R, G, and B data to connection terminals 996 by switching among them. Thus, the source driver circuit 14 only needs ⅓ as many output terminals as in FIG. 48.

Signals outputted from the source driver circuit 14 to the connection terminals 996 are allocated to 18R, 18G, and 18B by an output switching circuit 751. The output switching circuit 751 is formed directly on an array board 71 by polysilicon technology. Alternatively, it may be formed with silicon chips and mounted on the array board 71 by COG technology. Also, the output switching circuit 751 may be incorporated into the source driver circuit 14 as a sub-circuit of the source driver circuit 14.

If a changeover switch 752 is connected to an R terminal, the output signal from the source driver circuit 14 is applied to the source signal line 18R. If the changeover switch 752 is connected to a G terminal, the output signal from the source driver circuit 14 is applied to the source signal line 18G. If the changeover switch 752 is connected to a B terminal, the output signal from the source driver circuit 14 is applied to the source signal line 18B.

Figure 76:
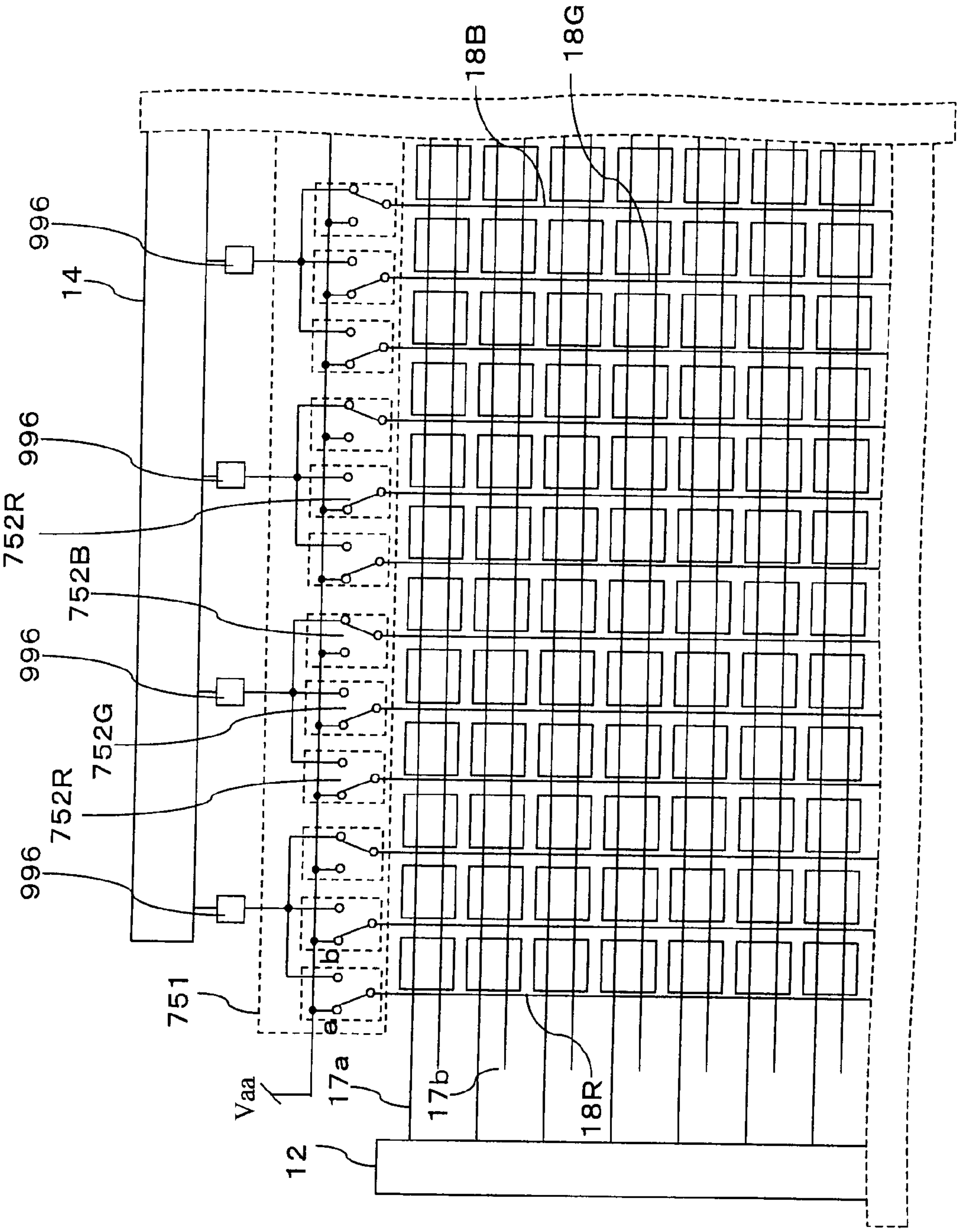
FIG. 76 is an explanatory diagram illustrating a display panel according to the present invention.

Incidentally, in the configuration in FIG. 76, when the changeover switch 752 is connected to the R terminal, the G terminal and B terminal of the changeover switch are open. Thus, the current entering the source signal lines 18G and 18B is 0 A. Consequently, the pixels 16 connected to the source signal lines 18G and 18B provide a black display.

When the changeover switch 752 is connected to the G terminal, the R terminal and B terminal of the changeover switch are open. Thus, the current entering the source signal lines 18R and 18B is 0 A. Consequently, the pixels 16 connected to the source signal lines 18R and 18B provide a black display.

In the configuration in FIG. 76, when the changeover switch 752 is connected to the B terminal, the R terminal and G terminal of the changeover switch are open. Thus, the current entering the source signal lines 18R and 18G is 0 A. Consequently, the pixels 16 connected to the source signal lines 18R and 18G provide a black display.

Basically, if one frame consists of three fields, R image data is written in sequence into the pixels 16 in the display area 50 in the first field. In the second field, G image data is written in sequence into the pixels 16 in the display area 50. In the third field, B image data is written in sequence into the pixels 16 in the display area 50.

Thus, R data→G data→B data→R data→ . . . are rewritten in sequence in the appropriate fields to implement sequential driving. Description of how N-fold pulse driving is performed by turning on and off the switching transistor 11*d* as shown in FIG. 1 has been given with reference to FIGS. 5, 13, 16, etc. Needless to say, such a drive method can be combined with sequential driving.

In the above example, it has been stated that when image data is written into the R pixel 16, black data is written into the G pixel and B pixel, that when image data is written into the G pixel 16, black data is written into the R pixel and B pixel, and that when image data is written into the B pixel 16, black data is written into the R pixel and G pixel. The present invention is not limited to this.

For example, when image data is written into the R pixel 16, the G pixel and B pixel may retain the image data rewritten in the previous field. This can make the screen 50 brighter. When image data is written into the G pixel 16, the R pixel and B pixel may retain the image data rewritten in the previous field. When image data is written into the B pixel 16, the G pixel and R pixel may retain the image data rewritten in the previous field.

In order to retain image data in pixels other than the color pixel being rewritten, the gate signal line 17*a* can be controlled separately for the R, G, and B pixels. For example, as illustrated in FIG. 75, a gate signal line 17*a*R can be designated as a signal line which turns on and off the transistors 11*b* and 11*c* of the R pixel, a gate signal line 17*a*G can be designated as a signal line which turns on and off the transistors 11*b* and 11*c* of the G pixel, and a gate signal line 17*a*B can be designated as a signal line which turns on and off the transistors 11*b* and 11*c* of the B pixel. On the other hand, the gate signal line 17*b* can be designated as a signal line which commonly turns on and off the transistors 11*d* of the R, G, and B pixels.

With the above configuration, when the source driver circuit 14 outputs R image data and the changeover switch 752 is set to an R contact, a turn-on voltage can be applied to the gate signal line 17*a*R and a turn-off voltage can be applied to the gate signal lines aG and aB. Thus, the R image data can be written into the R pixel 16 and the G pixel 16 and R pixel 16 can retain the image data of the previous field.

When the source driver circuit 14 outputs G image data in the second field and the changeover switch 752 is set to a G contact, a turn-on voltage can be applied to the gate signal line 17*a*G and a turn-off voltage can be applied to the gate signal lines aR and aB. Thus, the G image data can be written into the G pixel 16 and the R pixel 16 and B pixel 16 can retain the image data of the previous field.

When the source driver circuit 14 outputs B image data in the third field and the changeover switch 752 is set to a B contact, a turn-on voltage can be applied to the gate signal line 17*a*B and a turn-off voltage can be applied to the gate signal line aR and aG. Thus, the B image data can be written into the B pixel 16 and the R pixel 16 and G pixel 16 can retain the image data of the previous field.

In the example shown in FIG. 75, the gate signal lines 17*a* are placed (formed) in such a way as to turns on and off the transistors 11*b* of the R, G, and B pixels 16 separately. However, the present invention is not limited to this. For example, a gate signal line 17*a* common to the R, G, and B pixels 16 may be formed of placed as illustrated in FIG. 76.

In relation to the configuration in FIG. 75 and the like, it has been stated that when the R source signal line is selected by the changeover switch 752, the G and B source signal lines are open. However, the open state is an electrically floating state and is not desirable.

FIG. 76 shows a configuration in which measures are taken to eliminate such floating state. A terminal a of a changeover switch 752 of an output switching circuit 751 is connected to a Vaa voltage (voltage for black display). A terminal b is connected to an output terminal of the source driver circuit 14. The changeover switch 752 is installed for each of the R, G, and B pixels.

In the state shown in FIG. 76, a changeover switch 752R is connected to a Vaa terminal. Thus, the Vaa voltage (voltage for black display) is applied to the source signal line 18R. A changeover switch 752G is connected to a Vaa terminal. Thus, the Vaa voltage (voltage for black display) is applied to the source signal line 18G. A changeover switch 752B is connected to the output terminal of the source driver circuit 14. Thus, a B image signal is applied to the source signal line 18B.

In the above state, the B pixel is being rewritten and a black display voltage is applied to the R pixel and G pixel. As the changeover switches 752 are controlled in the above manner, an image composed of the pixels 16 are rewritten. Incidentally, control of the gate signal lines 17*b* is the same as in the examples described above, and thus detailed description thereof will be omitted.

In the above example, the R pixel 16 is rewritten in the first field, the G pixel 16 is rewritten in the second field, and the B pixel 16 is rewritten in the third field. That is, the color of the pixel rewritten changes every field. The present invention is not limited to this. The color of the pixel rewritten may be changed every horizontal scanning period (1 H). For example, a possible drive method involves rewriting the R pixel in the first H, the G pixel in the second H, the B pixel in the third H, the R pixel in the fourth H, and so on. Of course, the color of the pixel rewritten may be changed every two horizontal scanning periods or every ⅓ field.

Figure 77:
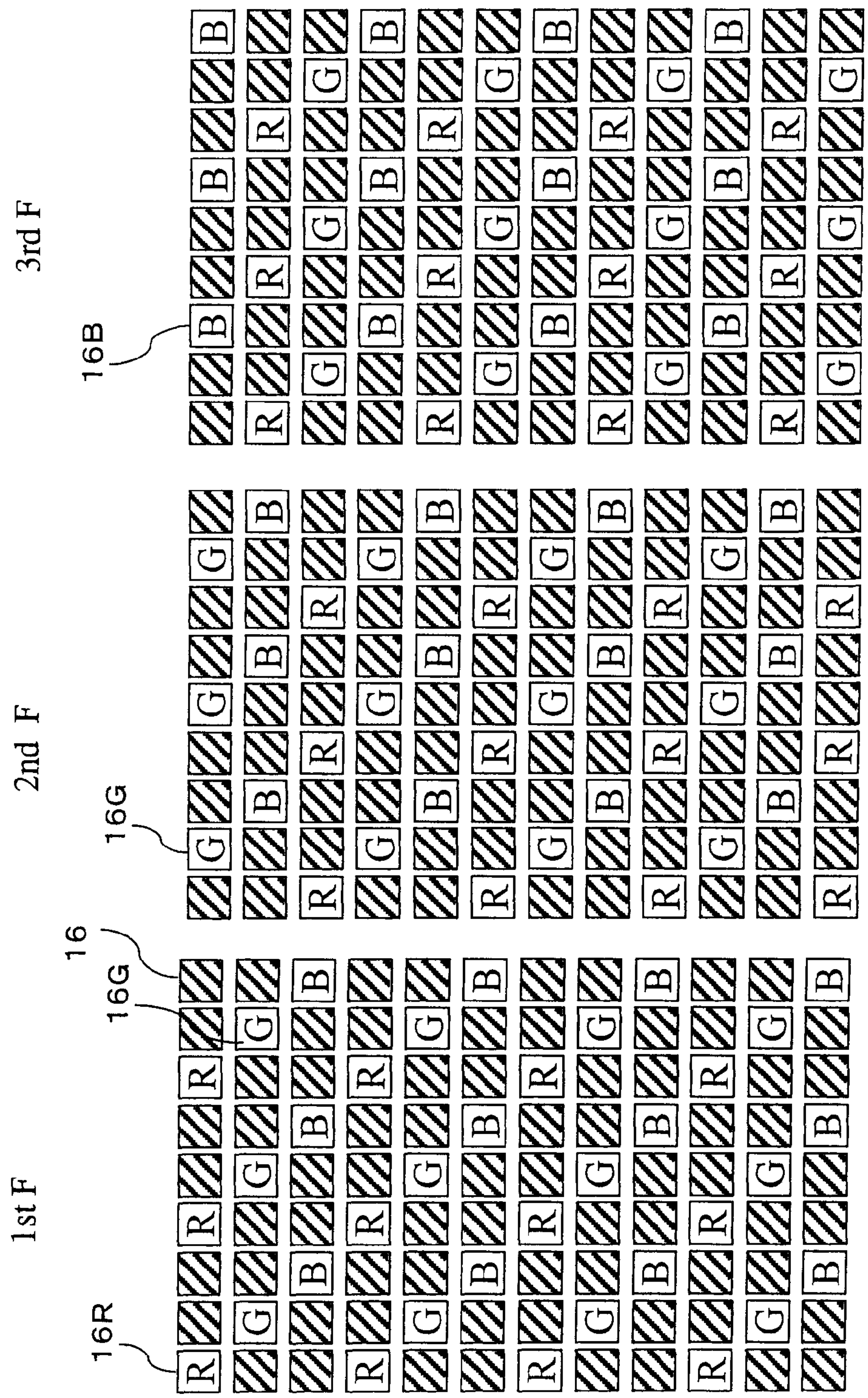
FIG. 77 is an explanatory diagram illustrating a drive method of a display apparatus according to the present invention.

FIG. 77 shows an example, in which the color of the pixel rewritten changes every 1 H. Incidentally, in FIGS. 77 to 79, the oblique hatching indicates that the pixels 16 either retain image data from the previous field instead of being rewritten or are displayed in black. Of course, the black display of the pixels and retention of image data from the previous field may be repeated alternately.

Needless to say, in the drive system in FIGS. 75 to 79, it is also possible to use the N-fold pulse driving in FIG. 13 or simultaneous M-row driving. FIGS. 75 to 79, and the like, show writing of pixels 16. Although illumination control of the EL elements 15 is not described, it goes without saying that this example can be used in combination with examples described earlier or later.

One frame need not necessarily consist of three fields and may consist of two fields or four or more fields. In one example illustrated herein, one frame consists of two fields and the R and G pixels out of the three primary RGB colors are rewritten in the first field and the B pixel is rewritten in the second field. In another example illustrated herein, one frame consists of four fields and the R pixel out of the three primary RGB colors is rewritten in the first field, the G pixel is rewritten in the second field, and the B pixel is rewritten in the third and fourth field. In these sequences, white balance can be achieved more efficiently if the luminous efficiencies of the R, G, and B EL elements 15 are taken into consideration.

In the above example, the R pixel 16 is rewritten in the first field, the G pixel 16 is rewritten in the second field, and the B pixel 16 is rewritten in the third field. That is, the color of the pixel rewritten changes every field.

According to the example shown in FIG. 77, in the first field, an R pixel is rewritten in the first H, a G pixel is rewritten in the second H, a B pixel is rewritten in the third H, an R pixel is rewritten in the fourth H, and so on. Of course, the color of the pixel rewritten may be changed every two or more horizontal scanning periods or every ⅓ field.

According to the example shown in FIG. 77, in the first field, an R pixel is rewritten in the first H, a G pixel is rewritten in the second H, a B pixel is rewritten in the third H, and an R pixel is rewritten in the fourth H. In the second field, a G pixel is rewritten in the first H, a B pixel is rewritten in the second H, an R pixel is rewritten in the third H, and a G pixel is rewritten in the fourth H. In the third field, a B pixel is rewritten in the first H, an R pixel is rewritten in the second H, a G pixel is rewritten in the third H, and a B pixel is rewritten in the fourth H.

Thus, by rewriting the R, G, and B pixels in each field arbitrarily or with some regularity, it is possible to prevent separation among the R, G, and B colors. Also, flickering is reduced.

Figure 78:
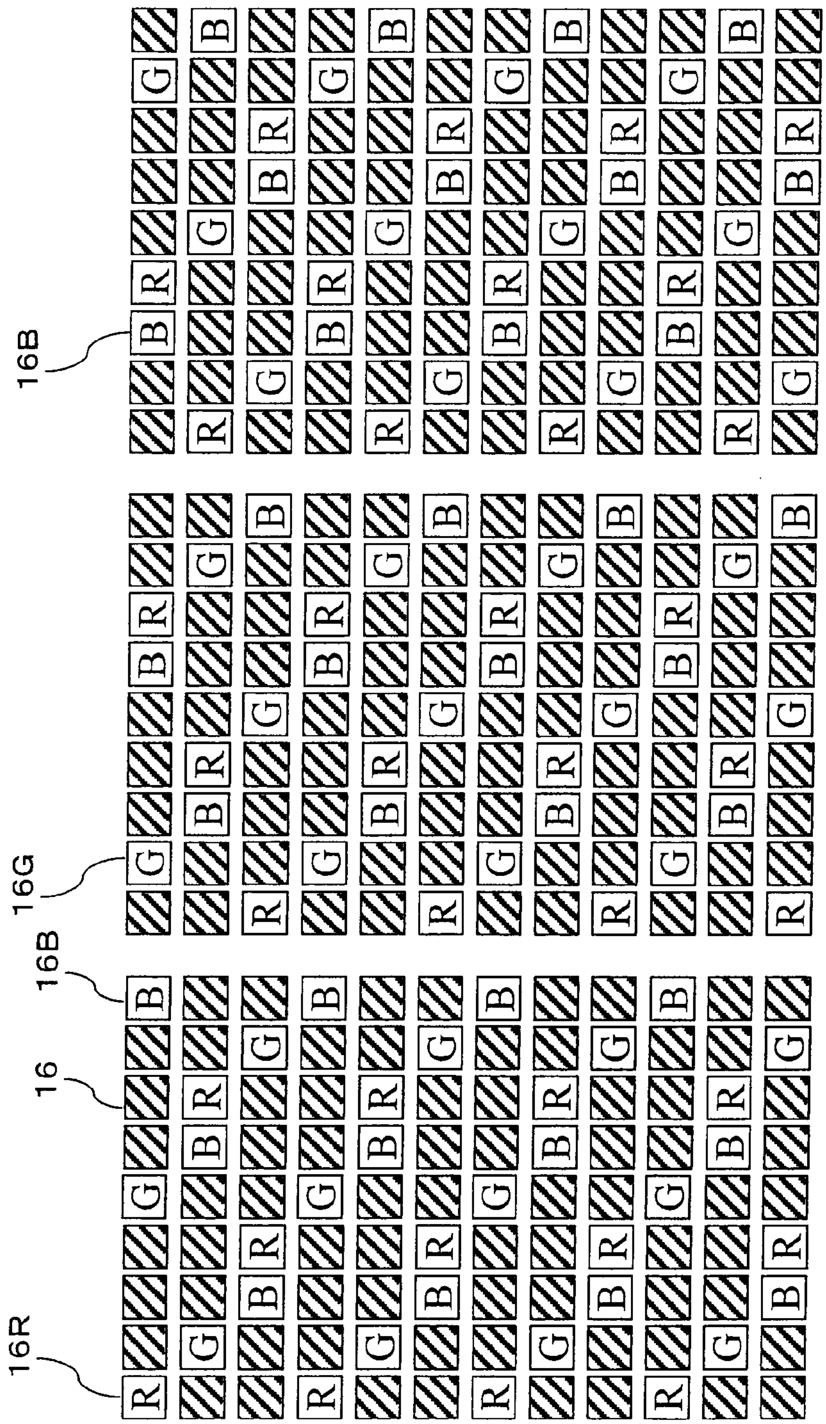
FIG. 78 is an explanatory diagram illustrating a drive method of a display apparatus according to the present invention.

In FIG. 78, a plurality of pixel 16 colors are rewritten every 1 H. In FIG. 77, in the first field, the pixel 16 rewritten in the first H is an R pixel, the pixel 16 rewritten in the second H is a G pixel, the pixel 16 rewritten in the third H is a B pixel, the pixel 16 rewritten in the fourth H is an R pixel.

In FIG. 78, positions of the different-colored pixels rewritten are changed every 1 H. By assigning R, G, and B pixels to different fields (needless to say, this may be done with some regularity) and rewriting them in sequence, it is possible to prevent separation among the R, G, and B colors as well as to reduce flickering.

Incidentally, even in the example in FIG. 78, the R, G, and B pixels should have the same illumination time or luminous intensity in each picture element, which is a set of R, G, and B pixels. Needless to say, this is also done in the examples in FIGS. 76, 77, and the like to avoid color irregularities.

As shown in FIG. 78, in order to rewrite pixels of different colors in each H (three colors—R, G, and B—are rewritten in the first H in the first field in FIG. 78), in FIG. 75, the source driver circuit 14 can be configured to output image signals of arbitrary colors (or colors determined with some regularity) to the terminals and the changeover switches 752 can be configured to connect to the R, G, and B contacts arbitrarily (or with some regularity).

Figure 79:
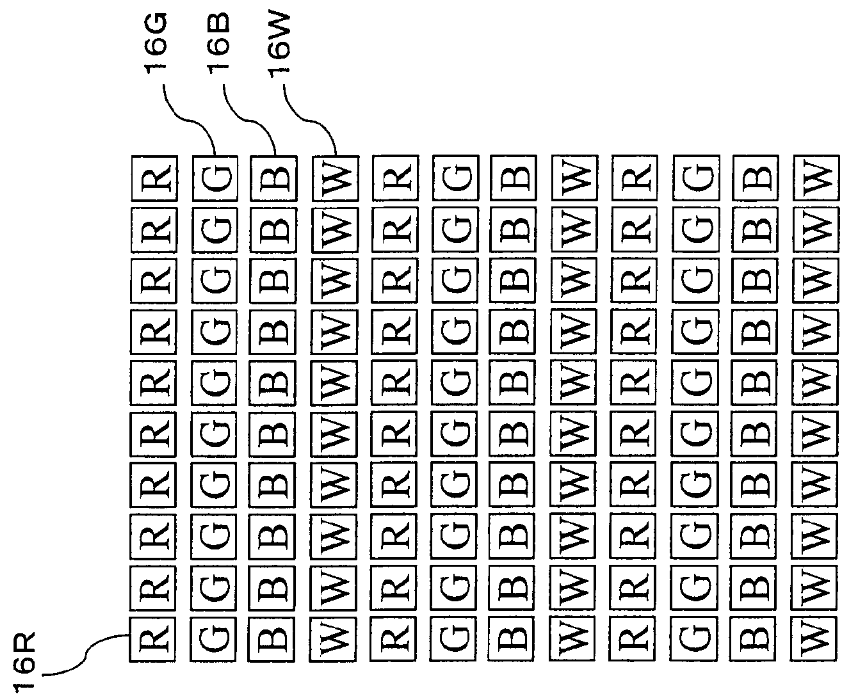
FIG. 79 is an explanatory diagram illustrating a drive method of a display apparatus according to the present invention.
Figure 79:
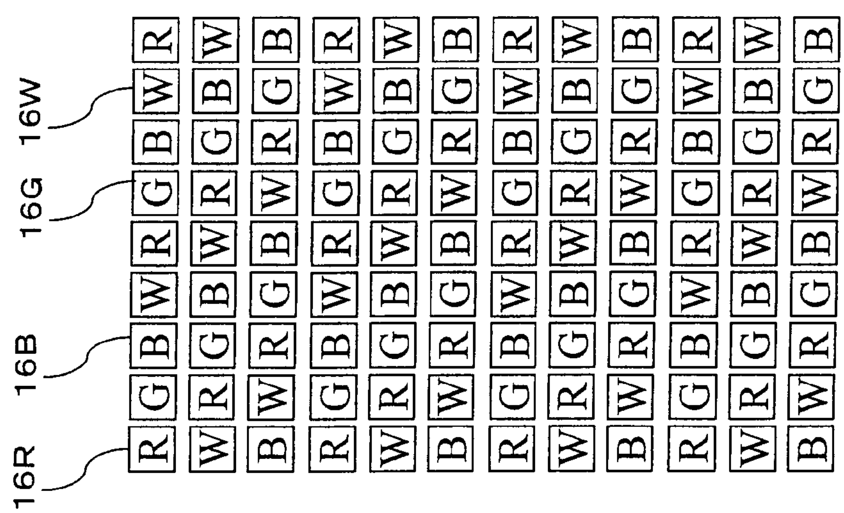

The panel in an example in FIG. 79 has W (white) pixels 16W in addition to the three primary colors RGB. By forming or placing pixels 16W, it is possible to achieve peak brightness of colors properly as well as to achieve a high brightness-display. FIG. 79(*a*) shows an example in which R, G, B, and W pixels 16 are formed in each pixel row. FIG. 79(*b*) shows an example in which R, G, B, and W pixels are placed in turns in different pixel rows.

Needless to say, the drive method in FIG. 79 can incorporate the drive methods in FIGS. 77, 78, etc. Also, it goes without saying that N-fold pulse driving, simultaneous M-row driving, etc. can be incorporated. These matters can easily be implemented by those skilled in the art based on this specification, and thus description thereof will be omitted.

Incidentally, for ease of explanation, it is assumed that the display panel according to the present invention has the three primary colors RGB, but this is not restrictive. The display panel may have cyan, yellow, and magenta in addition to R, G, and B, or it may have any one of R, G, and B or any two of R, G, and B.

Also, although it has been stated that the sequential driving system handles R, G, and B in each field, it goes without saying that the present invention is not limited to this. Besides, the examples in FIGS. 75 to 79 illustrate how image data is written into pixels 16. They do not illustrate (although, of course, they are related to) a method of displaying images by operating the transistors 11*d* and passing current through the EL elements 15 unlike in FIG. 1. In the configuration shown in FIG. 1, current is passed through the EL elements 15 by controlling the transistors 11*d*.

Also, the drive methods in FIGS. 77, 78, etc. can display RGB images in sequence by controlling the transistors 11*d* (in the case of FIG. 1). For example, in FIG. 80(*a*), an R display area 53R, G display area 53G, and B display area 53B are scanned from top to bottom (or from bottom to top) of the screen during one frame (one field) period. The remaining area becomes a non-display area 52. That is, intermittent driving is performed.

Figure 80:
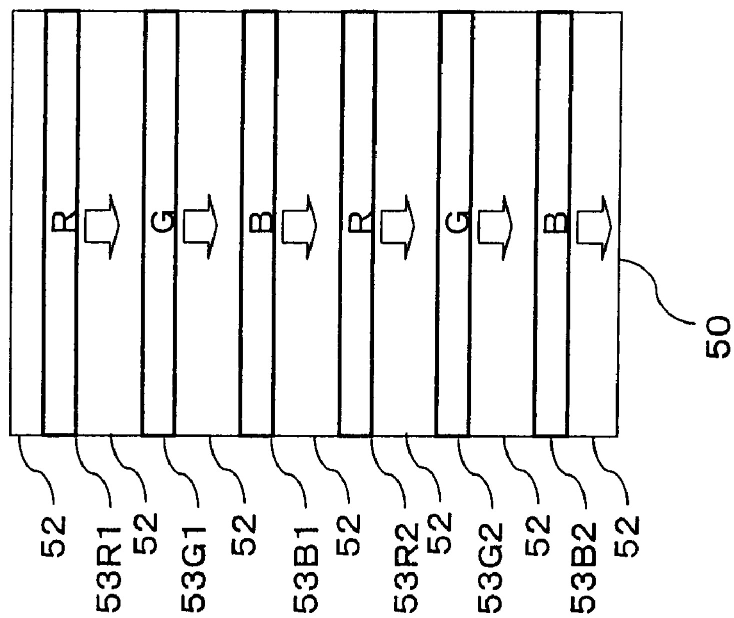
FIG. 80 is an explanatory diagram illustrating a drive method of a display apparatus according to the present invention.
Figure 80:
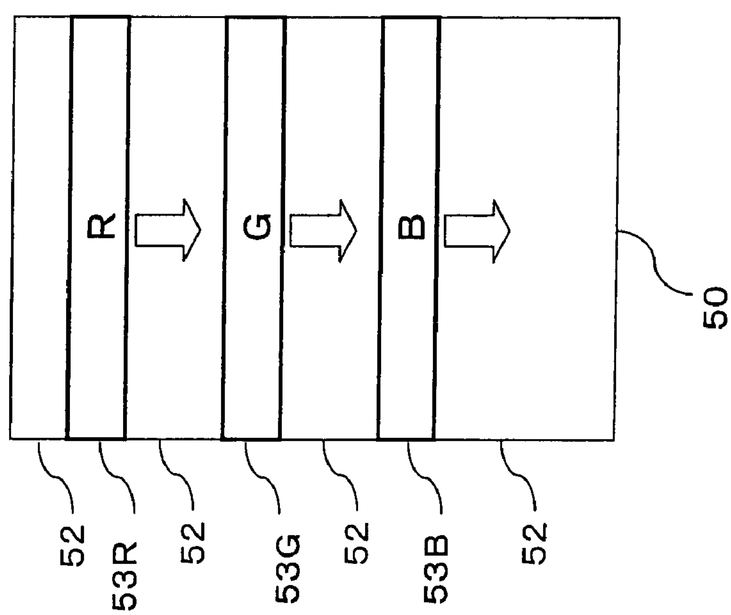

FIG. 80(*b*) shows an example in which a plurality of RGB display areas 53 are generated during one field (one frame) period. This drive method is analogous to the one shown in FIG. 16. Thus, it will require no explanation. In FIG. 80(*b*), by dividing the display area 53, it is possible to eliminate flickering even at a lower frame rate.

Figure 81:
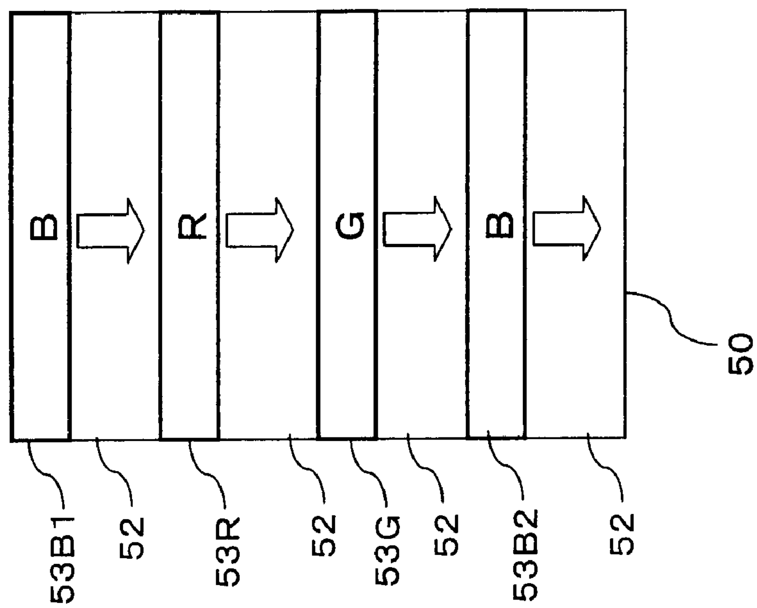
FIG. 81 is an explanatory diagram illustrating a drive method of a display apparatus according to the present invention.
Figure 81:
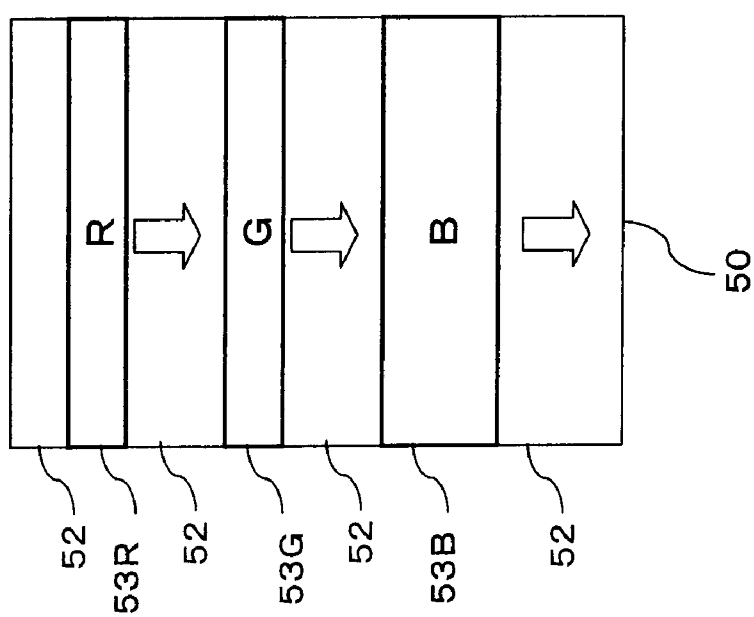

FIG. 81(*a*) shows a case in which R, G, and B display areas 53 have different sizes (needless to say, the size of a display area 53 is proportional to its illumination period). In FIG. 81(*a*), the R display area 53R and G display area 53G have the same size. The B display area 53B has a larger size than the G display area 53G. In an organic EL display panel, B often has a low light emission efficiency. By making the B display area 53B larger than the display areas 53 of other colors as shown in FIG. 81(*a*), it is possible to achieve a white balance efficiently.

FIG. 81(*b*) shows an example in which there are a plurality of B display periods 53B (53B1 and 53B2) during one field (one frame) period. Whereas FIG. 81(*a*) shows a method of varying the size of one B display area 53B to allow the white balance to be adjusted properly, FIG. 81(*b*) shows a method of displaying multiple B display areas 53B having the same surface area to achieve a proper white balance.

The drive system according to the present invention is not limited to either FIG. 81(*a*) or FIG. 81(*b*). It is intended to generate R, G, and B display areas 53 and create an intermittent display, and thereby correct blurred moving pictures and insufficient writing into the pixels 16. With the drive method in FIG. 16, independent display areas 53 for R, G, and B are not generated. R, G, and B are displayed simultaneously (it should be stated that a W display area 53 is presented). Incidentally, it goes without saying that FIG. 81(*a*) and FIG. 81(*b*) may be combined. For example, it is possible to combine the drive method of using display areas 53 of different sizes for R, G, and B in FIG. 81(*a*) with the drive method of generating multiple display areas 53 for R, G, or B in FIG. 81(*b*).

Incidentally, the drive method in FIGS. 80 and 81 is not limited to the drive methods in FIGS. 75 to 79 according to the present invention. Needless to say, with a configuration in which the currents flowing through the EL elements 15 (EL elements 15R, EL elements 15G, and EL elements 15B) are controlled separately for R, G, and B as shown in FIG. 41, the drive method in FIGS. 80 and 81 can be implemented easily.

By applying turn-on/turn-off voltages to the gate signal line 17*b*R, it is possible to turn on and off the R pixel 16R. By applying turn-on/turn-off voltages to the gate signal line 17*b*G, it is possible to turn on and off the G pixel 16G. By applying turn-on/turn-off voltages to the gate signal line 17*b*B, it is possible to turn on and off the B pixel 16B.

Figure 82:
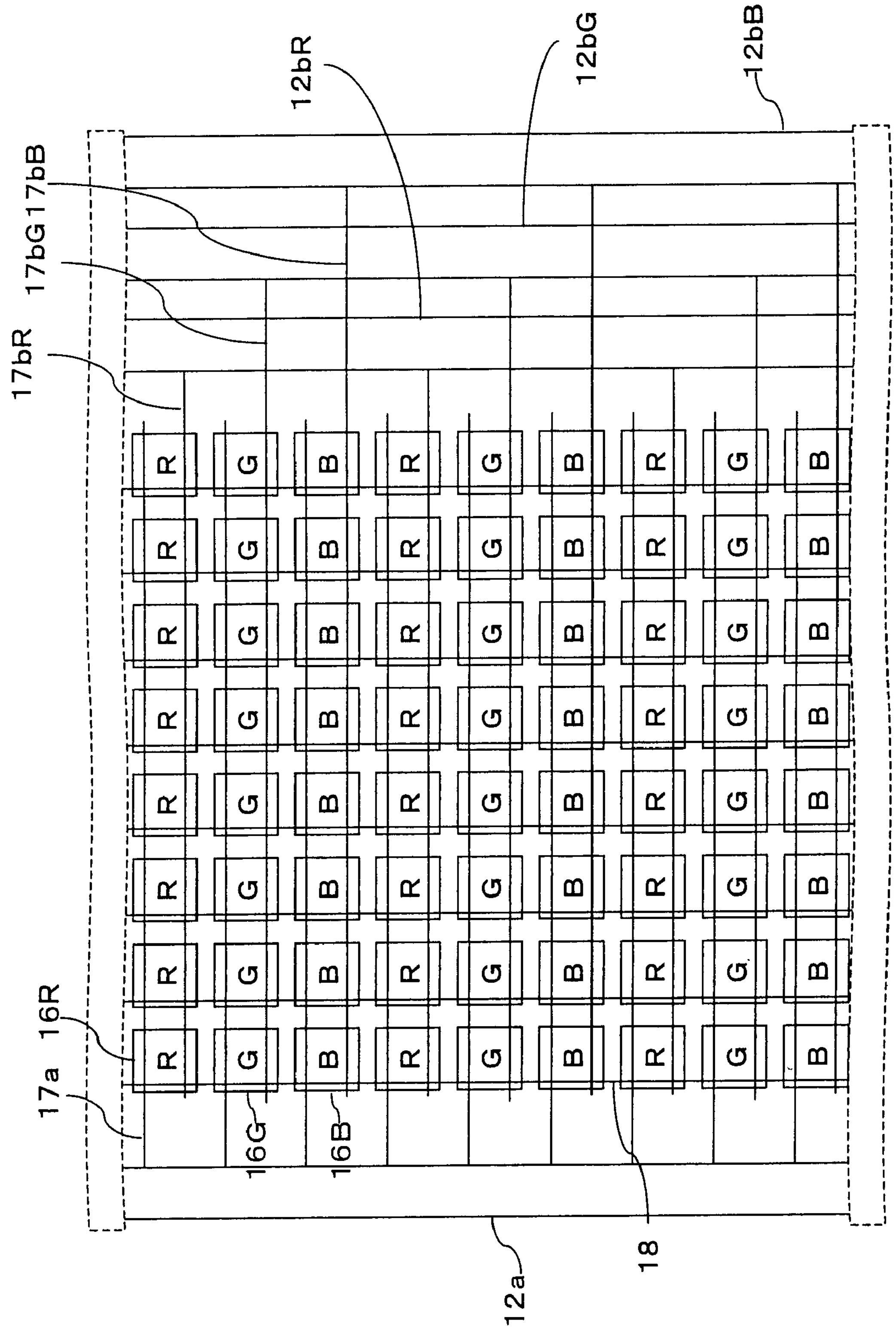
FIG. 82 is an explanatory diagram illustrating a display panel according to the present invention.

The above driving can be implemented by forming or placing a gate driver circuit 12*b*R which controls the gate signal line 17*b*R, a gate driver circuit 12*b*G which controls the gate signal line 17*b*G, and a gate driver circuit 12*b*B which controls the gate signal line 17*b*B, as illustrated in FIG. 82. By driving the gate driver circuits 12*b*R, 12*b*G, and 12*b*B in FIG. 82 by the method described in FIG. 6 or the like, the drive method in FIGS. 80 and 81 can be implemented. Of course, it goes without saying that the drive methods in FIG. 16 and the like can be implemented using the configuration of the display panel in FIG. 82.

Also, with the configuration shown in FIGS. 75 to 78, the drive method in FIGS. 80 and 81 can be implemented using a gate signal line 17*b* common to the R, G, and B pixels without using a gate signal line 17*b*R which controls the EL elements 15, a gate signal line 17*b*G which controls the EL elements 15G, and a gate signal line 17*b*B which controls the EL elements 15B as long as black image data can be written into pixels 16 other than the pixels 16 whose image data is rewritten.

In the EL element 15, electrons are injected into an electron transport layer from the negative pole (cathode) while at the same time positive holes are injected into a positive hole transport layer from the positive pole (anode). The injected electrons and positive holes move to the opposite pole under the influence of applied electric fields. In so doing, electrons and positive holes are trapped in an organic layer, and carriers are accumulated due to difference in energy levels on boundaries of a light-emitting layer.

It is known that accumulation of space charges in the organic layer causes molecules to be oxidized or reduced, producing unstable radical anion molecules or radical cation molecules, which in turn degrade membrane quality, resulting in reduced brightness and increased drive voltage during constant-current driving. To prevent this, device structure is changed and reverse voltage is applied, for example.

Application of a reverse bias voltage means application of a reverse current, and thus injected electrons and positive holes are drawn to the negative and positive poles, respectively. This makes it possible to cancel formation of space charge in the organic layer and reduce electro-chemical degradation, thereby prolonging the life.

Figure 45:
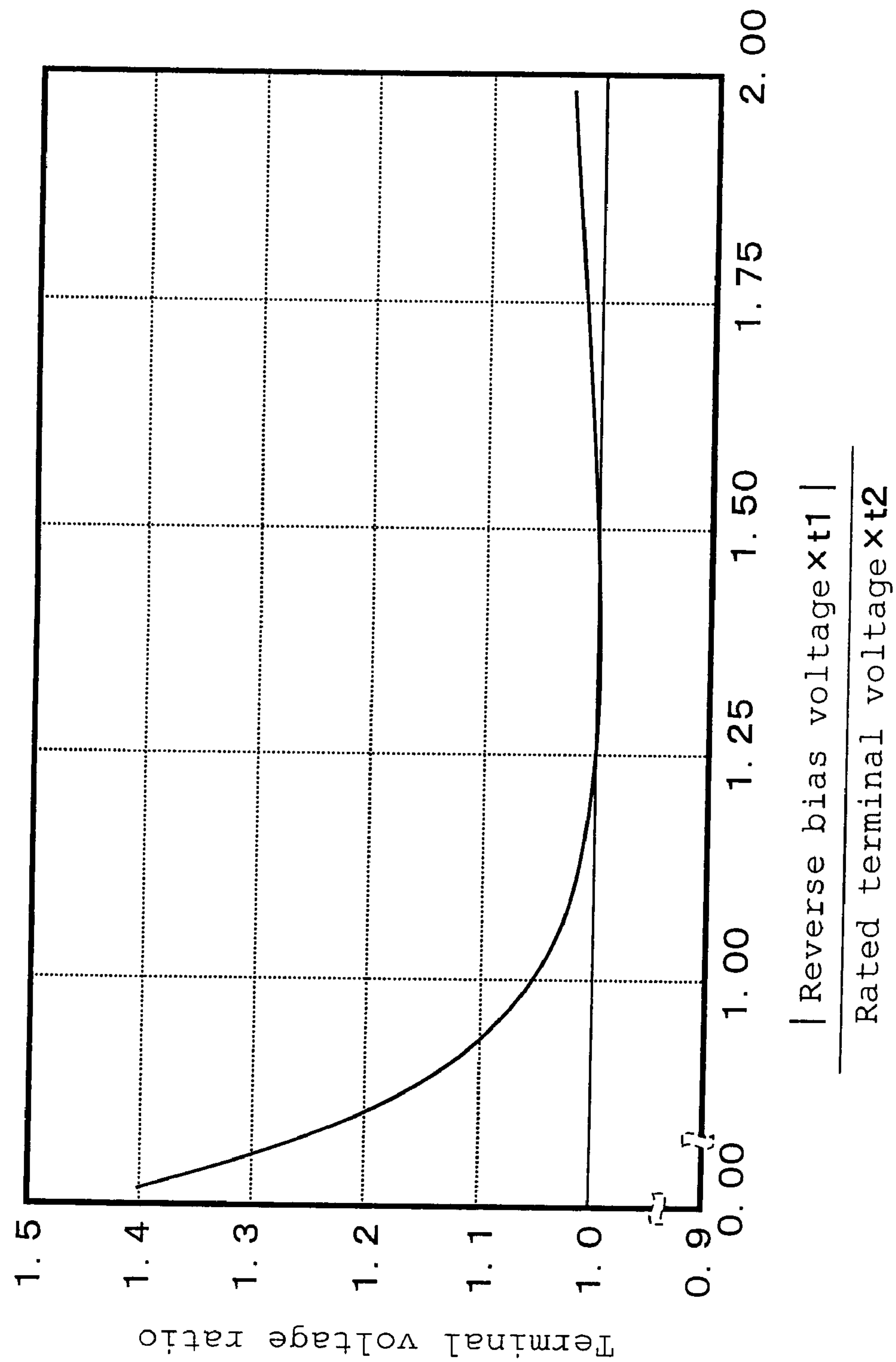
FIG. 45 is an explanatory diagram illustrating a drive method of a display apparatus according to the present invention.

FIG. 45 shows reverse bias voltage Vm versus changes in terminal voltage of the EL element 15. The terminal voltage results when a rated current is applied to the EL element 15. In FIG. 45, the current density of the current passed through the EL element 15 is 100 A per square meter. The trend in FIG. 45 shows little difference from the trend observed when the current density is 50 to 100 A per square meter. Thus, it is presumed that this method can be applied to a wide range of current density.

The vertical axis represents the ratio of the terminal voltage after 2500 hours to the initial terminal voltage of the EL element 15. For example, if the terminal voltage is 8 V and 10 V, respectively, when a current with a current density of 100 A per square meter is applied at time 0 (zero) and after 2500 hours, the terminal voltage ratio is 10/8=1.25.

The horizontal axis represents the ratio of the product of the reverse bias voltage Vm and its application duration t1 in a period to a rated terminal voltage V0. For example, if the reverse bias voltage Vm is applied at 60 Hz (60 Hz has no particular meaning) for ½ (half) a period, then t1=0.5. Further, t2 is the application duration of the rated terminal voltage. Also, if the terminal voltage (rated terminal voltage) is 8 V when a current with a current density of 100 A per square meter is applied at time 0 (zero) and if the reverse bias voltage Vm is −8V, then |reverse bias voltage×t1|/(rated terminal voltage×t2)=|−8 (V)×0.5|/(8 (V)×0.5)=1.0.

In FIG. 45, the terminal voltage ratio stops to change when |reverse bias voltage×t1|/(rated terminal voltage×t2) is 1.0 or larger (no change to the initial rated terminal voltage). Consequently, the application of the reverse bias voltage Vm works well. However, the terminal voltage ratio tends to increase when |reverse bias voltage×t1|/(rated terminal voltage×t2) is 1.75 or larger. Thus, the reverse bias voltage Vm and the application duration rate t1 (or t2 or the ratio between t1 and t2) should be determined in such a way as to make |reverse bias voltage×t1|/(rated terminal voltage×t2) equal to or larger than 1.0. Preferably, the reverse bias voltage Vm and the application duration rate t1 should be determined in such a way as to make |reverse bias voltage×t1|/(rated terminal voltage×t2) equal to or smaller than 1.75.

Figure 46:
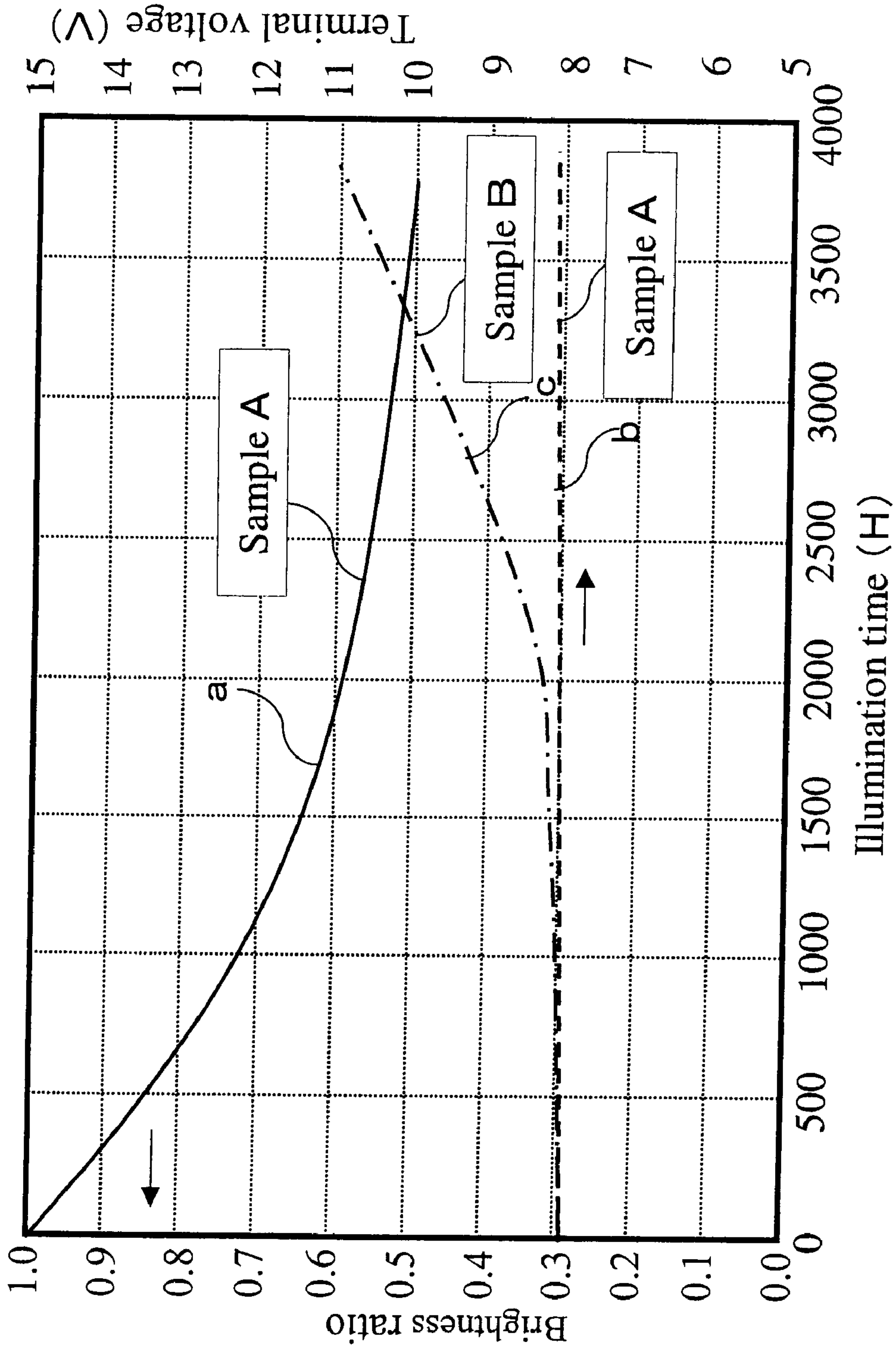
FIG. 46 is an explanatory diagram illustrating a drive method of a display apparatus according to the present invention.

However, for bias driving, the reverse bias Vm and rated current should be applied alternately. To equalize average brightness of samples A and B over a unit time as shown in FIG. 46 by the application of the reverse bias voltage Vm, it is necessary to pass a larger current instantaneously than when no reverse bias voltage is applied. Consequently, the application of the reverse bias voltage Vm (sample A in FIG. 46) also increases the terminal voltage of the EL element 15.

However, in FIG. 45, even with the drive method which involves applying the reverse bias voltage, the rated terminal voltage V0 should satisfy the average brightness (i.e., illuminate the EL element 15). (According to examples cited herein, such a terminal voltage is obtained when a current with a current density of 200 A per square meter is applied. However, since the duty ratio is 1/2 the average brightness over one cycle is equal to the brightness at a current density of 200 A per square meter.)

The above description assumes white raster display (maximum voltage is applied to all the EL elements 15 in the screen). However, video display on an EL display apparatus is provided as gradation display of natural images. Thus, it is not that a white peak current (a current which flows during maximum white display, or a current with an average current density of 100 A per square meter according to the examples described herein) always flows through the EL elements 15.

Generally, in the case of video display, the current applied to (passed through) each EL element 15 is approximately 0.2 of a white peak current (a current which flows at a rated terminal voltage, or a current with a current density of 100 A per square meter according to examples cited herein).

Therefore, for video display in the example in FIG. 45, the value of the horizontal axis should be multiplied by 0.2. Thus, the reverse bias voltage Vm and the application duration rate t1 (or t2 or the ratio between t1 and t2) should be determined in such a way as to make |reverse bias voltage×t1↑/(rated terminal voltage×t2) equal to 0.2 or larger. Preferably, the reverse bias voltage Vm and the application duration rate t1 should be determined in such a way as to make |reverse bias voltage×t1|/(rated terminal voltage×t2) equal to 0.35 (=1.75×0.2) or smaller.

That is, on the horizontal axis (|reverse bias voltage×t1|/(rated terminal voltage×t2)) in FIG. 45, the value of 1.0 should be changed to 0.2. Thus, if video is displayed on the display panel (probably this is normally the case and white raster is not likely to be displayed constantly), the reverse bias voltage Vm should be applied for a predetermined time t1 in such a way as to make |reverse bias voltage×t1|/(rated terminal voltage×t2) equal to 0.2 or larger. Even if the value of |reverse bias voltage×t1|/(rated terminal voltage×t2) is increased, the terminal voltage ratio does not increase greatly as shown in FIG. 45. Thus, an upper limit should be set to make |reverse bias voltage×t1|/(rated terminal voltage×t2) equal to 1.75 or smaller by allowing for white raster display. Basically, according to the present invention, a reverse bias voltage Vm (current) is applied during periods in which current does not flow through the EL element 15. However, this is not restrictive. For example, a reverse bias voltage Vm (current) may be applied forcibly when current flows through the EL element 15. In that case, however, the current will stop flowing through the EL element 15 as a result, bringing about non-illumination mode (black display mode). Also, although description herein is focused on application of a reverse bias voltage Vm in a current-programming pixel configuration, this is not restrictive.

Figure 47:
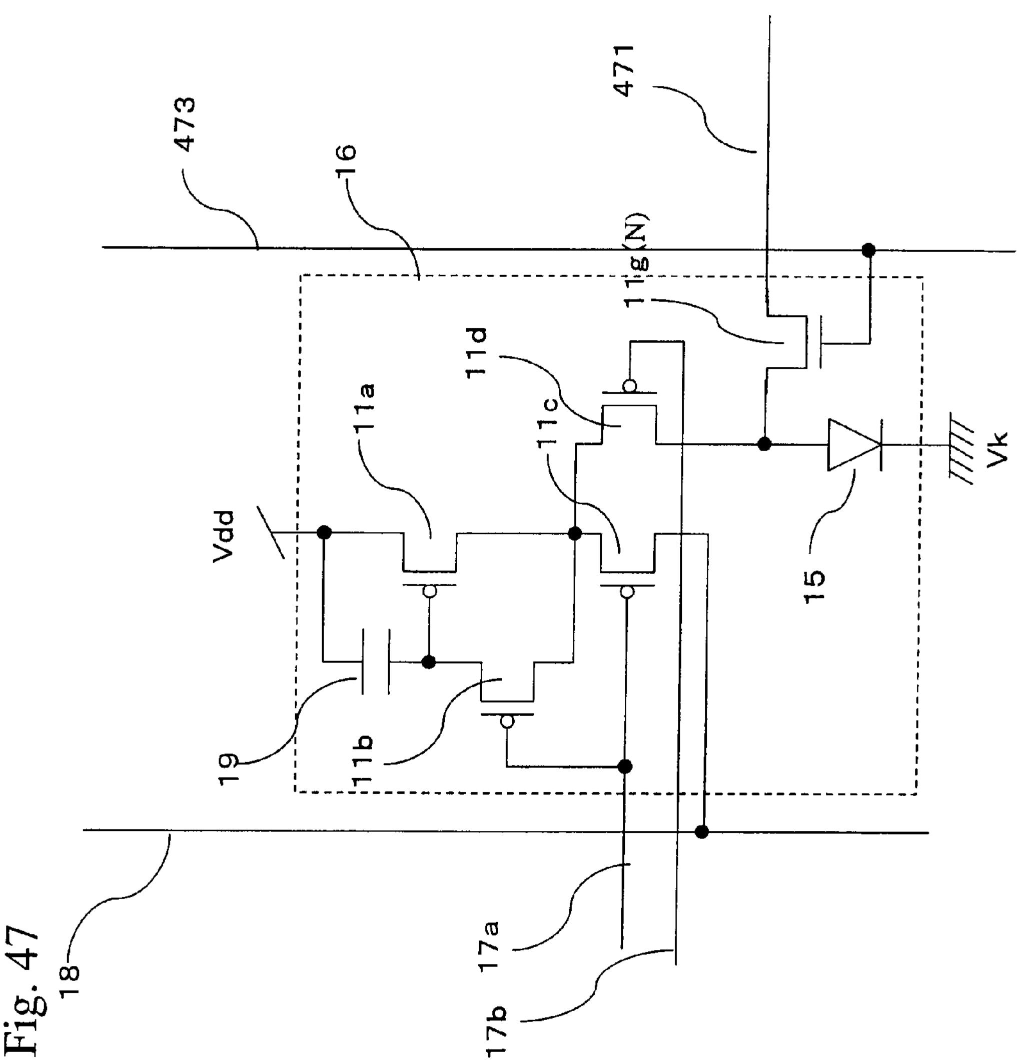
FIG. 47 is a block diagram of a pixel in a display panel according to the present invention.

In a pixel configuration for reverse bias driving, an N-channel transistor 11*g* is used as shown in FIG. 47. Of course, this may be a P-channel transistor.

In FIG. 47, as the voltage applied to a gate potential control line 473 is set higher than the voltage applied to a reverse bias line 471, the transistor 11*g* (N) turns on and the reverse bias voltage Vm is applied to the anode electrode of the EL element 15.

In the pixel configuration in FIG. 47 and the like, the gate potential control line 473 may be operated constantly at a fixed potential. For example, in FIG. 47, when voltage Vk is 0 (V), the potential of the gate potential control line 473 is set to 0 (V) or higher (preferably, 2 V or higher). Incidentally, this potential is denoted by Vsg. In this state, as the potential of the reverse bias line 471 is set to the reverse bias voltage Vm (0 V or lower, and preferably −5 V or lower than Vk), the transistor 11*g* (N) turns on and the reverse bias voltage Vm is applied to the anode electrode of the EL element 15. As the voltage of the reverse bias line 471 is set higher than the voltage applied to the gate potential control line 473 (i.e., the gate (G) terminal voltage of the transistor 11*g*), the transistor 11*g* stays off and the reverse bias voltage Vm is not applied to the anode electrode of the EL element 15. Of course, it goes without saying that in this state, the reverse bias line 471 may be put into a high-impedance state (such as an open state).

Figure 48:
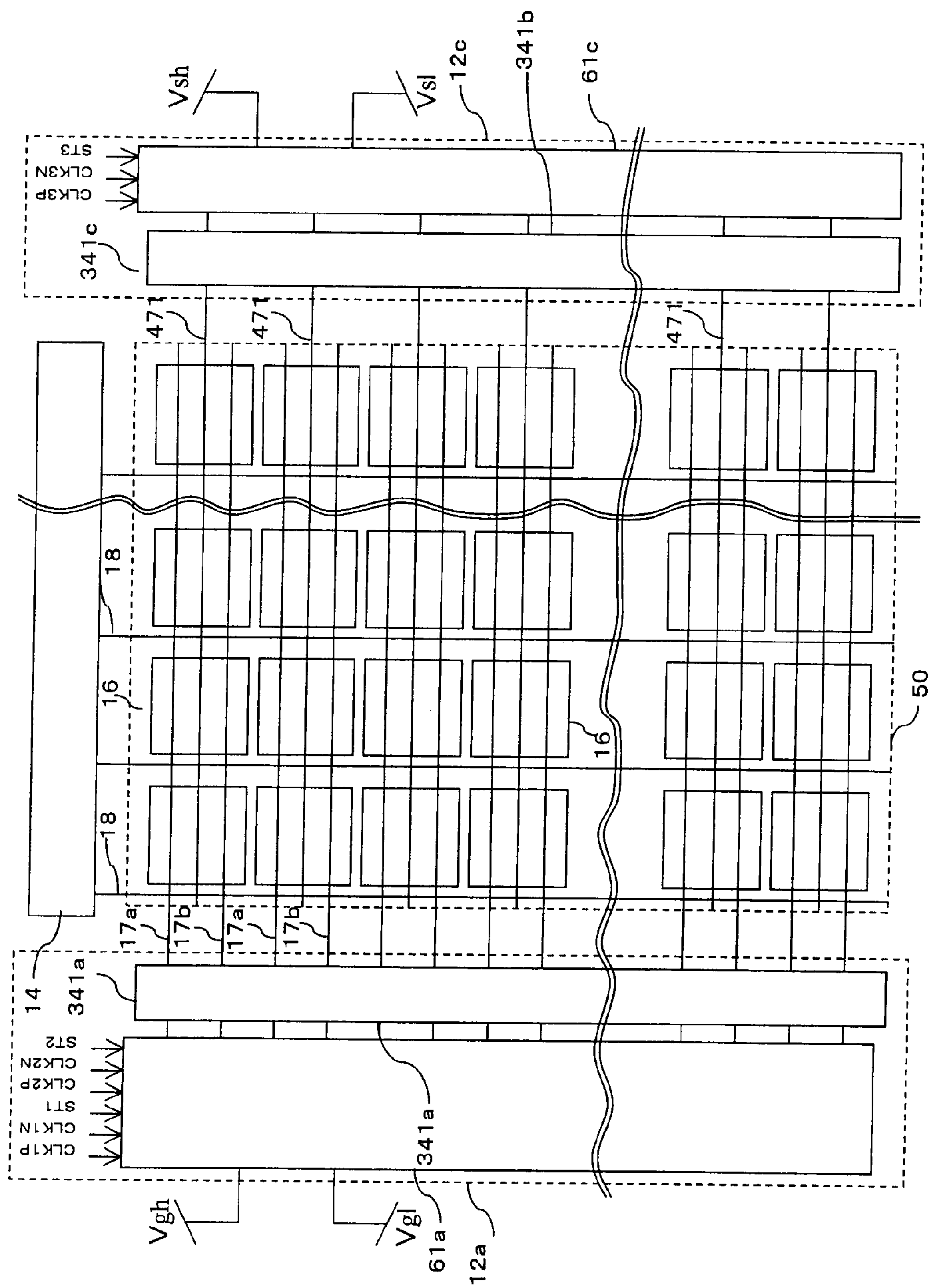
FIG. 48 is a block diagram of a display apparatus according to the present invention.

Also, a gate driver circuit 12*c* may be formed or placed separately to control the reverse bias line 471 as illustrated in FIG. 48. The gate driver circuit 12*c* operates by shifting in sequence as in the case of the gate driver circuit 12*a* and the location of application of the reverse bias voltage is shifted in sync with the shift operation.

The drive method described above makes it possible to apply the reverse bias voltage Vm to the EL element 15 by varying only the potential of the reverse bias line 471 with the gate (G) terminal of the transistor 11*g* set at a fixed potential. This makes it easy to control the application of the reverse bias voltage Vm. Also, the voltage applied between the source (S) terminal and gate (G) terminal of the transistor 11*g* can be decreased. This similarly applies when the transistor 11*g* is a p-channel transistor.

The reverse bias voltage Vm is applied when current is not passed through the EL element 15. This can be done by turning on the transistor 11*g* when the transistor 11*d* is off. That is, the reverse of on/off logic of the transistor 11*d* can be applied to the gate potential control line 473. For example, in FIG. 47, the gate (G) terminal of the transistors 11*d* and 11*g* can be connected to the gate signal line 17*b*. Since the transistor 11*d* is a P-channel transistor and the transistor 11*g* is an N-channel transistor, they turn on and off in the opposite manner.

Figure 49:
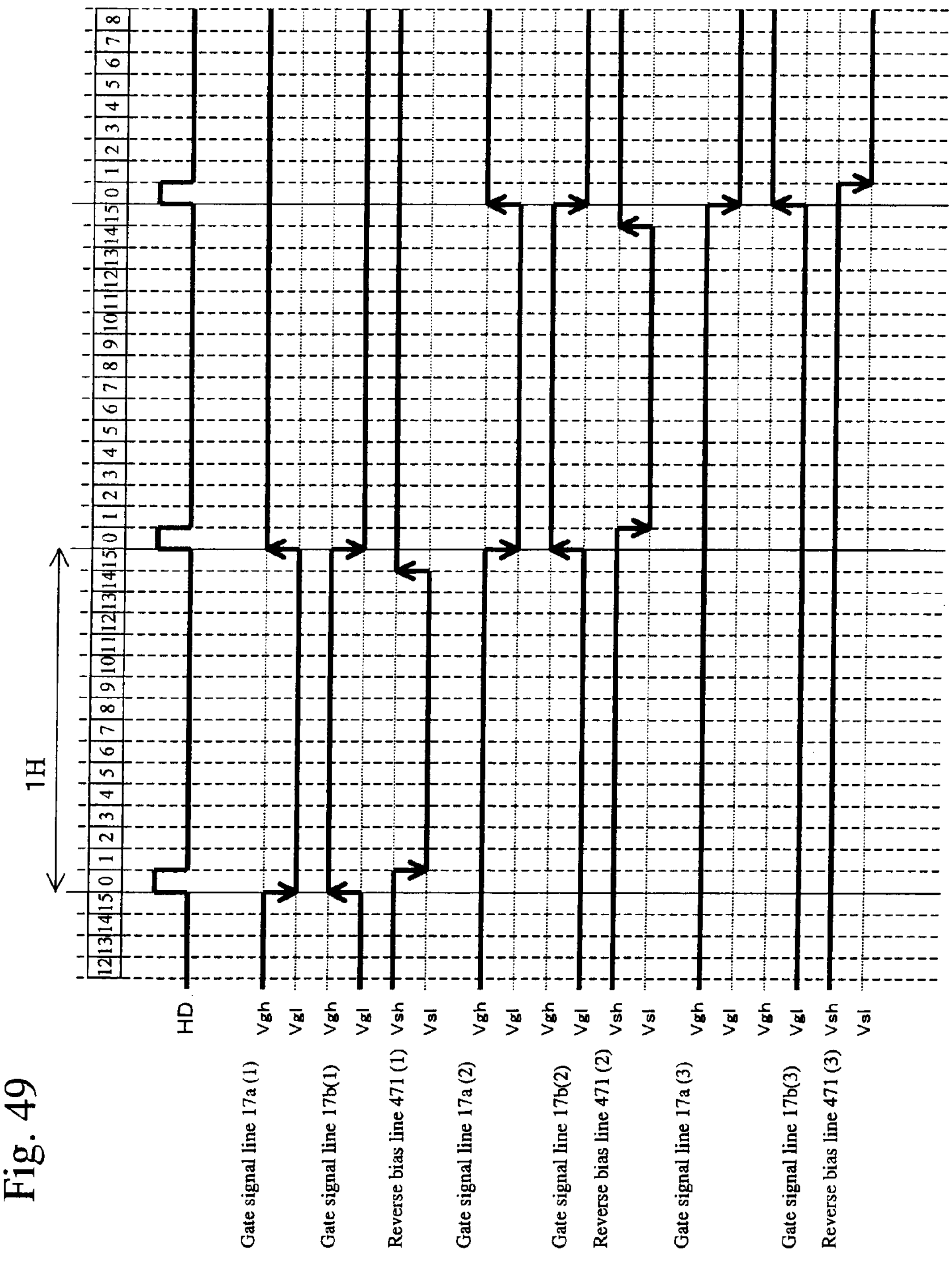
FIG. 49 is an explanatory diagram illustrating a drive method of a display apparatus according to the present invention.

FIG. 49 is a timing chart of reverse bias driving. In the chart, the subscripts such as (1) and (2) indicate pixel row numbers. It is assumed for ease of explanation that (1) indicates the first pixel row while (2) indicates the second pixel row, but this is not restrictive. It is also possible to consider that (1) indicates the N-th pixel row while (2) indicates the (N+1)-th pixel row. The same applies to other examples except for some special cases. Although examples in FIG. 49 and the like are described by citing the pixel configuration in FIG. 1 and the like, this is not restrictive. They are also applicable, for example, to the pixel configurations in FIGS. 41, 38, etc.

When a turn-on voltage (Vgl) is applied to the gate signal line 17*a* (1) in the first pixel row, a turn-off voltage (Vgh) is applied to the gate signal line 17*b* (1) in the first pixel row. Thus, the transistor 11*d* is off and current does not flow through the EL element 15.

A voltage Vsl (which turns on the transistor 11*g*) is applied to a reverse bias line 471(1). Thus, the transistor 11*d* is on and a reverse bias voltage is applied to the EL element 15. The reverse bias voltage is applied a predetermined period (1/200 of 1 H or longer; or 0.5 μsec) after the turn-off voltage (Vgh) is applied to the gate signal line 17*b*. The reverse bias voltage is turned off a predetermined period (1/200 of 1 H or longer; or 0.5 μsec) before the turn-on voltage (Vgl) is applied to the gate signal line 17*b*. This is done in order to prevent the transistors 11*d* and 11*g* from turning on simultaneously.

In the next 1 H (horizontal scanning period), a turn-off voltage (Vgh) is applied to the gate signal line 17*a*, and the second pixel row is selected. That is, a turn-on voltage is applied to a gate signal line 17*b*(2). On the other hand, a turn-on voltage (Vgl) is applied to the gate signal line 17*b*, the transistor 11*d* is turned on, and a current from the transistor 11*a* flows through the EL element 15, causing the EL element 15 to emit light. Also, a turn-off voltage (Vgh) is applied to the reverse bias line 471(1) stopping the reverse bias voltage from being applied to the EL elements 15 in the first pixel row (1). The voltage Vsl (reverse bias voltage) is applied to a reverse bias line 471(2) in the second pixel row.

As the above operations are repeated in sequence the images on the entire screen is rewritten. In the above example, a reverse bias voltage is applied while the pixels are being programmed. However, the circuit configuration in FIG. 48 is not limited to this. It is obvious that a reverse bias voltage may be applied to a plurality of pixel rows continuously. It is also obvious that the reverse bias driving may be used in combination with block driving (see FIG. 40), N-fold pulse driving, reset driving, or dummy pixel driving.

Reverse bias voltage can be applied not only during image display. The reverse bias voltage may be applied for a predetermined period after the EL display apparatus is turned off.

Although the above example has been described with reference to the pixel configuration in FIG. 1, it goes without saying that the use of reverse bias voltage is also applicable to the pixel configurations in FIGS. 38 and 41 and the like. For example, FIG. 50 shows a pixel configuration for current programming.

FIG. 50 shows a pixel configuration of a current mirror. The transistor 11*c* is a pixel selection element. As a turn-on voltage is applied to a gate signal line 17*a*1, the transistor 11*c* turns on. The transistor 11*d* is a switching element which is equipped with a reset function as well as a function to short-circuit the drain (D) terminal and gate (G) terminal of the transistor 11*a*. The transistor 11*d* turns on when a turn-on voltage is applied to a gate signal line 17*a*2.

The transistor 11*d* turns on 1 H (horizontal scanning period, i.e., one pixel row) or more before the given pixel is selected. Preferably, it turns on at least 3 Hs before. In that case, the transistor 11*d* turns on 3 Hs before selection of the pixel, short-circuiting the gate (G) terminal and drain (D) terminal of the transistor 11*a*. Consequently, the transistor 11*a* is turned off. Thus, the current stops flowing through the transistor 11*b* and the EL element 15 is turned off.

When the EL element 15 is not illuminated, the transistor 11*g* turns on, applying a reverse bias voltage to the EL element 15. Thus, the reverse bias voltage is applied while the transistor 11*d* is on. Consequently, the transistor 11*d* and transistor 11*g* turn on simultaneously in logical terms.

The voltage Vsg is applied continuously to the gate (G) terminal of the transistor 11*g*. The transistor 11*g* turns on when a reverse bias voltage sufficiently smaller than the voltage Vsg is applied to the reverse bias line 471.

Subsequently, when there comes a horizontal scanning period in which a video signal is applied to (written into) the pixel, a turn-on voltage is applied to a gate signal line 17*a*1, turning on the transistor 11*c*. Thus, a video signal voltage outputted from the source driver circuit 14 to the source signal line 18 is applied to the capacitor 19 (the transistor 11*d* remains on).

When the transistor 11*d* is turned on, the pixel is put into black display mode. The longer the conduction period of the transistor 11*d* in one field (one frame) period, the larger the proportion of the black display period. Thus, the brightness during a display period needs to be increased to obtain a desired average brightness over one field (one frame) in spite of the black display period. That is, the current to be passed through the EL element 15 during the display period needs to be increased. This operation is based on the N-fold pulse driving according to the present invention. Thus, an operation characteristic of the present invention is implemented by a combination of the N-fold pulse driving and driving which involves creating a black display by turning on the transistor 11*d*. Also, a configuration (method) characteristic of the present invention involves applying a reverse bias voltage to the EL element 15 when the EL element 15 is not illuminated.

Although in the above example, a reverse bias voltage is applied when pixels are not illuminated during image display, the configuration in which a reverse bias voltage is applied is not limited to this. There is no need to form a reverse-biasing transistor 11*g* in each pixel as long as a reverse bias voltage is applied when no image is displayed. The phrase "not illuminated" means a configuration in which a reverse bias voltage is applied after or before using the display panel.

For example, in the pixel configuration in FIG. 1, the pixel 16 is selected (the transistors 11*b* and 11*c* are turned on) and a low voltage V0 (e.g., GND voltage) which the source driver IC (circuit) 14 can output is outputted from the source driver IC and applied to the drain (D) terminal of the driver transistor 11*a*. If the transistor 11*d* is turned on as well in this state, the voltage V0 is applied to the anode terminal of the EL element. At the same time, if a voltage Vm lower than the voltage V0 by 5 to 15 V is applied to the cathode Vk of the EL element 15, a reverse bias voltage is applied to the EL element 15. Also, if a voltage lower than the voltage V0 by 0 to −5 V is applied as the Vdd voltage, the transistor 11*a* is turned off. Thus, by outputting a voltage from the source driver circuit 14 and thereby controlling the gate signal line 17, it is possible to apply a reverse bias voltage to the EL element 15.

The N-fold pulse driving allows a predetermined current (programmed current (at a voltage held in the capacitor 19)) to be passed through the EL element 15 again during one field (one frame) period even after a black display is created once. With the configuration in FIG. 50, however, once the transistor 11*d* turns on, since the capacitor 19 is discharged (or its charge is reduced), it is not possible to pass a predetermined current (programmed current) through the EL element 15. However, this configuration features ease of circuit operation.

Incidentally, although the above example uses a pixel configuration for current programming, the present invention is not limited to this and is applicable to other current-based pixel configurations such as those shown in FIGS. 38 and 50. It is also applicable to a pixel configuration for voltage programming such as the one shown in FIGS. 51, 54, and 62.

FIG. 51 shows pixel configurations for voltage programming. The transistor 11*b* acts as a selection switching element while the transistor 11*a* acts as a driver transistor which applies current to the EL element 15. This configuration contains a transistor (switching element) 11*g* which applies a reverse bias voltage to the anode of the EL element 15.

With the pixel configuration in FIG. 51, the current to be passed through the EL element 15 is applied to the source signal line 18. Then, it is applied to the gate (G) terminal of the transistor 11*a* as the transistor 11*b* is selected.

To describe the configuration in FIG. 51, basic operation will be described first with reference to FIG. 52. The pixel configuration in FIG. 51 is of a voltage offset canceling type and operates in four stages: initialization operation, reset operation, programming operation, and light-emitting operation.

The initialization operation is performed after a horizontal synchronization signal (HD) is provided. A turn-on voltage is applied to the gate signal line 17*b*, turning on the transistor 11*g*. Besides, a turn-on voltage is also applied to the gate signal line 17*a*, turning on the transistor 11*c*. At this time, a voltage Vdd is applied to the source signal line 18. Thus, the voltage Vdd is applied to a terminal a of the capacitor 19*b*. In this state, the driver transistor 11*a* turns on and a small current flows through the EL element 15. This current makes the voltage on the drain (D) terminal of the driver transistor 11*a* larger in absolute value than at least the voltage at an operating point of the driver transistor 11*a*.

Next, the reset operation is performed. A turn-off voltage is applied to the gate signal line 17*b*, turning off the transistor 11*e*. On the other hand, a turn-on voltage is applied to the gate signal line 17*c* for a period of T1, turning on the transistor 11*b*. The period T1 corresponds to a reset period. A turn-on voltage is applied to the gate signal line 17*a* continuously for a period of 1 H. Preferably, the period T1 is between 20% and 90% (both inclusive) of 1 H or between 20 μsec and 160 μsec (both inclusive). Preferably, a capacitance ratio Ca/Cb between a capacitor 19*b* (Cb) and capacitor 19*a* (Ca) is between ⅙ and ²⁄₁ (both inclusive).

During a reset period, the transistor 11*b* turns on, short-circuiting the gate (G) terminal and drain (D) terminal of the driver transistor 11*a*. Thus, the voltages at the gate (G) terminal and drain (D) terminal of the transistor 11*a* become equal, putting the transistor 11*a* in an offset mode (reset mode: a state in which no current flows). In the reset mode, the voltage at the gate (G) terminal of the transistor 11*a* approaches a starting voltage at which a current starts to flow. A gate voltage which maintains the reset mode is held at a terminal b of the capacitor 19*b*. Thus, the capacitor 19 holds an offset voltage (reset voltage).

In a next programming mode, a turn-off voltage is applied to the gate signal line 17*c*, turning off the transistor 11*b*. On the other hand, DATA voltage is applied to the source signal line 18 for a period of Td. Thus, the sum of the DATA voltage and offset voltage (reset voltage) is applied to the gate (G) terminal of the driver transistor 11*a*. This allows the driver transistor 11*a* to pass a programmed current.

After the programming period, a turn-off voltage is applied to the gate signal line 17*a*, turning off the transistor 11*c* and cutting off the driver transistor 11*a* from the source signal line 18. Besides, a turn-off voltage is also applied to the gate signal line 17*c*, turning off the transistor 11*b*, which remains off for a period of 1 F. On the other hand, a turn-on voltage and turn-off voltage are applied to the gate signal line 17*b* periodically, as required. Thus, if combined with N-fold pulse driving in FIGS. 13, 15, etc. or with interlaced driving, this method can achieve even better image display. This method can also be combined with reverse bias driving. Thus, the drive system according to the present invention is not limited to current-driven pixel configurations such as the one shown in FIG. 1, but it is also applicable to voltage-programming pixel configurations.

Figure 52:
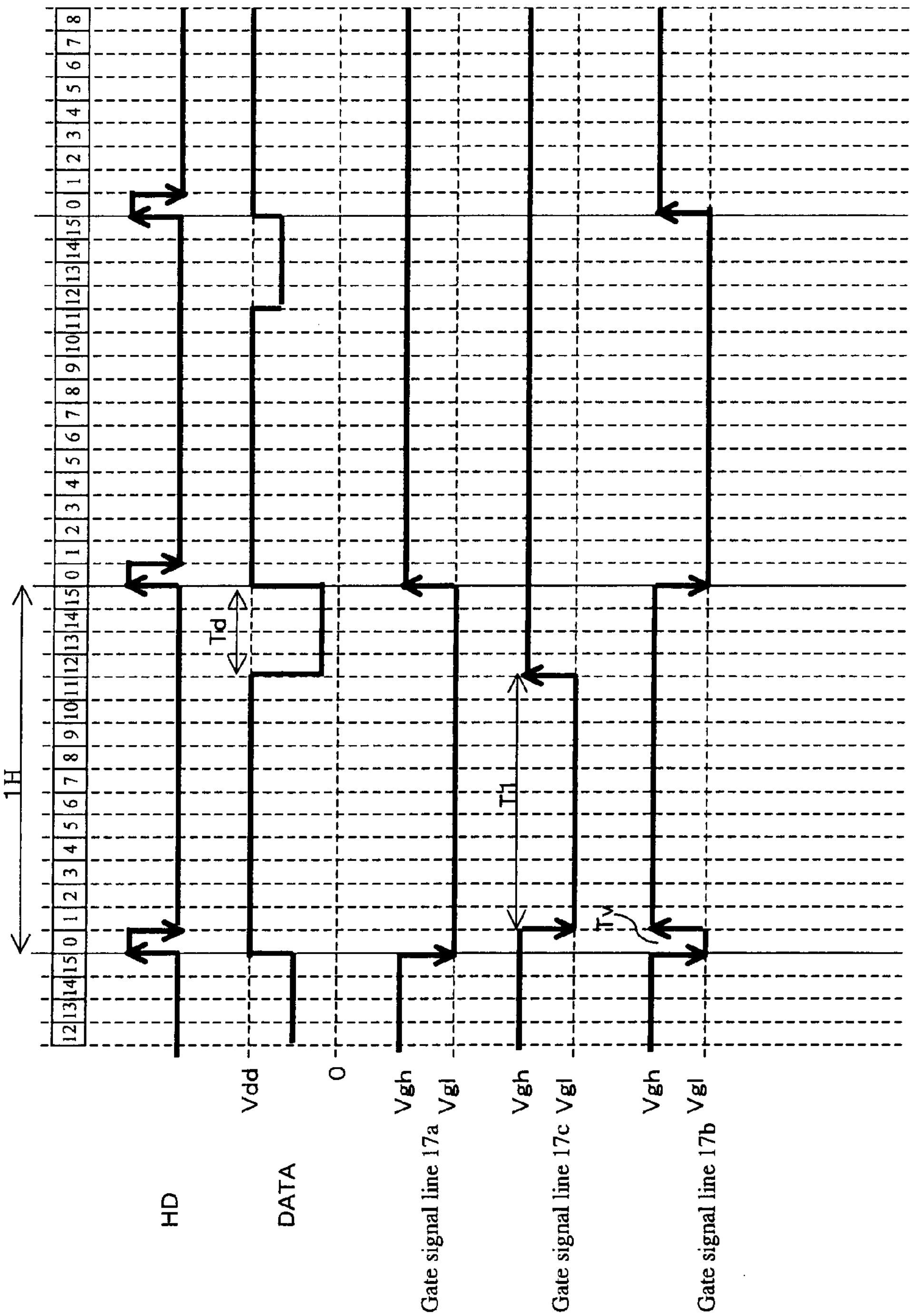
FIG. 52 is an explanatory diagram illustrating a drive method of a display apparatus according to the present invention.

With the drive system in FIG. 52, in reset mode, the capacitor 19 holds a starting current voltage (offset voltage, reset voltage) of the transistor 11*a*. Thus, the darkest black display is created when the reset voltage is being applied to the gate (G) terminal of the driver transistor 11*a*. However, coupling between the source signal line 18 and pixel 16, penetration voltage to the capacitor 19, or punch-through of a transistor causes excessive brightness (reduced contrast) resulting in a whitish screen. Therefore, the drive method described with reference to FIG. 53 cannot achieve high display contrast.

To apply the reverse bias voltage Vm to the EL element 15, it is necessary to turn off the transistor 11*a*. To turn off the transistor 11*a*, the drain terminal and gate (G) terminal of the transistor 11*a* can be short-circuited. This configuration will be described with reference to FIG. 53 later.

Alternatively, it is possible to apply the Vdd voltage or a voltage which turns off the transistor 11*a* to the source signal line 18, turn on the transistor 11*b*, and apply the voltage to the gate (G) terminal of the transistor 11*a*. This voltage turns off the transistor 11*a* (or makes it pass almost no current (almost off: the transistor 11*a* is in a high-impedance state)). Subsequently, the transistor 11*g* is turned on and a reverse bias voltage is applied to the EL element 15. The reverse bias voltage Vm may be applied to all the pixels simultaneously. Specifically, a voltage which almost turns off the transistors 11*a* is applied to the source signal lines 18 and the transistors 11*b* in all the pixel rows are turned on. Consequently, the transistors 11*a* are turned off. Then, the transistors 11*g* are turned on and a reverse bias voltage is applied to the EL elements 15. Then, video signals are applied to one after another of the pixel rows to display images on the display apparatus.

Figure 53:
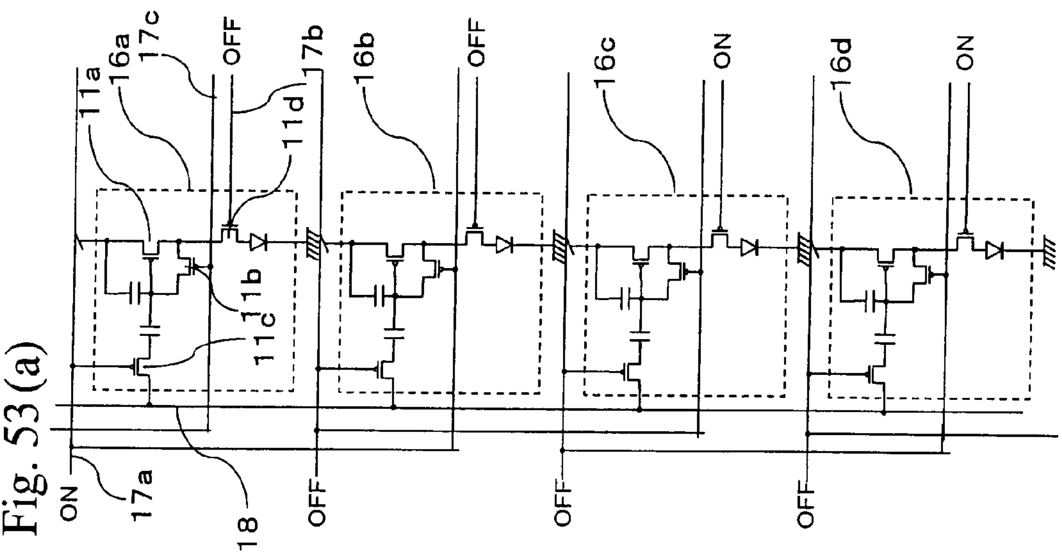
FIG. 53 is an explanatory diagram illustrating a drive method of a display apparatus according to the present invention.
Figure 53:
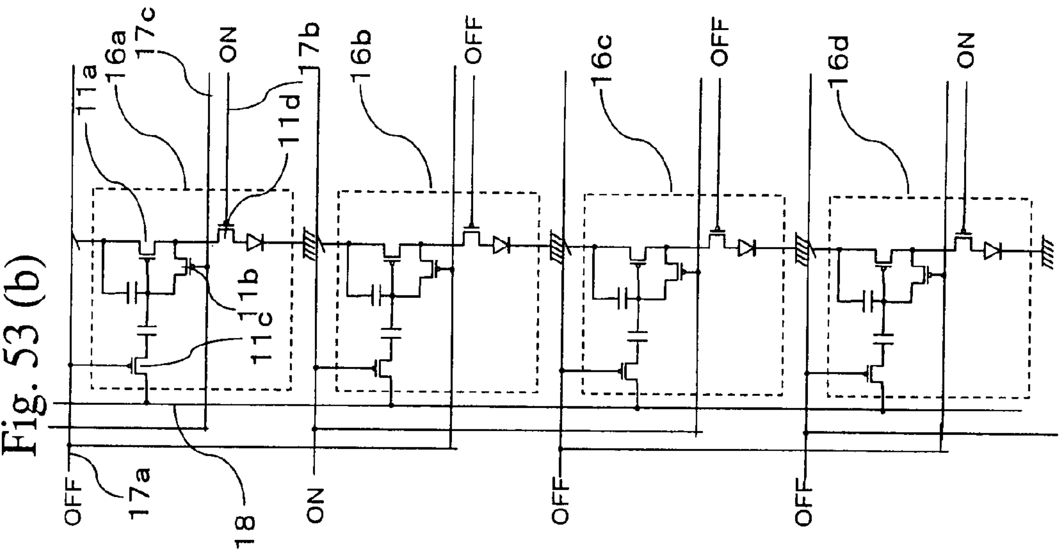

Next, reset driving in the pixel configuration in FIG. 51 will be described. FIG. 53 shows an example. As shown in FIG. 53, the gate signal line 17*a* connected to the gate (G) terminal of the transistor 11*c* in a pixel 16*a* is also connected to the gate (G) terminal of the reset transistor 11*b* in a pixel 16*b* in the next stage. Similarly, the gate signal line 17*a* connected to the gate (G) terminal of the transistor 11*c* in the pixel 16*b* is also connected to the gate (G) terminal of the reset transistor 11*b* in a pixel 16*c* in the next stage.

Thus, when a turn-on voltage is applied to the gate signal line 17*a* connected to the gate (G) terminal of the transistor 11*c* in the pixel 16*a*, the pixel 16*a* enters voltage programming mode, the reset transistor 11*b* of the pixel 16*b* in the next stage turns on, and the driver transistor 11*a* of the pixel 16*b* is reset. Similarly, when a turn-on voltage is applied to the gate signal line 17*a* connected to the gate (G) terminal of the transistor 11*c* in the pixel 16*b*, the pixel 16*b* enters current programming mode, the reset transistor 11*b* of the pixel 16*c* in the next stage turns on, and the driver transistor 11*a* of the pixel 16*c* is reset. Thus, reset driving by way of a preceding-stage gate control system can be implemented easily. Also, the number of leads from a gate signal line per pixel can be reduced.

More detailed description will be provided. Suppose voltage is applied to gate signal lines 17 as shown in FIG. 53(*a*). Specifically, a turn-on voltage is applied to the gate signal line 17*a* of the pixel 16*a* and a turn-off voltage is applied to the gate signal lines 17*a* of other pixels 16. Also, a turn-off voltage is applied to the gate signal lines 17*b* of the pixels 16*a* and 16*b* while a turn-on voltage is applied to the gate signal lines 17*b* of the pixels 16*c* and 16*d*.

In this state, the pixel 16*a* is in voltage programming mode and is not illuminated, the pixel 16*b* is in reset mode and not illuminated, the pixel 16*c* is pending current programming and is illuminated, and the pixel 16*d* is pending current programming and is illuminated.

After 1 H, data in a shift register 61 circuit of the controlling gate driver circuit 12 is shifted one bit to enter a state shown in FIG. 53(*b*). In FIG. 53(*b*), the pixel 16*a* is pending current programming and is illuminated, the pixel 16*b* is current programming mode and is not illuminated, the pixel 16*c* is in reset mode and is not illuminated, and the pixel 16*d* is pending programming and is illuminated.

Thus, it can be seen that the voltage applied to the gate signal line 17*a* of each pixel resets the driver transistor 11*a* of the pixel in the next stage to perform voltage programming in the next horizontal scanning period sequentially.

The pixel configuration for voltage programming in FIG. 43 can also implement preceding-stage gate control. FIG. 54 shows an example in which a connection method of a preceding-stage gate control system is used for the pixel configuration in FIG. 43.

In FIG. 54, the gate signal line 17*a* connected to the gate (G) terminal of the transistor 11*b* in the pixel 16*a* is connected to the gate (G) terminal of the reset transistor 11*e* in the pixel 16*b* in the next stage. Similarly, the gate signal line 17*a* connected to the gate (G) terminal of the transistor 11*b* in the pixel 16*b* is connected to the gate (G) terminal of the reset transistor 11*e* in the pixel 16*c* in the next stage.

Thus, when a turn-on voltage is applied to the gate signal line 17*a* connected to the gate (G) terminal of the transistor 11*b* in the pixel 16*a*, the pixel 16*a* enters voltage programming mode, the reset transistor 11*e* of the pixel 16*b* in the next stage turns on, and the driver transistor 11*a* of the pixel 16*b* is reset. Similarly, when a turn-on voltage is applied to the gate signal line 17*a* connected to the gate (G) terminal of the transistor 11*b* in the pixel 16*b*, the pixel 16*b* enters current programming mode, the reset transistor 11*e* of the pixel 16*c* in the next stage turns on, and the driver transistor 11*a* of the pixel 16*c* is reset. Thus, reset driving by way of a preceding-stage gate control system can be implemented easily.

Figure 55:
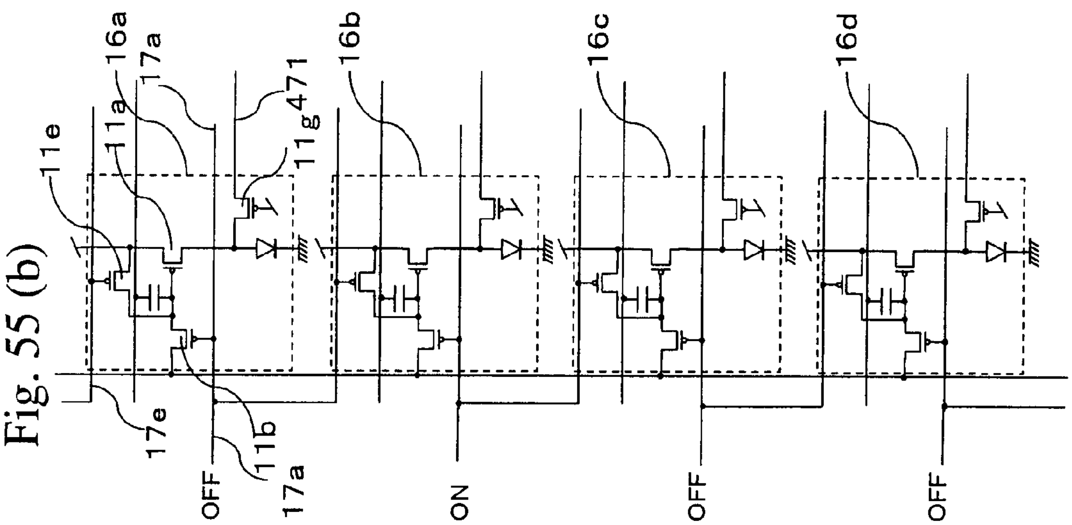
FIG. 55 is an explanatory diagram illustrating a drive method of a display apparatus according to the present invention.
Figure 55:
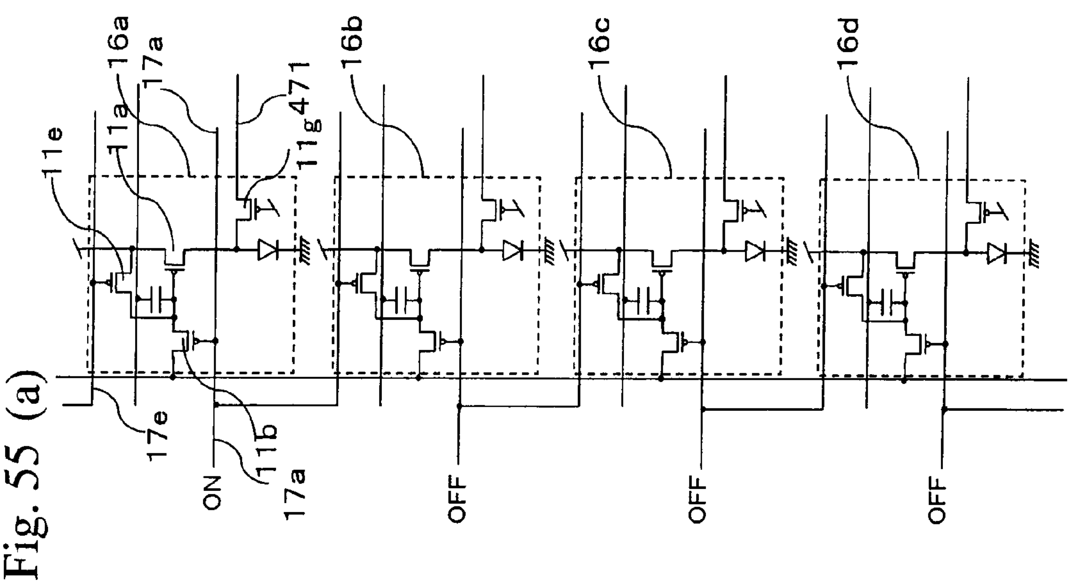

More detailed description will be provided. Suppose voltage is applied to gate signal lines 17 as shown in FIG. 55(*a*). Specifically, a turn-on voltage is applied to the gate signal line 17*a* of the pixel 16*a* and a turn-off voltage is applied to the gate signal lines 17*a* of other pixels 16. It is assumed that all the transistors 11*g* for reverse biasing are off.

In this state, the pixel 16*a* is in voltage programming mode, the pixel 16*b* is in reset mode, the pixel 16*c* is pending current programming, and the pixel 16*d* is pending current programming.

After 1 H, data in the shift register 61 circuit of the controlling gate driver circuit 12 is shifted one bit to enter a state shown in FIG. 55(*b*). In FIG. 55(*b*), the pixel 16*a* is pending current programming, the pixel 16$b$ is in current programming mode, the pixel 16$c$ is in reset mode, and the pixel 16$d$ is pending programming.

Thus, it can be seen that the voltage applied to the previous stage for the gate signal line 17$a$ of each pixel resets the driver transistor 11$a$ of the pixel in the next stage to perform voltage programming in the next horizontal scanning period sequentially.

For completely black display in current driving, the driver transistors 11 of the pixels are programmed with 0 current. That is, the source driver circuit 14 delivers no current. When no current is delivered, parasitic capacitance caused in the source signal line 18 cannot be discharged and the potential of the source signal line 18 cannot be varied. Consequently, the gate potential of the driver transistors also remains unchanged and the potential in the previous frame (field) (1 F) remains accumulated in the capacitor 19. For example, if the previous frame contains white display, the white display is retained even if the current frame contains completely black display.

To solve this problem, according to the present invention, a black level voltage is written into the source signal line 18 at the beginning of one horizontal scanning period (1 H) before the current to be programmed is output to the source signal line 18. For example, if image data consists of the 0th to 7th gradations close to black level, a black level voltage is written only during a certain period at the beginning of one horizontal scanning period to reduce the load of current programming and make up for insufficient writing. Incidentally, completely black display corresponds to the 0th gradation and white display corresponds to the 63rd gradation (in the case of 64-gradation display).

Preferably, gradations for which precharging is performed should be limited to a black display region. Specifically, precharging is performed by selecting gradations in a black region (low brightness region, in which only a small (weak) write current flows in the case of current driving) from write image data (selective precharging). If precharging is performed over the entire range of gradations, brightness lowers (a target brightness is not reached) in a white display region. Also, vertical streaks may be displayed in some cases.

Preferably, selective precharging is performed for ⅛ of all the gradations beginning with the 0th gradation (e.g., in the case of 64 gradations, image data is written after precharging for the 0th to 7th gradations). More preferably, selective precharging is performed for 1/16 of all the gradations beginning with the 0th gradation (e.g., in the case of 64 gradations, image data is written after precharging for the 0th to 3rd gradations).

A method which performs precharging by detecting only the 0th gradation is also effective in enhancing contrast, especially in black display. It achieves an extremely good black display. The problem is that the screen appears whitish in hue when the entire screen displays the 1st and second gradations. Thus, selective precharging is performed in a predetermined range: ⅛ of all the gradations beginning with the 0th gradation.

Incidentally, it is also useful to vary the precharge voltage and gradation range among R, G, and B because emission start voltage and emission brightness of EL display elements 15 vary among R, G, and B. For example, selective precharging is performed for ⅛ of all the gradations beginning with the 0th gradation (e.g., in the case of 64 gradations, image data is written after precharging for the 0th to 7th gradations) in the case of R. In the case of other colors (G and B), selective precharging is performed for 1/16 of all the gradations beginning with the 0th gradation (e.g., in the case of 64 gradations, image data is written after precharging for the 0th to 3rd gradations). Regarding the precharge voltage, if 7 V is written into the source signal lines 18 for R, 7.5 V is written into the source signal lines 18 for the other colors (G and B). Optimum precharge voltage often varies with the production lot of the EL display panel. Thus, preferably precharge voltage is adjustable with an external regulator or the like. Such a regulator circuit can be also implemented easily using an electronic regulator circuit.

A charge-holding capacitor 19 has been formed in the pixel 16. If 10% or more of the electric charges held in the capacitor 19 is discharged during one field (one frame) period, black display mode cannot be maintained. Regarding image display condition, pixels which contain transistors 11 with poor turn-off characteristics produce bright spots (referred to as off-leakage bright spots). Thus, it is necessary to use transistors with good turn-off characteristics, especially in the case of the transistor 11$b$ in FIG. 1.

To solve this problem, the present invention turns off active transistors 11$d$ for a short period of time by operating the gate signal lines 17$b$. This drive method can reduce off-leakage bright spots even if the voltage-holding transistors 11$b$ have poor turn-off characteristics. Also, by varying the OFF period of the voltage-holding transistors 11$b$, it is possible to control the extent to which off-leakage bright spots are reduced.

Figure 115:
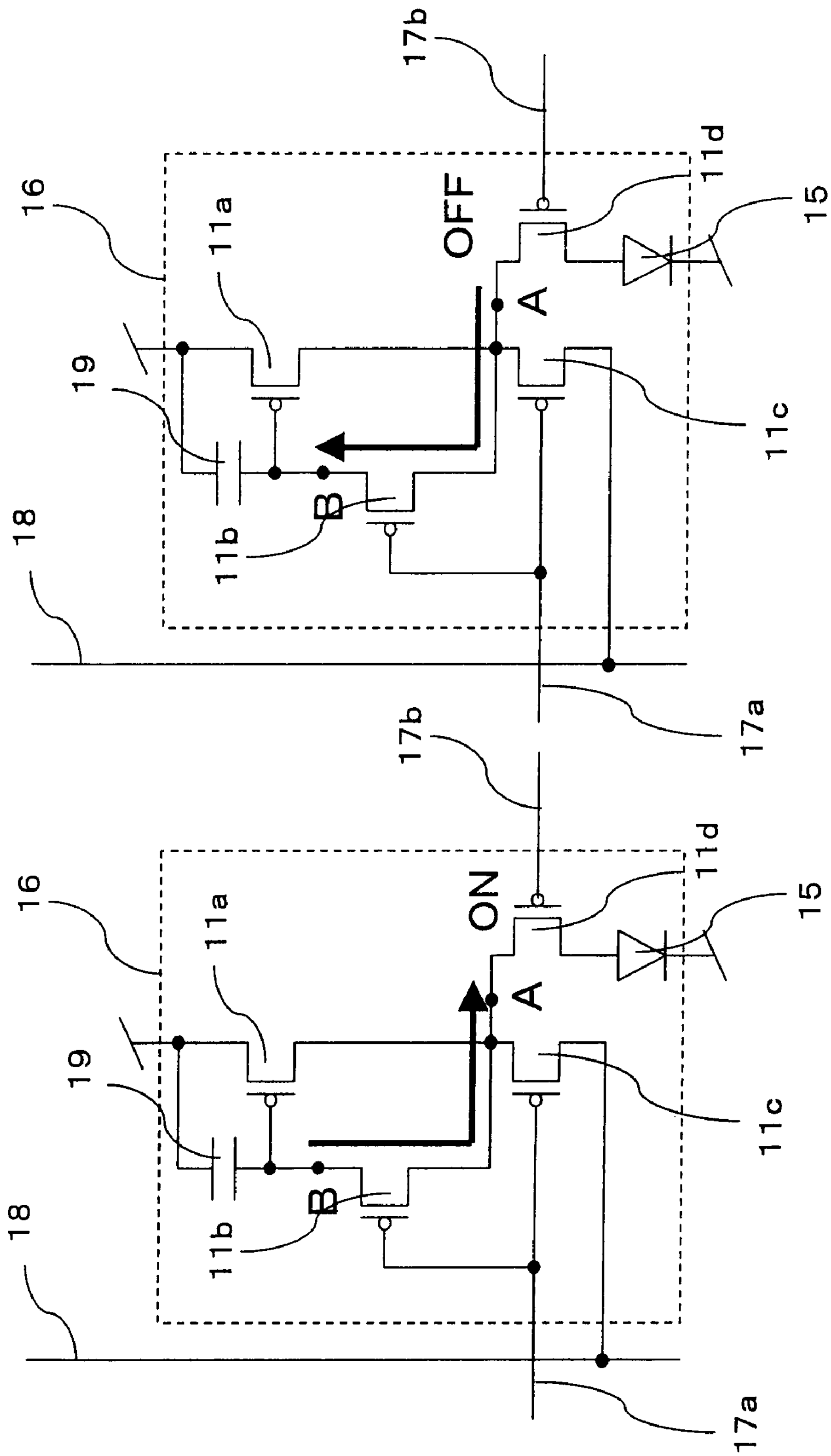
FIG. 115 is an explanatory diagram illustrating a drive method of a display panel according to the present invention.

As illustrated in FIG. 115($a$), off-leakage bright spots are believed to occur as the electric charges held in the capacitor 19 leak via the transistor 11$b$. This is because basically the potential at point A is low when the transistor 11$d$ is on. Thus, if the transistor 11$d$ remains on for a long period of time, the capacitor 19 is discharged rapidly, causing off-leakage bright spots. When a display area 53 and non-display area 52 repeat at short intervals as shown in FIG. 16, if the non-display area 52 has a larger proportion as shown in FIG. 13, no off-leakage bright spot occurs. However, if the display area 53 continues for a long time as shown in FIG. 5, off-leakage bright spots occur.

Also, the drive method for a display panel according to the present invention displays images by switching among the conditions in FIGS. 5, 13, and 16 according to contents of image data. Thus, the display condition in FIG. 5 can continue depending on contents of image display. If the condition in FIG. 5 occurs, the drive method described below is effective. That is, there is no need to always carry out the method described in the example below. It can be carried out when the transistor 11$d$ remains on for a certain period.

When the transistor 11$d$ turns off, the potential at point A rises at least once. Consequently, as illustrated in FIG. 115($b$), current flows from point A to point B, recharging the capacitor 19. Thus, no off-leakage bright spot occurs. That is, as the transistor 11$d$ is turned on and off, the capacitor 19 is charged.

Incidentally, the above description is derived from theoretical considerations of a phenomenon. Thus, there might be mistaken understanding. However, it is true that the use of the drive method according to the present invention in an actual panel is effective in reducing off-leakage bright spots.

In the pixel configuration in FIG. 1 (FIG. 115), the driver transistor 11$a$ and switching transistor 11$d$ are p-channel transistors. Thus, when the transistor 11$d$ is on, the transistor 11$b$ leaks. On the other hand, when the transistor 11$d$ turns off, the potential at point A rises, reducing leakage of electric charges or recharging the capacitor. Thus, if the transistor 11$d$ is an n-channel transistor, electric charges leak from the capacitor 19 when the transistor 11$d$ is off and the capacitor 19 is recharged when the transistor 11$d$ is on. Incidentally, if the driver transistor is an n-channel transistor, off-leakage bright spots do not occur, but brightness increases further in white display. Needless to say, the present invention can deal with this situation as well.

Now, a concept of "duty" will be introduced for ease of explanation. The term "duty" according to the present invention differs from a term "duty" used in relation to STN liquid crystal display panels. A duty ratio of 1/1 according to the present invention means a drive mode in which current flows through the EL elements 15 for a period of one field (one frame). That is, the duty ratio of 1/1 means a state in which the non-display area 52 takes up 0% of the display screen 50. Actually, however, since the pixel rows being programmed with current (voltage) are in non-display mode, the duty ratio of 1/1 in a strict sense cannot occur in the pixel configuration in FIG. 1. However, since there are 200 or more pixel rows in a display panel, a non-display area of one pixel row or so is within tolerances. On the other hand a duty ratio of 0/1 means a state in which no current flows through the EL elements 15 for a period of one field (one frame). That is, the duty ratio of 0/1 means a state in which the non-display area 52 takes up 100% of the display screen 50. In the following description, it is assumed that there are 220 pixel rows in the EL display panel.

For example, a duty ratio of 220/220 is reduced to a duty ratio of 1/1. Also, a duty ratio of 55/220 is reduced to a duty ratio of 1/4. When the duty ratio is 1/4, 3/4 of the screen is taken up by a non-display area 52. Thus, in N-fold pulse driving, a target (predetermined) display brightness can be obtained when N=4. A duty ratio of 110/220 is reduced to a duty ratio of 1/2. When the duty ratio is 1/2, 50% of the screen is taken up by a non-display area 52. Thus, in N-fold pulse driving, a predetermined display brightness can be obtained when N=2.

In the description of the display panel according to the present invention, it is assumed that the pixel rows to be programmed with current are selected by the gate signal line 17*a* (in the case of FIG. 1). The output from the gate driver circuit 12*a* which controls the gate signal line 17*a* is referred to as a WR-side selection signal line. Also, it is assumed that EL elements 15 are selected by the gate signal line 17*b* (in the case of FIG. 1). The output from the gate driver circuit 12*b* which controls the gate signal line 17*b* is referred to as a gate signal line 17B (EL-side selection signal line).

The gate driver circuits 12 are fed a start pulse, which is shifted as holding data in sequence within a shift register. Based on the holding data in the shift register of the gate driver circuit 12*a*, it is determined whether to output a turn-on voltage (Vgl) or turn-off voltage (Vgh) to the WR-side selection signal line. An OEV1 circuit (not shown) which turns off output forcibly is formed or placed in an output stage of the gate driver circuit 12*a*. When the OEV1 circuit is low, a WR-side selection signal which is an output of the gate driver circuit 12*a* is outputted as it is to the gate signal line 17*a*. The above relationship is illustrated logically in FIG. 116(*a*). Incidentally, the turn-on voltage is set at logic level L (0) and the turn-off voltage is set at logic level H (1).

That is, when the gate driver circuit 12*a* outputs a turn-off voltage, the turn-off voltage is applied to the gate signal line 17*a*. When the gate driver circuit 12*a* outputs a turn-on voltage (logic low), it is ORed with the output of the OEV1 circuit by the OR circuit and the result is outputted to the gate signal line 17*a*. That is, when the OEV1 circuit is high, the turn-off voltage (Vgh) is outputted to the gate driver signal line 17*a*.

Based on holding data in a shift register of the gate driver circuit 12*b*, it is determined whether to output a turn-on voltage (Vgl) or turn-off voltage (Vgh) to the gate signal line 17B (EL-side selection signal line). An OEV2 circuit (not shown) which turns off output forcibly is formed or placed in an output stage of the gate driver circuit 12*b*. When the OEV2 circuit is low, an output of the gate driver circuit 12*b* is outputted as it is to the gate signal line 17*b*. The above relationship is illustrated logically in FIG. 116(*a*). Incidentally, the turn-on voltage is set at logic level L (0) and the turn-off voltage is set at logic level H (1).

That is, when the gate driver circuit 12*b* outputs a turn-off voltage (an EL-side selection signal is a turn-off voltage), the turn-off voltage is applied to the gate signal line 17*b*. When the gate driver circuit 12*b* outputs a turn-on voltage (logic low), it is ORed with the output of the OEV2 circuit by the OR circuit and the result is outputted to the gate signal line 17*b*. That is, when an input signal is high, the OEV2 circuit outputs the turn-off voltage (Vgh) to the gate driver signal line 17*b*. Thus, even if the EL-side selection signal from the OEV2 circuit is a turn-on voltage, the turn-off voltage (Vgh) is outputted forcibly to the gate signal line 17*b*. Incidentally, if an input to the OEV2 circuit is low, the EL-side selection signal is outputted directly to the gate signal line 17*b*.

In the example described below, to deal with off-leakage bright spots, the states in FIG. 115 are created by operating the OEV2 circuit. Specifically, even if the gate signal line 17B (EL-side selection signal line) continues to output a turn-on voltage, logic high is inputted in the OEV2 circuit periodically to turn off the transistor 11*d*. By forcibly turning off the transistor 11*d* in this way, it is possible to solve the problem of off-leakage bright spots.

Figure 116:
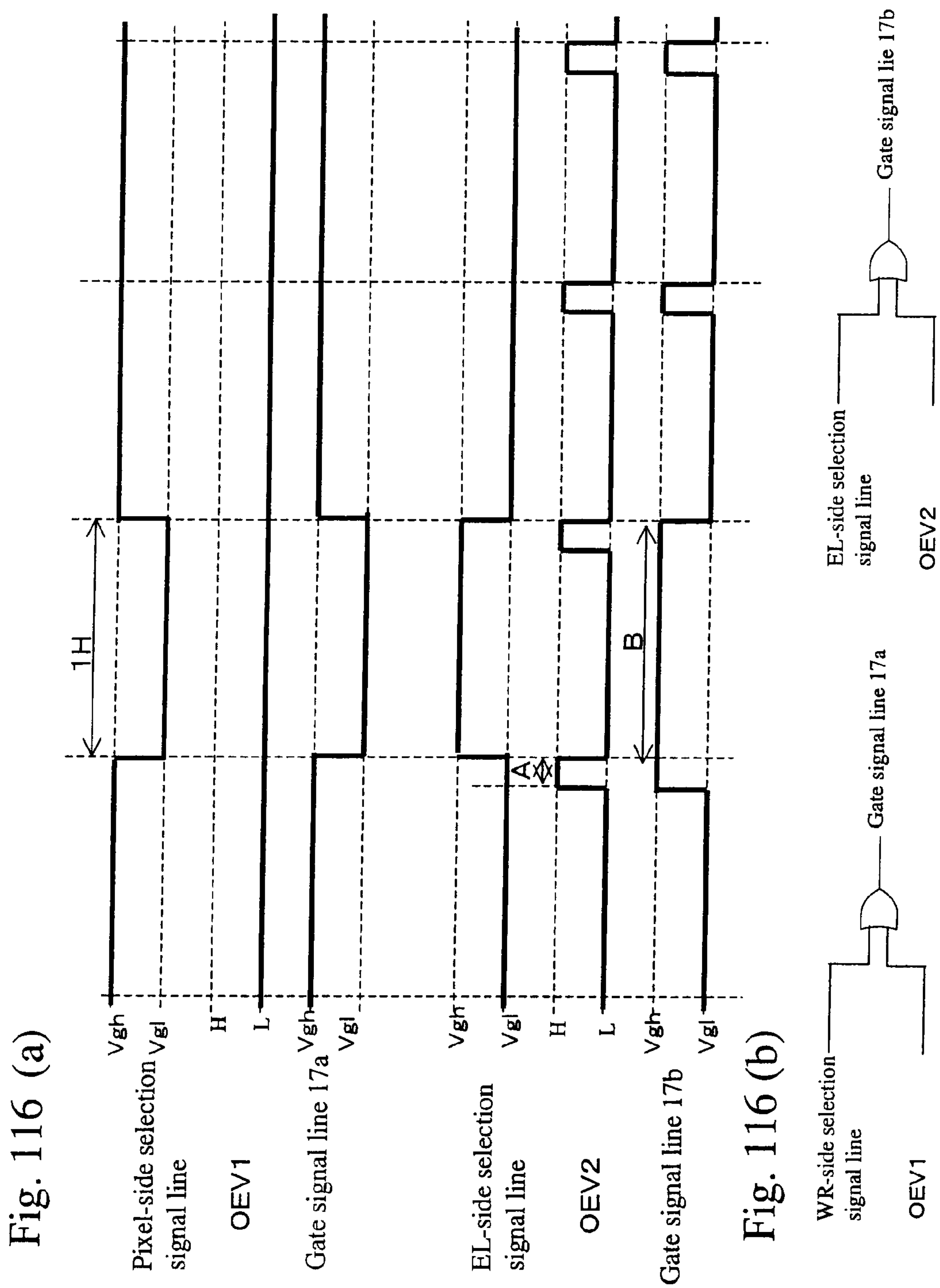
FIG. 116 is an explanatory diagram illustrating a drive method of a display panel according to the present invention.

FIG. 116 shows an example of a drive method according to the present invention. Since the OEV1 circuit is low, pixel rows are selected one by one and programmed with current (voltage) based on the output from the gate driver circuit 12*a*. Thus, the signal used to select the pixel rows is identical with a pixel-side selection signal. The gate driver circuit 12*b* (EL-side selection signal line) applies logic high to the OEV2 circuit every horizontal scanning period (1 H) by operating the OEV2 circuit as illustrated in FIG. 116, and thereby applies a turn-off voltage forcibly to the gate signal line 17B (EL-side selection signal line). Thus, even if the gate driver circuit 12*b* always outputs a turn-on voltage (Vgl), a turn-off voltage is outputted to the gate signal line 17*b* for a certain period every 1 H due to a signal from the OEV2 circuit. The application of the turn-off voltage by the OEV2 circuit reduces discharge from the capacitor 19 (see FIG. 115), and thereby reduces off-leakage bright spots.

FIG. 116 illustrates changes in output voltage to the gate signal line 17*a* caused by OEV1 and changes in output voltage to the gate signal line 17*b* caused by OEV2. Regarding the gate signal line 17*a*, since OEV1 is always low, the waveform of the WR-side selection signal line becomes the waveform of the gate signal line 17*a* directly. Regarding the gate signal line 17*b*, since OEV2 alternates between high and low, the output of the gate signal line 17B (EL-side selection signal line) is ORed with the output of the OEV2 circuit to produce a waveform to be applied to the gate signal line 17*b*. Thus, referring to FIG. 116, a turn-off voltage is applied to the gate signal line 17*b* for a period equal to the sum (A+B) of an interval (indicated by A) during which the higher voltage is applied to the OEV2 circuit and an interval (indicated by B) during which a turn-off voltage is applied to the EL selection signal line. Also, a turn-off voltage is applied to the gate signal line 17*b* during a period in which the higher voltage is applied to the OEV2 circuit.

By operating the OEV2 circuit, it is possible to control the illumination period of the EL elements 15. Thus, the brightness of the screen 50 can be varied through the control of the OEV2 circuit. That is, the OEV2 circuit has the effect of reducing off-leakage bright spots and controlling the screen brightness.

Figure 117:
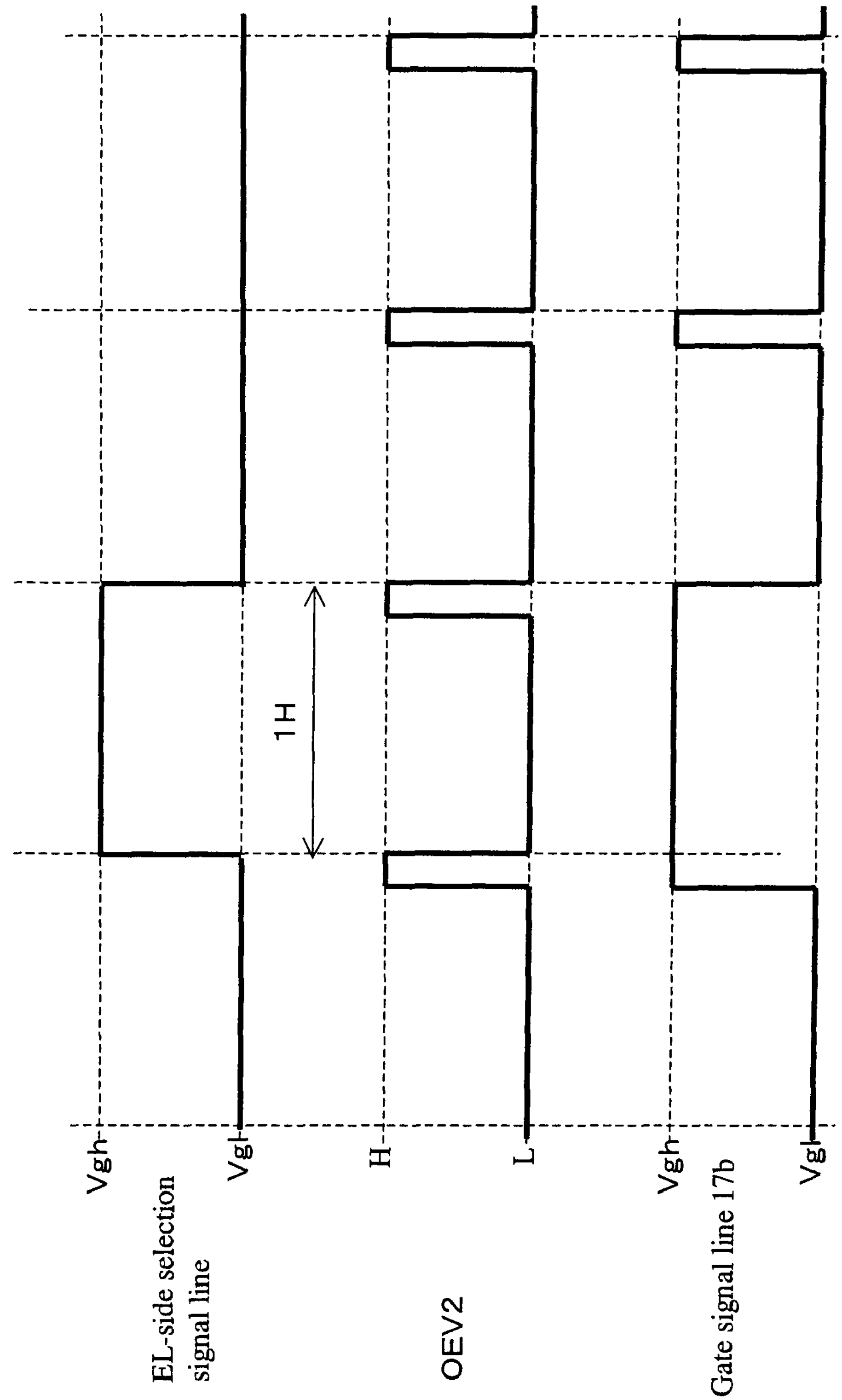
FIG. 117 is an explanatory diagram illustrating a drive method of a display panel according to the present invention.

In FIG. 117, a turn-on voltage is constantly applied to the gate signal line 17B (EL-side selection signal line) (this corresponds to a duty ratio of 1/1 in conventional drive methods). With the pixel configuration in FIG. 1, however, when a turn-on voltage is applied to the WR-side selection signal line, a turn-off voltage must be applied to the gate signal line 17B (EL-side selection signal line). Consequently, when a turn-on voltage is applied to the gate signal line 17*a*, a turn-off voltage is applied to the gate signal line 17*b*.

Driving with a duty ratio of 1/1 causes off-leakage bright spots. This is because the transistor 11*b* leaks due to a high inter-channel (SD) voltage of the transistor 11*b*. As illustrated in FIG. 117, if OEV2 is kept high for a predetermined period during 1 H, a turn-off voltage is applied to the gate signal line 17*b*. Consequently, the transistor 11*d* turns on and off creating the states in FIG. 115. When the transistor 11*d* turns off, the inter-channel (SD) voltage of the transistor 11*b* is decreased and the state in FIG. 115(*b*) is created. This reduces leakage from the transistor 11*b* and either eliminates or greatly reduces off-leakage bright spots.

Figure 118:
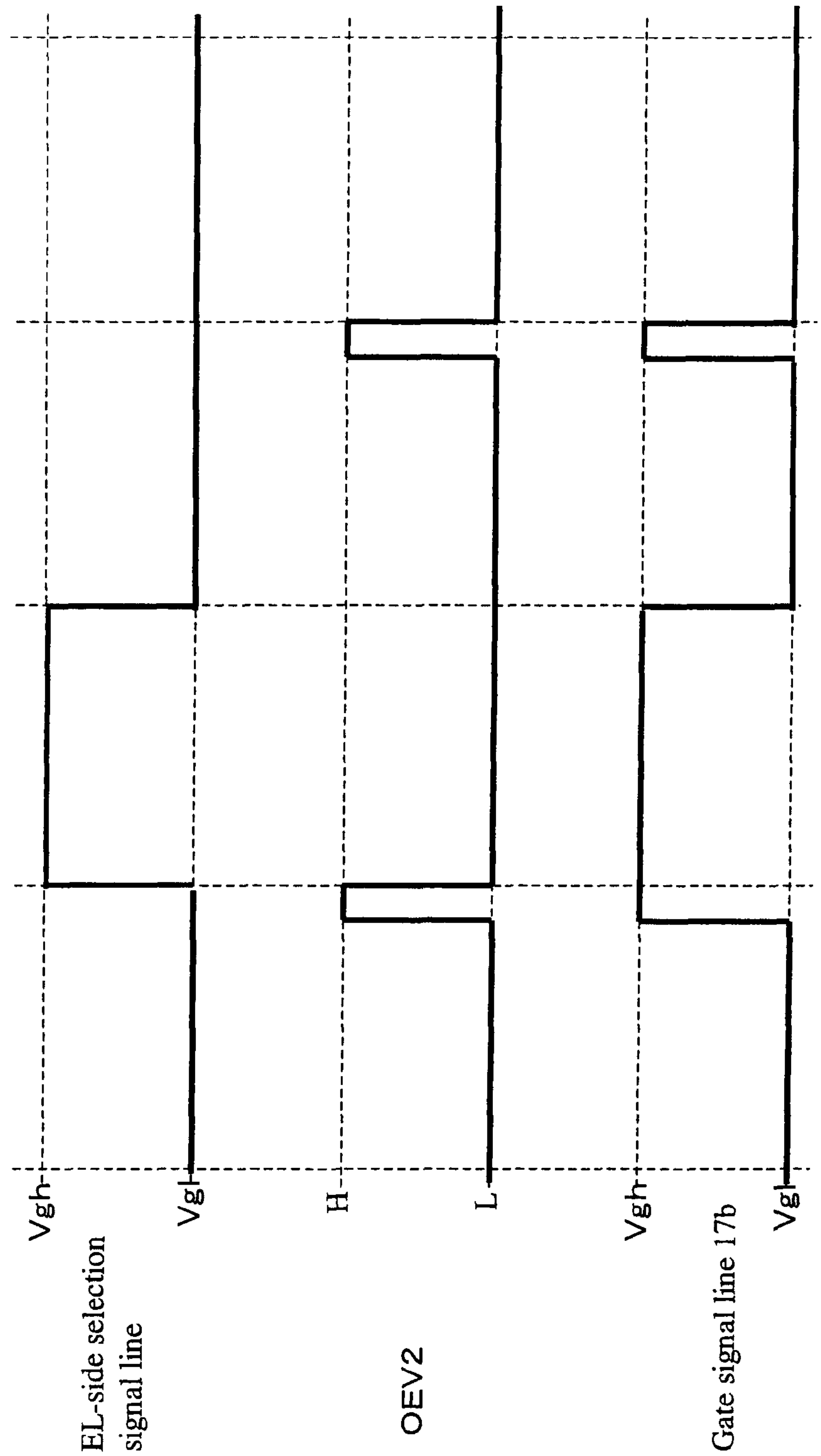
FIG. 118 is an explanatory diagram illustrating a drive method of a display panel according to the present invention.

Incidentally, although it has been stated with reference to FIG. 117 that the OEV2 circuit is operated every 1 H, this is not restrictive. Needless to say, for example, the transistor 11*d* may be turned on and off every 2 Hs or more as illustrated in FIG. 118. Of course, the transistor 11*d* may be turned on and off for a predetermined period once in every 3 Hs or more by controlling the OEV2 circuit. Needless to say, the present invention is also applicable to cases in which two pixel rows are selected at a time by the application of a turn-off voltage to a gate signal line 17*b* which covers two pixel rows (see FIG. 24, etc.).

Figure 119:
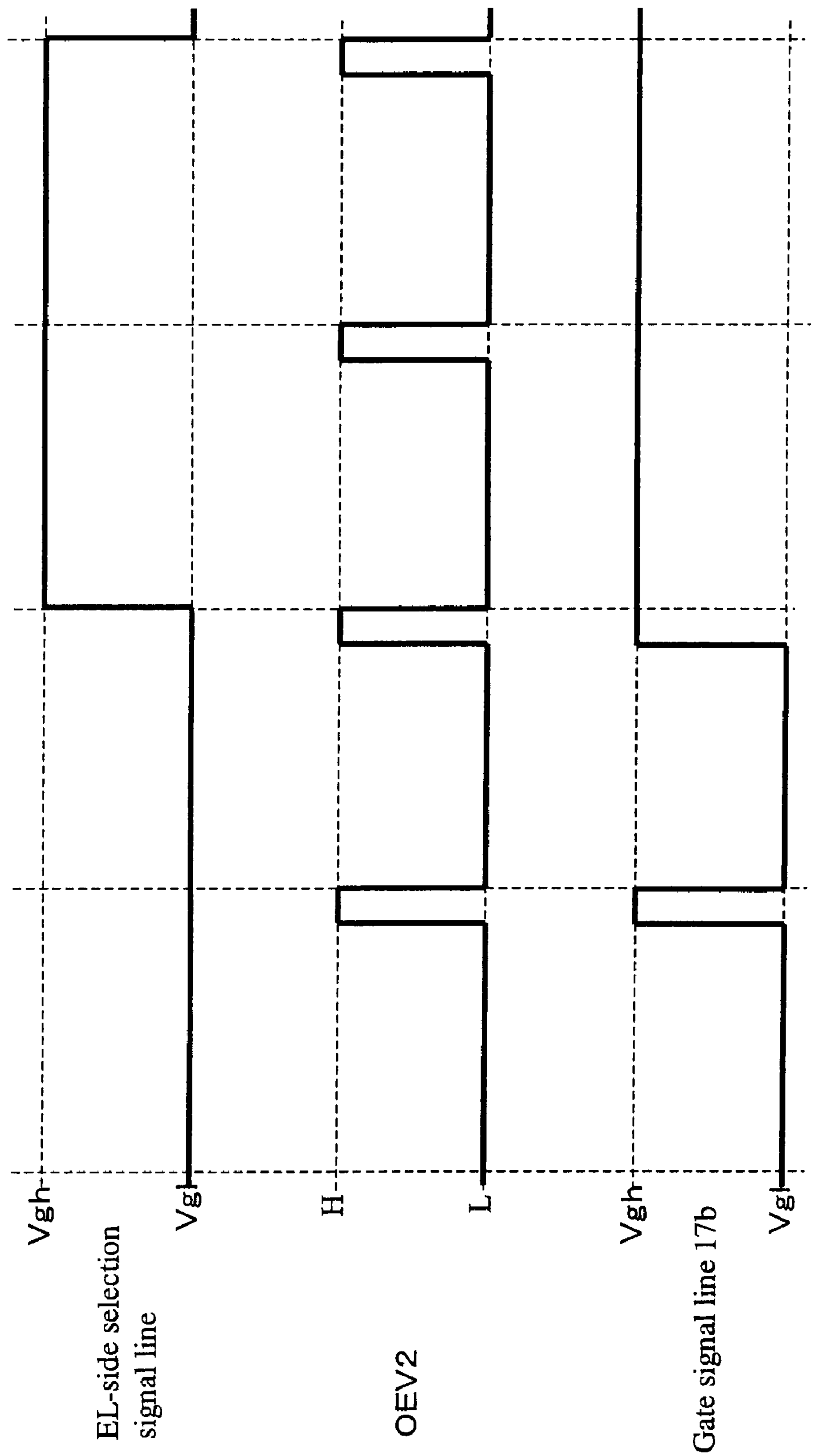
FIG. 119 is an explanatory diagram illustrating a drive method of a display panel according to the present invention.

FIG. 119 shows a case in which a turn-on voltage and turn-off voltage are applied to the gate signal line 17*b* periodically. A turn-on voltage and turn-off voltage are applied periodically to the gate signal line 17*b* rather than a turn-on voltage is applied continuously. Even when a turn-on voltage and turn-off voltage are applied to the gate signal line 17*b*, off-leakage bright spots may occur if a turn-on voltage continues to be applied for a certain period or more. Again, by operating the OEV2 circuit, a turn-off voltage is applied to the gate signal line 17*b* at predetermined intervals. Consequently, the transistor 11*d* is turned off periodically. This reduces leakage from the transistor 11*b* and either eliminates or greatly reduces off-leakage bright spots.

Figure 120:
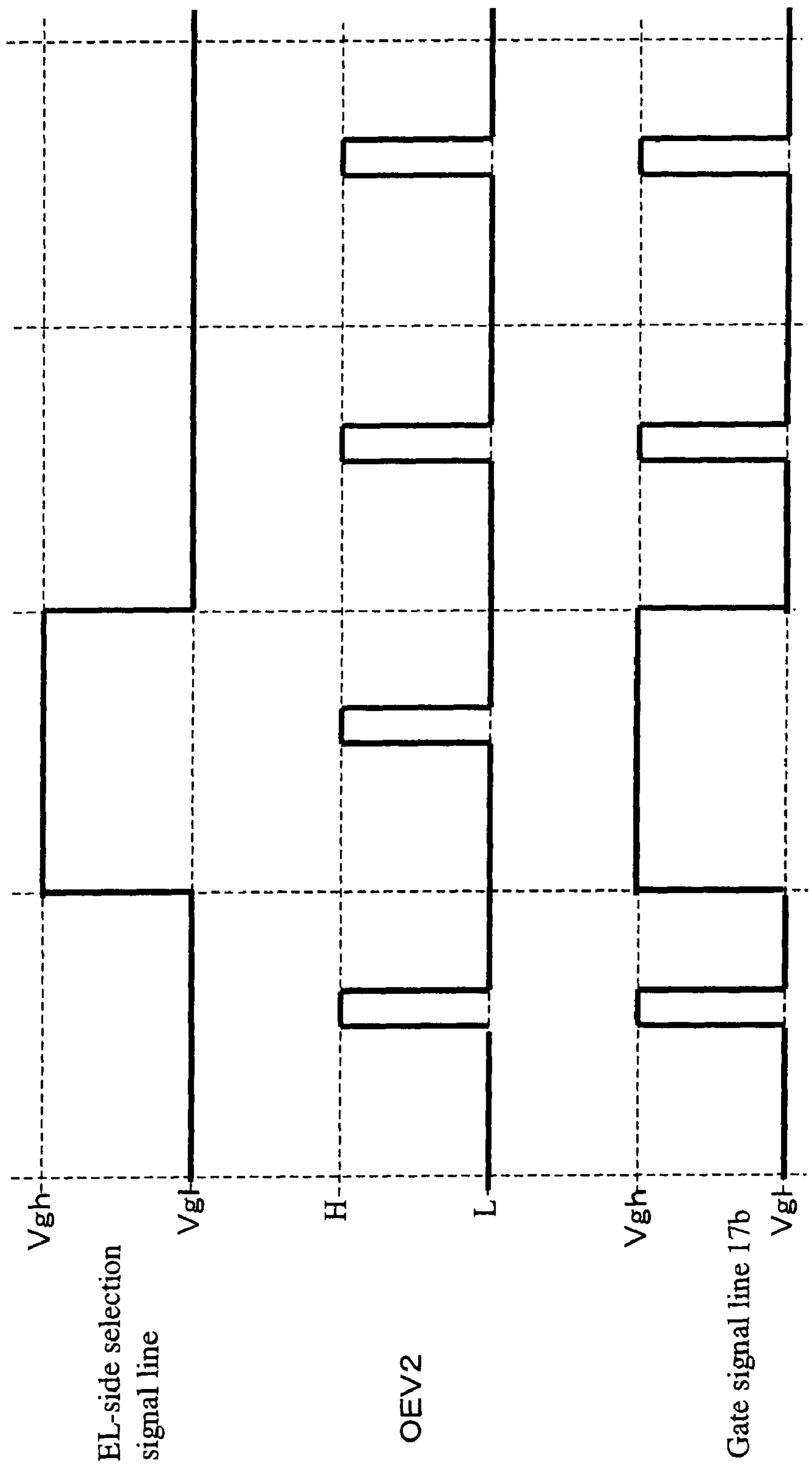

It has been stated with reference to FIGS. 117, 118, etc. that a turn-off voltage is applied to the gate signal line 17*b* periodically by setting OEV2 to high at the beginning or end of 1 H. However, the present invention is not limited to this. For example, as illustrated in FIG. 120, a turn-off voltage may be applied to the gate signal line 17*b* in the middle of 1 H.

Figure 121:
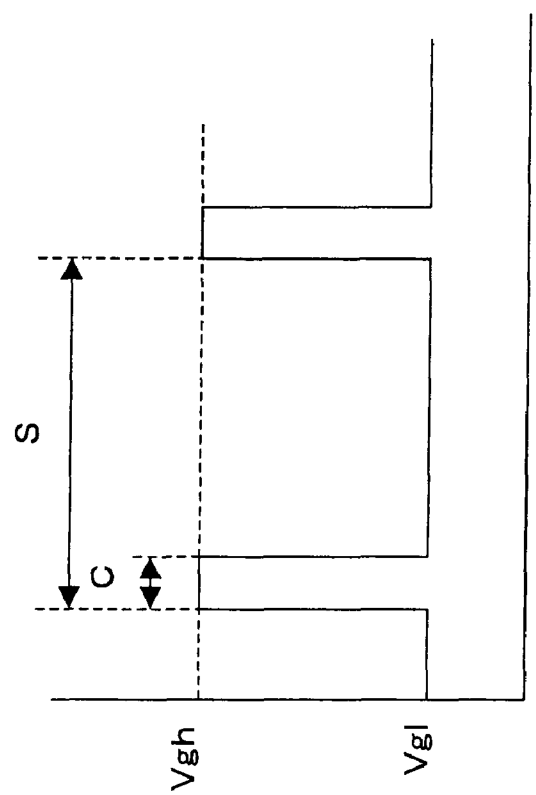
Figure 121:
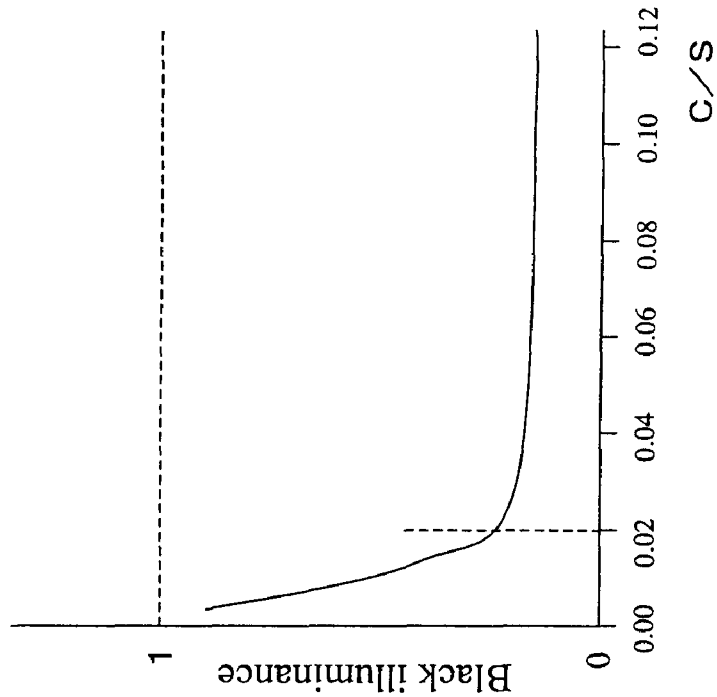

Thus, by applying a turn-off voltage to the gate signal line 17*b*, it is possible to reduce off-leakage bright spots. However, if the turn-off voltage applied to the gate signal line 17*b* is too short, it is not effective in reducing off-leakage bright spots. FIG. 121 illustrates relationship between the duration during which a turn-off voltage or turn-on voltage is applied to the gate signal line 17*b* and effects on reduction of off-leakage bright spots.

Off-leakage bright spots occur in black display. Off-leakage bright spots increase black illuminance (illuminance obtained by measuring the display screen of the display panel with an illuminance meter) (excessive brightness resulting in a whitish screen). FIG. 121(*a*) shows a voltage waveform applied to a gate signal line 17*b*. The application duration of a turn-off voltage is denoted by C and one cycle of the applied turn-off voltage is denoted by S. Incidentally, although it is assumed here that the cycle S corresponds to a period of 1 H, this is not restrictive.

In FIG. 121, when C/S is 0.02 or less, black illuminance is high (there are many off-leakage bright spots), but when C/S approaches 0.02, the black illuminance approaches 0 (there is no off-leakage bright spot). If 1 H=S=100 μsec, then C/S=0.02, that is, C/S becomes 0.02 μsec. Thus, when 1 H=100 μsec, off-leakage bright spots can be eliminated by applying a turn-off voltage to the gate signal line 17*b* for a period equal to approximately 2% of 1 H even if the duty ratio is 1/1.

Figure 122:
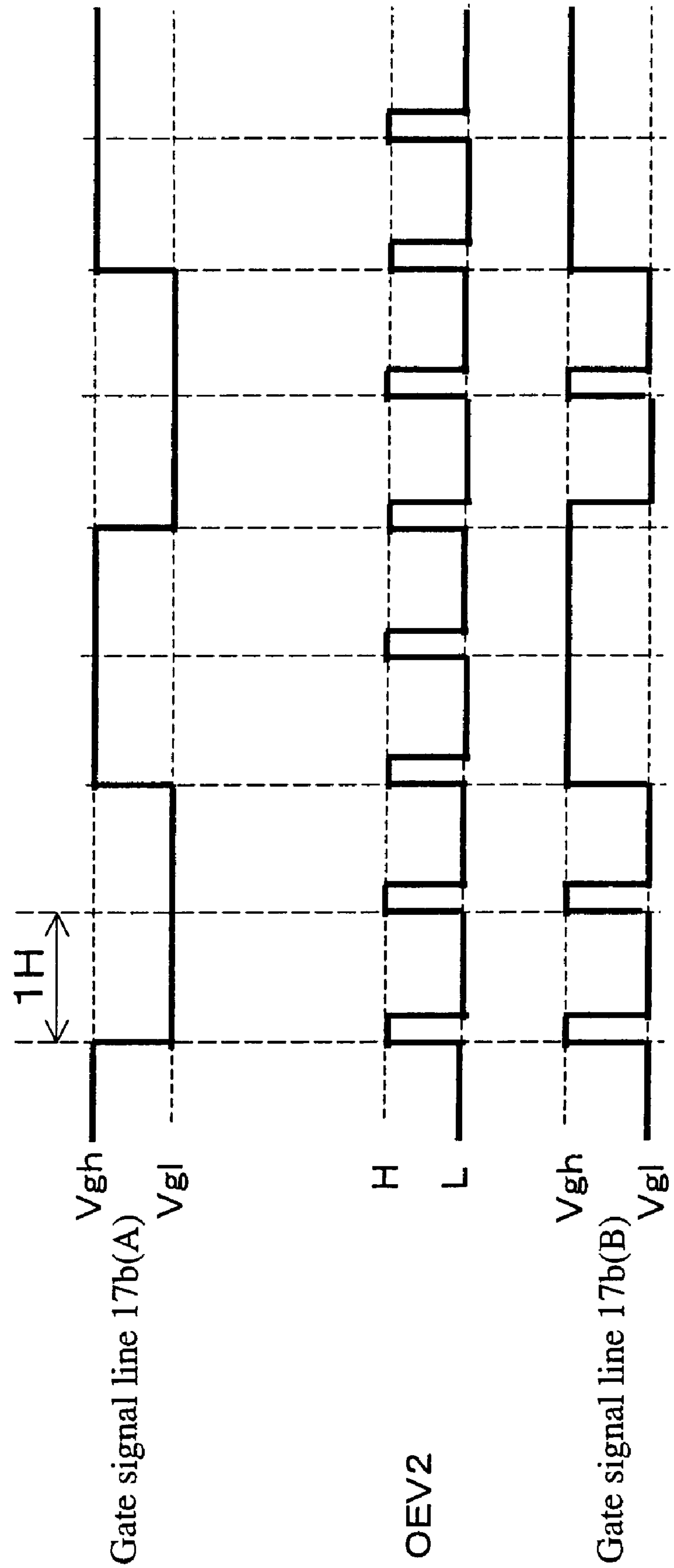

Referring to FIG. 122, a signal waveform of the gate signal line 17*b*(A) is obtained when the drive method according to the present invention is not used. A signal waveform of the gate signal line 17*b*(B) is obtained when a turn-on voltage and turn-off voltage are applied by operating the OEV2 circuit based on the drive method according to the present invention.

In the above example, the OEV2 circuit is controlled over an entire field (frame) period without using duty ratio control. However, the present invention is not limited to this. OEV2 circuit control may be performed based on image data only when the duty ratio is 1/1. Alternatively, OEV2 circuit control may be performed when a certain condition—e.g., a duty ratio of 1/1—continues for a certain period.

It has been shown analytically that preferably the OEV2 circuit is operated when the duty ratio is between 1/1 and 1/2 (both inclusive), and more preferably when the duty ratio is between 1/1 and 3/4 (both inclusive). It is also preferable to perform OEV2 circuit control when the duty ratio remains to be between 1/1 and 1/2 (both inclusive) for a period of 10 frames (fields).

Also, screen brightness can be adjusted by operating OEV2. Increasing the duration during which OEV2 is high decreases screen brightness. Decreasing the duration during which OEV2 is high increases screen brightness. The method of adjusting (changing) screen brightness through operation of OEV2 is a major feature of the drive method according to the present invention.

In the above example, off-leakage bright spots are reduced by the application of a turn-off voltage to the gate signal lines 17*b*. However, this is applicable only when pixels are composed of p-channel transistors as with the pixel configuration in FIG. 1. If pixels are composed of n-channel transistors, a turn-on voltage is applied to the gate signal lines 17*b*. As described above, the present invention reduces off-leakage bright spots by providing periods in which a higher voltage is applied to point A than the voltage applied to the capacitor 19 (point B) as illustrated in FIG. 115 rather than by applying a turn-on voltage and turn-off voltage to the gate signal lines 17*b*. Also, it reduces off-leakage by providing periods in which the inter-channel voltage (SD voltage) of the holding transistor 11*b* is decreased.

The methods in FIGS. 116 to 122 reduce off-leakage bright spots, by applying a turn-off voltage to the gate signal line 17*b* periodically through the operation of OEV2. However, the drive method according to the present invention is not limited to this. A turn-off voltage may be applied to the gate signal line 17*b* at predetermined intervals through operation of the gate driver circuit 12*b* without operating the OEV2 circuit. FIG. 123 shows an example.

In FIG. 123, a non-display area 52 consisting of one pixel row is generated at predetermined intervals and is scanned. With the pixel configuration in FIG. 1, the non-display area 52 as well as the gate signal lines 17 are not limited to a single pixel row and may cover two or more pixel rows in generating the non-display area 52.

In FIG. 123, the non-display area 52 moves as shown by FIG. 123(*a*)→123(*b*)→123(*c*). Preferably, the non-display area 52 repeats four or more times in one field (one frame) as illustrated in FIG. 124.

Figure 124:
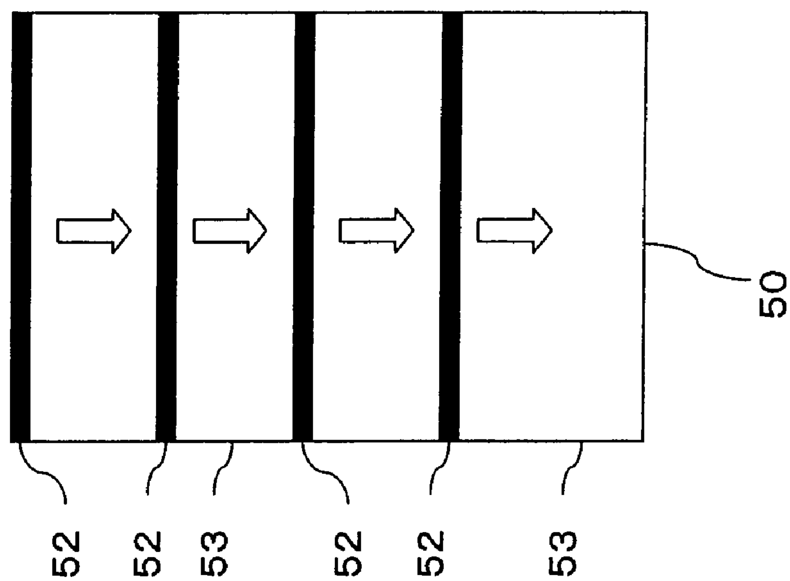
Figure 125:
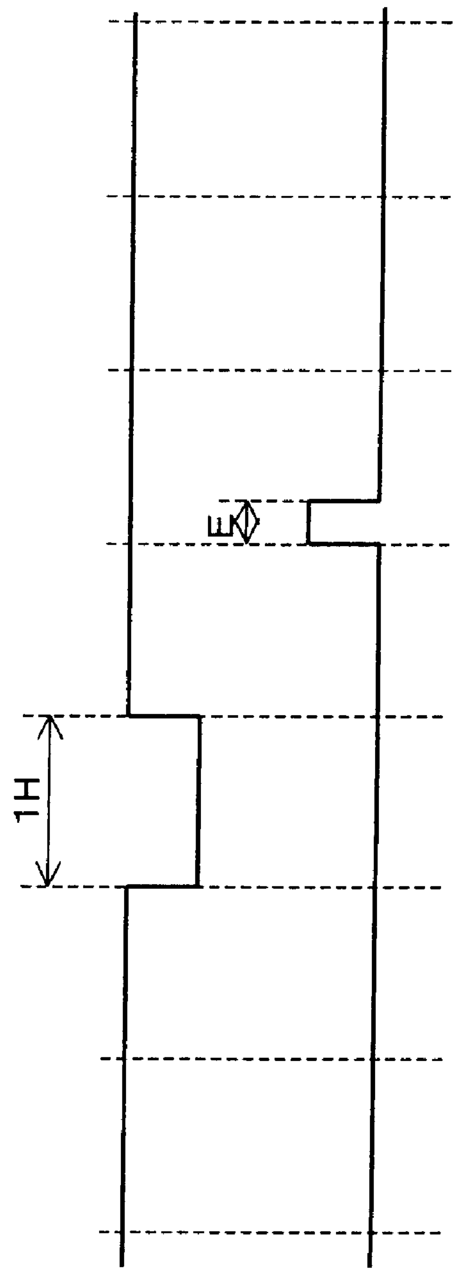

Incidentally, in the example in FIGS. 123 and 124, the period during which a turn-off voltage is applied to the gate signal line 17*b* is not limited to 1 H. This period may be shorter than 1 H, as exemplified by period E in FIG. 125.

The above example prevents off-leakage bright spots by applying a turn-off voltage for a predetermined period through operation of the OEV2 circuit when a turn-on voltage continues to be applied to the gate signal line 17*b* (the gate signal line 17*b* in FIG. 1) for a certain period.

As a measure against off-leakage bright spots in pixel 16 design, the turn-off characteristics of the transistor 11*b* can be improved. This can be done, for example, by placing a plurality of transistors 11*b* in series as illustrated in FIG. 150. It has been shown analytically that preferably three or more transistors 11*b* are placed or formed in series. More preferably, five or more transistors are placed or formed in series as illustrated in FIG. 150.

Incidentally, although examples in FIGS. 115 to 126 have been described by citing the pixel configuration in FIG. 1, this is not restrictive. The drive method described with reference to FIG. 115 and the like prevents leakage of electric charges from the capacitor 19. Thus, it is applicable to any pixel configuration that contains a capacitor 19 and holding transistor 11*b* as in FIG. 1.

The pixel configuration in FIG. 38, for example, also contains a capacitor 19 and holding transistor 11*d*. Thus, effect of the drive method according to the present invention can also be achieved with the pixel configuration in FIG. 38 by controlling the transistor 11*e*. Similarly, the pixel configuration in FIG. 43 also contains a capacitor 19 and holding transistor 11*e*. Thus, the effect of the present invention can be achieved by operating the transistor 11*d*.

The pixel configuration in FIG. 51 also contains a capacitor 19*a* and holding transistor 11*b*. Thus, the effect of the present invention can be achieved by operating the transistor 11*e*. This similarly applies to FIG. 50 and the like. Furthermore, this similarly applies to the pixel configuration in FIG. 63. The pixel configuration in FIG. 63 also contains a capacitor 19 and holding transistor 11*b*. Therefore, by operating the switch 631 and affecting the transistor element 11*b* via the EL element 15, it is possible to enhance holding effect as a result. Thus, the effect of the present invention can be achieved.

A problem with the pixel configuration in FIG. 1, FIG. 38, or the like is that the amplitude of the gate signal line 17*a* causes changes to the electric charges in the capacitor 19, making it impossible to obtain predetermined gradations. Description will be given citing the pixel configuration in FIG. 1 for ease of explanation. FIG. 138 illustrates changes in the potential of pixels 16 in the case of conventional current programming with the pixel configuration in FIG. 1.

Referring to FIG. 138, Gate Signal Line 17*a*(1) represents a signal waveform of the gate signal line 17*a* of a pixel (1). Gate Signal Line 17*a*(2) represents a signal waveform of the gate signal line 17*a* of a pixel (2) next to the pixel (1). Gate Signal Line 17*a*(3) represents a signal waveform of the gate signal line 17*a* of a pixel (3) next to the pixel (2). Source Signal Line 18 represents a voltage (current) waveform applied to the source signal line. The pixel potential illustrates a capacitor potential of the pixel (2) (voltage waveform of the gate terminal G of the driver transistor 11*a*). The gate signal lines 17*a* are scanned in the order: (1)→(2)→(3)→(4)→(5)→ . . . (1)→(2)→ . . . .

With the pixel configuration in FIG. 1 (although not limited to the pixel configuration in FIG. 1), parasitic capacitance 1381 is produced between the gate G and source S terminals of the transistor 11*b*. When the gate signal line 17*a* changes from Vgh (turn-off voltage) to Vgl (turn-on voltage) or from Vgl to Vgh, the voltage change is transmitted to the gate G terminal of the transistor 11*a* (capacitor 19 terminal) via the parasitic capacitance 1381. The potential change at the gate terminal of the driver transistor 11*a* causes the current value (voltage value) programmed into the driver transistor 11*a* to deviate from a predetermined value. The deviation from the predetermined value depends on a capacitance ratio between the parasitic capacitance 1381 and capacitor 19. The deviation from the predetermined value decreases with decreases in the capacitance of the parasitic capacitance 1381 or with increases in the capacitance of the capacitor 19.

Noteworthy are changes in the pixel potential at points A and B. At point A, the gate signal line 17*a*(2) changes from Vgh to Vgl. At point B, the gate signal line 17*a*(2) changes from Vgl to Vgh (see Pixel Potential in FIG. 138).

At point A, with a change in the potential of the gate signal line 17*a* from Vgh (turn-off voltage) to Vgl (turn-on voltage), the potential at the gate terminal G of the driver transistor 11*a* falls. However, since the transistors 11*b* and 11*c* are on, the potential (current) of the source signal line 18 is written into the pixel 16 and the capacitor 19 is charged (discharged). As the capacitor 19 is charged (discharged), the driver transistor 11*a* is programmed to pass a predetermined current (the pixel potential becomes equal to voltage Vb). Since pixel design is such that programming is completed within a period of 1 H, the driver transistor 11*a* passes the predetermined current at point C.

At point B, the potential of the gate signal line 17*a* changes from Vgl (turn-on voltage) to Vgh (turn-off voltage). With this voltage change, the potential at the gate terminal G of the driver transistor 11*a* rises (the pixel potential becomes equal to voltage Vc). When the potential of the gate signal line 17*a* changes to Vgh (turn-off voltage), the transistors 11*b* and 11*c* turn off, cutting off the capacitor 19 terminal from the source signal line 18 and consequently holding the voltage Vc.

Thus, although the pixel potential which causes programming current to flow equals the voltage Vb, the pixel potential actually held equals the voltage Vc. Consequently, the programming current flowing through the EL element 15 has a value different from the desired one.

A drive method which solves this problem will be described with reference to FIG. 139. However, the drive method in FIG. 138 not necessarily presents a problem. First, reasons for that will be described.

In relation to the driver transistor 11*a*, the potential of the gate signal line 17*a* changes from Vgl (turn-on voltage) to Vgh (turn-off voltage) and this state is maintained for one frame (field) period. As the gate signal line 17*a* changes from Vgl (turn-on voltage) to Vgh (turn-off voltage), the potential of the driver transistor 11*a* shifts to the anode voltage Vdd.

Since the driver transistor 11*a* is a p-channel transistor, the shift to the anode voltage Vdd works to prevent current flow. Current programming method has a problem of small programming current during black display as described earlier herein. To deal with this problem the present invention uses N-fold pulse driving and the like. In FIG. 138, however, the pixel potential is finally shifted to, and held at, the black side, making it possible to achieve proper black display.

The present invention can achieve the above effect through a synergy of the following: each pixel driver transistor 11*a* is a p-channel transistor, the anode voltage is higher than the cathode voltage, the current applied to the source signal line 18 is passed through the driver transistor 11*a* of the pixel 16 when the WR-side selection signal line (the gate signal line 17*a*) is low (Vgl), and the pixel 16 is cut off from the source signal line 18 when the WR-side selection signal line (the gate signal line 17*a*) is high (Vgh). Thus, it is important to use p-channel transistors as the transistors 11*b* and 11*c* (see FIG. 1). Also, as described with reference to FIG. 111, the synergy is enhanced if p-channel transistors are used for the gate driver circuits 12.

Also, for proper current programming, it is important to use p-channel transistors for the transistors 11*d* which cut off the paths to the EL elements 15. Furthermore, the synergy is further enhanced by the fact that the gate terminal G of the switching transistor 11*d* is held high (Vgh) for a certain period (at least 2 Hs) by N-fold pulse driving, maintaining the drain terminal D of the driver transistor 11*a* at a relatively high voltage because leakage from the transistor 11*b* is reduced. Thus, a combination of the configuration in FIG. 1 and the system in FIG. 138 or the like is a configuration characteristic of the present invention.

Next, the drive method in FIG. 139 will be described. Incidentally, as described earlier herein, the OEV1 circuit is formed in the output stage of the gate driver circuit 12*a* (see FIG. 116, etc.), and a Vgh voltage is applied to the gate signal line 17*a* when a high-level signal is applied to the OEV1 circuit. By the application of the Vgh voltage, the transistors 11*b* and 11*c* are turned off (in the case of the pixel configuration in FIG. 1 or the like).

The OEV1 circuit, to which the higher voltage is applied once in every 1 H, outputs Vgh (turn-off voltage) to the gate signal line 17*a*. However, non-selected gate signal lines 17*a* go through no output change because no turn-off voltage (Vgh) is outputted to them 17*a* from the beginning In the case of a selected gate signal line 17*a*, to which a turn-on voltage (Vgl) is applied, a Vgh (turn-off voltage) period is inserted by the application of the higher voltage to the OEV1 circuit.

As the higher voltage is applied to the OEV1 circuit, a turn-off voltage (Vgh) is applied to all the gate signal lines 17*a*. The source driver circuit 14 absorbs programming current from the source signal line (in the case of the pixel configuration in FIG. 1) and supplies programming current to the source signal line 18 via the anode terminal Vdd of the selected pixel 16, driver transistor 11*a*, and switching transistor 11*c*. Thus, if all the gate signal lines 17*a* turn off while the source driver circuit 14 is absorbing programming current, there is no longer a supply route for the programming current. Consequently, the source driver circuit 14 absorbs electric charges from the parasitic capacitance of the source signal line 18 and the potential of the source signal line 18 falls with time.

A problem with the drive method in FIG. 138 is that when the gate signal line 17*a* changes from on to off, its voltage penetrates to the capacitor 19 due to the parasitic capacitance 1381 (penetration voltage) and is held at a level higher than a predetermined voltage.

It is possible to hold a voltage approximately equal to the predetermined voltage in the capacitor 19 by lowering the potential of the source signal line 18 through control of the OEV1 circuit, and thereby compensating for the penetration voltage due to the parasitic capacitance 1381. The drive method in FIG. 139 is based on this principle.

As can be seen from FIG. 139, through control of the OEV1 circuit, a period t1 in which a turn-off voltage is applied is inserted in a period (1 H) during which a selection voltage (turn-on voltage: Vgl) is applied to the gate signal line 17*a* (t1 corresponds to a period during which the higher voltage is applied to the OEV1 circuit). The period t1 is referred to as a gate-open period. The gate-open period ends earlier than the end of 1 H by a period of t2. Also, the gate-open period starts later than the start of 1 H by a period of t3. Thus, a period of 1 H=t3+t1+t2.

Referring to FIG. 139, Gate Signal Line 17*a*(1) represents a voltage waveform of the gate signal line 17*a* of a pixel (1). Gate Signal Line 17*a*(2) represents a voltage waveform of the gate signal line 17*a* of a pixel (2) next to the pixel (1). Gate Signal Line 17*a*(3) represents a voltage waveform of the gate signal line 17*a* of a pixel (3) next to the pixel (2). Source Signal Line 18 represents a voltage (current) waveform applied to the source signal line. The pixel potential illustrates a capacitor potential of the pixel (3) (voltage waveform of the gate terminal G of the driver transistor 11*a*). The gate signal lines 17*a* are scanned in the order: (1)→(2)→(3)→(4)→(5)→ . . . (1)→(2)→ . . . .

Description will be given assuming that the pixel potential is the potential of the pixel (3) and citing the pixel configuration in FIG. 1. In the 1st H and 2nd H, the pixel potential (3) retains the potential from the previous field (frame). In the 3rd H, a turn-on voltage (Vgl) is applied to the gate signal line 17*a*(3), and the transistors 11*b* and 11*c* of the pixel row (3) turn on.

At point A in FIG. 139, with a change in the potential of the gate signal line 17*a* from Vgh (turn-off voltage) to Vgl (turn-on voltage), the potential at the gate terminal of the driver transistor 11*a* falls. However, since the transistors 11*b* and 11*c* are on, the potential (current) of the source signal line 18 is written into the pixel 16 and the capacitor 19 is charged (discharged). As the capacitor 19 is charged (discharged), the driver transistor 11*a* is programmed to pass a predetermined current (the pixel potential becomes equal to voltage Vb). Since pixel design is such that programming is completed within a period of 1 H, the driver transistor 11*a* passes the predetermined current at point C.

At point B, the writing of the programming current into the pixel is completed and the pixel potential becomes equal to voltage Va (it is assumed that the voltage Va is a target voltage. See FIG. 142(*a*)). At point C, the potential of the gate signal line 17*a* changes from Vgl (turn-on voltage) to Vgh (turn-off voltage). With this voltage change, the potential at the gate terminal of the driver transistor 11*a* rises (the pixel potential (3) becomes equal to voltage Vd due to penetration voltage). When the potential of the gate signal line 17*a* changes to Vgh (turn-off voltage), the transistors 11*b* and 11*c* turn off, cutting off the capacitor 19 terminal from the source signal line 18 and consequently holding the pixel potential at the voltage Vd for the gate-open period t1.

During the gate-open period t1, the potential of the source signal line 18 falls because the source driver circuit 14 continues to absorb the programming current and after a lapse of the period t1, it becomes equal to the voltage Vc as shown under Source Signal Line Potential (see FIG. 142(*b*)). Next, during the period t2, a turn-on voltage is applied to the gate signal line 17*a*(3) again, and the transistors 11*b* and 11*c* turn on. As the transistors 11*b* and 11*c* are on, the potential of the source signal line 18 is written into the capacitor 19 of the pixel. Consequently, the pixel potential (3) becomes equal to the voltage Vc. In the period t2, the current-programming mode is entered again and the pixel potential (3) changes to Vb. However, the period t2 is short, only enough for voltage programming, and thus the amount of change from voltage Vc to voltage Vb is slight (the period t2 is set so that the amount of change will be slight. It has been shown analytically that the period t2 should be set between 0.5 and 5 μsec (both inclusive)). On the other hand, it is appropriate to set the period t1 between 0.5 and 10 μsec (both inclusive).

At point E, the potential of the gate signal line 17*a*(3) changes from Vgl (turn-on voltage) to Vgh (turn-off voltage). With this voltage change, the potential at the gate terminal of the driver transistor 11*a* rises (the pixel potential becomes equal to the voltage Va). When the potential of the gate signal line 17*a* changes to Vgh (turn-off voltage), the transistors 11*b* and 11*c* turn off, cutting off the capacitor 19 terminal from the source signal line 18 and consequently holding the voltage Va. Thus, the pixel potential (3) which causes programming current to flow is held at the voltage Va (this means that penetration voltage has been compensated for).

The drive method in FIG. 139 is characterized in that it can adjust an amount of compensation for penetration voltage according to video signal data (programming current). The magnitude of penetration voltage basically depends on the potential difference between Vgh and Vgl, parasitic capacitance 1381, and capacitance of the capacitor 19 (although there are some differences due to the gate terminal voltage of the driver transistor 11*a*). Therefore, the magnitude of penetration voltage is a fixed value. If the duration during which the higher voltage is applied to the OEV1 circuit is also constant, when the programming current is intended for black display, the amount of current absorbed by the source driver circuit 14 is small. Thus, when the image data written into pixels is intended for black display, the potential drop in the source signal line 18 is also small. When the programming current is intended for white display, the amount of current absorbed by the source driver circuit 14 is large. Thus, when the image data written into pixels is intended for white display, the potential drop in the source signal line 18 is large.

On the other hand, the penetration voltage caused by the gate signal line 17*a* is a fixed value. Thus, when the programming current written into pixels carries black display data, only a small amount of compensation is made for penetration voltage through control of the OEV1 circuit. The penetration voltage caused by the gate signal line 17*a* becomes predominant. This provides more complete black display. In black display, which is characterized by a low luminosity factor, there is no problem even if penetration voltage causes a large deviation from a predetermined value.

When the programming current written into pixels carries white display data, a large amount of compensation is made for penetration voltage through control of the OEV1 circuit. This is because the potential of the source signal line 18 drops in a short time when the OEV1 circuit is high. Thus, by controlling the duration during which the OEV1 circuit is high so that the voltage drop caused through the control of the OEV1 circuit and the penetration voltage caused by the gate signal line 17*a* will be equal in magnitude, it is possible to eliminate the effect of the penetration voltage completely. Consequently, in white display, penetration voltage can be compensated for completely. For white display, which is characterized by a high luminosity factor, a drive method which cancels out penetration voltage works well.

Thus, the drive method according to the present invention can adjust the amount of compensation for penetration voltage according to image display data.

Incidentally, the duration during which the OEV1 circuit is high may be varied according to image display data. A possible method involves, for example, summing up image display data, determining screen brightness from the sum, and controlling the duration during which the OEV1 circuit is high based on the determined screen brightness.

Incidentally, the amount of compensation for penetration voltage can be changed if the gate-open period t1 and period t2 are made adjustable. This makes it possible to optimize the amount of compensation for penetration voltage according to characteristics of the panel. However, the period t2 does not need to be established exactly.

Although it has been stated in the example in FIG. 139 that the gate-open period t1 is provided when the gate signal line 17*a* is selected through the control of the OEV1 circuit. However, the present invention is not limited to this. It is also possible to determine for each horizontal scanning period or each pixel row whether to provide a gate-open period t1 or not for driving.

For example, a conceivable drive method involves not providing a gate-open period when the image data of a pixel row consists almost entirely of black display data, providing a gate-open period when the image data of a pixel row consists almost entirely of white display data, and providing a gate-open period longer than usual when the image data of a pixel row consists entirely of white display data.

FIG. 140 is an explanatory diagram illustrating a drive method according to the present invention. No gate-open period is provided in the 1st H and 5th H. A gate-open period is provided in the 2nd H to 4th H, and consequently there are potential drops in the source signal line 18.

There is a correlation between the gate-open period t1 (B in FIG. 141(*a*)) and current programming period (in FIG. 141 (*a*)). In a graph in FIG. 141(*b*), the vertical axis represents difference (%) from a predetermined brightness. However, numerals are expressed in absolute terms. The difference from a predetermined brightness is the difference in percentage terms (%) between a target brightness and actual brightness affected by penetration voltage and the like during current programming. As can also be seen from FIG. 141(*b*), the error almost reaches a minimum when B/A is 0.02 or above (where B=t1, A=1 H, and C=2 μsec). Therefore, preferably, B/A is 0.02 or above. However, if B is too large, current programming time is reduced, resulting in insufficient writing. Thus, preferably B/A is not larger than 0.3.

By switching among modes of B/A, it is possible to adjust the effect of panel penetration voltage (where B is the duration during which the OEV1 circuit is high, that is, the duration during which a selected gate signal line 17*a* is off while A is 1 H (one horizontal scanning period)). Preferably, B/A is varied according to gradations (see FIG. 145). Generally, it is preferable to decrease B/A for low gradations (black display=gradations 1, 2, 3, . . . ) and increase B/A for high gradations (white display=gradations 62, 63, 64, . . . ). Preferably, approximately four modes of B/A are provided to switch among them according to image scenes, contents, etc.

FIG. 145 shows MODE1, MODE2, MODE3, and MODE4. MODE1 corresponds to B=0 (i.e., the OEV1 circuit remains low and the selected gate signal line 17*a* remains off). MODE2 corresponds to B=0 on a low-gradation side (i.e., the OEV1 circuit remains low and the selected gate signal line 17*a* remains on) and B/A=0.05H on a high-gradation side. MODE3 corresponds to B/A=0.05 over all the gradations. MODE4 is a mode in which the value of B/A is varied according to gradations.

Also, the mode may be switched by selecting the value of B according to the average gradation level of image data in each pixel row. Also, OEV1 control may be changed above a certain gradation. It is also possible to stop using OEV1 below a certain gradation level.

The above example involves controlling the OEV1 circuit of the gate driver circuit 12, thereby changing the potential of the source signal line 18, and thereby dealing with effects of penetration voltage and the like. FIG. 143 shows how square waves are applied to source signal lines 18 from outside to deal with effects of penetration voltage and the like.

In FIG. 143, a capacitor driver 1431 generates square waves (referred to as source coupling signals. See FIG. 144.), which are applied by coupling capacitors 1434 to the source signal lines 18. One end of each coupling capacitor 1434 is connected to a capacitor signal line 1433. The square waves are applied to the capacitor signal line 1433. The source coupling signals are applied to the source signal lines in sync with horizontal synchronization signals.

For ease of explanation, description will be given with a focus on pixel potential (2). In the 3rd H, a turn-on voltage is applied to the gate signal line 17*a*(2). Upon the application of the turn-on voltage, the transistors 11*b* and 11*c* of the pixel (2) turn on and the current applied to the source signal line 18 is applied to the driver transistor 11*a* (point A). At point B, the source coupling signal applied to the capacitor signal line 1433 changes from Vsl to Vsh. Consequently, the source coupling signal couples (penetrates) to the source signal line 18, causing the pixel potential (2) to leap to the voltage Va. However, this leap is cancelled out by the programming current in a short period of time and the pixel potential (2) reaches a target potential Vb at point C at the latest.

At point C, the source coupling signal applied to the capacitor signal line 1433 changes from Vsh to Vsl. Consequently, the source coupling signal couples (penetrates) to the source signal line 18, causing the pixel potential (2) to fall to the voltage Vc. At point C, since a turn-on voltage is applied to the gate signal line 17*a*(2), the voltage Vc is changed by the programming current. However, the voltage Vc changes little if the time between point C and point D is short.

At point D, since the voltage applied to the gate signal line 17*a*(2) changes from turn-on voltage to turn-off voltage, the pixel (2) potential shifts to the voltage Vb due to penetration voltage. Consequently, the target voltage Vb is held in the pixel 16. Thus, by coupling the source coupling signal to the source signal line 18, it is possible to compensate for penetration voltage. Needless to say, by varying the amplitude of the source coupling signal, it is possible to adjust a compensation ratio of the penetration voltage.

FIG. 139 above shows how the potential of the source signal line 18 is changed by controlling OEV1. However, the potential of the source signal line 18 can also be changed using the source driver circuit 14 side. As illustrated in FIG. 147, the source driver circuit 14 has an analog switch 752 formed or placed between a terminal 1471 connected to the source signal line 18 and a current output circuit 1461 (see FIG. 146). Parasitic capacitance 1472 is produced in the source driver circuit 14 as well.

With the switch 752 closed, the programming current Iw flows into the current output circuit 1461 as illustrated in FIG. 147(*a*). When the switch 752 opens (see FIG. 147(*b*)), the current output circuit 1461, which is a constant-current circuit, absorbs the programming current Iw continuously. Consequently, the electric charges in the parasitic capacitance 1472 is absorbed, lowering the potential of internal wiring 1473. In this state, if the switch 752 is turned on (see FIG. 147(*c*)), the programming current Iw branches into the parasitic capacitance 1472 to charge it and current output circuit. This lowers the potential of the source signal line 18. If the situations of the potential drops in the source signal line 18 are applied to the situations at point C to point D in FIG. 139, the lowered potential of the source signal line 18 can be written into the pixel 16 as in the case of FIG. 139.

FIG. 143 above shows a configuration in which a signal is applied to the source signal line 18 via the capacitor signal line 1433 to compensate for penetration voltage. FIG. 151 shows a configuration in which penetration voltage is compensated for in each pixel row.

In FIG. 151, one end of the capacitor 19 is connected to the driver transistor 11*a* and the other end is connected to a common signal line 1511. The common signal line 1511 is a signal line shared by one pixel row. The common signal line 1511 is connected to a common driver circuit 1512. As illustrated in FIG. 152, the common driver circuit 1512 outputs a square wave signal and applies it to each common signal line 1511. The other part of the configuration is the same as that shown in FIG. 1, and thus description thereof will be omitted.

Referring to FIG. 152, Gate Signal Line 17*a*(1) represents a voltage waveform of the gate signal line 17*a* of a pixel (1). Gate Signal Line 17*a*(2) represents a voltage waveform of the gate signal line 17*a* of a pixel (2) next to the pixel (1). Gate Signal Line 17*a*(3) represents a voltage waveform of the gate signal line 17*a* of a pixel (3) next to the pixel (2).

Common Signal Line (1) represents a voltage waveform of the common signal line 1511 of the pixel (1). Similarly, Common Signal Line (2) represents a voltage waveform of the common signal line 1511 of the pixel (2) and Common Signal Line (3) represents a voltage waveform of the common signal line 1511 of the pixel (3).

Source Signal Line 18 represents a voltage (current) waveform applied to the source signal line. The pixel potential (2) illustrates a capacitor potential of the pixel (2) ((voltage waveform of the gate terminal G of the driver transistor 11*a*). The gate signal lines 17*a* are scanned in the order: (1)→(2)→(3)→(4)→(5)→ . . . (1)→(2)→ . . . . The common signal lines 1511 are also scanned in the order: (1)→(2)→(3)→(4)→(5)→ . . . (1)→(2)→ . . . . For ease of explanation, description will be given with a focus on the pixel potential of the pixel (2) (the potential at the gate terminal G of the driver transistor 11*a*). First, image data of all the fields is held in the pixel 16.

At point A, with a change in the potential of the gate signal line 17*a* from Vgh (turn-off voltage) to Vgl (turn-on voltage), the potential at the gate terminal G of the driver transistor 11*a* falls (Va→Vc). Since the transistors 11*b* and 11*c* are on, the potential (current) of the source signal line 18 is written into the pixel 16 and the capacitor 19 begins to charge (discharge). Incidentally, the potential of the common signal line 1511 is assumed to be Vcl at the start of 1 H (Vcl<Vch).

After a period of Ta from the start of 1 H, the potential of the common signal line 1511 changes from Vcl to Vch (see point B in FIG. 152). Needless to say, however, the above operation may be performed at the start of 1 H. The change in the potential of the common signal line 1511 causes the potential (pixel potential (2)) of the capacitor 19 to shift to voltage Ve. Since the transistors 11*b* and 11*c* are on, the potential (current) of the source signal line 18 is written into the pixel 16, the capacitor 19 is charged (discharged), and at point C at the end of 1 H, the target voltage Vb is written into the pixel 16. Incidentally, the time Ta may be 0 sec. (at the start of 1 H). Preferably, the time Ta is set to between 0 and ⅕ of 1 H (both inclusive). This is because extending the time Ta decreases the current programming period itself.

At point C, the potential of the gate signal line 17*a* changes from Vgl (turn-on voltage) to Vgh (turn-off voltage). This voltage change acts as penetration voltage and changes the pixel potential (2) via parasitic capacitance 1381. With this change in the potential, the pixel potential (2) becomes equal to voltage Vd. At point C, when the potential of the gate signal line 17*a* changes to Vgh (turn-off voltage), the transistors 11*b* and 11*c* turn off, cutting off the capacitor 19 terminal from the source signal line 18 and consequently holding the voltage Vd.

After a lapse of Tb from the completion of 1 H (selection period of pixel (2)), the potential of the common signal line 1511 changes from Vch to Vcl (see point D in FIG. 152). The change in the potential of the common signal line 1511 causes the potential (pixel potential (2)) of the capacitor 19 to shift to the target voltage Vb. Through the above operation, the capacitor 19 holds the voltage Vb so that a predetermined current based on image data flows through the driver transistor 11*a*.

As can be seen from the above operation, the penetration voltage caused by the parasitic capacitance 1381 and the like is compensated for by the application of a signal to the common signal line 1511. This compensation allows accurate current programming of the pixels 16. Incidentally, it has been stated that the potential of the common signal line 1511 changes from Vch to Vcl after a lapse of Tb from the completion of 1 H. However, Tb may be either 0 sec. (immediately upon termination of 1 H) or 1 H or longer.

In this way, the drive method according to the present invention changes the potential of the common signal line from Vcl to Vch within a pixel selection period (if the potential is changed before the selection period, there is no problem because current programming is performed within the selection period). Thus, the potential of the common signal line can be changed from Vcl to Vch before the current programming of the given pixel is finished. After the pixel selection period (or immediately upon termination of the selection period), the drive method changes the potential of the common signal line from Vch to Vcl.

Incidentally, the amplitudes (Vch and Vcl) of the common signal line 1511 are configured to be changeable by a regulator of a voltage generator circuit (not shown). The configuration and operation of the common driver circuit 1512 is the same as or similar to those of the gate driver circuit 12, and thus description thereof will be omitted. Also, the other part of the operation is the same as that shown in FIG. 139, and thus description thereof will be omitted.

FIGS. 151 and 152 above show a system which compensates for penetration voltage by the operation of the common signal lines. FIG. 153 shows a configuration in which penetration voltage is compensated for by the operation of the gate signal line 17*a* in the preceding stage of a pixel without using a common driver circuit 1512.

In FIG. 153, one end of the capacitor 19 is connected to the driver transistor 11*a* and the other end is connected to the gate signal line 17*a* in the preceding stage (the last pixel selected). The electrode at one end of the capacitor 19 is the gate signal line 17*a*. The other part of the configuration is the same as that shown in FIGS. 1, 151, etc.

Referring to FIG. 154, Gate Signal Line 17*a*(1) represents a voltage waveform of the gate signal line 17*a* of a pixel (1). Gate Signal Line 17*a*(2) represents a voltage waveform of the gate signal line 17*a* of a pixel (2) next to the pixel (1). Gate Signal Line 17*a*(3) represents a voltage waveform of the gate signal line 17*a* of a pixel (3) next to the pixel (2).

Source Signal Line 18 represents a voltage (current) waveform applied to the source signal line. The pixel potential (2) illustrates a capacitor potential of the pixel (2) (voltage waveform of the gate terminal G of the driver transistor 11*a*). The gate signal lines 17*a* are scanned in the order: (1)→(2)→(3)→ (4)→(5)→ . . . (1)→(2)→ . . . .

For ease of explanation, description will be given with a focus on the pixel potential of the pixel (2) (the potential at the gate terminal G of the driver transistor 11*a*). First, image data of all the fields is held in the pixel 16. In the example in FIG. 153, the gate drive circuit 12*a* applies one turn-on voltage (Vgl) and two turn-off voltages (Vgh2 and Vgh1) to the gate signal lines 17*a*. Assuming that the turn-off voltage Vgh2>the turn-off voltage Vgh1, the following condition is satisfied: 0.02 (V)<Vgh2−Vgh1<0.4 (V).

At point A, with a change in the potential of the gate signal line 17*a*(1) in the preceding stage from Vgh1 (turn-off voltage) to Vgl (turn-on voltage), the potential of the capacitor 19 of the pixel (2) changes (the pixel potential changes from Ve to Vd). Consequently, the potential at the gate terminal G of the driver transistor 11*a* falls.

At point B, with a change in the potential of the gate signal line 17*a* of the pixel (2) from Vgh1 (turn-off voltage) to Vgl (turn-on voltage), the pixel potential changes. Since the transistors 11*b* and 11*c* are on, the potential (current) of the source signal line 18 is written into the pixel 16 and the capacitor 19 begins to charge (discharge). Within a selection period of 1 H, the target voltage Vb is reached. Through the above operation, the capacitor 19 is set such that a predetermined current based on image data flows through the driver transistor 11*a*.

At point C, the potential of the gate signal line 17*a*(2) changes from Vgl (turn-on voltage) to Vgh2 (turn-off voltage). This voltage change acts as penetration voltage and changes the pixel potential (2) via parasitic capacitance 1381. With this change in the potential, the pixel potential (2) becomes equal to voltage Vc. At point C, when the potential of the gate signal line 17*a* changes to Vgh (turn-off voltage), the transistors 11*b* and 11*c* turn off, cutting off the capacitor 19 terminal from the source signal line 18 and consequently holding the voltage Vc.

After a lapse of 1 H (point D in FIG. 154) from the completion of 1 H (selection period of pixel (2)), the potential of the gate signal line 17*a*(2) changes from Vgh2 to Vgh1 (see point D in FIG. 152). The change in the potential of the gate signal line 17*a*(2) causes the potential (pixel potential (2)) of the capacitor 19 to shift to the target voltage Vb. Through the above operation, the capacitor 19 holds the voltage Vb so that a predetermined current based on image data flows through the driver transistor 11*a*.

As can be seen from the above operation, the penetration voltage caused by the parasitic capacitance 1381 and the like is compensated for by the application of three voltages (Vgh1, Vgh2, and Vgl) to the gate signal lines 17*a*. This compensation allows accurate current programming of the pixels 16. Incidentally, although it has been stated that the potential of the gate signal line 17*a*(2) changes from Vgh2 to Vgh1 after a lapse of 1 H (point D in FIG. 154) from the selection period, this is not restrictive. For example, the potential may be changed after a lapse of time Ta within 1 H (see point D in FIG. 155) as illustrated in FIG. 155. Alternatively, it may be changed after a lapse of 1 H or more.

Although in FIG. 153, the gate signal line 17*a* in the previous stage is used as the terminal electrode of the capacitor 19 in the subsequent stage, the present invention is not limited to this. As illustrated in FIG. 156, the gate signal line 17*a* in a stage before the previous stage may be used as the electrode of the capacitor 19. A timing chart for this is shown in FIG. 157.

At point A, with a change in the potential of the gate signal line 17*a*(1) in the stage before the preceding stage from Vgh1 (turn-off voltage) to Vgl (turn-on voltage), the potential of the capacitor 19 of the pixel (3) changes (the pixel potential changes from Va to Ve). Consequently, the potential at the gate terminal G of the driver transistor 11*a* falls.

At point B, with a change in the potential of the gate signal line 17*a*(1) in the stage before the preceding stage from Vgl (turn-on voltage) to Vgh2 (turn-off voltage), the potential of the capacitor 19 of the pixel (3) changes (the pixel potential changes from Ve to Va). Consequently, the potential at the gate terminal G of the driver transistor 11*a* rises.

At point C, with a change in the potential of the gate signal line 17*a*(3) from Vgh1 (turn-off voltage) to Vgl (turn-on voltage), the potential of the capacitor 19 of the pixel (3) changes. Since the transistors 11*b* and 11*c* are on, the potential (current) of the source signal line 18 is written into the pixel 16 and the capacitor 19 begins to charge (discharge). Within a selection period of 1 H, the target voltage Vc is reached.

Through the above operation, the capacitor 19 is set such that a predetermined current based on image data flows through the driver transistor 11*a*.

At point D, the potential of the gate signal line 17*a*(3) changes from Vgl (turn-on voltage) to Vgh2 (turn-off voltage). This voltage change acts as penetration voltage and changes the pixel potential (3) via parasitic capacitance 1381. With this change in the potential, the pixel potential (3) becomes equal to voltage Vb. At point C, when the potential of the gate signal line 17*a* changes to Vgh (turn-off voltage), the transistors 11*b* and 11*c* turn off, cutting off the capacitor 19 terminal from the source signal line 18 and consequently holding the voltage Vb.

After a lapse of 1 H (point D in FIG. 157) from the completion of 1 H (selection period of pixel (3)), the potential of the gate signal line 17*a*(3) changes from Vgh2 to Vgh1 (see point D in FIG. 157). With the change in the potential of the gate signal line 17*a*(3), the potential (the pixel potential (3)) of the capacitor 19 shifts to the target voltage Vc. Through the above operation, the capacitor 19 holds the voltage Vc so that a predetermined current based on image data flows through the driver transistor 11*a*.

As can be seen from the above operation, the penetration voltage caused by the parasitic capacitance 1381 and the like is compensated for by the application of three voltages (Vgh1, Vgh2, and Vgl) to the gate signal lines 17*a*. This compensation allows accurate current programming of the pixels 16.

The above example compensates for the effect of penetration voltage through improvement or invention of a drive system. Penetration voltage can also be suppressed using pixel 16 configuration. In FIG. 148, a p-channel transistor 11*bp* and n-channel transistor 11*bn* are used in place of the p-channel switching transistor 11*b* in FIG. 1. They constitute an analog switch. An inverter 1481 is placed to turn on the p-channel transistor 11*bp* and n-channel transistor 11*bn* simultaneously.

As the transistor 11*b* is composed of the p-channel transistor and n-channel transistor as illustrated in FIG. 148, voltages applied to the two transistors by the gate signal line 17*a* cancel each other. This makes it possible to reduce potential shift due to penetration voltage greatly. Needless to say, as illustrated in FIG. 149, this effect can also be achieved if the transistor 11*bn* and the like are configured by diodes.

Thus, by using the pixel configuration shown in FIGS. 148, 149, or the like, it is possible to compensates for the effect of penetration voltage. Also, when this method is used in combination with the method described with reference to FIG. 139 or the like, it is possible to compensate for penetration voltage and achieve uniform image display due to synergism.

The above example has been described with a focus on the gate signal lines 17*a* (WR-side selection signal lines). Now, a drive method of gate signal lines 17*b* (EL-side selection signal lines) will be described additionally. The gate signal lines 17*b* (EL-side selection signal lines) are signal lines which control the current passed through EL elements 15. In FIG. 63, however, the current passing through the EL element 15 is controlled by turning on and off the switch 631. Thus, the control method of the gate signal lines 17*b* (EL-side selection signal lines) described below additionally can be restated as a method of controlling the timing or time to pass current through the EL elements 15. For ease of explanation, a gate signal line 17*b* (EL-side selection signal line) will be cited as an example in the following description. Needless to say, the items described below apply to all the drive systems according to the present invention.

It has been stated with reference to FIGS. 15, 18, 21, etc. that the gate signal line 17*b* (EL-side selection signal line) applies a turn-on voltage (Vgl) and turn-off voltage (Vgh) every horizontal scanning period (1 H). However, in the case of a constant current, light emission quantity of the EL elements 15 is proportional to the duration of the current. Thus the duration is not limited to 1 H.

FIG. 158 shows ¼-duty driving. A turn-on voltage is applied to the gate signal line 17*b* (EL-side selection signal line) every 4 Hs and the locations to which the turn-on voltage is applied are scanned in sync with a horizontal synchronization signal (HD). Thus, the unit length of a conduction period is 1 H.

However, the present invention is not limited to this. The duration of the conduction period may be less than 1 H (½ H in FIG. 161) as shown in FIG. 161 or it may be equal to or less than 1 H. In short, the unit length of the conduction period is not limited to 1 H and a unit length other than 1 H can be generated easily using the OEV2 circuit formed or placed in the output stage of the gate driver circuit 12*b* (circuit which controls the gate signal line 17*b*). The OEV2 circuit is similar to the OEV1 circuit described earlier, and thus description thereof will be omitted.

In FIG. 159, the conduction period of the gate signal line 17*b* (EL-side selection signal line) does not have a unit length of 1 H. A turn-on voltage little shorter than 1 H is applied to the gate signal lines 17*b* (EL-side selection signal lines) in odd-numbered pixel rows. A turn-on voltage is applied to the gate signal lines 17*b* (EL-side selection signal lines) in even-numbered pixel rows for a very short period. The duration T1 of the turn-on voltage applied to the gate signal lines 17*b* (EL-side selection signal lines) in odd-numbered pixel rows plus the duration T2 of the turn-on voltage applied to the gate signal lines 17*b* (EL-side selection signal lines) in even-numbered pixel rows is designed to be 1 H. FIG. 159 shows a state of the first field.

In the second field which follows the first field, a turn-on voltage little shorter than 1 H is applied to the gate signal lines 17*b* (EL-side selection signal lines) in even-numbered pixel rows. A turn-on voltage is applied to the gate signal lines 17*b* (EL-side selection signal lines) in odd-numbered pixel rows for a very short period. The duration T1 of the turn-on voltage applied to the gate signal lines 17*b* (EL-side selection signal lines) in even-numbered pixel rows plus the duration T2 of the turn-on voltage applied to the gate signal lines 17*b* (EL-side selection signal lines) in odd-numbered pixel rows is designed to be 1 H.

The sum duration of turn-on voltage applications to gate signal lines 17*b* in a plurality of pixel rows may be designed to be constant. Alternatively, the illumination time of each EL element 15 in each pixel row in each field may be designed to be constant.

FIG. 160 shows a case in which the conduction period of the gate signal line 17*b* (EL-side selection signal line) is 1.5 Hs. The rise and fall of the gate signal line 17*b* at point A are designed to overlap. The gate signal line 17*b* (EL-side selection signal line) and source signal line 18 are coupled. Thus, any change in a waveform of the gate signal line 17*b* (EL-side selection signal line) penetrates to the source signal line 18. Consequently, any potential fluctuation in the source signal line 18 lowers accuracy of current (voltage) programming, causing irregularities in the characteristics of the driver transistors 11*a* to appear in the display.

Referring to FIG. 160, at point A, the voltage applied to the gate signal line 17B (EL-side selection signal line) (1) changes from turn-on voltage (Vgl) to turn-off voltage (Vgh). The voltage applied to the gate signal line 17B (EL-side selection signal line) (2) changes from turn-off voltage (Vgh) to turn-on voltage (Vgl). Thus, at point A, the signal waveform of the gate signal line 17B (EL-side selection signal line) (1) and the signal waveform of the gate signal line 17B (EL-side selection signal line) (2) cancel out each other. Consequently, even if the gate signal line 17B (EL-side selection signal line) and source signal line 18 are coupled, changes in the waveform of the gate signal line 17*b* (EL-side selection signal line) do not penetrate to the source signal line 18. This improves the accuracy of current (voltage) programming, resulting in a uniform image display.

Incidentally, in the example in FIG. 160, the conduction period is 1.5 Hs. However, the present invention is not limited to this. Needless to say, the duration of application of the turn-on voltage may be 1 H or less as illustrated in FIG. 162.

By adjusting the duration of application of the turn-on voltage to the gate signal line 17B (EL-side selection signal line), it is possible to adjust the brightness of the display screen 50 linearly. This can be done easily through control of the OEV2 circuit. Referring to FIG. 163, for example, display brightness in FIG. 163(*b*) is lower than in FIG. 163(*a*). Also, display brightness in FIG. 163(*c*) is lower than in FIG. 163(*b*).

As shown in FIG. 164, multiple sets of turn-on voltage and turn-off voltage may be applied in a period of 1 H. FIG. 164(*a*) shows an example in which six sets are applied. FIG. 164(*b*) shows an example in which three sets are applied. FIG. 164(*c*) shows an example in which one set is applied. In FIG. 164, display brightness is lower in FIG. 164(*b*) than in FIG. 164(*a*). It is lower in FIG. 164(*c*) than in FIG. 164(*b*). Thus, by controlling the number of conduction periods, display brightness can be adjusted (controlled) easily.

Figure 98:
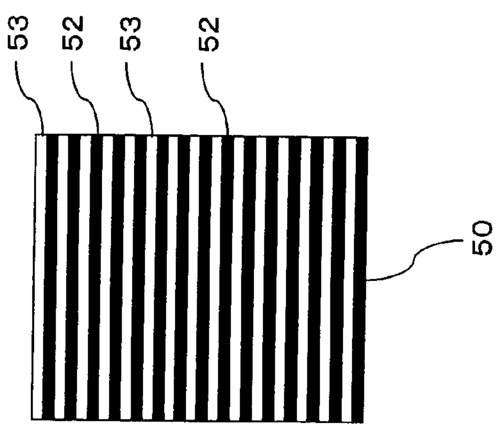
FIG. 98 is an explanatory diagram illustrating a drive method of a display panel according to the present invention.
Figure 98:
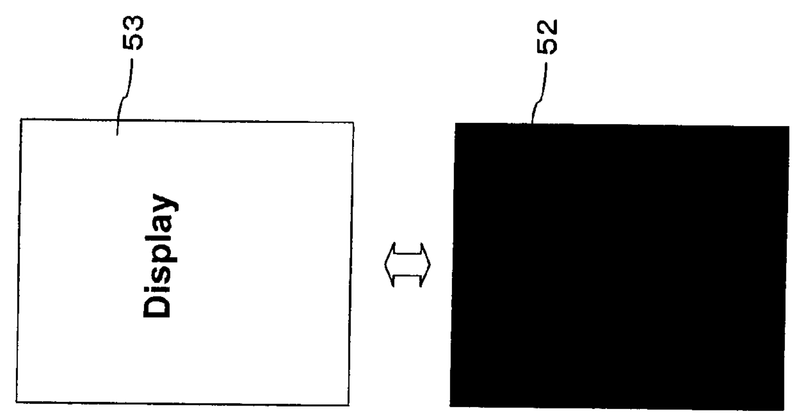
Figure 98:
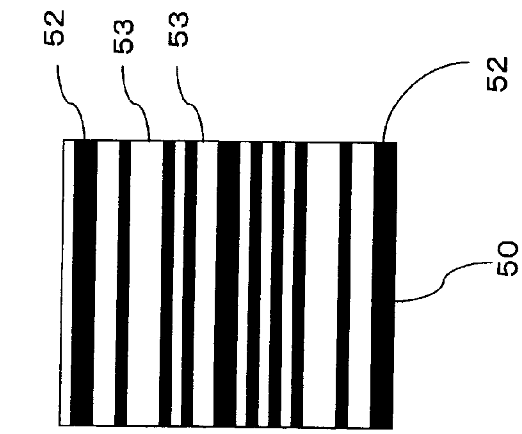

Also, it is possible to allow selection from different drive modes: a drive mode for controlling non-display areas 52 and display areas 53 regularly as illustrated in FIG. 98(*a*), a drive mode for controlling non-display areas 52 and display areas 53 randomly as illustrated in FIG. 98(*c*), and a drive mode for repeating a non-display area 52 and display area 53 every other frame (field) as illustrated in FIG. 98(*b*). It is also possible to switch among modes in FIGS. 98(*a*), 98(*b*), and 98(*c*) under user control or according to image data.

FIG. 184 is a block diagram showing a current-driven source driver IC (circuit) 14 according to one example of the present invention. FIG. 184 shows a multi-stage current mirror circuit comprising three-stage current sources (1841, 1842, 1843).

In FIG. 184, the current value of the current source 1841 in the first stage is copied by the current mirror circuit to N current sources 1842 in the second stage (where N is an arbitrary integer). The current values of the second-stage current sources 1842 are copied by the current mirror circuit to M current sources 1843 in the third stage (where M is an arbitrary integer). Consequently, this configuration causes the current value of the first-stage current source 1841 to be copied to N×M third-stage current sources 1843.

For example, when driving the source signal lines 18 with one source driver IC 14, there are 176 outputs (because the source signal lines require a total of 176 outputs for R, G, and B). Here it is assumed that N=16 and M=11. Thus, 16×11=176 and the 176 outputs can be covered. In this way, by using a multiple of 8 or 16 for N or M, it becomes easier to lay out and design the current sources of the driver IC.

The current-driven source driver IC (circuit) 14 employing the multi-stage current mirror circuit according to the present invention can absorb variations in transistor characteristics because it has the second-stage current sources 1842 in between instead of copying the current value of the first-stage current source 1841 directly to N×M third-stage current sources 1843 using the current mirror circuit.

In particular, the present invention is characterized in that a first-stage current mirror circuit (current source 1841) and second-stage current mirror circuits (current sources 1842) are placed close to each other. If a first-stage current source 1841 are connected with third-stage current sources 1843 (i.e., in the case of two-stage current mirror circuit), the second-stage current sources 1843 connected to the first-stage current source are large in number, making it impossible to place the first-stage current source 1841 and third-stage current sources 1843 close to each other.

The source driver circuit 14 according to the present invention copies the current value of the first-stage current mirror circuit (current source 1841) to the second-stage current mirror circuits (current sources 1842), and the current values of the second-stage current mirror circuits (current sources 1842) to the third-stage current mirror circuits (current sources 1842). With this configuration, the second-stage current mirror circuits (current sources 1842) connected to the first-stage current mirror circuit (current source 1841) are small in number. Thus, the first-stage current mirror circuit (current source 1841) and second-stage current mirror circuits (current sources 1842) can be placed close to each other.

If transistors composing the current mirror circuits can be placed close to each other, naturally variations in the transistors are reduced, and so are variations in current values. The number of the third-stage current mirror circuits (current sources 1843) connected to the second-stage current mirror circuits (current sources 1842) are reduced as well. Consequently, the second-stage current mirror circuits (current sources 1842) and third-stage current mirror circuits (current sources 1843) can be placed close to each other.

That is, transistors in current receiving parts of the first-stage current mirror circuit (current source 1841), second-stage current mirror circuits (current sources 1842), and third-stage current mirror circuits (current sources 1843) can be placed close to each other on the whole. In this way, transistors composing the current mirror circuits can be placed close to each other, reducing variations in the transistors and greatly reducing variations in current signals from output terminals (high precision).

In the present invention, the terms "current sources 1841, 1842, and 1843" and "current mirror circuits" are used interchangeably. That is, current sources are a basic construct of the present invention and the current sources are embodied into current mirror circuits.

FIG. 185 is a structural drawing of a more concrete source driver IC (circuit) 14. It illustrates part of third current sources 1843. This is an output part connected to one source signal line 18. It is composed of multiple current mirror circuits (unit transistors 484 (1 unit)) of the same size as a current mirror configuration in the final stage. Their number is bit-weighted according to the data size of image data.

Incidentally, the transistors composing the source driver IC (circuit) 14 according to the present invention are not limited to a MOS type and may be a bipolar type. Also, they are not limited to silicon semiconductors and may be gallium arsenide semiconductors. Also, they may be germanium semiconductors. Alternatively, they may be formed directly on a substrate using low-temperature polysilicon technology, other polysilicon technology, or amorphous silicon technology.

FIG. 185 illustrates an example of the present invention which handles 6-bit digital input. Six bits are the sixth power of two, and thus provide a 64-gradation display. This source driver IC 14, when mounted on an array board, provides 64 gradations each of red (R), green (G), and blue (B), meaning 64×64×64=approximately 260,000 colors.

Sixty-four (64) gradations require 1 D0-bit unit transistor 1854, two D1-bit unit transistors 1854, four D2-bit unit transistors 1854, eight D3-bit unit transistors 1854, sixteen D4-bit unit transistors 1854, and thirty-two D5-bit unit transistors 1854 for a total of 63 unit transistors 1854. Thus, the present invention produces one output using as many unit transistors 1854 as the number of gradations (64 gradations in this example) minus 1. Incidentally, even if one unit transistor is divided into a plurality of sub-unit transistors, this simply means that a unit transistor is divided into sub-unit transistors, and makes no difference in the fact that the present invention uses as many unit transistors as the number of gradations minus 1.

In FIG. 185, D0 represents LSB input and D5 represents MSB input. When a D0 input terminal is high (positive logic), a switch 1851*a* is closed (the switch 1851*a* is an on/off means and may be constructed of a single transistor or may be an analog switch consisting of a P-channel transistor and N-channel transistor. Then, current flows to a current source (single-unit) 1854 composing a current mirror. The current flows through internal wiring 1853 in the IC 14. Since the internal wiring 1853 is connected to the source signal line 18 via a terminal electrode of the IC 14, the current flowing through internal wiring 1853 provides a programming current for the pixels 16.

For example, when a D1 input terminal is high (positive logic), a switch 1851*b* is closed. Then, current flows to two current sources (single-unit) 1854 composing a current mirror. The current flows through the internal wiring 1853 in the IC 14. Since the internal wiring 1853 is connected to the source signal line 18 via a terminal electrode of the IC 14, the current flowing through internal wiring 1853 provides a programming current for the pixels 16.

The same applies to the other switches 1851. When a D2 input terminal is high (positive logic), a switch 1851*c* is closed. Then, current flows to four current sources (single-unit) 1854 composing a current mirror. When a D5 input terminal is high (positive logic), a switch 1851*f* is closed. Then, current flows to 32 (thirty-two) current sources (single-unit) 1854 composing a current mirror.

In this way, based on external data (D0 to D5), current flows to the corresponding current sources (single-unit). That is, current flows to 0 to 63 current sources (single-unit) depending on the data.

Incidentally, for ease of explanation, it is assumed that there are 63 current sources for a 6-bit configuration, but this is not restrictive. In the case of 8-bit configuration, 255 unit transistors 1854 can be formed (placed). For a 4-bit configuration, 15 unit transistors 1854 can be formed (placed). The transistors 1854 constituting the unit current sources have a channel width W and channel length L. The use of equal transistors makes it possible to construct output stages with small variations.

Besides, not all the unit transistors 1854 need to pass equal current. For example, individual unit transistors 1854 may be weighted. For example a current output circuit may be constructed using a mixture of single-unit unit transistors 1854, double-sized unit transistors 1854, quadruple-sized unit transistors 1854, etc. However, if unit transistors 1854 are weighted, the weighted current sources may not provide the right proportions, resulting in variations. Thus, even when using weighting, it is preferable to construct each current source from transistors each of which corresponds to a single-unit current source.

The unit transistor 1854 should be equal to or larger than a certain size. The smaller the transistor size, the larger the variations in output current. The size of a transistor 1854 is given by the channel length L multiplied by the channel width W. For example, if W=3 μm and L=4 μm, the size of the unit transistor 1854 constituting a unit current source is W×L=12 square μm. It is believed that crystal boundary conditions of silicon wafers have something to do with the fact that a smaller transistor size results in larger variations. Thus, variations in output current of transistors are small when each transistor is formed across a plurality of crystal boundaries.

Preferably, the unit transistor 1854 is an n-channel transistor. P-channel unit transistors have 1.5 times as large variations in output current as n-channel unit transistors.

Since it is preferable that the unit transistors 1854 of the source driver IC 14 are n-channel transistors, the source driver IC 14 draws programming current from the pixels 16. Thus, the driver transistors 11*a* of the pixels 16 are p-channel transistors. The switching transistor 11*d* in FIG. 1 is also a p-channel transistor.

Thus, the configuration in which the unit transistor 1854 in the output stage of the source driver IC (circuit) 14 is an n-channel transistor and the driver transistor 11*a* of the pixel 16 is a p-channel transistor is characteristic of the present invention. Incidentally, it is preferable that all the transistors 11 (transistors 11*a*, 11*b*, 11*c*, and 11*d*) composing the pixel 16 are p-channel transistors. Since this can eliminate the process of forming n-channel transistors, it is possible to achieve low costs and high yields.

Incidentally, although it has been stated that the unit transistor 1854 is formed in the IC 14, this is not restrictive. The source driver circuit 14 may be formed by low-temperature polysilicon technology. In that case again, it is preferable that the unit transistors 1854 in the source driver circuit 14 are n-channel transistors.

P-channel transistors are used as the transistors 11 of pixels 16 and for the gate driver circuits 12. This makes it possible to reduce the cost of the board 71. However, in the source driver circuit 14, the unit transistors 1854 must be n-channel transistors. Thus, the source driver circuit 14 cannot be formed directly on a board 71. Thus, the source driver circuit 14 is made of a silicon chip and the like separately and mounted on the board 71. In short, the present invention is configured to mount the source driver IC 14 (means of outputting programming current as video signals) externally.

If the gate driver circuits 12 are constructed from p-channel transistors, it becomes easy to hold (maintain) the turn-off voltage (Vgh). As the driver transistors 11*a*, 11*b*, and 11*c* of the pixels 16 can be held readily at the turn-off potential, the gate driver circuits 12 match well, and achieve synergy, with the pixel configuration according to the present invention consisting of p-channel transistors.

Incidentally, although it has been stated that the source driver circuit 14 is made of a silicon chip, this is not restrictive. For example, a large number of source driver circuits may be formed on a glass substrate simultaneously using low-temperature polysilicon technology or the like, cut off into chips, and mounted on a board 71. Incidentally, although it has been stated that a source driver circuit is mounted on a board 71, this is not restrictive. Any form may be adopted as long as the output terminals of the source driver circuit 14 are connected to the source signal lines 18 on the board 71. For example, the source driver circuit 14 may be connected to the source signal lines 18 using TAB technology. By forming a source driver circuit 14 on a silicon chip separately, it is possible to reduce variations in output current and achieve proper image display as well as to reduce costs.

The configuration in which p-channel transistors are used as selection transistors of pixels 16 and for gate driver circuits is not limited to organic EL or other self-luminous devices (display panels or display apparatus). For example, it is also applicable to liquid crystal display devices and FEDs (field emission displays).

If the switching transistors 11*b* and 11*c* of a pixel 16 are p-channel transistors, the pixel 16 becomes selected at Vgh, and becomes deselected at Vgl. As described earlier, when the gate signal line 17*a* changes from on (Vgl) to off (Vgh), voltage penetrates (penetration voltage). If the driver transistor 11*a* of the pixel 16 is a p-channel transistor, the penetration voltage more tightly restricts the flow of current through the transistor 11*a* in black display mode. This makes it possible to achieve a proper black display. The problem with the current-driven system is that it is difficult to achieve a black display.

According to the present invention, if p-channel transistors are used for the gate driver circuits 12, the turn-on voltage corresponds to Vgh. Thus, the gate driver circuits 12 match well with the pixels 16 constructed from p-channel transistors. Also, to improve black display, it is important that the programming current Iw flows from the anode voltage Vdd to the unit transistors 1854 of the source driver circuit 14 via the driver transistors 11*a* and source signal lines 18, as is the case with the pixel 16 configuration shown in FIGS. 1 and 2. Thus, a good synergistic effect can be produced if p-channel transistors are used for the gate driver circuits 12 and pixels 16, the source driver circuit 14 is mounted on the substrate, and n-channel transistors are used as the unit transistors 1854 of the source driver circuit 14. Besides, unit transistors 1854 formed of n-channel transistors have smaller variations in output current than unit transistors 1854 formed of p-channel transistors. N-channel unit transistors 1854 have 1/1.5 to ½ as large variations in output current as p-channel unit transistors 1854 when they have the same area (W·L). For this reason, it is preferable that n-channel transistors are used as the unit transistors 1854 of the source driver IC 14.

FIG. 186 is an exemplary circuit diagram showing 176 outputs (N×M=176) of a three-stage current mirror circuit. In FIG. 186, the current source 1841 constituted of the first-stage current mirror circuit is referred to as a parent current source, the current sources 1842 constituted of the second-stage current mirror circuits are referred to as child current sources, and the current sources 1843 constituted of the third-stage current mirror circuits are referred to as grandchild current sources. The use of an integral multiple for the third-stage current mirror circuits which are the final-stage current mirror circuits makes it possible to minimize variations in the 176 outputs and produce high-accuracy current outputs.

Incidentally, dense placement means placing the first current source 1841 and the second current sources 1842 (the current or voltage output and current or voltage input) at least within a distance of 8 mm. More preferably, they are placed within 5 mm. It has been shown analytically that when placed at this density, the current sources can fit into a silicon chip with little difference in transistor characteristics (Vt and mobility (i)). Similarly, the second current sources 1842 and third current sources 1843 (the current output and current input) are placed at least within a distance of 8 mm. More preferably, they are placed within 5 mm. Needless to say, the above items also apply to other examples of the present invention.

The current or voltage output and current or voltage input mean the following relationships. In the case of voltage-based delivery shown in FIG. 187, the transistor 1841 (the output) of the (I)-th current source and the transistor 1842*a* (the input) of the (I+1)-th current source are placed close to each other. In the case of current-based delivery shown in FIG. 188, the transistor 1841*a* (the output) of the (I)-th current source and the transistor 1842*b* (the input) of the (I+1)-th current source are placed close to each other.

Incidentally, although it is assumed in FIGS. 186, 187, etc. that there is one transistor 1841, this is not restrictive. For example, it is also possible to form a plurality of small sub-transistors 1841 and connect the source or drain terminals of the sub-transistors with the register 491 to form a unit transistor 1854. By connecting the plurality of small sub-transistors in parallel, it is possible to reduce variations of the unit transistor 1854.

Similarly, although it is assumed that there is one transistor 1842*a*, this is not restrictive. For example, it is also possible to form a plurality of small sub-transistors 1842*a* and connect the gate terminals of the transistors 1842*a* with the gate terminal of the transistor 1841. By connecting the plurality of small transistors 1842*a* in parallel, it is possible to reduce variations of the transistor 1842*a*.

Thus, according to the present invention, the following configurations can be illustrated: a configuration in which one transistor 1841 is connected with a plurality of transistors 1842*a*, a configuration in which a plurality of transistors 1841 are connected with one transistor 1842*a*, and a configuration in which a plurality of transistors 1841 are connected with a plurality of transistors 1842*a*. These examples will be described in more detail below.

The above items also apply to a configuration of transistors 1843*a* and 1843*b* in FIG. 189. Possible configurations include a configuration in which one transistor 1843*a* is connected with a plurality of transistors 1843*b*, a configuration in which a plurality of transistors 1843*a* are connected with one transistor 1843*b*, and a configuration in which a plurality of transistors 1843*a* are connected with a plurality of transistors 1843*b*. By connecting the plurality of small transistors 1843 in parallel, it is possible to reduce variations of the transistor 1843.

The above items also apply to relationship between transistors 1842*a* and 1842*b* in FIG. 189. Also, preferably a plurality of transistors 1843*b* are used in FIG. 185.

Although it has been stated that the source driver IC 14 consists of a silicon chip, this is not restrictive. The source driver IC 14 may be constructed of another semiconductor chip formed on a gallium substrate or germanium substrate. Also, the unit transistor 1854 may be a bipolar transistor, CMOS transistor, FET, Bi-CMOS transistor, or DMOS transistor. However, in terms of reducing variations in the output of the unit transistor 1854, preferably a CMOS transistor is used for the unit transistor 1854.

Preferably, the unit transistor 1854 is an N-channel transistor. The unit transistor consisting of a P-channel transistor has 1.5 times larger output variations than the unit transistor consisting of an N-channel transistor.

Since it is preferable that the unit transistor 1854 of the source driver IC 14 is an N-channel transistor, the programming current of the source driver IC 14 is a current drawn from the pixel 16. Thus, the driver transistor 11*a* of the pixel 16 is a P-channel transistor. The switching transistor 11*d* in FIG. 1 is also a P-channel transistor. 0657-*d*

Thus, the configuration in which the unit transistor 1854 in the output stage of the source driver IC (circuit) 14 is an N-channel transistor and the driver transistor 11*a* of the pixel 16 is a P-channel transistor is characteristic of the present invention. Incidentally, it is preferable that all the transistors (transistors 11*a*, 11*b*, 11*c*, and 11*d*) composing the pixel 16 are P-channel transistors. This eliminates the process of forming N-channel transistors, resulting in low costs and high yields.

Incidentally, although it has been stated that the unit transistor 1854 is formed in the IC 14, this is not restrictive. The source driver circuit 14 may be formed by low-temperature polysilicon technology. In that case again, it is preferable that the unit transistors 1854 in the source driver circuit 14 are N-channel transistors.

FIG. 188 shows an example of configuration for current-based delivery. FIG. 187 also shows an example of configuration for current-based delivery. FIGS. 187 and 188 are similar in terms of circuit diagrams and differ in layout configuration, i.e., wiring layout. In FIG. 187, reference numeral 1841 denotes a first-stage n-channel current source transistor, 1842*a* denotes a second-stage n-channel current source transistor, and 1842*b* denotes a second-stage p-channel current source transistor.

In FIG. 188, reference numeral 1841*a* denotes a first-stage N-channel current source transistor, 1842*a* denotes a second-stage N-channel current source transistor, and 1842*b* denotes a second-stage P-channel current source transistor.

In FIG. 187, the gate voltage of the first-stage current source consisting of a variable register 491 (used to vary current) and the N-channel transistor 1841 is delivered to the gate of the N-channel transistor 1842*a* of the second-stage current source. Thus, this is a layout configuration of a voltage-based delivery type.

In FIG. 188, the gate voltage of the first-stage current source consisting of a variable register 491 and the N-channel transistor 1841*a* is applied to the gate of the N-channel transistor 1842*a* of the adjacent second-stage current source, and consequently the value of the current flowing through the transistor is delivered to the P-channel transistor 1842*b* of the second-stage current source. Thus, this is a layout configuration of a current-based delivery type.

Incidentally, although this example of the present invention focuses on relationship between the first current source and second current source for ease of explanation or understanding, this is not restrictive and it goes without saying that this example also applies (can be applied) to relationship between the second current source and third current source as well as relationship between other current sources.

In the layout configuration of the current mirror circuit of the voltage-based delivery type shown in FIG. 187, the N-channel transistor 1841 of the first-stage current source and the N-channel transistor 1842*a* of the second-stage current source composing the current mirror circuit are separated (or liable to get separated, to be precise), and thus the two transistors tend to differ in characteristics. Consequently, the current value of the first-stage current source is not transmitted correctly to the second-stage current source and there can be variations.

In contrast, in the layout configuration of the current mirror circuit of the current-based delivery type shown in FIG. 188, the N-channel transistor 1841*a* of the first-stage current source and the N-channel transistor 1842*a* of the second-stage current source composing the current mirror circuit are located adjacent to each other (easy to place adjacent to each other), and thus the two transistors hardly differ in characteristics. Consequently, the current value of the first-stage current source is transmitted correctly to the second-stage current source and there can be little variations.

In view of the above circumstances, it is preferable to use a layout configuration of the current-based delivery type instead of the voltage-based delivery type for the circuit configuration of the multi-stage current mirror circuit according to the present invention (the source driver IC (circuit) 14 of the current-based delivery type according to the present invention) in terms of reduced variations. Needless to say the above example can be applied to other examples of the present invention.

Incidentally, although delivery from the first-stage current source to the second-stage current source has been cited for the sake of explanation, the same applies to delivery from the second-stage current source to the third-stage current source, delivery from the third-stage current source to the fourth-stage current source, and so on. Also, it goes without saying that the present invention may adopt a single-stage current source configuration.

FIG. 189 shows a current-based delivery version of three-stage current mirror circuit (three-stage current source) shown in FIG. 186 (which, therefore shows a circuit configuration of a voltage-based delivery type).

In FIG. 189, a reference current is created first by the variable register 491 and N-channel transistor 1841. Incidentally, although it is stated that the reference current is adjusted by the variable register 491, actually the source voltage of the transistor 1841 is set and regulated by an electronic regulator formed (or placed) in the source driver IC (circuit) 14. Alternatively, the reference current is adjusted by directly supplying the source terminal of the transistor 1841 with current outputted from a current-type electronic regulator consisting of a large number of unit transistors (single-unit) 1854 as shown in FIG. 185.

The gate voltage of the first-stage current source constituted of the transistor 1841 is applied to the gate of the N-channel transistor 1842*a* of the adjacent second-stage current source, and the current consequently flowing through the transistor is delivered to the P-channel transistor 1842*b* of the second-stage current source. Also, the gate voltage of the P-channel transistor 1842*b* of the second-stage current source is applied to the gate of the N-channel transistor 1843*a* of the adjacent third-stage current source, and the current consequently flowing through the transistor is delivered to the N-channel transistor 1843*b* of the third-stage current source. A large number of N-channel unit transistors 1854 are formed (placed) at the gate of the N-channel transistor 1843*b* of the third-stage current source according to the required bit count as illustrated in FIG. 185.

The display panel according to the present invention will be described below. In the display panel according to the present invention, pixels and the gate driver circuits 12 are formed using polysilicon technology. The source driver circuit 14 is constructed from an IC chip fabricated from a silicon wafer. Thus, the source driver circuit 14 is a source driver IC. The source driver IC 14 is mounted on the array board 71 using COG technology. Thus, there is a space under the source driver IC 14. Anode wiring is formed in this space (on a surface of the array board).

Figure 83:
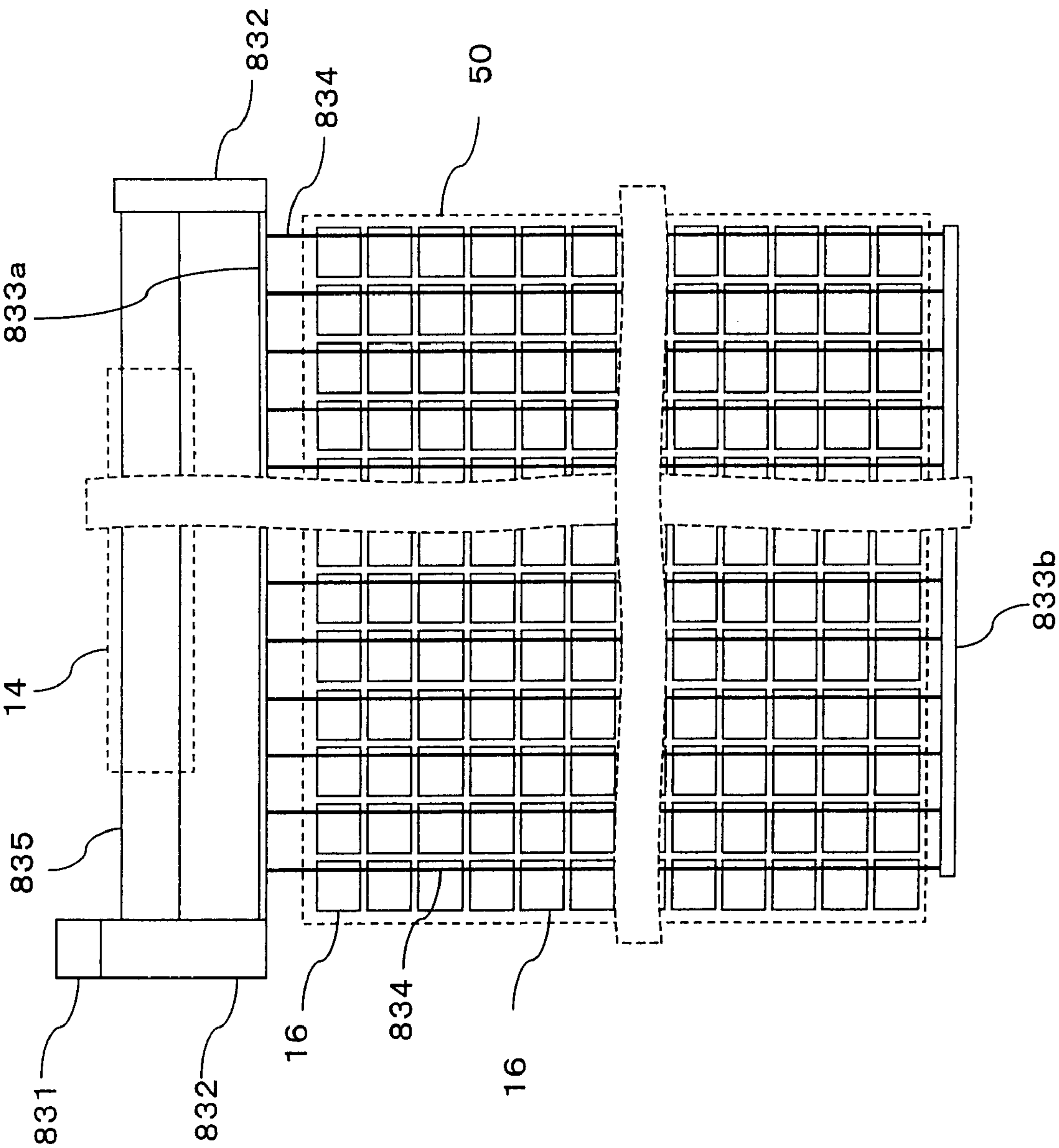
FIG. 83 is an explanatory diagram illustrating a display panel according to the present invention.

As illustrated in FIG. 83, anode lines 832 are wired from an anode connection terminal and the anode lines 832 formed on both sides of the source driver IC are connected electrically by means of an anode coupling line 835 formed under the IC 14.

A common anode line 833 is formed or placed on the output side of the IC 14. Anode wires 834 branch off from the common anode line 833. There are 528 (=176×RGB) anode wires 834 in a QCIF panel. The voltage Vdd (anode voltage) illustrated in FIG. 1 and the like is supplied via the anode wires 834.

A current of up to 200 μA flows through one anode wire 834 if the EL elements 15 are made of low molecular weight-material. Therefore, a current of approximately 100 mA (200 μA×528) flows through the common anode line 833.

To reduce voltage drops in the common anode line 833 to within 0.2 V, it is necessary to reduce the resistance value of the largest current path to 2Ω or less (assuming that a current of 100 mA flows).

The anode coupling line 835 is formed (placed) under the IC chip 14. Needless to say, its line width should be as thick as possible to reduce resistance. Besides, preferably the anode coupling line 835 is provided with a light shielding function. This is intended to prevent malfunctions caused by a photoconductive phenomenon in the source driver IC 14, which in turn would be caused by light emitted by EL elements 15. Needless to say, if the anode coupling line 835 is formed of a metal material to a required film thickness, it will have a light shielding function.

If the anode coupling line 835 cannot be made thick enough or is made of transparent material such as ITO, light-absorbing film or light-reflecting film is stacked in a single or multiple layers under the IC chip 14 and on the anode coupling line 835 (basically, on the surface of the array board 71). The anode coupling line 835 does not need to shield light perfectly. It may have openings. Also, it may have diffraction effect or scattering effect. Also, light-shielding film consisting of multilayer optical interference film may be formed or placed by stacking on the anode coupling line 835.

Of course, a reflector plate (sheet) or light-absorbing plate (sheet) made of a metal foil, plate, or sheet may be placed, inserted or formed in the space between the array board 71 and IC chip 14. Needless to say, it is also possible to place, insert or form a reflector plate (sheet) or light-absorbing plate (sheet) made of a foil, plate or sheet of organic or inorganic material rather than a metal foil. Alternatively, light-absorbing material or light-reflecting material in a gel or liquid state may be inserted or formed in the space between the array board 71 and IC chip 14. Preferably, light-absorbing material or light-reflecting material in the gel or liquid state are solidified by heating or by exposure to light. Incidentally, it is assumed for ease of explanation that the anode coupling line 835 is made of a light-shielding film (light-reflecting film).

The anode coupling line 835 is formed on the surface of the array board 71 (not limited to the surface). The idea of a light-shielding film or light-reflecting film can be satisfied if light does not reach the rear surface of the IC chip 14. Thus, needless to say, the anode coupling line 835 and the like may be formed on an inner surface or inner layer of the array board 71. Alternatively, the anode coupling line 835 (an arrangement or structure which functions as a reflecting film or light-shielding film) may be formed on the rear surface of the array board 71 as long as it can prevent or reduce entrance of light into the IC 14.

Although it has been stated with reference to FIG. 83 and the like that the light-shielding film and the like are formed on the array board 71, this is not restrictive and the light-shielding film and the like may be formed directly on the rear surface of the IC chip 14. In that case, an insulating film (not shown) is formed on the rear surface of the IC chip 14 and the light-shielding film, reflecting film, or the like is formed on the insulating film.

When forming the source driver circuit 14 directly on the array board 71 (driver construction by low-temperature polysilicon technology, high-temperature polysilicon technology, solid-phase growth technology, or amorphous silicon technology), the source driver circuit 14 can be formed (placed) on the light-shielding film, light-absorbing film, or reflecting film which is formed on the array board 71.

A large number of transistor elements, such as current output circuit 1461, which pass minute current are formed on the IC chip 14 (in FIG. 146). When light enters transistor elements which pass minute current, a photoconduction phenomenon and the like occur, making values of output current (programming current Iw), etc. abnormal (causing variations, and the like). In the case of organic EL or other self-luminous elements, in particular, light produced by the EL elements 15 is reflected diffusely within the array board 71, causing intense light to be radiated from places other than the display area 50. The radiated light, upon entering the circuit forming section 1461 of the IC chip 14, causes the photoconduction phenomenon. Thus, measures against the photoconduction phenomenon are measures peculiar to EL display devices.

To deal with this problem, the present invention constructs the anode coupling line 835 on the array board 71 and uses it as a light-shielding film. The formation area of the anode coupling line 835 covers the circuit forming section 1461 as illustrated in FIG. 83. By forming the light-shielding film (anode coupling line 835) in this way, it is possible to prevent the photoconduction phenomenon completely. As the screen is refreshed, current flows through EL power lines such as the anode coupling line 835, in particular, causing some changes to their potential. However, since the potential changes little by little every horizontal scanning period, it can be regarded as ground potential (meaning that there is virtually no change in the potential). Thus, the anode coupling line 835 performs not only a light-shielding function, but also an electric shielding function.

Figure 84:
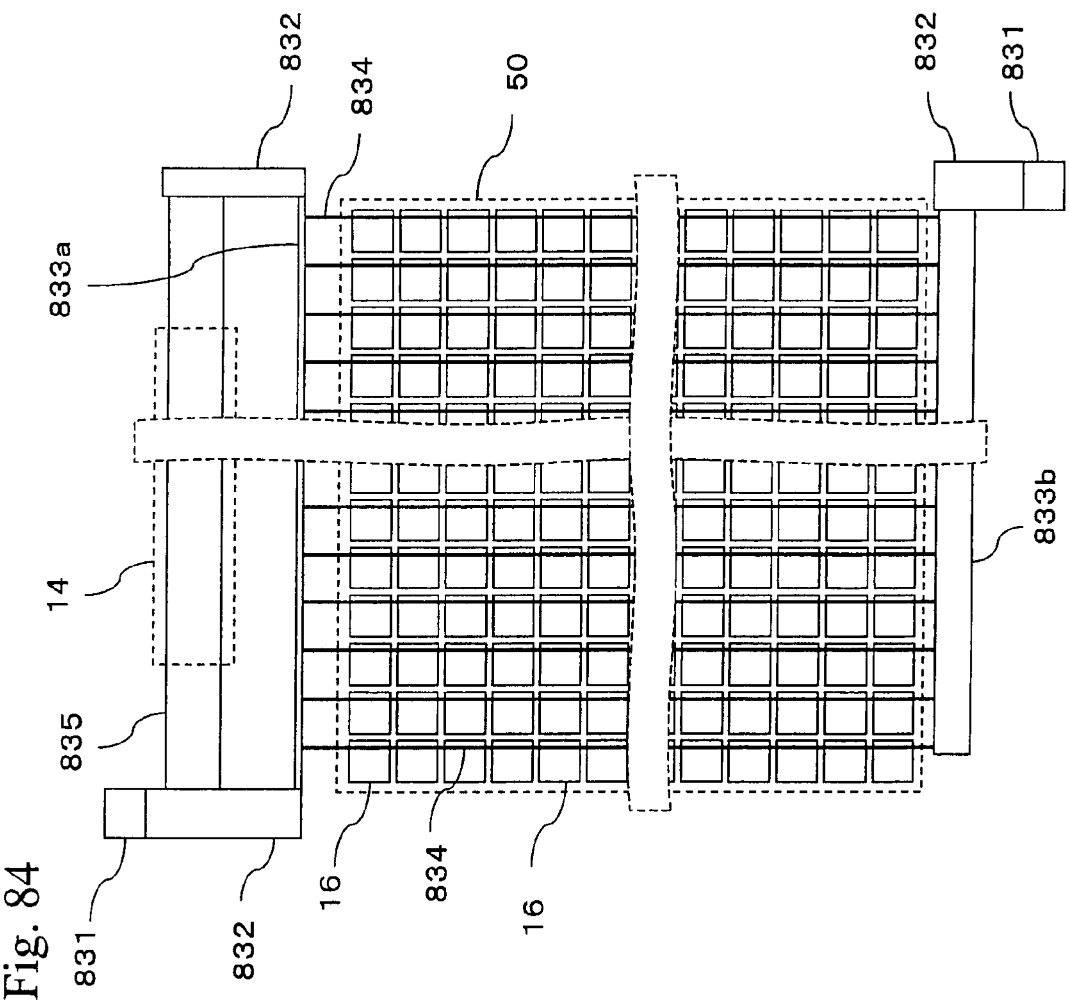
FIG. 84 is an explanatory diagram illustrating a display panel according to the present invention.

To reduce voltage drops in the common anode lines 833 and anode wires 834, it is recommended to form a common anode line 833*a* on the upper side of the display screen 50, form a common anode line 833*b* on the lower side of the display screen 50, and short-circuit the anode wires 834 at the top and bottom, as illustrated in FIG. 84.

Figure 85:
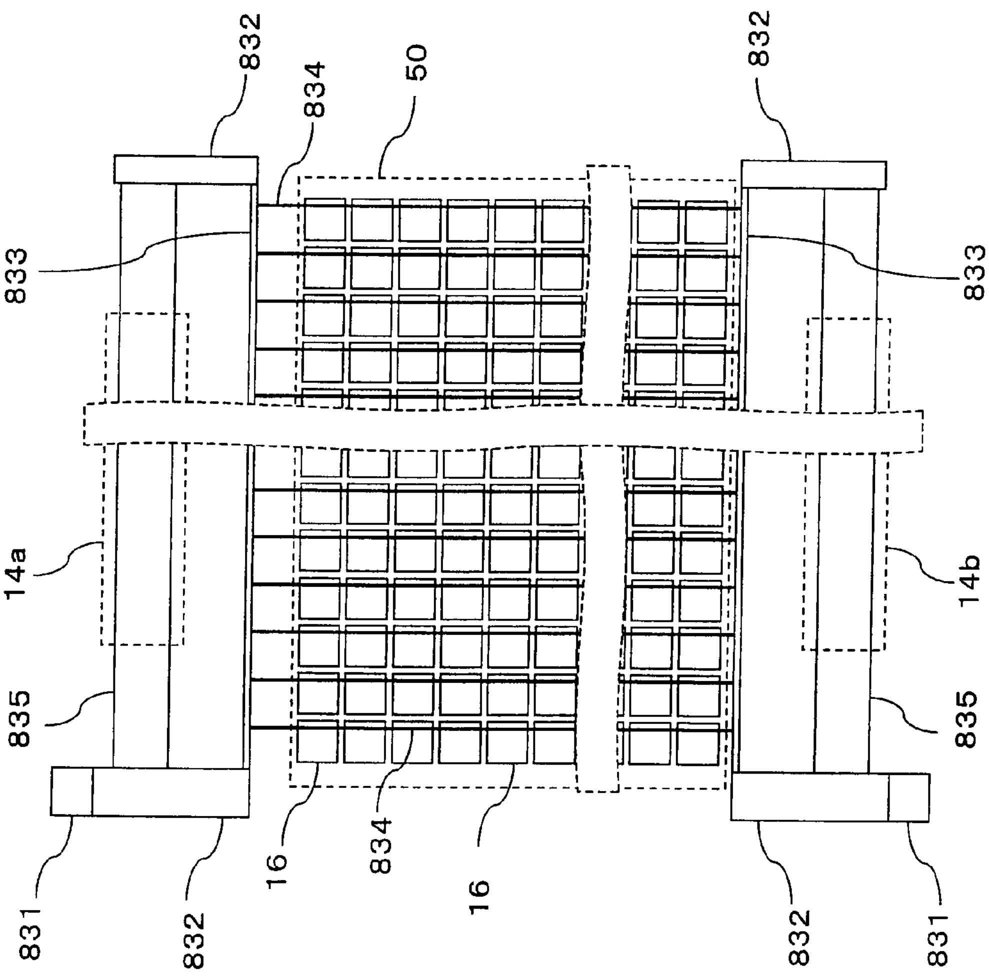
FIG. 85 is an explanatory diagram illustrating a display panel according to the present invention.
Figure 86:
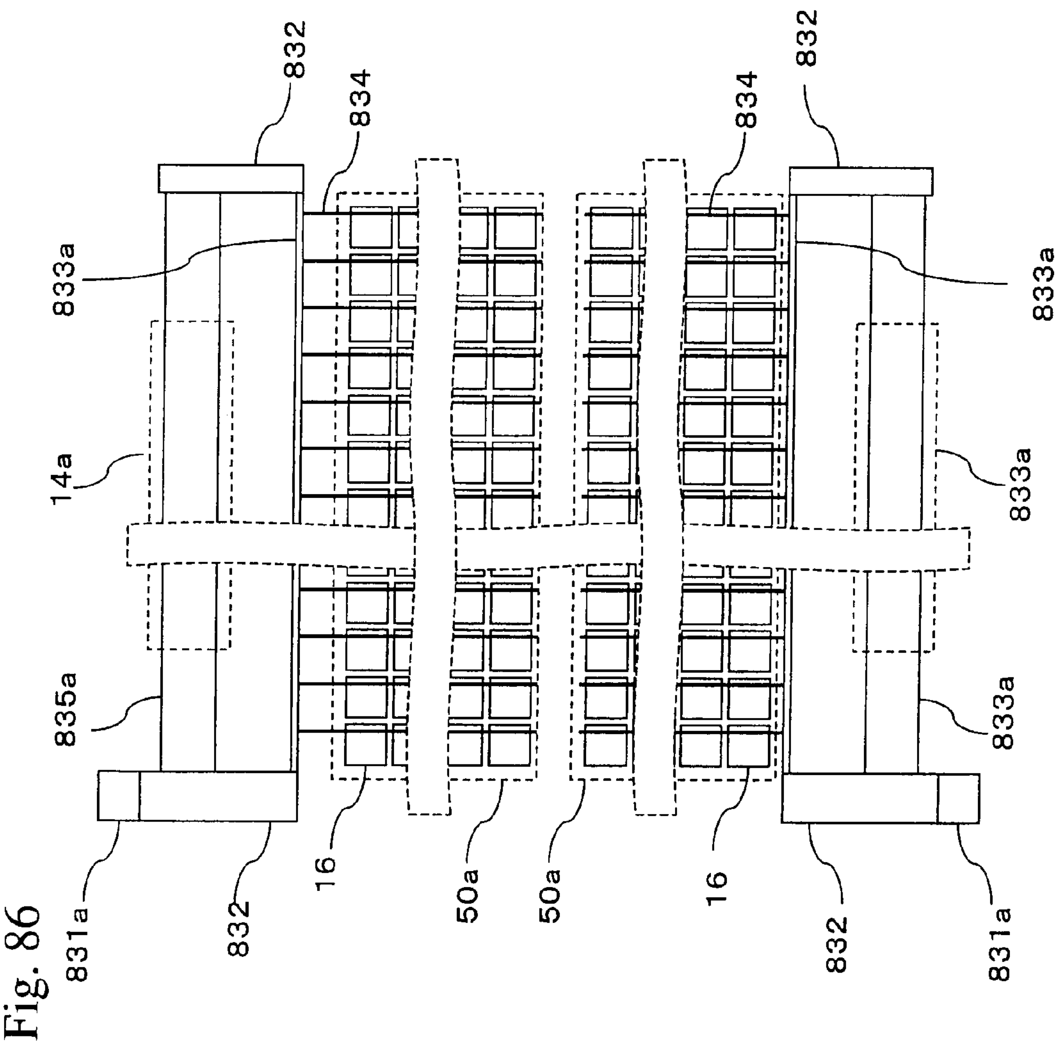
FIG. 86 is an explanatory diagram illustrating a display panel according to the present invention.

It is also preferable to place source driver circuits 14 at the top and bottom of the screen 50 as illustrated in FIG. 85. Also, as illustrated in FIG. 86, it is possible to divide the display screen 50 into a display screen 50*a* and display screen 50*b* and drive the display screen 50*a* with a source driver circuit 14*a*, and the display screen 50*b* with a source driver circuit 14*b*.

In the case of organic EL or other self-luminous elements, light produced by the EL elements 15 is reflected diffusely within the array board 71, causing intense light to be radiated from places other than the display area 50. To prevent or reduce the diffusely reflected light, it is preferable that light-absorbing films 1011 are formed in ineffective areas which do not pass light effective for image display. The light-absorbing films are formed on an outer surface of a sealing lid 85, inner surface of the sealing lid 85, side face of the array board 71, area on the board other than the image display area (light-absorbing film 1011*b*), etc. Incidentally, instead of light-absorbing films, light-absorbing sheets or light-absorbing walls may be installed. Besides, the concept of light absorption also includes schemes or structures which diverge light by scattering it. In a broader sense, it also includes schemes or structures which confine light through reflection.

Possible materials for light-absorbing films include, for example, organic material such as acrylic resin containing carbon, organic resin with a black pigment dispersed in it, and gelatin or casein colored with a black acidic dye as with a color filter. Besides, they also include a fluorine-based pigment which singly develops a black color as well as green and red pigments which develop a black color when mixed. Furthermore, they also include PrMnO3 film formed by sputtering, phthalocyanine film formed by plasma polymerization, etc.

Figure 94:
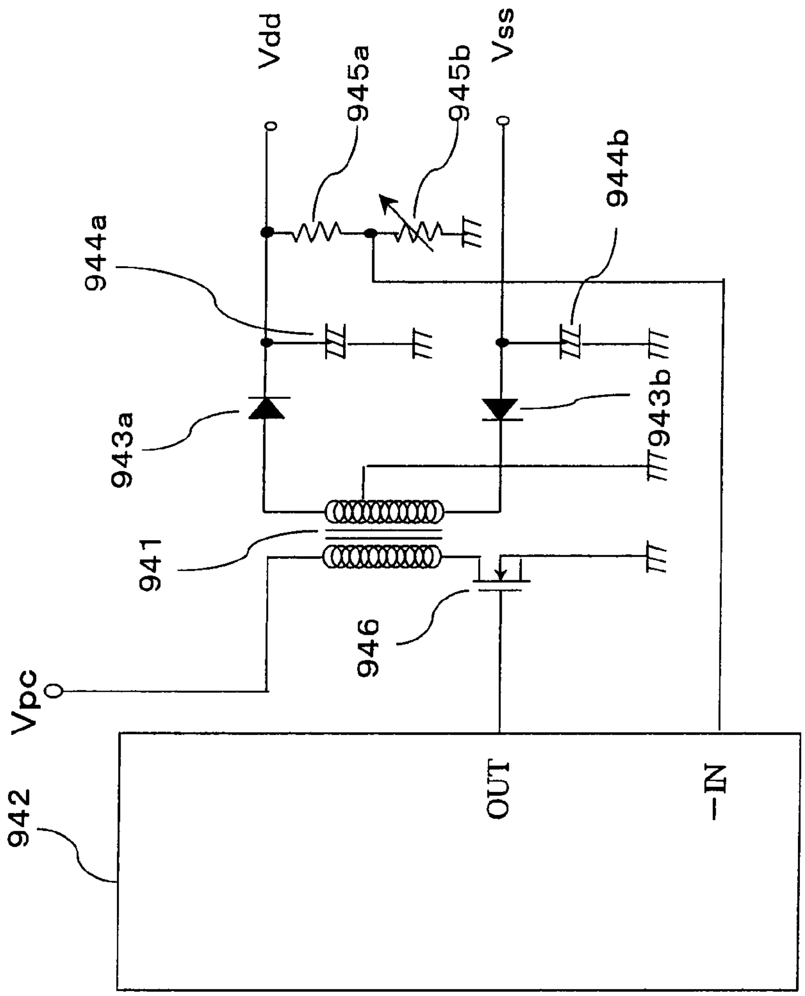
FIG. 94 is an explanatory diagram illustrating a power supply circuit of a display apparatus according to the present invention.

FIG. 94 is a block diagram of the power supply circuit according to the present invention. Reference numeral 942 denotes a control circuit, which controls the midpoint potential of resistances 945*a* and 945*b* and outputs a gate signal of a transistor 946. A power supply Vpc is applied to the primary side of a transformer 941 and primary current is transmitted to the secondary side under on/off control of the transistor 946. Reference numeral 943 denotes a rectifying diode and 944 denotes a smoothing capacitor.

Figure 95:
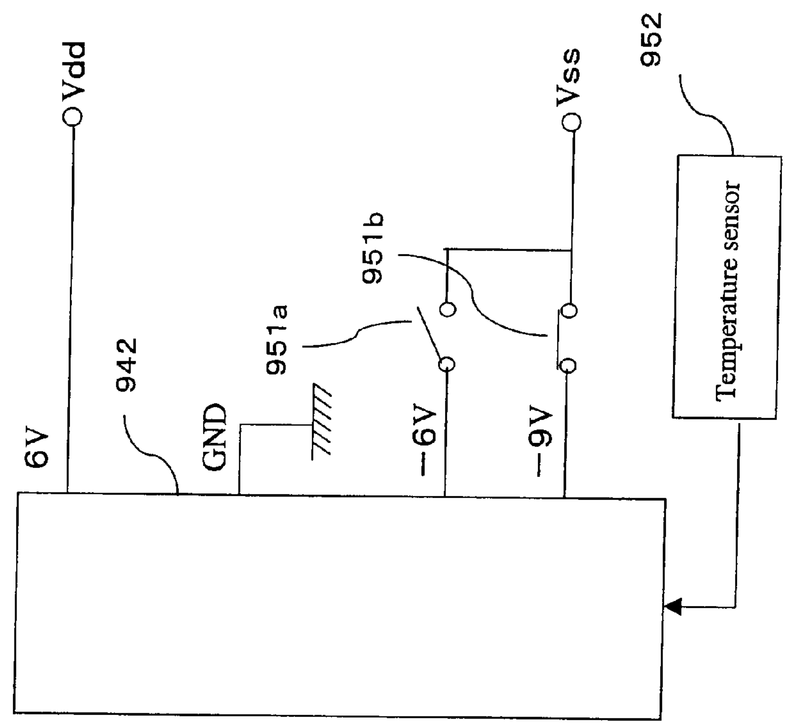
FIG. 95 is an explanatory diagram illustrating a power supply circuit of a display apparatus according to the present invention.

Anode voltage Vdd has its output voltage adjusted to a resistor 945*b*. Vss denotes cathode voltage. One of two voltages can be output selectively as the cathode voltage Vss as illustrated in FIG. 95. A switch 951 is used for the selection. In FIG. 95, −9 (V) is selected by the switch 951.

The switch 951 is operated according to output from a temperature sensor 952. When panel temperature is low, −9 (V) is selected as the voltage Vss. When the panel temperature is equal to or higher than a certain level, −6 (V) is selected. This is because EL elements 15 have temperature dependence and terminal voltage of the EL elements 15 becomes higher on a low temperature side. Incidentally, although it has been stated with reference to FIG. 95 that one of two voltages is selected as Vss (the cathode voltage), this is not restrictive and the voltage Vss may be selected from three voltages. The above items similarly apply to Vdd.

Figure 96:
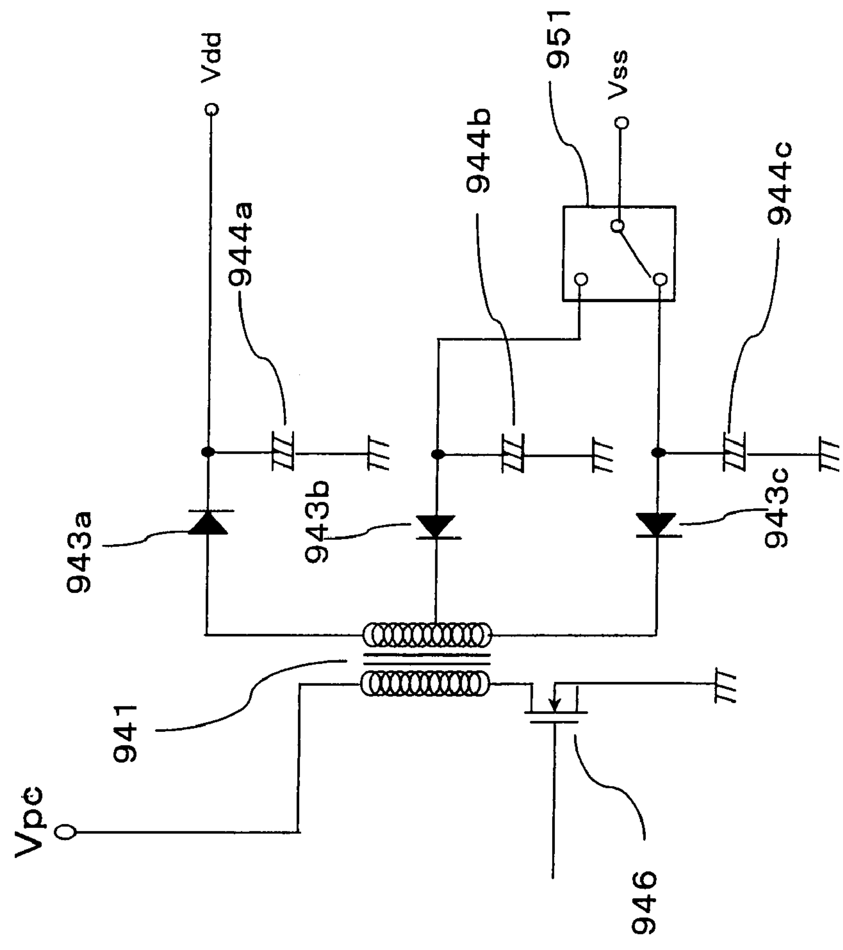
FIG. 96 is an explanatory diagram illustrating a power supply circuit of a display apparatus according to the present invention.

By allowing a voltage to be selected from a plurality of voltages based on panel temperature as shown in FIG. 95, it is possible to reduce power consumption of the panel. This is because the voltage Vss can be lowered when the temperature is equal to or lower than a certain level. Normally, the lower Vss (=−6(V)) can be used. Incidentally, the switch 951 may be configured as illustrated in FIG. 96. A plurality of voltages Vss can be generated easily by using intermediate taps of a transformer 941 in FIG. 96. This similarly applies to the anode voltage Vdd.

Figure 97:
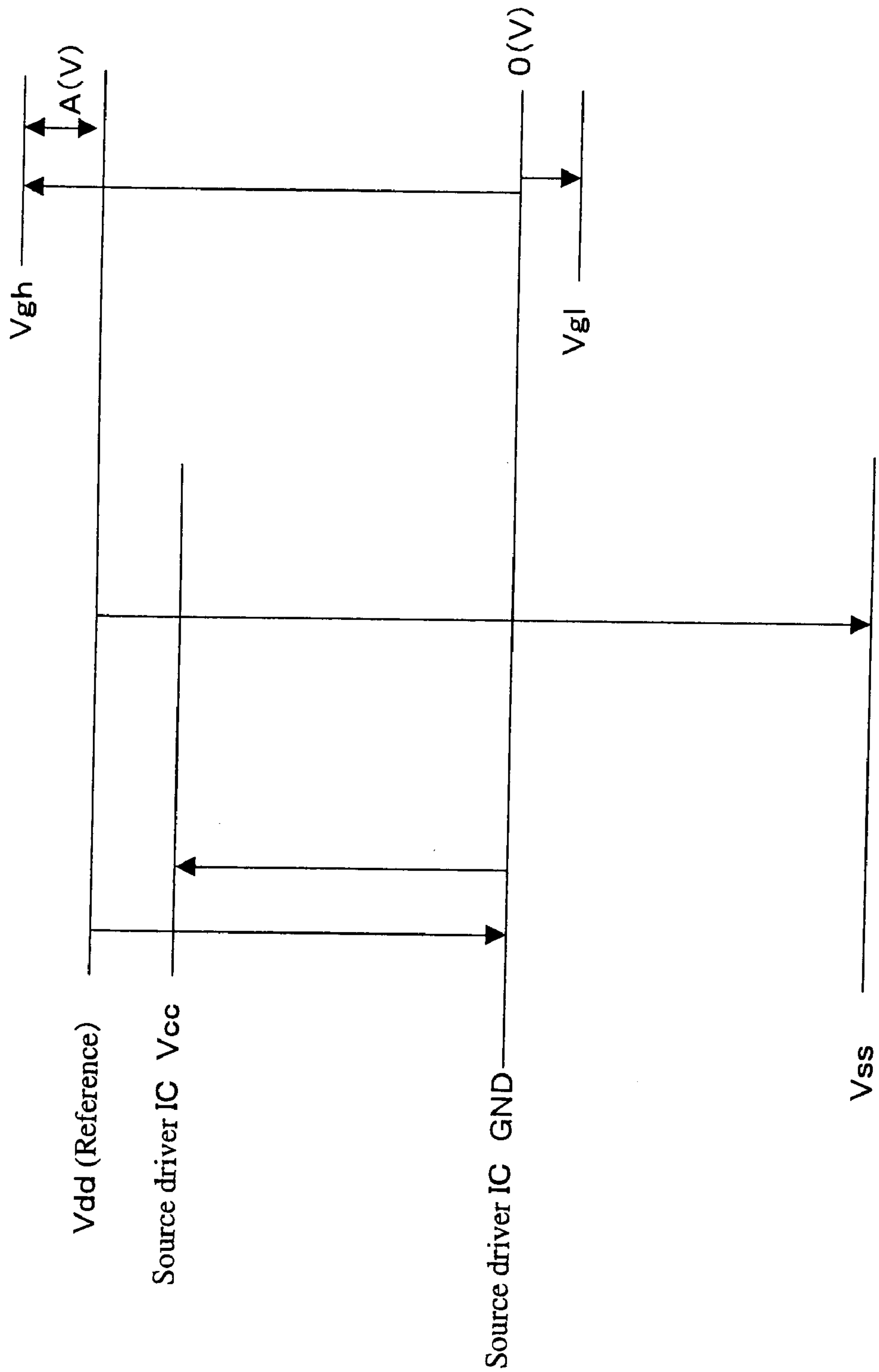
FIG. 97 is an explanatory diagram illustrating a power supply circuit of a display apparatus according to the present invention.

FIG. 97 is an explanatory diagram illustrating potential setting. The source driver IC 14 is based on GND. The power supply for the source driver IC 14 is Vcc. Vcc may be brought to coincide with the anode voltage (Vdd). According to the present invention, Vcc<Vdd from the viewpoint of power consumption.

The turn-off voltage Vgh of the gate driver circuit 12 is set to equal to or higher than the voltage Vdd. Preferably, Vdd+0.5 (V)<Vgh<Vdd+2.5 (V) is satisfied. The turn-on voltage Vgl may be brought to coincide with Vss, but preferably Vss (V)<Vgl<−0.5 (V) is satisfied. The voltage settings above are important when the pixel configuration in FIG. 1 is used.

Figure 99:
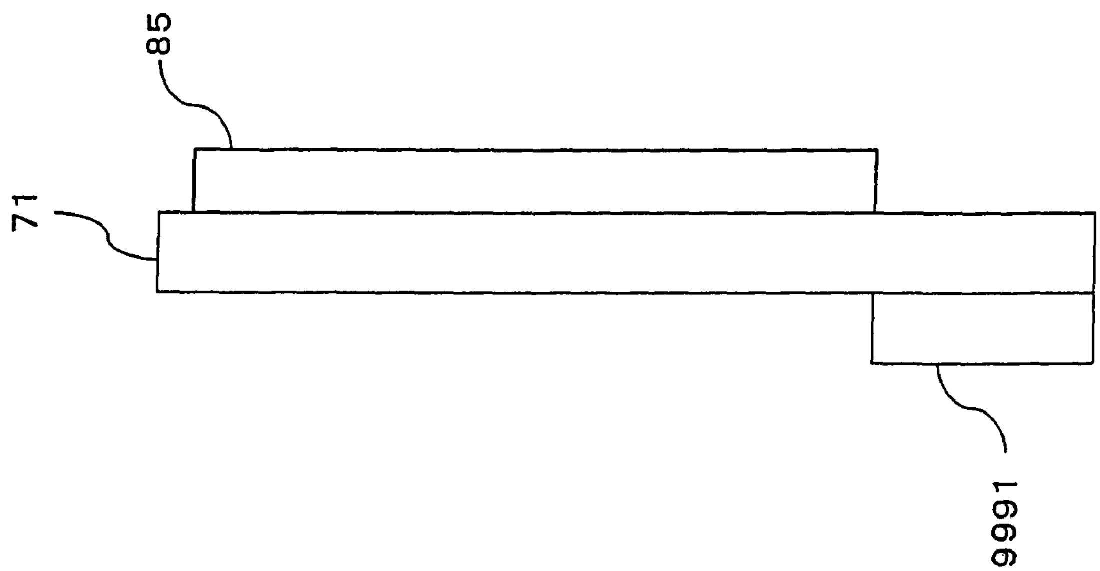
FIG. 99 is a schematic sectional view illustrating a display apparatus according to the present invention.

Although organic EL display apparatus are described herein, the display panels used for the organic EL display apparatus are not limited to organic EL display panels. For example, as illustrated in FIG. 99, a display apparatus may be composed of an organic EL display panel used as a main display panel and a liquid crystal display panel 9991 used as a sub display panel.

Figure 100:
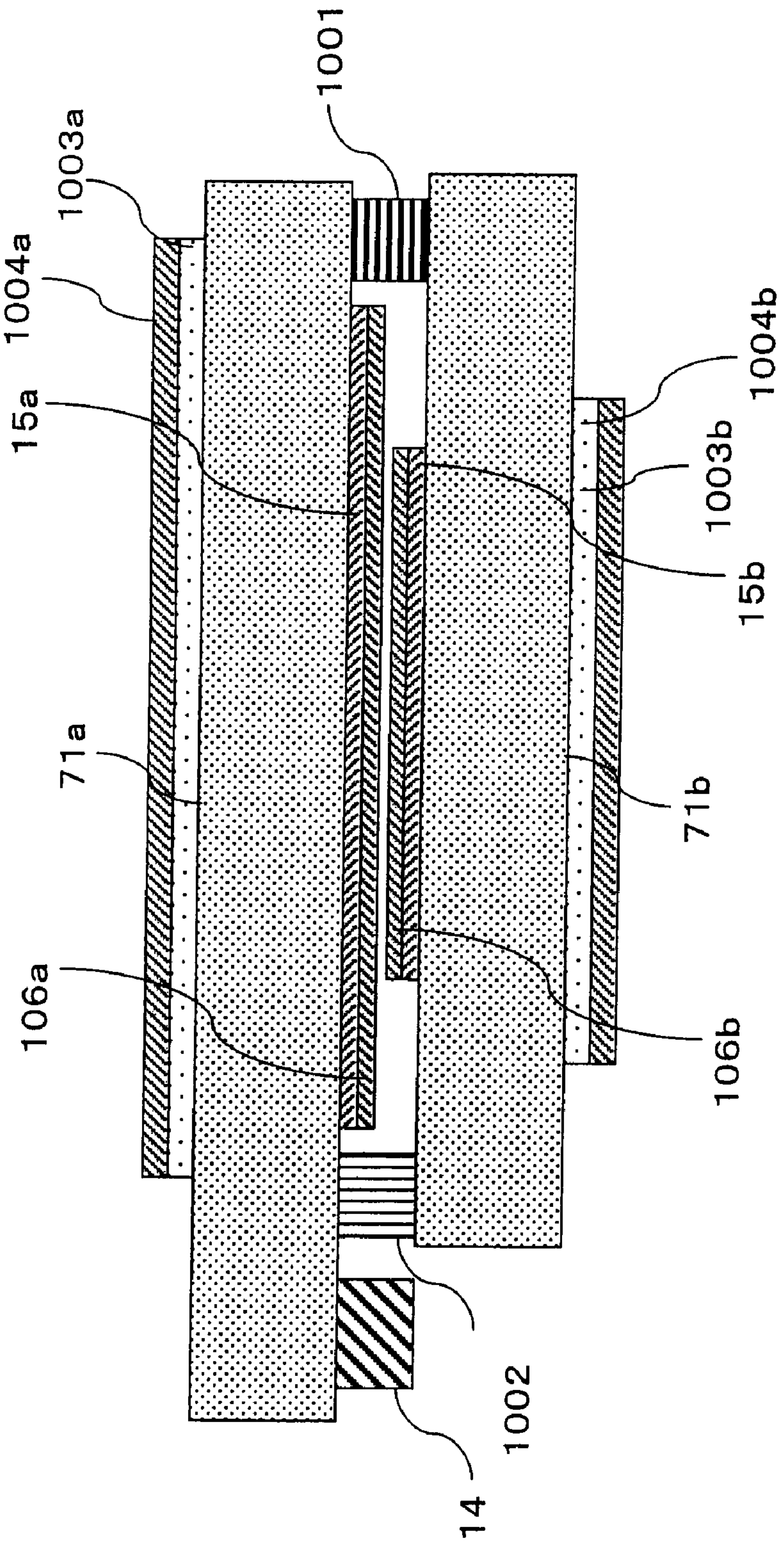
FIG. 100 is an explanatory diagram illustrating a display apparatus according to the present invention.

FIG. 100 is a constructional diagram of an EL display panel which employs an array board 71*a* for main display and an array board 71*b* for sub display. A desiccant 107 is placed (sealed) between the array board 71*a* and array board 71*b* (see FIG. 101).

Reference numeral 1001 denotes connector resin such as ACF. A signal from source driver circuit 14 is transmitted to the source signal line 18 on the array board 71*b* via the source signal line 18 on the array board 71*a* and the connector resin 1001.

Reference numeral 1004 denotes a polarizing plate or circular polarizing plate. A dispersing agent 1003 is placed or formed between the polarizing plates 1004 and array boards 71. The dispersing agent 1003 also functions as an adhesive which bonds the polarizing plates 1004 and array boards 71 together. The dispersing agent 1003 may be, for example, an acrylic adhesive containing fine-powdered titanium oxide or an acrylic adhesive containing fine-powdered calcium carbonate The dispersing agent 1003 improves the efficiency of extracting light produced by the EL elements 15.

Figure 101:
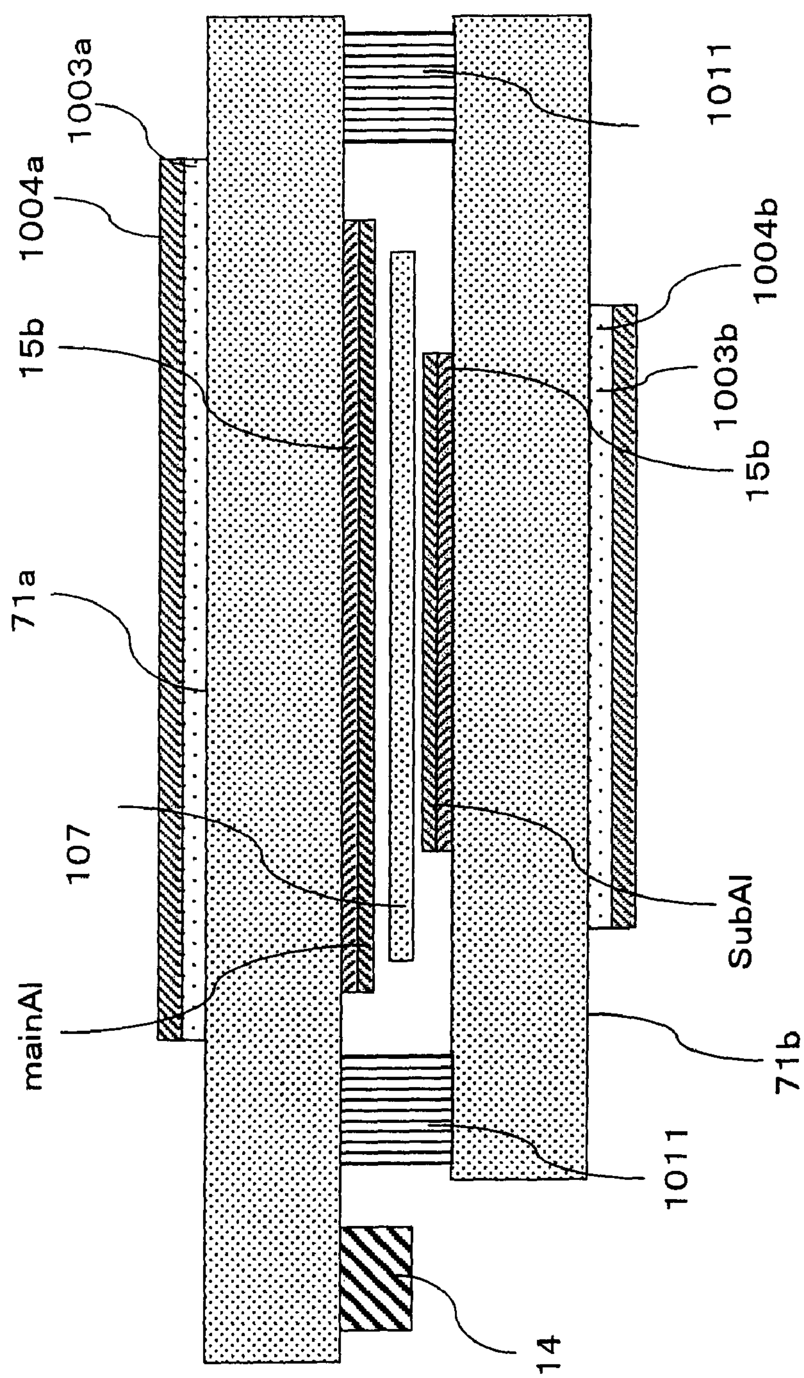
FIG. 101 is an explanatory diagram illustrating a display apparatus according to the present invention.

FIG. 101 shows a configuration in which a glass ring 1011 is placed between the array board 71*a* and array board 17*b*. The use of the glass ring 1011 makes it possible to set the distance between the array board 71*a* and array board 17*b* freely.

Figure 102:
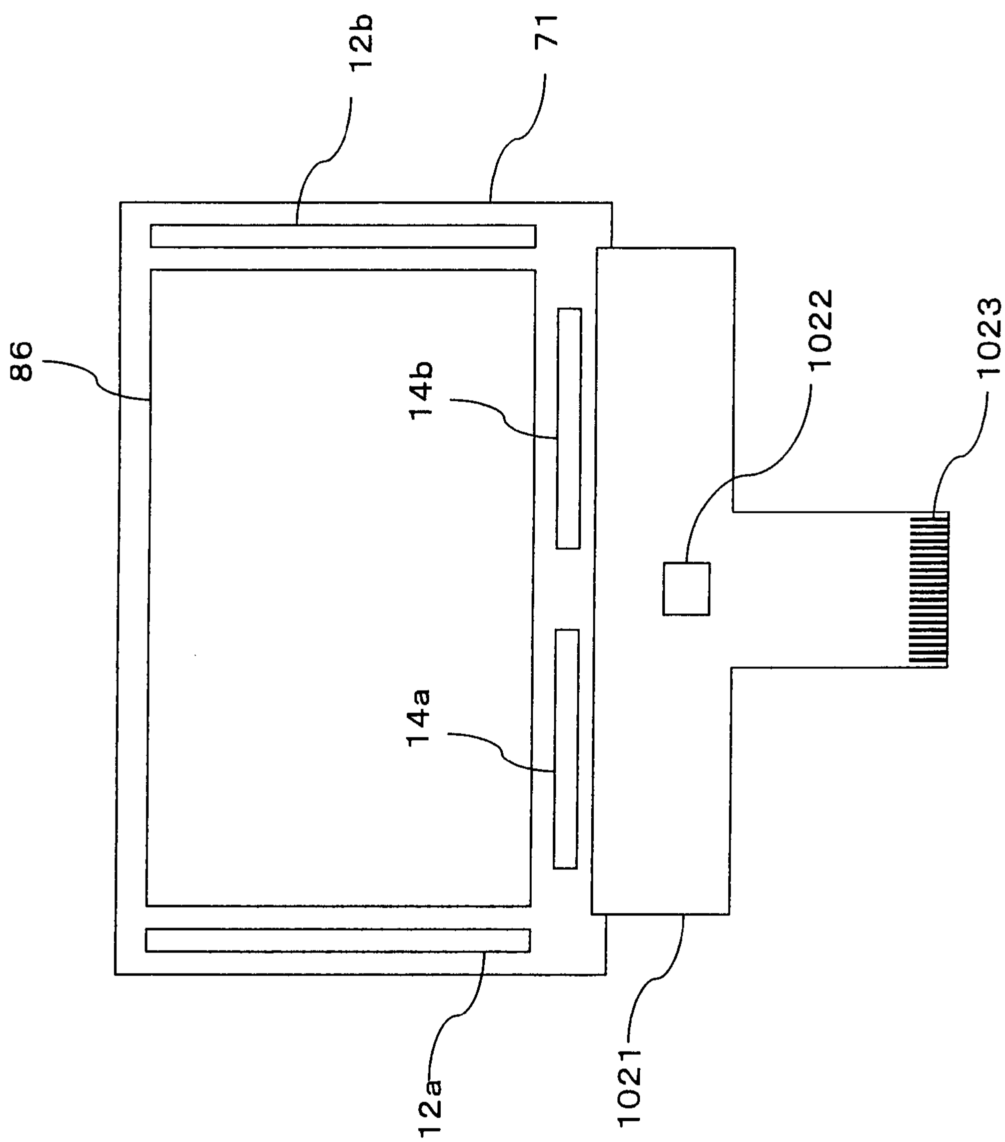
FIG. 102 is an explanatory diagram illustrating a display apparatus according to the present invention.

FIG. 102 is a constructional diagram of a panel module according to the present invention. A flexible board 1021 has a function to transmit signals inputted in a connector terminal 1023 to the source driver IC 14 and gate driver circuits 12. Reference numeral 1022 denotes a control IC.

The control IC 1022 converts serial video data into parallel data and inputs the resulting data in the source driver ICs 14. Also, it has the function of decoding panel control data and controlling the source driver circuits 14 and the like.

Figure 103:
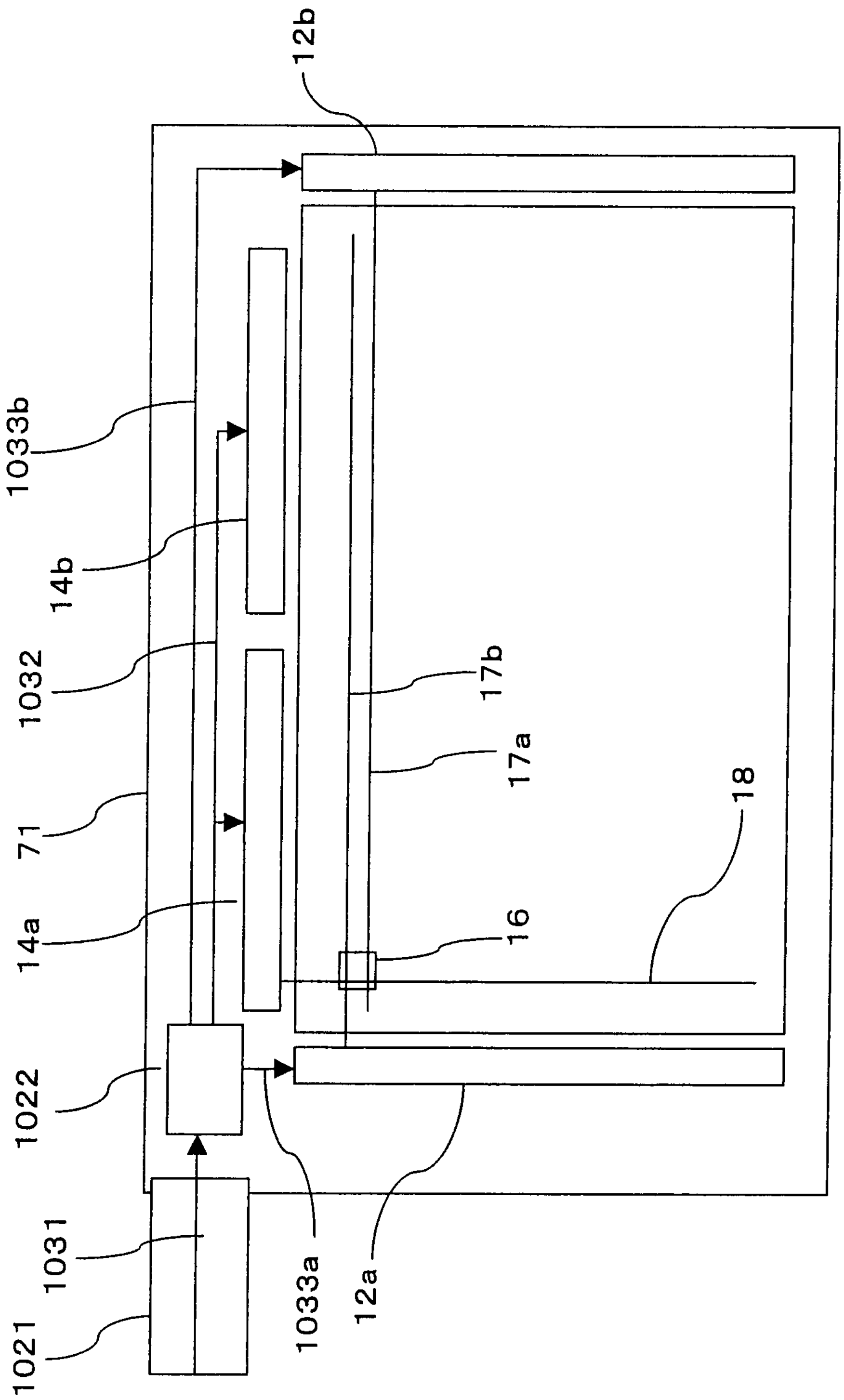
FIG. 103 is an explanatory diagram illustrating a display apparatus according to the present invention.

FIG. 103 shows the flow of signals schematically. Serial data 1031 is inputted in the control IC 1022 via wiring on the flexible board 1021. The control IC 1022 performs serial/parallel data conversion to produce parallel video data 1032 and gate driver circuit control data 1033.

Figure 104:
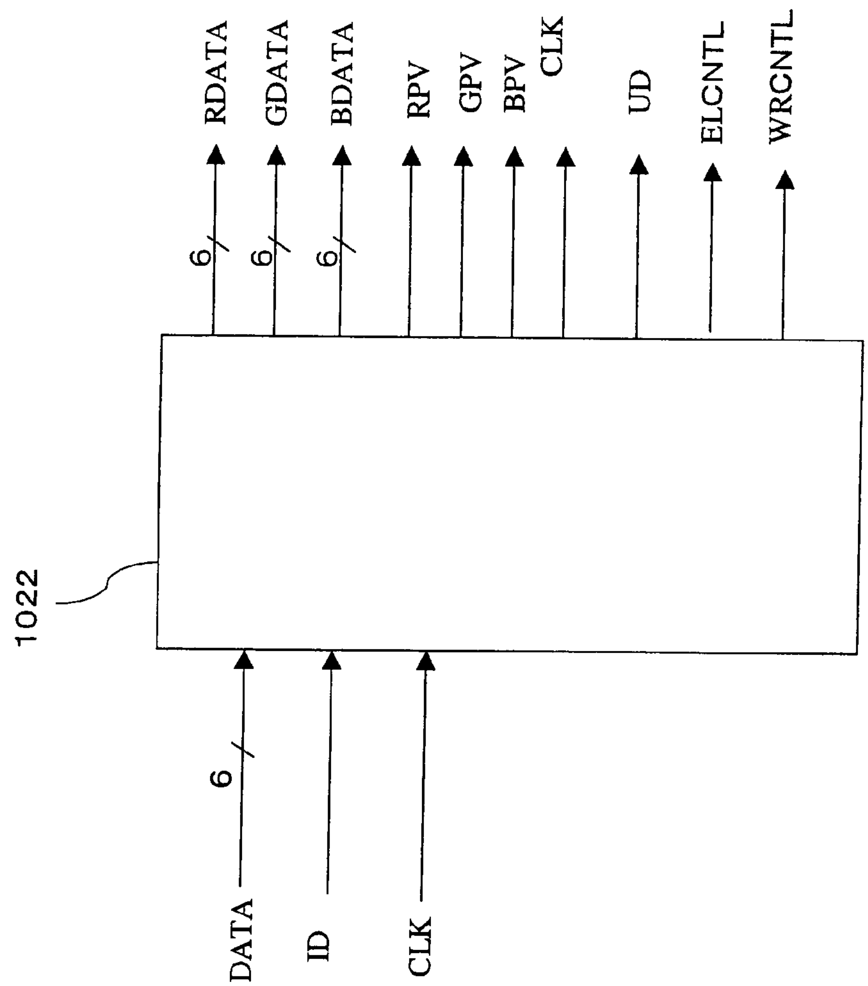
FIG. 104 is an explanatory diagram illustrating a display apparatus according to the present invention.

FIG. 104 shows data produced by the control IC 1022. Inputs are serial video signal DATA, serial control data ID, and a clock CLK. Outputs are parallel video data (RDATA (red data), GDATA (green data), and BDATA (blue data)), precharge voltage (RPV (precharge voltage for red), GPV (precharge voltage for green), and BPV (precharge voltage for blue)), a clock (CLK), an inversion signal (UD), an EL-side gate circuit control signal (ELCNTL), a WR-side gate circuit control signal (WRCNTL), etc.

Figure 108:
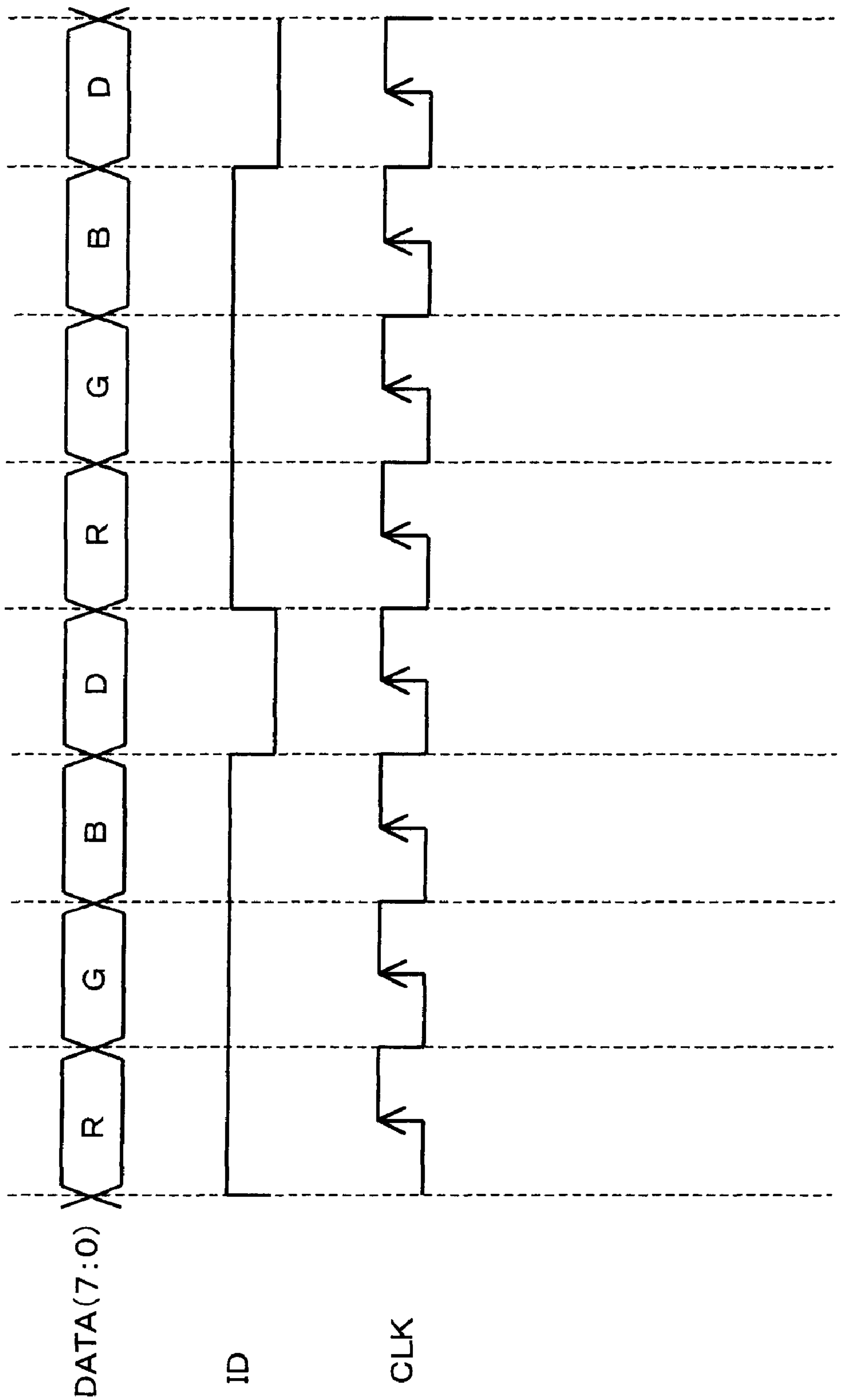
FIG. 108 is an explanatory diagram illustrating a display apparatus according to the present invention.

FIG. 108 is a timing chart of input data signals. When ID is low, DATA is a video signal. When ID is high, DATA is control data. Data is detected on rising edges of CLK.

Figure 109:
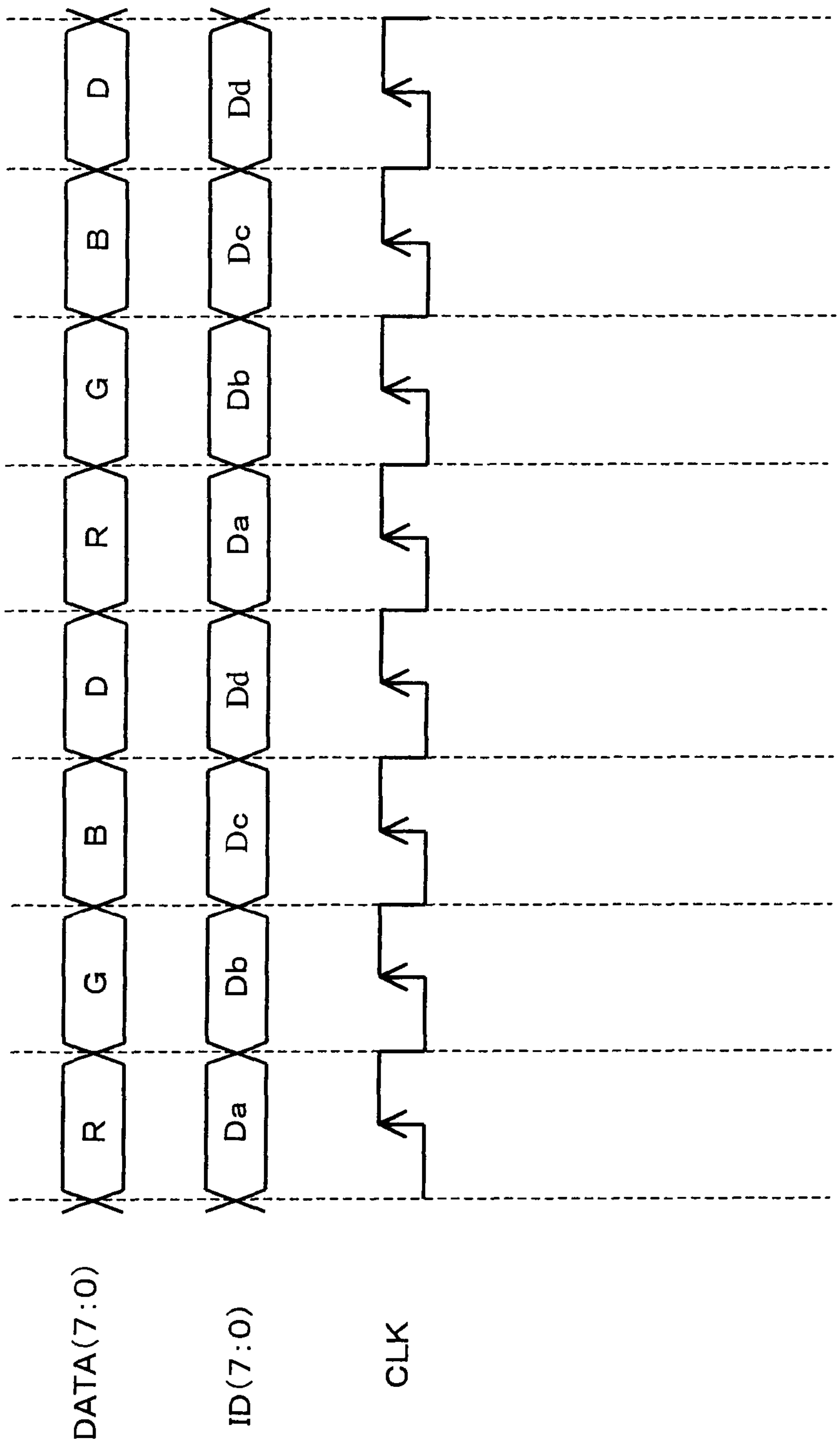
FIG. 109 is an explanatory diagram illustrating a display apparatus according to the present invention.
Figure 110:
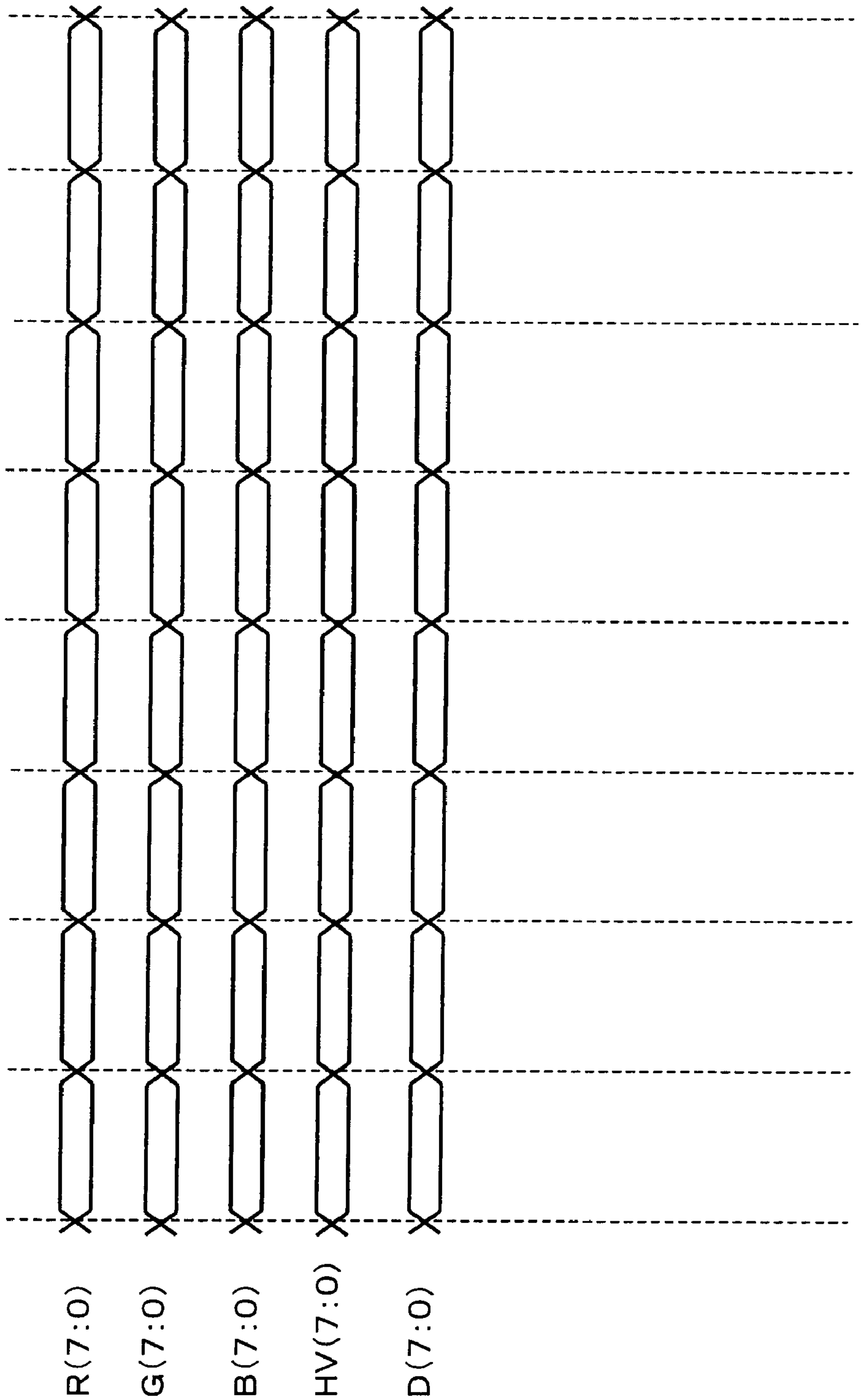
FIG. 110 is an explanatory diagram illustrating a display apparatus according to the present invention.

FIG. 109 shows an example in which the control data ID is also inputted serially. FIG. 110 shows an example in which input signals are LVDS signals.

Figure 105:
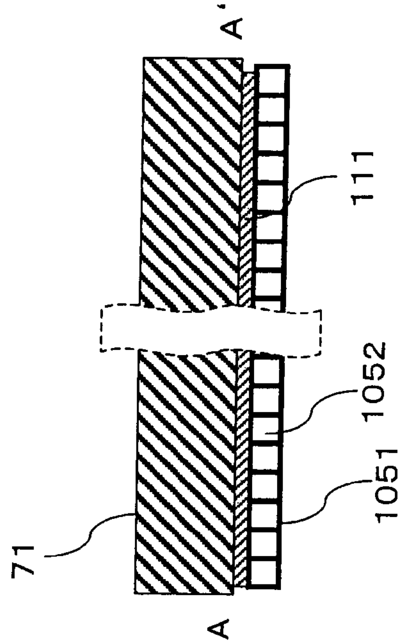
FIG. 105 is an explanatory diagram illustrating a display apparatus according to the present invention.
Figure 105:
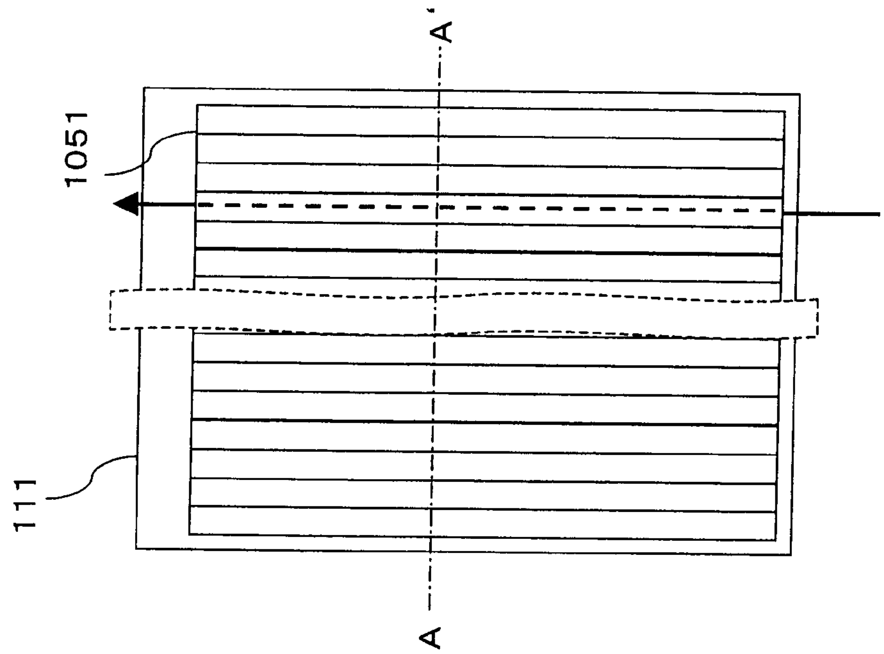

FIG. 105 is a constructional diagram of a display panel according to the present invention. FIG. 105(*a*) shows the back of the display panel and FIG. 105(*b*) is a sectional view taken along the line A-A'. A radiator plate 1051 is mounted on the back of the display panel. Also, thin film encapsulation described with reference to FIG. 11 is provided. The radiator plate 1051 is bonded to a thin encapsulation film 111 with a silicon-based adhesive (not shown). The adhesive also acts as a conductor of heat generated by the EL elements 15. A plurality of holes 1052 are formed in the radiator plate. Air passes through the holes 1052 to release heat from the panel.

Figure 106:
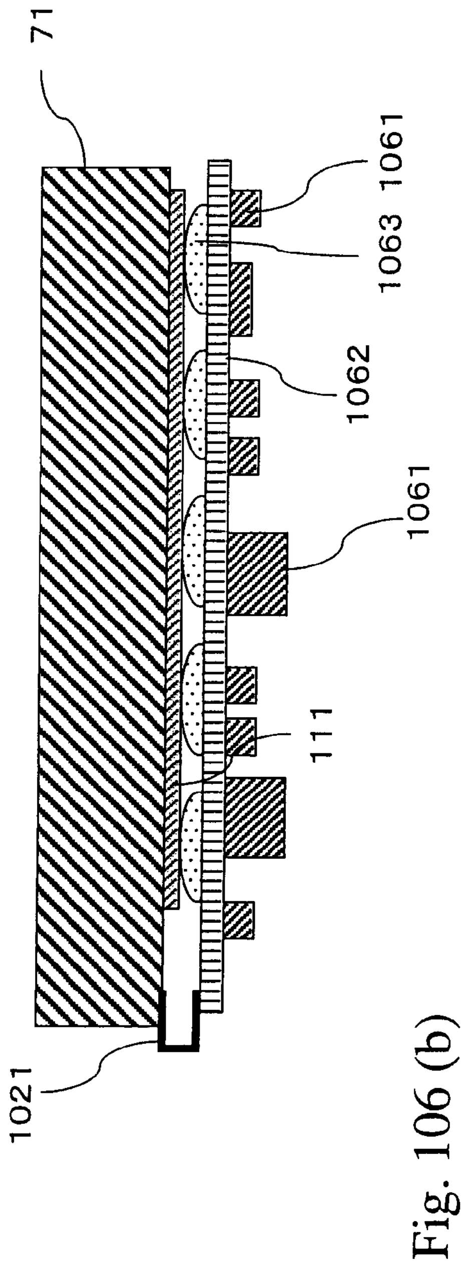
FIG. 106 is an explanatory diagram illustrating a display apparatus according to the present invention.
Figure 106:
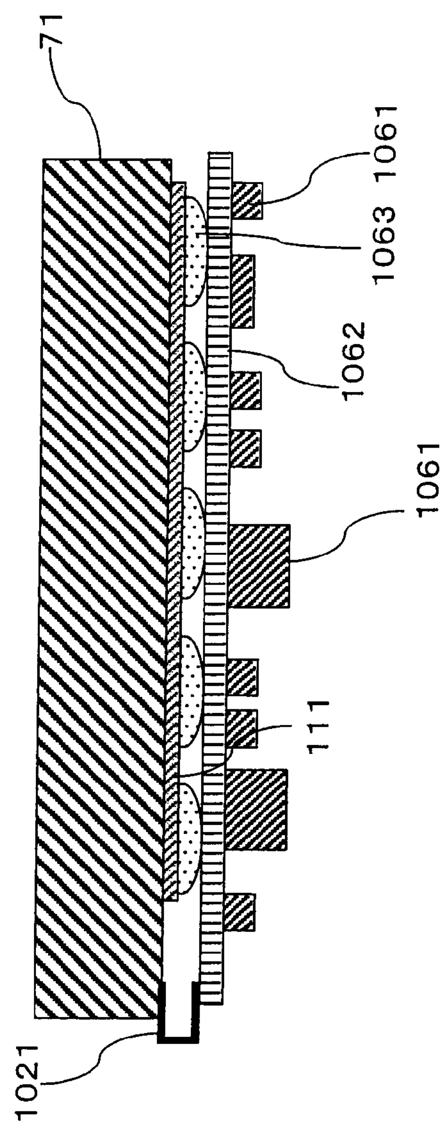
Figure 107:
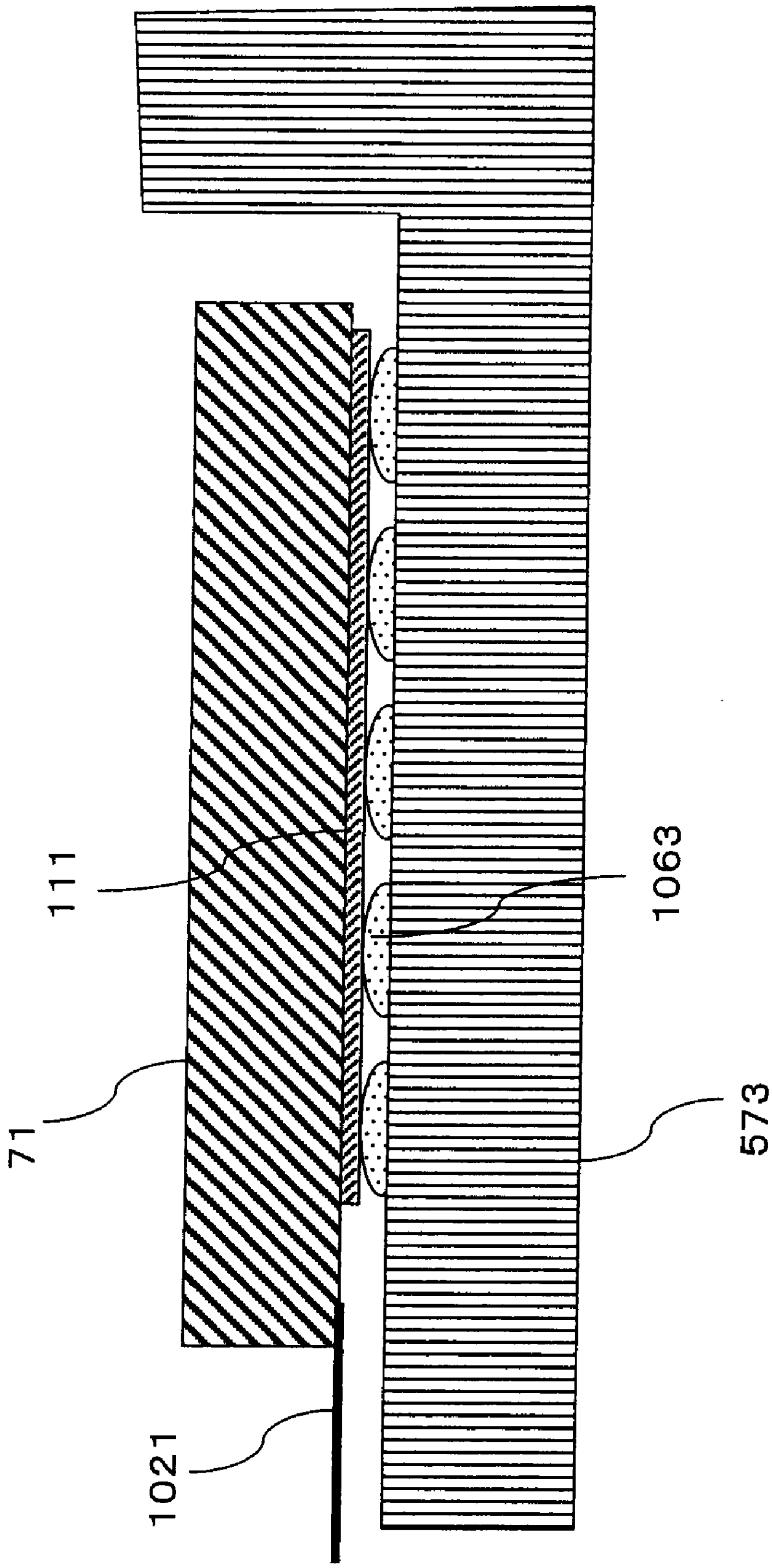
FIG. 107 is an explanatory diagram illustrating a display apparatus according to the present invention.

As illustrated in FIG. 106, there are surface-mount components 1061 on a circuit board (printed board) 1062. The circuit board 1062 is attached via a panel connection terminal and the flexible board 1021. Thus, signals from the circuit board 1062 are transmitted to the panel board 71 via the flexible board 1021.

Cushioning members (cushioning bumps) 1063 are formed on the printed board 1062 to prevent the printed board 1062 from coming into contact with the board 71, damaging the thin encapsulation film 111 (FIG. 106(*a*)). The cushioning members 1063 may be formed of acrylic resin, polyurethane resin, or polyimide resin. Incidentally, the cushioning members 1063 may be formed on the panel board 71 as illustrated in FIG. 106(*b*). When placing the panel board 71 on a casing 573, it is recommended to place the cushioning members 1063 between the casing 573 and panel board 71.

Figure 57:
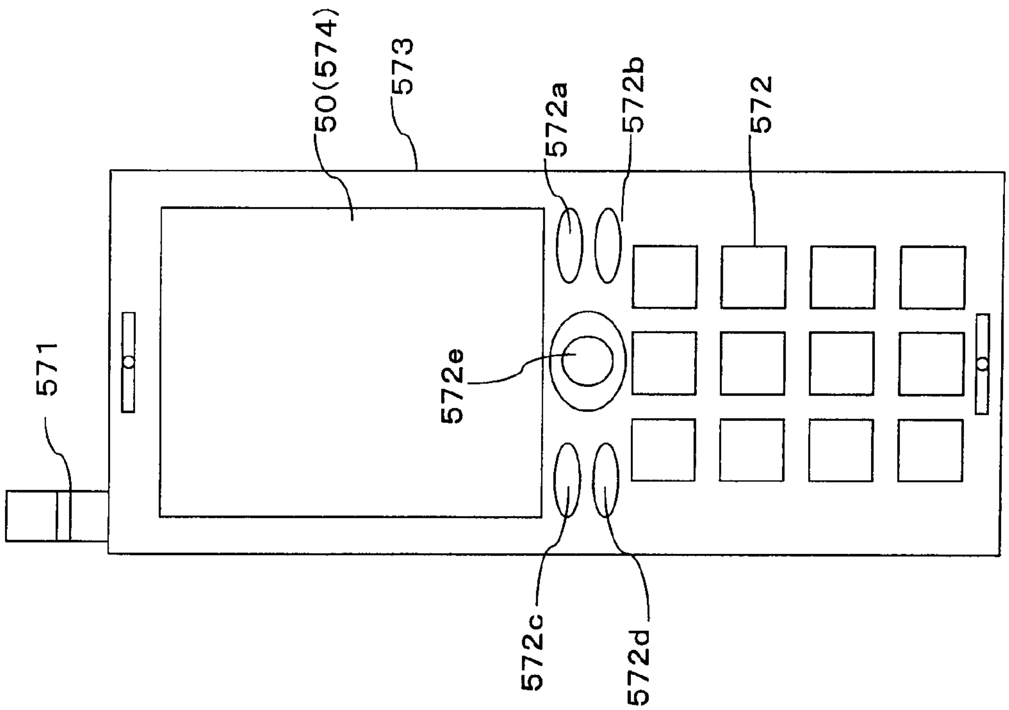
FIG. 57 is an explanatory diagram illustrating a cell phone according to the present invention.

Next, description will be given of examples of display devices according to the present invention which run the drive systems according to the present invention. FIG. 57 is a plan view of a cell phone which is an example of an information terminal. An antenna 571, numeric keys 572, etc. are mounted on a casing 573. Reference numerals 572 and the like denote a display color switch key, power key, and frame rate switch key.

The key 572 may be configured to switch among color modes as follows: pressing it once enters 8-color display mode, pressing it again enters 256-color display mode, and pressing it again enters 4,096-color display mode. The key is a toggle switch which switch among color display modes each time it is pressed. Incidentally, a display color change key may be provided separately. In that case, three (or more) keys 572 are needed.

In addition to a push switch, the key 572 may be a slide switch or other mechanical switch. Speech recognition may also be used for switching. For example, the switch may be configured such that display colors on the display screen 50 of the display panel will change as the user enters a color change command by speaking such as "high-definition display," "256-color mode," or "low-color display mode" into the phone. This can be implemented easily using existing speech recognition technology.

Also, display colors may be switched electrically. It is also possible to employ a touch panel which allows the user to make a selection by touching a menu presented on the display part 21 of the display panel. Besides, display colors may be switched based on the number of times the switch is pressed or based on a rotation or direction as is the case with a click ball.

A key which changes frame rate or a key which switches between moving pictures and still pictures many be used in place of the display color switch key 572. A key may switch two or more items at the same time: for example, among frame rates and between moving pictures and still pictures. Also, the key may be configured to change the frame rate gradually (continuously) when pressed and held. For that, among a capacitor C and a resistor R of an oscillator, the resistor R can be made variable or replaced with an electronic regulator. Alternatively, a trimmer capacitor may be used as a capacitor C of the oscillator. Such a key can also be implemented by forming a plurality of capacitors in a semiconductor chip, selecting one or more capacitors, and connecting the capacitors in parallel.

Incidentally, the technical idea of changing frame rates according to display color and the like is not limited to cell phones, but is widely applicable to devices with a display screen such as palmtop computers, notebook personal computers, desktop personal computers, and portable watches.

The cell phone according to the present invention described with reference to FIG. 57 is equipped with a CCD camera on the backside of the casing although not shown in the figure. Images taken by the CCD camera can be displayed on the display screen 50 of the display panel instantly. Data picked up by the CCD camera can be displayed on the display screen 50. The image data of the CCD camera can be switched among 24-bit (16,700,000 colors), 18-bit (260,000 colors), 16-bit (65,000 colors), 12-bit (4,096 colors), and 8-bit (256 colors) using input from keys 572.

Figure 58:
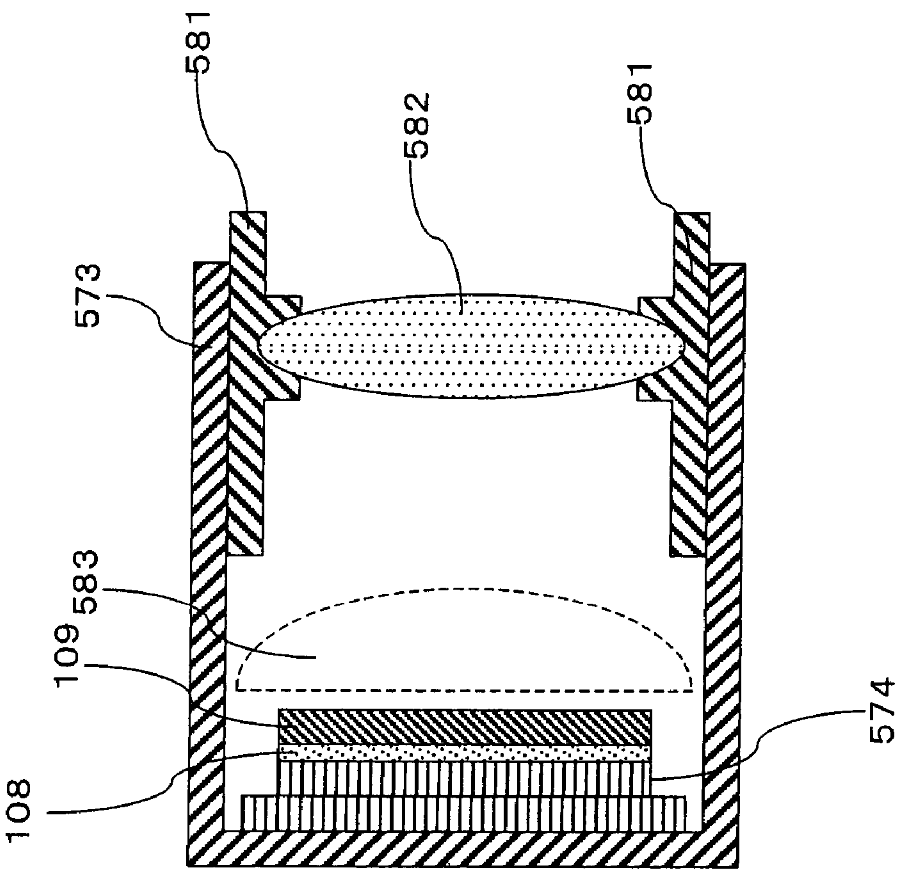
FIG. 58 is an explanatory diagram illustrating a viewfinder according to the present invention.

FIG. 58 is a sectional view of a viewfinder according to an embodiment of the present invention. It is illustrated schematically for ease of explanation. Besides, some parts are enlarged, reduced, or omitted. For example, an eyepiece cover is omitted in FIG. 58. The above items also apply to other drawings.

Inner surfaces of a body 573 are dark- or black-colored. This is to prevent stray light emitted from an EL display panel (EL display apparatus) 574 from being reflected diffusely inside the body 573 and lowering display contrast. A phase plate (λ/4) 108, polarizing plate 109, and the like are placed on an exit side of the display panel. This has also been described with reference to FIGS. 10 and 11.

An eye ring 581 is fitted with a magnifying lens 582. The observer focuses on a display image 50 on the display panel 574 by adjusting the position of the eye ring 581 in the body 573.

If a convex lens 583 is placed on the exit side of the display panel 574 as required, principal rays entering the magnifying lens 582 can be made to converge. This makes it possible to reduce the diameter of the magnifying lens 582, and thus reduce the size of the viewfinder.

Figure 59:
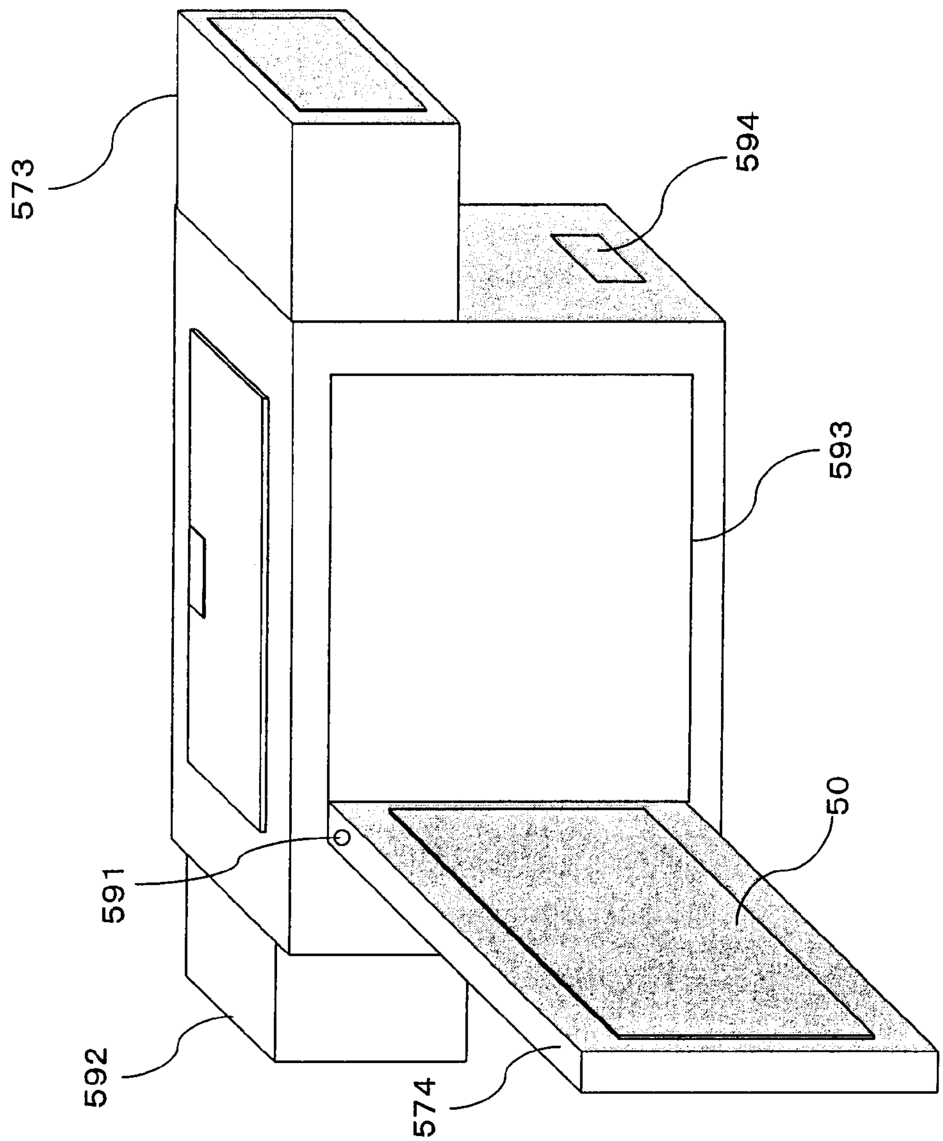
FIG. 59 is an explanatory diagram illustrating a video camera according to the present invention.

FIG. 59 is a perspective view of a video camera. A video camera has a taking (imaging) lens 592 and a video camera body 573. The taking lens 592 and viewfinder 573 are mounted back to back with each other. The viewfinder 573 (see also FIG. 58) is equipped with an eyepiece cover. The observer views the image 50 on the display panel 574 through the eyepiece cover.

The EL display panel according to the present invention is also used as a display monitor. The display part 50 can pivot freely on a point of support 591. The display part 50 is stored in a storage compartment 593 when not in use.

A switch 594 is a changeover switch or control switch and performs the following functions. The switch 594 is a display mode changeover switch. The switch 594 is also suitable for cell phones and the like. Now the display mode changeover switch 594 will be described.

The drive methods according to the present invention include the one that passes an N times larger current through EL elements 15 to illuminate them for a period equal to 1/M of 1 F. By varying this illumination period, it is possible to change brightness digitally. For example, designating that N=4, a four times larger current is passed through the EL elements 15. If the illumination period is 1/M, by switching M among 1, 2, 3, and 4, it is possible to vary brightness from 1 to 4 times. Incidentally, M may be switched among 1, 1.5, 2, 3, 4, 5, 6, and so on.

The switching operation described above is used for cell phones, which display the display screen 50 very brightly at power-on and reduce display brightness after a certain period to save power. It can also be used to allow the user to set a desired brightness. For example, the brightness of the screen is increased greatly outdoors. This is because the screen cannot be seen at all outdoors due to bright surroundings. However, the EL elements 15 deteriorate quickly under conditions of continuous display at high brightness. Thus, the screen 50 is designed to return to normal brightness in a short period of time if it is displayed very brightly. A button which can be pressed to increase display brightness should be provided, in case the user wants to display the screen 50 at high brightness again.

Thus, it is preferable that the user can change display brightness with the button switch 1594, that the display brightness can be changed automatically according to mode settings, or that the display brightness can be changed automatically by detecting the brightness of extraneous light. Preferably, display brightness settings such as 50%, 60%, 80%, etc. are available to the user.

Preferably, the display screen 50 employs Gaussian display. That is, the center of the display screen 50 is bright and the perimeter is relatively dark. Visually, if the center is bright, the display screen 50 seems to be bright even if the perimeter is dark. According to subjective evaluation, as long as the perimeter is at least 70% as bright as the center, there is not much difference. Even if the brightness of the perimeter is reduced to 50%, there is almost no problem. The self-luminous display panel according to the present invention generates a Gaussian distribution from top to bottom of the screen using the N-fold pulse driving described above (a method which passes an N times larger current through EL elements 15 to illuminate them for a period equal to 1/M of 1 F).

Specifically, the value of M is increased in upper and lower parts of the screen and decreased in the center of the screen. This is accomplished by modulating the operating speed of a shift register of the gate driver circuits 12. The brightness at the left and right of the screen is modulated by multiplying video data by table data. By reducing peripheral brightness (at an angle of view of 0.9) to 50% through the above operation, it is possible to reduce power consumption by 20% compared to brightness of 100%. By reducing peripheral brightness (at an angle of view of 0.9) to 70%, it is possible to reduce power consumption by 15% compared to brightness of 100%.

Preferably a changeover switch is provided to enable and disable the Gaussian display. This is because the perimeter of the screen cannot be seen at all outdoors if the Gaussian display is used. Thus, it is preferable that the user can change display brightness with the button switch, that the display brightness can be changed automatically according to mode settings, or that the display brightness can be changed automatically by detecting the brightness of extraneous light. Preferably, display brightness settings such as 50%, 60%, 80%, etc. are available to the user.

Liquid crystal display panels generate a fixed Gaussian distribution using a backlight. Thus, they cannot enable and disable the Gaussian distribution. The capability to enable and disable Gaussian distribution is peculiar to self-luminous display devices.

A fixed frame rate may cause interference with illumination of an indoor fluorescent lamp or the like, resulting in flickering. Specifically, if the EL elements 15 operate on 60-Hz alternating current, a fluorescent lamp illuminating on 60-Hz alternating current may cause subtle interference, making it look as if the screen were flickering slowly. To avoid this situation, the frame rate can be changed. The present invention has a capability to change frame rates. Also, it allows the value of N or M to be changed in N-fold pulse driving (a method which passes an N times larger current through EL elements 15 to illuminate them for a period equal to 1/M of 1 F).

The above capabilities are implemented by way of the switch 594. The switch 594 switches among the above capabilities when pressed more than once, following a menu on the screen 50.

Incidentally, the above items are not limited to cell phones. Needless to say, they are applicable to television sets, monitors, etc. Also, it is preferable to provide icons on the display screen to allow the user to know at a glance what display mode he/she is in. The above items similarly apply to the following.

Figure 60:
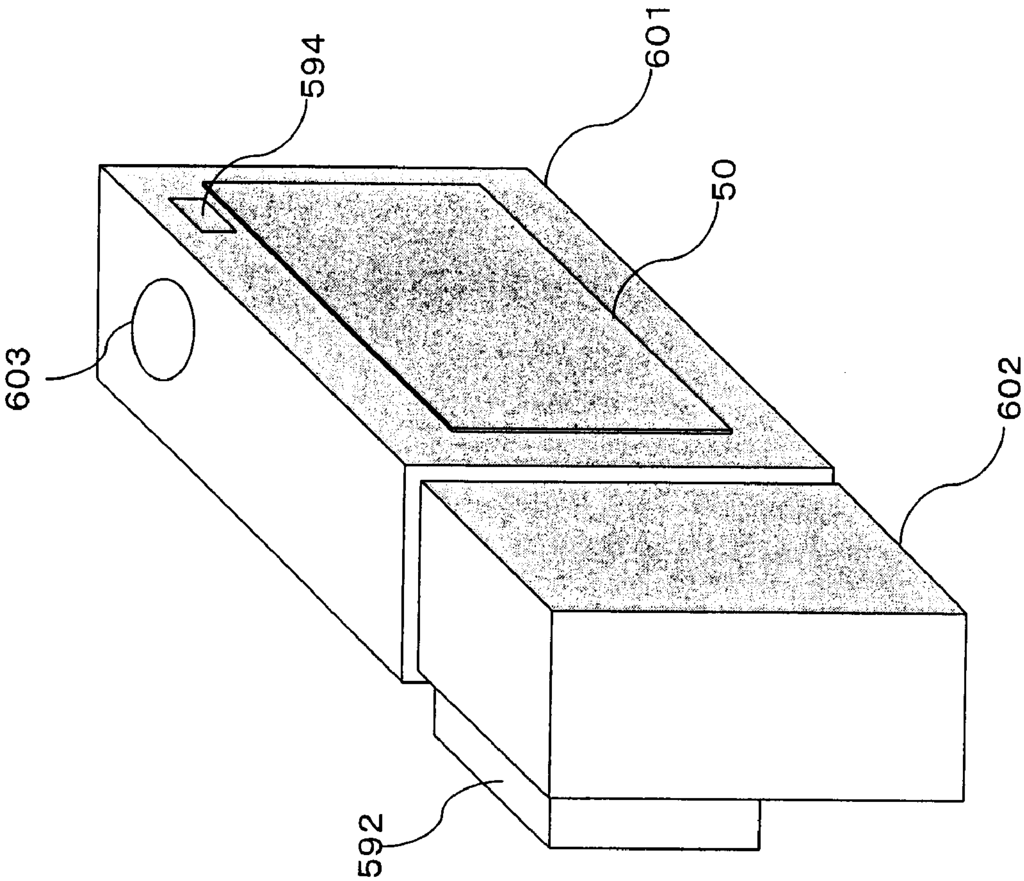
FIG. 60 is an explanatory diagram illustrating a digital camera according to the present invention.

The EL display apparatus and the like according to this embodiment can be applied not only to video cameras, but also to digital cameras such as the one shown in FIG. 60. The display apparatus is used as a monitor 50 attached to a camera body 601. The camera body 601 is equipped with a switch 594 as well as a shutter 603.

Figure 61:
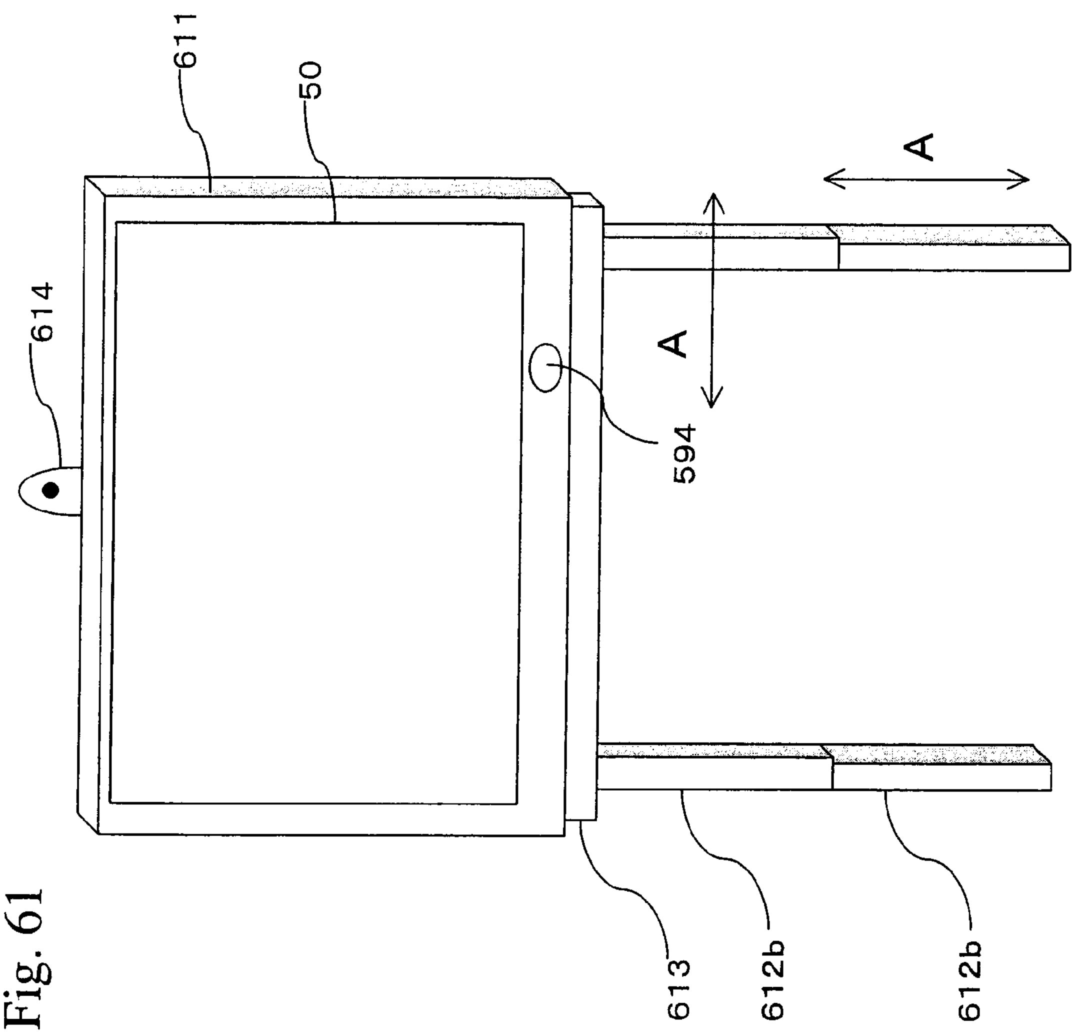
FIG. 61 is an explanatory diagram illustrating a TV (monitor) according to the present invention.

The display panel described above has a relatively small display area. However, with a display area of 30 inches or larger, the display screen 50 tends to flex. To deal with this situation, the present invention puts the display panel in a frame 611 and attaches a fitting 614 so that the frame 611 can be suspended as shown in FIG. 61. The display panel is mounted on a wall or the like using the fitting 614.

A large screen size increases the weight of the display panel. As a measure against this situation, the display panel is mounted on a stand 613, to which a plurality of legs 612 are attached to support the weight of the display panel.

The legs 612 can be moved from side to side as indicated by A. Also, they can be contracted as indicated by B. Thus, the display apparatus can be installed even in a small space.

A television set in FIG. 61 has a surface of its screen covered with a protective film (or a protective plate). One purpose of the protective film is to prevent the surface of the display panel from breakage by protecting from being hit by something. An AIR coat is formed on the surface of the protective film. Also, the surface is embossed to reduce glare caused by extraneous light on the display panel.

A space is formed between the protective film and display panel by spraying beads or the like. Fine projections are formed on the rear face of the protective film to maintain the space between the protective film and display panel. The space prevents impacts from being transmitted from the protective film to the display panel.

Also, it is useful to inject an optical coupling agent into the space between the protective film and display panel. The optical coupling agent may be a liquid such as alcohol or ethylene glycol, a gel such as acrylic resin, or a solid resin such as epoxy. The optical coupling agent can prevent interfacial reflection and function as a cushioning material.

The protective film may be, for example, a polycarbonate film (plate), polypropylene film (plate), acrylic film (plate), polyester film (plate), PVA film (plate), etc. Besides, it goes without saying that an engineering resin film (ABS, etc.) may be used. Also, it may be made of an inorganic material such as tempered glass. Instead of using a protective film, the surface of the display panel may be coated with epoxy resin, phenolic resin, and acrylic resin 0.5 mm to 2.0 mm thick (both inclusive) to produce a similar effect. Also, it is useful to emboss surfaces of the resin.

It is also useful to coat surfaces of the protective film or coating material with fluorine. This will make it easy to wipe dirt from the surfaces with a detergent. Also, the protective film may be made thick and used for a front light as well as for the screen surface.

The display panel according to the example of the present invention may be used in combination with the three-side free configuration. The three-side free configuration is useful especially when pixels are built using amorphous silicon technology. Also, in the case of panels formed using amorphous silicon technology, since it is difficult to control variations in the characteristics of transistor elements during production processes, it is preferable to use the N-pulse driving, reset driving, dummy pixel driving, or the like according to the present invention. That is, the transistors according to the present invention are not limited to those produced by polysilicon technology, and they may be produced by amorphous silicon technology.

Incidentally, the N-fold pulse driving (FIGS. 13, 16, 19, 20, 22, 24, 30, etc.) and the like according to the present invention are more effective for display panels which contain transistors 11 formed by low-temperature polysilicon technology than display panels which contain transistors 11 formed by amorphous silicon technology. This is because adjacent transistors, when formed by amorphous silicon technology, have almost equal characteristics. Thus, driving currents for individual transistors are close to a target value even if the transistors are driven by current obtained by addition (the N-fold pulse driving in FIGS. 22, 24, and 30, in particular, are effective for pixel configurations containing amorphous silicon transistors).

The technical idea described in the example of the present invention can be applied to video cameras, projectors, 3D television sets, projection television sets, etc. It can also be applied to viewfinders, cell phone monitors, PHS, personal digital assistants and their monitors, and digital cameras and their monitors.

Also, the technical idea is applicable to electrophotographic systems, head-mounted displays, direct view monitors, notebook personal computers, video cameras, electronic still cameras. Also, it is applicable to ATM monitors, public phones, videophones, personal computers, and wristwatches and its displays.

Furthermore, it goes without saying that the technical idea can be applied to display monitors of household appliances, pocket game machines and their monitors, backlights for display panels, or illuminating devices for home or commercial use. Preferably, illuminating devices are configured such that color temperature can be varied. Color temperature can be changed by forming RGB pixels in stripes or in dot matrix and adjusting currents passed through them. Also, the technical idea can be applied to display apparatus for advertisements or posters, RGB traffic lights, alarm lights, etc.

Also, organic EL display panels are useful as light sources for scanners. An image is read with light directed to an object using an RGB dot matrix as a light source. Needless to say, the light may be monochromatic. Besides, the matrix is not limited to an active matrix and may be a simple matrix. The use of adjustable color temperature will improve imaging accuracy.

Also, organic EL display panels are useful as backlights of liquid crystal display panels. Color temperature can be changed and brightness can be adjusted easily by forming RGB pixels of an EL display panel (backlight) in stripes or in dot matrix and adjusting currents passed through them. Besides, the organic EL display panel, which provides a surface light source, makes it easy to generate Gaussian distribution that makes the center of the screen brighter and perimeter of the screen darker. Also, organic EL display panels are useful as backlights of field-sequential liquid crystal display panels which scan with R, G, and B lights in turns. Also, they can be used as backlights of liquid crystal display panels for movie display by inserting black even if the backlights are turned on and off.

INDUSTRIAL APPLICABILITY

According to the present invention, the display panels, display apparatus, etc. offer distinctive effects, including high quality, high movie display performance, low power consumption, low costs, high brightness, etc., according to their respective configurations. Incidentally, the present invention does not consume much power because it can provide power-saving information display apparatus. Also, it does not waste resources because it can reduce size and weight. Furthermore, it can adequately support high-resolution display panels. Thus, the present invention is friendly to both global environmental and space environment.

What is claimed is:

1. An EL display apparatus comprising:

a display area in which pixels are arranged in a matrix, each of the pixels having an EL element;

source signal lines which transfer an image signal to the pixels;

gate signal lines;

a source driver circuit; and a selection circuit;

wherein each of the pixels has:

a driver transistor which supplies an electric current to the EL element;

a first switching transistor which supplies the image signal applied to the source signal lines to the driver transistor;

a first capacitor connected to a gate terminal of the driver transistor, the first capacitor retaining a voltage which defines the electric current passing through the driver transistor; and a second capacitor having a first terminal and a second terminal, said first terminal being connected to said gate signal line and said second terminal being connected to said gate terminal of the driver transistor, wherein a gate terminal of the first switching transistor is connected to one of the gate signal lines, and capacity of the second capacitor changes a potential on the gate terminal of the driver transistor depending on variation of a voltage applied to the one of the gate signal lines, a change of said potential on the gate terminal of the driver transistor acts such that said driver transistor reduces said electric current supplied to said EL element, said source driver outputs a signal from a signal output terminal, said selection circuit has a plurality of groups, each one of said groups including one input terminal and a plurality of selection output terminals that can be connected with said one input terminal, each one of said input terminals is connected with said signal output terminal of said source driver circuit, and each one of said selection output terminals is connected with each one of said source signal lines, and said selection circuit selects one or more selection output terminals from said a plurality of selection output terminals and impresses said signal of said source driver circuit impressed to said input terminal of said selection circuit to said source signal line connected with said selected selection output terminal.

2. The EL display apparatus according to claim 1, further comprising a gate driver circuit which drives the gate signal lines, wherein the gate driver circuit applies a voltage which causes the first switching transistor to turn on or off to the gate signal lines, a first terminal of the second capacitor is connected to one of the gate signal lines connected to the gate terminal of the first switching transistor, and a second terminal of the second capacitor is connected to the gate terminal of the driver transistor or one terminal of the first capacitor.

3. The EL display apparatus according to claim 1, further comprising a second switching transistor which causes a short-circuit between the gate terminal of the driver transistor and another terminal of the driver transistor, wherein the second switching transistor has a multi-gate structure including dual gates or more.

4. The EL display apparatus according to claim 1, wherein a capacity of the second capacitor is smaller than a capacity of the first capacitor.

5. The EL display apparatus according to claim 1, wherein channel polarity of the driver transistor is the same as that of the first switching transistor.

6. The EL display apparatus according to claim 1, further comprising a third switching transistor in the pixel between the driver transistor and the EL element.

7. The EL display apparatus according to claim 1, further comprising a fourth switching transistor in the pixel, wherein a first terminal of the fourth switching transistor is connected to the gate terminal of the driver transistor, a second terminal of the fourth switching transistor is connected to an electrode or wire to which a predetermined voltage is applied, and by operating the fourth switching transistor, the predetermined voltage is applied to the gate terminal of the driver transistor.

8. The EL display apparatus according to claim 1, wherein an encapsulation film is formed on an upper layer of an EL film constituting the EL element.

9. The EL display apparatus according to claim 1, further comprising a gate driver circuit which selects the gate signal lines, wherein a control signal to the gate driver circuit is supplied from a source driver circuit.

10. The EL display apparatus according to claim 1, wherein at least a pixel having a first color and a pixel having a second color are arranged in a matrix in a display screen, and a capacity of the second capacitor for the pixel having the first color is different from a capacity of the second capacitor for the pixel having the second color.

11. The EL display apparatus according to claim 1, wherein a film constituting the semiconductor for the transistors is formed in a laser anneal process in which striped laser shots are sequentially moved in parallel to a direction in which the source signal lines are formed.

* * * * *